US010867945B2

(12) United States Patent
Yamamoto

(10) Patent No.: US 10,867,945 B2
(45) Date of Patent: *Dec. 15, 2020

(54) CHIP PARTS AND METHOD FOR MANUFACTURING THE SAME, CIRCUIT ASSEMBLY HAVING THE CHIP PARTS AND ELECTRONIC DEVICE

(71) Applicant: ROHM CO., LTD., Kyoto (JP)

(72) Inventor: Hiroki Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/575,557

(22) Filed: Sep. 19, 2019

(65) Prior Publication Data

US 2020/0013737 A1 Jan. 9, 2020

Related U.S. Application Data

(63) Continuation of application No. 15/832,358, filed on Dec. 5, 2017, now Pat. No. 10,468,362, which is a (Continued)

(30) Foreign Application Priority Data

Jan. 8, 2014 (JP) ................................ 2014-001910
Jan. 8, 2014 (JP) ................................ 2014-001911
(Continued)

(51) Int. Cl.
*H01L 23/00* (2006.01)
*H01L 21/78* (2006.01)
(Continued)

(52) U.S. Cl.
CPC .......... *H01L 24/06* (2013.01); *H01L 21/6836* (2013.01); *H01L 21/78* (2013.01);
(Continued)

(58) Field of Classification Search
CPC ...................................................... H01L 24/06
See application file for complete search history.

(56) References Cited

U.S. PATENT DOCUMENTS 4,558,345 A * 12/1985 Dwyer ................ H01L 23/4824 257/529
6,423,908 B1 7/2002 Liu
(Continued)

FOREIGN PATENT DOCUMENTS

JP H01258470 A 10/1989
JP H0529173 A 2/1993
(Continued)

*Primary Examiner* — Thao X Le
*Assistant Examiner* — Laura M Dykes
(74) *Attorney, Agent, or Firm* — Rabin & Berdo, P.C.

(57) ABSTRACT

A chip part according to the present invention includes a substrate having a penetrating hole, a pair of electrodes formed on a front surface of the substrate and including one electrode overlapping the penetrating hole in a plan view and another electrode facing the one electrode, and an element formed on the front surface side of the substrate and electrically connected to the pair of electrodes.

16 Claims, 162 Drawing Sheets

TEG1

Related U.S. Application Data continuation of application No. 14/587,843, filed on Dec. 31, 2014, now Pat. No. 9,859,240.

(30) Foreign Application Priority Data

Jan. 31, 2014 (JP) ................................ 2014-017689
Oct. 29, 2014 (JP) ................................ 2014-220433

(51) Int. Cl.

| | |
|---|---|
| ***H01L 21/683*** | (2006.01) |
| ***H01L 29/866*** | (2006.01) |
| ***H01L 23/482*** | (2006.01) |
| ***H01L 23/544*** | (2006.01) |
| ***H01L 29/861*** | (2006.01) |
| ***H01L 29/872*** | (2006.01) |
| ***H01L 29/06*** | (2006.01) |
| *H01L 21/66* | (2006.01) |

(52) U.S. Cl.

CPC ........ *H01L 23/4824* (2013.01); *H01L 23/544* (2013.01); *H01L 24/05* (2013.01); *H01L 24/32* (2013.01); *H01L 29/0619* (2013.01); *H01L 29/866* (2013.01); *H01L 29/8611* (2013.01); *H01L 29/872* (2013.01); *H01L 22/12* (2013.01); *H01L 24/29* (2013.01); *H01L 2221/6834* (2013.01); *H01L 2221/68313* (2013.01); *H01L 2221/68327* (2013.01); *H01L 2221/68381* (2013.01); *H01L 2223/5442* (2013.01); *H01L 2223/54413* (2013.01); *H01L 2223/54433* (2013.01); *H01L 2223/54486* (2013.01); *H01L 2224/03* (2013.01); *H01L 2224/03464* (2013.01); *H01L 2224/04026* (2013.01); *H01L 2224/0502* (2013.01); *H01L 2224/05017* (2013.01); *H01L 2224/05023* (2013.01); *H01L 2224/0556* (2013.01); *H01L 2224/05552* (2013.01); *H01L 2224/05557* (2013.01); *H01L 2224/05562* (2013.01); *H01L 2224/05567* (2013.01); *H01L 2224/05568* (2013.01); *H01L 2224/05582* (2013.01); *H01L 2224/05644* (2013.01); *H01L 2224/06051* (2013.01); *H01L 2224/06151* (2013.01); *H01L 2224/32013* (2013.01); *H01L 2224/32054* (2013.01); *H01L 2224/32057* (2013.01); *H01L 2224/32105* (2013.01); *H01L 2224/32237* (2013.01); *H01L 2224/33151* (2013.01); *H01L 2224/75745* (2013.01); *H01L 2224/75753* (2013.01); *H01L 2224/83192* (2013.01); *H01L 2224/83815* (2013.01); *H01L 2224/94* (2013.01); *H01L 2924/10156* (2013.01); *H01L 2924/12035* (2013.01); *H01L 2924/12036* (2013.01); *H01L 2924/12042* (2013.01)

(56) References Cited

U.S. PATENT DOCUMENTS

| | | | |
|---|---|---|---|
| 6,429,383 | B1 | 8/2002 | Sprietsma et al. |
| 7,041,591 | B1 | 5/2006 | Lee et al. |
| 2002/0011109 | A1 | 1/2002 | Tabota |
| 2003/0057497 | A1 | 3/2003 | Higashida et al. |
| 2004/0197979 | A1 | 10/2004 | Jeong et al. |
| 2005/0121686 | A1 | 6/2005 | Keller et al. |
| 2005/0184387 | A1 | 8/2005 | Collins et al. |
| 2006/0177999 | A1 | 8/2006 | Hembree et al. |
| 2007/0210317 | A1 | 9/2007 | Chou et al. |
| 2007/0290329 | A1 | 12/2007 | Murayama et al. |
| 2008/0003846 | A1 | 1/2008 | Miyagawa |
| 2009/0179207 | A1 | 7/2009 | Chitnis et al. |
| 2009/0261418 | A1 | 10/2009 | Yajima |
| 2010/0167534 | A1 | 7/2010 | Iwata |
| 2013/0062625 | A1 | 3/2013 | Takada |
| 2013/0240908 | A1 | 9/2013 | Haney et al. |

FOREIGN PATENT DOCUMENTS

| | | | |
|---|---|---|---|
| JP | H0629386 | A | 2/1994 |
| JP | H08316001 | A | 11/1996 |
| JP | H09320911 | A | 12/1997 |
| JP | 2001326354 | A | 11/2001 |
| JP | 2003060119 | A | 2/2003 |
| JP | 2006261643 | A | 9/2006 |
| JP | 2007243102 | A | 9/2007 |
| JP | 2008021987 | A | 1/2008 |
| JP | 2009076576 | A | 4/2009 |
| JP | 2013153129 | A | 8/2013 |
| JP | 2013232620 | A | 11/2013 |
| WO | 2006085492 | A1 | 8/2006 |
| WO | 2013058232 | A1 | 4/2013 |

* cited by examiner

401C

401D

1001

1001

1401

1401A

1401C

1401D

9A

1701

1951

| | Number of parallels | Peripheral length (μm) | Area (μm²) |
|---|---|---|---|
| Chip part 2001 | 1 | 350 | 2514 |
| TEG1 | 2 | 700 | 5028 |
| TEG2 | 3 | 1050 | 7542 |
| TEG3 | 4 | 1400 | 10056 |
| TEG4 | 5 | 1750 | 12570 |
| TEG5 | 5 | 700 | 4620 |
| TEG6 | 5 | 1050 | 7245 |
| TEG7 | 5 | 1400 | 9870 |

FIG. 100

| Number of parallels | $L_D$ (μm) | $W_D$ (μm) | Total extension of first diffusion region 2110 (μm) | Total area of first diffusion region 2110 ($\mu m^2$) | $W_C$ (μm) | $W_M$ (μm) | $W_S$ (μm) | Inter-terminal capacitance Ct(pF) | ESD resistance (kV) |
|---|---|---|---|---|---|---|---|---|---|
| 1 | 20~200 | 5~20 | 350 | 2514 | 10~15 | 12~20 | 3~10 | 4.95 | 6.0 |
| 5 | 25 | 15 | 400 | 1875 | 10 | 21 | 3 | 5.4 | 11.0 |
| 6 | 20 | 15 | 420 | 1800 | 10 | 20 | 2 | 5.5 | 11.5 |
| 7 | 22 | 12 | 476 | 1848 | 7 | 17 | 2 | 5.5 | 13.0 |
| 8 | 26 | 9 | 560 | 1872 | 4 | 14 | 2 | 5.5 | 14.0 |
| 10 | 30 | 6 | 720 | 1800 | 1 | 11 | 2 | 5.8 | 15.0 |

2401

CHIP PARTS AND METHOD FOR MANUFACTURING THE SAME, CIRCUIT ASSEMBLY HAVING THE CHIP PARTS AND ELECTRONIC DEVICE

CROSS-REFERENCE TO RELATED APPLICATIONS

This is a continuation of U.S. application Ser. No. 15/832,358, filed on Dec. 5, 2017, and allowed on Jun. 19, 2019; which is a continuation of Ser. No. 14/587,843, filed on Dec. 31, 2014, (now U.S. Pat. No. 9,859,240 issued on Jan. 2, 2018). Furthermore, this application claims the benefit of priority of the Japanese Patent Application No. 2014-1910 filed in the Japan Patent Office on Jan. 8, 2014, Japanese Patent Application No. 2014-1911 filed in the Japan Patent Office on Jan. 8, 2014, Japanese Patent Application No. 2014-17689 filed in the Japan Patent Office on Jan. 31, 2014, and Japanese Patent Application No. 2014-220433 filed in the Japan Patent Office on Oct. 29, 2014. The disclosures of these prior U.S. and Japanese applications are incorporated herein by reference.

FIELD OF THE INVENTION

The present invention relates to a chip part, a method for manufacturing the chip part, and a circuit assembly and an electronic device that include the chip part.

BACKGROUND ART

Patent Document 1 (Japanese Patent Application Publication No. 8-316001) discloses a chip type electronic part including a pair of electrodes formed on an insulating substrate, an element formed between the pair of electrodes, an overcoat layer made of a photosensitive material and covering the element, and a marking formed by irradiating the overcoat layer with ultraviolet rays. The chip type electronic part is mounted on a printed circuit board (mounting substrate), for example, by soldering, etc.

BRIEF SUMMARY OF THE INVENTION

Ordinarily, with mounting substrates having a chip part mounted thereon, only those that are judged to be "non-defective" upon undergoing a substrate appearance inspection process are shipped. As judgment items in the substrate appearance inspection process, an inspection of the state of soldering on the mounting substrate, a polarity inspection in a case where there is polarity to the electrodes of the chip part, etc., are performed by an automatic optical inspection machine (AOI).

Among these judgment items, the polarity inspection is performed, for example, according to whether or not the marking formed on the chip part is detected to be of a color (for example, white, blue, etc.) of not less than a value set in advance in a polarity inspection window at a predetermined position of the inspection machine, and if the marking is detected as such, the "non-defective" judgment is made.

However, a chip part is not necessarily mounted in a horizontal attitude onto a mounting substrate and there are cases where a chip part is mounted in an inclined attitude onto a mounting substrate. In this case, depending on the inclination angle, a portion of the light irradiated from the inspection machine onto the chip part may be reflected outside the polarity window or the wavelength of the reflected light may change with respect to the incident light so that the detected color is recognized (misrecognized) to be a color of not more than the set value. This leads to a problem that a "defective" judgment is made despite the polarity direction of the electrodes being correct.

To prevent such misrecognition, a detection system (part recognizing camera, etc.) and an illumination system (light source, etc.) of the automatic optical inspection machine must be optimized according to each inspection object to improve the inspection precision and thus extra effort is required for the appearance inspection and productivity is decreased. Moreover, such effort becomes excessive as chip parts of even smaller size become desired.

Therefore a main object of the present invention is to provide a chip part and a method for manufacturing the chip part with which a polarity direction can be judged with good precision while suppressing the decrease of productivity.

Further, another object of the present invention is to provide a circuit assembly and an electronic device that include a chip part with which a polarity direction can be judged with good precision while suppressing the decrease of productivity.

BRIEF DESCRIPTION OF THE DRAWINGS

FIG. 100 is a table of values of respective arrangements, inter-terminal capacitances, and ESD resistances of the chip part shown in FIG. 99.

FIG. 117 is a schematic perspective view of a chip part according to an eighth reference example.

FIGS. 118A, 118B and 118C show plan views of the chip part shown in FIG. 117 as viewed from a rear surface side and shows diagrams for explaining the arrangements of projecting marks.

FIGS. 119A, 119B and 119C show plan views of the chip part shown in FIG. 117 as viewed from the rear surface side and shows diagrams showing modification examples of a projecting mark.

FIGS. 120A and 120B show diagrams of examples with which the types of information that can be indicated by projecting marks are made abundant by varying the types and positions of the projecting marks.

FIG. 121 is a schematic plan view of a portion of a resist pattern used to form grooves for the projecting marks in the chip part shown in FIG. 117.

FIG. 122 is a perspective view of an outer appearance of a smartphone that is an example of an electronic device in which the chip parts according to the sixth to eighth reference examples are used.

FIG. 123 is an illustrative plan view of the arrangement example of an electronic circuit assembly housed in the smartphone.

FIG. 124 to FIG. 126 are schematic plan views respectively of first to third modification examples of the chip part shown in FIG. 77.

FIG. 127 is a sectional view of the chip part shown in FIG. 126.

FIG. 128A to FIG. 128D are sectional views of a method for manufacturing the chip part shown in FIG. 126.

DETAILED DESCRIPTION OF THE INVENTION

Figure 1:
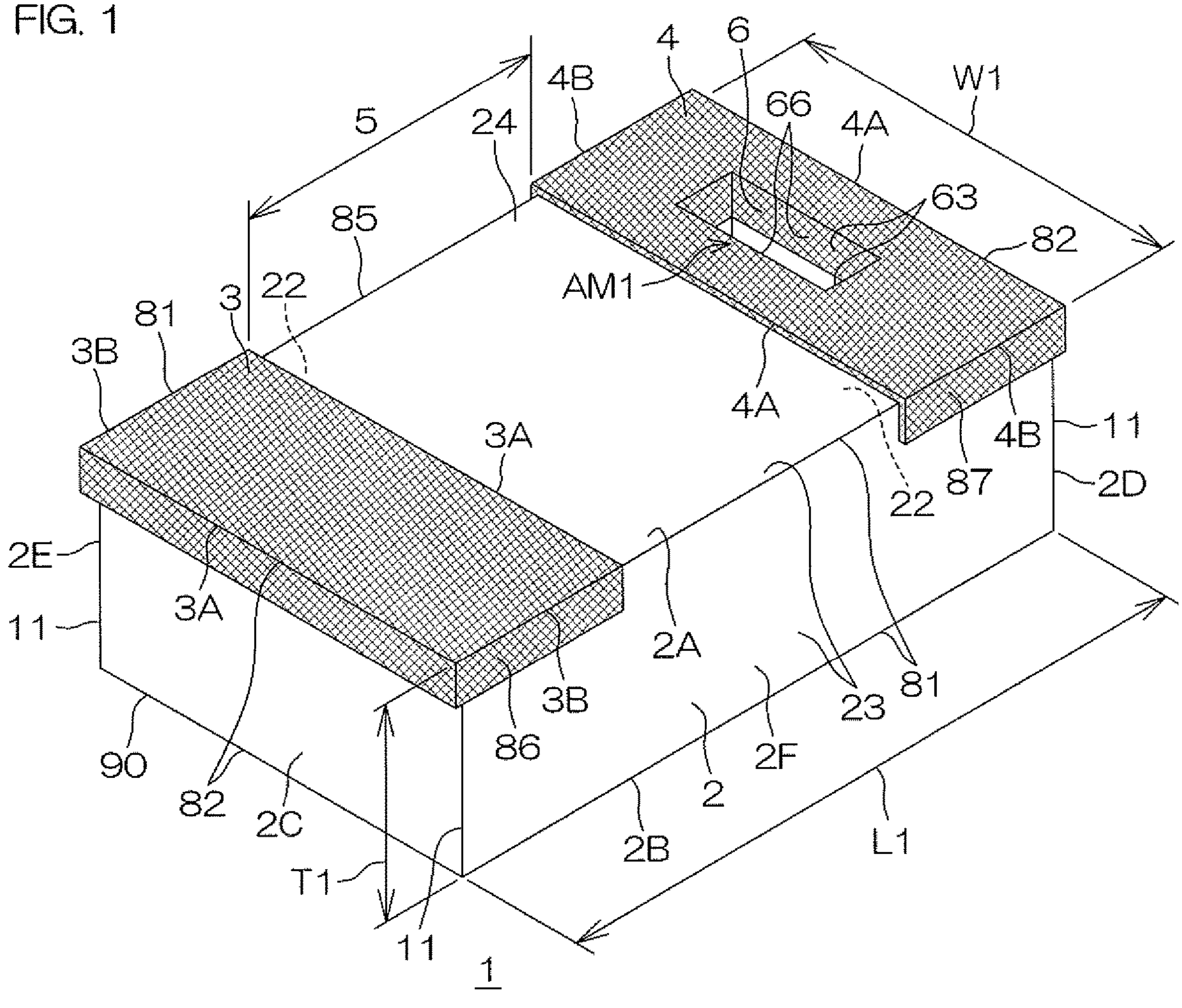
FIG. 1 is a schematic perspective view of a chip part according to a first preferred embodiment of the present invention.

A chip part according to a preferred embodiment of the present invention includes a substrate having a penetrating hole formed therein, a pair of electrodes formed on a front surface of the substrate and including one electrode formed at a position overlapping the penetrating hole in a plan view and another electrode facing the one electrode along the front surface of the substrate, and an element formed on the front surface side of the substrate and electrically connected to the pair of electrodes.

With this arrangement, when the chip part is mounted on a mounting substrate, the respective positions of the one electrode and the other electrode can be confirmed based on the position of the penetrating hole. In a case where there is polarity to the pair of electrodes, the polarity direction can thereby be judged easily. Moreover, the polarity judgment is made not based on brightness or tint detected by an inspection machine but based on the penetrating hole (external shape of the penetrating hole) that is unchanged even when an inclination of the chip part with respect to the mounting substrate changes. Therefore, even if a mounting substrate, on which the chip part is mounted in an inclined attitude, and a mounting substrate, on which the chip part is mounted in a horizontal attitude, are mixed together in an appearance inspection process, the polarity direction can be judged with stable quality based on the penetrating hole and without having to optimize a detection system, etc., of the inspection machine according to each mounting substrate.

Preferably in the chip part, the one electrode includes an opening portion exposing the penetrating hole. With this arrangement, the polarity direction at which the one electrode is formed can be indicated reliably by the penetrating hole and the opening portion.

Preferably in the chip part, the one electrode overlaps with the penetrating hole at a position avoiding a central portion of the one electrode. With this arrangement, in performing an electrical test using a probe, a position of contact of the probe and the one electrode can be set at the central portion of the one electrode to effectively suppress a tip of the probe from entering into the penetrating hole. Consequently, the electrical test can be performed satisfactorily.

In the chip part, each of the one electrode and the other electrode may be formed integrally on the front surface and a side surface of the substrate so as to cover a peripheral edge portion of the substrate.

With this arrangement, each electrode is formed on the side surface in addition to the front surface of the substrate and the adhesion area for soldering the chip part onto the mounting substrate can be enlarged. Consequently, the amount of solder adsorbed to the electrode can be increased to improve the adhesion strength. Also, the solder is adsorbed so as to extend around from the front surface to the side surface of the substrate and the chip part can thus be held from the two directions of the front surface and the side surface of the substrate in the mounted state. The mounting form of the chip part can thus be stabilized.

In the chip part, a plurality of the penetrating holes may be formed. With this arrangement, the position of the one electrode can be indicated by the plurality of penetrating holes. The respective positions of the one electrode and the other electrode can thereby be confirmed even more readily based on the positions of the plurality of penetrating holes when the chip part is mounted on the mounting substrate.

Preferably in the chip part, the element is formed between the pair of electrodes.

In the chip part, the element may include a plurality of elements having mutually different functions and disposed on the substrate at intervals from each other and the pair of electrodes may be formed on the substrate so as to be electrically connected to each of the plurality of elements.

With this arrangement, the chip part constitutes a composite chip part in which a plurality of circuit elements are disposed on a substrate in common. With the composite chip part, the bonding area (mounting area) with respect to the mounting substrate can be reduced. Also, by the composite chip part being arranged as an N-tuple chip (where N is a positive integer), a chip part providing the same functions obtained by performing N times of mounting of a chip part carrying only one element can be mounted in a single process. Further, in comparison to a single-component chip part, the area per chip part can be enlarged to stabilize a suction operation by a suction nozzle of an automatic mounting machine.

In the chip part, the element may include a diode and the pair of electrodes may include a cathode electrode and an anode electrode electrically connected respectively to a cathode and an anode of the diode.

With this arrangement, the penetrating hole formed in the substrate functions as a cathode mark that indicates the cathode electrode or an anode mark that indicates the anode electrode. Therefore even if in the mounting of the chip part onto the mounting substrate, the mounting is performed such that the cathode electrode and the anode electrode are reversed, the polarity of the chip part can be judged based on the position of the penetrating hole. The reliability of mounting of the chip part including the diode onto the mounting substrate can thus be improved further.

In the chip part, a rear surface of the substrate at the side opposite to the front surface is mirror-finished.

With this arrangement, the rear surface of the chip part is mirror-finished and therefore light made incident onto the rear surface from an inspection machine can be reflected with good efficiency. Therefore in a case where various mounting substrates that differ in the condition of inclination of the chip part with respect to the mounting substrate are to be inspected, information (brightness or tint of reflected light) for distinguishing a certain inclination from another inclination can be utilized satisfactorily by the inspection machine. Consequently, the inclination of the chip part can be detected satisfactorily. In particular, with the preferred embodiment of the present invention, information on reflected light from the chip part can be omitted as an index for judging the polarity direction and the lowering of the precision of judgment of the polarity direction of the chip part due to such mirror-finishing of the rear surface can be prevented.

In the chip part, each of the pair of electrodes may include an Ni layer, an Au layer, and a Pd layer interposed between the Ni layer and the Au layer.

With this arrangement, the Au layer is formed at a frontmost surface of each electrode functioning as an external connection electrode of the chip part. Excellent solder wettability and high reliability can thus be achieved in mounting the chip part onto the mounting substrate. Also, with the electrode of this arrangement, even if a penetrating hole (pinhole) forms in the Au layer of the electrode due to thinning of the Au layer, the Pd layer interposed between the Ni layer and the Au layer closes the penetrating hole and the Ni layer can thus be prevented from being exposed to the exterior through the penetrating hole and becoming oxidized.

The chip part may be applied, for example, in a circuit assembly, etc., that includes a mounting substrate. In this case, the circuit assembly may include the chip part and a mounting substrate having lands, solder-bonded to the pair of electrodes, on a mounting surface facing the pair of electrodes on the substrate.

With this arrangement, the chip part according to the preferred embodiment of the present invention is included and therefore a circuit assembly having a highly reliable electronic circuit without error in the polarity direction of the chip part can be provided.

The circuit assembly may be applied, for example, in an electronic device, etc. In this case, the electronic device may include the circuit assembly and a casing that houses the circuit assembly.

With this arrangement, the chip part according to the preferred embodiment of the present invention is included and therefore an electronic device having a highly reliable electronic circuit without error in the polarity direction of the chip part can be provided.

A method for manufacturing a chip part according to a preferred embodiment of the present invention includes a step of forming a plurality of elements at intervals from each other on a substrate, a groove forming step of selectively removing the substrate to form a groove defining a chip region including at least one of the elements and a penetrating hole groove for forming a penetrating hole in the chip region, an electrode forming step of forming a pair of electrodes, including one electrode at a position overlapping the penetrating hole and another electrode facing the one electrode along a front surface of the substrate, in the chip region so as to be electrically connected to the element, and a step of grinding the substrate from a rear surface at the opposite side of the front surface until the groove and the penetrating hole groove are reached to divide and separate a plurality of the chip regions along the groove into a plurality of individual chip parts, each having the penetrating hole formed therein.

By this method, chip parts exhibiting the same effects as the chip part according to the one aspect described above can be manufactured. Also by this method, the groove that defines the chip region and the penetrating hole groove for forming the penetrating hole can be formed at the same time and there is thus no need to separately prepare an apparatus for forming the penetrating hole. The process for manufacturing the chip part can thus be simplified and equipment investment can be reduced. The productivity of the chip part can also be improved thereby.

In the method for manufacturing a chip part, the electrode forming step may include a step of forming an opening portion, exposing the penetrating hole groove, in the one electrode.

By this method, a chip part can be manufactured by which the polarity direction in which the one electrode is formed can be indicated reliably by the penetrating hole and the opening portion.

In the method for manufacturing a chip part, a step of forming the one electrode so as to overlap the penetrating hole at a position avoiding a central portion of the one electrode in the electrode forming step may be included.

By this method, a chip part can be manufactured by which, in performing an electrical test using a probe, a position of contact of the probe and the one electrode can be set at the central portion of the one electrode to effectively suppress a tip of the probe from entering into the penetrating hole to enable the electrical test to be performed satisfactorily.

In the method for manufacturing a chip part, a step of forming an insulating film on a side surface of the groove prior to the electrode forming step may be included and the electrode forming step may include a step of forming each of the one electrode and the other electrode by electroless plating so as to integrally cover the front surface of the chip region and the side surface of the groove.

By this method, each electrode is formed on the side surface in addition to the front surface of the substrate to enable manufacturing a chip part with which the adhesion area for soldering onto the mounting substrate is enlarged. Consequently, with the chip part, the amount of solder adsorbed to the electrode can be increased to improve the adhesion strength. Also, the solder is adsorbed so as to extend around from the front surface to the side surface of the substrate and the chip part can thus be held from the two directions of the front surface and the side surface of the substrate in the mounted state. The mounting form of the chip part can thus be stabilized.

In the method for manufacturing a chip part, the groove forming step may include a step of forming a plurality of the penetrating hole grooves.

By this method, a chip part can be manufactured with which the position of the one electrode can be indicated by the plurality of penetrating holes. The respective positions of the one electrode and the other electrode can thereby be confirmed even more readily based on the positions of the plurality of penetrating hole when the chip part is mounted on the mounting substrate.

In the method for manufacturing a chip part, the groove forming step may include a step of forming the groove and the penetrating hole groove by etching.

In the method for manufacturing a chip part, the step of forming the elements may include a step of forming a diode on the substrate and the step of forming the pair of electrodes may include a step of forming a cathode electrode and an anode electrode electrically connected respectively to a cathode and an anode of the diode.

By this method, a chip part can be manufactured with which the penetrating hole formed in the substrate functions as a cathode mark that indicates the cathode electrode or an anode mark that indicates the anode electrode. Therefore even if in the mounting of the chip part onto the mounting substrate, the mounting is performed such that the cathode electrode and the anode electrode are reversed, the polarity direction of the chip part can be judged based on the position of the penetrating hole. The reliability of mounting of the chip part including the diode onto the mounting substrate can thus be improved further.

Preferred embodiments of the present invention and embodiments according to reference examples (first to eighth reference examples) shall now be described in detail with reference to the attached drawings.

First Preferred Embodiment

FIG. 1 is a schematic perspective view of a chip part 1 according to a first preferred embodiment of the present invention. For the sake of description, in FIG. 1, cross hatching is applied to first and second connection electrodes 3 and 4 to be described later.

The chip part 1 is a minute chip part and has a substantially rectangular parallelepiped shape as shown in FIG. 1. The planar shape of the chip part 1 may, for example, be a rectangle (0603 chip) with a length L1 along a long side 81 being not more than 0.6 mm and a length W1 along a short side 82 being not more than 0.3 mm or may be a rectangle (0402 chip) with the length L1 along the long side 81 being not more than 0.4 mm and the length W1 along the short side 82 being not more than 0.2 mm. More preferably, the dimension of the chip part 1 is a rectangle (03015 chip) with the length L1 along the long side 81 being 0.3 mm and the length W1 along the short side 82 being 0.15 mm. The chip part 1 has a thickness T1, for example, of 0.1 mm.

The chip part 1 mainly includes a substrate 2 that constitutes the main body of the chip part 1, the first and second connection electrodes 3 and 4, and an element region 5, in which is selectively formed a circuit element connected to the exterior by the first and second connection electrodes 3 and 4.

The substrate 2 has a substantially rectangular parallelepiped chip shape. With the substrate 2, one surface constituting the upper surface in FIG. 1 is an element forming surface 2A. The element forming surface 2A is the surface of the substrate 2 on which the circuit element is formed and has a substantially oblong shape. The surface at the opposite side of the element forming surface 2A in the thickness direction of the substrate 2 is a rear surface 2B. The element forming surface 2A and the rear surface 2B are substantially the same in dimension and same in shape and are parallel to each other. A rectangular edge defined by the pair each of long sides 81 and short sides 82 at the element forming surface 2A shall be referred to as a peripheral edge portion 85 and a rectangular edge defined by the pair each of long sides 81 and short sides 82 at the rear surface 2B shall be referred to as a peripheral edge portion 90. When viewed from the direction of a normal orthogonal to the element forming surface 2A (rear surface 2B), the peripheral edge portion 85 and the peripheral edge portion 90 are overlapped.

As surfaces besides the element forming surface 2A and the rear surface 2B, the substrate 2 has a plurality of side surfaces (a side surface 2C, a side surface 2D, a side surface 2E, and a side surface 2F). The plurality of side surfaces 2C to 2F extend so as to intersect (specifically, so as to be orthogonal to) each of the element forming surface 2A and the rear surface 2B and join the element forming surface 2A and the rear surface 2B.

The side surface 2C is constructed between the short sides 82 at one side in a long direction (the front left side in FIG. 1) of the element forming surface 2A and the rear surface 2B, and the side surface 2D is constructed between the short sides 82 at the other side in the long direction (the inner right side in FIG. 1) of the element forming surface 2A and the rear surface 2B. The side surface 2C and the side surface 2D are the respective end surfaces of the substrate 2 in the long direction. The side surface 2E is constructed between the long sides 81 at one side in a short direction (the inner left side in FIG. 1) of the element forming surface 2A and the rear surface 2B, and the side surface 2F is constructed between the long sides 81 at the other side in the short direction (the front right side in FIG. 1) of the element forming surface 2A and the rear surface 2B. The side surface 2E and the side surface 2F are the respective end surfaces of the substrate 2 in the short direction. Each of the side surface 2C and the side surface 2D intersects (specifically, is orthogonal to) each of the side surface 2E and the side surface 2F. Mutually adjacent surfaces among the element forming surface 2A to side surface 2F thus form a right angle.

In its long direction, the element forming surface 2A includes a one end portion at which the first connection electrode 3 is formed and another end portion at which the second connection electrode 4 is formed. The one end portion of the element forming surface 2A is an end portion at the side surface 2D side of the substrate 2, and the other end portion of the element forming surface 2A is an end portion at the side surface 2C side of the substrate 2. A penetrating hole 6 is formed in the other end portion of the element forming surface 2A. The penetrating hole 6 penetrates through the rear surface 2B in the thickness direction from the element forming surface 2A.

The penetrating hole 6 is formed to a substantially rectangular shape in a plan view and has four wall surfaces 66, among which the adjacent surfaces intersect mutually at right angles. The four wall surfaces 66 are constructed between the element forming surface 2A and the rear surface 2B and are formed to form right angles with the element forming surface 2A and the rear surface 2B of the substrate 2. Preferably, a length of the penetrating hole 6 in a direction along the long side 81 of the substrate 2 is 0.025 μm to 0.05 mm and a length of the penetrating hole 6 in a direction along the short side 82 of the substrate 2 is 0.5 μm to 0.1 mm.

Although with the present preferred embodiment, an example in which the penetrating hole 6 of substantially rectangular shape in a plan view is formed shall be described, the penetrating hole 6 may be of any shape, such as a circular shape in a plan view, a polygonal shape in a plan view, etc.

With the substrate 2, the respective entireties of the element forming surface 2A, the side surfaces 2C to 2F, and the wall surfaces 66 of the penetrating hole 6 are covered by a passivation film 23. Therefore to be exact, the respective entireties of the element forming surface 2A, the side surfaces 2C to 2F, and the wall surfaces 66 of the penetrating hole 6 in FIG. 1 are positioned at the inner sides (rear sides) of the passivation film 23 and are not exposed to the exterior. The chip part 1 further has a resin film 24. The resin film 24 covers the entirety (the peripheral edge portion 85 and a region at the inner side thereof) of the passivation film 23 on the element forming surface 2A. The passivation film 23 and the resin film 24 shall be described in detail later.

The first and second connection electrodes 3 and 4 are disposed at the one end portion and the other end portion of the element forming surface 2A and are formed across an interval from each other.

The first connection electrode 3 has a pair of long sides 3A and a pair of short sides 3B that define four sides in a plan view and a peripheral edge portion 86. The long sides 3A and the short sides 3B of the first connection electrode 3 are orthogonal in a plan view. The peripheral edge portion 86 of the first connection electrode 3 is formed integrally on the element forming surface 2A of the substrate 2 so as to extend from the element forming surface 2A to the side surfaces 2C, 2E, and 2F and thereby cover the peripheral edge portion 85. In the present preferred embodiment, the peripheral edge portion 86 is formed so as to cover respective corner portions 11 at which the side surfaces 2C, 2E, and 2F of the substrate 2 intersect mutually.

On the other hand, the second connection electrode 4 has a pair of long sides 4A and a pair of short sides 4B that define four sides in a plan view, a peripheral edge portion 87, and an opening portion 63. The long sides 4A and the short sides 4B of the second connection electrode 4 are orthogonal in a plan view. The peripheral edge portion 87 of the second connection electrode 4 is formed integrally on the element forming surface 2A of the substrate 2 so as to extend from the element forming surface 2A to the side surfaces 2D, 2E, and 2F and thereby cover the peripheral edge portion 85. In the present preferred embodiment, the peripheral edge portion 87 is formed so as to cover respective corner portions 11 at which the side surfaces 2D, 2E, and 2F of the substrate 2 intersect mutually.

In the present preferred embodiment, the opening portion 63 is formed at a central portion of the second connection electrode 4. That is, the penetrating hole 6 is formed in a portion at which the opening portion 63 is formed at the central portion of the second connection electrode 4. The opening portion 63 of the second connection electrode 4 is formed integrally so as to extend from the element forming surface 2A to the wall surfaces 66 so as to cover the wall surfaces 66 of the penetrating hole 6 formed in the substrate 2. A region of the second connection electrode 4 in which the penetrating hole 6 is formed is thus opened by the opening portion 63 of approximately the same size as the penetrating hole 6 and the penetrating hole 6 (the wall surfaces 66 of the penetrating hole 6) is exposed to the exterior from the opening portion 3. The second connection electrode 4 is thus formed to a shape that differs from and has a smaller area than the first connection electrode 3 in a plan view.

With the substrate 2, each corner portion 11 may have a chamfered rounded shape in a plan view. In this case, the structure is made capable of suppressing chipping during a manufacturing process or mounting of the chip part 1.

The circuit element is formed in the element region 5. The circuit element is formed in a region of the element forming surface 2A of the substrate 2 between the first connection electrode 3 and the second connection electrode 4 and is covered from above by the passivation film 23 and the resin film 24.

Figure 2:
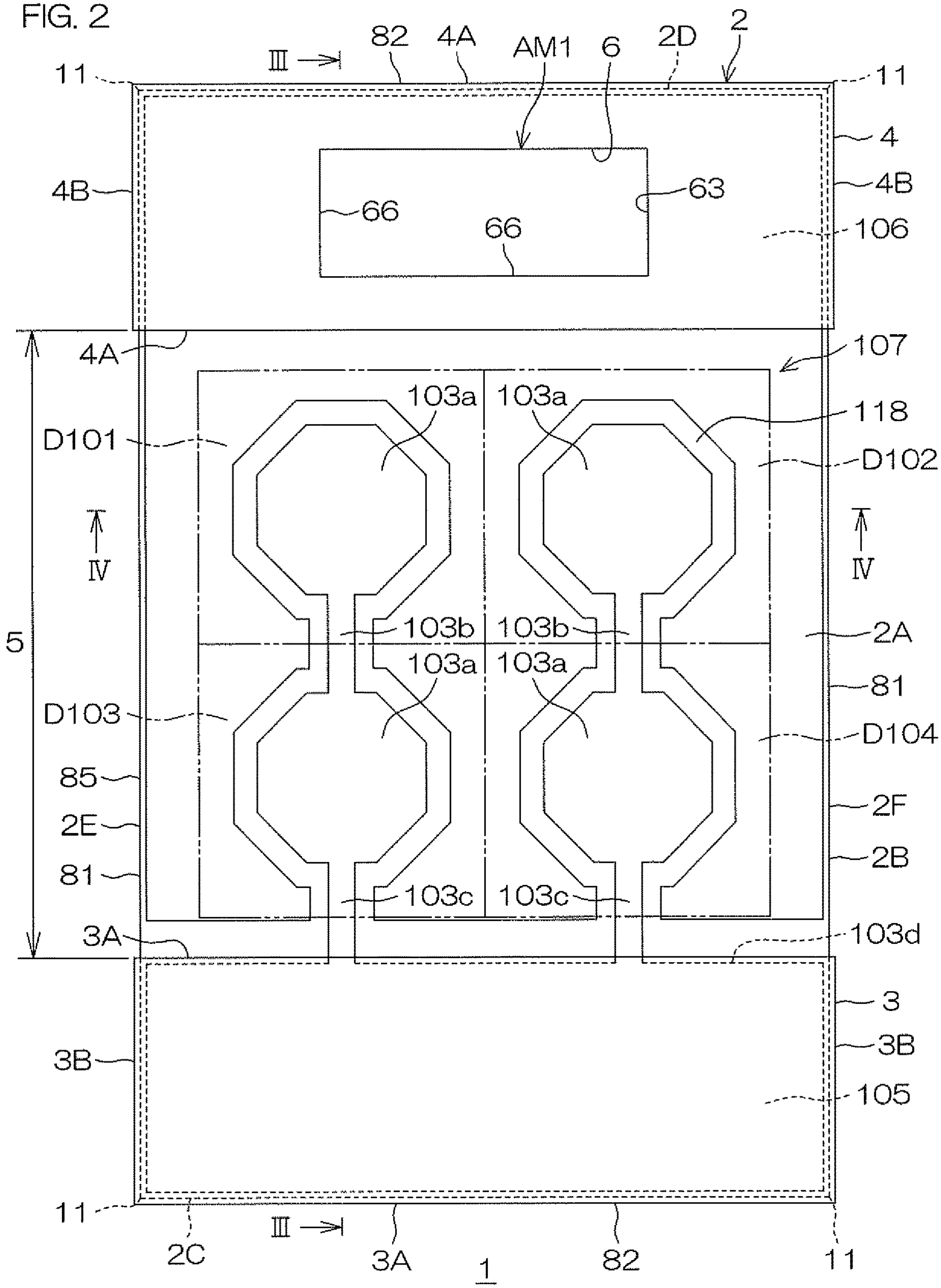
FIG. 2 is a plan view of the chip part shown in FIG. 1.
Figure 3:
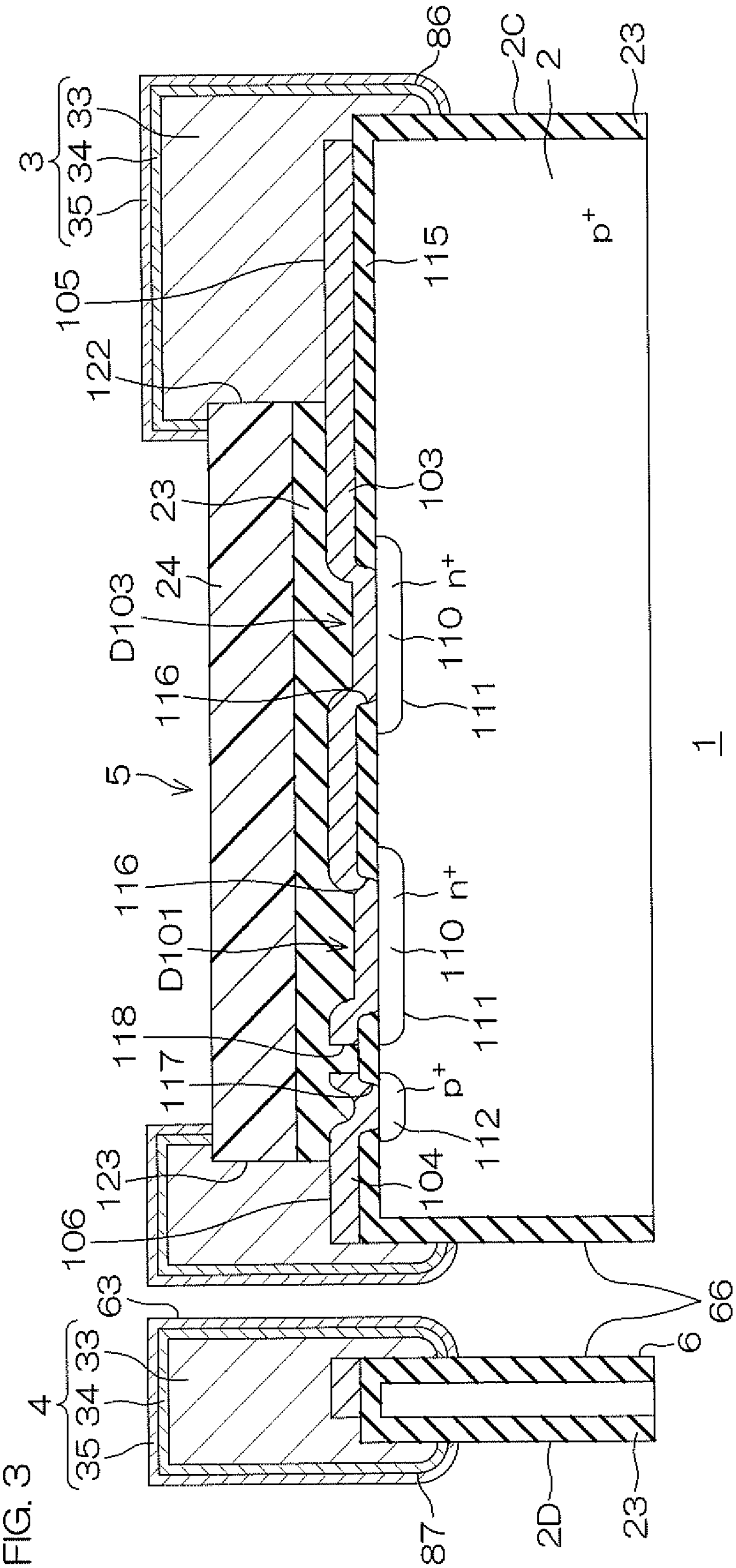
FIG. 3 is a sectional view taken along section line III-III shown in FIG. 2.
Figure 4:
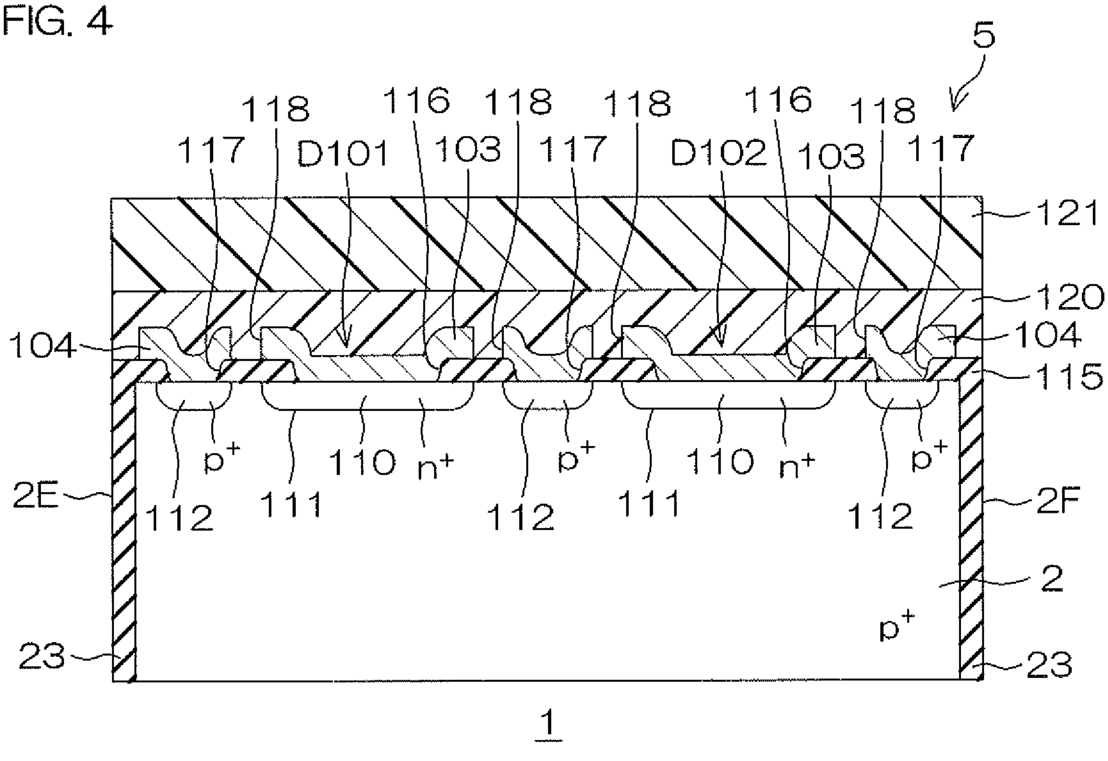
FIG. 4 is a sectional view taken along section line IV-IV shown in FIG. 2.

FIG. 2 is a plan view of the chip part 1. FIG. 3 is a sectional view taken along section line III-III shown in FIG. 2. FIG. 4 is a sectional view taken along section line IV-IV shown in FIG. 2.

The chip part 1 includes the substrate 2, a plurality of diode cells D101 to D104 that are formed on the semiconductor substrate 2, and a cathode electrode film 103 and an anode electrode film 104 connecting the plurality of diode cells D101 to D104 in parallel. The first connection electrode 3 is connected to the cathode electrode film 103 and the second connection electrode 4 is connected to the anode electrode film 104. That is, in the present preferred embodiment, the first connection electrode 3 is a cathode electrode and the second connection electrode 4 is an anode electrode. Therefore in the present preferred embodiment, the penetrating hole 6 (opening portion 63) described in FIG. 1 functions as an anode mark AM1 that indicates the polarity direction of the second connection electrode 4.

In the present preferred embodiment, the substrate 2 is a $p^+$-type semiconductor substrate (for example, a silicon substrate). A cathode pad 105 arranged to be connected to the first connection electrode 3 and an anode pad 106 arranged to be connected to the second connection electrode 4 are disposed at respective end portions of the substrate 2. A diode cell region 107 is provided between the pads 105 and 106 (that is, in the element region 5).

In the present preferred embodiment, the diode cell region 107 is formed to a rectangular shape. The plurality of diode cells D101 to D104 are disposed inside the diode cell region 107. In regard to the plurality of diode cells D101 to D104, four are provided in the present preferred embodiment and these are aligned two-dimensionally at equal intervals in a matrix along the long direction and short direction of the substrate 2.

Figure 5:
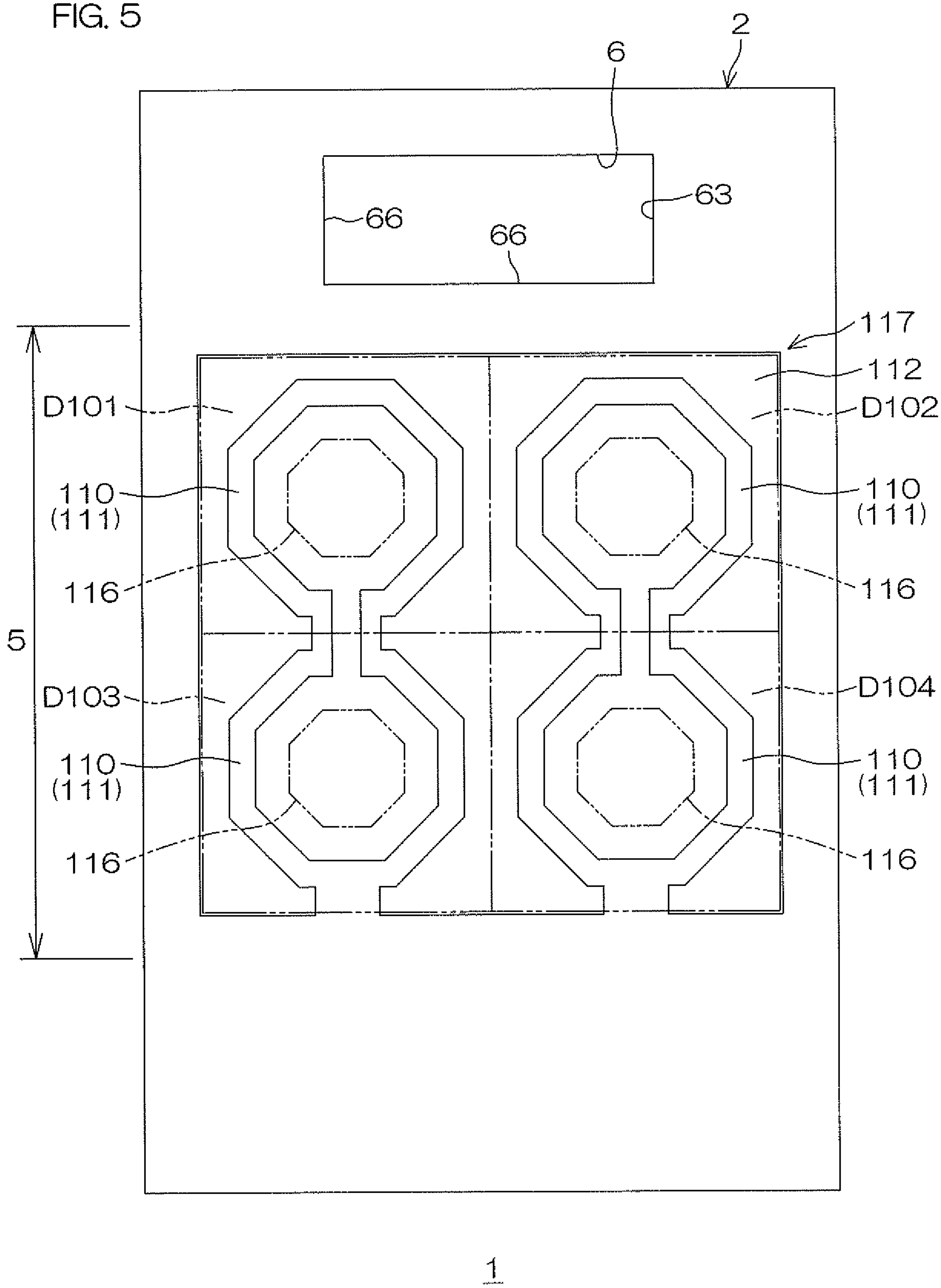
FIG. 5 is a plan view of the chip part shown in FIG. 1 with a cathode electrode, an anode electrode, and the arrangement formed thereon being removed to show the structure of a front surface of a substrate.

FIG. 5 is a plan view of the chip part shown in FIG. 1 with the cathode electrode film 103, the anode electrode film 104, and the arrangement formed thereon being removed to show the structure of the front surface of the substrate 2. In each of the regions of the diode cells D101 to D104, an $n^+$-type region 110 is formed in a surface layer region of the $p^+$-type substrate 2. The $n^+$-type regions 110 are separated according to each individual diode cell. The diode cells D101 to D104 are thereby made to respectively have p-n junction regions 111 that are separated according to each individual diode cell.

In the present preferred embodiment, the plurality of diode cells D101 to D104 are formed to be equal in size and equal in shape and are specifically formed to rectangular shapes, and the $n^+$-type region 110 with a polygonal shape is formed in the rectangular region of each diode cell. In the present preferred embodiment, each $n^+$-type region 110 is formed to a regular octagon having four sides extending along the four sides defining the rectangular region of the corresponding diode cell among the diode cells D101 to D104 and another four sides respectively facing the four corner portions of the rectangular region of the corresponding diode cell among the diode cells D1 to D4. Further in the surface layer region of the substrate 2, a $p^+$-type region 112 is formed in a state of being separated from the $n^+$-type regions 110 across a predetermined interval. In the diode cell region 107, the $p^+$-type region 112 is formed to a pattern that avoids a region in which the cathode electrode film 103 is disposed.

As shown in FIG. 3 and FIG. 4, an insulating film 115 (omitted from illustration in FIG. 1 and FIG. 2), constituted of an oxide film, etc., is formed on the front surface of the semiconductor substrate 2. Contact holes 116 exposing front surfaces of the respective $n^+$-type regions 110 of the diode cells D101 to D104 and a contact hole 117 exposing the $p^+$-type region 112 are formed in the insulating film 115. The cathode electrode film 103 and the anode electrode film 104 are formed on the front surface of the insulating film 115.

The cathode electrode film 103 enters into the contact holes 116 from the front surface of the insulating film 115 and forms an ohmic contact with the respective $n^+$-type regions 110 of the diode cells 101 to 104 inside the contact holes 116. The anode electrode film 104 extends to inner sides of the contact hole 117 from the front surface of the insulating film 115 and forms an ohmic contact with the $p^+$-type region 112 inside the contact hole 117. In the present preferred embodiment, the cathode electrode film 103 and the anode electrode film 104 are constituted of electrode films made of the same material.

As each of the cathode electrode film 103 and the anode electrode film 104, a Ti/Al laminated film having a Ti film as a lower layer and an Al film as an upper layer or an AlCu film may be applied. Besides these, an AlSi film may also be used as the electrode film. When an AlSi film is used, an ohmic contact between the anode electrode film 104 and the substrate 2 can be formed without having to provide the $p^+$-type region 112 on the front surface of the substrate 2. A process for forming the $p^+$-type region 112 can thus be omitted.

The cathode electrode film 103 and the anode electrode film 104 are separated by a slit 118. In the present preferred embodiment, the slit 118 is formed to a frame shape (that is, a regular octagonal frame shape) matching the planar shapes of the $n^+$-type regions 110 of the diode cells D101 to D104 so as to border the $n^+$-type regions 110. Accordingly, the cathode electrode film 103 has, in the regions of the respective diode cells D101 to D104, cell junction portions 103*a* with planar shapes matching the shapes of the $n^+$-type regions 110 (that is, regular octagonal shapes), the cell junction portions 103*a* are put in communication with each other by rectilinear bridging portions 103*b* and are connected by other rectilinear bridging portions 103*c* to a large external connection portion 103*d* of rectangular shape that is formed directly below the cathode pad 105. On the other hand, the anode electrode film 104 is formed on the front surface of the insulating film 115 so as to surround the cathode electrode film 103 across an interval corresponding to the slit 118 of substantially fixed width and is formed integrally to extend to a rectangular region directly below the anode pad 106.

The cathode electrode film 103 and the anode electrode film 104 are covered by the passivation film 23 (omitted from illustration in FIG. 1 and FIG. 2), constituted, for example, of a nitride film (SiN film), and the resin film 24, made of polyimide, etc., is further formed on the passivation film 23. A notched portion 122 selectively exposing the cathode pad 105 and a notched portion 123 selectively exposing the anode pad 106 are formed so as to penetrate through the passivation film 23 and the resin film 24. The first and second connection electrodes 3 and 4 are connected to the corresponding pads 105 and 106.

The first connection electrode 3 has an Ni layer 33, a Pd layer 34, and an Au layer 35 in that order from the element forming surface 2A side and the side surface 2C, 2E, and 2F sides. That is, the first connection electrode 3 has a laminated structure constituted of the Ni layer 33, the Pd layer 34, and the Au layer 35 not only in a region on the element forming surface 2A but also in regions on the side surfaces 2C, 2E, and 2F. Therefore in the first connection electrode 3, the Pd layer 34 is interposed between the Ni layer 33 and the Au layer 35. In the first connection electrode 3, the Ni layer 33 takes up a large portion of each connection electrode and the Pd layer 34 and the Au layer 35 are formed significantly thinly in comparison to the Ni layer 33. The Ni layer 33 serves the role of intermediating between the cathode electrode film 103 and the anode electrode film 104 (for example, the Al of the respective electrode films 103 and 104) in the respective pads 105 and 106 and solder when the chip part 1 is mounted on a mounting substrate.

Meanwhile, the Ni layer 33, the Pd layer 34, and the Au layer 35 are also formed in the same arrangement in the second connection electrode 4. The second connection electrode 4 has the Ni layer 33, the Pd layer 34, and the Au layer 35 in that order from the element forming surface 2A side, the side surface 2D, 2E, and 2F sides, and the wall surface 66 sides of the penetrating hole 6. That is, the second connection electrode 4 has the laminated structure constituted of the Ni layer 33, the Pd layer 34, and the Au layer 35 from regions on the wall surfaces 66 of the penetrating hole in addition to a region on the element forming surface 2A and in regions on the side surfaces 2D, 2E, and 2F.

With the first and second connection electrodes 3 and 4, the front surface of the Ni layer 33 is thus covered by the Au layer 35 and therefore the Ni layer 33 can be prevented from becoming oxidized. Also, with the first and second connection electrodes 3 and 4, even if a penetrating hole (pinhole) forms in the Au layer 35 due to thinning of the Au layer 35, the Pd layer 34 interposed between the Ni layer 33 and the Au layer 34 closes the penetrating hole and the Ni layer 33 can thus be prevented from being exposed to the exterior through the penetrating hole and becoming oxidized.

With each of the first and second connection electrodes 3 and 4, the Au layer 35 is exposed at the frontmost surface. The first connection electrode 3 is electrically connected via the one notched portion 122 to the cathode electrode film 103 at the cathode pad 105 in the notched portion 122. The second connection electrode 4 is electrically connected via the other notched portion 123 to the anode electrode film 104 at the anode pad 106 in the notched portion 123. With each of the first and second connection electrodes 3 and 4, the Ni layer 33 is connected to the corresponding pad 105 or 106. Each of the first and second connection electrodes 3 and 4 is thereby electrically connected to the respective diode cells D101 to D104.

The resin film 24 and the passivation film 23 having the notched portions 122 and 123 formed therein thus cover the element forming surface 2A in a state of exposing the first and second connection electrodes 3 and 4 from the notched portions 122 and 123. Electrical connection between the chip part 1 and the mounting substrate can thus be achieved via the first and second connection electrodes 3 and 4 that protrude (project) from the notched portions 122 and 123 at the front surface of the resin film 24.

In each of the diode cells D101 to D104, the p-n junction region 111 is formed between the $p^+$-type substrate 2 and the $n^+$-type region 110, and a p-n junction diode is thus formed respectively. The $n^+$-type regions 110 of the plurality of diode cells D101 to D104 are connected in common to the cathode electrode film 103, and the $p^+$-type substrate 2, which is the p-type region in common to the diode cells D101 to D104, is connected in common via the $p^+$-type region 112 to the anode electrode film 104. The plurality of diode cells D101 to D104 formed on the substrate 2 are thereby connected in parallel all together.

Figure 6:
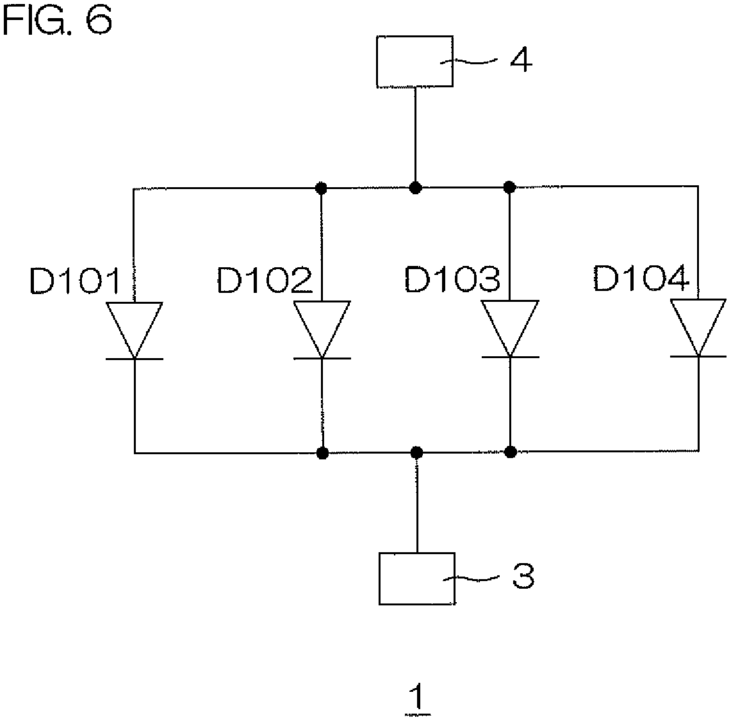
FIG. 6 is an electric circuit diagram of the electrical structure of the interior of the chip part shown in FIG. 1.

FIG. 6 is an electric circuit diagram of the electrical structure of the interior of the chip part shown in FIG. 1. By the cathode sides of the p-n junction diodes respectively constituted by the diode cells D101 to D104 being connected in common by the first connection electrode 3 (cathode electrode film 103) and the anode sides being connected in common by the second connection electrode 4 (anode electrode film 104), all of the diodes are connected in parallel and are thereby made to function as a single diode as a whole.

With the arrangement of the present preferred embodiment, the chip part 1 has the plurality of diode cells D101 to D104 and each of the diode cells D101 to D104 has the p-n junction region 111. The p-n junction regions 111 are separated according to each of the diode cells D101 to D104. The chip part 1 is thus made long in the peripheral length of the p-n junction regions 111, that is, the total peripheral length (total extension) of the $n^+$-type regions 110 in the substrate 2. The electric field can thereby be dispersed and prevented from concentrating at vicinities of the p-n junction regions 111, and the ESD resistance can thus be improved. That is, even when the chip part 1 is to be formed compactly, the total peripheral length of the p-n junction regions 111 can be made large, thereby enabling both downsizing of the chip part 1 and securing of the ESD resistance to be achieved at the same time.

Figure 7:
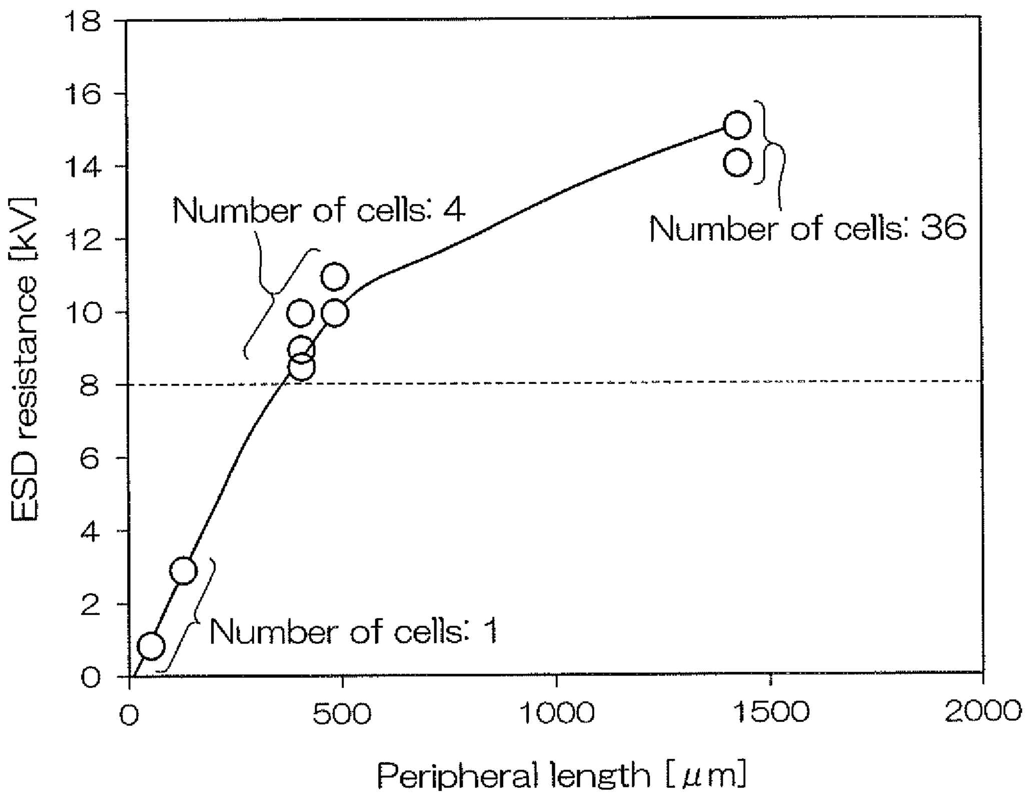
FIG. 7 shows experimental results of measuring the ESD resistances of a plurality of samples that are differed in total peripheral length (total extension) of p-n junction regions by variously setting the sizes of diode cells and/or the number of the diode cells formed on a substrate of the same area.

FIG. 7 shows experimental results of measuring the ESD resistances of a plurality of samples that are differed in the total peripheral length (total extension) of the p-n junction regions by variously setting the sizes of diode cells and/or the number of the diode cells formed on a semiconductor substrate of the same area. From these experimental results, it can be understood that the longer the peripheral length of the p-n junction regions, the greater the ESD resistance. In cases where not less than four diode cells are formed on the substrate, ESD resistances exceeding 8 kilovolts could be realized.

A method for manufacturing the chip part 1 shall now be described in detail with reference to FIG. 8A to FIG. 8H.

Figure 8A:
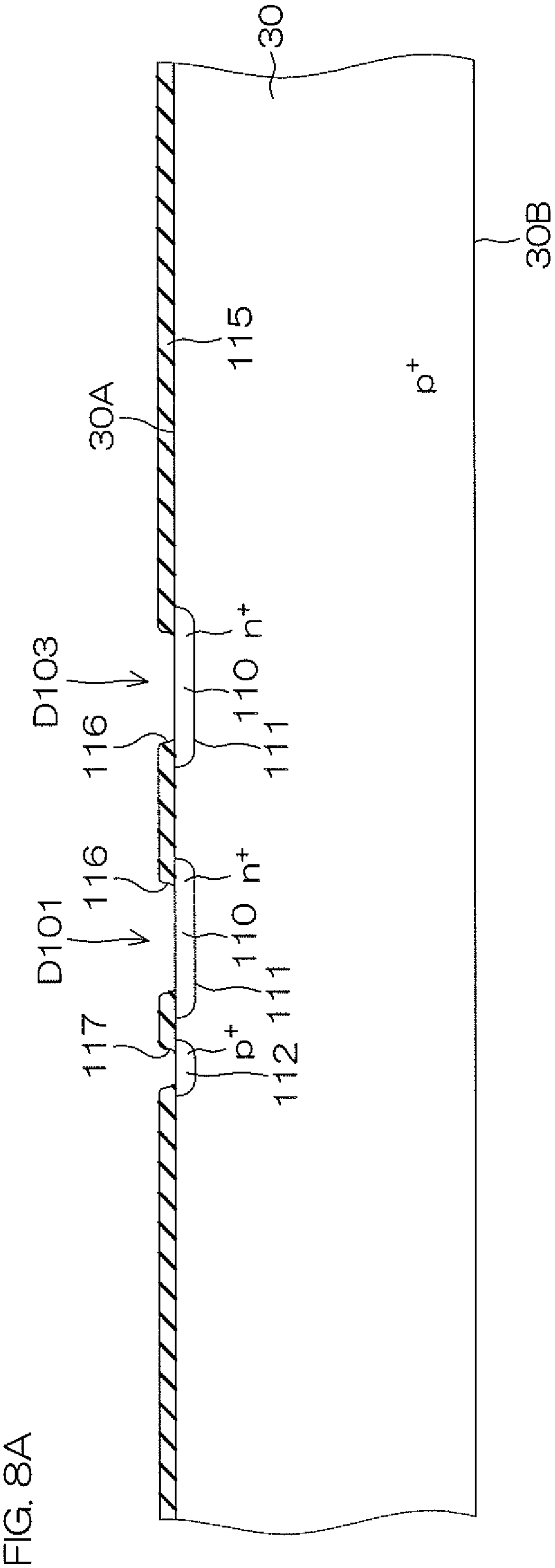
FIG. 8A to FIG. 8H are sectional views of a method for manufacturing the chip part shown in FIG. 1.

First, as shown in FIG. 8A, a $p^+$-type substrate 30, which is the base of the substrate 2, is prepared. Here, a front surface 30A of the substrate 30 is the element forming surface 2A of the substrate 2 and a rear surface 30B of the substrate 30 is the rear surface 2B of the substrate 2. The diode cells D101 to D104 are formed in plurality as unit elements at intervals with respect to each other on the front surface 30A side of the substrate 30.

After preparing the substrate 30, the insulating film 115, which is a thermal oxide film, etc., is formed on the front surface of the substrate 30 and a resist mask is formed thereabove. By ion implantation or diffusion of an n-type impurity (for example, phosphorus) via the resist mask, the $n^+$-type regions 110 are formed. Further, another resist mask, having an opening matching the $p^+$-type region 112, is formed and by ion implantation or diffusion of a p-type impurity (for example, arsenic) via the resist mask, the $p^+$-type region 112 is formed. The diode cells D101 to D104 are formed thereby.

After peeling off the resist mask and thickening the insulating film 115 (thickening, for example, by CVD) as necessary, yet another resist mask, having openings matching the contact holes 116 and 117, is formed on the insulating film 115. The contact holes 116 and 117 are formed in the insulating film 115 by etching via the resist mask.

Figure 8B:
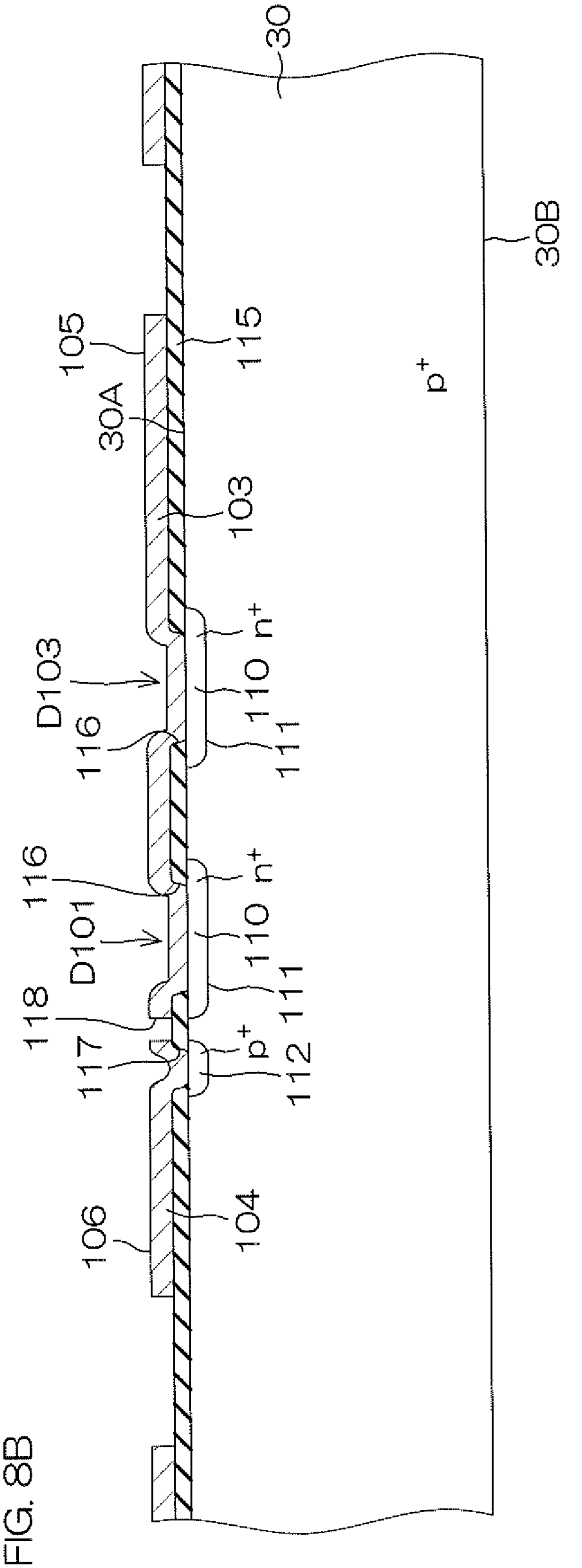

Thereafter as shown in FIG. 8B, an electrode film that constitutes the cathode electrode film 103 and the anode electrode film 104 is formed on the insulating film 115, for example, by sputtering. A resist film having an opening pattern corresponding to the slit 118 is then formed on the electrode film and the slit 118 is formed in the electrode film by etching via the resist film. The electrode film is thereby separated into the cathode electrode film 103 and the anode electrode film 104.

Figure 8C:
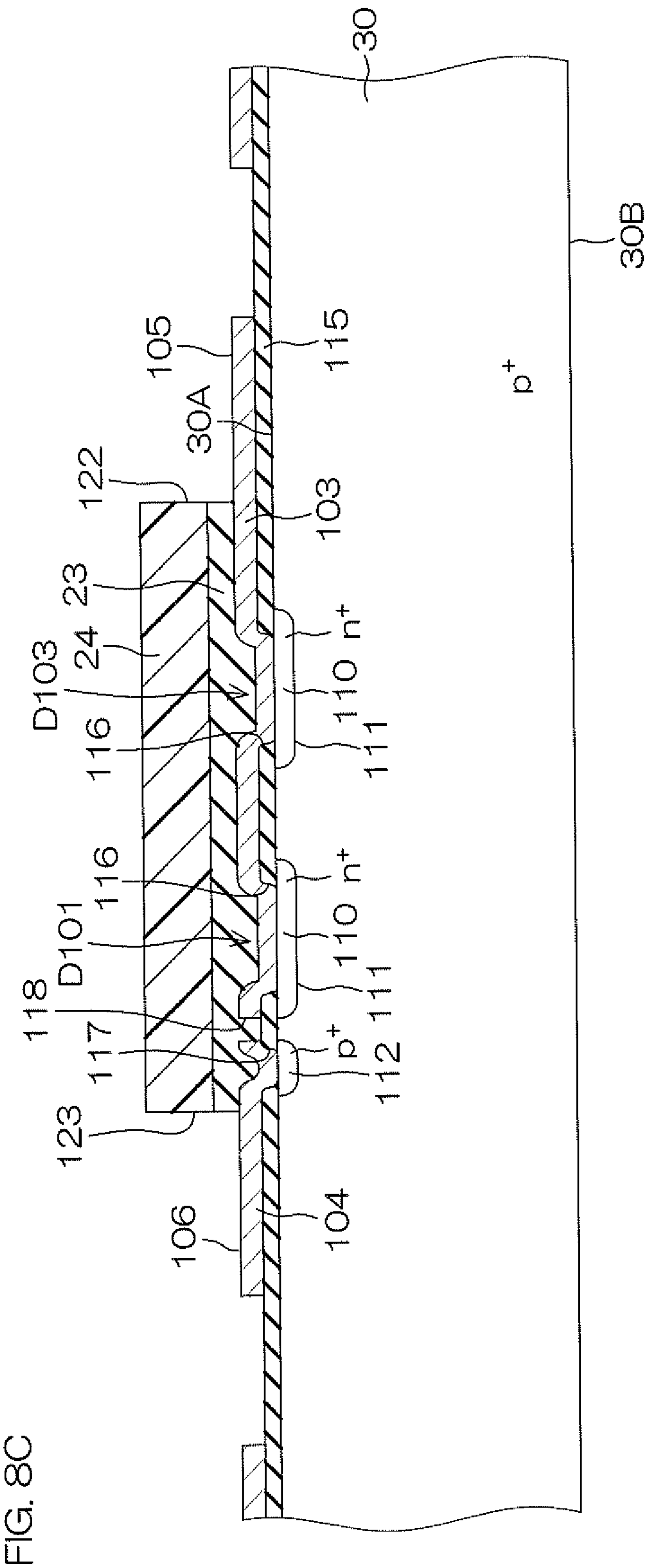

Thereafter as shown in FIG. 8C, after peeling off the resist film, the passivation film 23, which is a nitride film (SiN film), etc., is formed, for example, by the CVD method, and further, polyimide, etc., is applied to form the resin film 24. By then applying etching using photolithography to the passivation film 23 and the resin film 24, the notched portions 122 and 123 are formed.

Figure 8D:
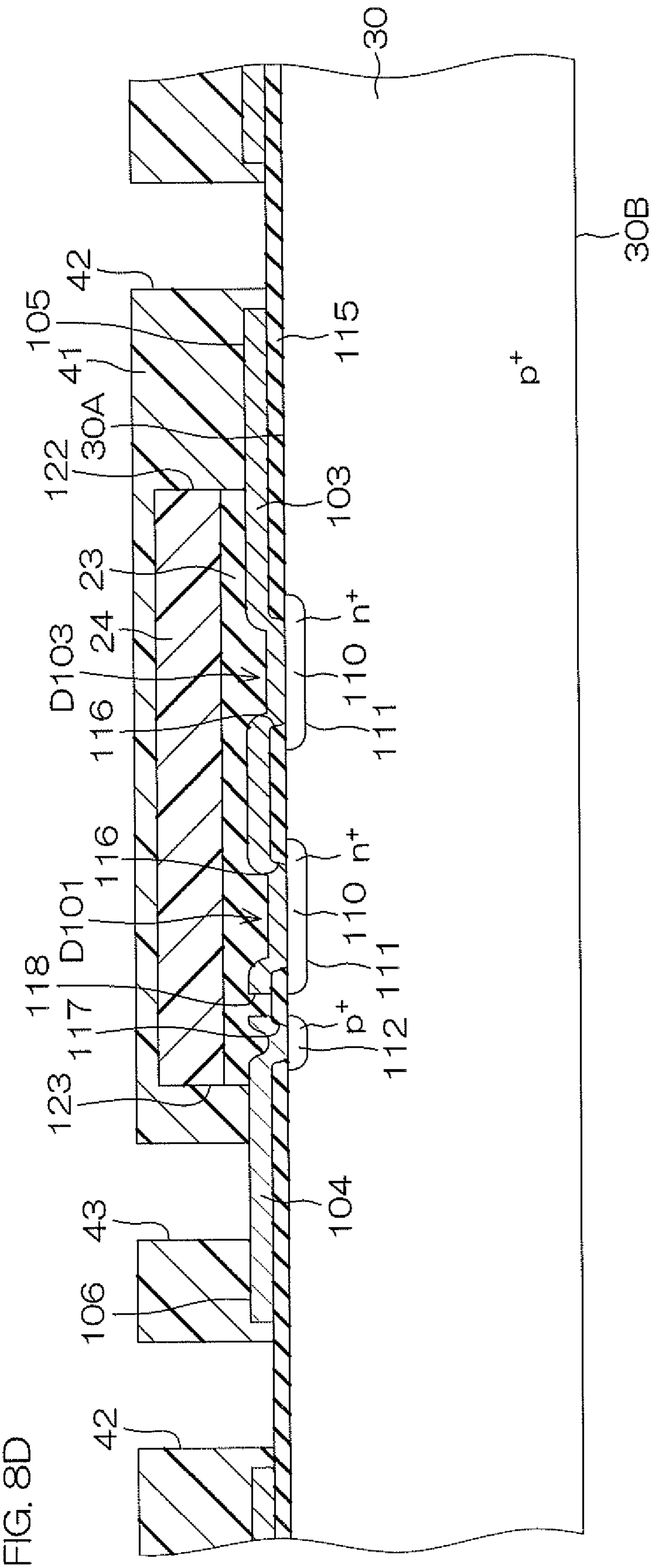

Thereafter as shown in FIG. 8D, a resist pattern 41 is formed across the entire front surface 30A of the substrate 30. In the resist pattern 41, an opening 42 and openings 43 are formed selectively in regions in which a groove 45 and penetrating hole grooves 46 to be described below are to be formed.

Figure 9:
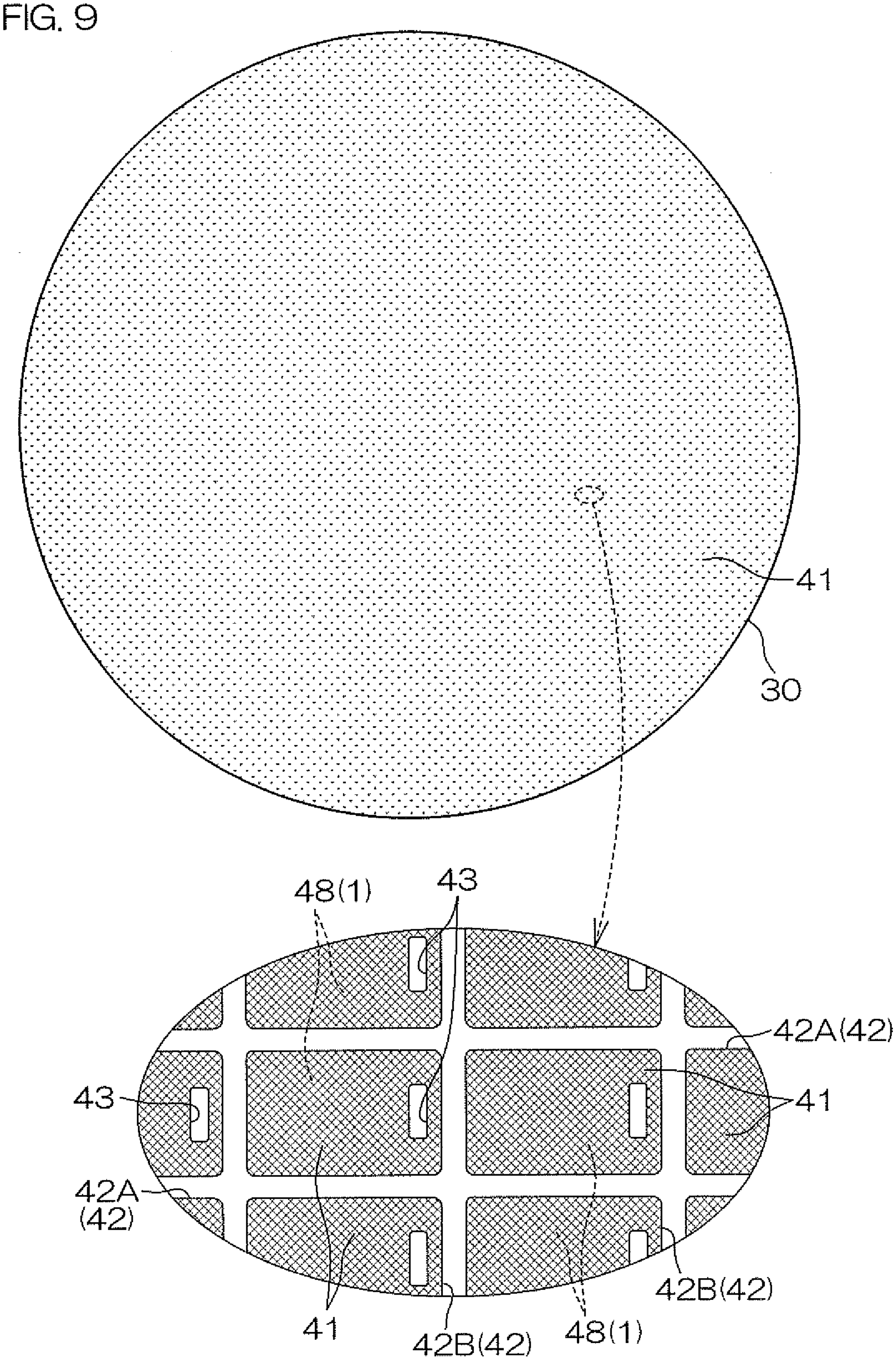
FIG. 9 is a schematic plan view of a portion of a resist pattern used to form grooves in the process of FIG. 8D.

FIG. 9 is a schematic plan view of a portion of the resist pattern 41 used to form the groove 45 and the penetrating hole grooves 46 in the process of FIG. 8D. For the sake of description, in FIG. 9, cross hatching is applied to regions on which the resist pattern 41 is formed.

With reference to FIG. 9, the opening 42 of the resist pattern 41 includes rectilinear portions 42A and 42B. The rectilinear portions 42A and 42B are connected while being maintained in mutually orthogonal states so that the regions that include the diode cells D101 to D104 and are mutually adjacent in a plan view are aligned in a lattice in a plan view. That is, the rectilinear portions 42A and 42B define the regions that include the diode cells D101 to D104 as chip regions 48, which are to become the chip parts 1, in the form of a lattice in a plan view.

On the other hand, the openings 43 are formed in the chip region 48 to selectively expose regions in which the penetrating hole grooves 46 (penetrating holes 6) are to be formed.

Figure 8E:
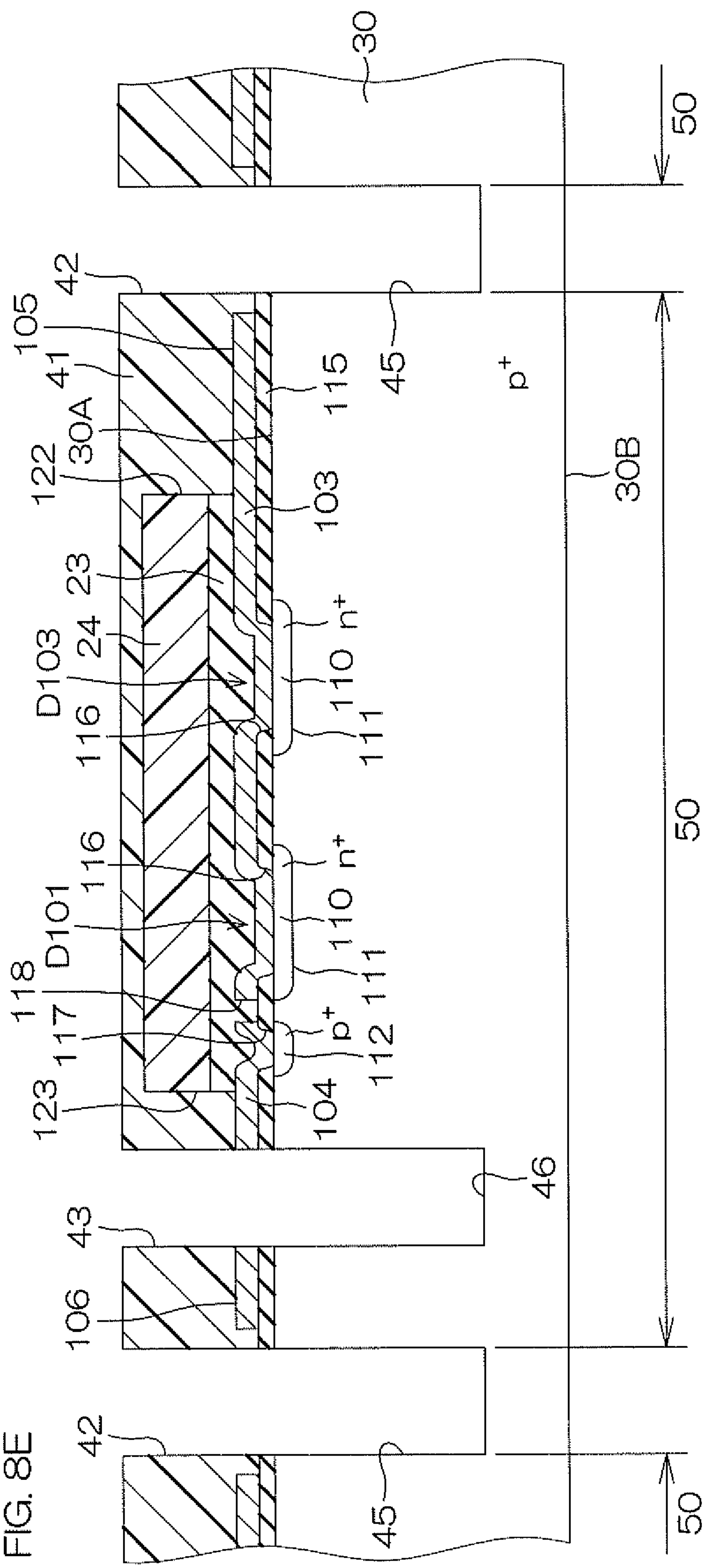

Thereafter as shown in FIG. 8E, the substrate 30 is removed selectively by plasma etching using the resist pattern 41 as a mask. The groove 45 and the penetrating hole grooves 46 of predetermined depth reaching the middle of the thickness of the substrate 30 from the front surface 30A of the substrate 30 are thereby formed at positions matching the opening 42 and the openings 43 of the resist pattern 41 in a plan view. The groove 45 is defined by a pair of mutually facing side walls and a bottom wall joining the lower ends (ends at the rear surface 30B side of the substrate 30) of the pair of side walls. On the other hand, each penetrating hole groove 46 is defined by four wall surfaces and a bottom wall joining the lower ends (ends at the rear surface 30B side of the substrate 30) of the four wall surfaces.

The overall shapes of the groove 45 and the penetrating hole grooves 46 in the substrate 30 are shapes that match the opening 42 (rectilinear portions 42A and 42B) and the openings 43 of the resist pattern 41 in a plan view. In the substrate 30, each portion in which the diode cells D101 to D104 are formed is a semi-finished product 50 of the chip part 1. At the front surface 30A of the substrate 30, one semi-finished product 50 is positioned in each chip region 48 defined by the groove 45, and these semi-finished products 50 are aligned and disposed in an array. After the groove 45 and the penetrating hole grooves 46 have been formed, the resist pattern 41 is removed. After removing the resist pattern 41, probing (electrical test) of the diode cells D101 to D104 may be performed.

Figure 8F:
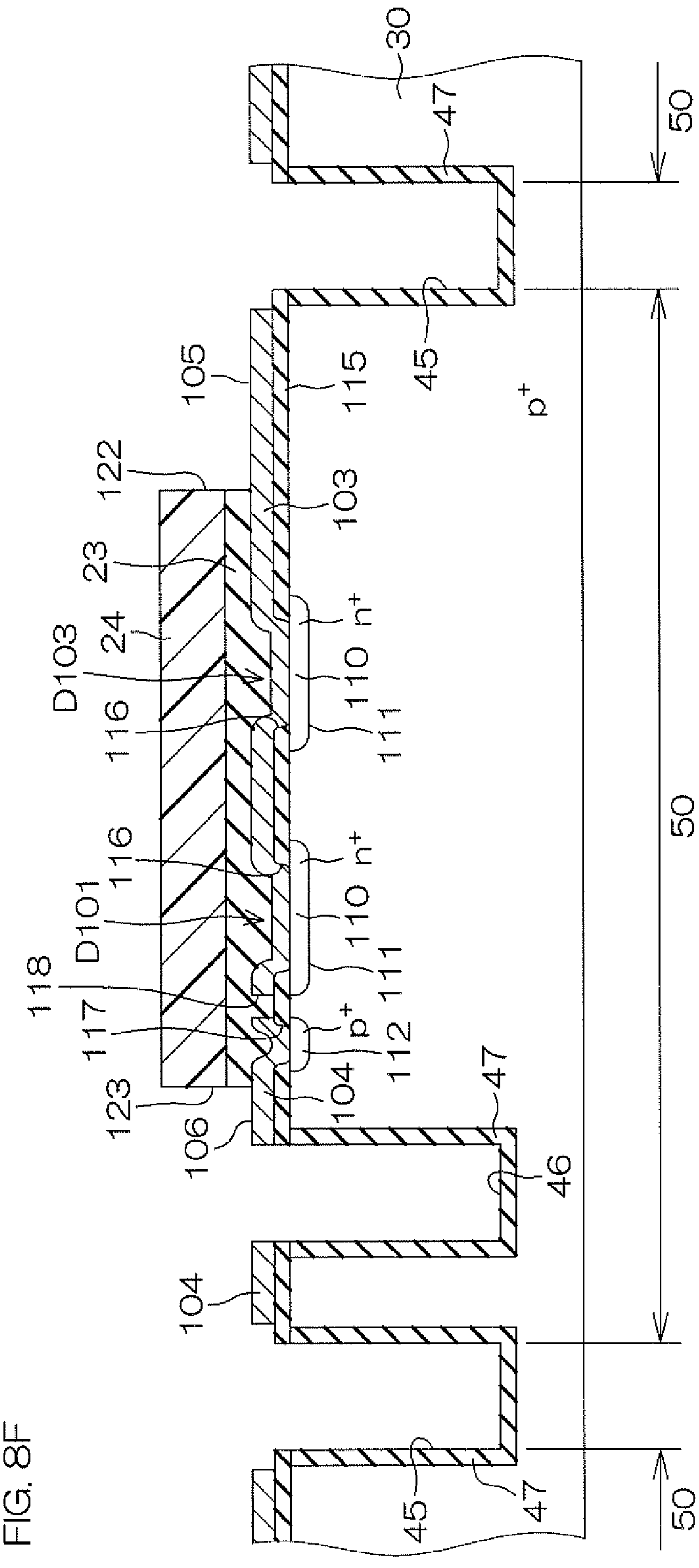

Thereafter as shown in FIG. 8F, an insulating film 47, constituted of SiN, is formed across the entire front surface 30A of the substrate 30 by the CVD method. In this process, the insulating film 47 is also formed on the entireties of the inner peripheral surfaces (the side walls and bottom wall) of the groove 45 and the penetrating hole grooves 46. Thereafter, the insulating film 47 formed on regions besides the inner peripheral surfaces of the groove 45 and the penetrating hole grooves 46 is selectively etched.

Figure 8G:
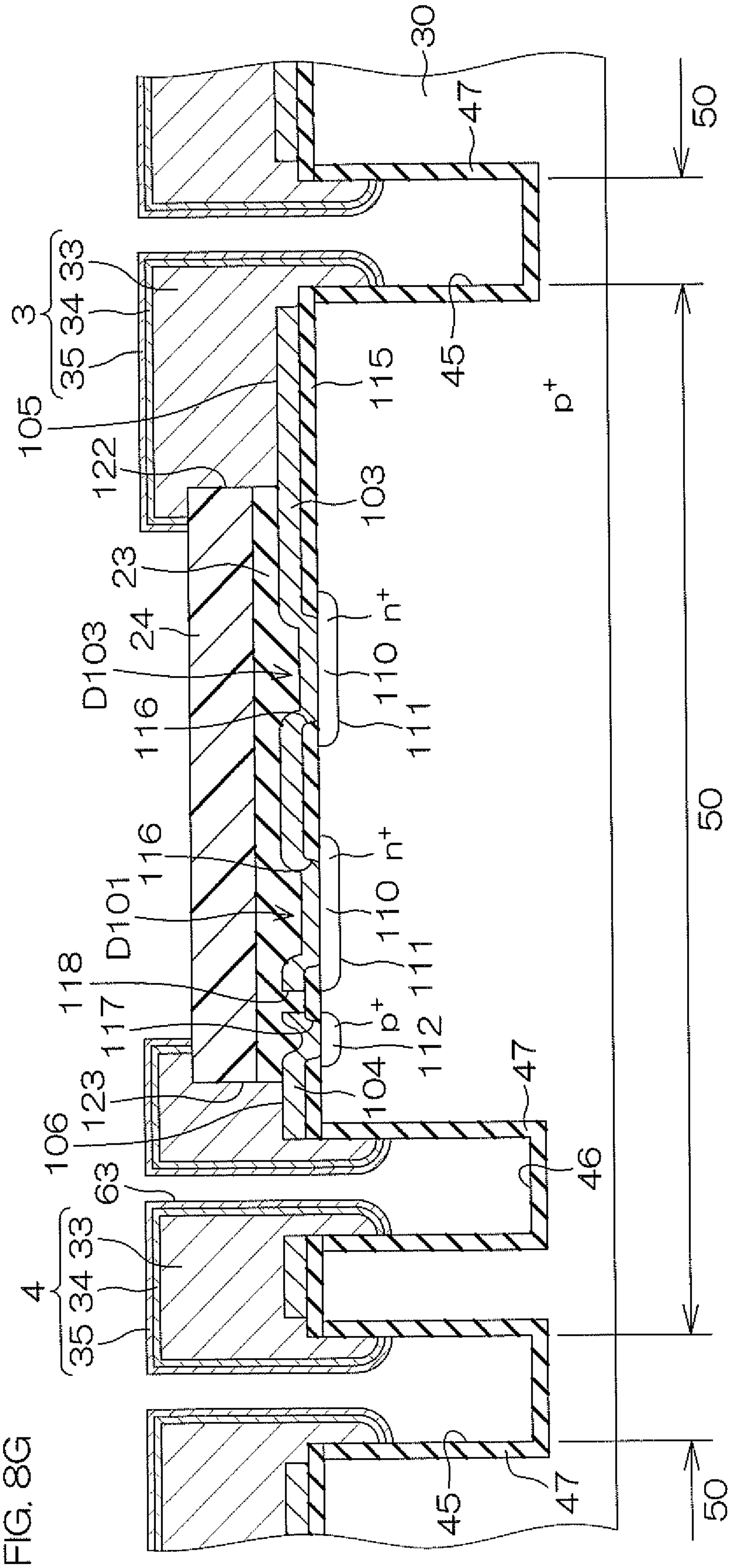
Figure 10:
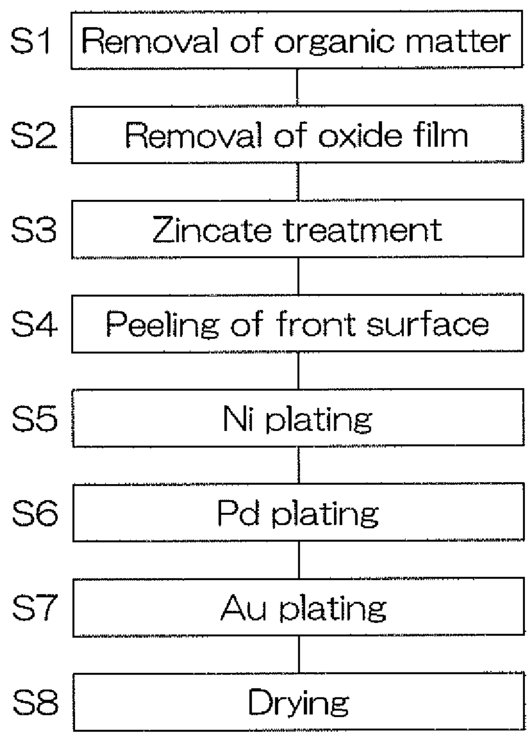
FIG. 10 is a flow chart for describing a process for manufacturing connection electrodes.

Thereafter, by the process shown in FIG. 10, Ni, Pd, and Au are grown successively by plating as shown in FIG. 8G from the cathode pad 105 and the anode pad 106 (the cathode electrode film 103 and the anode electrode film 104) exposed from the respective notched portions 122 and 123. The plating is continued until each plating film grows in lateral directions along the front surface 30A and covers the insulating film 47 on the side walls of the groove 45 and the penetrating hole grooves 46. The first and second connection electrodes 3 and 4, constituted of Ni/Pd/Au laminated films, are thereby formed.

FIG. 10 is a diagram for describing a process for manufacturing the first and second connection electrodes 3 and 4.

First, front surfaces of the cathode pad 105 and the anode pad 106 are cleaned to remove (degrease) organic matter (including smut such as carbon stains and greasy dirt) on the front surfaces (step S1). Thereafter, an oxide film on the front surfaces is removed (step S2). Thereafter, a zincate treatment is performed on the front surfaces to convert the Al (of the electrode films) at the front surfaces to Zn (step S3). Thereafter, the Zn on the front surfaces is peeled off by nitric acid, etc., so that fresh Al is exposed at the respective pads 105 and 106 (step S4).

Thereafter, the respective pads 105 and 106 are immersed in a plating solution to apply Ni plating on front surfaces of the fresh Al in the respective pads 105 and 106. The Ni in the plating solution is thereby chemically reduced and deposited to form the Ni layers 33 on the front surfaces (step S5).

Thereafter, the Ni layers 33 are immersed in another plating solution to apply Pd plating on front surfaces of the Ni layers 33. The Pd in the plating solution is thereby chemically reduced and deposited to form the Pd layers 34 on the front surfaces of the Ni layers 33 (step S6).

Thereafter, the Pd layers 34 are immersed in yet another plating solution to apply Au plating on front surfaces of the Pd layers 34. The Au in the plating solution is thereby chemically reduced and deposited to form the Au layers 35 on the front surfaces of the Pd layer 34 (step S7). The first and second connection electrodes 3 and 4 are thereby formed, and when the first and second connection electrodes 3 and 4 that have been formed are dried (step S8), the process for manufacturing the first and second connection electrodes 3 and 4 is completed. A step of cleaning the semi-finished product 50 with water is performed as necessary between consecutive steps. Also, the zincate treatment may be performed a plurality of times.

As described above, the first and second connection electrodes 3 and 4 are formed by electroless plating and the Ni, Pd, and Al, which are the electrode materials, can thus be grown satisfactorily by plating even on the insulating film 47. Also in comparison to a case where the first and second connection electrodes 3 and 4 are formed by electrolytic plating, the number of steps of the process for forming the first and second connection electrodes 3 and 4 (for example, a lithography process, a resist mask peeling process, etc., that are necessary in electrolytic plating) can be reduced to improve the productivity of the chip part 1. Further in the case of electroless plating, the resist mask that is deemed to be necessary in electrolytic plating is unnecessary and deviation of the positions of formation of the first and second connection electrodes 3 and 4 due to positional deviation of the resist mask thus does not occur, thereby enabling the formation position precision of the first and second connection electrodes 3 and 4 to be improved to improve the yield.

Also with this method, the cathode pad 105 and the anode pad 106 (the cathode electrode film 103 and the anode electrode film 104) are exposed from the notched portions 122 and 123 and there is nothing that hinders the plating growth from the respective pads 105 and 106 to the groove 45 and the penetrating hole grooves 46. Plating growth can thus be achieved rectilinearly from the respective pads 105 and 106 to the groove 45 and the penetrating hole grooves 46. Consequently, the time taken to form the electrodes can be reduced.

After the first and second connection electrodes 3 and 4 have thus been formed, the substrate 30 is ground from the rear surface 30B.

Figure 8H:
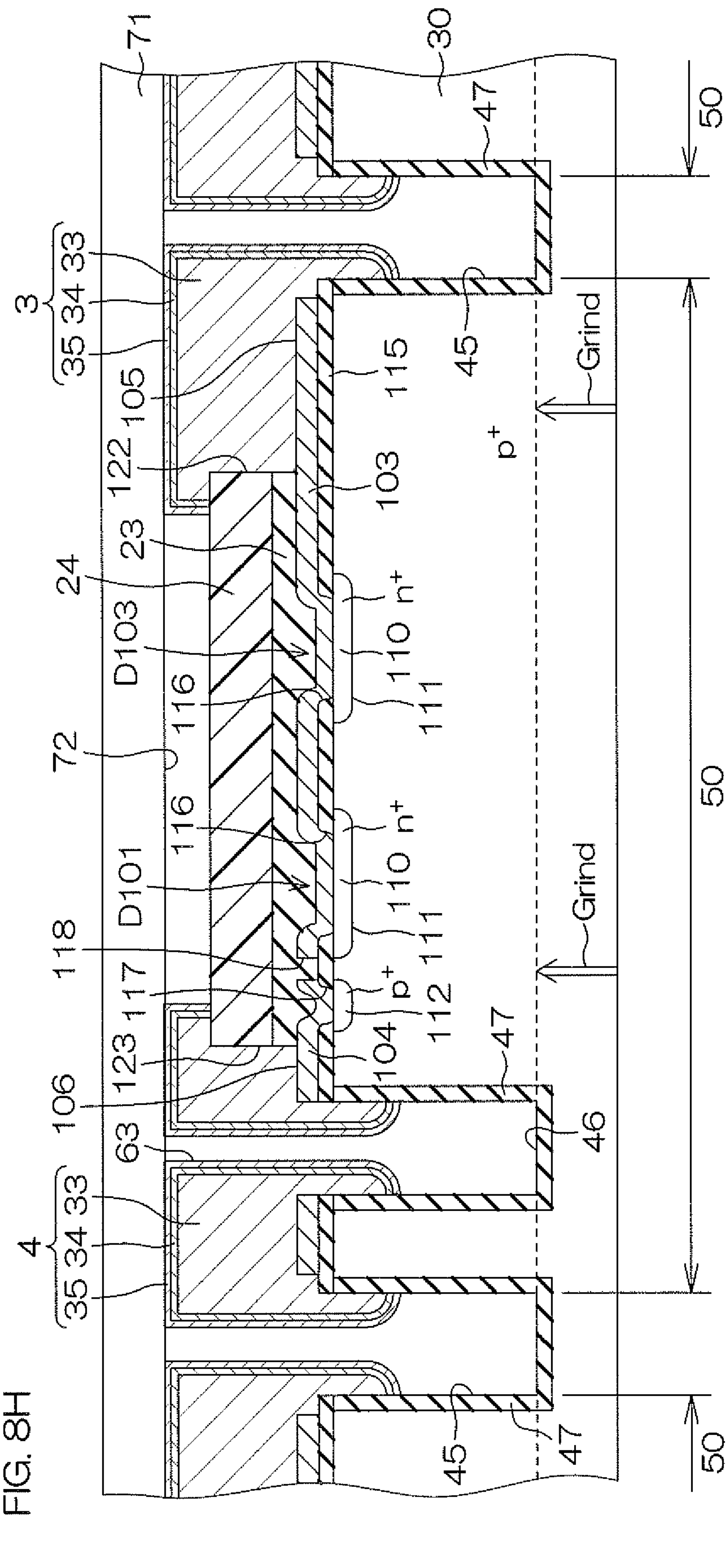

Specifically, after the groove 45 and the penetrating hole grooves 46 have been formed, a thin, plate-shaped supporting tape 71, made of PET (polyethylene terephthalate) and having an adhesive surface 72 is adhered at the adhesive surface 72 onto the first and second connection electrode 3 and 4 sides (that is, the front surface 30A) of each semi-finished product 50 as shown in FIG. 8H. The respective semi-finished products 50 are thereby supported by the supporting tape 71. Here, for example, a laminated tape may be used as the supporting tape 71.

In the state where the respective semi-finished products 50 are supported by the supporting tape 71, the substrate 30 is ground from the rear surface 30B side. When the substrate 30 has been thinned by grinding until the upper surfaces of the bottom walls of the groove 45 and the penetrating hole grooves 46 are reached, there are no longer portions that join mutually adjacent semi-finished products 50 and the substrate 30 is thus divided at the groove 45 as boundaries and the penetrating hole grooves 46 are formed as the penetrating holes 6 of the substrates 2. The semi-finished products 50 are thereby separated individually to become the finished products of the chip parts 1. That is, the substrate 30 is cut (split up) at the groove 45 and the penetrating hole grooves 46 and the individual chip parts 1, each having the penetrating hole 6, are thereby cut out. The chip parts 1 may be cut out instead by etching to the bottom walls of the groove 45 and the penetrating hole grooves 46 from the rear surface 30B side of the substrate 30.

With each finished chip part 1, each portion that constituted the side wall of the groove 45 becomes one of the side surfaces 2C to 2F of the substrate 2, each portion that constituted the side wall of the penetrating hole groove 46 becomes the wall surface 66 of the penetrating hole 6, and the rear surface 30B of the substrate 30 becomes the rear surface 2B. That is, the step of forming the groove 45 and the penetrating hole grooves 46 by etching (see FIG. 8E) is included in the step of forming the side surfaces 2C to 2F and the penetrating holes 6. Portions of the insulating film 47 on the groove 45 and the penetrating hole grooves 46 become portions of the passivation film 23 described above.

The plurality of chip parts 1 formed on the substrate 30 can thus be divided all at once into individual chips (the individual chips of the plurality of chip parts 1 can be obtained at once) and the penetrating holes 6 can be formed at the same time by forming the groove 45 and the penetrating hole grooves 46 and then grinding the substrate 30 from the rear surface 30B side as described above. The productivity of the chip parts 1 can thus be improved by reduction of the time for manufacturing the plurality of chip parts 1.

The rear surface 2B of the substrate 2 of the finished chip part 1 may be mirror-finished by polishing or etching to refine the rear surface 2B. As a matter of course, probing (electrical test) of the diode cells D101 to D104 may be performed on the finished chip part 1.

FIG. 11A to FIG. 11D are illustrative sectional views of a process for recovering the chip parts 1 after the process of FIG. 8H.

Figure 11A:
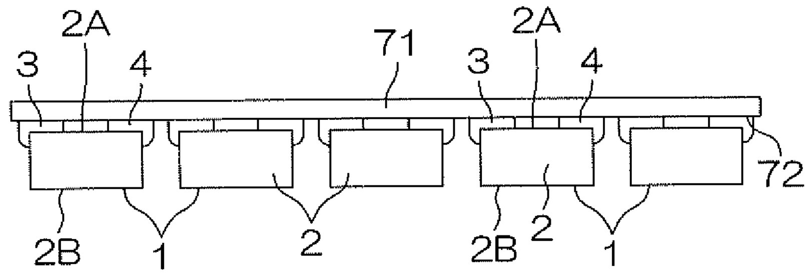
FIG. 11A to FIG. 11D are illustrative sectional views of a chip part recovery process performed after the process of FIG. 8H.
Figure 11B:
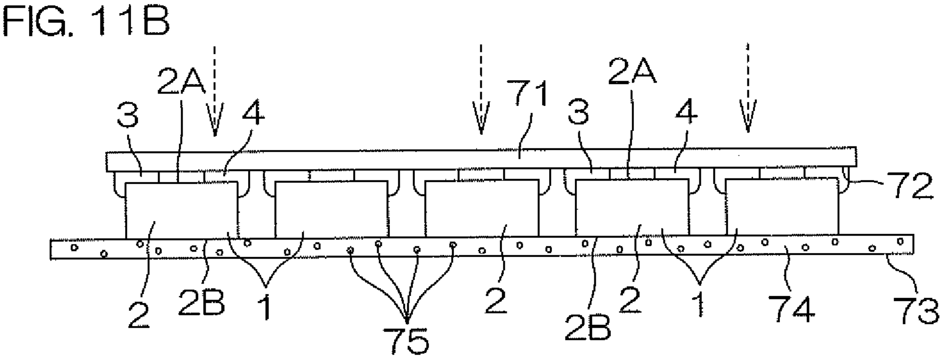

FIG. 11A shows a state where the plurality of chip parts 1, which have been separated into individual chips, continue to be adhered to the supporting tape 71. In this state, a thermally foaming sheet 73 is adhered onto the rear surfaces 2B of the substrates 2 of the respective chip parts 1 as shown in FIG. 11B. The thermally foaming sheet 73 includes a sheet main body 74 of sheet shape and numerous foaming particles 75 that are kneaded into the sheet main body 74.

Figure 11C:
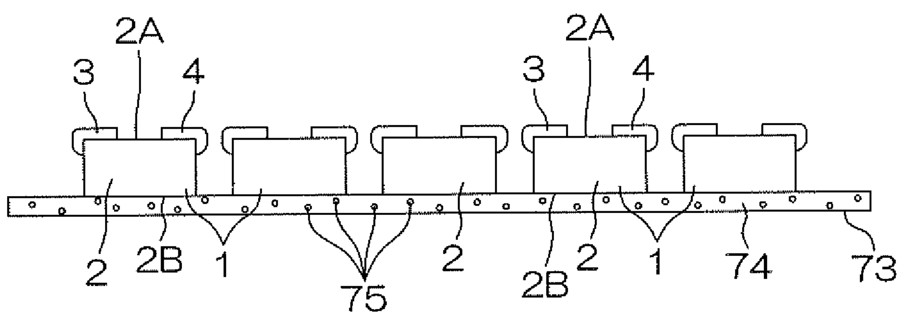

The adhesive force of the sheet main body 74 is stronger than the adhesive force at the adhesive surface 72 of the supporting tape 71. Thus after the thermally foaming sheet 73 has been adhered onto the rear surfaces 2B of the substrates 2 of the respective chip parts 1, the supporting tape 71 is peeled off from the respective chip parts 1 to transfer the chip parts 1 onto the thermally foaming sheet 73 as shown in FIG. 11C. If ultraviolet rays are irradiated onto the supporting tape 71 in this process (see the dotted arrows in FIG. 11B), the adhesive property of the adhesive surface 72 weakens and the supporting tape 71 can be peeled off easily from the respective chip parts 1.

Figure 11D:
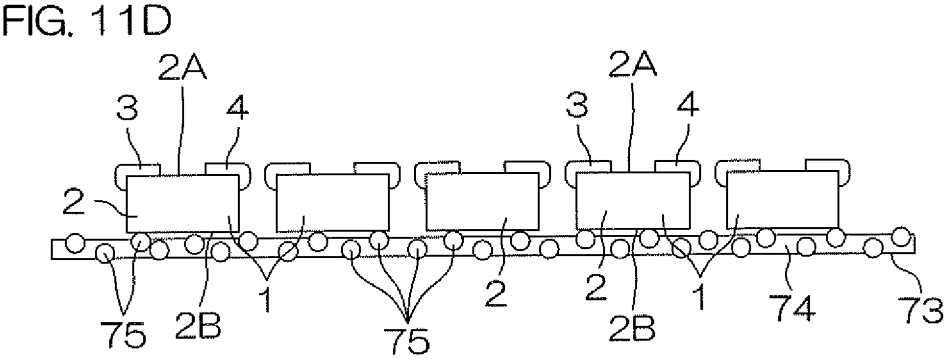

Thereafter, the thermally foaming sheet 73 is heated. Thereby in the thermally foaming sheet 73, the respective thermally foaming particles 75 in the sheet main body 74 are made to foam and swell out from the front surface of the sheet main body 74 as shown in FIG. 11D. Consequently, the area of contact of the thermally foaming sheet 73 and the rear surfaces 2B of the substrates 2 of the respective chip parts 1 decreases and all of the chip parts 1 peel off (fall off) naturally from the thermally foaming sheet 73. The chip parts 1 that are thus recovered are housed in housing spaces formed in an embossed carrier tape (not shown). In this case, the processing time can be reduced in comparison to a case where the chip parts 1 are peeled off one-by-one from the supporting tape 71 or the thermally foaming sheet 73. As a matter of course, in the state where the plurality of chip parts 1 are adhered to the supporting tape 71 (see FIG. 11A), a predetermined number of the chip parts 1 may be peeled off at a time directly from the supporting tape 71 without using the thermally foaming sheet 73. The embossed carrier tape in which the chip parts 1 are housed is then placed in an automatic mounting machine. Each chip part 1 is recovered individually by being suctioned by a suction nozzle 76 included in the automatic mounting machine and thereafter mounted on the mounting substrate 9.

Figure 12A:
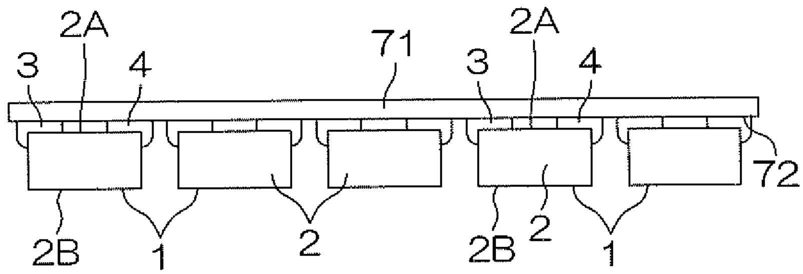
FIG. 12A to FIG. 12C are illustrative sectional views of a chip part recovery process (modification example) performed after the process of FIG. 8H.
Figure 12B:
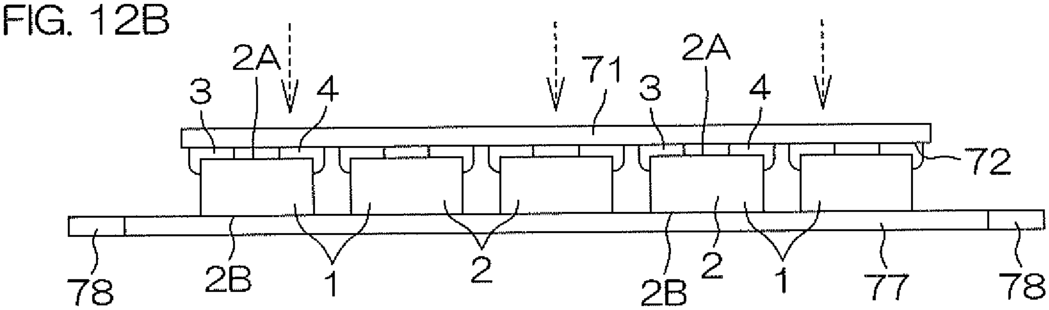
Figure 12C:
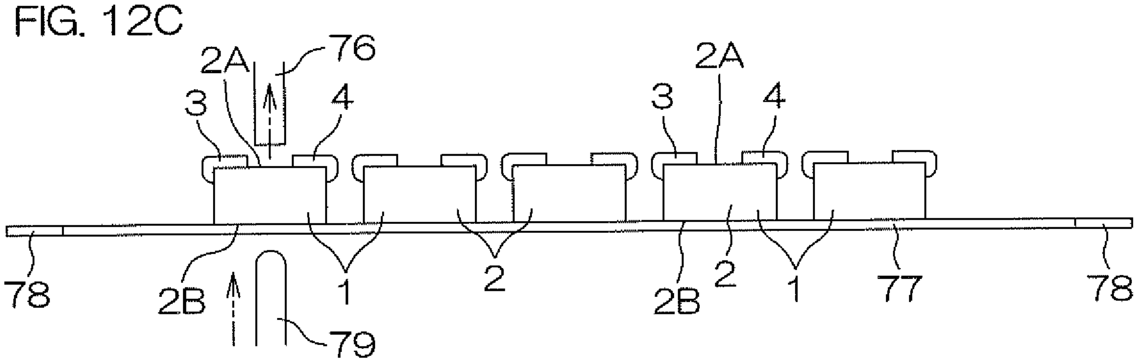

The respective chip parts 1 may also be recovered by another method shown in FIG. 12A to FIG. 12C.

FIG. 12A to FIG. 12C are illustrative sectional views of a process (modification example) for recovering the chip parts 1 after the process of FIG. 8H.

As in FIG. 11A, FIG. 12A shows a state where the plurality of chip parts 1, which have been separated into individual chips, continue to be adhered to the supporting tape 71. In this state, a transfer tape 77 is adhered onto the rear surfaces 2B of the substrates 2 of the respective chip parts 1 as shown in FIG. 12B. The transfer tape 77 has a stronger adhesive force than the adhesive surface 72 of the supporting tape 71. Therefore after the transfer tape 77 has been adhered onto the respective chip parts 1, the supporting tape 71 is peeled off from the respective chip parts 1 as shown in FIG. 12C. In this process, ultraviolet rays (see the dotted arrows in FIG. 12B) may be irradiated onto the supporting tape 71 to weaken the adhesive property of the adhesive surface 72 as described above.

Frames 78 installed in the automatic mounting machine are adhered to both ends of the transfer tape 77. The frames 78 at both sides are enabled to move in directions of approaching each other or separating from each other. When after the supporting tape 71 has been peeled off from the respective chip parts 1, the frames 78 at both sides are moved in directions of separating from each other, the transfer tape 77 elongates and becomes thin. The adhesive force of the transfer tape 77 is thereby weakened, making it easier for the respective chip parts 1 to become peeled off from the transfer tape 77. When in this state, the suction nozzle 76 of the automatic mounting machine is directed toward the element forming surface 2A side of a chip part 1, the chip part 1 becomes peeled off from the transfer tape 77 and suctioned onto the suction nozzle 76 by the suction force generated by the automatic mounting machine (suction nozzle 76). When in this process, a projection 79 shown in FIG. 12C pushes the chip part 1 up toward the suction nozzle 76 from the opposite side of the suction nozzle 76 and via the transfer tape 77, the chip part 1 can be peeled off smoothly from the transfer tape 77.

Figure 13:
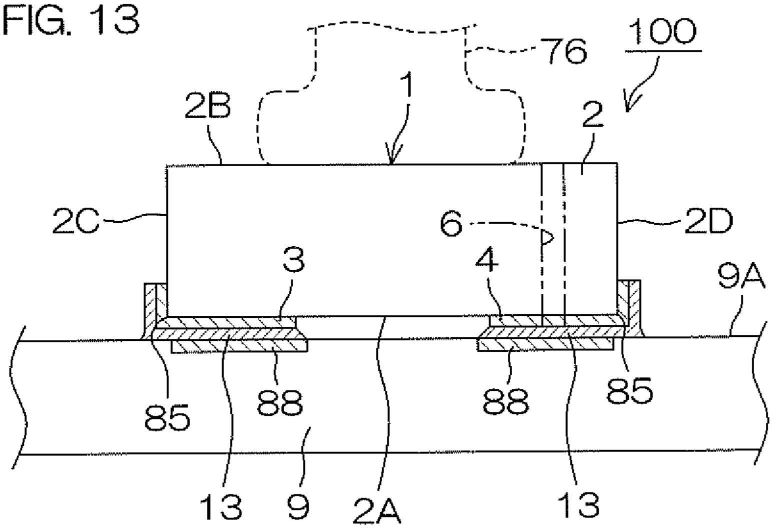
FIG. 13 is a schematic sectional view of a circuit assembly with which the chip part shown in FIG. 1 is mounted on a mounting substrate.
Figure 14:
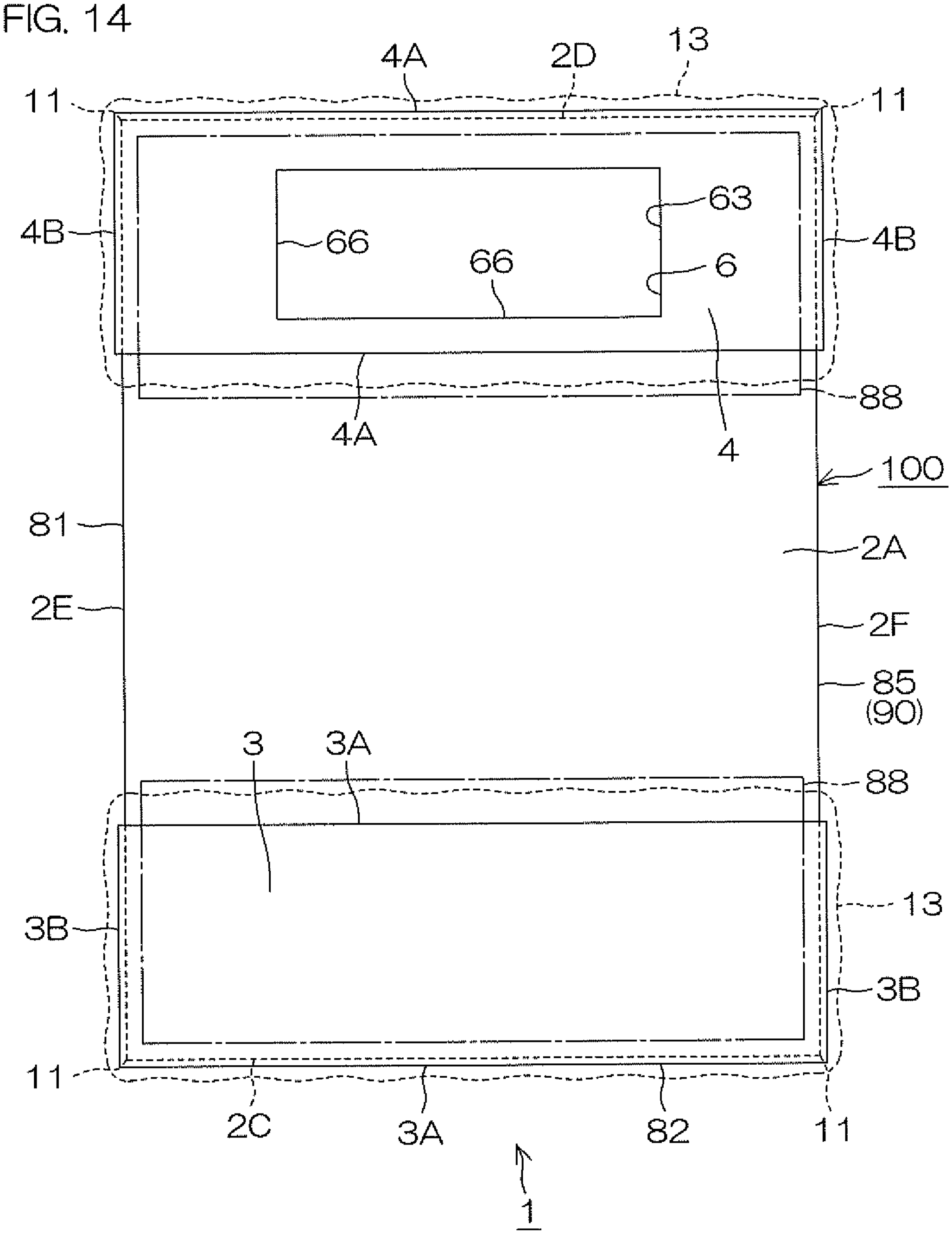
FIG. 14 is a schematic plan view of the circuit assembly shown in FIG. 13 as viewed from an element forming surface side of the chip part.

FIG. 13 is a schematic sectional view, taken along a long direction of the chip part 1, of a circuit assembly 100 in a state where the chip part 1 is mounted on the mounting substrate 9. FIG. 14 is a schematic plan view, as viewed from the element forming surface 2A side, of the chip part 1 in the state of being mounted on the mounting substrate 9.

The chip part 1 is mounted on the mounting substrate 9 as shown in FIG. 13. The chip part 1 and the mounting substrate 9 in this state constitute the circuit assembly 100. An upper surface of the mounting substrate 9 in FIG. 13 is a mounting surface 9A. A pair (two) of lands 88, connected to an internal circuit (not shown) of the mounting substrate 9, are formed on the mounting surface 9A. Each land 88 is formed, for example, of Cu. On a front surface of each land 88, a solder 13 is provided so as to project from the front surface.

The automatic mounting machine moves the suction nozzle 76, in the state of suctioning the chip part 1, to the mounting substrate 9. In this process, a substantially central portion in the long direction of the rear surface 2B is suctioned onto the suction nozzle 76. As mentioned above, the first and second connection electrodes 3 and 4 are provided only on one surface (the element forming surface 2A) and the element forming surface 2A side end portions of the side surfaces 2C to 2F of the chip part 1 and the penetrating hole 6 of the substrate 2 is formed at a position avoiding the substantially central portion of the chip part 1. A flat surface (a flat suctioned surface suctioned by the suction nozzle 76) without the first and second connection electrodes 3 and 4 and the penetrating hole 6 (unevenness) is thus formed at the substantially central portion of the rear surface 2B of the substrate 2.

The flat rear surface 2B can thus be suctioned onto the suction nozzle 76 when the chip part 1 is to be suctioned by the suction nozzle 76 and moved. In other words, with the flat rear surface 2B, a margin of the portion that can be suctioned by the suction nozzle 76 can be increased. The chip part 1 can thereby be suctioned reliably by the suction nozzle 76 and the chip part 1 can be conveyed reliably to a position above the mounting substrate 9 without dropping off from the suction nozzle 76 midway. Above the mounting substrate 9, the element forming surface 2A of the chip part 1 and the mounting surface 9A of the mounting substrate 9 face each other. In this state, the suction nozzle 76 is lowered and pressed against the mounting substrate 9 to make the first connection electrode 3 of the chip part 1 contact the solder 13 on one land 88 and the second connection electrode 4 contact the solder 13 on the other land 88.

When the solders 13 are then heated in a reflow process, the solders 13 melt. Thereafter, when the solders 13 become cooled and solidified, the first connection electrode 3 and the one land 88 become bonded via the solder 13 and the second connection electrode 4 and the other land 88 become bonded via the solder 13. That is, each of the two lands 88 is solder-bonded to the corresponding electrode among the first and second connection electrodes 3 and 4. Mounting (flip-chip connection) of the chip part 1 onto the mounting substrate 9 is thereby completed and the circuit assembly 100 is completed. At this point, the Au layer 35 (gold plating) is formed on the frontmost surfaces of the first and second connection electrodes 3 and 4 that function as the external connection electrodes of the chip part 1. Excellent solder wettability and high reliability can thus be achieved in the process of mounting the chip part 1 onto the mounting substrate 9.

In the circuit assembly 100 in the completed state, the element forming surface 2A of the chip part 1 and the mounting surface 9A of the mounting substrate 9 extend parallel while facing each other across a gap (see also FIG. 14). The dimension of the gap corresponds to the total of the thickness of the portion of the first connection electrode 3 or the second connection electrode 4 projecting from the element forming surface 2A and the thickness of the solders 13.

As shown in FIG. 13, in a sectional view, the first and second connection electrodes 3 and 4 are, for example, formed to L-like shapes with front surface portions on the element forming surface 2A and side surface portions on the side surfaces 2C to 2F being made integral. Therefore, when the circuit assembly 100 (to be accurate, the portion of bonding of the chip part 1 and the mounting substrate 9) is viewed from the direction of a normal to the mounting surface 9A (and the element forming surface 2A) (the direction orthogonal to these surfaces) as shown in FIG. 14, the solder 13 bonding the first connection electrode 3 and the one land 88 is adsorbed not only to the front surface portion but also to the side surface portions of the first connection electrode 3. Similarly, the solder 13 bonding the second connection electrode 4 and the other land 88 is adsorbed not only to the front surface portion but also to the side surface portions of the second connection electrode 4.

Thus with the chip part 1, the first connection electrode 3 is formed to integrally cover the side surfaces 2C, 2E, and 2F of the substrate 2, and the second connection electrode 4 is formed to integrally cover the side surfaces 2D, 2E, and 2F of the substrate 2. That is, the electrodes are formed on the side surfaces 2C to 2F in addition to the element forming surface 2A of the substrate 2 and therefore the adhesion area for soldering the chip part 1 onto the mounting substrate 9 can be enlarged. Consequently, the amount of solder 13 adsorbed to the first connection electrode 3 and the second connection electrode 4 can be increased to improve the adhesion strength.

Also as shown in FIG. 14, the solder 13 is adsorbed so as to extend from the element forming surface 2A to the side surfaces 2C to 2F of the substrate 2. Therefore in the mounted state, the first connection electrode 3 is held by the solder 13 at the side surfaces 2C, 2E, and 2F and the second connection electrode 4 is held by the solder 13 at the side surfaces 2D, 2E, and 2F so that all of the side surfaces 2C to 2F of the rectangular chip part 1 can be fixed by the solder 13. The mounting form of the chip part 1 can thus be stabilized.

With circuit assemblies 100 having the chip part 1 mounted on the mounting substrate 9, only those that are judged to be "non-defective" upon undergoing a substrate appearance inspection process are shipped. As judgment items in the substrate appearance inspection process, an inspection of the state of soldering on the mounting substrate 9, a polarity inspection of the chip part 1, etc., are performed by an automatic optical inspection machine (AOI) 91 as an inspection machine.

Figure 15:
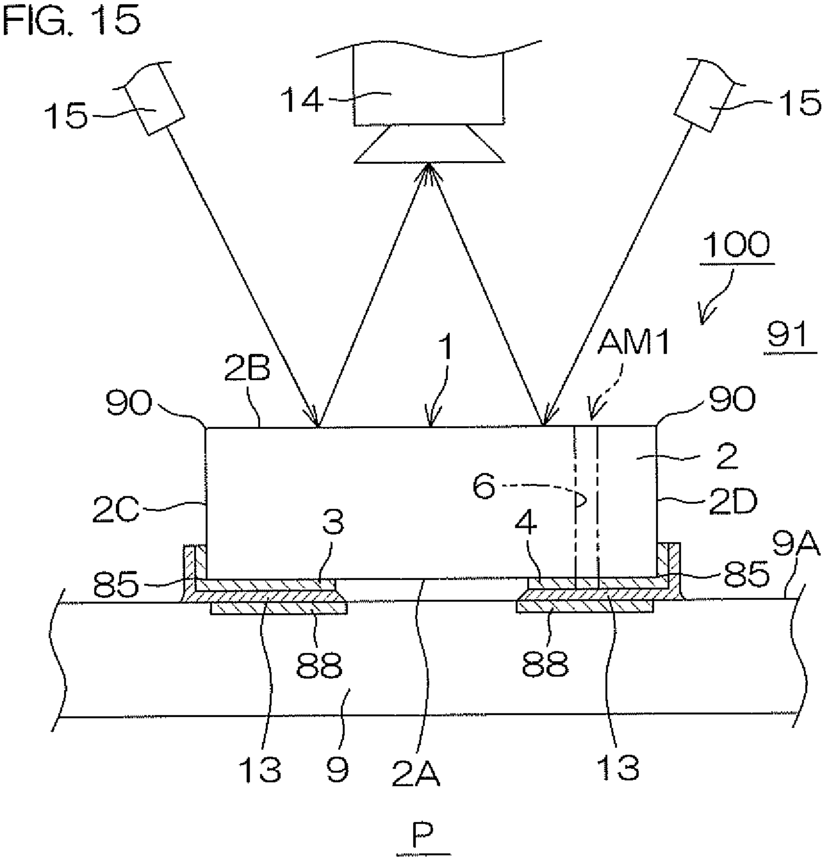
FIG. 15 is a diagram for describing a polarity inspection process for the chip part shown in FIG. 1.
Figure 16:
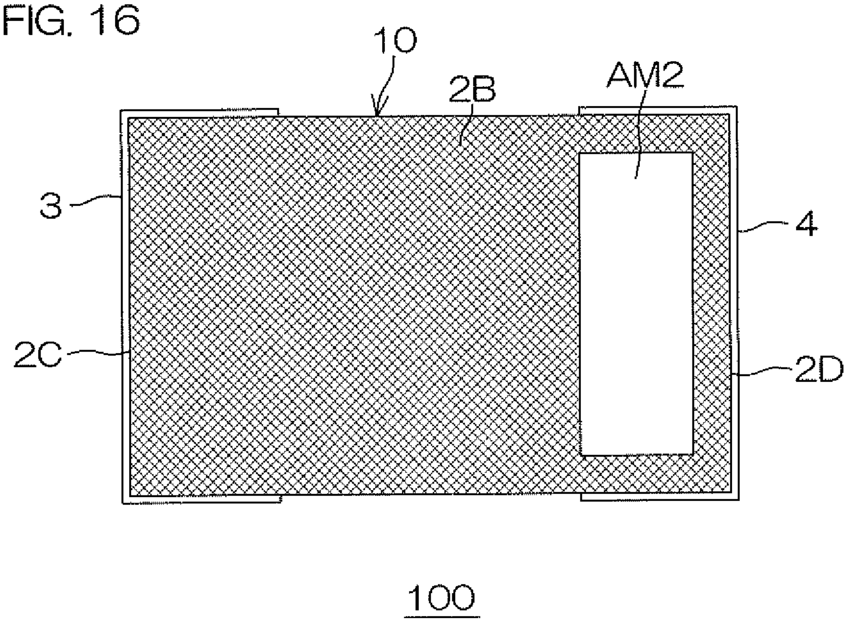
FIG. 16 is a schematic plan view of a chip part according to a reference example in a state of being mounted on a mounting substrate as viewed from a rear surface side.

FIG. 15 is a diagram for describing a polarity inspection process for the chip part 1 shown in FIG. 1. FIG. 16 is a schematic plan view of a chip part 10 according to a reference example in a state of being mounted on the mounting substrate 9 as viewed from the rear surface 2B side. FIG. 15 is a schematic sectional view, taken along the long direction of the chip part 1, of the circuit assembly 100 in the state where the chip part 1 is mounted on the mounting substrate 9.

The automatic optical inspection machine 91 is a machine that irradiates light onto an inspection object and makes a "non-defective" or "defective" judgment from image information detected by means of light reflected from the inspection object. More specifically, as shown in FIG. 15, at a part detection position P of the automatic optical inspection machine 91, a part recognizing camera 14 and a plurality of light sources 15 are disposed directly above the circuit assembly 100. The plurality of light sources 15 are disposed respectively in a periphery of the part recognizing camera 14. When the circuit assembly 100 is placed at the part detection position P, the automatic optical inspection machine 91 irradiates light from the light sources 15 in oblique directions toward the rear surface 2B of the chip part 1 and detects, by means of the part recognizing camera 14, reflected light reflected by the rear surface 2B of the chip part 1.

Here, as shown in FIG. 16, with the chip part 10 according to the reference example, the penetrating hole 6 is not formed in the substrate 2 and an anode mark AM2 is formed (printed) as a marking on the rear surface 2B. Such a marking is formed by a marking apparatus that irradiates ultraviolet rays or a laser, etc., onto the rear surface 2B of the chip part 10.

The polarity inspection of the chip part 10 according to the reference example is performed, for example, according to whether or not the anode mark AM2 (marking) is detected to be of a color (for example, white, blue, etc.) of not less than a value set in advance in a polarity inspection window at a predetermined position of the automatic optical inspection machine 91, and if the marking is detected as such, the "non-defective" judgment is made.

However, the chip part 10 according to the reference example is not necessarily mounted in a horizontal attitude onto the mounting substrate 9 and there are cases where the chip part 10 is mounted in an inclined attitude onto the mounting substrate 9. In this case, depending on the inclination angle, a portion of the light irradiated from the light sources 15 onto the chip part 10 according to the reference example may be reflected outside the polarity inspection window or the wavelength of the reflected light may change with respect to the incident light so that the detected color is recognized (misrecognized) to be a color of not more than the set value. This leads to a problem that a "defective" judgment is made despite the polarity direction of the first and second connection electrodes 3 and 4 being correct. Such a problem becomes more significant, the higher the specularity of the rear surface 2B of the chip part 10 according to the reference example.

To prevent such misrecognition, the detection system (part recognizing camera 14, etc.) and the illumination system (light sources 15, etc.) of the automatic optical inspection machine 91 must be optimized according to each inspection object to improve the inspection precision and extra effort is thus required for the appearance inspection and productivity is decreased. Moreover, such effort becomes excessive as chip parts of even smaller size become desired.

On the other hand, with the chip part 1 according to the preferred embodiment of the present invention, the penetrating hole 6 is formed as the anode mark AM1 in the substrate 2 as shown in FIG. 1 and FIG. 2. Therefore, when the chip part 1 is mounted on the mounting substrate 9, the respective positions of the first and second connection electrodes 3 and 4 can be confirmed based on the position of the penetrating hole 6. The polarity direction of the first and second connection electrodes 3 and 4 can thereby be judged easily. Moreover, the polarity judgment is made not based on brightness or tint detected by the automatic optical inspection machine 91 but based on the shape of the penetrating hole 6 that is unchanged even when the inclination of the chip part 1 with respect to the mounting substrate 9 changes. Therefore, even if a mounting substrate 9, on which the chip part 1 is mounted in an inclined attitude, and a mounting substrate 9, on which the chip part 1 is mounted in a horizontal attitude, are mixed together in the polarity inspection process, the polarity direction can be judged with stable quality based on the penetrating hole 6 (the external shape of the penetrating hole 6) and without having to optimize the detection system (part recognizing camera 14, etc.) of the automatic optical inspection machine 91 according to each mounting substrate 9.

Also, there is no need to form a marking on the front surface or the rear surface of the chip part as index for judging the polarity direction and therefore there is no need to use a marking apparatus for forming a marking on the chip part by irradiation of ultraviolet rays or a laser, etc. The process for manufacturing the chip part can thus be simplified and equipment investment can be reduced. The productivity can thereby be improved.

Also, if the specularity of the rear surface 2B of the chip part 1 is made high, the light made incident on the rear surface 2B from the automatic optical inspection machine 91 can be reflected with good efficiency. Therefore in a case where various mounting substrates 9 that differ in the condition of inclination of the chip part 1 with respect to the mounting substrate 9 are to be inspected, information (brightness or tint of reflected light) for distinguishing a certain inclination from another inclination can be utilized satisfactorily by the automatic optical inspection machine 91. Consequently, the inclination of the chip part 1 can be detected satisfactorily. In particular, with the preferred embodiment of the present invention, information on reflected light from the chip part 1 can be omitted as an index for judging the polarity direction and the lowering of the precision of judgment of the polarity direction of the chip part 1 due to such mirror-finishing of the rear surface 2B can be prevented.

A front/rear judgment process and a polarity judgment process by an automatic mounting machine, etc., may be performed in mounting the chip part 1 onto the mounting substrate 9. In this case, the chip part 1 has formed thereon the first and second connection electrodes 3 and 4 that differ mutually in shape and area, and therefore front/rear judgment and polarity judgment of the chip part 1 can be made based on the shapes of the first and second connection electrodes 3 and 4.

As described above, with the arrangement of the chip part 1, the polarity direction can be judged with good precision while suppressing the decrease of productivity, and therefore the circuit assembly 100 having a highly reliable electronic circuit without error in the polarity direction of the chip part 1 can be provided. An electronic device that includes such a circuit assembly 100 can also be provided.

Second Preferred Embodiment

Figure 17:
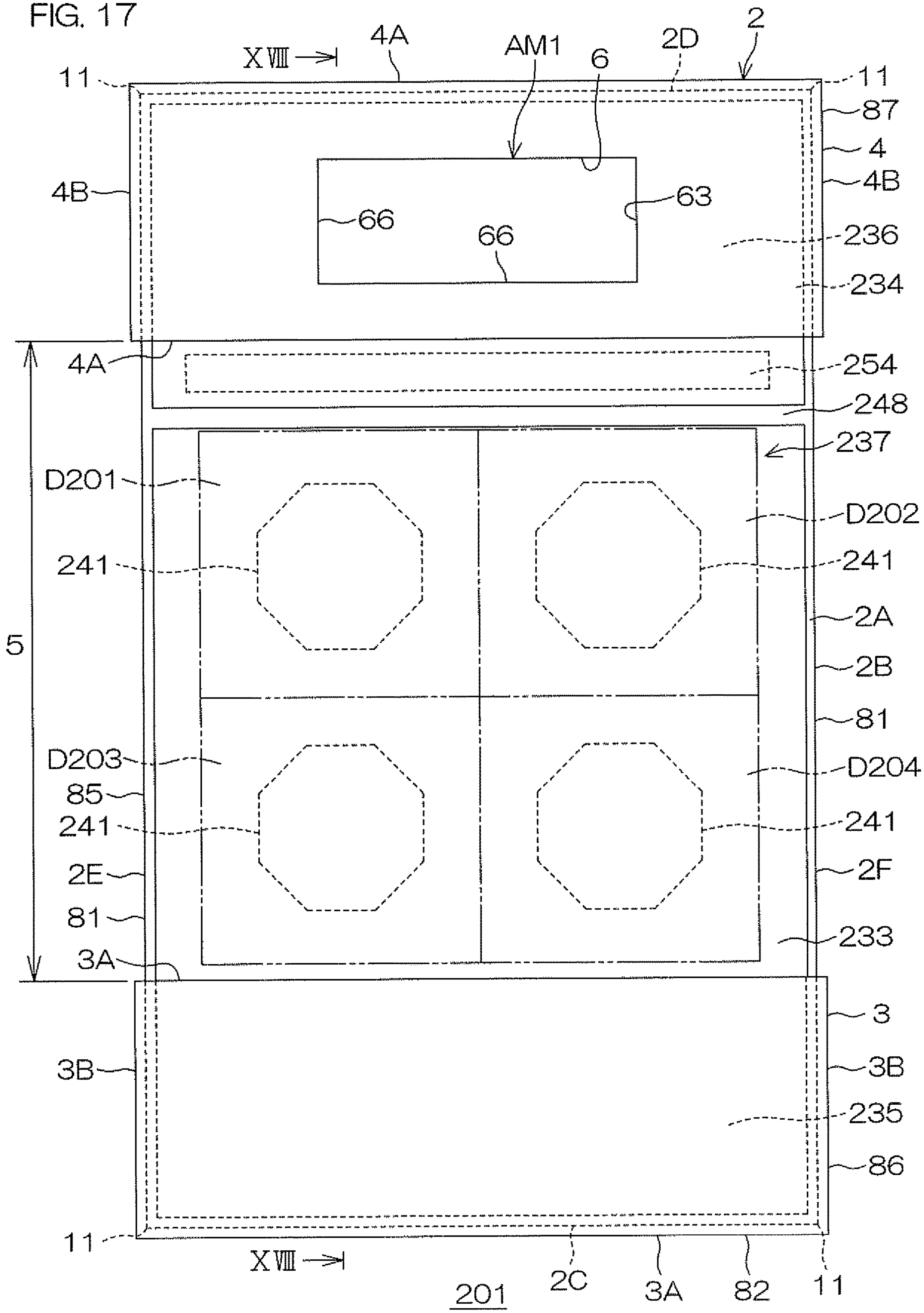
FIG. 17 is a plan view for describing the arrangement of a chip part according to a second preferred embodiment of the present invention.
Figure 18:
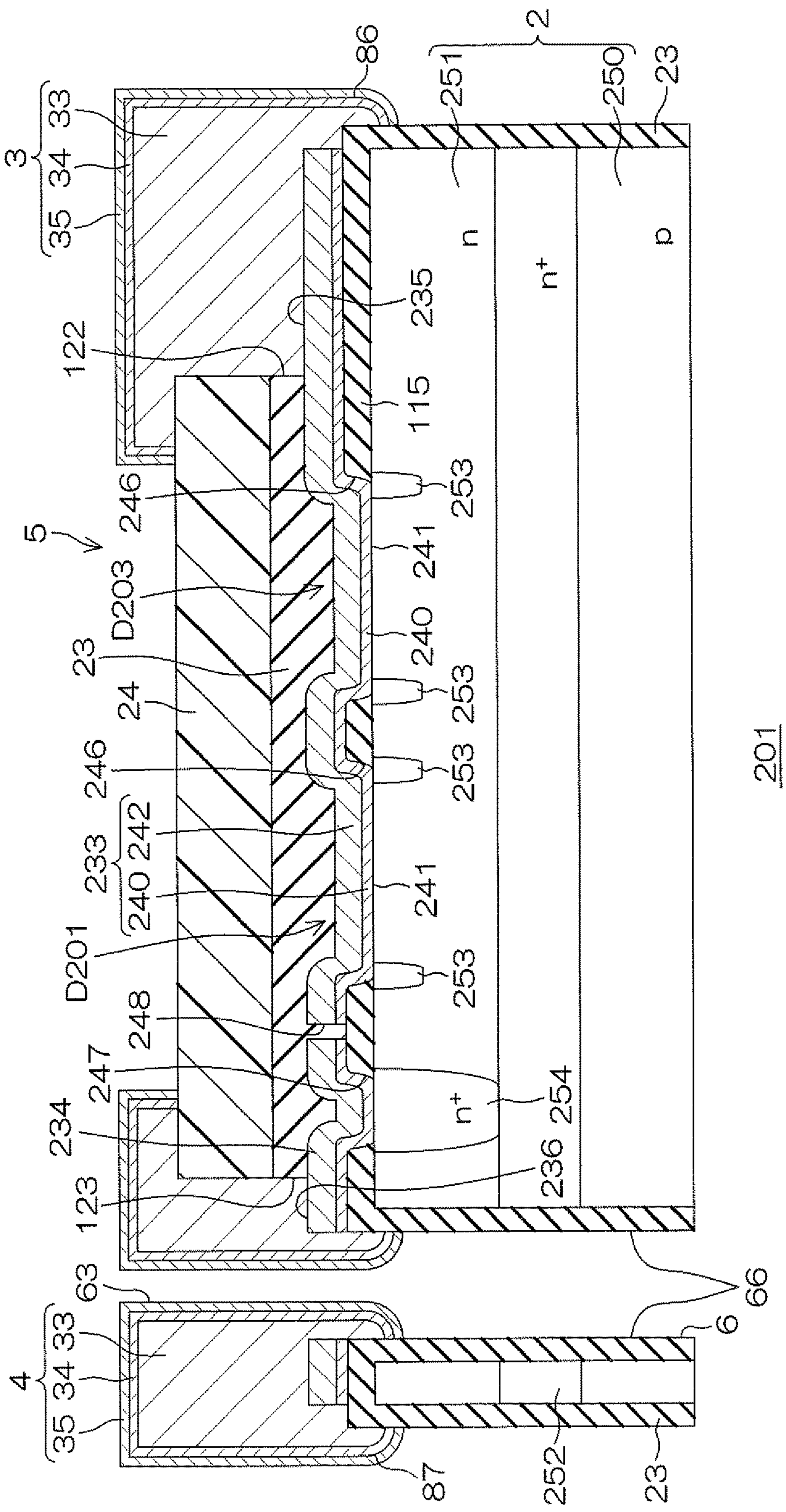
FIG. 18 is a sectional view taken along section line XVIII-XVIII shown in FIG. 17.

FIG. 17 is a plan view for describing the arrangement of a chip part 201 according to a second preferred embodiment of the present invention. FIG. 18 is a sectional view taken along section line XVIII-XVIII shown in FIG. 17.

The chip part 201 includes the substrate 2, a cathode electrode film 233 and an anode electrode film 234 formed on the substrate 2, and a plurality of diode cells D201 to D204 connected in parallel between the cathode electrode film 233 and the anode electrode film 234. The substrate 2 has the penetrating hole 6 formed therein in the same arrangement as in the first preferred embodiment described above.

A cathode pad 235 and an anode pad 236 are respectively disposed at respective end portions in the long direction of the substrate 2. A diode cell region 237 of rectangular shape is set between the cathode pad 235 and the anode pad 236. The plurality of diode cells D201 to D204 are aligned two-dimensionally inside the diode cell region 237. In the present preferred embodiment, the plurality of diode cells D201 to D204 are aligned at equal intervals in a matrix along the long direction and the short direction of the substrate 2.

Each of the diode cells D201 to D204 is constituted of a rectangular region and has a Schottky junction region 241 of polygonal shape (a regular octagonal shape in the present preferred embodiment) in a plan view in the interior of the rectangular region. A Schottky metal 240 is disposed so as to contact the respective Schottky junction regions 241. That is, the Schottky metal 240 is in a Schottky junction with the substrate 2 in the Schottky junction regions 241.

In the present preferred embodiment, the substrate 2 has a p-type silicon substrate 250 and an n-type epitaxial layer 251 grown epitaxially thereon. An $n^+$-type embedded layer 252, which is formed by introducing an n-type impurity (for example, arsenic) and is formed on the front surface of the p-type silicon substrate 250, may be formed in the substrate 2 as shown in FIG. 18. The Schottky junction region 241 is set at the front surface of the n-type epitaxial layer 251 and the Schottky junction is formed by the Schottky metal 240 being joined to the front surface of the n-type epitaxial layer 251. A guard ring 253 is formed at a periphery of the Schottky junction region 241 to suppress leakage at the contact edge.

The Schottky metal 240 may be made, for example, of Ti or TiN, and the cathode electrode film 233 is arranged by laminating a metal film 242 of AlSi alloy, etc., on the Schottky metal 240. Although the Schottky metal 240 may be separated according to each of the diode cells D201 to D204, in the present preferred embodiment, the Schottky metal 240 is formed so as to be in contact in common with the respective Schottky junction regions 241 of the plurality of diode cells D201 to D204.

An $n^+$-type well 254, reaching from the front surface of the n-type epitaxial layer 251 to the $n^+$-type embedded layer 252, is formed in a region of the n-type epitaxial layer 251 that avoids the Schottky junction regions 241. The anode electrode film 234 is formed so as to form an ohmic contact with the front surface of the $n^+$-type well 254. The anode electrode film 234 may be constituted of an electrode film of the same arrangement as the cathode electrode film 233.

The insulating film 115 is formed on the front surface of the n-type epitaxial layer 251. Contact holes 246, corresponding to the Schottky junction regions 241, and a contact hole 247, exposing the $n^+$-type well 254, are formed in the insulating film 115. The cathode electrode film 233 is formed so as to cover the insulating film 115, reaches the interiors of the contact holes 246, and is in Schottky junction with the n-type epitaxial layer 251 in the contact holes 246. On the other hand, the anode electrode film 234 is formed on the insulating film 115, extends into the contact hole 247, and is in ohmic contact with the $n^+$-type well 254 inside the contact hole 247. The cathode electrode film 233 and the anode electrode film 234 are separated by a slit 248.

The passivation film 23 is formed in the same arrangement as in the first preferred embodiment so as to cover the element forming surface 2A (the cathode electrode film 233 and the anode electrode film 234), the side surfaces 2C to 2F, and the wall surfaces 66 of the penetrating hole 6. Further, the resin film 24 is formed so as to cover the passivation film 23. The notched portion 122, which exposes a partial region of the front surface of the cathode electrode film 233 that is to be the cathode pad 235, is formed to penetrate through the passivation film 23 and the resin film 24. Further, the notched portion 123 is formed to penetrate through the passivation film 23 and the resin film 24 so as to expose a partial region of the front surface of the anode electrode film 234 that is to be the anode pad 236. The first and second connection electrodes 3 and 4 are formed in the same arrangements as in the first preferred embodiment on the cathode pad 235 and the anode pad 236 exposed from the notched portions 122 and 123.

With this arrangement, the cathode electrode film 233 is connected in common to the Schottky junction regions 241 that the diode cells D201 to D204 have respectively. Also, the anode electrode film 234 is connected to the n-type epitaxial layer 251 via the $n^+$-type well 254 and the $n^+$-type embedded layer 252 and is thus connected in common and parallel to the Schottky junction regions 241 formed in the plurality of diode cells D201 to D204. A plurality of Schottky barrier diodes, having the Schottky junction regions 241 of the plurality of diode cells D201 to D204, are thus connected in parallel between the cathode electrode film 233 and the anode electrode film 234.

The same effects as the effects described for the first preferred embodiment can thus be exhibited by the present preferred embodiment as well. Also, the plurality of diode cells D201 to D204 respectively have the mutually separated Schottky junction regions 241, and therefore the total extension of the peripheral length of the Schottky junction regions 241 (peripheral length of the Schottky junction regions 241 at the front surface of the n-type epitaxial layer 251) is made large. Concentration of electric field can thereby be suppressed and the ESD resistance can thus be improved. That is, even when the chip part 201 is to be formed compactly, the total peripheral length of the Schottky junction regions 241 can be made large, thereby enabling both downsizing of the chip part 201 and securing of the ESD resistance to be achieved at the same time.

Third Preferred Embodiment

Figure 19:
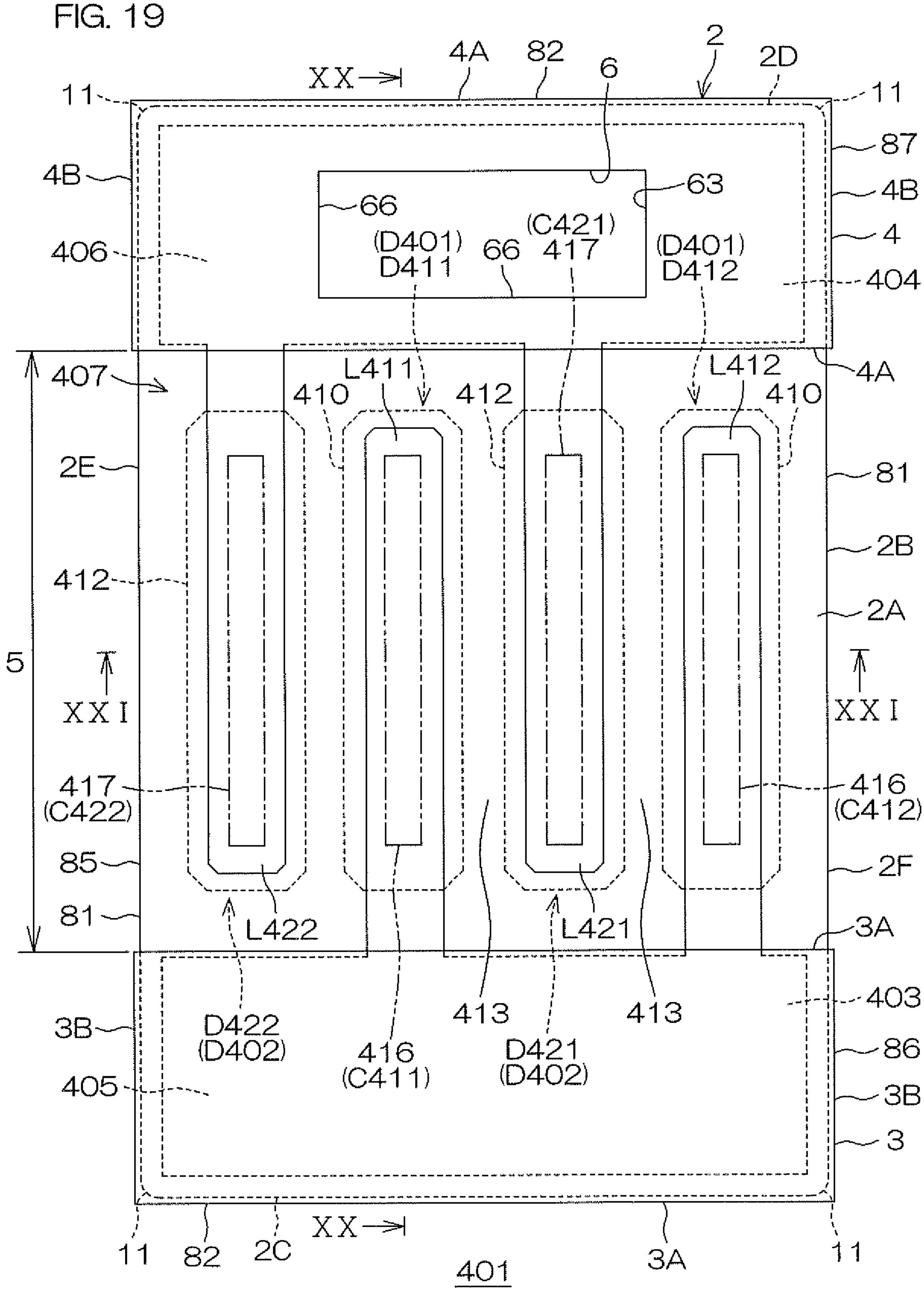
FIG. 19 is a plan view of a chip part according to a third preferred embodiment of the present invention.
Figure 20:
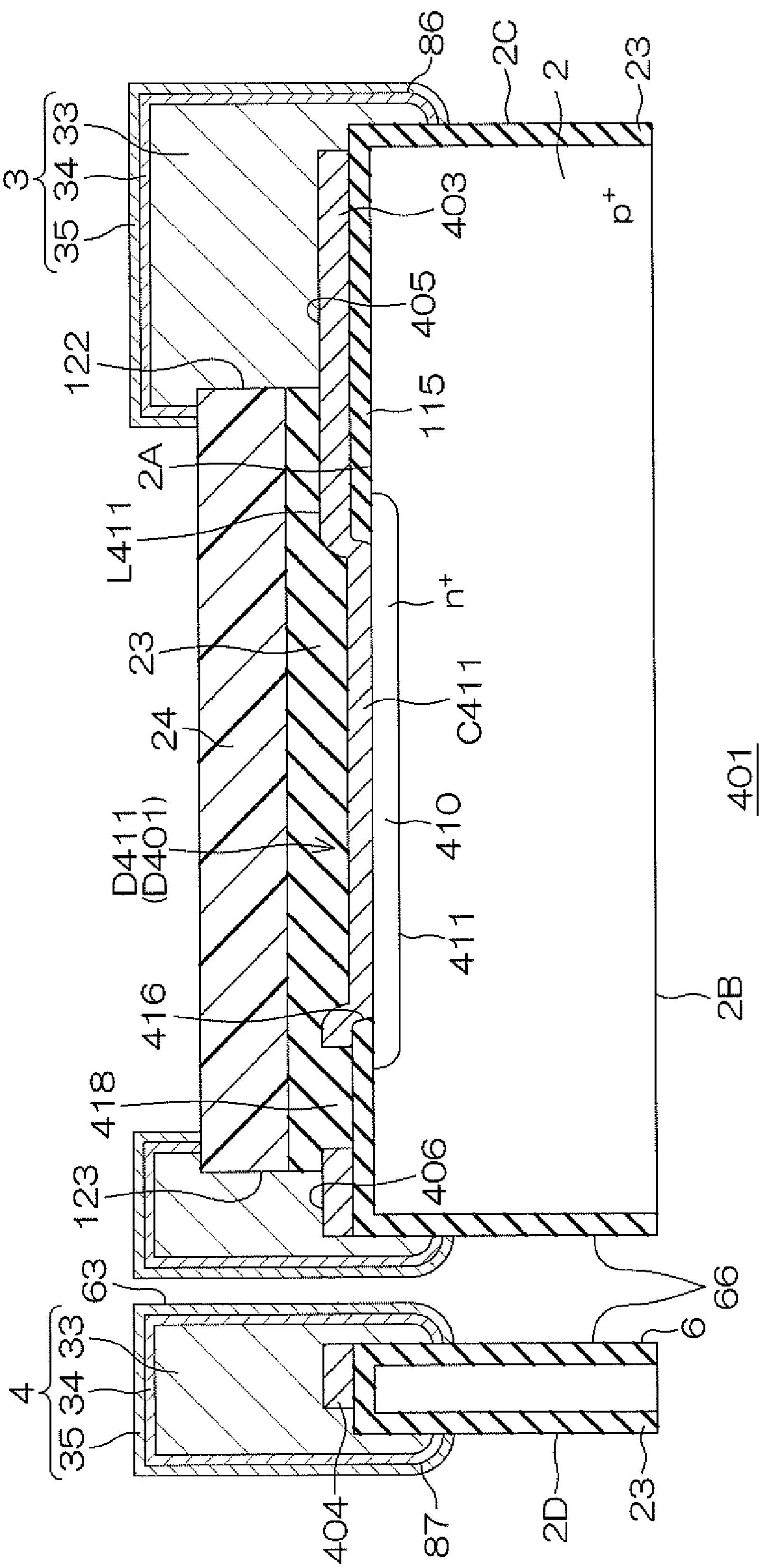
FIG. 20 is a sectional view taken along section line XX-XX shown in FIG. 19.
Figure 21:
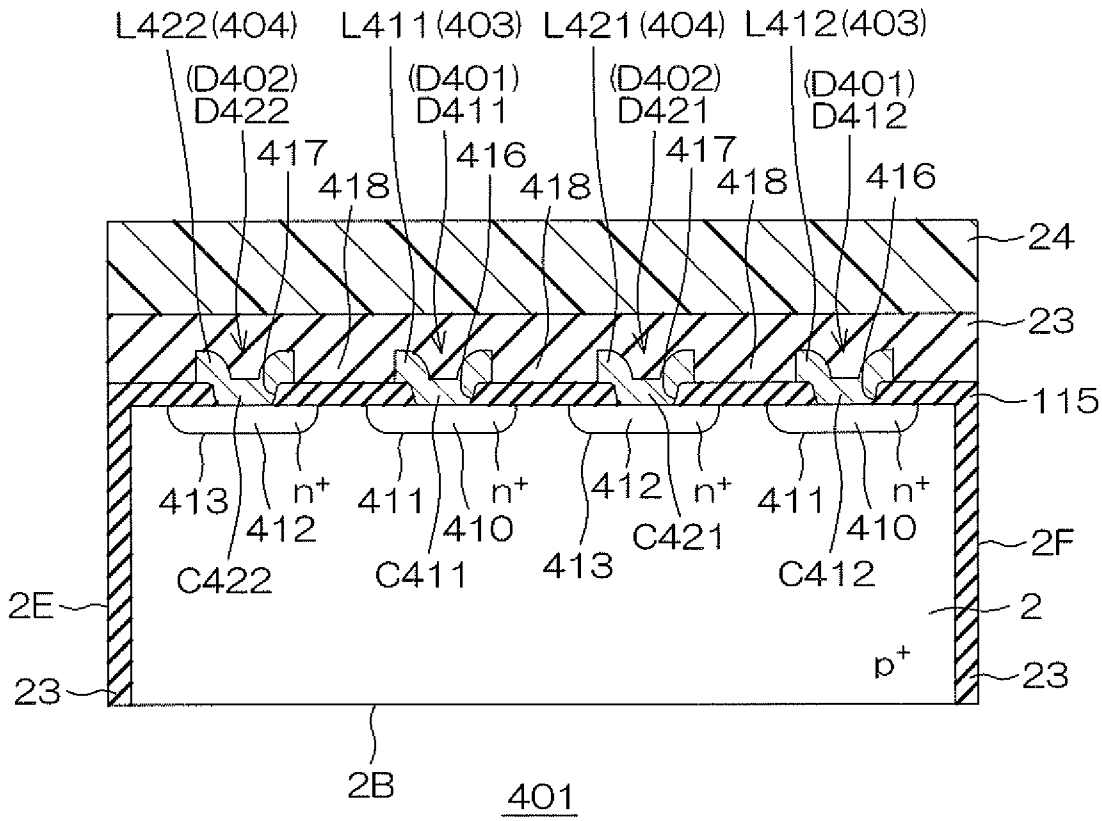
FIG. 21 is a sectional view taken along section line XXI-XXI shown in FIG. 19.

FIG. 19 is a plan view of a chip part 401 according to a third preferred embodiment of the present invention. FIG. 20 is a sectional view taken along section line XX-XX shown in FIG. 19. FIG. 21 is a sectional view taken along section line XXI-XXI shown in FIG. 19.

A point of difference of the chip part 401 according to the third preferred embodiment with respect to the chip part 1 according to the first preferred embodiment described above is that in place of the diode cells D101 to D104, first and second Zener diodes D401 and D402 are formed as the circuit elements formed in the element region 5. Arrangements of other portions are equivalent to the arrangements in the chip part 1 according to the first preferred embodiment. In FIG. 19 to FIG. 21, portions corresponding to the respective portions shown in FIG. 1 to FIG. 18 are provided with the same reference symbols.

The chip part 401 includes the substrate 2 (for example, a $p^+$-type silicon substrate), the first Zener diode D401 formed on the substrate 2, the second Zener diode D402 formed on the substrate 2 and connected anti-serially to the first Zener diode D401, the first connection electrode 3 connected to the first Zener diode D401, and the second connection electrode 4 connected to the second Zener diode D402. The first Zener diode D401 is arranged from a plurality of Zener diodes D411 and D412. The second Zener diode D402 is arranged from a plurality of Zener diodes D421 and D422.

The first connection electrode 3 connected to a first electrode film 403 and the second connection electrode 4 connected to a second electrode film 404 are disposed at respective end portions of the element forming surface 2A according to the third preferred embodiment. A diode forming region 407 is provided in the element forming surface 2A between the first and second connection electrodes 3 and 4. The diode forming region 407 is formed to a rectangle in the present preferred embodiment.

Figure 22:
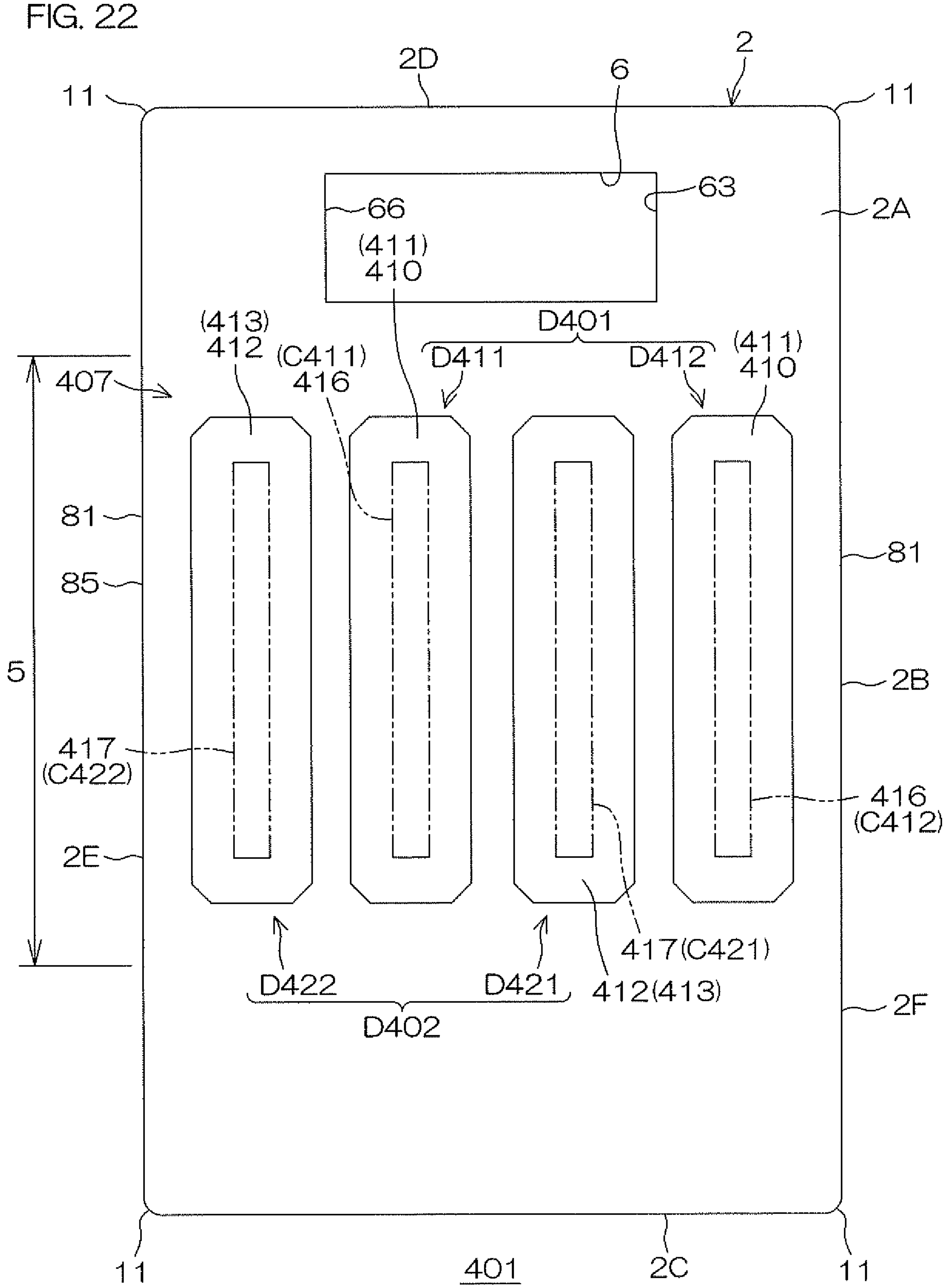
FIG. 22 is a plan view of the chip part shown in FIG. 19 with connection electrodes and the arrangement formed thereon being removed to show the structure of a front surface of a semiconductor substrate.

FIG. 22 is a plan view of the chip part 401 shown in FIG. 19 with the first and second connection electrodes 3 and 4 and the arrangement formed thereon being removed to show the structure of the front surface (element forming surface 2A) of the substrate 2.

Referring to FIG. 19 and FIG. 22, a plurality of first $n^+$-type diffusion regions (hereinafter referred to as "first diffusion regions 410"), respectively forming p-n junction regions 411 with the substrate 2, are formed in a surface layer region of the substrate 2 ($p^+$-type semiconductor substrate). Also, a plurality of second $n^+$-type diffusion regions (hereinafter referred to as "second diffusion regions 412"), respectively forming p-n junction regions 413 with the substrate 2, are formed in the surface layer region of the substrate 2.

In the present preferred embodiment, two each of the first diffusion regions 410 and the second diffusion regions 412 are formed. With the four diffusion regions 410 and 412, the first diffusion regions 410 and the second diffusion regions 412 are aligned alternately and at equal intervals along the short direction of the substrate 2. Also, the four diffusion regions 410 and 412 are formed to extend longitudinally in a direction intersecting (in the present preferred embodiment, a direction orthogonal to) the short direction of the substrate 2. In the present preferred embodiment, the first diffusion regions 410 and the second diffusion regions 412 are formed to be equal in size and equal in shape. Specifically, in a plan view, the first diffusion regions 410 and the second diffusion regions 412 are formed to substantially rectangular shapes, each of which is long in the long direction of the substrate 2 and is cut at the four corners.

The two Zener diodes D411 and D412 are constituted by the respective first diffusion regions 410 and portions of the substrate 2 in the vicinities of the first diffusion regions 410, and the first Zener diode D401 is constituted by the two Zener diodes D411 and D412. The first diffusion regions 410 are separated according to each of the Zener diodes D411 and D412. The Zener diodes D411 and D412 are thereby made to respectively have the p-n junction regions 411 that are separated according to each Zener diode.

Similarly, the two Zener diodes D421 and D422 are constituted by the respective second diffusion regions 412 and portions of the substrate 2 in the vicinities of the second diffusion regions 412, and the second Zener diode D402 is constituted by the two Zener diodes D421 and D422. The second diffusion regions 412 are separated according to each of the Zener diodes D421 and D422. The Zener diodes D421 and D422 are thereby made to respectively have the p-n junction regions 413 that are separated according to each Zener diode.

As shown in FIG. 20 and FIG. 21, the insulating film 115 (omitted from illustration in FIG. 19) is formed on the element forming surface 2A of the substrate 2. First contact holes 416 respectively exposing front surfaces of the first diffusion regions 410 and second contact holes 417 exposing the front surfaces of the second diffusion regions 412 are formed in the insulating film 115. The first electrode film 403 and the second electrode film 404 are formed on the front surface of the insulating film 115.

The first electrode film 403 includes a lead-out electrode L411 connected to the first diffusion region 410 corresponding to the Zener diode D411, a lead-out electrode L412 connected to the first diffusion region 410 corresponding to the Zener diode D412, and a first pad 405 formed integral to the lead-out electrodes L411 and L412 (first lead-out electrodes). The first pad 405 is formed to a rectangle at one end portion of the element forming surface 2A. The first connection electrode 3 is connected to the first pad 405. The first connection electrode 3 is thereby connected in common to the lead-out electrodes L411 and L412.

The second electrode film 404 includes a lead-out electrode L421 connected to the second diffusion region 412 corresponding to the Zener diode D421, a lead-out electrode L422 connected to the second diffusion region 412 corresponding to the Zener diode D422, and a second pad 406 formed integral to the lead-out electrodes L421 and L422 (second lead-out electrodes). The second pad 406 is formed to a rectangle at one end portion of the element forming surface 2A. The second connection electrode 4 is connected to the second pad 406. The second connection electrode 4 is thereby connected in common to the lead-out electrodes L421 and L422. The second pad 406 and the second connection electrode 4 constitute an external connection portion of the second connection electrode 4.

The lead-out electrode L411 enters into the first contact hole 416 of the Zener diode D411 from the front surface of the insulating film 115 and forms an ohmic contact with the first diffusion region 410 of the Zener diode D411 inside the first contact hole 416. In the lead-out electrode L411, the portion bonded to the Zener diode D411 inside the first contact hole 416 constitutes a bonding portion C411. Similarly, the lead-out electrode L412 enters into the first contact hole 416 of the Zener diode D412 from the front surface of the insulating film 115 and forms an ohmic contact with the first diffusion region 410 of the Zener diode D412 inside the first contact hole 416. In the lead-out electrode L412, the portion bonded to the Zener diode D412 inside the first contact hole 416 constitutes a bonding portion C412.

The lead-out electrode L421 enters into the second contact hole 417 of the Zener diode D421 from the front surface of the insulating film 115 and forms an ohmic contact with the second diffusion region 412 of the Zener diode D421 inside the second contact hole 417. In the lead-out electrode L421, the portion bonded to the Zener diode D421 inside the second contact hole 417 constitutes a bonding portion C421. Similarly, the lead-out electrode L422 enters into the second contact hole 417 of the Zener diode D422 from the front surface of the insulating film 115 and forms an ohmic contact with the second diffusion region 412 of the Zener diode D422 inside the second contact hole 417. In the lead-out electrode L422, the portion bonded to the Zener diode D422 inside the second contact hole 417 constitutes a bonding portion C422. In the present preferred embodiment, the first electrode film 403 and the second electrode film 404 are made of the same material. In the present preferred embodiment, Al films are used as the electrode films 403 and 404.

The first electrode film 403 and the second electrode film 404 are separated by a slit 418. The lead-out electrode L411 is formed rectilinearly along a straight line passing above the first diffusion region 410 corresponding to the Zener diode D411 and leading to the first pad 405. Similarly, the lead-out electrode L412 is formed rectilinearly along a straight line passing above the first diffusion region 410 corresponding to the Zener diode D412 and leading to the first pad 405. Each of the lead-out electrodes L411 and L412 has a uniform width at all locations between the corresponding first diffusion region 410 and the first pad 405, and the respective widths are wider than the widths of the bonding portions C411 and C412. The widths of the bonding portions C411 and C412 are defined by the lengths in the direction orthogonal to the lead-out directions of the lead-out electrodes L411 and L412. Tip end portions of the lead-out electrodes L411 and L412 are shaped to match the planar shapes of the corresponding first diffusion regions 410. Base end portions of the lead-out electrodes L411 and L412 are connected to the first pad 405.

The lead-out electrode L421 is formed rectilinearly along a straight line passing above the second diffusion region 412 corresponding to the Zener diode D421 and leading to the second pad 406. Similarly, the lead-out electrode L422 is formed rectilinearly along a straight line passing above the second diffusion region 412 corresponding to the Zener diode D422 and leading to the second pad 406. Each of the lead-out electrodes L421 and L422 has a uniform width at all locations between the corresponding second diffusion region 412 and the second pad 406, and the respective widths are wider than the widths of the bonding portions C421 and C422. The widths of the bonding portions C421 and C422 are defined by the lengths in the direction orthogonal to the lead-out directions of the lead-out electrodes L421 and L422. Tip end portions of the lead-out electrodes L421 and L422 are shaped to match the planar shapes of the corresponding second diffusion regions 412. Base end portions of the lead-out electrodes L421 and L422 are connected to the second pad 406.

That is, the first and second connection electrodes 3 and 4 are formed in comb-teeth-like shapes in which the plurality of first lead-out electrodes L411 and L412 and the plurality of second lead-out electrodes L421 and L422 are mutually engaged. Also, the first connection electrode 3 plus the first diffusion regions 410 and the second connection electrode 4 plus the second diffusion regions 412 are arranged to be mutually symmetrical in a plan view. More specifically, the first connection electrode 3 plus the first diffusion regions 410 and the second connection electrode 4 plus the second diffusion regions 412 are arranged to be point symmetrical with respect to a center of gravity of the element forming surface 2A in a plan view.

The first connection electrode 3 plus the first diffusion regions 410 and the second connection electrode 4 plus the second diffusion regions 412 may also be regarded as being arranged to be practically line symmetrical. Specifically, the second lead-out electrode L422 at one of the long sides of the substrate 2 and the first lead-out electrode L411 adjacent thereto may be regarded as being at substantially the same position, and the first lead-out electrode L412 at the other long side of the substrate 2 and the second lead-out electrode L421 adjacent thereto may be regarded as being at substantially the same position. In this case, the first connection electrode 3 plus the first diffusion regions 410 and the second connection electrode 4 plus the second diffusion regions 412 may be regarded as being arranged to be line symmetrical with respect to a straight line parallel to the short direction of the element forming surface 2A and passing through the long direction center in a plan view. The slit 418 is formed so as to border the lead-out electrodes L411, L412, L421, and L422.

The passivation film 23 is formed in the same arrangement as in the first preferred embodiment so as to cover the element forming surface 2A (upper sides of the first electrode film 403 and the second electrode film 404), and the side surfaces 2C to 2F. Further, the resin film 24 is formed so as to cover the passivation film 23. The notched portion 122, which exposes a partial region of the front surface of the first electrode film 403 that is to be the first pad 405, is formed to penetrate through the passivation film 23 and the resin film 24. Further, the notched portion 123 is formed to penetrate through the passivation film 23 and the resin film 24 so as to expose a partial region of the front surface of the second electrode film 404 that is to be the second pad 406. The first and second connection electrodes 3 and 4 are formed in the same arrangements as in the first preferred embodiment on the first pad 405 and the second pad 406 exposed from the notched portions 122 and 123.

On the front surface of the first electrode film 403 (first pad 405), the passivation film 23 and the resin film 24 constitute a protective film of the chip part 401 to suppress or prevent the entry of moisture to the first lead-out electrodes L411 and L412, the second lead-out electrodes L421 and L422, and the p-n junction regions 411 and 413 and also absorb impacts, etc., from the exterior, thereby contributing to improvement of the durability of the chip part 401.

The first diffusion regions 410 of the plurality of Zener diodes D411 and D412 that constitute the first Zener diode D401 are connected in common to the first connection electrode 3 and are connected to the substrate 2, which is the p-type region in common to the Zener diodes D411 and D412. The plurality of Zener diodes D411 and D412 that constitute the first Zener diode D401 are thereby connected in parallel. Meanwhile, the second diffusion regions 412 of the plurality of Zener diodes D421 and D422 that constitute the second Zener diode D402 are connected to the second connection electrode 4 and are connected to the substrate 2, which is the p-type region in common to the Zener diodes D421 and D422. The plurality of Zener diodes D421 and D422 that constitute the second Zener diode D402 are thereby connected in parallel. The parallel circuit of the Zener diodes D421 and D422 and the parallel circuit of the Zener diodes D411 and D412 are connected anti-serially, and the bidirectional Zener diode is constituted by the anti-serial circuit.

Figure 23:
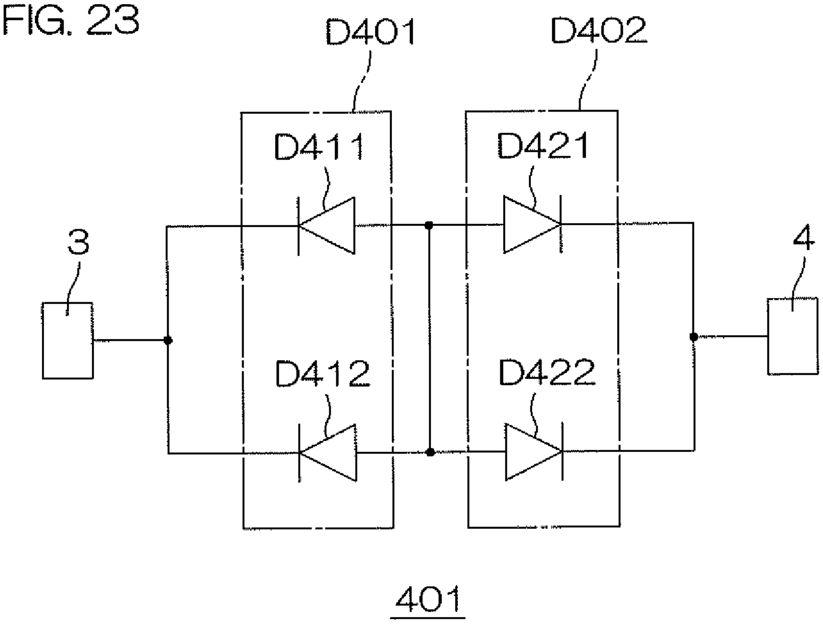
FIG. 23 is an electric circuit diagram of the electrical structure of the interior of the chip part shown in FIG. 19.

FIG. 23 is an electric circuit diagram of the electrical structure of the interior of the chip part 401 shown in FIG. 19. The cathodes of the plurality of Zener diodes D411 and D412 constituting the first Zener diode D401 are connected in common to the first connection electrode 3 and the anodes thereof are connected in common to the anodes of the plurality of Zener diodes D421 and D422 constituting the second Zener diode D402. The cathodes of the plurality of Zener diodes D421 and D422 are connected in common to the second connection electrode 4. These thus function as a single bidirectional Zener diode as a whole.

With the present preferred embodiment, the first connection electrode 3 plus the first diffusion regions 410 and the second connection electrode 4 plus the second diffusion regions 412 are arranged to be mutually symmetrical, and characteristics for respective current directions can thus be made practically equal.

Figure 24A:
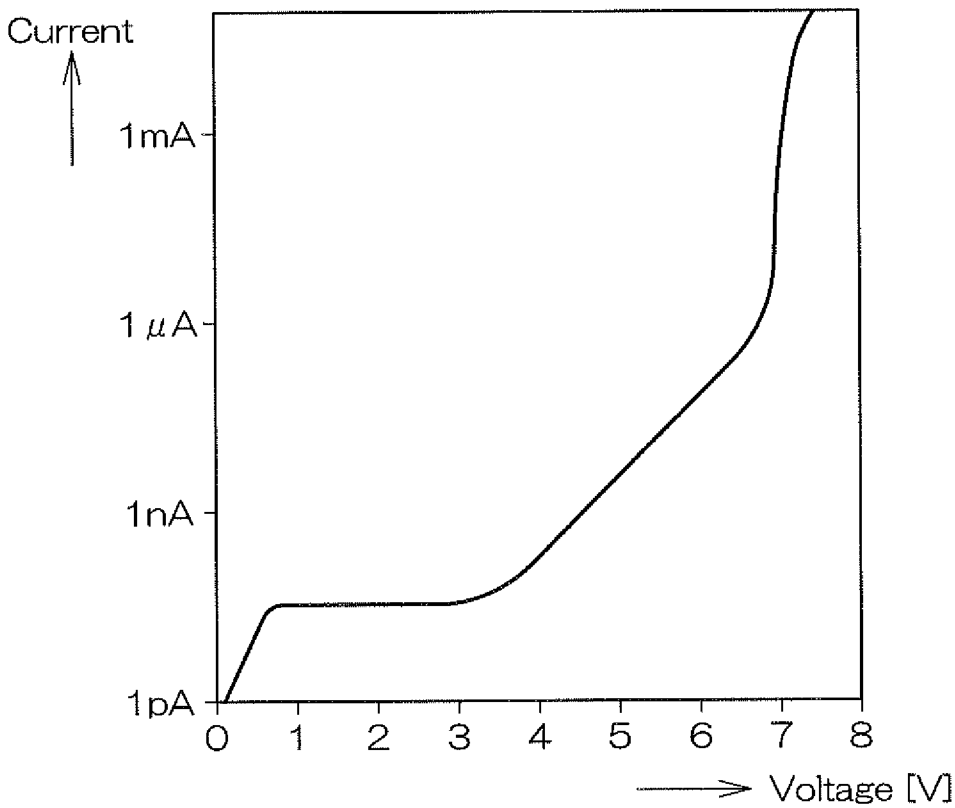
FIG. 24A is a graph of experimental results of measuring, for respective current directions, current vs. voltage characteristics of the chip part shown in FIG. 19.
Figure 24B:
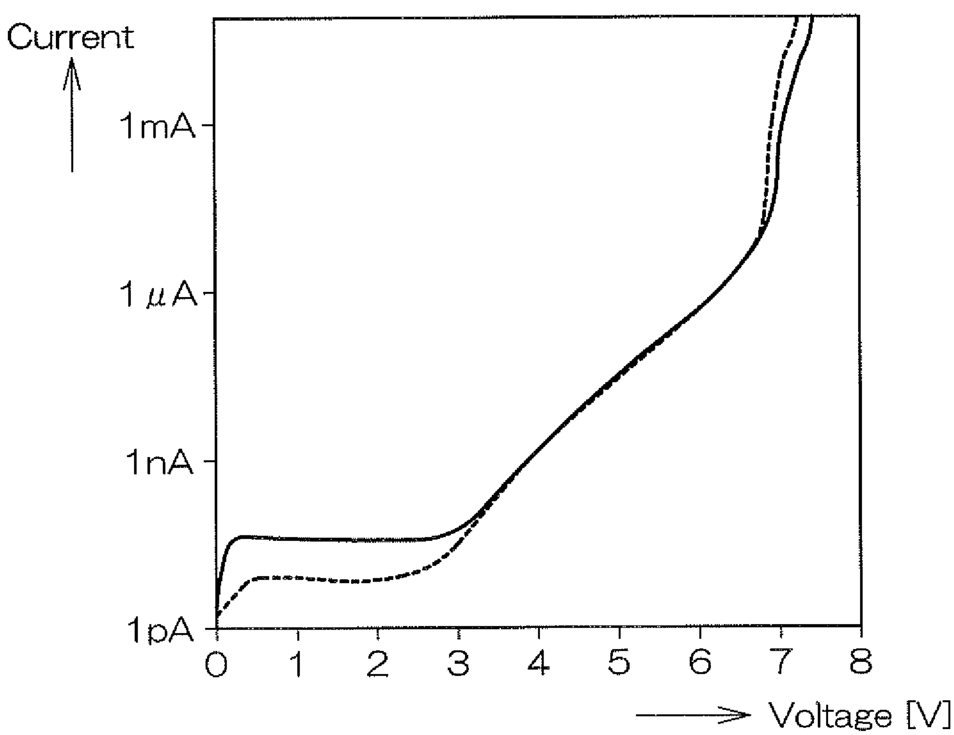
FIG. 24B is a graph of experimental results of measuring, for respective current directions, current vs. voltage characteristics of a bidirectional Zener diode chip, with which a first connection electrode plus first diffusion region and a second connection electrode plus second diffusion region are arranged to be mutually asymmetrical.

FIG. 24B is a graph of experimental results of measuring, for respective current directions, current vs. voltage characteristics of a bidirectional Zener diode chip, with which a first connection electrode plus first diffusion region and a second connection electrode plus second diffusion region are arranged to be mutually asymmetrical.

In FIG. 24B, a solid line indicates the current vs. voltage characteristics in a case of applying voltage to the bidirectional Zener diode with one electrode being a positive electrode and the other electrode being a negative electrode and a broken line indicates the current vs. voltage characteristics in a case of applying voltage to the bidirectional Zener diode with the one electrode being the negative electrode and the other electrode being the positive electrode. From the experimental results, it can be understood with the bidirectional Zener diode, with which the first connection electrode plus first diffusion region and the second connection electrode plus second diffusion region are arranged to be asymmetrical, the current vs. voltage characteristics are not equal for the respective current directions.

FIG. 24A is a graph of experimental results of measuring, for respective current directions, current vs. voltage characteristics of the chip part 401 shown in FIG. 19.

With the bidirectional Zener diode according to the present preferred embodiment, both the current vs. voltage characteristics in the case of applying voltage with the first connection electrode 3 being the positive electrode and the second connection electrode 4 being the negative electrode and the current vs. voltage characteristics in the case of applying voltage with the second connection electrode 4 being the positive electrode and the first connection electrode 3 being the negative electrode were characteristics indicated by a solid line in FIG. 24A. That is, with the bidirectional Zener diode according to the present preferred embodiment, the current vs. voltage characteristics were practically equal for the respective current directions.

With the arrangement of the present preferred embodiment, the chip part 401 has the first Zener diode D401 and the second Zener diode D402. The first Zener diode D401 has the plurality of Zener diodes D411 and D412 (first diffusion regions 410) and each of the Zener diodes D411 and D412 has the p-n junction region 411. The p-n junction regions 411 are separated according to each of the Zener diodes D411 and D412. Therefore "a peripheral length of the p-n junction regions 411 of the first Zener diode D401," that is, the total (total extension) of the peripheral lengths of the first diffusion regions 410 in the substrate 2 is long. The electric field can thereby be dispersed and prevented from concentrating at vicinities of the p-n junction regions 411, and the ESD resistance of the first Zener diode D401 can thus be improved. That is, even when the chip part 401 is to be formed compactly, the total peripheral length of the p-n junction regions 411 can be made large, thereby enabling both downsizing of the chip part 401 and securing of the ESD resistance to be achieved at the same time.

Similarly, the second Zener diode D402 has the plurality of Zener diodes D421 and D422 (second diffusion regions 412) and each of the Zener diodes D421 and D422 has the p-n junction region 413. The p-n junction regions 413 are separated according to each of the Zener diodes D421 and D422. Therefore "a peripheral length of the p-n junction regions 413 of the second Zener diode D402," that is, the total (total extension) of the peripheral lengths of the p-n junction regions 413 in the substrate 2 is long. The electric field can thereby be dispersed and prevented from concentrating at vicinities of the p-n junction regions 413, and the ESD resistance of the second Zener diode D402 can thus be improved. That is, even when the chip part 401 is to be formed compactly, the total peripheral length of the p-n junction regions 413 can be made large, thereby enabling both downsizing of the chip part 401 and securing of the ESD resistance to be achieved at the same time.

With the present preferred embodiment, the respective peripheral lengths of the p-n junction regions 411 of the first Zener diode D401 and the p-n junction regions 413 of the second Zener diode D402 are defined to be not less than 400 μm and not more than 1500 μm. More preferably, the respective peripheral lengths are defined to be not less than 500 μm and not more than 1000 μm.

As shall be described later using FIG. 25, a bidirectional Zener diode chip of high ESD resistance can be realized because the respective peripheral lengths are defined to be not less than 400 μm. Also, as shall be described later using FIG. 26, a bidirectional Zener diode chip with which the capacitance between the first connection electrode 3 and the second connection electrode 4 (inter-terminal capacitance) is small can be realized because the respective peripheral lengths are defined to be not more than 1500 μm. More specifically, a bidirectional Zener diode chip with an inter-terminal capacitance of not more than 30 [pF] can be realized. More preferably, the respective peripheral lengths are defined to be not less than 500 μm and not more than 1000 μm.

Figure 25:
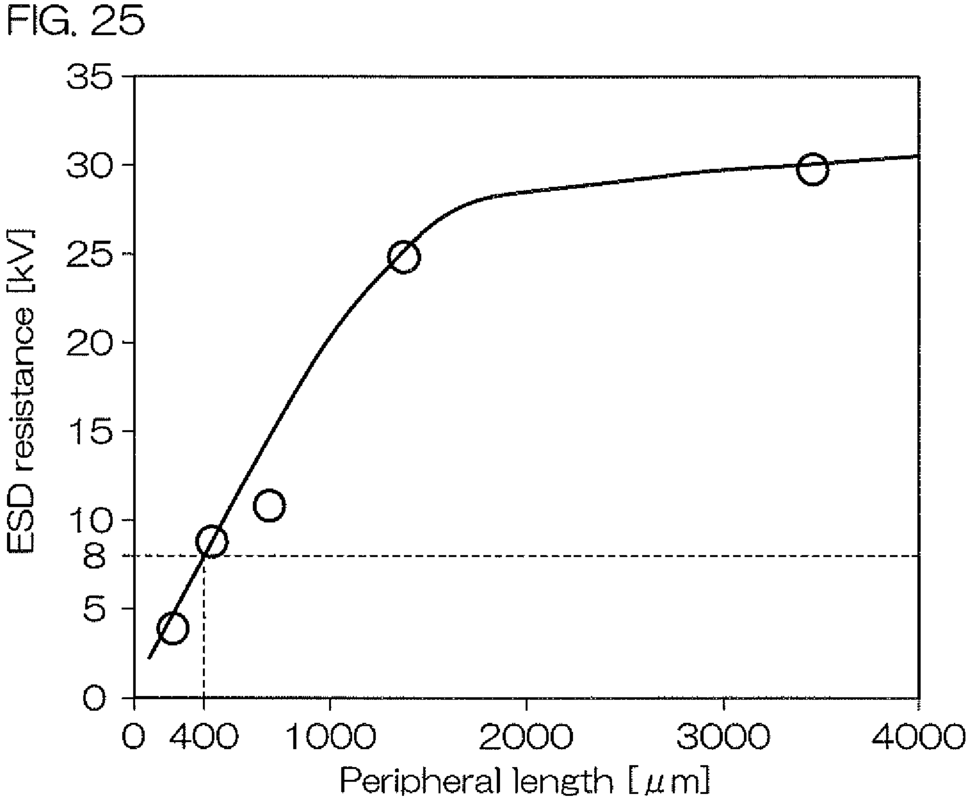
FIG. 25 is a graph of experimental results of measuring the ESD resistances of a plurality of samples that are differed in respective peripheral lengths of p-n junction regions of a first Zener diode and p-n junction regions of a second Zener diode by variously setting the number of lead-out electrodes (diffusion regions) and/or the sizes of the diffusion regions formed on a semiconductor substrate of the same area.

FIG. 25 is a graph of experimental results of measuring the ESD resistances of a plurality of samples that are differed in the respective peripheral lengths of the p-n junction regions of the first Zener diode and the p-n junction regions of the second Zener diode by variously setting the number of lead-out electrodes (diffusion regions) and/or the sizes of the diffusion regions formed on the substrate of the same area. In each sample, the first connection electrode plus the first diffusion regions and the second connection electrode plus the second diffusion regions are formed to be mutually symmetrical in the same manner as in the preferred embodiment. Therefore in each sample, the peripheral length of the junction regions 411 of the first Zener diode D401 and the peripheral length of the p-n junction regions 413 of the second Zener diode D402 are substantially equal.

The abscissa axis of FIG. 25 indicates a length that is one of either the peripheral length of the p-n junction regions 411 of the first Zener diode D401 or the peripheral length of the p-n junction regions 413 of the second Zener diode D402. From these experimental results, it can be understood that the longer the respective peripheral lengths of the p-n junction regions 411 and p-n junction regions 413, the greater the ESD resistance. In cases where the respective peripheral lengths of the p-n junction regions 411 and p-n junction regions 413 are defined to be not less than 400 μm, ESD resistances of not less than 8 kilovolts, which is the target value, could be realized.

Figure 26:
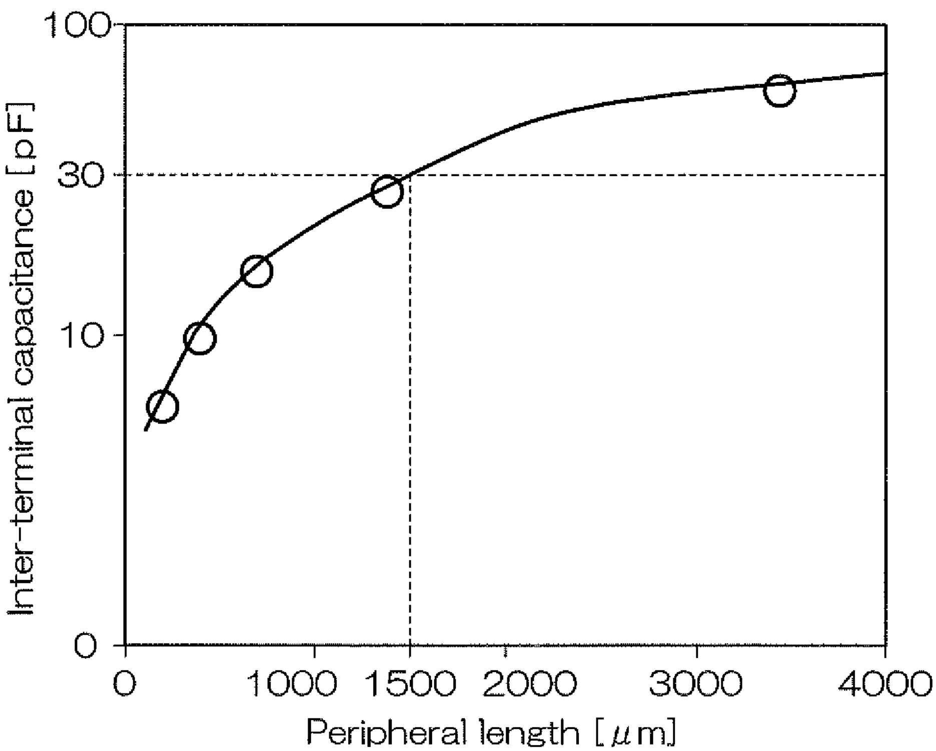
FIG. 26 is a graph of experimental results of measuring the inter-terminal capacitances of the plurality of samples that are differed in the respective peripheral lengths of the p-n junction regions of the first Zener diode and the p-n junction regions of the second Zener diode by variously setting the number of lead-out electrodes (diffusion regions) and/or the sizes of the diffusion regions formed on the semiconductor substrate of the same area.

FIG. 26 is a graph of experimental results of measuring the inter-terminal capacitances of the plurality of samples that are differed in the respective peripheral lengths of the p-n junction regions of the first Zener diode and the p-n junction regions of the second Zener diode by variously setting the number of lead-out electrodes (diffusion regions) and/or the sizes of the diffusion regions formed on the substrate of the same area. In each sample, the first connection electrode plus the first diffusion regions and the second connection electrode plus the second diffusion regions are formed to be mutually symmetrical in the same manner as in the preferred embodiment.

The abscissa axis of FIG. 26 indicates a length that is one of either the peripheral length of the junction regions 411 of the first Zener diode D401 or the peripheral length of the p-n junction regions 413 of the second Zener diode D402. From these experimental results, it can be understood that the longer the respective peripheral lengths of the p-n junction regions 411 and p-n junction regions 413, the greater the inter-terminal capacitance. In cases where the respective peripheral lengths of the p-n junction regions 411 and p-n junction regions 413 are defined to be not more than 1500 μm, inter-terminal capacitances of not more than 30 [pF], which is the target value, could be realized.

Further with the present preferred embodiment, the widths of the lead-out electrodes L411, L412, L421, and L422 are wider than the widths of the bonding portions C411, C412, C421, and C422 at all locations between the bonding portions C411, C412, C421, and C422 and the first pad 405. A large allowable current amount can thus be set and electromigration can be reduced to improve reliability with respect to a large current. That is, a bidirectional Zener diode chip that is compact, high in ESD resistance, and secured in reliability with respect to large currents can be provided.

Further, the first and second connection electrodes 3 and 4 are both formed on the element forming surface 2A, which is one of the surfaces of the substrate 2. Therefore as described with the first preferred embodiment, a circuit assembly having the chip part 401 surface-mounted on the mounting substrate 9 can be arranged by making the element forming surface 2A face the mounting substrate 9 and bonding the first and second connection electrodes 3 and 4 onto the mounting substrate 9 by the solders 13 (see FIG. 13). That is, the chip part 401 of the flip-chip connection type can be provided, and by performing face-down bonding with the element forming surface 2A being made to face the mounting surface of the mounting substrate 9, the chip part 401 can be connected to the mounting substrate 9 by wireless bonding. The space occupied by the chip part 401 on the mounting substrate 9 can thereby be made small. In particular, reduction of height of the chip part 401 on the mounting substrate 9 can be realized. Effective use can thereby be made of the space inside a casing of a compact electronic device, etc., to contribute to high-density packaging and downsizing.

Also with the present preferred embodiment, the insulating film 115 is formed on the substrate 2 and the bonding portions C411 and C412 of the lead-out electrodes L411 and L412 are connected to the first diffusion regions 410 of the Zener diodes D411 and D412 via the first contact holes 416 formed in the insulating film 115. The first pad 405 is disposed on the insulating film 115 in the region outside the first contact holes 416. That is, the first pad 405 is provided at a position separated from positions directly above the p-n junction regions 411.

Similarly, the bonding portions C421 and C422 of the lead-out electrodes L421 and L422 are connected to the second diffusion regions 412 of the Zener diodes D421 and D422 via the second contact holes 417 formed in the insulating film 115. The second pad 406 is disposed on the insulating film 115 in the region outside the second contact holes 417. The second pad 406 is also disposed at a position separated from positions directly above the p-n junction regions 413. Application of a large impact to the p-n junction regions 411 and 413 can thus be avoided during mounting of the chip part 401 on the mounting substrate 9. Destruction of the p-n junction regions 411 and 413 can thereby be avoided and a bidirectional Zener diode chip that is excellent in durability against external forces can thereby be realized.

Such a chip part 401 may be obtained by executing a process of forming the first and second Zener diodes D401 and D402 in place of the process of forming the diode cells D101 to D104 in the first preferred embodiment. Points of difference with respect to the manufacturing process for the first preferred embodiment shall now be described in detail with reference to FIG. 27.

Figure 27:
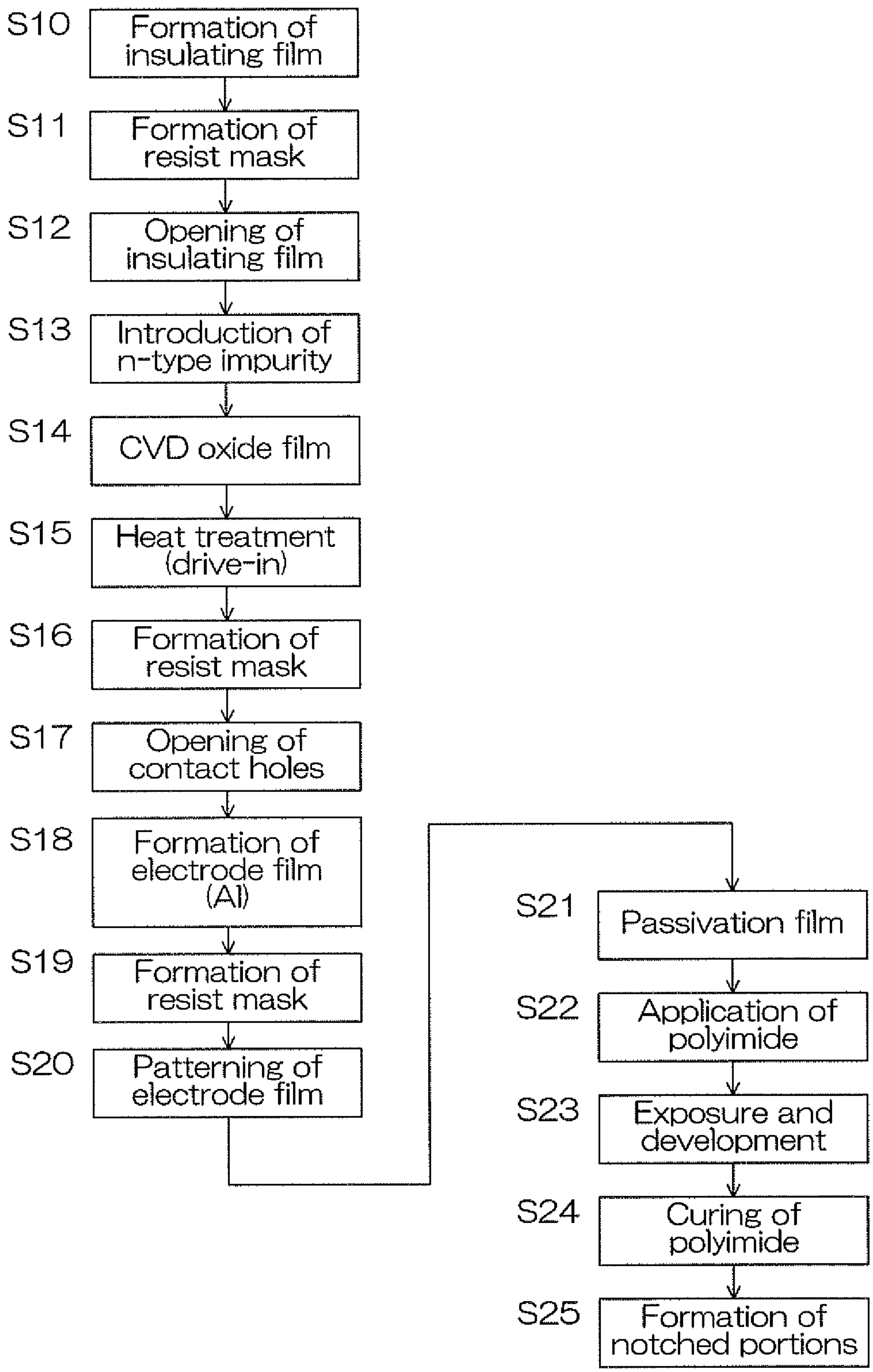
FIG. 27 is a flow chart for describing an example of a manufacturing process of the chip part shown in FIG. 19.

FIG. 27 is a flow chart for describing an example of a manufacturing process of the chip part 401 shown in FIG. 19.

First, a $p^+$-type substrate (corresponding to the substrate 30 in first preferred embodiment) is prepared as the base substrate of the substrate 2. A front surface of the substrate is an element forming surface and corresponds to the element forming surface 2A of the substrate 2. A plurality of bidirectional Zener diode chip regions, corresponding to a plurality of the chip parts 401, are aligned and set in a matrix on the element forming surface. Thereafter, the insulating film 115 is formed on the element forming surface of the substrate (step S10) and a resist mask is formed thereon (step S11). Openings corresponding to the first diffusion regions 410 and the second diffusion regions 412 are then formed in the insulating film 115 by etching using the resist mask (step S12).

Further, after peeling off the resist mask, an n-type impurity is introduced to surface layer portions of the substrate that are exposed from the openings formed in the insulating film 115 (step S13). The introduction of the n-type impurity may be performed by a process of depositing phosphorus as the n-type impurity on the front surface (so-called phosphorus deposition) or by implantation of n-type impurity ions (for example, phosphorus ions). Phosphorus deposition is a process of depositing phosphorus on the front surface of the substrate exposed inside the openings in the insulating film 115 by conveying the substrate into a diffusion furnace and performing heat treatment while making $POCl_3$ gas flow inside a diffusion passage. After thickening the insulating film 115 as necessary (step S14), heat treatment (drive-in) for activation of the impurity ions introduced into the substrate is performed (step S15). The first diffusion regions 410 and the second diffusion regions 412 are thereby formed on the surface layer portion of the substrate.

Thereafter, another resist mask having openings matching the contact holes 416 and 417 is formed on the insulating film 115 (step S16). The contact holes 416 and 417 are formed in the insulating film 115 by etching via the resist mask (step S17), and the resist mask is peeled off thereafter.

An electrode film that constitutes the first electrode film 403 and the second electrode film 404 is then formed on the insulating film 115, for example, by sputtering (step S18). In the present preferred embodiment, an electrode film, made of Al, is formed. Another resist mask having an opening pattern corresponding to the slit 418 is then formed on the electrode film (step S19) and the slit 418 is formed in the electrode film by etching (for example, reactive ion etching) via the resist mask (step S20). The electrode film is thereby separated into the first electrode film 403 and the second electrode film 404.

Then after peeling off the resist film, the passivation film 23, which is a nitride film, etc., is formed, for example, by the CVD method (step S21), and further, polyimide, etc., is applied to form the resin film 24 (step S22). For example, a polyimide imparted with photosensitivity is applied, and after exposing in a pattern corresponding to the notched portions 122 and 123, the polyimide film is developed (step S23). The resin film 24 having the notched portions 122 and 123 that selectively expose the front surfaces of the first electrode film 403 and the second electrode film 404 is thereby formed. Thereafter, heat treatment for curing the resin film is performed as necessary (step S24). The notched portions 122 and 123 are then formed by performing dry etching (for example, reactive ion etching) using the resin film 24 as a mask (step S25).

Thereafter, the first and second connection electrodes 3 and 4 are formed as the external connection electrodes so as to be connected to the first electrode film 403 and the second electrode film 404 and then the substrate is separated into individual chips in accordance with the method described above with the first preferred embodiment (see FIG. 8D to FIG. 8H). The chip parts 401 with the structure described above can thereby be obtained.

With the present preferred embodiment, the substrate 2 is constituted of the p-type semiconductor substrate and therefore stable characteristics can be realized even if an epitaxial layer is not formed on the substrate 2. That is, an n-type semiconductor substrate is large in in-plane variation of resistivity, and therefore when an n-type semiconductor substrate is used, an epitaxial layer with low in-plane variation of resistivity must be formed on the front surface and an impurity diffusion layer must be formed on the epitaxial layer to form the p-n junction. This is because an n-type impurity is low in segregation coefficient and therefore when an ingot (for example, a silicon ingot) that is the base of a substrate is formed, a large difference in resistivity arises between a central portion and a peripheral edge portion of the substrate. On the other hand, a p-type impurity is comparatively high in segregation coefficient and therefore a p-type semiconductor substrate is low in in-plane variation of resistivity. Therefore by using a p-type semiconductor substrate, a bidirectional Zener diode with stable characteristics can be cut out from any location of the substrate without having to form an epitaxial layer. Therefore by using the $p^+$-type semiconductor substrate as the substrate 2, the manufacturing process can be simplified and the manufacturing cost can be reduced.

FIG. 28A to FIG. 28F are plan views respectively of first to sixth modification examples of the chip part 401 shown in FIG. 19. FIG. 28A to FIG. 28F are plan views corresponding to FIG. 19. In FIG. 28A to FIG. 28F, portions corresponding to respective portions shown in FIG. 19 are provided with the same reference symbols as in FIG. 19.

Figure 28A:
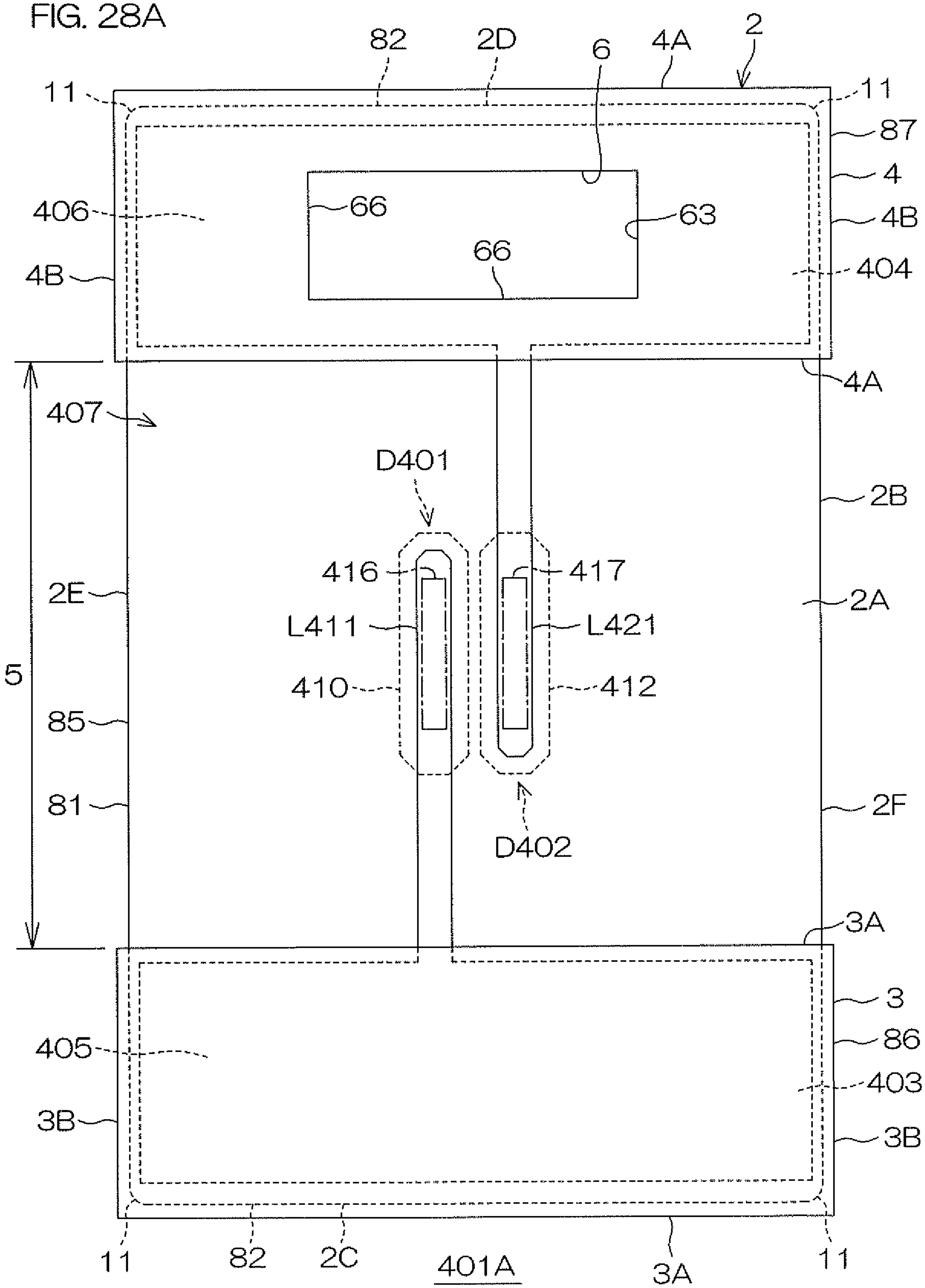
FIG. 28A to FIG. 28F are plan views respectively of first to sixth modification examples of the chip part shown in FIG. 19.

With the chip part 401A shown in FIG. 28A, one each of the first diffusion region 410 and the second diffusion region 412 are formed. The first Zener diode D401 is constituted of a single Zener diode corresponding to the first diffusion region 410. The second Zener diode D402 is constituted of a single Zener diode corresponding to the second diffusion region 412. The first diffusion region 410 and the second diffusion region 412 have substantially rectangular shapes that are long in the long direction of the substrate 2 and are disposed across an interval in the short direction of the substrate 2. The lengths of the first diffusion region 410 and the second diffusion region 412 in the long direction are defined to be comparatively short (shorter than ½ the interval between the first pad 405 and the second pad 406). The interval between the first diffusion region 410 and the second diffusion region 412 is set to be shorter than the widths of the diffusion regions 410 and 412.

The single lead-out electrode L411 corresponding to the first diffusion region 410 is formed in the first connection electrode 3. Similarly, the single lead-out electrode L421 corresponding to the second diffusion region 412 is formed in the second connection electrode 4. The first and second connection electrodes 3 and 4 are formed in comb-teeth-like shapes in which the lead-out electrode L411 and the lead-out electrode L421 are mutually engaged.

The first connection electrode 3 plus the first diffusion region 410 and the second connection electrode 4 plus the second diffusion region 412 are arranged to be point symmetrical with respect to the center of gravity of the element forming surface 2A in a plan view. The first connection electrode 3 plus the first diffusion region 410 and the second connection electrode 4 plus the second diffusion region 412 may also be regarded as being arranged to be practically line symmetrical. That is, if the first lead-out electrode L411 and the second lead-out electrode L421 are regarded to be at substantially the same position, the first connection electrode 3 plus the first diffusion region 410 and the second connection electrode 4 plus the second diffusion region 412 may be regarded as being arranged to be line symmetrical with respect to the straight line parallel to the short direction of the element forming surface 2A and passing through the long direction center in a plan view.

Figure 28B:
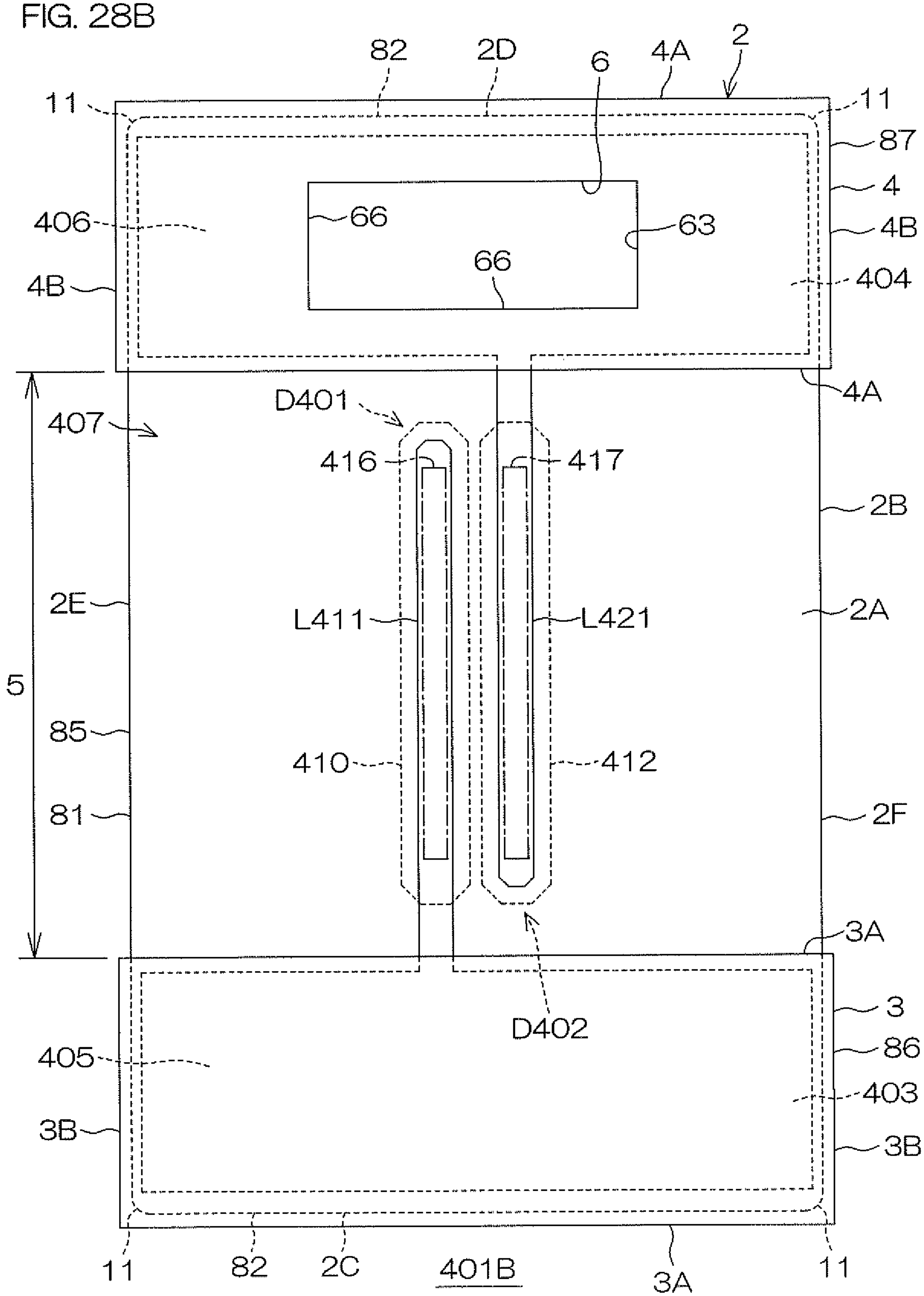

As with the chip part 401A shown in FIG. 28A, with the chip part 401B shown in FIG. 28B, each of the first Zener diode D401 and the second Zener diode D402 is constituted of a single Zener diode. With the chip part 401B shown in FIG. 28B, the lengths of the first diffusion region 410 and the second diffusion region 412 in the long direction and the lengths of the lead-out electrodes L411 and L421 are defined to be comparatively long (longer than ½ the interval between the first pad 405 and the second pad 406) in comparison to the chip part 401A shown in FIG. 28A.

Figure 28C:
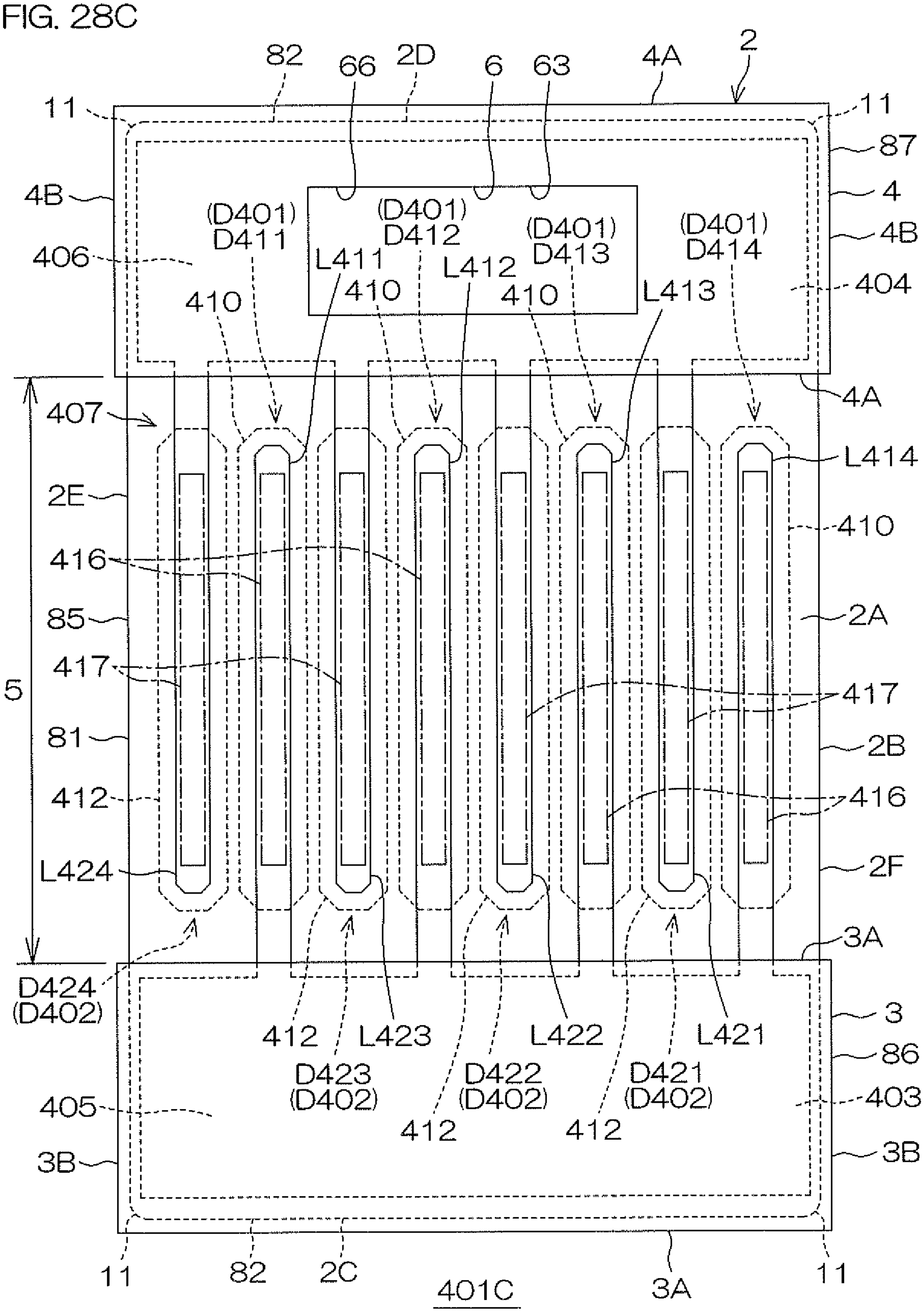

With the chip part 401C shown in FIG. 28C, four each of the first diffusion regions 410 and the second diffusion regions 412 are formed. The eight first diffusion regions 410 and second diffusion regions 412 have rectangular shapes that are long in the long direction of the substrate 2, and the first diffusion regions 410 and the second diffusion regions 412 are disposed alternately at equal intervals along the short direction of the substrate 2. The first Zener diode D401 is constituted of four Zener diodes D411 to D414 respectively corresponding to the respective first diffusion regions 410. The second Zener diode D402 is constituted of four Zener diodes D421 to D424 respectively corresponding to the respective second diffusion regions 412.

Four lead-out electrodes L411 to L414 respectively corresponding to the respective first diffusion regions 410 are formed in the first connection electrode 3. Similarly, four lead-out electrodes L421 to L424 respectively corresponding to the respective second diffusion regions 412 are formed in the second connection electrode 4. The first and the second connection electrodes 3 and 4 are formed in comb-teeth-like shapes in which the lead-out electrodes L411 to L414 and the lead-out electrodes L421 to L424 are mutually engaged.

The first connection electrode 3 plus the first diffusion regions 410 and the second connection electrode 4 plus the second diffusion regions 412 are arranged to be point symmetrical with respect to the center of gravity of the element forming surface 2A in a plan view. The first connection electrode 3 plus the first diffusion regions 410 and the second connection electrode 4 plus the second diffusion regions 412 may also be regarded as being arranged to be practically line symmetrical. That is, if it is regarded that the mutually adjacent electrodes among the first lead-out electrodes L411 to L414 and the second lead-out electrodes L421 to L424 (L424 plus L411, L423 plus L412, L422 plus L413, and L421 plus L414) are at substantially the same positions, the first connection electrode 3 plus the first diffusion regions 410 and the second connection electrode 4 plus the second diffusion regions 412 may be regarded as being arranged to be line symmetrical with respect to the straight line parallel to the short direction center of the element forming surface 2A and passing through the long direction center in a plan view.

Figure 28D:
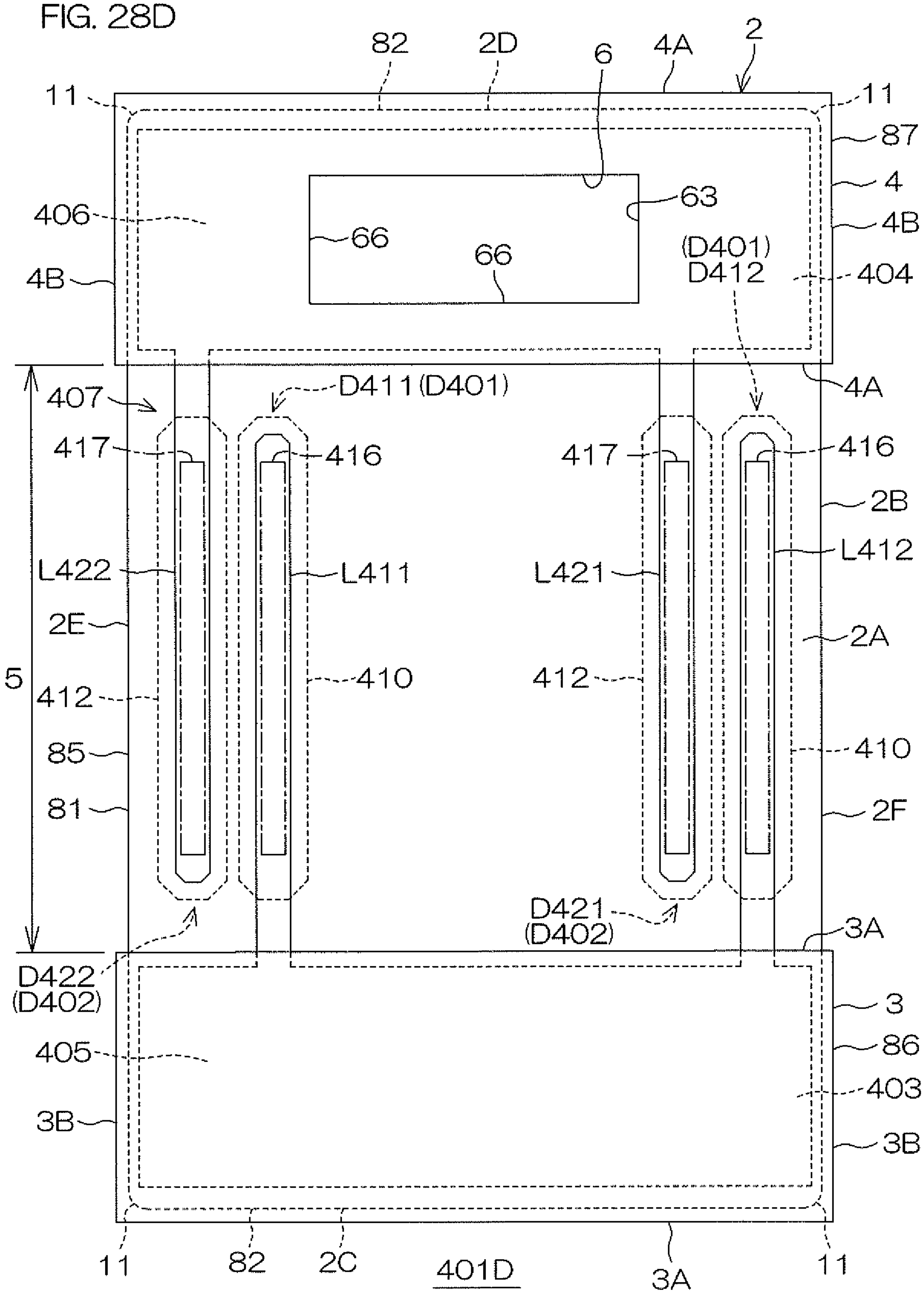

As with the preferred embodiment of FIG. 19, with the chip part 410D shown in FIG. 28D, two each of the first diffusion regions 410 and the second diffusion regions 412 are formed. The four first diffusion regions 410 and second diffusion regions 412 have rectangular shapes that are long in the long direction of the substrate 2, and the first diffusion regions 410 and the second diffusion regions 412 are disposed alternately along the short direction of the substrate 2. The first Zener diode D401 is constituted of two Zener diodes D411 and D412 respectively corresponding to the respective first diffusion regions 410. The second Zener diode D402 is constituted of two Zener diodes D421 and D422 respectively corresponding to the respective second diffusion regions 412. On the element forming surface 2A, the four diodes are aligned in the short side direction of the surface in the order of D422, D411, D421, and D412.

The second diffusion region 412 corresponding to the Zener diode D422 and the first diffusion region 410 corresponding to the Zener diode D411 are disposed adjacent to each other at a portion of the element forming surface 2A that is close to one of the long sides of the surface. The second diffusion region 412 corresponding to the Zener diode D421 and the first diffusion region 410 corresponding to the Zener diode D412 are disposed adjacent to each other at a portion of the element forming surface 2A that is close to the other long side of the surface. The first diffusion region 410 corresponding to the Zener diode D411 and the second diffusion region 412 corresponding to the Zener diode D421 are thus disposed across a large interval (an interval greater than the widths of the diffusion regions 410 and 412).

Two lead-out electrodes L411 and L412 respectively corresponding to the respective first diffusion regions 410 are formed in the first connection electrode 3. Similarly, two lead-out electrodes L421 and L422 respectively corresponding to the respective second diffusion regions 412 are formed in the second connection electrode 4. The first and second connection electrodes 3 and 4 are formed in comb-teeth-like shapes in which the lead-out electrodes L411 and L412 and the lead-out electrodes L421 and L422 are mutually engaged.

The first connection electrode 3 plus the first diffusion regions 410 and the second connection electrode 4 plus the second diffusion regions 412 are arranged to be point symmetrical with respect to the center of gravity of the element forming surface 2A in a plan view. The first connection electrode 3 plus the first diffusion regions 410 and the second connection electrode 4 plus the second diffusion regions 412 may also be regarded as being arranged to be practically line symmetrical. That is, the second lead-out electrode L422 at one of the long sides of the substrate 2 and the first lead-out electrode L411 adjacent thereto may be regarded as being at substantially the same position, and the first lead-out electrode L412 at the other long side of the substrate 2 and the second lead-out electrode L421 adjacent thereto may be regarded as being at substantially the same position. In this case, the first connection electrode 3 plus the first diffusion regions 410 and the second connection electrode 4 plus the second diffusion regions 412 may be regarded as being arranged to be line symmetrical with respect to the straight line parallel to the short direction of the element forming surface 2A and passing through the long direction center in a plan view.

Figure 28E:
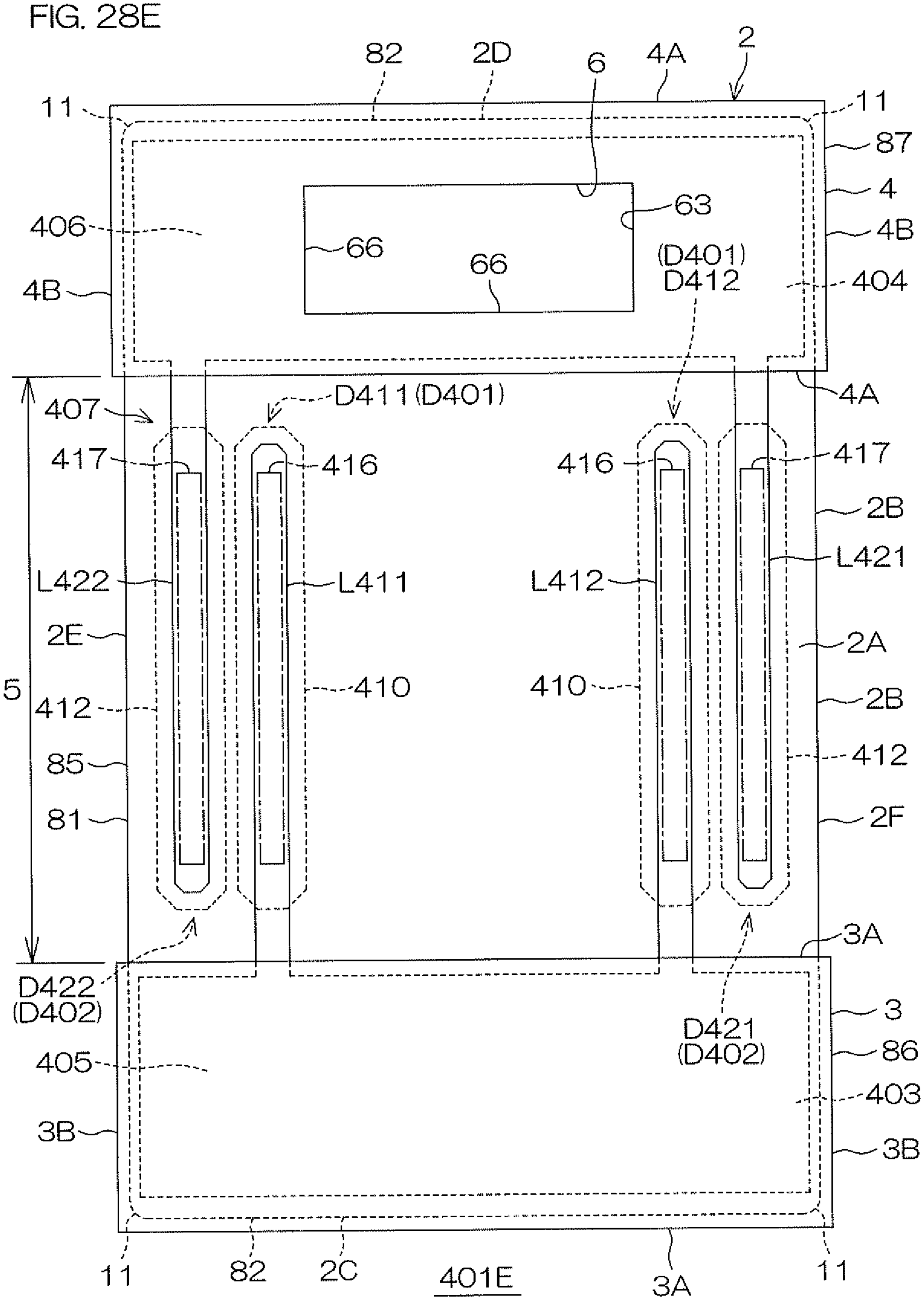

With the chip part 401E of FIG. 28E, two each of the first diffusion regions 410 and the second diffusion regions 412 are formed. The respective first diffusion regions 410 and the respective second diffusion regions 412 have substantially rectangular shapes that are long in the long direction of the first diffusion region 410. One of the second diffusion regions 412 is formed at a portion of the element forming surface 2A close to one of the long sides of the surface and the other second diffusion region 412 is formed at a portion of the element forming surface 2A close to the other long side of the surface. The two first diffusion regions 410 are formed respectively adjacent to the respective second diffusion regions 412 in a region between the two second diffusion regions 412. That is, the two first diffusion regions 410 are disposed across a large interval (an interval greater than the widths of the diffusion regions 410 and 412) and one each of the second diffusion regions 412 are disposed at the outer sides thereof.

The first Zener diode D401 is constituted of two Zener diodes D411 and D412 respectively corresponding to the respective first diffusion regions 410. The second Zener diode D402 is constituted of two Zener diodes D421 and D422 respectively corresponding to the respective second diffusion regions 412. Two lead-out electrodes L411 and L412 respectively corresponding to the respective first diffusion regions 410 are formed in the first connection electrode 3. Similarly, two lead-out electrodes L421 and L422 respectively corresponding to the respective second diffusion regions 412 are formed in the second connection electrode 4.

The first connection electrode 3 plus the first diffusion regions 410 and the second connection electrode 4 plus the second diffusion regions 412 may be regarded as being arranged to be practically line symmetrical. That is, the second lead-out electrode L422 at one of the long sides of the substrate 2 and the first lead-out electrode L411 adjacent thereto may be regarded as being at substantially the same position, and the second lead-out electrode L421 at the other long side of the substrate 2 and the first lead-out electrode L412 adjacent thereto may be regarded as being at substantially the same position. In this case, the first connection electrode 3 plus the first diffusion regions 410 and the second connection electrode 4 plus the second diffusion regions 412 may be regarded as being arranged to be line symmetrical with respect to the straight line passing through the long direction center of the element forming surface 2A in a plan view.

With the chip part 401E shown in FIG. 28E, the second lead-out electrode L422 at one of the long sides of the substrate 2 and the first lead-out electrode L411 adjacent thereto are arranged to be mutually point symmetrical around a predetermined point in between. Also, the second lead-out electrode L421 at the other long side of the substrate 2 and the first lead-out electrode L412 adjacent thereto are arranged to be mutually point symmetrical around a predetermined point in between. Even in such a case where the first connection electrode 3 plus the first diffusion regions 410 and the second connection electrode 4 plus the second diffusion regions 412 are arranged from a combination of partially symmetrical structures, it may be regarded that the first connection electrode 3 plus the first diffusion regions 410 and the second connection electrode 4 plus the second diffusion regions 412 are arranged to be practically symmetrical.

Figure 28F:
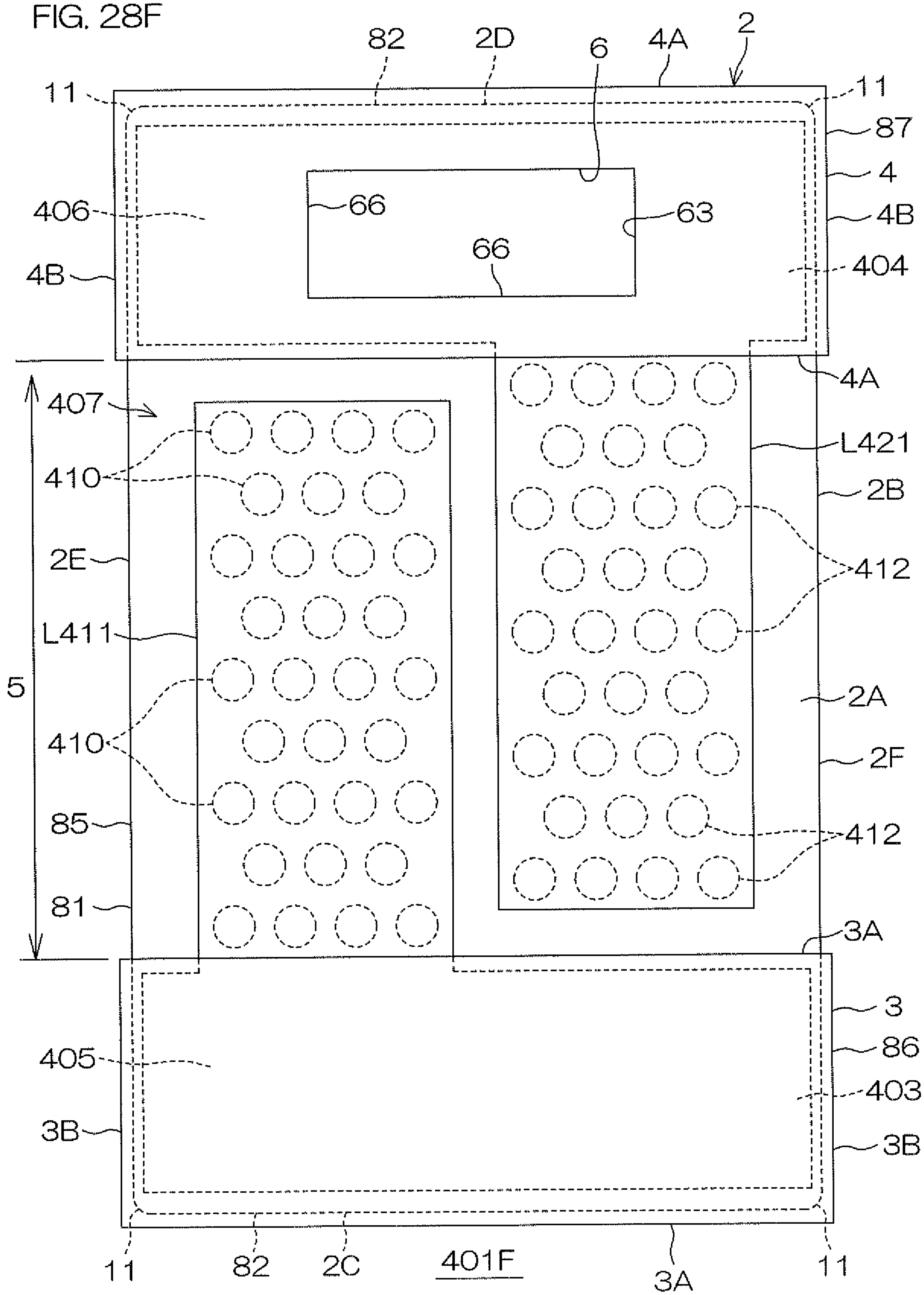

With the chip part 401F shown in FIG. 28F, a plurality of the first diffusion regions 410 are disposed discretely and a plurality of the second diffusion regions 412 are disposed discretely in a surface layer region of the substrate 2. The first diffusion regions 410 and the second diffusion regions 412 are formed to circles of the same size in a plan view. The plurality of first diffusion regions 410 are disposed in a region between the width center and one of the long sides of the element forming surface 2A, and the plurality of second diffusion regions 412 are disposed in a region between the width center and the other long side of the element forming surface 2A. The first connection electrode 3 has a single lead-out electrode L411 connected in common to the plurality of first diffusion regions 410. Similarly, the second connection electrode 4 has a single lead-out electrode L421 connected in common to the plurality of second diffusion regions 412. The first connection electrode 3 plus the first diffusion regions 410 and the second connection electrode 4 plus the second diffusion regions 412 are arranged to be point symmetrical with respect to the center of gravity of the element forming surface 2A in a plan view in this modification example as well.

The shape in a plan view of each of the first diffusion regions 410 and the second diffusion regions 412 may be any shape, such as a triangle, rectangle, or other polygon, etc. Also, a plurality of the first diffusion regions 410, extending in a long direction of the element forming surface 2A, may be formed across intervals in the short direction of the element forming surface 2A in a region between the width center and one of the long sides of the element forming surface 2A and the lead-out electrode L411 may be connected in common to the plurality of first diffusion regions 410. In this case, a plurality of the second diffusion regions 412, extending in a long direction of the element forming surface 2A, are formed across intervals in the short direction of the element forming surface 2A in a region between the width center and the other long side of the element forming surface 2A and the lead-out electrode L421 is connected in common to the plurality of second diffusion regions 412.

Fourth Preferred Embodiment

Figure 29A:
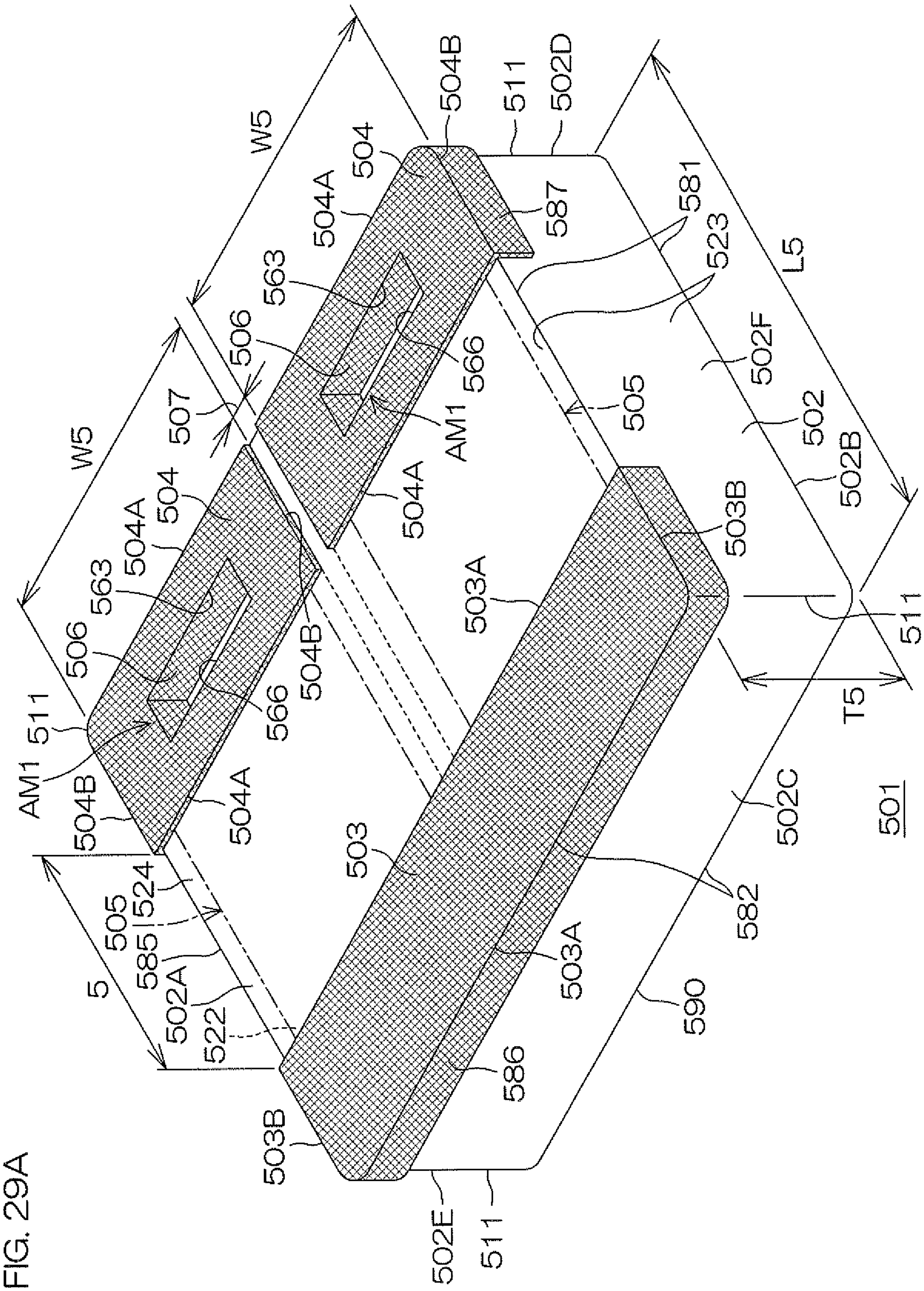
FIG. 29A is a schematic perspective view of a chip part according to a fourth preferred embodiment of the present invention.

FIG. 29A is a schematic perspective view for describing the arrangement of a chip part 501 according to a fourth preferred embodiment of the present invention.

A point of difference of the chip part 501 according to the fourth preferred embodiment with respect to the chip part 1 according to the first preferred embodiment described above is that two circuit elements are formed on a single substrate 502 (that is, the element region 5 includes two element regions 505 on the single substrate 502). Arrangements of other portions are equivalent to the arrangements in the chip part 1 according to the first preferred embodiment. In FIG. 29A, portions corresponding to the respective portions shown in FIG. 1 to FIG. 28F are provided with the same reference symbols and description thereof shall be omitted. In the following description, the chip part 501 shall be referred to as the "composite chip part 501." For the sake of description, in FIG. 29A, cross hatching is applied to first and second connection electrodes 503 and 504 to be described later.

The composite chip part 501 is a bare chip having a diode according to any of the first to third preferred embodiments mounted selectively on the common substrate 502. A diode according to any of the first to third preferred embodiments may be mounted on either one or on each of both of the two element regions 505 of the substrate 502 or a diode according to any of the first to third preferred embodiments may be mounted on either one of the element regions 505 while selectively mounting a circuit element, including a resistor element, a capacitor element, a fuse element, etc., on the other element region 505. The respective element regions 505 are disposed adjacent to each other so as to be right/left symmetrical with respect to a boundary region 507 thereof.

The planar shape of the composite chip part 501 is a rectangle having sides (lateral sides 582) extending along a direction in which the two circuit elements are aligned (hereinafter, the "lateral direction of the substrate 502") and sides (longitudinal sides 581) orthogonal to the lateral sides 582. In regard to the planar dimensions of the composite chip part 510, for example, a 0606 size is arranged by a combination of two circuit elements each of 0603 size with a length L5 along the longitudinal side 581 being not more than approximately 0.6 mm and a width W5 being not more than approximately 0.3 mm.

As a matter of course, the planar dimensions of the composite chip part 501 are not restricted to the above and, for example, a 0404 size may be arranged by a combination of elements each of 0402 size with the length L5 along the longitudinal side 581 being not more than approximately 0.4 mm and the width W5 being not more than approximately 0.2 mm, or a 0303 size may be arranged by a combination of elements each of 03015 size with the length L5 along the longitudinal side 581 being not more than approximately 0.3 mm and the width W5 being not more than approximately 0.15 mm. The composite chip part 501 has a thickness T5, for example, of 0.1 mm, and a width of the boundary region 507 between the two mutually adjacent circuit elements is preferably approximately 0.03 mm.

The composite chip part 501 is obtained by defining chip regions, for forming numerous composite chip parts 501, in a lattice on a substrate (corresponding to the substrate 30 in the first preferred embodiment), then forming grooves (corresponding to the grooves 45 and 46) in the substrate, and thereafter performing rear surface polishing (dividing of the substrate at the groove) to perform separation into the individual chip parts 501.

The substrate 502 has a substantially rectangular parallelepiped chip shape. The material of the substrate 502 is the same as the material of the substrate 2 in the first to third preferred embodiments described above. With the substrate 502, one surface constituting the upper surface in FIG. 29A is an element forming surface 502A. The element forming surface 502A is the surface of the substrate 502 on which the elements are formed and has a substantially oblong shape. The surface at the opposite side of the element forming surface 502A in the thickness direction of the substrate 502 is a rear surface 502B. The element forming surface 502A and the rear surface 502B are substantially the same in dimension and same in shape and are parallel to each other. A rectangular edge defined by the pair of longitudinal sides 581 and lateral sides 582 at the element forming surface 502A shall be referred to as a peripheral edge portion 585 and a rectangular edge defined by the pair of longitudinal sides 581 and lateral sides 582 at the rear surface 502B shall be referred to as a peripheral edge portion 590. When viewed from the direction of a normal orthogonal to the element forming surface 502A (rear surface 502B), the peripheral edge portion 585 and the peripheral edge portion 590 are overlapped (see FIGS. 29C and 29D described below).

As surfaces besides the element forming surface 502A and the rear surface 502B, the substrate 502 has a plurality of side surfaces (a side surface 502C, a side surface 502D, a side surface 502E, and a side surface 502F). The plurality of side surfaces 502C to 502F extend so as to intersect (specifically, so as to be orthogonal to) each of the element forming surface 502A and the rear surface 502B and join the element forming surface 502A and the rear surface 502B.

The side surface 502C is constructed between the lateral sides 582 of the element forming surface 502A and the rear surface 502B at one side (the front left side in FIG. 29A) in a longitudinal direction (hereinafter, the "longitudinal direction of the substrate 502") orthogonal to a lateral direction of the substrate 502, and the side surface 502D is constructed between the lateral sides 582 of the element forming surface 502A and the rear surface 502B at the other side (the inner right side in FIG. 29A) in the longitudinal direction of the substrate 502. The side surface 502C and the side surface 502D are the respective end surfaces of the substrate 502 in the longitudinal direction.

The side surface 502E is constructed between the longitudinal sides 581 of the element forming surface 502A and the rear surface 502B at one side (the inner left side in FIG. 29A) in the lateral direction of the substrate 502, and the side surface 502F is constructed between the longitudinal sides 581 of the element forming surface 502A and the rear surface 502B at the other side (the front right side in FIG. 29A) in the lateral direction of the substrate 502. The side surfaces 502E and 502F are the respective end surfaces of the substrate 502 in the lateral direction.

Each of the side surface 502C and the side surface 502D intersects (specifically, is orthogonal to) each of the side surface 502E and the side surface 502F. Mutually adjacent surfaces among the element forming surface 502A to side surface 502F thus form a right angle.

The element forming surface 502A includes a one end portion at which the first connection electrode 503 is formed and another end portion at which the second connection electrodes 504 are formed. The one end portion of the element forming surface 502A is an end portion at the side surface 502D side of the substrate 502, and the other end portion of the element forming surface 502A is an end portion at the side surface 502C side of the substrate 502. Penetrating holes 506 are selectively formed in the other end portion of the element forming surface 502A. The penetrating holes 506 penetrate through the substrate 502, from the element forming surface 502A through the rear surface 502B in the thickness direction. With the present preferred embodiment, an example is illustrated where one penetrating hole 506 is formed in each of the portions in which the respective second connection electrodes 504 are formed.

Each penetrating hole 506 is formed to a substantially rectangular shape in a plan view and has four wall surfaces 566, among which the adjacent surfaces intersect mutually at right angles. The four wall surfaces 566 are constructed between the element forming surface 502A and the rear surface 502B and are formed to form right angles with the element forming surface 502A and the rear surface 502B of the substrate 502. Preferably, a length of the penetrating hole 506 in a direction along the longitudinal side 581 of the substrate 502 is 0.025 μm to 0.05 mm and a length of the penetrating hole 506 in a direction along the lateral side 582 of the substrate 502 is 0.5 μm to 0.1 mm.

With the substrate 502, the respective entireties of the element forming surface 502A, the side surfaces 502C to 502F, and the wall surfaces 566 of the penetrating holes 506 are covered by a passivation film 523. Therefore to be exact, the respective entireties of the element forming surface 502A, the side surfaces 502C to 502F, and the wall surfaces 566 of the penetrating holes 506 in FIG. 29A are positioned at the inner sides (rear sides) of the passivation film 523 and are not exposed to the exterior. The composite chip part 501 further has a resin film 524. The resin film 524 covers the entirety (the peripheral edge portion 585 and a region at the inner side thereof) of the passivation film 523 on the element forming surface 502A. Although differing in the point that the substrate 2 is the substrate 502, the passivation film 523 and the resin film 524 are substantially the same in arrangement as the passivation film 23 and the resin film 24 described with the first to third preferred embodiments and therefore description thereof shall be omitted.

The first and second connection electrodes 503 and 504 are disposed at the one end portion and the other end portion of the element forming surface 502A and are formed across an interval from each other.

The first connection electrode 503 has a pair of long sides 503A and a pair of short sides 503B that form four sides in a plan view and a peripheral edge portion 586. The long sides 503A and the short sides 503B of the first connection electrode 503 are orthogonal in a plan view. The peripheral edge portion 586 of the first connection electrode 503 is formed integrally on the element forming surface 502A of the substrate 502 so as to extend from the element forming surface 502A to the side surfaces 502C, 502E, and 502F and thereby cover the peripheral edge portion 585. In the present preferred embodiment, the peripheral edge portion 586 is formed so as to cover respective corner portions 511 at which the side surfaces 502C, 502E, and 502F of the substrate 502 intersect mutually.

On the other hand, each second connection electrode 504 has a pair of long sides 504A and a pair of short sides 504B that form four sides in a plan view, a peripheral edge portion 587, and an opening portion 563. The long sides 504A and the short sides 504B of the second connection electrode 504 are orthogonal in a plan view. The peripheral edge portions 587 of the second connection electrodes 504 are formed integrally on the element forming surface 502A of the substrate 502 so as to extend from the element forming surface 502A to the side surfaces 502D, 502E, and 502F and thereby cover the peripheral edge portion 585. In the present preferred embodiment, the peripheral edge portions 587 are formed so as to cover respective corner portions 511 at which the side surfaces 502D, 502E, and 502F of the substrate 502 intersect mutually.

In the present preferred embodiment, the opening portion 563 is formed at a central portion of each second connection electrode 504. That is, the penetrating hole 506 is formed in a portion at which the opening portion 563 is formed at the central portion of the second connection electrode 504. The opening portion 563 is formed integrally so as to extend from the element forming surface 502A to the wall surfaces 566 so as to cover the wall surfaces 566 of the penetrating hole 506 formed in the substrate 502. A region of the second connection electrode 504 in which the penetrating hole 506 is formed is thus opened by the opening portion 563 of approximately the same size as the penetrating hole 506 and the penetrating hole 506 (the wall surfaces 566 of the penetrating hole 506) is exposed to the exterior from the opening portion 563.

With the substrate 502, each corner portion 511 may have a chamfered rounded shape in a plan view. In this case, the structure is made capable of suppressing chipping during a manufacturing process or mounting of the composite chip part 501.

In each element region 505 of such a composite chip part 501, a diode is formed such that a cathode side is connected to the first connection electrode 503 and an anode side is connected to the second connection electrode 504. Therefore in the present preferred embodiment, each penetrating hole 506 functions as an anode mark AM1 that indicates the polarity direction of the composite chip part 501.

Figure 29B:
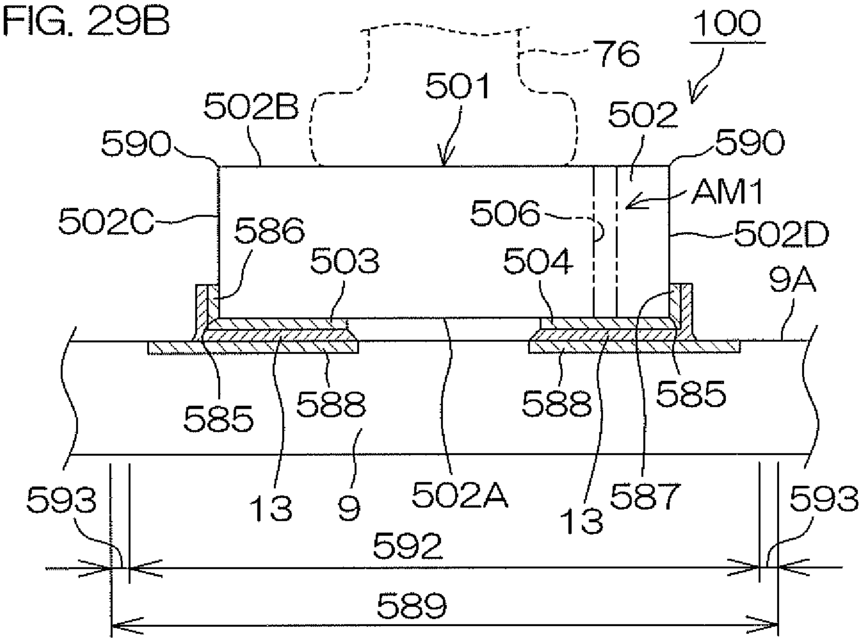
FIG. 29B is a schematic sectional view of a circuit assembly with which the chip part shown in FIG. 29A is mounted on a mounting substrate.
Figure 29C:
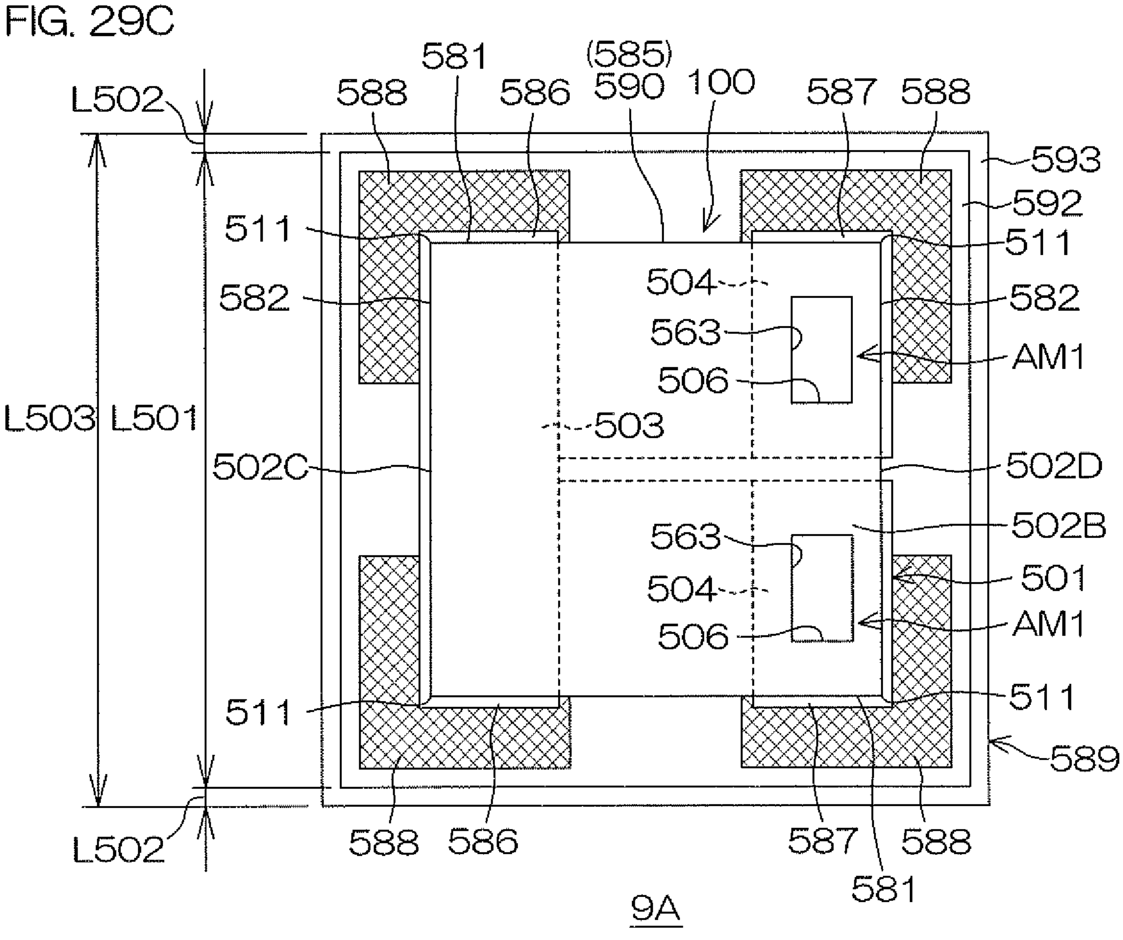
FIG. 29C is a schematic plan view of the circuit assembly of FIG. 29B as viewed from a rear surface side of the chip part.
Figure 29D:
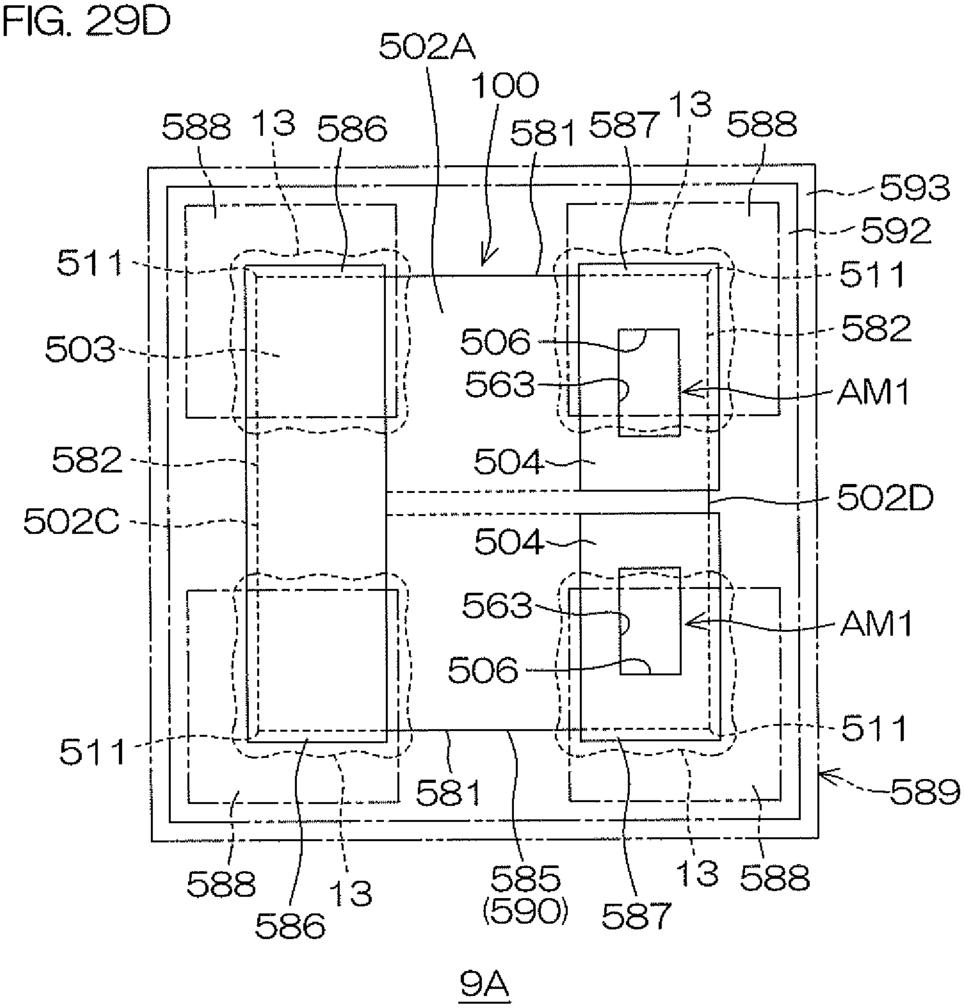
FIG. 29D is a schematic plan view of the circuit assembly of FIG. 29B as viewed from an element forming surface side of the chip part.
Figure 29E:
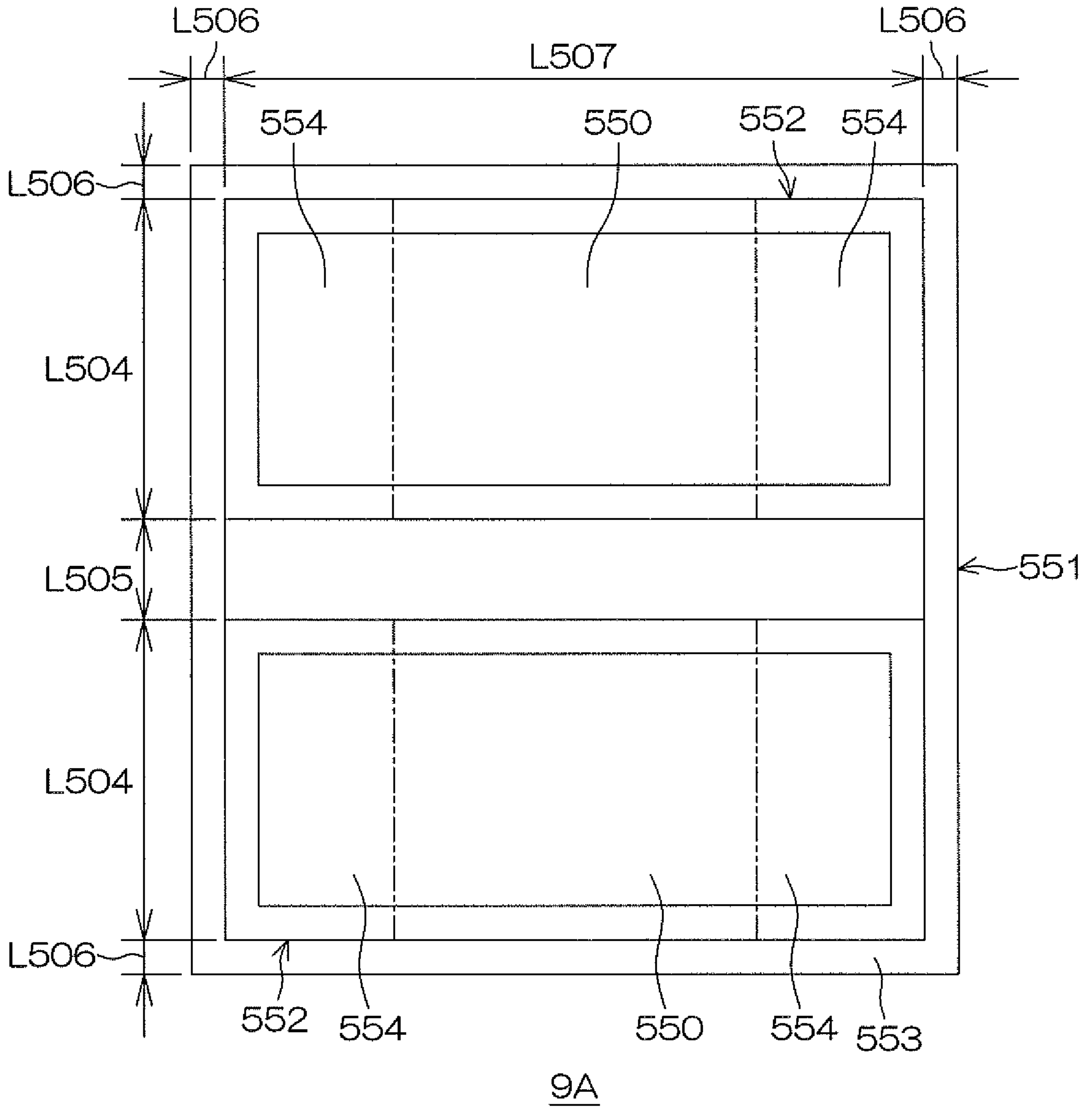
FIG. 29E is a diagram of a state where two of the chip parts are mounted on a mounting substrate.

FIG. 29B is a schematic sectional view of the circuit assembly 100 with which the composite chip part 501 of FIG. 29A is mounted on the mounting substrate 9. FIG. 29C is a schematic plan view of the circuit assembly 100 of FIG. 29B as viewed from the rear surface 502B side of the composite chip part 501. FIG. 29D is a schematic plan view of the circuit assembly 100 of FIG. 29B as viewed from the element forming surface 502A side of the composite chip part 501. FIG. 29E is a diagram of a state where two chip parts are mounted on a mounting substrate. Only principal portions are shown in FIG. 29B to FIG. 29E. In FIG. 29C, cross hatching is applied to regions in which respective lands 588 are formed.

The composite chip part 501 is mounted on the mounting substrate 9 as shown in FIG. 29B to FIG. 29D. The composite chip part 501 and the mounting substrate 9 in this state constitute the circuit assembly 100.

As shown in FIG. 29B, an upper surface of the mounting substrate 9 is the mounting surface 9A. A mounting region 589 for the composite chip part 501 is defined on the mounting surface 9A. In the present preferred embodiment, the mounting region 589 is defined to be a square in a plan view and includes a land region 592 in which lands 588 are disposed and a solder resist region 593 surrounding the land region 592 as shown in FIG. 29C and FIG. 29D.

For example, if the composite chip part 501 is a pair chip that includes one each of the two circuit elements of 03015 size, the land region 592 has a rectangular (square) shape having a planar size of 410 μm×410 μm. That is, a length L501 of one side of the land region 592 is such that L501=410 μm. On the other hand, the solder resist region 593 is defined to have a rectangular annular shape with a width L502 of 25 μm so as to border the land region 592.

A total of four lands 588 are disposed in the land region 592, one each at each of the four corners of the land region 592. In the present preferred embodiment, each land 588 is provided at a position spaced by a fixed interval from each of the sides that define the land region 592. For example, the interval from each side of the land region 592 to each land 588 is 25 μm. Also, an interval of 80 μm is provided between mutually adjacent lands 588. Each land 588 is formed, for example, of Cu and is connected to the internal circuit (not shown) of the mounting substrate 9. On a front surface of each land 588, a solder 13 is provided so as to project from the front surface as shown in FIG. 29B.

In mounting the composite chip part 501 onto the mounting substrate 9, the suction nozzle 76 of the automatic mounting machine (not shown) is made to suction the rear surface 502B of the composite chip part 501 as shown in FIG. 29B and then the suction nozzle 76 is moved to convey the composite chip part 501. In this process, the suction nozzle 76 suctions the rear surface 502B at a substantially central portion in the longitudinal direction of the substrate 502. As mentioned above, the first connection electrode 503 and the second connection electrodes 504 are provided only on one surface (the element forming surface 502A) and the element forming surface 502A side end portions of the side surfaces 502C to 502F of the composite chip part 501 and the penetrating holes 506 of the substrate 502 are formed at positions avoiding the substantially central portion of the composite chip part 501. A flat surface (a flat suctioned surface suctioned by the suction nozzle 76) without the first and second connection electrodes 503 and 504 and the penetrating holes 506 (unevenness) is thus formed at the substantially central portion of the rear surface 502B of the substrate 502.

The flat rear surface 502B can thus be suctioned onto the suction nozzle 76 when the composite chip part 501 is to be suctioned by the suction nozzle 76 and moved. In other words, with the flat rear surface 502B, a margin of the portion that can be suctioned by the suction nozzle 76 can be increased. The composite chip part 501 can thereby be suctioned reliably by the suction nozzle 76 and the composite chip part 501 can be conveyed reliably without dropping off from the suction nozzle 76 midway.

Also, the composite chip part 501 is a pair chip that includes a pair of, that is, two circuit elements, and therefore, for example, in comparison to a case of performing two times of mounting to mount two chip parts, each having just one diode according to the first to third preferred embodiments installed thereon, a chip part having the same functions can be mounted in a single mounting process. Further in comparison to a single-component chip part, the rear surface area per chip part can be enlarged by an amount corresponding to two or more chips to stabilize the suction operation by the suction nozzle 76.

The suction nozzle 76, suctioning the chip part 501, is then moved to the mounting substrate 9. At this point, the element forming surface 502A of the composite chip part 501 and the mounting surface 9A of the mounting substrate 9 face each other. In this state, the suction nozzle 76 is moved and pressed against the mounting substrate 9 to make the first connection electrode 503 and the second connection electrodes 504 of the composite chip part 501 contact the solders 13 of the respective lands 588.

When the solders 13 are then heated in a reflow process, the solders 13 melt. Thereafter, when the solders 13 become cooled and solidified, the first connection electrode 503 and the second connection electrodes 504 become bonded to the lands 588 via the solders 13. That is, each of the lands 588 is solder-bonded to the corresponding electrode among the first connection electrode 503 and the second connection electrodes 504. Mounting (flip-chip connection) of the composite chip part 501 onto the mounting substrate 9 is thereby completed and the circuit assembly 100 is completed.

In the circuit assembly 100 in the completed state, the element forming surface 502A of the composite chip part 501 and the mounting surface 9A of the mounting substrate 9 extend parallel while facing each other across a gap. The dimension of the gap corresponds to the total of the thickness of the portions of the first and second connection electrodes 503 and 504 projecting from the element forming surface 502A and the thickness of the solders 13.

With the circuit assembly 100, the peripheral edge portions 586 and 587 of the first and second connection electrodes 503 and 504 are formed to extend from the element forming surface 502A to the side surface 502C to 502F (only the side surfaces 502C and 502D are shown in FIG. 29B) of the substrate 502. Therefore the adhesion area for soldering the composite chip part 501 onto the mounting substrate 9 can be enlarged. Consequently, the amount of solder 13 adsorbed to the first and second connection electrodes 503 and 504 can be increased to improve the adhesion strength.

Also, in the mounted state, the composite chip part 501 can be held from at least the two directions of the element forming surface 502A and the side surface 502C to 502F of the substrate 502. The mounting form of the composite chip part 501 can thus be stabilized. Moreover, the composite chip part 501 after mounting onto the mounting substrate 9 can be supported at four points by the four lands 588 so that the mounting form can be stabilized further.

Also, the composite chip part 501 is a pair chip that includes a pair of, that is, two circuit elements of 03015 size. Therefore, the area of the mounting region 589 for the composite chip part 501 can be reduced significantly in comparison to a conventional case.

For example, with the present preferred embodiment, in reference to FIG. 29C, the area of the mounting region 589 suffices to be: L503×L503=(L502+L501+L502)×(L502+L501+L502)=(25+410+25)×(25+410+25)=211600 $\mu m^2$.

On the other hand, as shown in FIG. 29E, in a case where two single-component chip parts 550 of 0402 size, which is the smallest size that can be prepared conventionally, are to be mounted on the mounting surface 9A of the mounting substrate 9, a mounting region 551 of 319000 $\mu m^2$ is necessary. From a comparison of the areas of the mounting region 589 of the present preferred embodiment and the conventional mounting region 551, it can be understood that the mounting area can be reduced by approximately 34% with the arrangement of the present preferred embodiment.

The area of the mounting region 551 in FIG. 29E was calculated as: (L506+L504+L505+L504+L506)×(L506+L507+L506)=(25+250+30+250+25)×(25+500+25)=319000 μm$^2$ based on a mounting area 552 for each single-component chip part 550 with lands 554 disposed therein having a lateral width L504=250 μm, an interval L505 between mutually adjacent mounting areas 552 being such that L505=30 μm, a solder resist region, constituting an outer periphery of the mounting region 551, having a width L506=25 μm, and the mounting area 552 having a length L507=500 μm.

Fifth Preferred Embodiment

Figure 30:
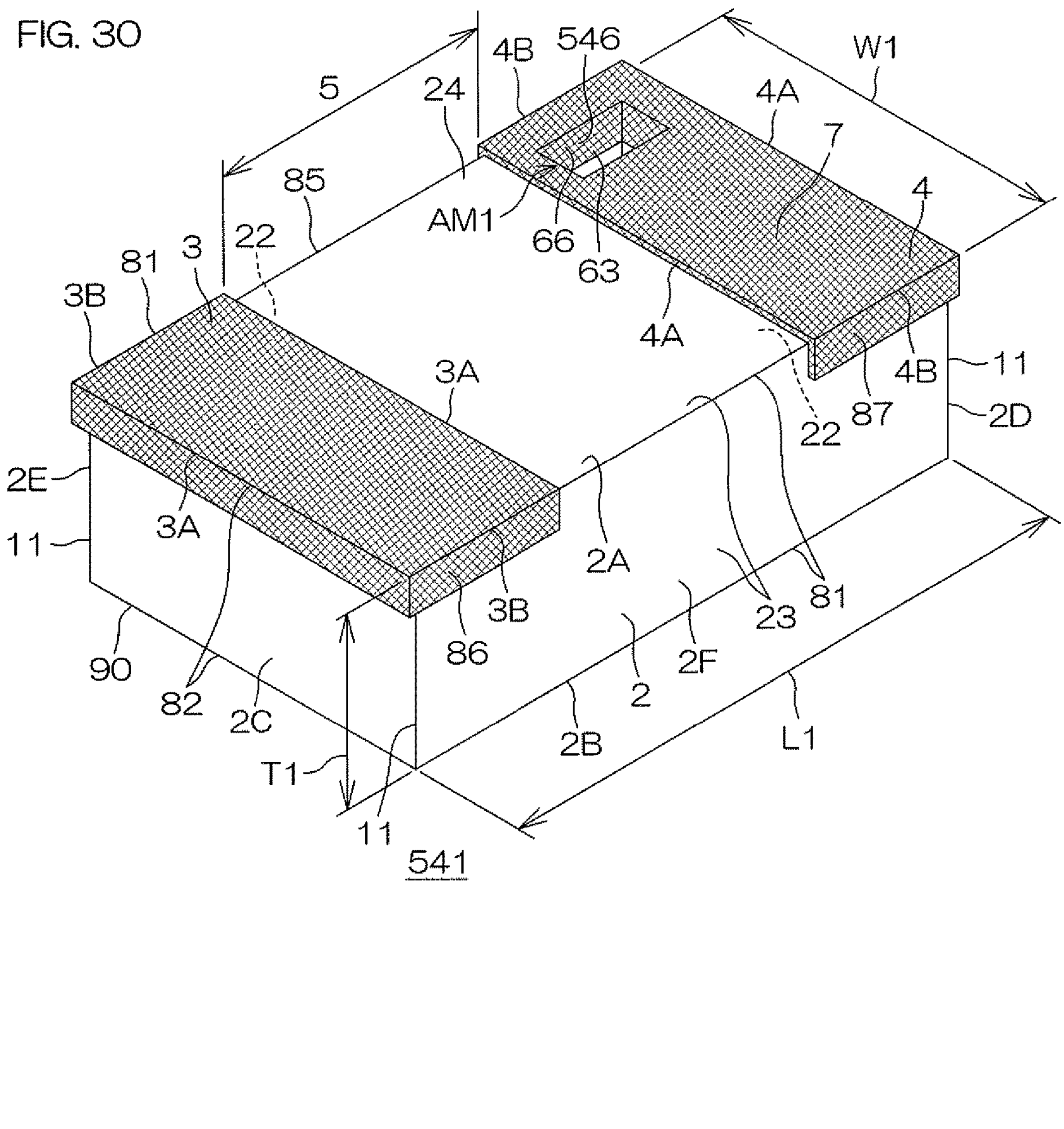
FIG. 30 is a plan view for describing the arrangement of a chip part according to a fifth preferred embodiment of the present invention.

FIG. 30 is a plan view for describing the arrangement of a chip part 541 according to a fifth preferred embodiment of the present invention.

Points of difference of the chip part 541 according to the fifth preferred embodiment with respect to the chip part 1 according to the first preferred embodiment are that, in the other end portion of the element forming surface 2A, a penetrating hole 546 is formed at a position avoiding the central portion of the second connection electrode 4 and that a flat portion 7, without a penetrating hole formed therein, is formed at the central portion of the second connection electrode 4. Arrangements of other portions are the same as the arrangements of the first preferred embodiment described above and therefore the same reference symbols shall be provided and description shall be omitted.

With the present preferred embodiment, at the other end portion (end portion at the side surface 2D side of the substrate 2) side of the element forming surface 2A, the penetrating hole 546 is formed at a portion close to the corner portion at which the side surface 2D and the side surface 2E of the substrate 2 intersect. The second connection electrode 4 overlaps the penetrating hole 546 at a position avoiding the central portion of the second connection electrode 4. The opening portion 63 is formed at the portion of the second connection electrode 4 overlapping the penetrating hole 546. On the other hand, the flat portion 7, in which the opening portion 63 (penetrating hole 546) is not formed, is formed at the central portion of the second connection electrode 4.

Even with such an arrangement, the same effects as the effects described above with the first preferred embodiment can be exhibited.

Also, such a penetrating hole 546 may be formed by the same processes as the processes of FIG. 8A to FIG. 8H described above with the first preferred embodiment. More specifically, the opening 43 in the resist pattern 41 described in FIG. 9 is formed in a region in which the penetrating hole 546 is to be formed. Also, by the flat portion 7 being formed at the central portion of the second connection electrode 4, probing can be performed satisfactorily in the process of manufacturing the chip part 541 as shall be described with reference to FIG. 31 and FIG. 32.

Figure 31:
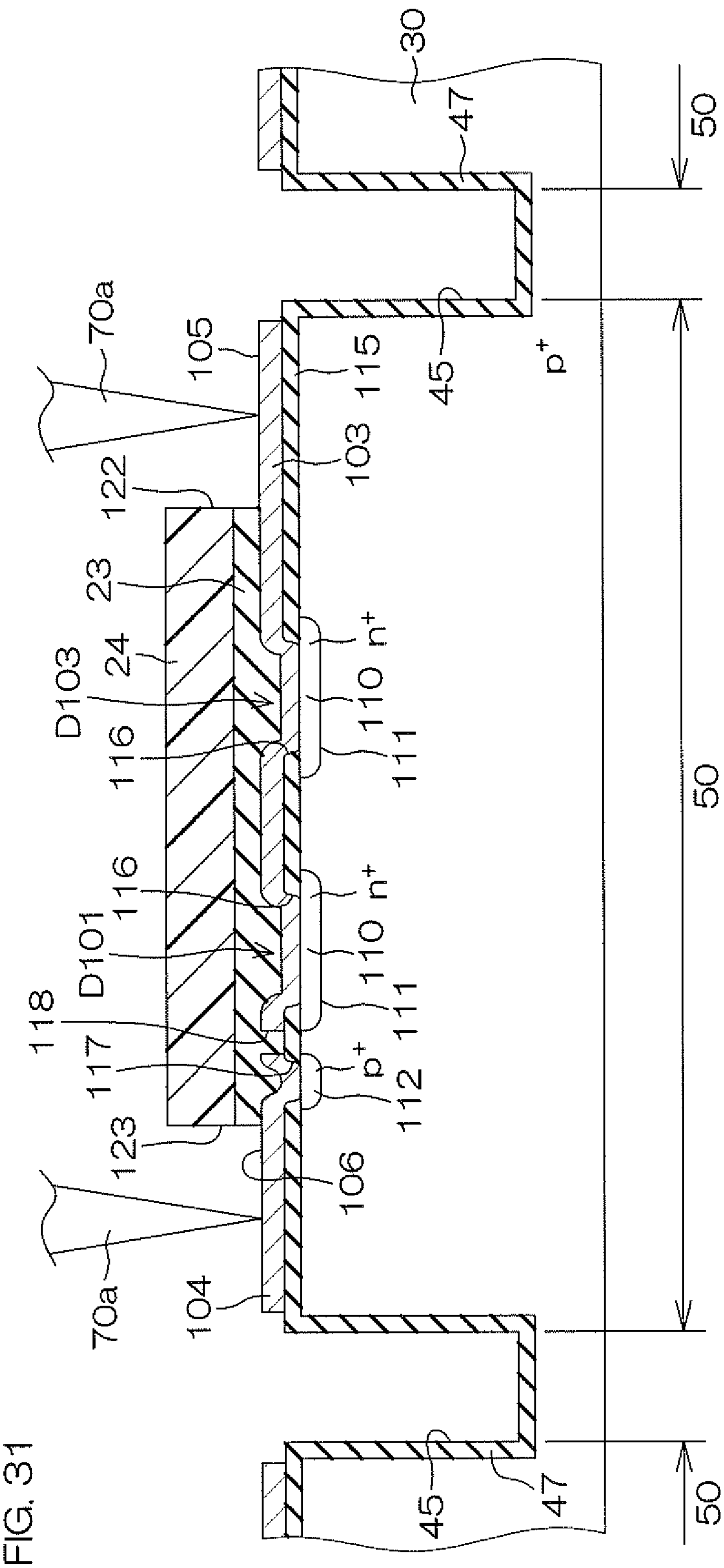
FIG. 31 is a sectional view of a method for manufacturing the chip part shown in FIG. 30.
Figure 32:
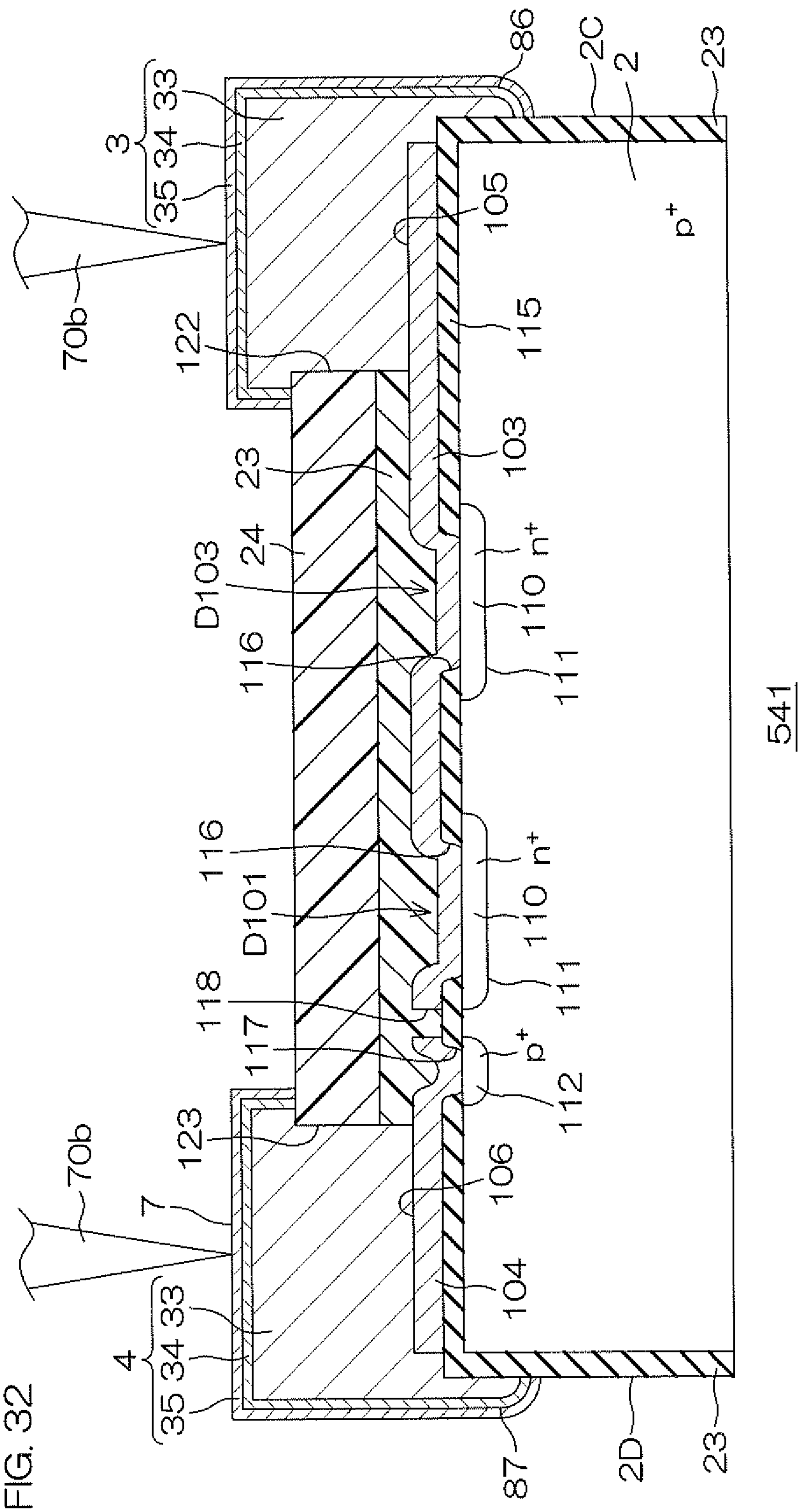
FIG. 32 is a sectional view of the method for manufacturing the chip part shown in FIG. 30.

FIG. 31 and FIG. 32 are sectional views of a method for manufacturing the chip part shown in FIG. 30.

As shown in FIG. 31, after the process of FIG. 8E in the first preferred embodiment, probing (electrical test) may be performed prior to the process of FIG. 8F. By providing the flat portion 7, in which a groove (corresponding to the penetrating hole groove 46 in FIG. 8E) is not formed, at the central portion of the anode pad 106, a probe 70*a* can be suppressed or prevented from entering into the groove. Consequently, the probing can be performed satisfactorily.

Also, probing (electrical test) may be performed on the chip part 541 (finished product) after the process of FIG. 8H as shown in FIG. 32. By providing the flat portion 7 at the front surface of the second connection electrode 4, a probe 70*b* can be suppressed or prevented from entering into the penetrating hole 546. Consequently, the probing can be performed satisfactorily.

<Smartphone>

Figure 33:
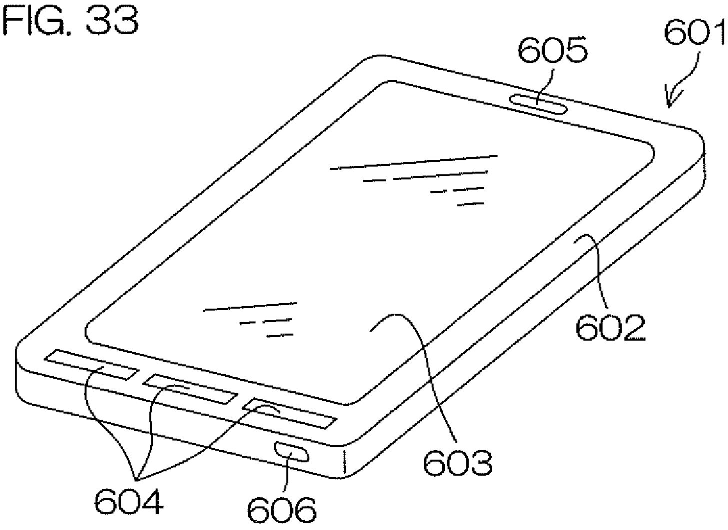
FIG. 33 is a perspective view of an outer appearance of a smartphone that is an example of an electronic device in which the chip parts according to a preferred embodiment of the present invention are used.

FIG. 33 is a perspective view of an outer appearance of a smartphone 601 that is an example of an electronic device in which the chip parts according to the first to fifth preferred embodiments are used. The smartphone 601 is arranged by housing electronic parts in the interior of a casing 602 with a flat rectangular parallelepiped shape. The casing 602 has a pair of major surfaces with an oblong shape at its front side and rear side, and the pair of major surfaces are joined by four side surfaces. A display surface of a display panel 603, constituted of a liquid crystal panel or an organic EL panel, etc., is exposed at one of the major surfaces of the casing 602. The display surface of the display panel 603 constitutes a touch panel and provides an input interface for a user.

The display panel 603 is formed to an oblong shape that occupies most of one of the major surfaces of the casing 602. Operation buttons 604 are disposed along one short side of the display panel 603. In the present preferred embodiment, a plurality (three) of the operation buttons 604 are aligned along the short side of the display panel 603. The user can call and execute necessary functions by performing operations of the smartphone 601 by operating the operation buttons 604 and the touch panel.

A speaker 605 is disposed in a vicinity of the other short side of the display panel 603. The speaker 605 provides an earpiece for a telephone function and is also used as an acoustic conversion unit for reproducing music data, etc. On the other hand, close to the operation buttons 604, a microphone 606 is disposed at one of the side surfaces of the casing 602. The microphone 606 provides a mouthpiece for the telephone function and may also be used as a microphone for sound recording.

Figure 34:
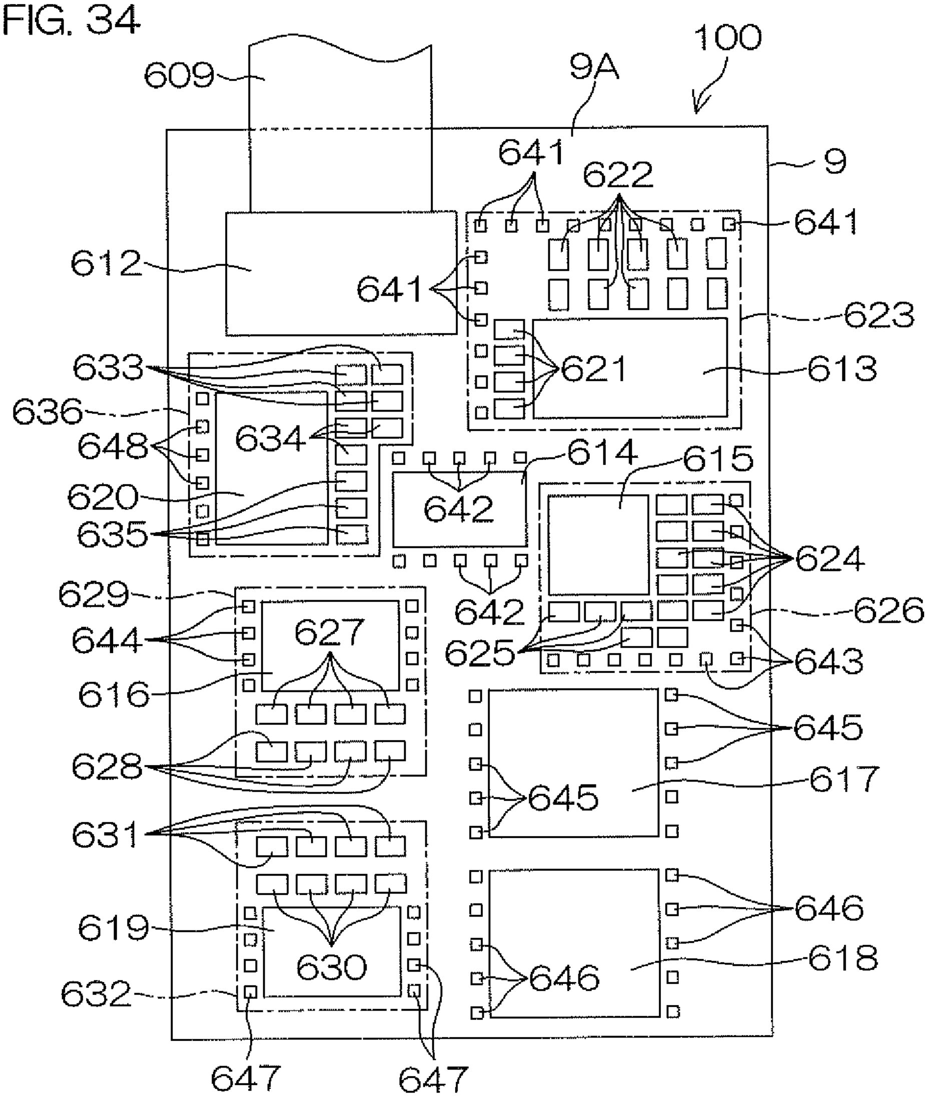
FIG. 34 is an illustrative plan view of the arrangement of a circuit assembly housed in the interior of a casing of the smartphone.

FIG. 34 is an illustrative plan view of the arrangement of the circuit assembly 100 housed in the interior of the casing 602. The circuit assembly 100 includes the mounting substrate 9 and circuit parts mounted on the mounting surface 9A of the mounting substrate 9. The plurality of circuit parts include a plurality of integrated circuit elements (ICs) 612 to 620 and a plurality of chip parts. The plurality of ICs include a transmission processing IC 612, a one-segment TV receiving IC 613, a GPS receiving IC 614, an FM tuner IC 615, a power supply IC 616, a flash memory 617, a microcomputer 618, a power supply IC 619, and a baseband IC 620.

The plurality of chip parts include chip inductors 621, 625, and 635, chip resistors 622, 624, and 633, chip capacitors 627, 630, and 634, chip diodes 628 and 631, and bidirectional Zener diode chips 641 to 648. The chip diodes 628 and 631 and the bidirectional Zener diode chips 641 to 648 correspond to the chip parts according to the first to fifth preferred embodiments described above and are mounted on the mounting surface 9A of the mounting substrate 9, for example, by flip-chip bonding.

The bidirectional Zener diode chips 641 to 648 are provided for absorbing positive and negative surges, etc., in signal input lines to the one-segment TV receiving IC 613, the GPS receiving IC 614, the FM tuner IC 615, the power supply IC 616, the flash memory 617, the microcomputer 618, the power supply IC 619, and the baseband IC 620.

The transmission processing IC 612 has incorporated therein an electronic circuit arranged to generate display control signals for the display panel 603 and receive input signals from the touch panel on the front surface of the display panel 603. For connection with the display panel 603, the transmission processing IC 612 is connected to a flexible wiring 609.

The one-segment TV receiving IC 613 incorporates an electronic circuit that constitutes a receiver for receiving one-segment broadcast (terrestrial digital television broadcast targeted for reception by portable equipment) radio waves. A plurality of the chip inductors 621, a plurality of the chip resistors 622, and a plurality of the bidirectional Zener diode chips 641 are disposed in a vicinity of the one-segment TV receiving IC 613. The one-segment TV receiving IC 613, the chip inductors 621, the chip resistors 622, and the bidirectional Zener diode chips 641 constitute a one-segment broadcast receiving circuit 623. The chip inductors 621 and the chip resistors 622 respectively have accurately adjusted inductances and resistances and provide circuit constants of high precision to the one-segment broadcast receiving circuit 623.

The GPS receiving IC 614 incorporates an electronic circuit that receives radio waves from GPS satellites and outputs positional information of the smartphone 601. A plurality of the bidirectional Zener diode chips 642 are disposed in a vicinity of the GPS receiving IC 614.

The FM tuner IC 615 constitutes, together with a plurality of the chip resistors 624, a plurality of the chip inductors 625, and a plurality of the bidirectional Zener diode chips 643 mounted on the mounting substrate 9 in a vicinity thereof, an FM broadcast receiving circuit 626. The chip resistors 624 and the chip inductors 625 respectively have accurately adjusted resistance values and inductances and provide circuit constants of high precision to the FM broadcast receiving circuit 626.

A plurality of the chip capacitors 627, a plurality of the chip diodes 628, and a plurality of the bidirectional Zener diode chips 644 are mounted on the mounting surface 9A of the mounting substrate 9 in a vicinity of the power supply IC 616. Together with the chip capacitors 627, the chip diodes 628, and the bidirectional Zener diode chips 644, the power supply IC 616 constitutes a power supply circuit 629.

The flash memory 617 is a storage device for recording operating system programs, data generated in the interior of the smartphone 601, data and programs acquired from the exterior by communication functions, etc. A plurality of the bidirectional Zener diode chips 645 are disposed in a vicinity of the flash memory 617.

The microcomputer 618 is a computing processing circuit that incorporates a CPU, a ROM, and a RAM and realizes a plurality of functions of the smartphone 601 by executing various computational processes. More specifically, computational processes for image processing and various application programs are realized by actions of the microcomputer 618. A plurality of the bidirectional Zener diode chips 646 are disposed in a vicinity of the microcomputer 618.

A plurality of the chip capacitors 630, a plurality of the chip diodes 631, and a plurality of the bidirectional Zener diode chips 647 are mounted on the mounting surface 9A of the mounting substrate 9 in a vicinity of the power supply IC 619. Together with the chip capacitors 630, the chip diodes 631, and the plurality of bidirectional Zener diode chips 647, the power supply IC 619 constitutes a power supply circuit 632.

A plurality of the chip resistors 633, a plurality of the chip capacitors 634, a plurality of the chip inductors 635, and a plurality of the bidirectional Zener diode chips 648 are mounted on the mounting surface 9A of the mounting substrate 9 in a vicinity of the baseband IC 620. Together with the chip resistors 633, the chip capacitors 634, the chip inductors 635, and the plurality of bidirectional Zener diode chips 648, the baseband IC 620 constitutes a baseband communication circuit 636. The baseband communication circuit 636 provides communication functions for telephone communication and data communication.

With the above arrangement, electric power that is appropriately adjusted by the power supply circuits 629 and 632 is supplied to the transmission processing IC 612, the GPS receiving IC 614, the one-segment broadcast receiving circuit 623, the FM broadcast receiving circuit 626, the baseband communication circuit 636, the flash memory 617, and the microcomputer 618. The microcomputer 618 performs computational processes in response to input signals input via the transmission processing IC 612 and makes the display control signals be output from the transmission processing IC 612 to the display panel 603 to make the display panel 603 perform various displays.

When receiving of a one-segment broadcast is commanded by operation of the touch panel or the operation buttons 604, the one-segment broadcast is received by actions of the one-segment broadcast receiving circuit 623. Computational processes for outputting the received images to the display panel 603 and making the received audio signals be acoustically converted by the speaker 605 are executed by the microcomputer 618.

Also, when positional information of the smartphone 601 is required, the microcomputer 618 acquires the positional information output by the GPS receiving IC 614 and executes computational processes using the positional information.

Further, when an FM broadcast receiving command is input by operation of the touch panel or the operation buttons 604, the microcomputer 618 starts up the FM broadcast receiving circuit 626 and executes computational processes for outputting the received audio signals from the speaker 605.

The flash memory 617 is used for storing data acquired by communication and storing data prepared by computations by the microcomputer 618 and inputs from the touch panel. The microcomputer 618 writes data into the flash memory 617 or reads data from the flash memory 617 as necessary.

The telephone communication or data communication functions are realized by the baseband communication circuit 636. The microcomputer 618 controls the baseband communication circuit 636 to perform processes for sending and receiving audio signals or data.

MODIFICATION EXAMPLES

Figure 35:
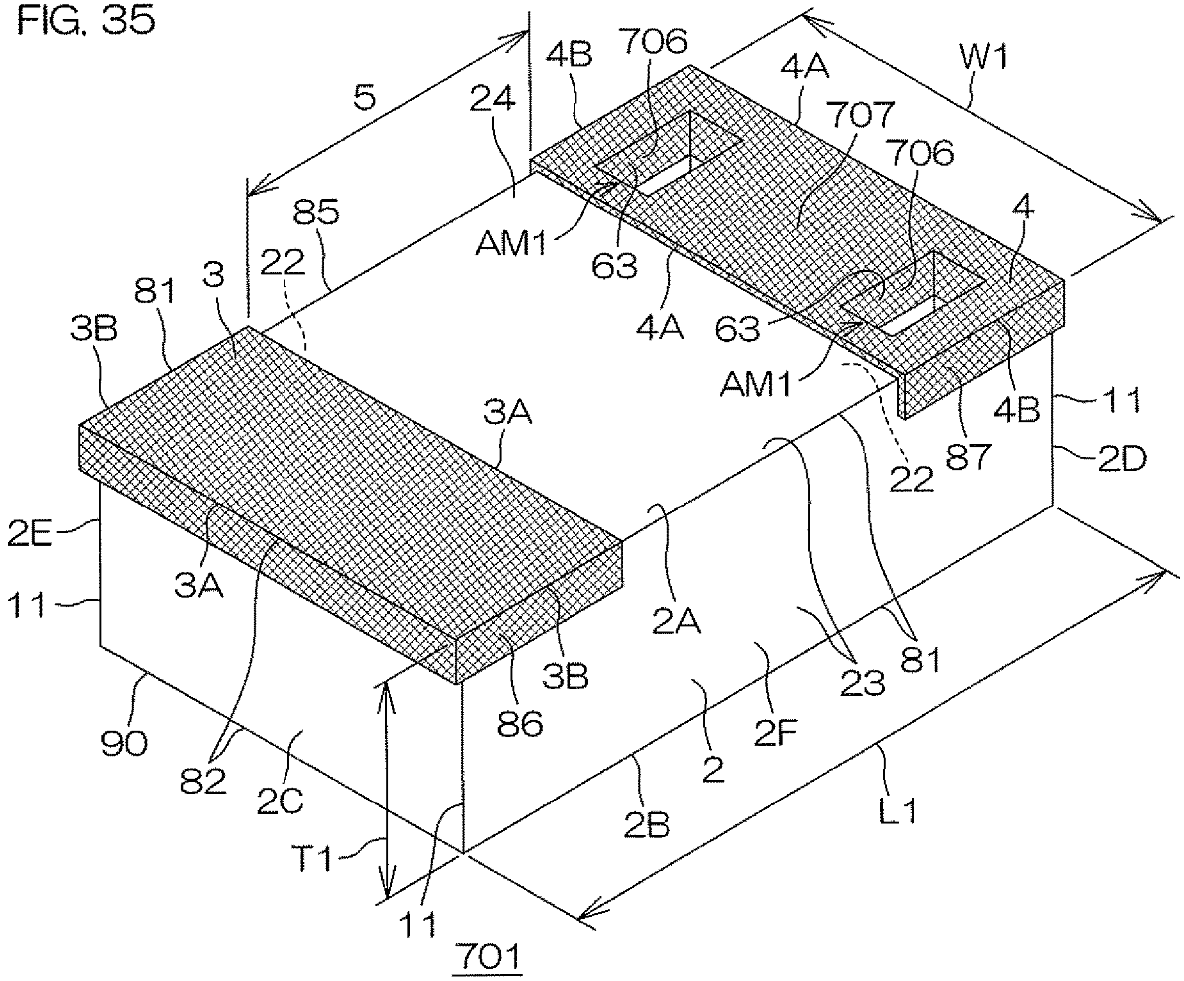
FIG. 35 to FIG. 37 are schematic perspective views respectively of first to third modification examples of the chip part shown in FIG. 1.

Although with each of the first to fifth preferred embodiments described above, an example where one penetrating hole 6, 506, or 546 is formed in the region in which the second connection electrode 4 or 504 is formed was described, two or more (a plurality) of the penetrating holes 6, 506, or 546 may be formed. In this case, the arrangement shown in FIG. 35 may be adopted. FIG. 35 is a schematic perspective view of a first modification example of the chip part 1 shown in FIG. 1.

A point of difference of a chip part 701 according to the first modification example with respect to the chip part 1 according to the first preferred embodiment described above is that a plurality of penetrating holes 706 are formed. Arrangements of other portions are the same as the arrangements of the first preferred embodiment described above and therefore the same reference symbols shall be provided and description shall be omitted. FIG. 35 shows an example where two penetrating holes 706 are formed as an example of the plurality of penetrating holes in the substrate 2.

In the present modification example, the two penetrating holes 706 are formed across an interval from each other and so as to avoid the central portion of the second connection electrode 4. Specifically, at the other end portion (end portion at the side surface 2D side of the substrate 2) side of the element forming surface 2A, the two penetrating holes 706 are formed at a portion close to the corner portion at which the side surface 2D and the side surface 2E of the substrate 2 intersect and at a portion close to the corner portion at which the side surface 2D and the side surface 2F of the substrate 2 intersect. Opening portions 63 are thereby formed at respective end portions in the long direction of the second connection electrode 4 along the short side 82 of the substrate 2, and a flat portion 707, in which the opening portion 63 (penetrating hole 706), is not formed, is formed at a central portion of the second connection electrode 4 between the opening portions 63.

Even when the plurality of the penetrating holes 706 are formed thus, the same effects as the effects described above with the first preferred embodiment can be exhibited. Also, the position of the second connection electrode 4 can be indicated by the plurality of penetrating holes 706. The respective positions of the first and second connection electrodes 3 and 4 can thereby be confirmed even more readily based on the positions of the plurality of penetrating holes 706 when the chip part 701 is mounted on the mounting substrate 9. Further, as described above with the fifth preferred embodiment, probing can be performed more satisfactorily by means of the flat portion 707 of the second connection electrode 4.

Although in FIG. 35, the chip part 701 is illustrated as a modification example of the chip part 1 according to the first preferred embodiment described above, the arrangement with the plurality of penetrating holes 706 may obviously be adopted in any of the second to fifth preferred embodiments described above.

Figure 36:
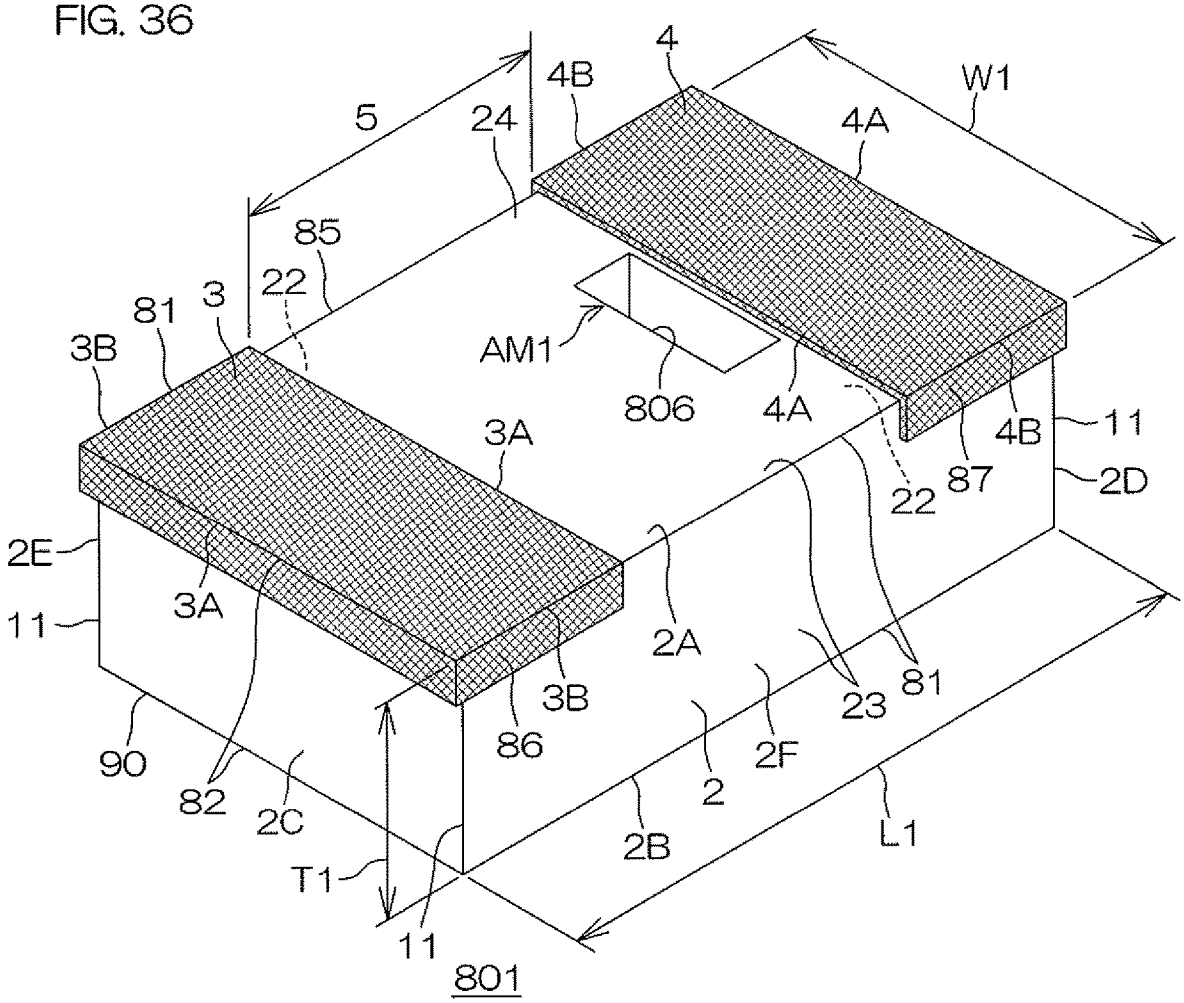

Also, although with each of the first to fifth preferred embodiments described above, an example where the penetrating hole 6, 506, or 546 is formed in the region in which the second connection electrode 4 or 504 is formed was described, a penetrating hole may be formed in a region outside the region in which the second connection electrode 4 or 504 is formed. In this case, the arrangement shown in FIG. 36 may be adopted. FIG. 36 is a schematic perspective view of a second modification example of the chip part 1 shown in FIG. 1.

A point of difference of a chip part 801 according to the second modification example with respect to the chip part 1 according to the first preferred embodiment described above is that a penetrating hole 806 is formed outside the region in which the second connection electrode 4 is formed. Arrangements of other portions are the same as the arrangements of the first preferred embodiment described above and therefore the same reference symbols shall be provided and description shall be omitted.

The penetrating hole 806 according to the second modification example is formed at the other end side (that is, the side closer to the side surface 2D of the substrate 2) side of the element forming surface 2A, outside the region in which the second connection electrode 4 is formed. In other words, the second connection electrode 4 is formed at a position of not overlapping the penetrating hole 806 and the penetrating hole 806 is formed in a periphery of the second connection electrode 4.

If space for forming the penetrating hole 806 can be secured in the element region 5, the same effects as the effects described above with the first preferred embodiment can be exhibited by adopting the present arrangement. Also, with the present arrangement, the penetrating hole 806 can be formed without being restricted by wiring rules related to the electrode film (for example, the anode electrode film 104 in the first preferred embodiment), etc., formed in a lower layer of the second connection electrode 4. Also, a sufficient connection area can be secured for the second connection electrode 4. As a matter of course, a plurality of such penetrating holes 806 may be formed.

Figure 37:
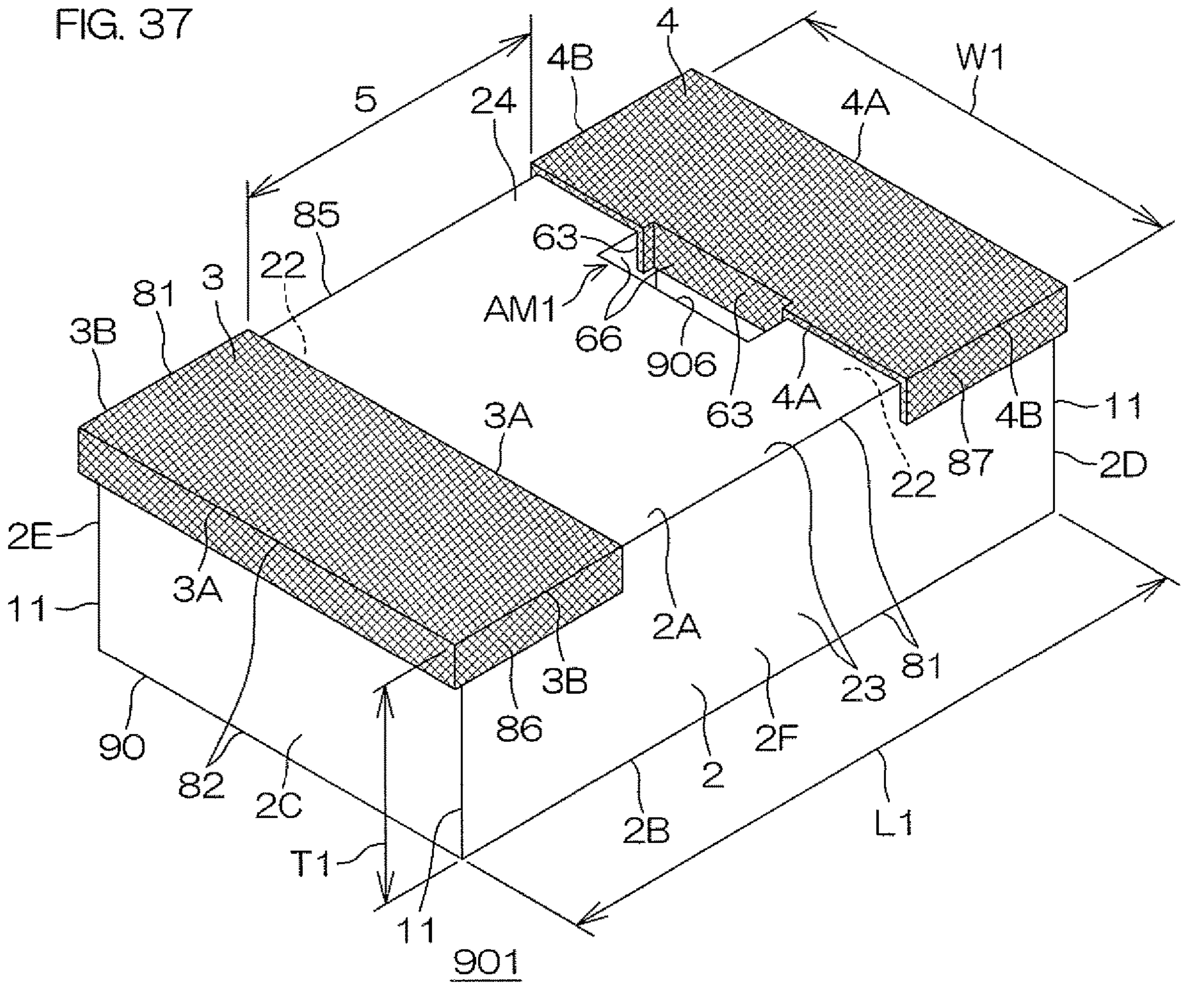

Although in FIG. 36, the chip part 801 is illustrated as a modification example of the chip part 1 according to the first preferred embodiment described above, the arrangement of the penetrating hole 806 may obviously be adopted in any of the second to fifth preferred embodiments described above. Also, the penetrating hole 806 may be formed at a position shown in FIG. 37. FIG. 37 is a schematic perspective view of a third modification example of the chip part 1 shown in FIG. 1.

A point of difference of a chip part 901 according to the third modification example with respect to the chip part 1 according to the first preferred embodiment described above is that a penetrating hole 906 is formed at a position at which it crosses a long side 4A of the second connection electrode 4. Arrangements of other portions are the same as the arrangements of the first preferred embodiment described above and therefore the same reference symbols shall be provided and description shall be omitted.

The opening portion 63 of the second connection electrode 4 is formed in a portion of the wall surfaces 66 (the wall surface 66 at the side surface 2D side of the substrate 2 and the wall surfaces 66 at the side surfaces 2E and 2F sides of the substrate 2) of the penetrating hole 906. The same effects as the effects described above with the first preferred embodiment can thus be exhibited by the arrangement according to the third modification example as well.

Although in FIG. 37, the chip part 901 is illustrated as a modification example of the chip part 1 according to the first preferred embodiment described above, the arrangement of the penetrating hole 906 may obviously be adopted in any of the second to fifth preferred embodiments described above.

Figure 38:
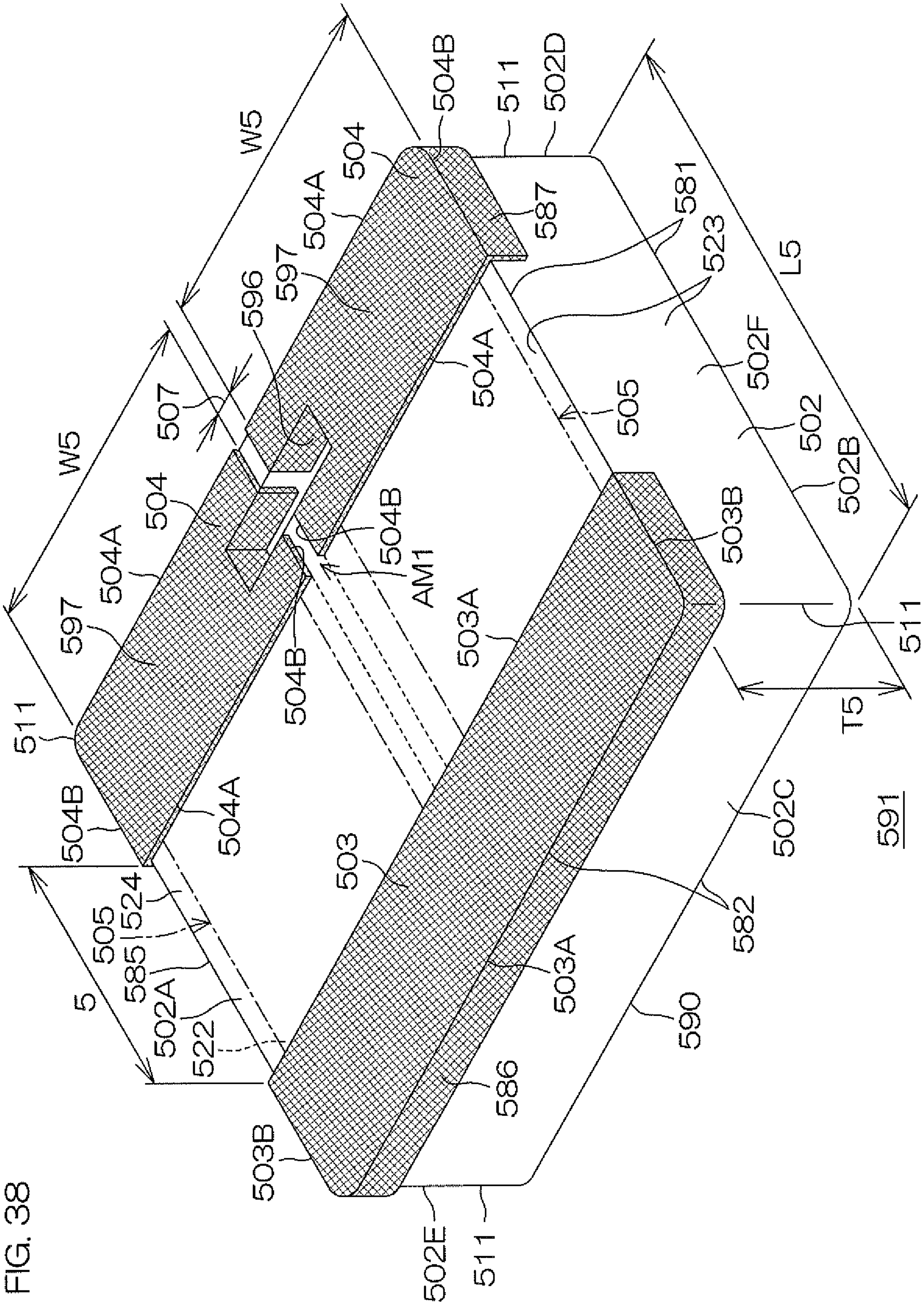
FIG. 38 is a schematic perspective view of a modification example of the chip part shown in FIG. 29A.

Although with the fourth preferred embodiment described above, an example where the penetrating holes 506 are respectively formed in the regions in which the respective second connection electrodes 504 are formed was described, the arrangement shown in FIG. 38 may also be adopted. FIG. 38 is a schematic perspective view of a modification example of the chip part 501 shown in FIG. 29A.

Points of difference of the chip part 591 according to the modification example with respect to the composite chip part 501 according to the fourth preferred embodiment are that a single penetrating hole 596 is formed so as to cross the boundary region 507 set between the respective second connection electrodes 504 and that flat portions 597, without a penetrating hole formed therein, are formed at the central portions of the respective second connection electrodes 504. Arrangements of other portions are the same as those of the composite chip part 501 according to the fourth preferred embodiment described above and therefore the same reference symbols shall be provided and description shall be omitted.

Even with such an arrangement, the same effects as the effects described above with the fourth preferred embodiment can be exhibited. Also, probing can be performed satisfactorily because the flat portions 597 are formed at the central portions of the respective second connection electrodes 504.

Figure 39:
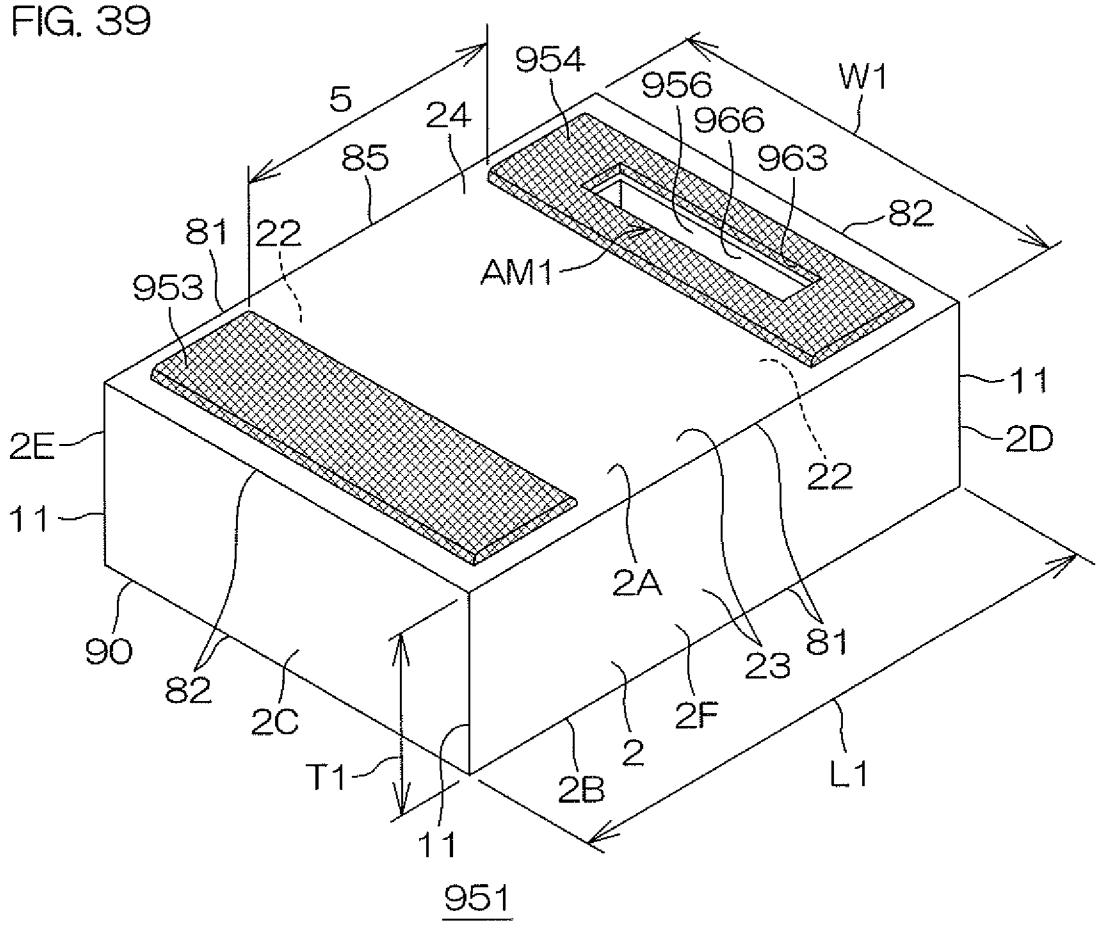
FIG. 39 is a schematic perspective view of another modification example of the chip part shown in FIG. 1.
Figure 40:
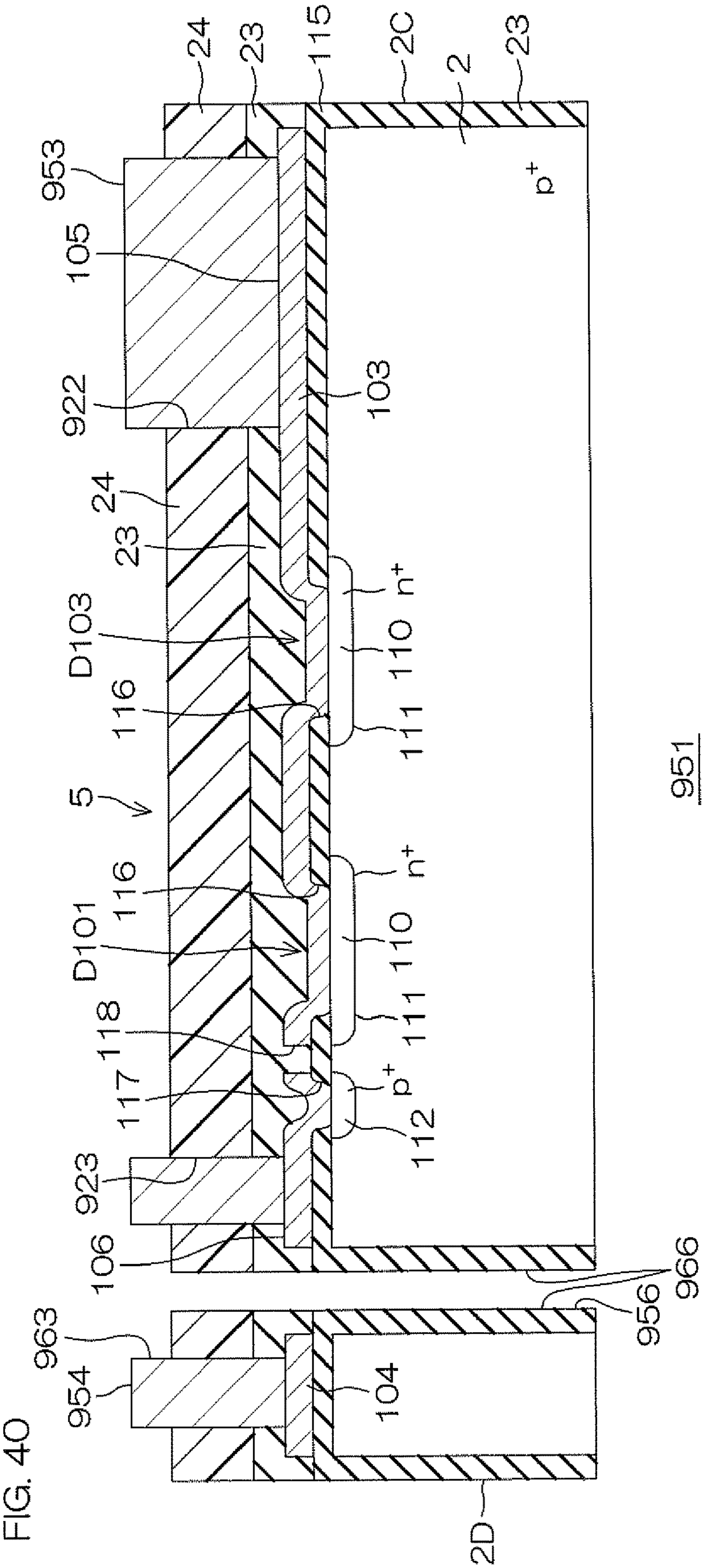
FIG. 40 is a sectional view of the chip part shown in FIG. 39.

Although with each of the first to fifth preferred embodiment described above, an example where the first and second connection electrodes 3 and 4 are formed on the side surfaces 2C to 2F and the element forming surface 2A so as to cover the edge portions of the substrate 2 was described, the arrangement shown in FIG. 39 and FIG. 40 may also be adopted. FIG. 39 is a schematic perspective view of another modification example (chip part 951) of the chip part 1 shown in FIG. 1. FIG. 40 is a sectional view of the chip part 951 shown in FIG. 39.

A point of difference of the chip part 951 according to the other modification example with respect to the chip part 1 according to the first preferred embodiment is that the first and second connection electrodes 953 and 954 are formed in place of the first and second connection electrodes 3 and 4. Arrangements of other portions are the same as those of the chip part 1 according to the first preferred embodiment described above and therefore the same reference symbols shall be provided and description shall be omitted. Although in FIG. 39 and FIG. 40, the chip part 951 is illustrated as a modification example of the chip part 1 according to the first preferred embodiment, the arrangement of the first and second connection electrodes 953 and 954 may obviously be adopted in the second to fifth preferred embodiments and the respective modification examples described above.

As shown in FIG. 39, the first and second connection electrodes 953 and 954 are disposed at an interval from each other at respective end portions of the element forming surface 2A of the substrate 2 (the end portion of the substrate 2 at the side surface 2C side and the end portion of the substrate 2 at the side surface 2D side). The first and second connection electrodes 953 and 954 are formed only on the element forming surface 2A of the substrate 2 and are not formed so as to cover the side surfaces 2C, 2D, 2E, and 2F of the substrate 2. That is, unlike the first and second connection electrodes 3 and 4 described above, the first and second connection electrodes 953 and 954 do not have the peripheral edge portions 86 and 87.

As shown in FIG. 40, on the substrate 2 (across the entire element forming surface 2A), the passivation film 23 and the resin film 24 are formed to cover the cathode electrode film 103 and the anode electrode film 104. A penetrating hole 956 in the present modification example is formed to penetrate through the resin film 24, the passivation film 23, and the substrate 2. The penetrating hole 956 is, for example, formed in the same shape and at the same position as the penetrating hole 6 in the first preferred embodiment.

An opening that exposes the penetrating hole 956 is formed in the anode electrode film 104 of the chip part 951. The opening in the anode electrode film 104 is formed to have a greater area than the area of the penetrating hole 956. In a plan view of the element forming surface 2A of the substrate 2 as viewed in a normal direction, inner walls of the opening in the anode electrode film 104 are defined at positions across intervals from wall surfaces 966 of the penetrating hole 956. That is, the penetrating hole 956 penetrates through the resin film 24, the passivation film 23, and the substrate 2 so as to pass through the opening in the anode electrode film 104.

A pad opening 922 that exposes the cathode pad 105 and a pad opening 923 that exposes the anode pad 106 are formed in the passivation film 23 and the resin film 24. The pad opening 923 that exposes the anode pad 106 is formed to penetrate through the passivation film 23 and the resin film 24 so as to surround a periphery of the penetrating hole 956 (the opening in the anode electrode film 104). The first and second connection electrodes 953 and 954 are formed so as to refill the respective pad openings 922 and 923.

A region of the second connection electrode 954 in which the penetrating hole 956 is formed is opened by an opening portion 963 having approximately the same size as the penetrating hole 956 (more specifically, greater than the penetrating hole 956), and in an inner portion thereof, a front surface of the resin film 24 and the penetrating hole 956 (the wall surfaces 966 of the penetrating hole 956) are exposed to the exterior from the opening portion 963. Unlike in the first preferred embodiment described above, the opening portion 963 of the second connecting electrode 954 is not formed so as to cover the wall surfaces 966 of the penetrating hole 956 formed in the substrate 2. The second connection electrode 954 is thus formed to have a smaller area and a mutually different shape in comparison to the first connection electrode 953 in a plan view.

The first and second connection electrodes 953 and 954 may have front surfaces at positions lower (positions closer to the substrate 2) than the front surface of the resin film 24 or, as shown in FIG. 40, may project from the front surface of the resin film 24 and have front surfaces at positions higher (positions further from the substrate 2) than the resin film 24. In the case where the first and second connection electrodes 953 and 954 project from the front surface of the resin film 24, the first and second connection electrodes 953 and 954 may have overlapping portions extending from opening ends of the pad openings 922 and 923 to the front surface of the resin film 24. Also, although an example where the first and second connection electrodes 953 and 954, each constituted of a single layer of a metal material (for example, an Ni layer), are formed is illustrated in FIG. 40, these may instead have the laminated structure of the Ni layer 33/Pd layer 34/Au layer 35 as in the first preferred embodiment.

Such a chip part 951 may be formed by changing the processes of FIG. 8A to FIG. 8H of the first preferred embodiment described above. Portions of processes for manufacturing the chip part 951 that differ from the processes of FIG. 8A to 8H shall now be described with reference to FIG. 41A to FIG. 41D. FIG. 41A to FIG. 41D are sectional views of a method for manufacturing the chip part 951 shown in FIG. 39.

Figure 41A:
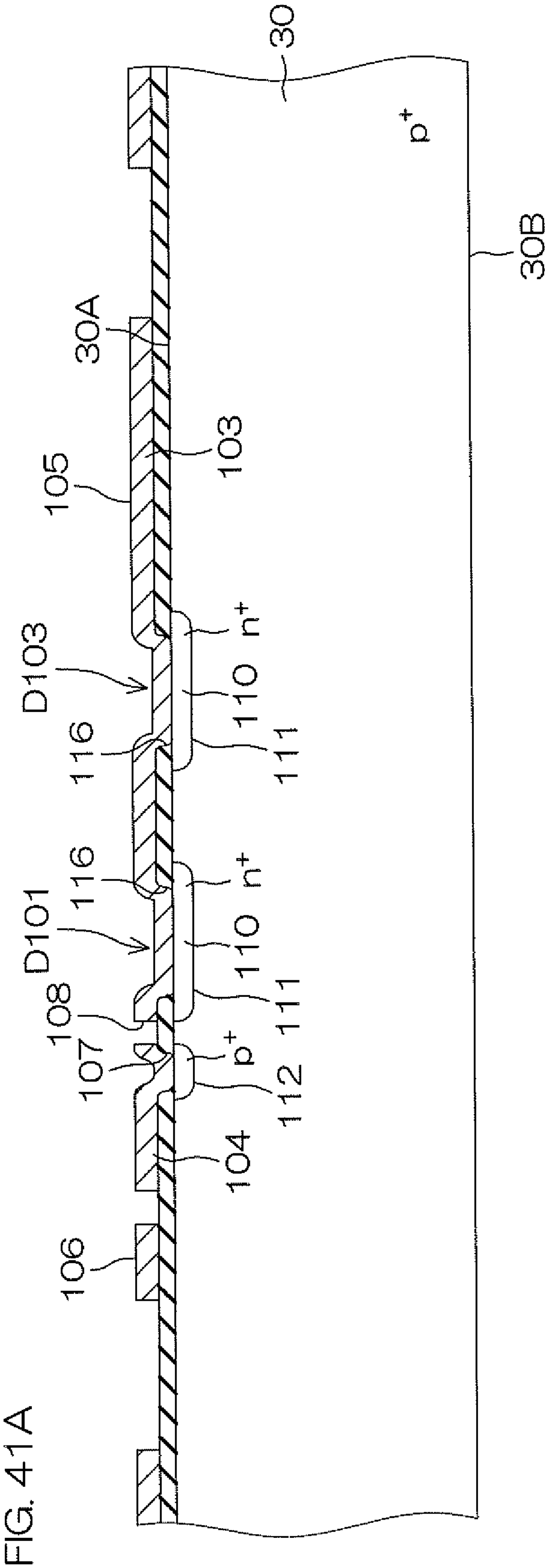
FIG. 41A to FIG. 41D are sectional views of a method for manufacturing the chip part shown in FIG. 39.

First, as shown in FIG. 41A, the substrate 30 that has undergone the process of FIG. 8A of the first preferred embodiment is prepared. Thereafter, the cathode electrode film 103 and the anode electrode film 104 are formed by the same process as that of FIG. 8B. Thereafter, openings are formed, for example, by etching in regions of the anode electrode film 104 in which the penetrating holes 956 (the penetrating hole grooves 46) are to be formed.

Figure 41B:
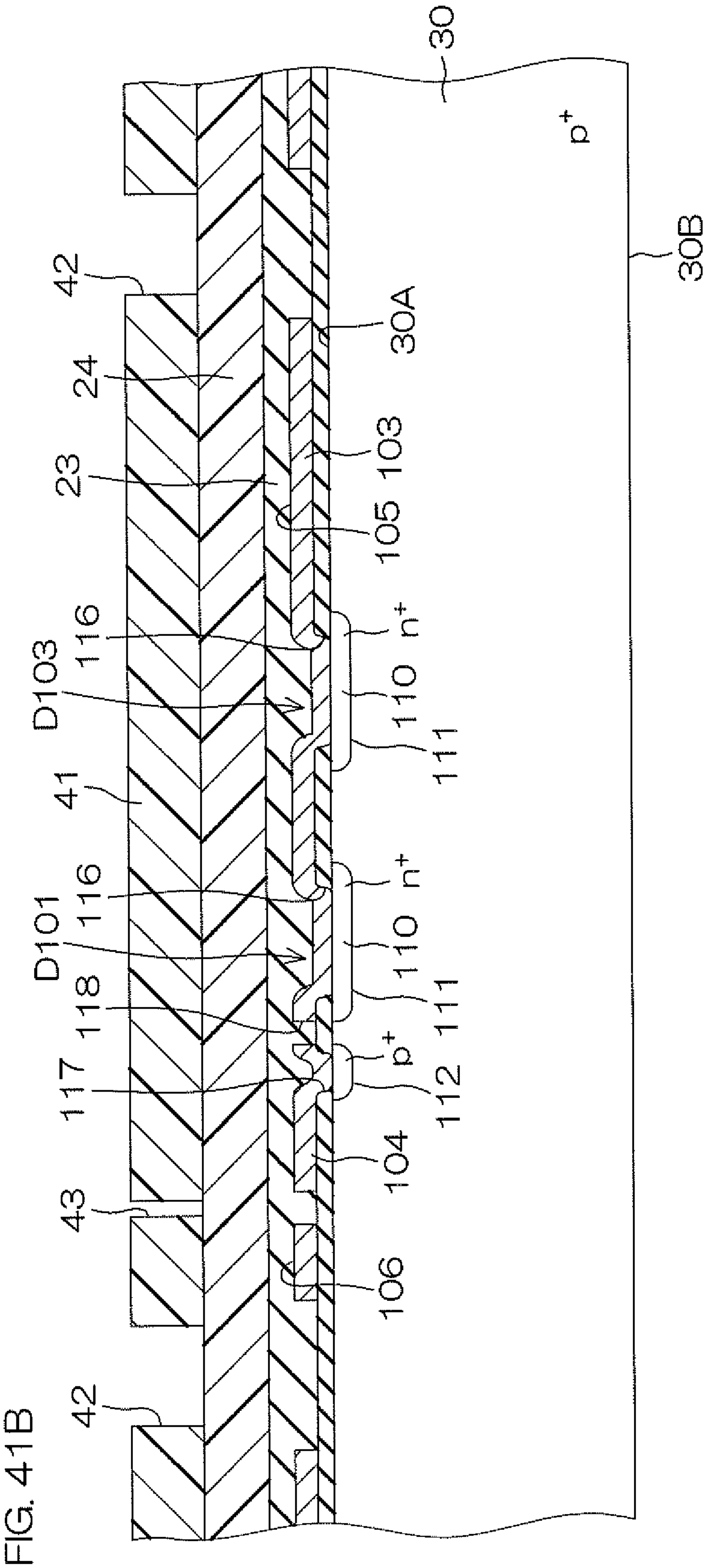

Thereafter, as shown in FIG. 41B, the passivation film 23 and the resin film 24 are formed on the entire front surface 30A of the substrate 30 so as to cover the cathode electrode film 103 and the anode electrode film 104. Thereafter, via the same process as that of FIG. 8D, the resist pattern 41, having the opening 42 and the openings 43 formed selectively in regions in which the groove 45 and the penetrating hole grooves 46 are to be formed, is formed so as to cover the substrate 30 (see FIG. 9).

Figure 41C:
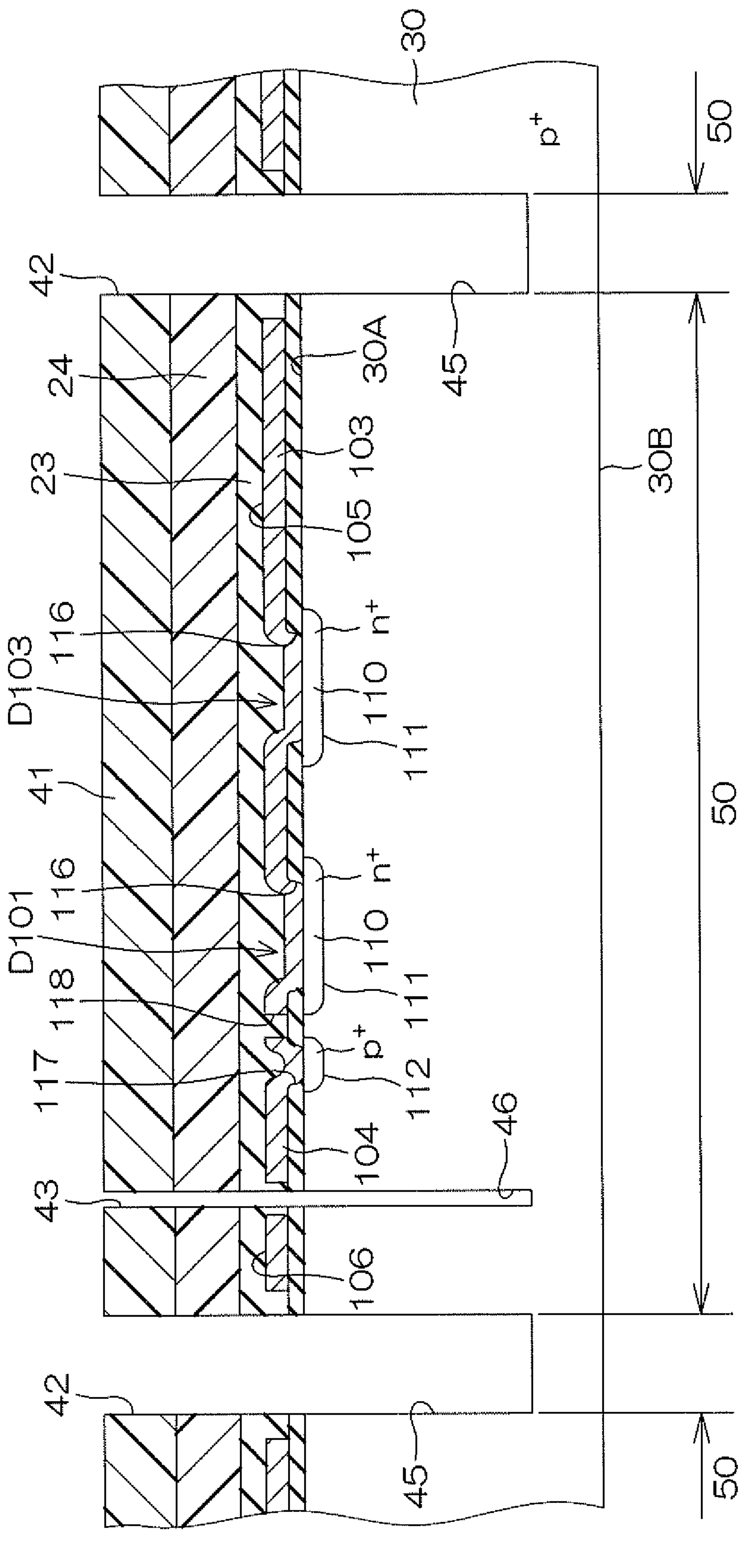

Thereafter as shown in FIG. 41C, the substrate 30 is removed selectively by plasma etching using the resist pattern 41 as a mask. The groove 45 and the penetrating hole grooves 46 of predetermined depth reaching the middle of the thickness of the substrate 30 from the front surface 30A of the substrate 30 are thereby formed at positions matching the opening 42 and the openings 43 of the resist pattern 41 in a plan view, and the semi-finished products 50 that are aligned and disposed in an array are formed. After the groove 45 and the penetrating hole grooves 46 have been formed, the resist pattern 41 is removed.

Figure 41D:
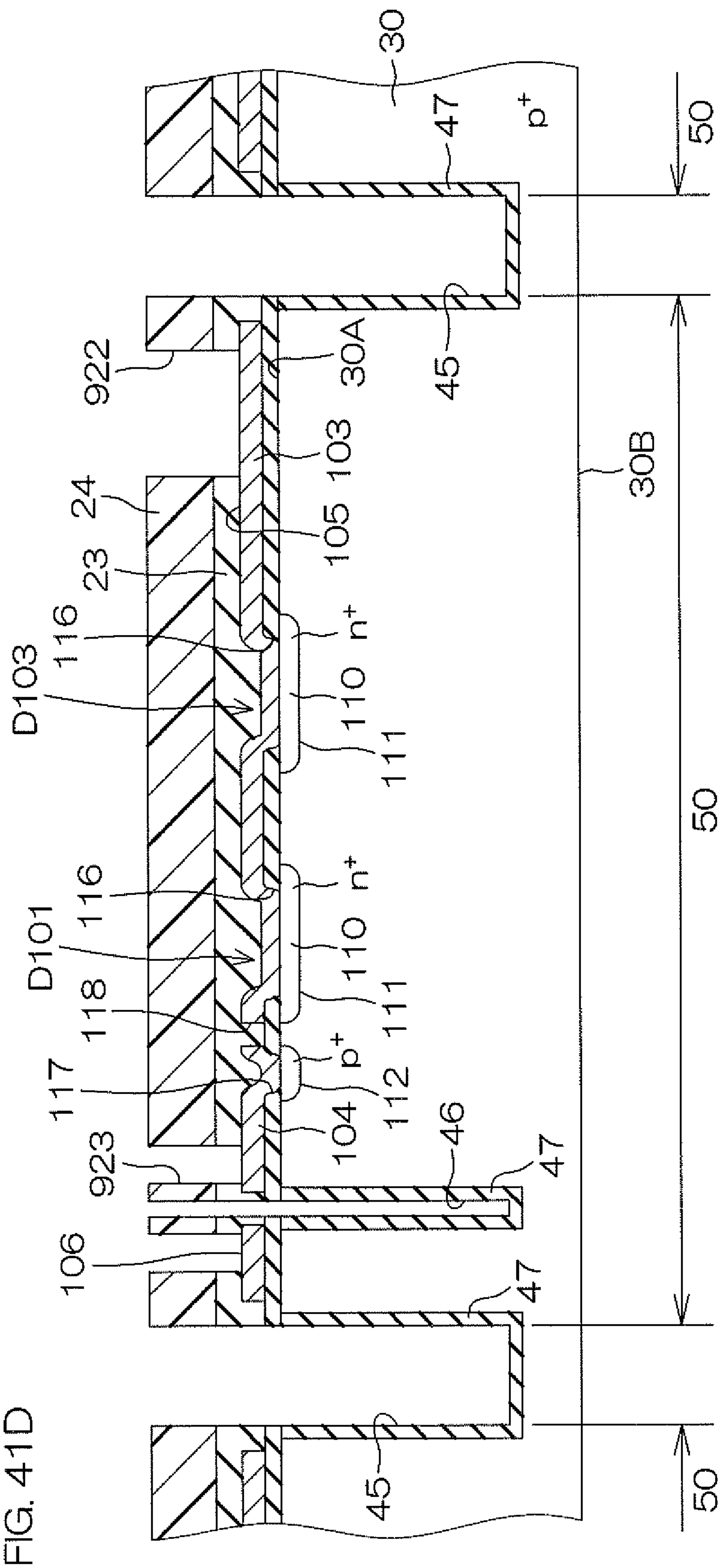

Thereafter as shown in FIG. 41D, the insulating film 47, constituted of SiN, is formed across the entire front surface 30A (including the respective wall surfaces of the groove 45 and the penetrating hole grooves 46) of the substrate 30 via the same process as that of FIG. 8F. Thereafter, the pad openings 922 and 923 that expose the cathode electrode film 103 and the anode electrode film 104 are formed, for example, by etching, so as to penetrate through the passivation film 23 and the resin film 24.

Thereafter, via the same process as the process of FIG. 8G, the first and second connection electrodes 953 and 954 are formed (by plating growth, see FIG. 10) so as to refill the pad openings 922 and 923. The chip parts 951 (see FIG. 39) that are separated into individual chips are then obtained via the same process as the process of FIG. 8H.

Even with such an arrangement, the same effects as the effects described above with the respective preferred embodiment can be exhibited.

First Reference Example

Figure 42:
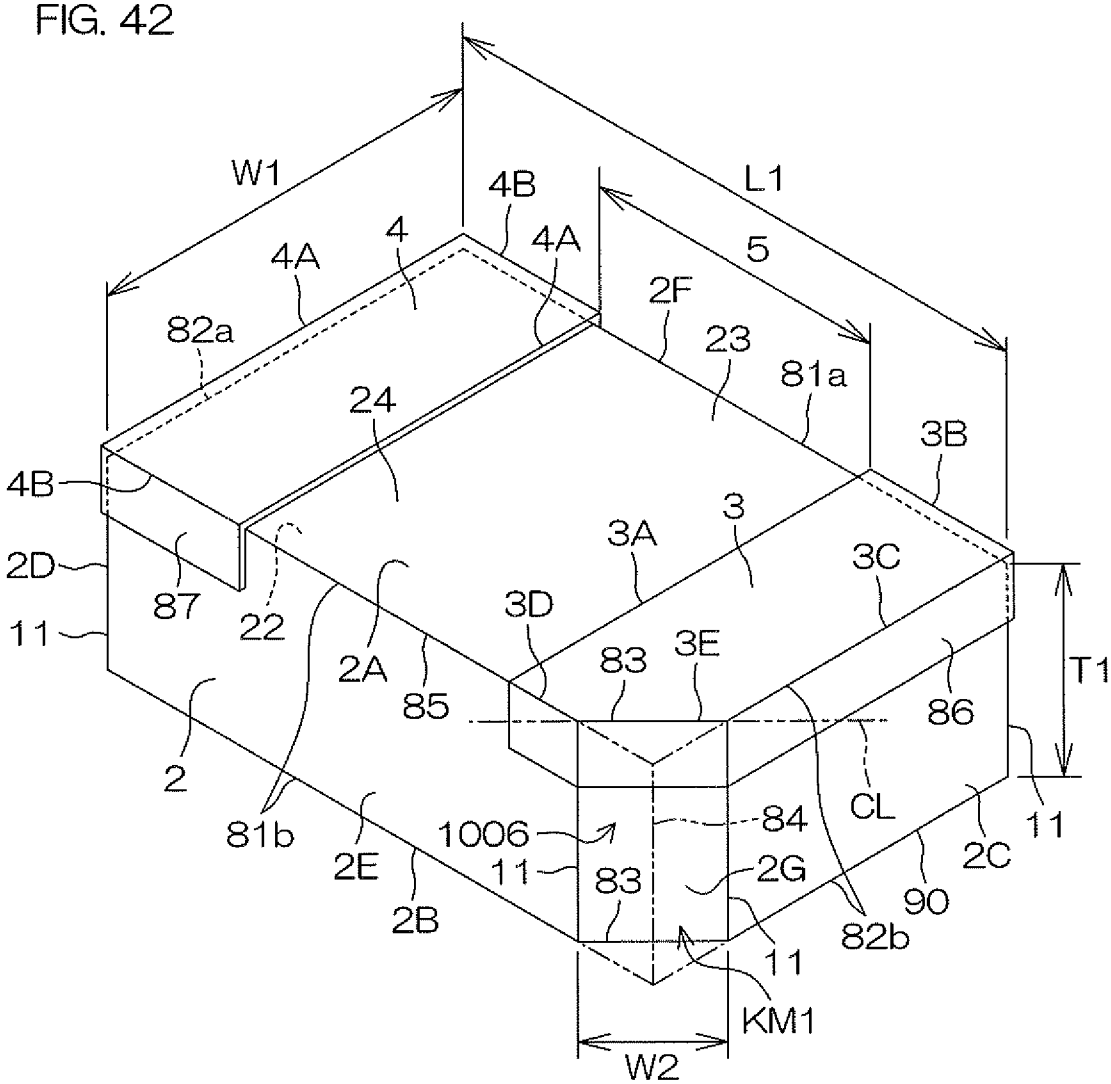
FIG. 42 is a schematic perspective view of a chip part according to a first reference example.

FIG. 42 is a schematic perspective view of a chip part 1001 according to a first reference example. The first reference example shall now be described with portions corresponding to the respective portions shown in FIG. 1 to FIG. 41 being provided with the same reference symbols.

The chip part 1001 is a minute chip part and has a substantially rectangular parallelepiped shape as shown in FIG. 42. More specifically, the chip part 1001 has a chamfered portion 1006 as a notched portion at one corner portion as shall be described below and is thereby made to have a substantially rectangular parallelepiped shape with an asymmetrical shape. The chamfered portion 1006 expresses the polarity direction of the chip part 1001. In FIG. 42, the portion that is chamfered is indicated by alternate long and two short dashes lines.

The chip part 1001 mainly includes the substrate 2 that constitutes the main body of the chip part 1001, the first and second connection electrodes 3 and 4, and the element region 5, in which is selectively formed a circuit element electrically connected by the first and second connection electrodes 3 and 4.

With the substrate 2, the one surface constituting the upper surface in FIG. 42 is the element forming surface 2A. The element forming surface 2A is the surface of the substrate 2 on which the circuit element is formed and has a substantially oblong shape. The surface at the opposite side of the element forming surface 2A in the thickness direction of the substrate 2 is the rear surface 2B. The element forming surface 2A and the rear surface 2B are substantially the same in dimension and same in shape and are parallel to each other.

Each of the element forming surface 2A and the rear surface 2B has a pair of long sides 81(*a*) and 81(*b*) that differ mutually in length (length of the long side 81(*a*)>length of the long side 81(*b*)), a pair of short sides 82(*a*) and 82(*b*) that differ mutually in length (length of the short side 82(*a*) >length of the short side 82(*b*)), and an oblique side 83 joining the long side 81(*b*) and the short side 82(*b*).

The planar shape of the chip part 1001 may, for example, be a rectangle (0603 chip) with the length L1 along the long side 81(*a*) being not more than 0.6 mm and the length W1 along the short side 82(*a*) being not more than 0.3 mm or may be a rectangle (0402 chip) with the length L1 along the long side 81(*a*) being not more than 0.4 mm and the length W1 along the short side 82(*a*) being not more than 0.2 mm. More preferably, the dimension of the chip part 1001 is a rectangle (03015 chip) with the length L1 along the long side 81(*a*) being 0.3 mm and the length W1 along the short side 82(*a*) being 0.15 mm. The chip part 1001 has a thickness T1, for example, of 0.1 mm.

In the following description, the rectangular edge defined by the pair of long sides 81(*a*) and 81(*b*), the pair of short sides 82(*a*) and 82(*b*), and the oblique side 83 at the element forming surface 2A shall be referred to as the peripheral edge portion 85 and the rectangular edge defined by the pair of long sides 81(*a*) and 81(*b*), the pair of short sides 82(*a*) and 82(*b*), and the oblique side 83 at the rear surface 2B shall be referred to as the peripheral edge portion 90. At the element forming surface 2A, the pair of long sides 81(*a*) and 81(*b*) are mutually parallel and the pair of short sides 82(*a*) and 82(*b*) are mutually parallel. When viewed from the direction of the normal orthogonal to the element forming surface 2A (rear surface 2B), the peripheral edge portion 85 and the peripheral edge portion 90 are overlapped.

As surfaces besides the element forming surface 2A and the rear surface 2B, the substrate 2 has the plurality of side surfaces (the side surface 2C, the side surface 2D, the side surface 2E, the side surface 2F, and the side surface 2G). The plurality of side surfaces 2C to 2G extend so as to intersect (specifically, so as to be orthogonal to) each of the element forming surface 2A and the rear surface 2B and join the element forming surface 2A and the rear surface 2B.

The side surface 2C is constructed between the short sides 82(*b*) at one side in the long direction (the front right side in FIG. 42) of the element forming surface 2A and the rear surface 2B, and the side surface 2D is constructed between the short sides 82(*a*) at the other side in the long direction (the inner left side in FIG. 42) of the element forming surface 2A and the rear surface 2B. The side surface 2C and the side surface 2D are the respective end surfaces of the substrate 2 in the long direction. The side surface 2E is constructed between the long sides 81(*b*) at one side in the short direction (the front left side in FIG. 42) of the element forming surface 2A and the rear surface 2B, and the side surface 2F is constructed between the long sides 81(*a*) at the other side in the short direction (the inner right side in FIG. 42) of the element forming surface 2A and the rear surface 2B. The side surface 2E and the side surface 2F are the respective end surfaces of the substrate 2 in the short direction. The side surface 2C and side surface 2F, the side surface 2F and side surface 2D, and the side surface 2D and side surface 2E intersect (specifically, are orthogonal) respectively. The chamfered portion 1006 is formed by chamfering of a corner portion 84 (see the alternate long and two short dashes lines in FIG. 42) of the substrate 2 defined by intersection of the side surface 2C and the side surface 2E along extensions thereof. With the present reference example, an arrangement is illustrated in which the corner portion 84 is chamfered along a chamfer line CL.

In a plan view of viewing from the direction of the normal orthogonal to the element forming surface 2A (rear surface 2B), the chamfered portion 1006 is formed to have a chamfer width W2 (notch width) greater than 10 μm. In the present reference example, the chamfer width W2 is the length of the oblique side 83. The chamfer width W2 is preferably defined to be not less than 30 μm (more specifically, 40 μm to 70 μm).

The chamfer line CL is a straight line passing through the side surface 2C (long side 81(*b*)) and the side surface 2E (short side 82(*b*)). Preferably, lengths (minimum lengths) between the corner portion 84 and the intersections of the chamfer line CL and the side surfaces 2C and 2E (respective sides 81(*b*) and 82(*b*)) are 30 μm to 50 μm respectively.

The side surface 2G is formed by the chamfered portion 1006. The side surface 2G is an oblique surface that is inclined with respect to the side surface 2C and the side surface 2E. The side surface 2G is constructed between the oblique sides 83 at the element forming surface 2A and the rear surface 2B and between the side surface 2C and the side surface 2E.

Although the present reference example illustrates an example adopting a straight line, by which a portion of the substrate 2 that includes corner portion 84 is chamfered in the shape of a triangular prism (a triangle in a plan view), as the chamfer line CL, the chamfer line CL may, for example, be a broken line, by which a portion including the corner portion 84 is chamfered in the shape of a quadratic prism (a rectangle in a plan view), or may be a curve, by which a portion including the corner portion 84 is chamfered in an arcuate shape in a plan view (in the shape of a convex surface or a concave surface).

With the substrate 2, the respective entireties of the element forming surface 2A and the side surfaces 2C to 2G are covered by the passivation film 23. Therefore to be exact, the respective entireties of the element forming surface 2A and the side surfaces 2C to 2G in FIG. 42 are positioned at the inner sides (rear sides) of the passivation film 23 and are not exposed to the exterior. The chip part 1001 further has the resin film 24.

The resin film 24 covers the entirety (the peripheral edge portion 85 and a region at the inner side thereof) of the passivation film 23 on the element forming surface 2A. The passivation film 23 and the resin film 24 shall be described in detail later.

The first and second connection electrodes 3 and 4 are disposed at one end portion and another end portion of the element forming surface 2A and are formed across an interval from each other. The one end portion of the element forming surface 2A is an end portion at the side surface 2C side of the substrate 2, and the other end portion of the element forming surface 2A is an end portion at the side surface 2D side of the substrate 2.

The first connection electrode 3 includes the peripheral edge portion 86 having a portion extending along the chamfer line CL (oblique side 83) that defines the chamfered portion 1006 of the substrate 2. The peripheral edge portion 86 of the first connection electrode 3 is formed integrally on the element forming surface 2A of the substrate 2 so as to extend from the element forming surface 2A to the side surfaces 2C, 2E, 2F, and 2G and thereby cover the peripheral edge portion 85. In the present reference example, the peripheral edge portion 86 is formed so as to cover respective corner portions 11 at which the side surfaces 2C, 2E, 2F, and 2G of the substrate 2 intersect mutually. The first connection electrode 3 thus includes a pair of long sides 3A and 3C that differ mutually in length (length of the long side 3A>length of the long side 3C), a pair of short sides 3B and 3D that differ mutually in length (length of the short side 3B>length of the short side 3D), and an oblique side 3E joining the long side 3C and the short side 3D. The peripheral edge portion 86 along the oblique side 3E is formed along the chamfer line CL that defines the chamfered portion 1006. The long side 3A and short side 3B, the short side 3B and long side 3C, and the long side 3A and short side 3D are respectively orthogonal in a plan view.

On the other hand, the second connection electrode 4 includes the peripheral edge portion 87. The peripheral edge portion 87 of the second connection electrode 4 is formed integrally on the element forming surface 2A of the substrate 2 so as to extend from the element forming surface 2A to the side surfaces 2D, 2E, and 2F and thereby cover the peripheral edge portion 85. In the present reference example, the peripheral edge portion 87 is formed so as to cover respective corner portions 11 at which the side surfaces 2D, 2E, and 2F of the substrate 2 intersect mutually. The second connection electrode 4 has the pair of long sides 4A and the pair of short sides 4B that define four sides in a plan view. The long sides 4A and the short sides 4B of the second connection electrode 4 are orthogonal in a plan view.

The substrate 2 thus has different shapes at the one end portion at which the first connection electrode 3 is formed and at the other end portion at which the second connection electrode 4 is formed. That is, the first connection electrode 3 is formed at the one end portion side of the substrate 2 at which the chamfered portion 1006 is formed and the second connection electrode 4 is formed at the other end portion side of the substrate 2 at which the mutually adjacent side surfaces among the side surfaces 2D, 2E, and 2F are kept mutually perpendicular. Therefore, in the plan view of viewing the element forming surface 2A from the normal direction, the respective end portions of the substrate 2 at which the first and second connection electrodes 3 and 4 are formed have shapes that are not line symmetrical with respect to a straight line orthogonal to the long sides 81(*a*) and 81(*b*) of the substrate 2 (and passing through a center of gravity of the substrate 2). The respective end portions of the substrate 2 at which the first and second connection electrodes 3 and 4 are formed also have shapes that are not point symmetrical with respect to the center of gravity of the substrate 2.

With the substrate 2, each corner portion 11 may have a chamfered rounded shape in a plan view. In this case, the structure is made capable of suppressing chipping during a manufacturing process or mounting of the chip part 1001.

The circuit element is formed in the element region 5. The circuit element is formed in a region of the element forming surface 2A of the substrate 2 between the first connection electrode 3 and the second connection electrode 4 and is covered from above by the passivation film 23 and the resin film 24.

Figure 43:
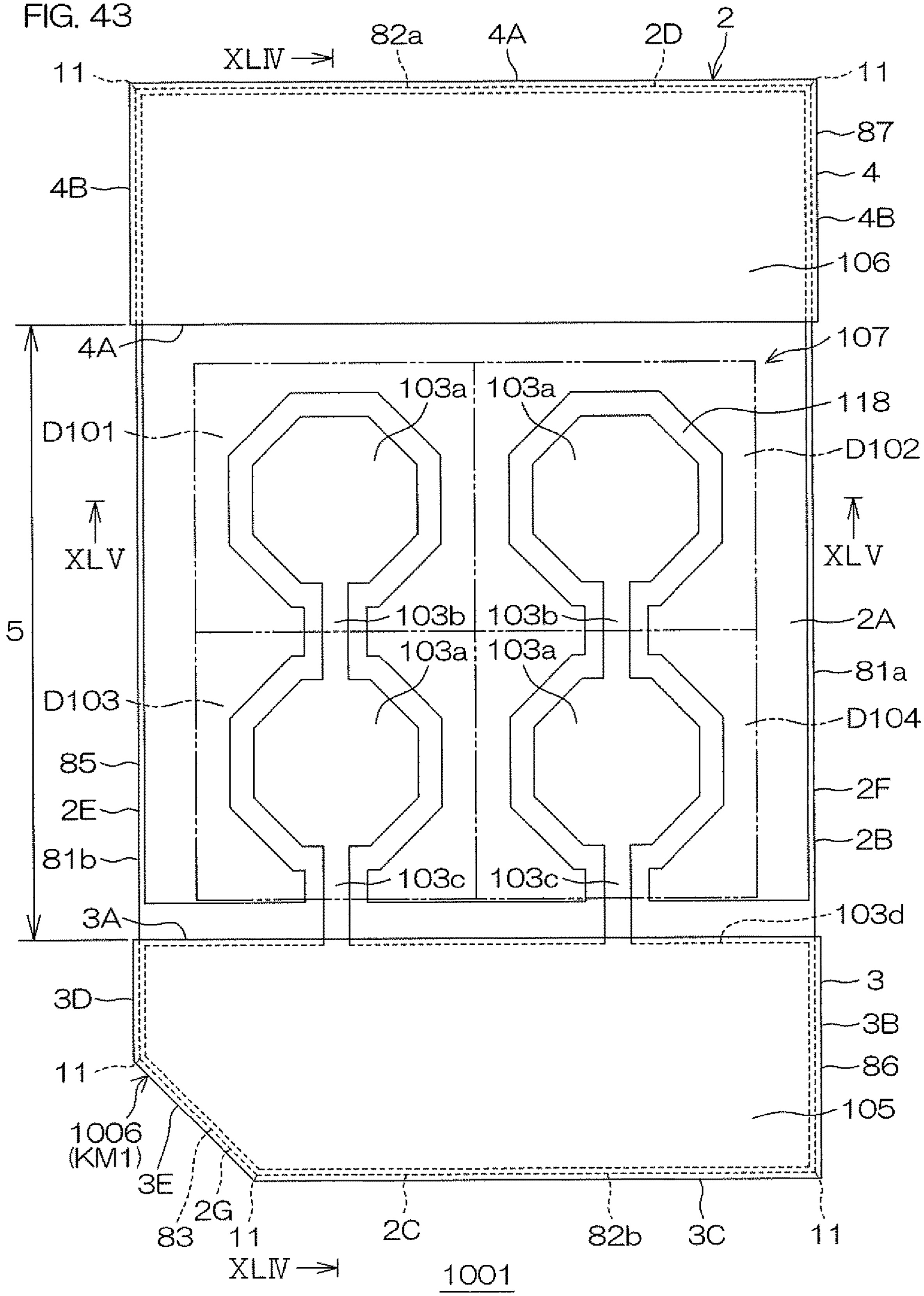
FIG. 43 is a plan view of the chip part shown in FIG. 42.
Figure 44:
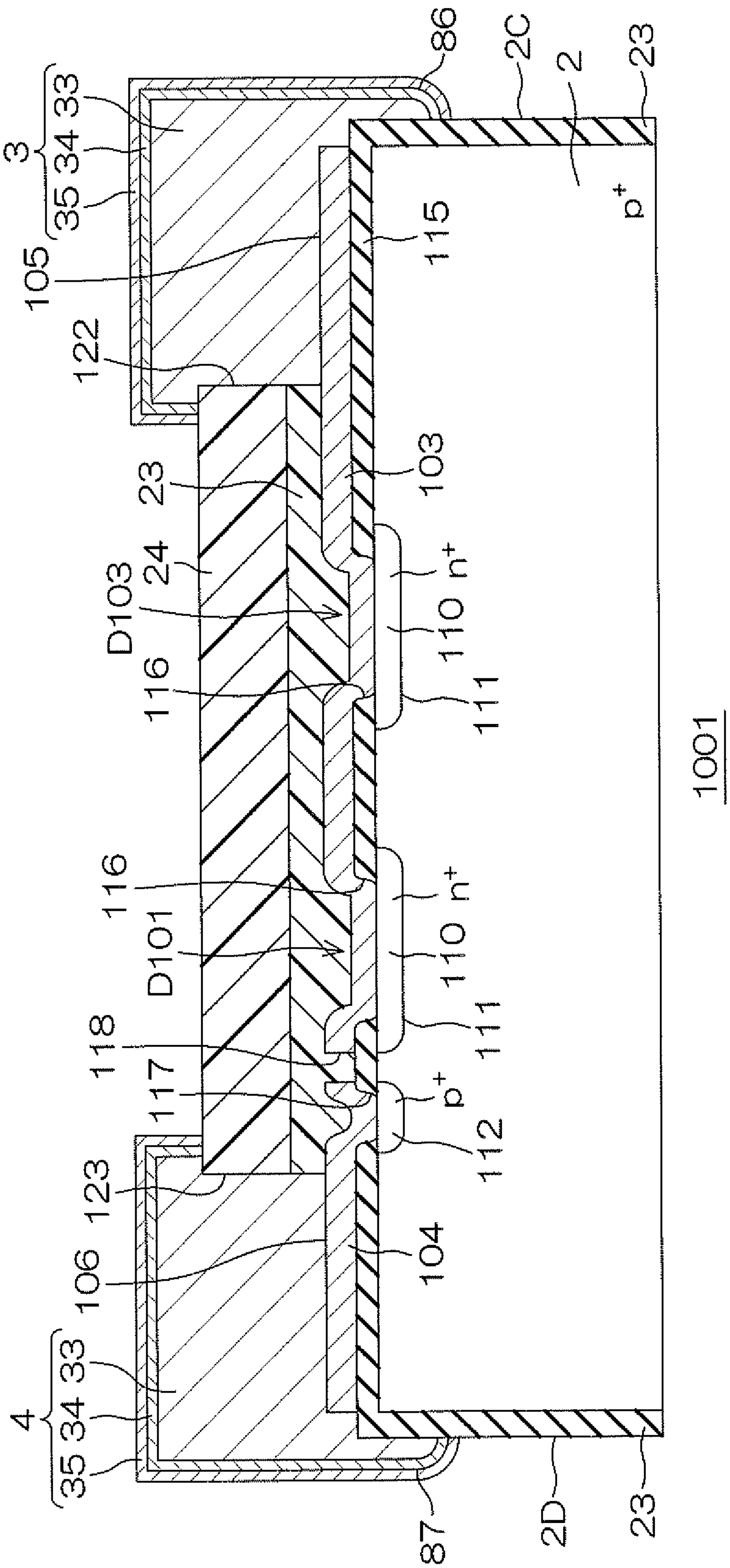
FIG. 44 is a sectional view taken along section line XLIV-XLIV shown in FIG. 43.
Figure 45:
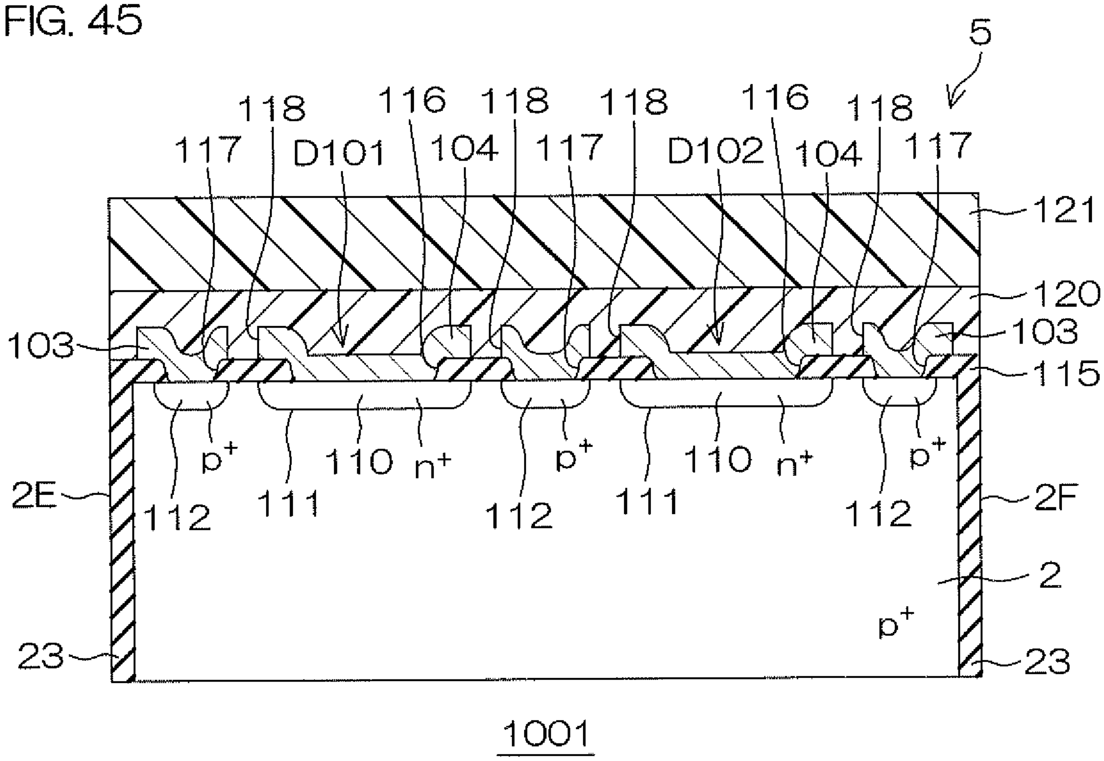
FIG. 45 is a sectional view taken along section line XLV-XLV shown in FIG. 43.

FIG. 43 is a plan view of the chip part 1001 shown in FIG. 42. FIG. 44 is a sectional view taken along section line XLIV-XLIV shown in FIG. 43. FIG. 45 is a sectional view taken along section line XLV-XLV shown in FIG. 43.

The chip part 1001 includes the substrate 2, the plurality of diode cells D101 to D104 that are formed on the substrate 2, and the cathode electrode film 103 and the anode electrode film 104 connecting the plurality of diode cells D101 to D104 in parallel. The first connection electrode 3 is connected to the cathode electrode film 103 and the second connection electrode 4 is connected to the anode electrode film 104. Therefore, in the present reference example, the first connection electrode 3 is a cathode electrode and the second connection electrode 4 is an anode electrode. In the present reference example, the chamfered portion 1006 described in FIG. 42 functions as a cathode mark KM1 that indicates the polarity direction of the first connection electrode 3.

In the present reference example, the substrate 2 is a $p^+$-type semiconductor substrate (for example, a silicon substrate). The cathode pad 105 arranged to be connected to the first connection electrode 3 and the anode pad 106 arranged to be connected to the second connection electrode 4 are disposed at respective end portions of the substrate 2. The diode cell region 107 is provided between the pads 105 and 106 (that is, in the element region 5).

In the present reference example, the diode cell region 107 is formed to a rectangular shape. The plurality of diode cells D101 to D104 are disposed inside the diode cell region 107. In regard to the plurality of diode cells D101 to D104, four are provided in the present reference example and these are aligned two-dimensionally at equal intervals in a matrix along the long direction and short direction of the substrate 2.

Figure 46:
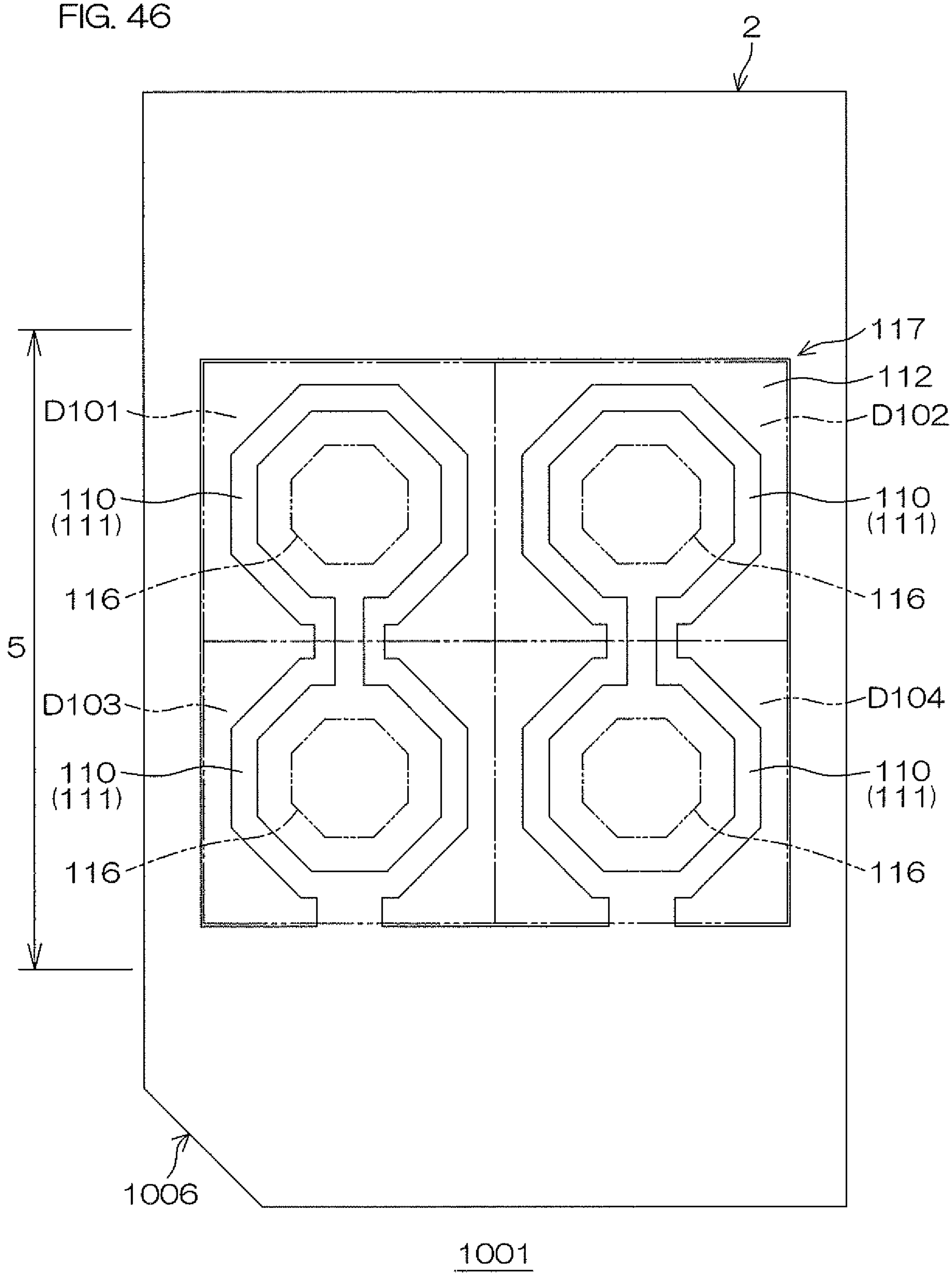
FIG. 46 is a plan view of the chip part shown in FIG. 42 with a cathode electrode, an anode electrode, and the arrangement formed thereon being removed to show the structure of a front surface of a substrate.

FIG. 46 is a plan view of the chip part shown in FIG. 42 with the cathode electrode film 103, the anode electrode film 104, and the arrangement formed thereon being removed to show the structure of the front surface of the substrate 2. In each of the regions of the diode cells D101 to D104, the $n^+$-type region 110 is formed in the surface layer region of the $p^+$-type substrate 2. The $n^+$-type regions 110 are separated according to each individual diode cell. The diode cells D101 to D104 are thereby made to respectively have the p-n junction regions 111 that are separated according to each individual diode cell.

In the present reference example, the plurality of diode cells D101 to D104 are formed to be equal in size and equal in shape and are specifically formed to rectangular shapes, and the $n^+$-type region 110 with a polygonal shape is formed in the rectangular region of each diode cell. In the present reference example, each $n^+$-type region 110 is formed to a regular octagon having four sides extending along the four sides defining the rectangular region of the corresponding diode cell among the diode cells D101 to D104 and another four sides respectively facing the four corner portions of the rectangular region of the corresponding diode cell among the diode cells D1 to D4. Further in the surface layer region of the substrate 2, the $p^+$-type region 112 is formed in the state of being separated from the $n^+$-type regions 110 across a predetermined interval. In the diode cell region 107, the $p^+$-type region 112 is formed to a pattern that avoids the region in which the cathode electrode film 103 is disposed.

As shown in FIG. 44 and FIG. 45, the insulating film 115 (omitted from illustration in FIG. 42 and FIG. 43), constituted of an oxide film, etc., is formed on the front surface of the substrate 2. The contact holes 116 exposing the front surfaces of the respective $n^+$-type regions 110 of the diode cells D101 to D104 and the contact hole 117 exposing the $p^+$-type region 112 are formed in the insulating film 115. The cathode electrode film 103 and the anode electrode film 104 are formed on the front surface of the insulating film 115.

The cathode electrode film 103 enters into the contact holes 116 from the front surface of the insulating film 115 and forms an ohmic contact with the respective $n^+$-type regions 110 of the diode cells 101 to 104 inside the contact holes 116. The anode electrode film 104 extends to inner sides of the contact hole 117 from the front surface of the insulating film 115 and forms an ohmic contact with the $p^+$-type region 112 inside the contact hole 117. In the present reference example, the cathode electrode film 103 and the anode electrode film 104 are constituted of electrode films made of the same material.

As each of the cathode electrode film 103 and the anode electrode film 104, a Ti/Al laminated film having a Ti film as a lower layer and an Al film as an upper layer or an AlCu film may be applied. Besides these, an AlSi film may also be used as the electrode film. When an AlSi film is used, an ohmic contact between the anode electrode film 104 and the substrate 2 can be formed without having to provide the $p^+$-type region 112 on the front surface of the substrate 2. A process for forming the $p^+$-type region 112 can thus be omitted.

The cathode electrode film 103 and the anode electrode film 104 are separated by the slit 118. In the present reference example, the slit 118 is formed to a frame shape (that is, a regular octagonal frame shape) matching the planar shapes of the $n^+$-type regions 110 of the diode cells D101 to D104 so as to border the $n^+$-type regions 110. Accordingly, the cathode electrode film 103 has, in the regions of the respective diode cells D101 to D104, the cell junction portions 103*a* with planar shapes matching the shapes of the $n^+$-type regions 110 (that is, regular octagonal shapes), the cell junction portions 103*a* are put in communication with each other by rectilinear bridging portions 103*b* and are connected by other rectilinear bridging portions 103*c* to the large external connection portion 103*d* of rectangular shape that is formed directly below the cathode pad 105. On the other hand, the anode electrode film 104 is formed on the front surface of the insulating film 115 so as to surround the cathode electrode film 103 across an interval corresponding to the slit 118 of substantially fixed width and is formed integrally to extend to a rectangular region directly below the anode pad 106.

The cathode electrode film 103 and the anode electrode film 104 are covered by the passivation film 23 (omitted from illustration in FIG. 42 and FIG. 43), constituted, for example, of a nitride film (SiN film), and the resin film 24, made of polyimide, etc., is further formed on the passivation film 23. The notched portion 122 selectively exposing the cathode pad 105 and the notched portion 123 selectively exposing the anode pad 106 are formed so as to penetrate through the passivation film 23 and the resin film 24. The first and second connection electrodes 3 and 4 are connected to the corresponding pads 105 and 106.

Each of the first and second connection electrodes 3 and 4 has the Ni layer 33, the Pd layer 34, and the Au layer 35 in that order from the element forming surface 2A side and the side surface 2C to 2G sides. That is, each of the first and second connection electrodes 3 and 4 has the laminated structure constituted of the Ni layer 33, the Pd layer 34, and the Au layer 35 not only in a region on the element forming surface 2A but also in regions on the side surfaces 2C to 2G. Therefore in each of the first and second connection electrodes 3 and 4, the Pd layer 34 is interposed between the Ni layer 33 and the Au layer 35. In each of the first and second connection electrodes 3 and 4, the Ni layer 33 takes up a large portion of each connection electrode and the Pd layer 34 and the Au layer 35 are formed significantly thinly in comparison to the Ni layer 33. The Ni layer 33 serves the role of intermediating between the cathode electrode film 103 and the anode electrode film 104 (for example, the Al of the respective electrode films 103 and 104) in the respective pads 105 and 106 and solder when the chip part 1001 is mounted on a mounting substrate.

With the first and second connection electrodes 3 and 4, the front surface of the Ni layer 33 is thus covered by the Au layer 35 and therefore the Ni layer 33 can be prevented from becoming oxidized. Also, with the first and second connection electrodes 3 and 4, even if a penetrating hole (pinhole)

forms in the Au layer 35 due to thinning of the Au layer 35, the Pd layer 34 interposed between the Ni layer 33 and the Au layer 34 closes the penetrating hole and the Ni layer 33 can thus be prevented from being exposed to the exterior through the penetrating hole and becoming oxidized.

With each of the first and second connection electrodes 3 and 4, the Au layer 35 is exposed at the frontmost surface. The first connection electrode 3 is electrically connected via the one notched portion 122 to the cathode electrode film 103 at the cathode pad 105 in the notched portion 122. The second connection electrode 4 is electrically connected via the other notched portion 123 to the anode electrode film 104 at the anode pad 106 in the notched portion 123. With each of the first and second connection electrodes 3 and 4, the Ni layer 33 is connected to the corresponding pad 105 or 106. Each of the first and second connection electrodes 3 and 4 is thereby electrically connected to the respective diode cells D101 to D104.

The resin film 24 and the passivation film 23 having the notched portions 122 and 123 formed therein thus cover the element forming surface 2A in a state of exposing the first and second connection electrodes 3 and 4 from the notched portions 122 and 123. Electrical connection between the chip part 1001 and the mounting substrate can thus be achieved via the first and second connection electrodes 3 and 4 that protrude (project) from the notched portions 122 and 123 at the front surface of the resin film 24.

In each of the diode cells D101 to D104, the p-n junction region 111 is formed between the $p^+$-type substrate 2 and the $n^+$-type region 110, and a p-n junction diode is thus formed respectively. The $n^+$-type regions 110 of the plurality of diode cells D101 to D104 are connected in common to the cathode electrode film 103, and the $p^+$-type substrate 2, which is the p-type region in common to the diode cells D101 to D104, is connected in common via the $p^+$-type region 112 to the anode electrode film 104. The plurality of diode cells D101 to D104 formed on the substrate 2 are thereby connected in parallel all together.

Figure 47:
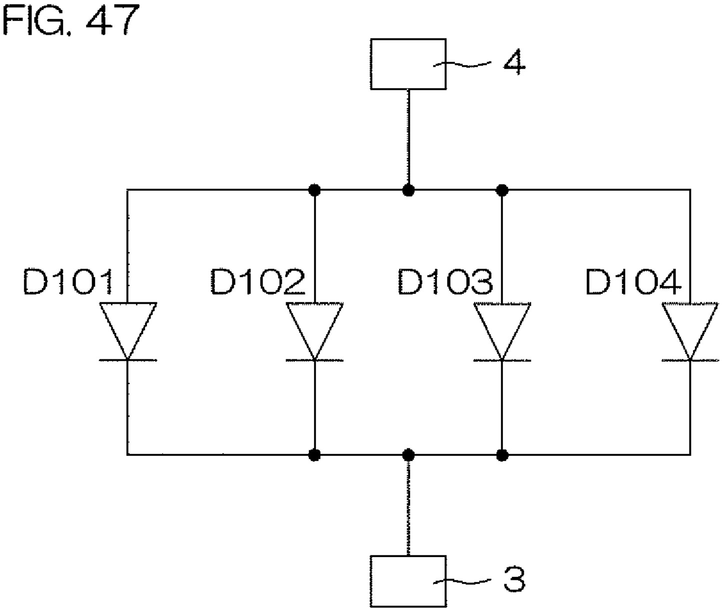
FIG. 47 is an electric circuit diagram of the electrical structure of the interior of the chip part shown in FIG. 42.

FIG. 47 is an electric circuit diagram of the electrical structure of the interior of the chip part shown in FIG. 42. By the cathode sides of the p-n junction diodes respectively constituted by the diode cells D101 to D104 being connected in common by the first connection electrode 3 (cathode electrode film 103) and the anode sides being connected in common by the second connection electrode 4 (anode electrode film 104), all of the diodes are connected in parallel and are thereby made to function as a single diode as a whole.

With the arrangement of the present reference example, the chip part 1001 has the plurality of diode cells D101 to D104 and each of the diode cells D101 to D104 has the p-n junction region 111. The p-n junction regions 111 are separated according to each of the diode cells D101 to D104. The chip part 1001 is thus made long in the peripheral length of the p-n junction regions 111, that is, the total peripheral length (total extension) of the $n^+$-type regions 110 in the substrate 2. The electric field can thereby be dispersed and prevented from concentrating at vicinities of the p-n junction regions 111, and the ESD resistance can thus be improved. That is, even when the chip part 1001 is to be formed compactly, the total peripheral length of the p-n junction regions 111 can be made large, thereby enabling both downsizing of the chip part 1001 and securing of the ESD resistance to be achieved at the same time.

Figure 48:
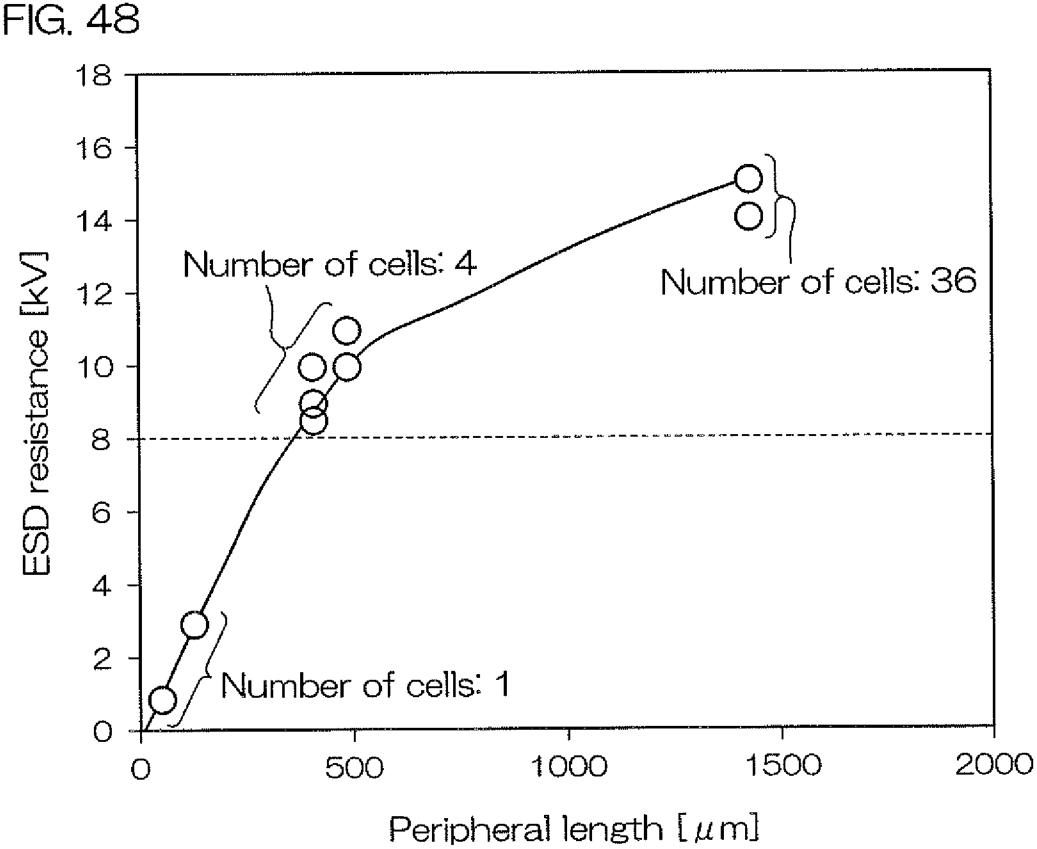
FIG. 48 shows experimental results of measuring the ESD resistances of a plurality of samples that are differed in total peripheral length (total extension) of p-n junction regions by variously setting the sizes of diode cells and/or the number of the diode cells formed on a substrate of the same area.

FIG. 48 shows experimental results of measuring the ESD resistances of a plurality of samples that are differed in the total peripheral length (total extension) of the p-n junction regions by variously setting the sizes of diode cells and/or the number of the diode cells formed on a semiconductor substrate of the same area. From these experimental results, it can be understood that the longer the peripheral length of the p-n junction regions, the greater the ESD resistance. In cases where not less than four diode cells are formed on the substrate, ESD resistances exceeding 8 kilovolts could be realized.

A method for manufacturing the chip part 1001 shall now be described in detail with reference to FIG. 49A to FIG. 49H.

Figure 49A:
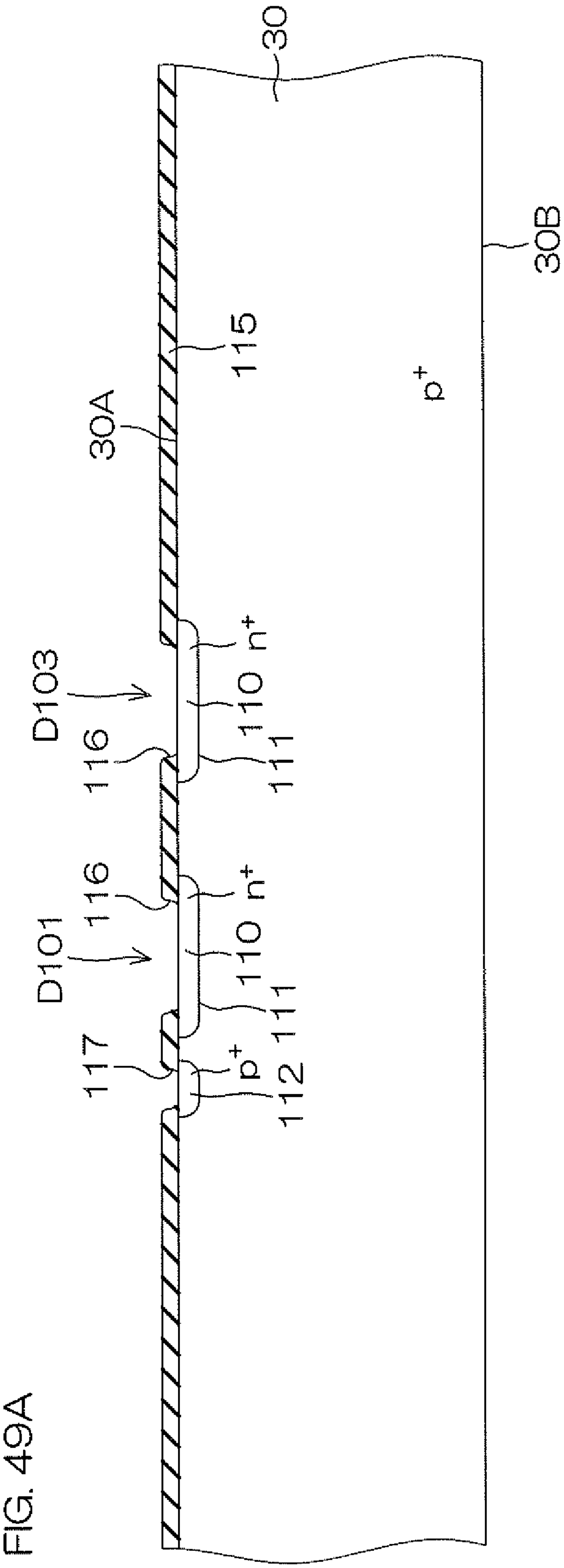
FIG. 49A to FIG. 49H are sectional views of a method for manufacturing the chip part shown in FIG. 42.

First, as shown in FIG. 49A, the $p^+$-type substrate 30, which is the base of the substrate 2, is prepared. Here, the front surface 30A of the substrate 30 is the element forming surface 2A of the substrate 2 and the rear surface 30B of the substrate 30 is the rear surface 2B of the substrate 2. The diode cells D101 to D104 are formed in plurality as unit elements at intervals with respect to each other on the front surface 30A side of the substrate 30.

After preparing the substrate 30, the insulating film 115, which is a thermal oxide film, etc., is formed on the front surface of the substrate 30 and a resist mask is formed thereabove. By ion implantation or diffusion of an n-type impurity (for example, phosphorus) via the resist mask, the $n^+$-type regions 110 are formed. Further, another resist mask, having an opening matching the $p^+$-type region 112, is formed and by ion implantation or diffusion of a p-type impurity (for example, arsenic) via the resist mask, the $p^+$-type region 112 is formed. The diode cells D101 to D104 are formed thereby.

After then peeling off the resist mask and thickening the insulating film 115 (thickening, for example, by CVD) as necessary, yet another resist mask, having openings matching the contact holes 116 and 117, is formed on the insulating film 115. The contact holes 116 and 117 are formed in the insulating film 115 by etching via the resist mask.

Figure 49B:
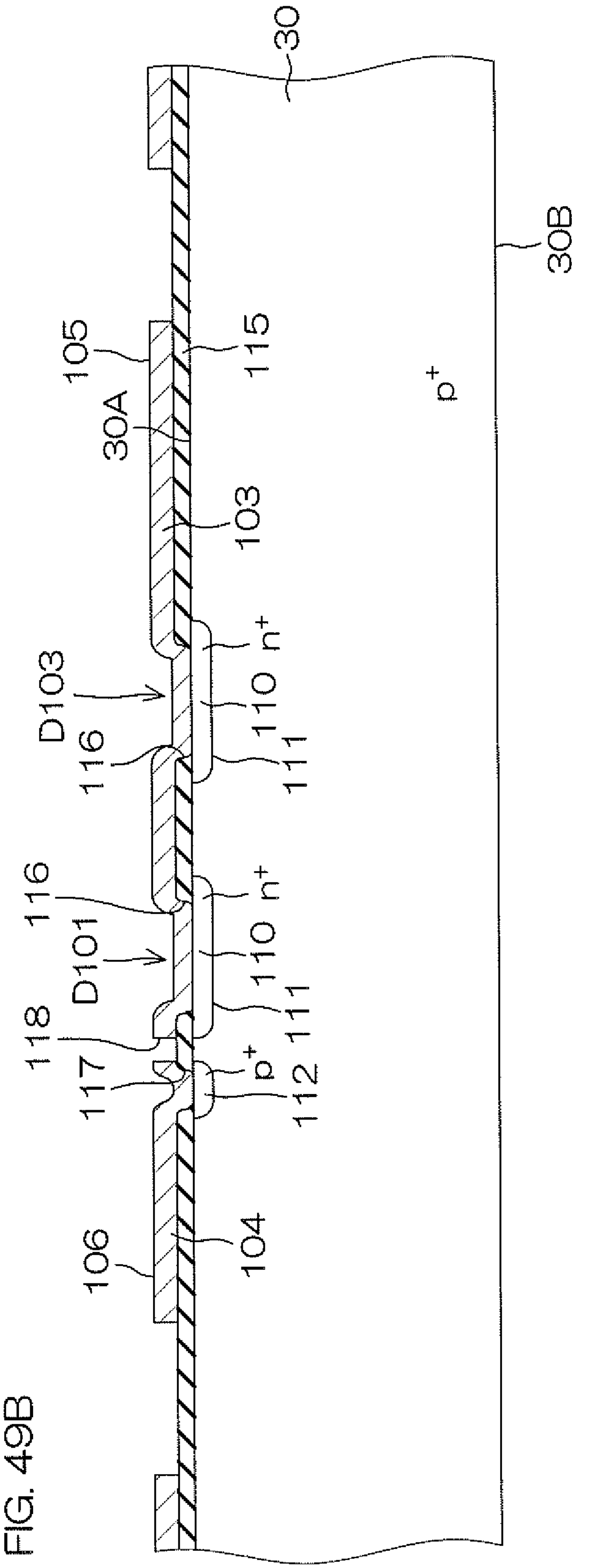

Next, as shown in FIG. 49B, an electrode film that constitutes the cathode electrode film 103 and the anode electrode film 104 is formed on the insulating film 115, for example, by sputtering. A resist film having an opening pattern corresponding to the slit 118 is then formed on the electrode film and the slit 118 is formed in the electrode film by etching via the resist film. The electrode film is thereby separated into the cathode electrode film 103 and the anode electrode film 104.

Figure 49C:
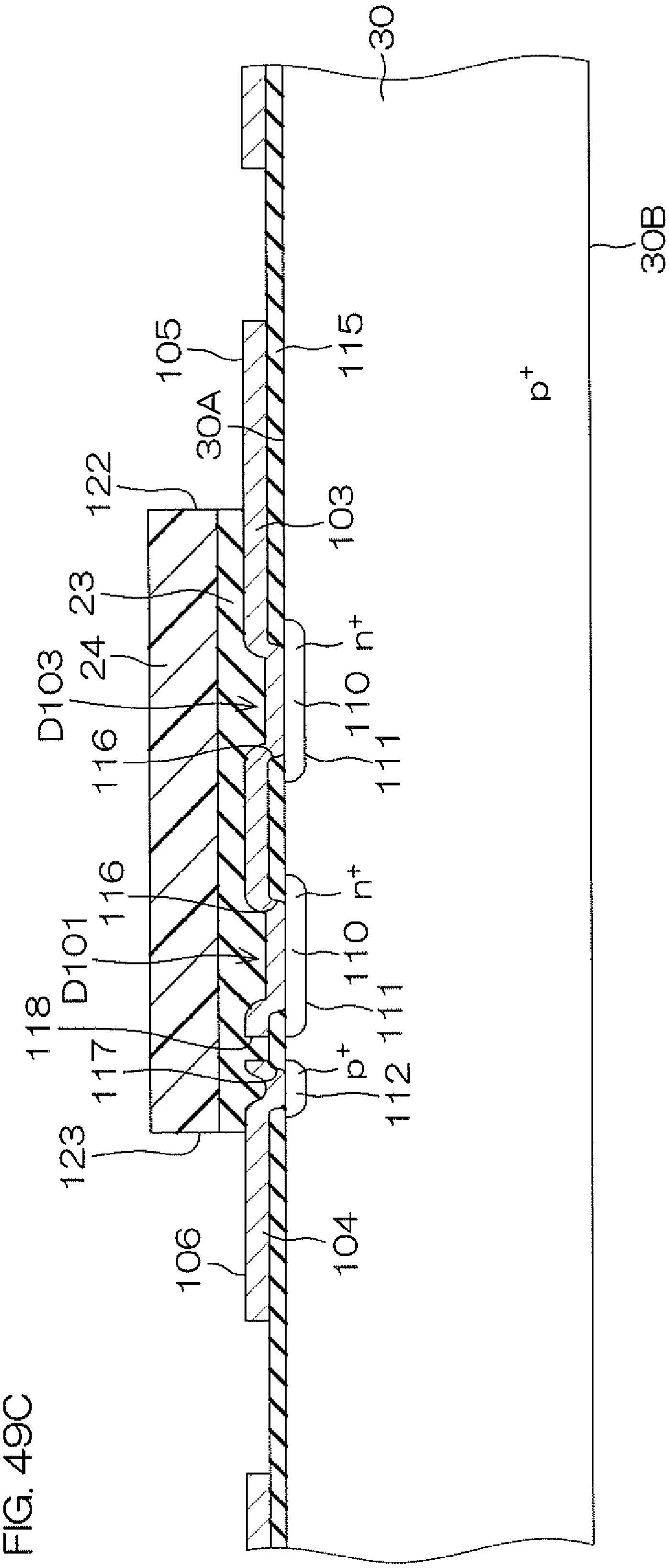

Next, as shown in FIG. 49C, after peeling off the resist film, the passivation film 23, which is a nitride film (SiN film), etc., is formed, for example, by the CVD method, and further, polyimide, etc., is applied to form the resin film 24. By then applying etching using photolithography to the passivation film 23 and the resin film 24, the notched portions 122 and 123 are formed.

Figure 49D:
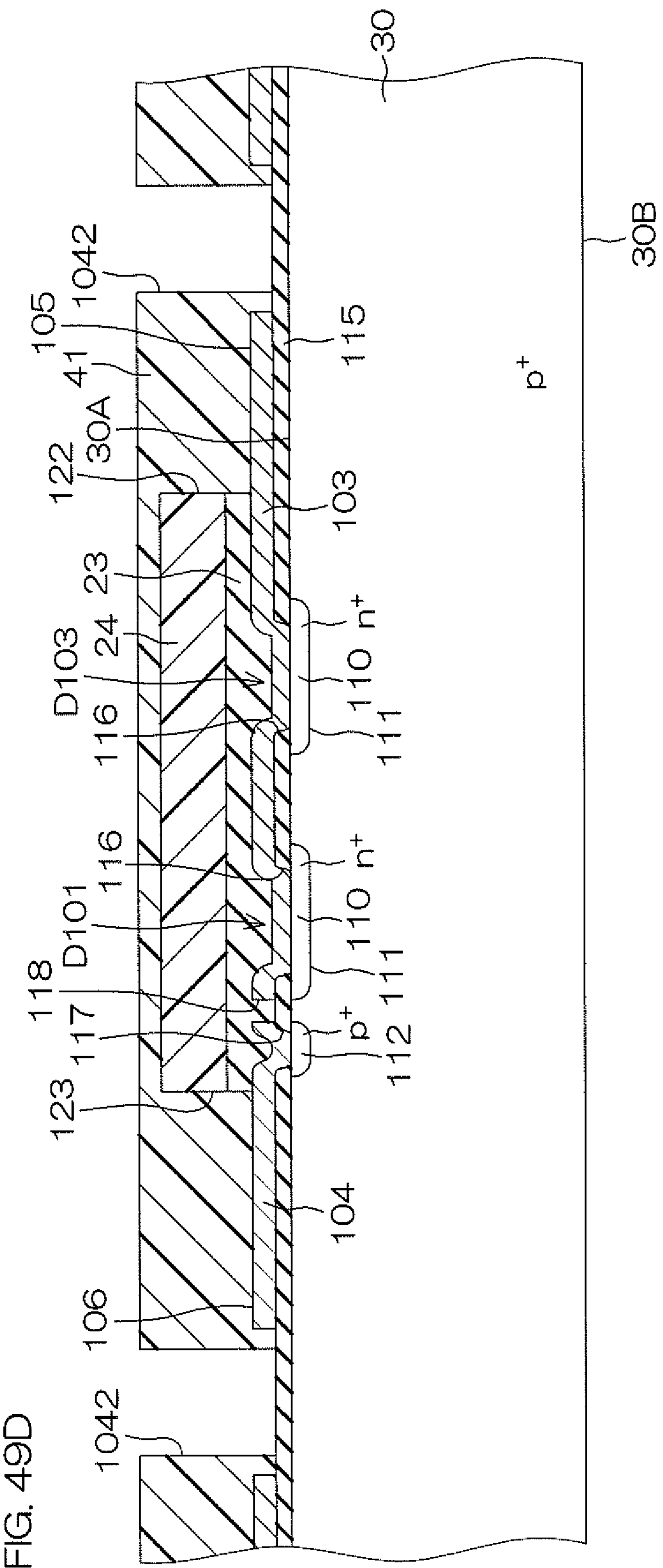

Next, as shown in FIG. 49D, the resist pattern 41 is formed across the entire front surface 30A of the substrate 30. In the resist pattern 41, an opening 1042 is formed selectively in a region in which a groove 1044 to be described below is to be formed.

Figure 50:
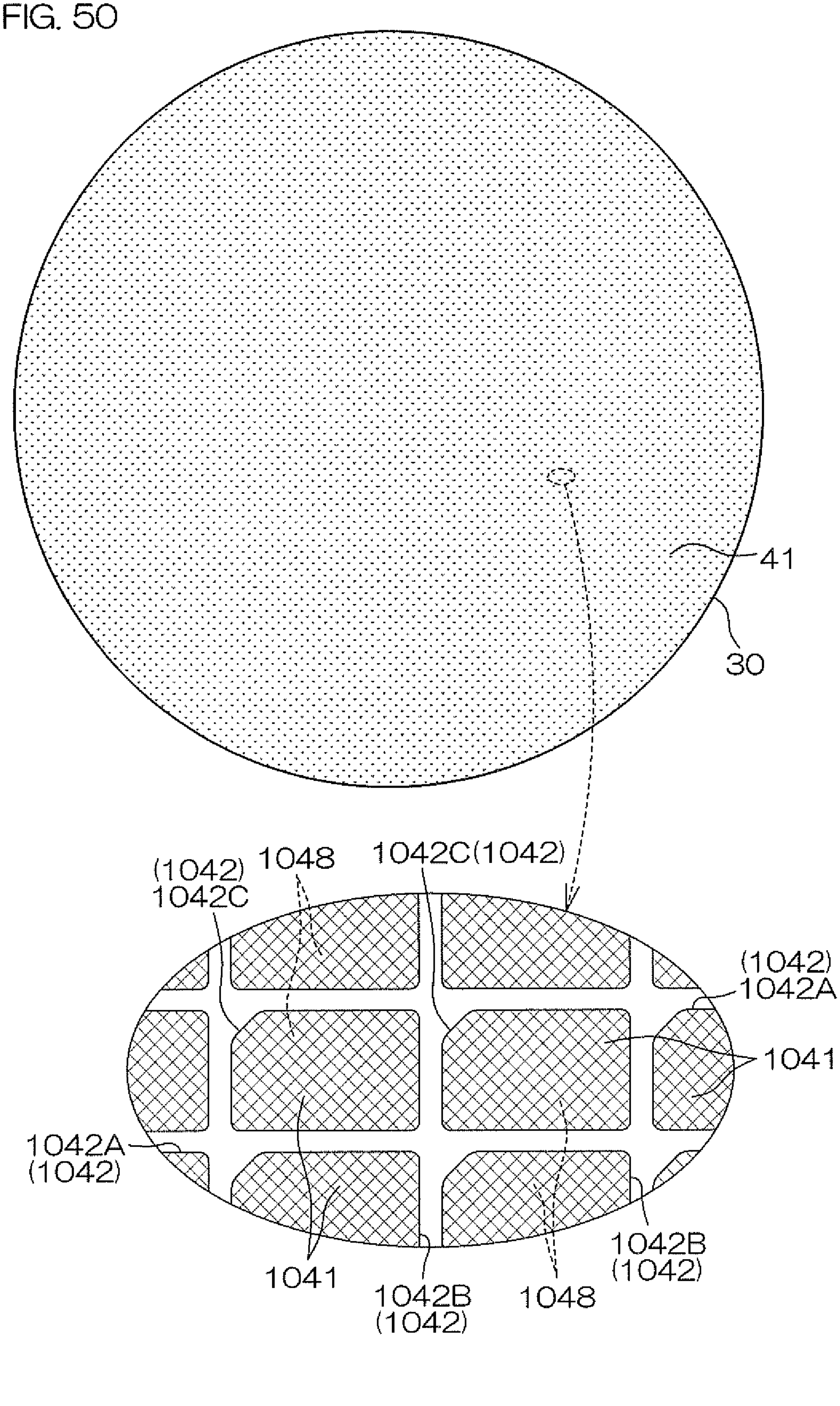
FIG. 50 is a schematic plan view of a portion of a resist pattern used to form a groove in the process of FIG. 49D.

FIG. 50 is a schematic plan view of a portion of the resist pattern 41 used to form the groove 1044 in the process of FIG. 49D. For the sake of description, in FIG. 50, cross hatching is applied to regions on which the resist pattern 41 is formed.

With reference to FIG. 50, the opening 1042 of the resist pattern 41 includes rectilinear portions 1042A and 1042B and chamfered portions 1042C. The rectilinear portions 1042A and 1042B are connected while being maintained in mutually orthogonal states so that the regions that include the diode cells D101 to D104 and are mutually adjacent in a plan view are aligned in a lattice in a plan view. That is, the rectilinear portions 1042A and 1042B define the regions that include the diode cells D101 to D104 as chip regions 1048, which are to become the chip parts 1001. The chip regions 1048, each including the respective diode cells D101 to D104, are thus formed in the form of a lattice in a plan view at the front surface 30A side of the substrate 30.

On the other hand, the chamfered portions 1042C are connected integrally to the rectilinear portions 1042A and 1042B and are formed to selectively expose the corner portions of the respective chip regions 1048 so as to form the chamfered portions 1006 (see FIG. 42 and FIG. 43). The chamfer line CL (see FIG. 42) is set by each chamfered portion 1042C.

Figure 49E:
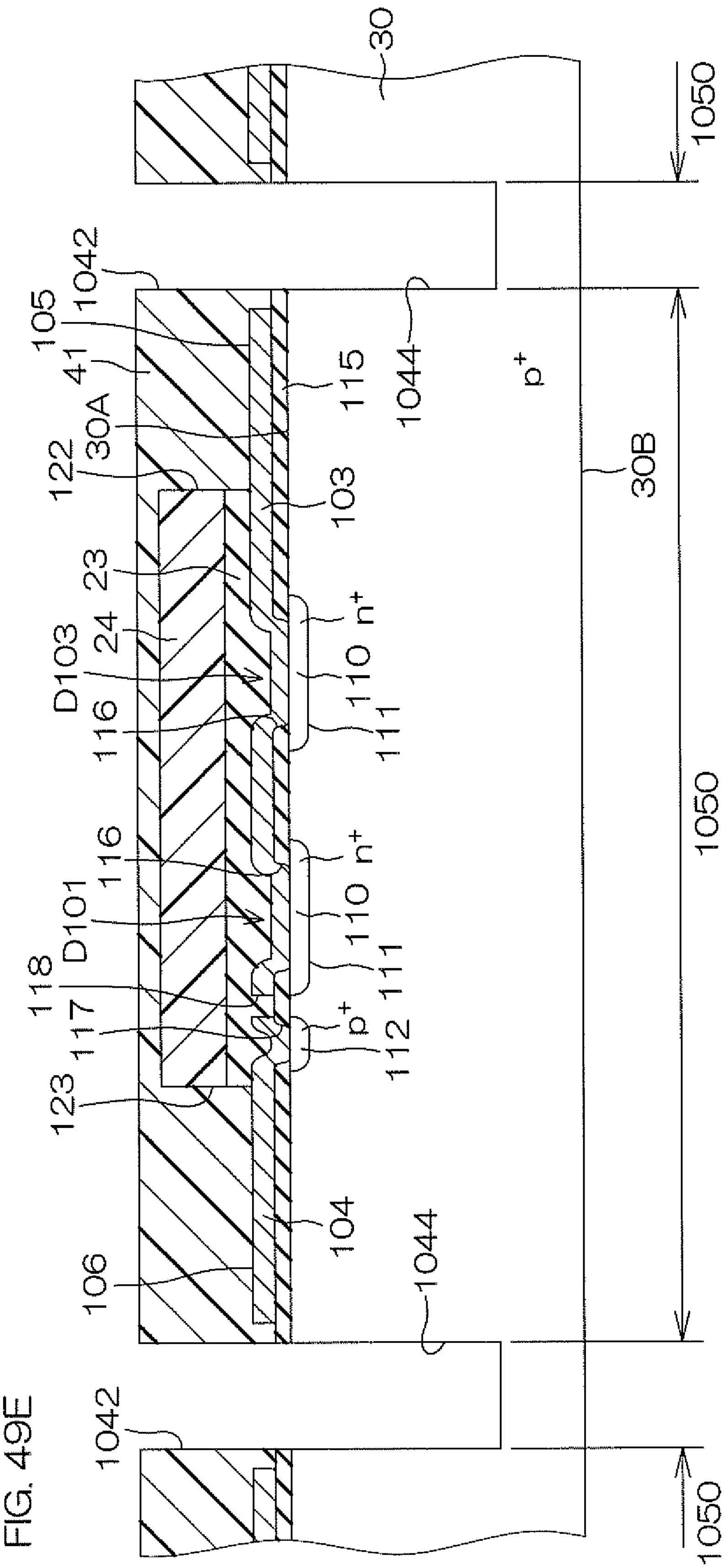

Next, as shown in FIG. 49E, the substrate 30 is removed selectively by plasma etching using the resist pattern 41 as a mask. The groove 1044 of predetermined depth reaching the middle of the thickness of the substrate 30 from the front surface 30A of the substrate 30 is thereby formed at positions matching the opening 1042 of the resist pattern 41 in a plan view and the respective chip regions 1048 are defined as a lattice in a plan view by the groove 1044. The groove 1044 is defined by a pair of mutually facing side walls and a bottom wall joining the lower ends (ends at the rear surface 30B side of the substrate 30) of the pair of side walls.

The overall shape of the groove 1044 in the substrate 30 is a shape that matches the opening 1042 (rectilinear portions 1042A and 1042B and the chamfered portion 1042C) of the resist pattern 41 in a plan view. In the substrate 30, each portion in which the diode cells D101 to D104 are formed is a semi-finished product 1050 of the chip part 1001. At the front surface 30A of the substrate 30, one semi-finished product 1050 is positioned in each chip region 1048 defined by the groove 1044, and these semi-finished products 1050 are aligned and disposed in an array. After the groove 1044 has been formed, the resist pattern 41 is removed.

Figure 49F:
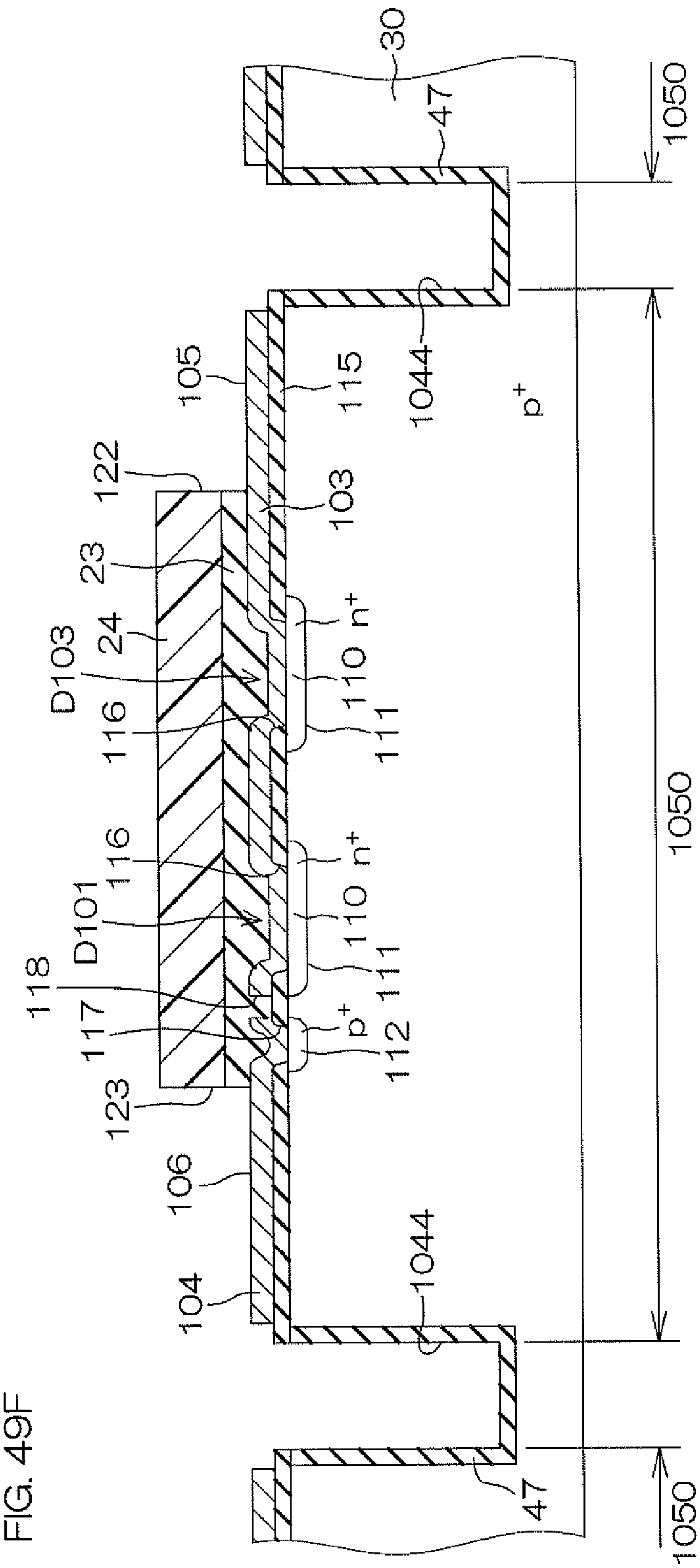

Next, as shown in FIG. 49F, an insulating film 47, constituted of SiN, is formed across the entire front surface 30A of the substrate 30 by the CVD method. In this process, the insulating film 47 is also formed on the entireties of the inner peripheral surfaces (the side walls and bottom wall) of the groove 1044. Next, the insulating film 47 formed on regions besides the inner peripheral surfaces of the groove 1044 is selectively etched.

Figure 49G:
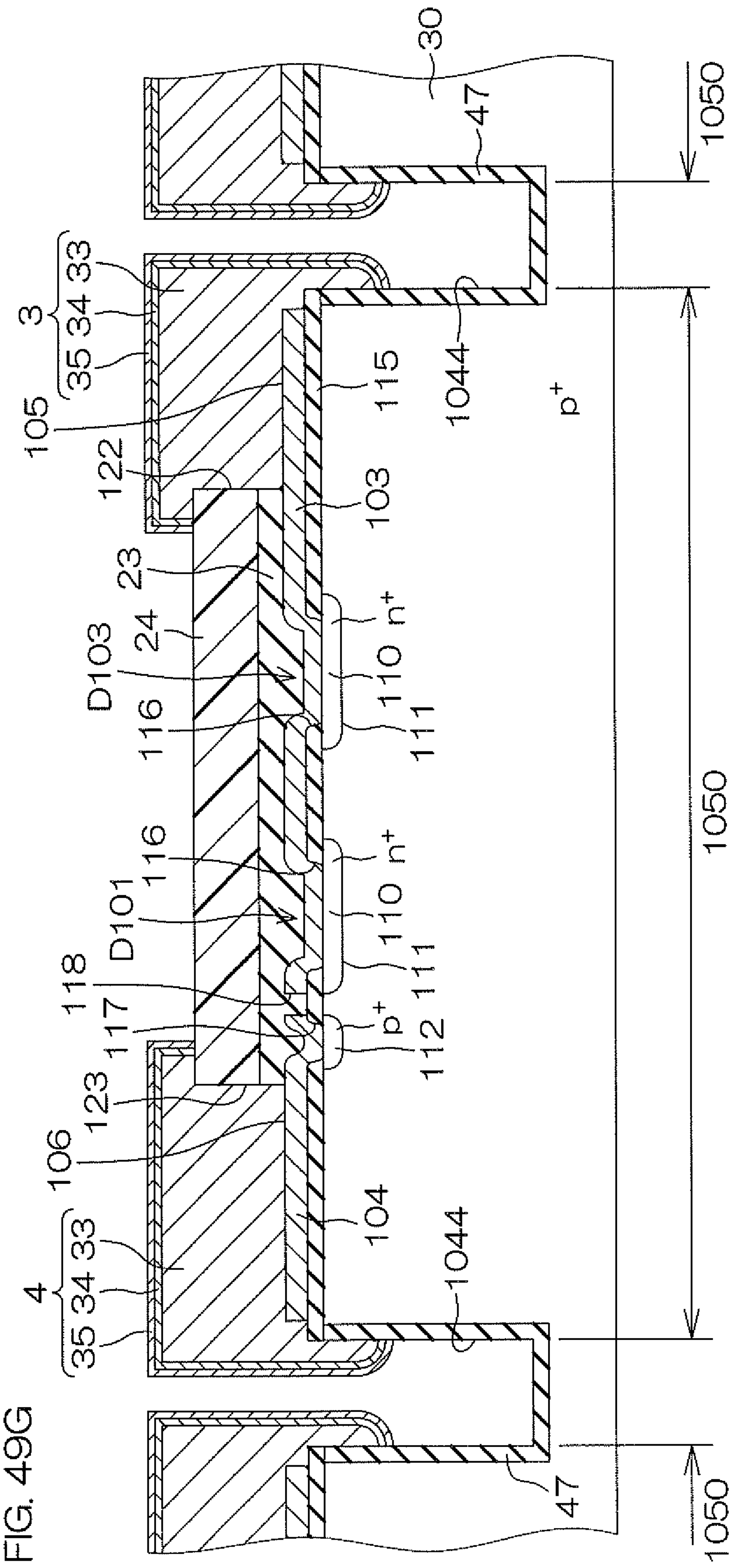
Figure 51:
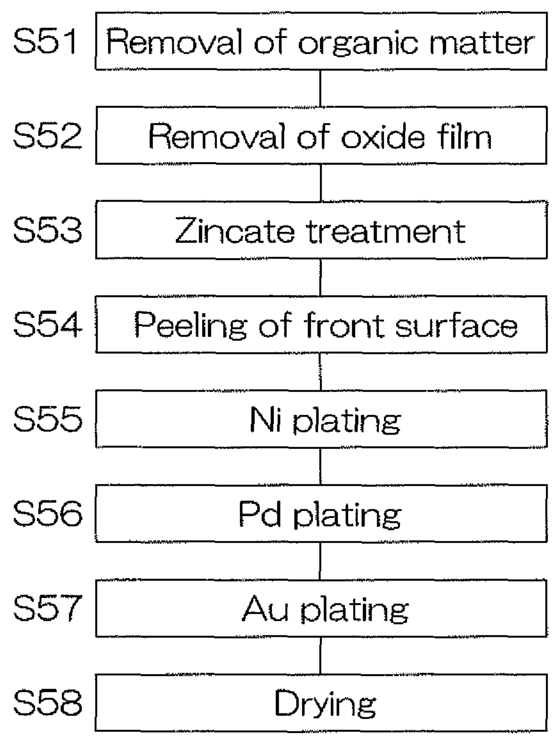
FIG. 51 is a flow chart for describing a method for manufacturing connection electrodes.

Next, by the process shown in FIG. 51, Ni, Pd, and Au are grown successively by plating as shown in FIG. 49G from the cathode pad 105 and the anode pad 106 (the cathode electrode film 103 and the anode electrode film 104) exposed from the respective notched portions 122 and 123. The plating is continued until each plating film grows in lateral directions along the front surface 30A and covers the insulating film 47 on the side walls of the groove 1044. The first and second connection electrodes 3 and 4, constituted of Ni/Pd/Au laminated films, are thereby formed.

FIG. 51 is a diagram for describing a process for manufacturing the first and second connection electrodes 3 and 4.

First, front surfaces of the cathode pad 105 and the anode pad 106 are cleaned to remove (degrease) organic matter (including smut such as carbon stains and greasy dirt) on the front surfaces (step S51). Next, an oxide film on the front surfaces is removed (step S52). Thereafter, a zincate treatment is performed on the front surfaces to convert the Al (of the electrode films) at the front surfaces to Zn (step S53). Thereafter, the Zn on the front surfaces is peeled off by nitric acid, etc., so that fresh Al is exposed at the respective pads 105 and 106 (step S54).

Next, the respective pads 105 and 106 are immersed in a plating solution to apply Ni plating on front surfaces of the fresh Al in the respective pads 105 and 106. The Ni in the plating solution is thereby chemically reduced and deposited to form the Ni layers 33 on the front surfaces (step S55).

Next, the Ni layers 33 are immersed in another plating solution to apply Pd plating on front surfaces of the Ni layers 33. The Pd in the plating solution is thereby chemically reduced and deposited to form the Pd layers 34 on the front surfaces of the Ni layers 33 (step S56).

Next, the Pd layers 34 are immersed in yet another plating solution to apply Au plating on front surfaces of the Pd layers 34. The Au in the plating solution is thereby chemically reduced and deposited to form the Au layers 35 on the front surfaces of the Pd layer 34 (step S57). The first and second connection electrodes 3 and 4 are thereby formed, and when the first and second connection electrodes 3 and 4 that have been formed are dried (step S58), the process for manufacturing the first and second connection electrodes 3 and 4 is completed. A step of cleaning the semi-finished product 1050 with water is performed as necessary between consecutive steps. Also, the zincate treatment may be performed a plurality of times.

As described above, the first and second connection electrodes 3 and 4 are formed by electroless plating and the Ni, Pd, and Al, which are the electrode materials, can thus be grown satisfactorily by plating even on the insulating film 47. Also in comparison to a case where the first and second connection electrodes 3 and 4 are formed by electrolytic plating, the number of steps of the process for forming the first and second connection electrodes 3 and 4 (for example, a lithography process, a resist mask peeling process, etc., that are necessary in electrolytic plating) can be reduced to improve the productivity of the chip part 1001. Further, in the case of electroless plating, the resist mask that is deemed to be necessary in electrolytic plating is unnecessary and deviation of the positions of formation of the first and second connection electrodes 3 and 4 due to positional deviation of the resist mask thus does not occur, thereby enabling the formation position precision of the first and second connection electrodes 3 and 4 to be improved to improve the yield.

Also with this method, the cathode pad 105 and the anode pad 106 (the cathode electrode film 103 and the anode electrode film 104) are exposed from the notched portions 122 and 123 and there is nothing that hinders the plating growth from the respective pads 105 and 106 to the groove 1044. Plating growth can thus be achieved rectilinearly from the respective pads 105 and 106 to the groove 1044. Consequently, the time taken to form the electrodes can be reduced.

After the first and second connection electrodes 3 and 4 have thus been formed, the substrate 30 is ground from the rear surface 30B.

Figure 49H:
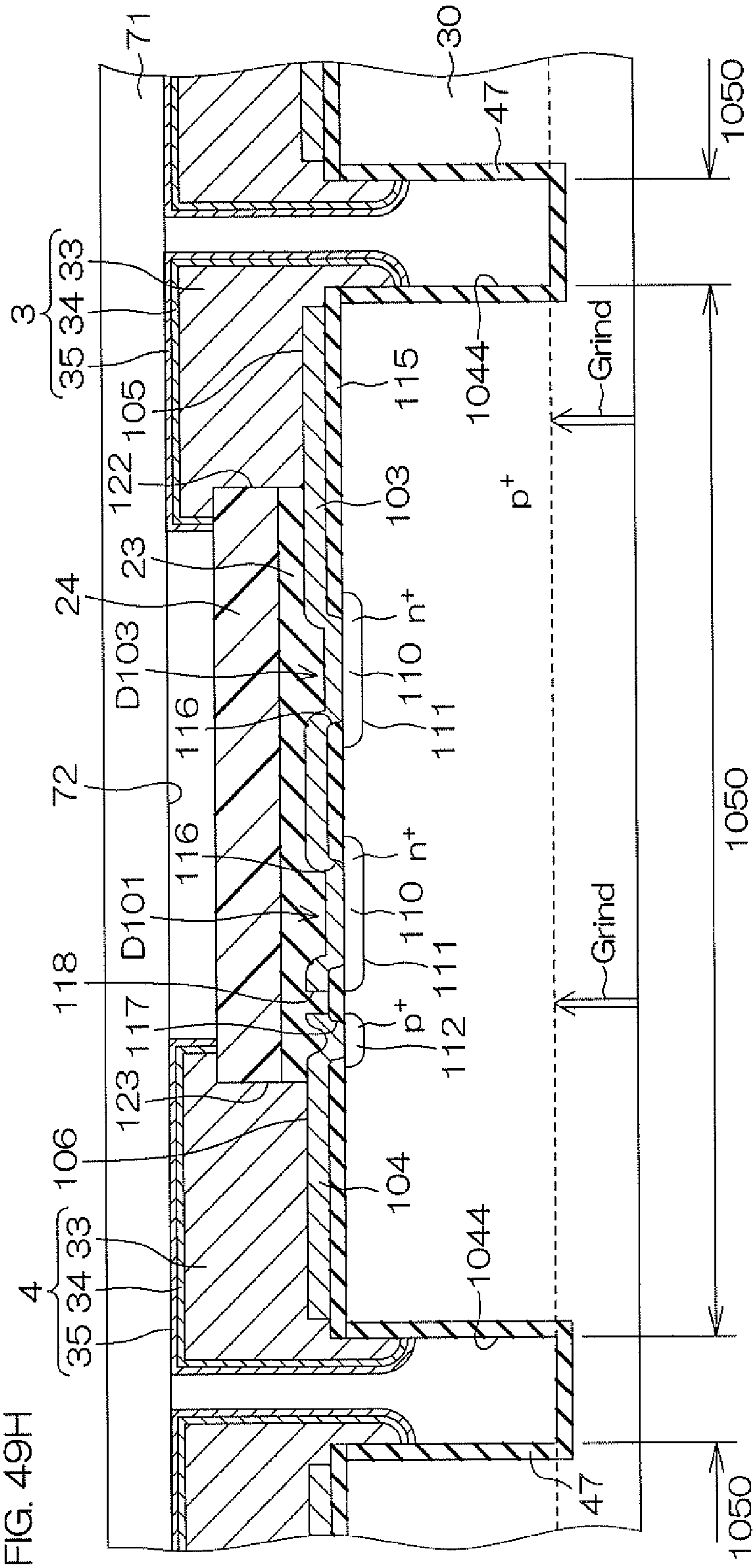

Specifically, after the groove 1044 has been formed, a thin, plate-shaped supporting tape 71, made of PET (polyethylene terephthalate) and having an adhesive surface 72 is adhered at the adhesive surface 72 onto the first and second connection electrode 3 and 4 sides (that is, the front surface 30A side) of each semi-finished product 1050 as shown in FIG. 49H. The respective semi-finished products 1050 are thereby supported by the supporting tape 71. Here, for example, a laminated tape may be used as the supporting tape 71.

In the state where the respective semi-finished products 1050 are supported by the supporting tape 71, the substrate 30 is ground from the rear surface 30B side. When the substrate 30 has been thinned by grinding until the upper surfaces of the bottom wall of the groove 1044 is reached, there are no longer portions that join mutually adjacent semi-finished products 1050 and the substrate 30 is thus divided at the groove 1044 as boundaries and the semi-finished products 1050 are thereby separated individually to become the finished products of the chip parts 1001. That is, the substrate 30 is cut (split up) at the groove 1044 and the individual chip parts 1001 are thereby cut out. The chip parts 1001 may be cut out instead by etching to the bottom wall of the groove 1044 from the rear surface 30B side of the substrate 30.

With each finished chip part 1001, each portion that constituted the side wall of the groove 1044 becomes one of the side surfaces 2C to 2G of the substrate 2 and the rear surface 30B of the substrate 2 becomes the rear surface 2B. That is, the step of forming the groove 1044 by etching (see FIG. 49E) is included in the step of forming the side surfaces 2C to 2G. Portions of the insulating film 47 on the groove 1044 become portions of the passivation film 23 described above.

The plurality of chip parts 1001 formed on the substrate 30 can thus be divided all at once into individual chips (the individual chips of the plurality of chip parts 1001 can be obtained at once) by forming the groove 1044 and then grinding the substrate 30 from the rear surface 30B side as described above. The productivity of the chip parts 1001 can thus be improved by reduction of the time for manufacturing the plurality of chip parts 1001.

The rear surface 2B of the substrate 2 of the finished chip part 1001 may be mirror-finished by polishing or etching to refine the rear surface 2B.

FIG. 52A to FIG. 52D are illustrative sectional views of a process for recovering the chip parts 1001 after the process of FIG. 49H.

Figure 52A:
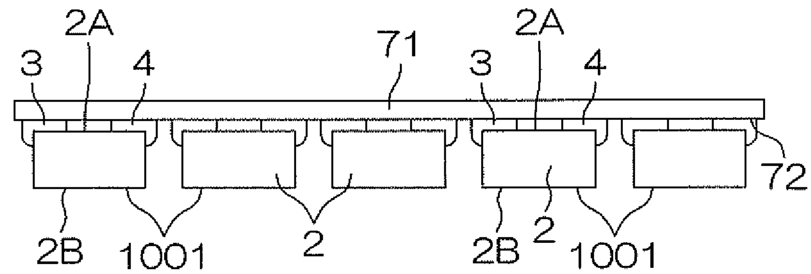
FIG. 52A to FIG. 52D are illustrative sectional views of a chip part recovery process performed after the process of FIG. 49H.
Figure 52B:
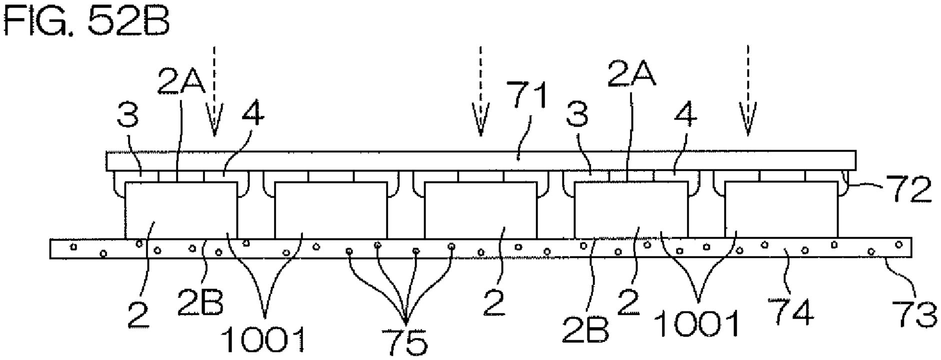

FIG. 52A shows a state where the plurality of chip parts 1001, which have been separated into individual chips, continue to be adhered to the supporting tape 71. In this state, the thermally foaming sheet 73 is adhered onto the rear surfaces 2B of the substrates 2 of the respective chip parts 1001 as shown in FIG. 52B. The thermally foaming sheet 73 includes the sheet main body 74 of sheet shape and the numerous foaming particles 75 that are kneaded into the sheet main body 74.

Figure 52C:
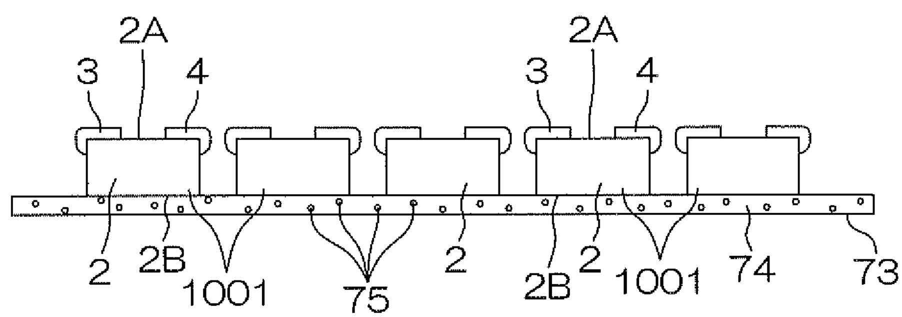

The adhesive force of the sheet main body 74 is stronger than the adhesive force at the adhesive surface 72 of the supporting tape 71. Thus, after the thermally foaming sheet 73 has been adhered onto the rear surfaces 2B of the substrates 2 of the respective chip parts 1001, the supporting tape 71 is peeled off from the respective chip parts 1001 to transfer the chip parts 1001 onto the thermally foaming sheet 73 as shown in FIG. 52C. If ultraviolet rays are irradiated onto the supporting tape 71 in this process (see the dotted arrows in FIG. 52B), the adhesive property of the adhesive surface 72 weakens and the supporting tape 71 can be peeled off easily from the respective chip parts 1001.

Figure 52D:
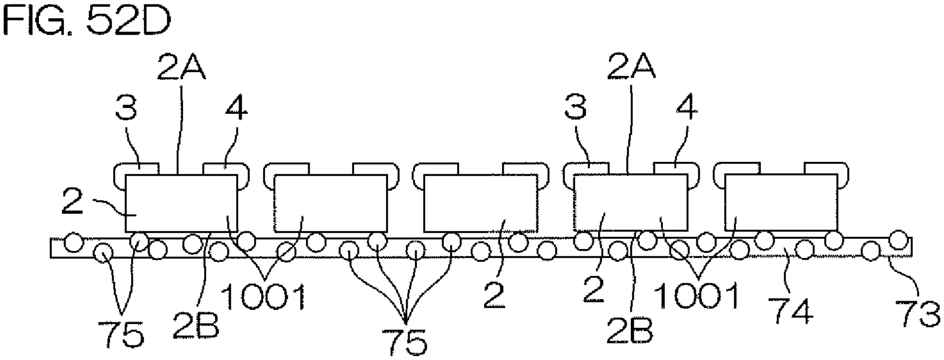

Next, the thermally foaming sheet 73 is heated. Thereby, in the thermally foaming sheet 73, the respective thermally foaming particles 75 in the sheet main body 74 are made to foam and swell out from the front surface of the sheet main body 74 as shown in FIG. 52D. Consequently, the area of contact of the thermally foaming sheet 73 and the rear surfaces 2B of the substrates 2 of the respective chip parts 1001 decreases and all of the chip parts 1001 peel off (fall off) naturally from the thermally foaming sheet 73. The chip parts 1001 that are thus recovered are housed in housing spaces formed in an embossed carrier tape (not shown). In this case, the processing time can be reduced in comparison to a case where the chip parts 1001 are peeled off one-by-one from the supporting tape 71 or the thermally foaming sheet 73. As a matter of course, in the state where the plurality of chip parts 1001 are adhered to the supporting tape 71 (see FIG. 52A), a predetermined number of the chip parts 1001 may be peeled off at a time directly from the supporting tape 71 without using the thermally foaming sheet 73. The embossed carrier tape in which the chip parts 1001 are housed is then placed in an automatic mounting machine. Each chip part 1001 is recovered individually by being suctioned by the suction nozzle 76 included in the automatic mounting machine and thereafter mounted on the mounting substrate 9.

Figure 53A:
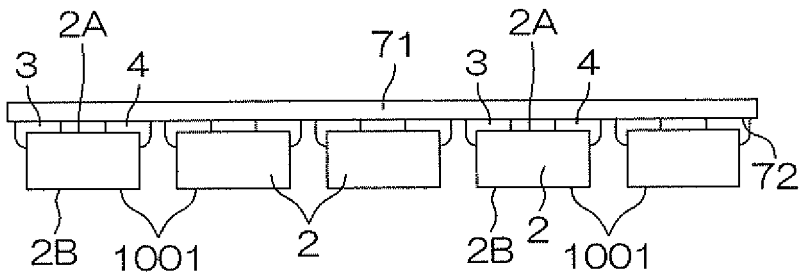
FIG. 53A to FIG. 53C are illustrative sectional views of a chip part recovery process (modification example) performed after the process of FIG. 49H.
Figure 53B:
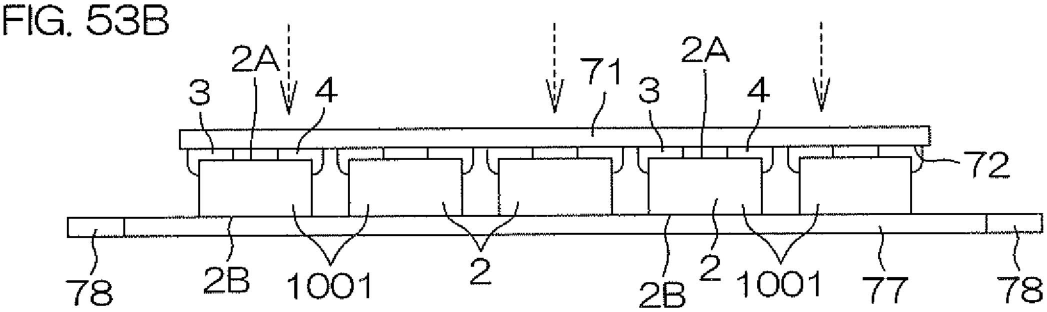
Figure 53C:
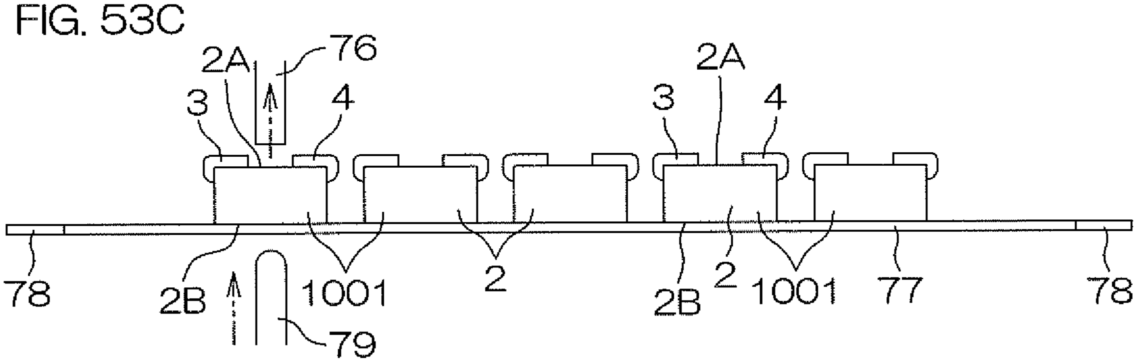

The respective chip parts 1001 may also be recovered by another method shown in FIG. 53A to FIG. 53C.

FIG. 53A to FIG. 53C are illustrative sectional views of a process (modification example) for recovering the chip parts 1001 after the process of FIG. 49H.

As in FIG. 52A, FIG. 53A shows a state where the plurality of chip parts 1001, which have been separated into individual chips, continue to be adhered to the supporting tape 71. In this state, the transfer tape 77 is adhered onto the rear surfaces 2B of the substrates 2 of the respective chip parts 1001 as shown in FIG. 53B. The transfer tape 77 has a stronger adhesive force than the adhesive surface 72 of the supporting tape 71. Therefore, after the transfer tape 77 has been adhered onto the respective chip parts 1001, the supporting tape 71 is peeled off from the respective chip parts 1001 as shown in FIG. 53C. In this process, ultraviolet rays (see the dotted arrows in FIG. 53B) may be irradiated onto the supporting tape 71 to weaken the adhesive property of the adhesive surface 72 as described above.

Frames 78 installed in the automatic mounting machine are adhered to both ends of the transfer tape 77. The frames 78 at both sides are enabled to move in directions of approaching each other or separating from each other. When after the supporting tape 71 has been peeled off from the respective chip parts 1001, the frames 78 at both sides are moved in directions of separating from each other, the transfer tape 77 elongates and becomes thin. The adhesive force of the transfer tape 77 is thereby weakened, making it easier for the respective chip parts 1001 to become peeled off from the transfer tape 77. When in this state, the suction nozzle 76 of the automatic mounting machine is directed toward the element forming surface 2A side of a chip part 1001, the chip part 1001 becomes peeled off from the transfer tape 77 and suctioned onto the suction nozzle 76 by the suction force generated by the automatic mounting machine (suction nozzle 76). When in this process, the projection 79 shown in FIG. 53C pushes the chip part 1001 up toward the suction nozzle 76 from the opposite side of the suction nozzle 76 and via the transfer tape 77, the chip part 1001 can be peeled off smoothly from the transfer tape 77.

Figure 54:
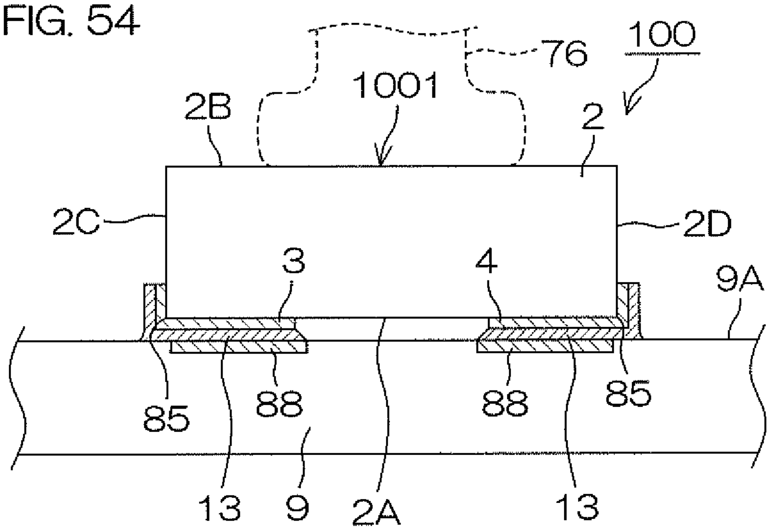
FIG. 54 is a schematic sectional view of a circuit assembly with which the chip part shown in FIG. 42 is mounted on a mounting substrate.
Figure 55:
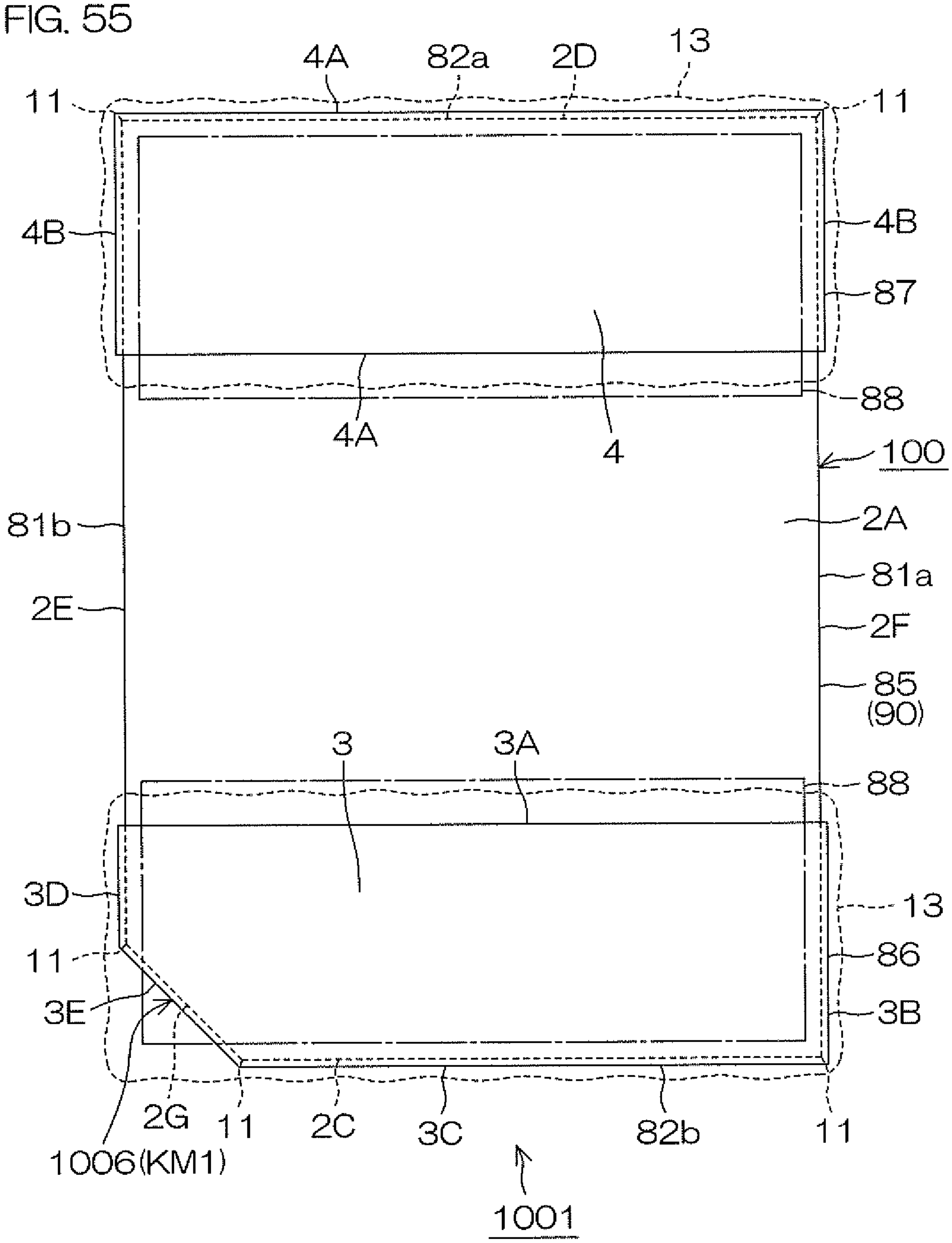
FIG. 55 is a schematic plan view of the circuit assembly shown in FIG. 54 as viewed from an element forming surface side of the chip part.

FIG. 54 is a schematic sectional view of the circuit assembly 100 in a state where the chip part 1001 is mounted on the mounting substrate 9. FIG. 55 is a schematic plan view, as viewed from the element forming surface 2A side, of the circuit assembly 100.

The chip part 1001 is mounted on the mounting substrate 9 as shown in FIG. 54. The chip part 1001 and the mounting substrate 9 in this state constitute the circuit assembly 100. An upper surface of the mounting substrate 9 in FIG. 54 is the mounting surface 9A. The pair (two) of lands 88, connected to an internal circuit (not shown) of the mounting substrate 9, are formed on the mounting surface 9A. Each land 88 is formed, for example, of Cu. On a front surface of each land 88, the solder 13 is provided so as to project from the front surface.

The automatic mounting machine moves the suction nozzle 76, in the state of suctioning the chip part 1001, to the mounting substrate 9. In this process, a substantially central portion in the long direction of the rear surface 2B is suctioned onto the suction nozzle 76. As mentioned above, the first and second connection electrodes 3 and 4 are provided only on one surface (the element forming surface 2A) and the element forming surface 2A side end portions of the side surfaces 2C to 2G of the chip part 1001 and therefore with the chip part 1001, the rear surface 2B is a flat surface without electrodes (unevenness). The flat rear surface 2B can thus be suctioned onto the suction nozzle 76 when the chip part 1001 is to be suctioned by the suction nozzle 76 and moved. In other words, with the flat rear surface 2B, a margin of the portion that can be suctioned by the suction nozzle 76 can be increased. The chip part 1001 can thereby be suctioned reliably by the suction nozzle 76 and the chip part 1001 can be conveyed reliably to a position above the mounting substrate 9 without dropping off from the suction nozzle 76 midway. Above the mounting substrate 9, the element forming surface 2A of the chip part 1001 and the mounting surface 9A of the mounting substrate 9 face each other. In this state, the suction nozzle 76 is lowered and pressed against the mounting substrate 9 to make the first connection electrode 3 of the chip part 1001 contact the solder 13 on one land 88 and the second connection electrode 4 contact the solder 13 on the other land 88.

When the solders 13 are then heated in a reflow process, the solders 13 melt. Thereafter, when the solders 13 become cooled and solidified, the first connection electrode 3 and the one land 88 become bonded via the solder 13 and the second connection electrode 4 and the other land 88 become bonded via the solder 13. That is, each of the two lands 88 is solder-bonded to the corresponding electrode among the first and second connection electrodes 3 and 4. Mounting (flip-chip connection) of the chip part 1001 onto the mounting substrate 9 is thereby completed and the circuit assembly 100 is completed. At this point, the Au layer 35 (gold plating) is formed on the frontmost surfaces of the first and second connection electrodes 3 and 4 that function as the external connection electrodes of the chip part 1001. Excellent solder wettability and high reliability can thus be achieved in the process of mounting the chip part 1001 onto the mounting substrate 9.

In the circuit assembly 100 in the completed state, the element forming surface 2A of the chip part 1001 and the mounting surface 9A of the mounting substrate 9 extend parallel while facing each other across a gap (see also FIG. 55). The dimension of the gap corresponds to the total of the thickness of the portion of the first connection electrode 3 or the second connection electrode 4 projecting from the element forming surface 2A and the thickness of the solders 13.

As shown in FIG. 54, in a sectional view, the first and second connection electrodes 3 and 4 are, for example, formed to substantially L-like shapes with front surface portions on the element forming surface 2A and side surface portions on the side surfaces 2C, 2D, and 2G being made integral. Therefore, when the circuit assembly 100 (to be accurate, the portion of bonding of the chip part 1001 and the mounting substrate 9) is viewed from the direction of a normal to the mounting surface 9A (and the element forming surface 2A) (the direction orthogonal to these surfaces) as shown in FIG. 55, the solder 13 bonding the first connection electrode 3 and the one land 88 is adsorbed not only to the front surface portion but also to the side surface portions of the first connection electrode 3. Similarly, the solder 13 bonding the second connection electrode 4 and the other land 88 is adsorbed not only to the front surface portion but also to the side surface portions of the second connection electrode 4.

Thus, with the chip part 1001, the first connection electrode 3 is formed to integrally cover the side surfaces 2C, 2E, 2F, and 2G of the substrate 2, and the second connection electrode 4 is formed to integrally cover the side surfaces 2D, 2E, and 2F of the substrate 2. That is, the electrodes are formed on the side surfaces 2C to 2G in addition to the element forming surface 2A of the substrate 2 and therefore the adhesion area for soldering the chip part 1001 onto the mounting substrate 9 can be enlarged. Consequently, the amount of solder 13 adsorbed to the first connection electrode 3 and the second connection electrode 4 can be increased to improve the adhesion strength.

Also, as shown in FIG. 55, the solder 13 is adsorbed so as to extend from the element forming surface 2A to the side surfaces 2C to 2G of the substrate 2. Therefore, in the mounted state, the first connection electrode 3 is held by the solder 13 at the side surfaces 2C, 2E, 2F, and 2G and the second connection electrode 4 is held by the solder 13 at the three side surfaces 2D, 2E, and 2F so that all of the side surfaces 2C to 2G of the rectangular chip part 1001 can be fixed by the solder 13. The mounting form of the chip part 1001 can thus be stabilized.

With circuit assemblies 100 having the chip part 1001 mounted on the mounting substrate 9, only those that are judged to be "non-defective" upon undergoing a substrate appearance inspection process are shipped. As judgment items in the substrate appearance inspection process, the inspection of the state of soldering on the mounting substrate 9, the polarity inspection of the chip 1001, etc., are performed by the automatic optical inspection machine (AOI) 91 as the inspection machine.

Figure 56:
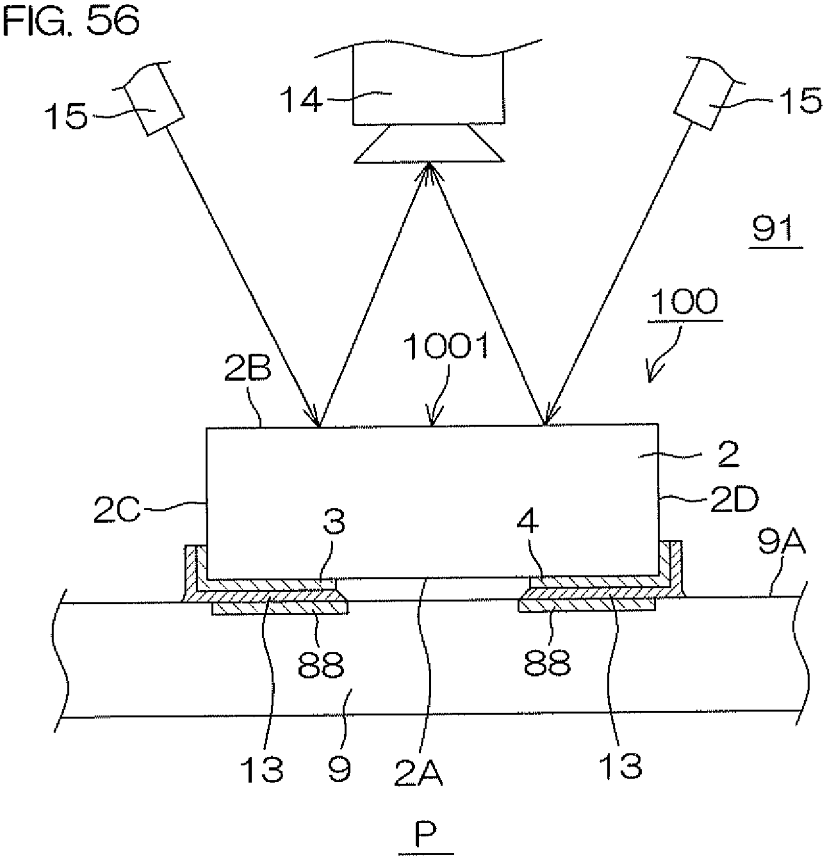
FIG. 56 is a diagram for describing a polarity inspection process of the chip part shown in FIG. 42.
Figure 57:
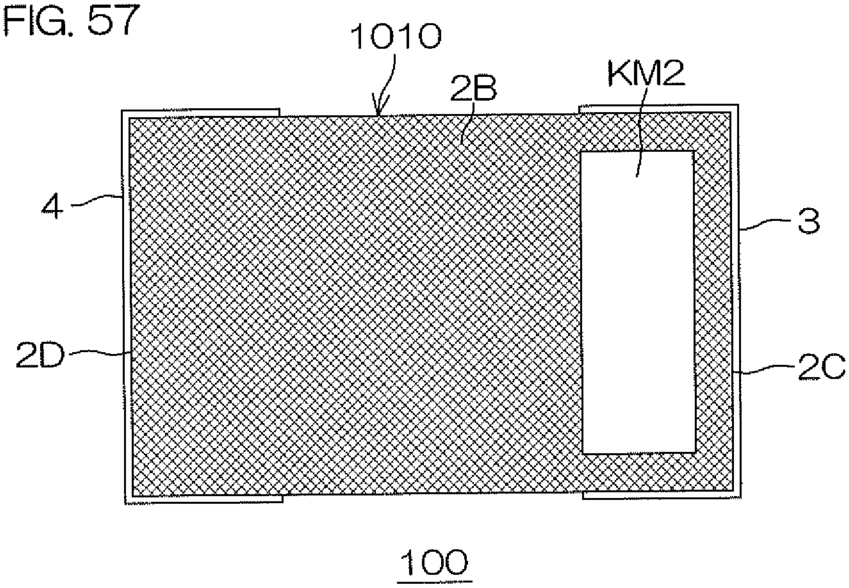
FIG. 57 is a schematic plan view of a chip part according to the reference example in a state of being mounted on the mounting substrate as viewed from a rear surface side.

FIG. 56 is a diagram for describing a polarity inspection process for the chip part 1001 shown in FIG. 42. FIG. 57 is a schematic plan view of a chip part 1010 according to a reference example in a state of being mounted on the mounting substrate 9 as viewed from the rear surface 2B side. FIG. 56 is a schematic sectional view, taken along the long direction of the chip part 1001, of the circuit assembly 100 in the state where the chip part 1001 is mounted on the mounting substrate 9.

The automatic optical inspection machine 91 is a machine that irradiates light onto an inspection object and makes a "non-defective" or "defective" judgment from image information detected by means of light reflected from the inspection object. More specifically, as shown in FIG. 56, at the part detection position P of the automatic optical inspection machine 91, the part recognizing camera 14 and the plurality of light sources 15 are disposed directly above the circuit assembly 100. The plurality of light sources 15 are disposed respectively in a periphery of the part recognizing camera 14. When the circuit assembly 100 is placed at the part detection position P, the automatic optical inspection machine 91 irradiates light from the light sources 15 in oblique directions toward the rear surface 2B of the chip part 1001 and detects, by means of the part recognizing camera 14, reflected light reflected by the rear surface 2B of the chip part 1001.

Here, as shown in FIG. 57, with the chip part 1010 according to the reference example, the chamfered portion 1006 is not formed in the substrate 2 and a cathode mark KM2 is formed (printed) as a marking on the rear surface 2B. Such a marking is formed by a marking apparatus that irradiates ultraviolet rays or a laser, etc., onto the rear surface 2B of the chip part 1010.

The polarity inspection of the chip part 1010 according to the reference example is performed, for example, according to whether or not the cathode mark KM2 (marking) is detected to be of a color (for example, white, blue, etc.) of not less than a value set in advance in a polarity inspection window at a predetermined position of the automatic optical inspection machine 91, and if the marking is detected as such, the "non-defective" judgment is made.

However, the chip part 1010 according to the reference example is not necessarily mounted in a horizontal attitude onto the mounting substrate 9 and there are cases where the chip part 1010 is mounted in an inclined attitude onto the mounting substrate 9. In this case, depending on the inclination angle, a portion of the light irradiated from the light sources 15 onto the chip part 1010 according to the reference example may be reflected outside the polarity window or the wavelength of the reflected light may change with respect to the incident light so that the detected color is recognized (misrecognized) to be a color of not more than the set value. This leads to a problem that a "defective" judgment is made despite the polarity direction of the first and second connection electrodes 3 and 4 being correct. Such a problem becomes more significant, the higher the specularity of the rear surface 2B of the chip part 1010 according to the reference example.

To prevent such misrecognition, the detection system (part recognizing camera 14, etc.) and the illumination system (light sources 15, etc.) of the automatic optical inspection machine 91 must be optimized according to each inspection object to improve the inspection precision and extra effort is thus required for the appearance inspection and productivity is decreased. Moreover, such effort becomes excessive as chip parts of even smaller size become desired.

On the other hand, with the chip part 1001 according to the first reference example of the present invention, the chamfered portion 1006 is formed as the cathode mark KM1 in the substrate 2 as shown in FIG. 42 and FIG. 43. Therefore, when the chip part 1001 is mounted on the mounting substrate 9, the respective positions of the first and second connection electrodes 3 and 4 can be confirmed based on the position of the chamfered portion 1006. The polarity direction of the first and second connection electrodes 3 and 4 can thereby be judged easily. Moreover, the polarity judgment is made not based on brightness or tint detected by the automatic optical inspection machine 91 but based on the shape of the chamfered portion 1006 that is unchanged even when the inclination of the chip part 1001 with respect to the mounting substrate 9 changes. Therefore, even if a mounting substrate 9, on which the chip part 1001 is mounted in an inclined attitude, and a mounting substrate 9, on which the chip part 1001 is mounted in a horizontal attitude, are mixed together in the polarity inspection process, the polarity direction can be judged with stable quality based on the chamfered portion 1006 and without having to optimize the detection system (part recognizing camera 14, etc.) of the automatic optical inspection machine 91 according to each mounting substrate 9.

Also, the chamfered portion 1006 is formed to have the chamfer width W2 (see FIG. 42) that is greater than 10 μm and therefore a portion at which the chamfered portion 1006 is formed and a portion at which it is not formed can be detected satisfactorily without having to use an automatic optical inspection machine of high precision (high resolution) in judging the polarity direction.

Also, there is no need to form a marking on the front surface or the rear surface of the chip part as index for judging the polarity direction and therefore there is no need to use a marking apparatus for forming a marking on the chip part by irradiation of ultraviolet rays or a laser, etc. The process for manufacturing the chip part can thus be simplified and equipment investment can be reduced. The productivity can thereby be improved as well.

Also, if the specularity of the rear surface 2B of the chip part 1001 is made high, the light made incident on the rear surface 2B from the automatic optical inspection machine 91 can be reflected with good efficiency. Therefore in the case where various mounting substrates 9 that differ in the condition of inclination of the chip part 1001 with respect to the mounting substrate 9 are to be inspected, the information (brightness or tint of reflected light) for distinguishing a certain inclination from another inclination can be utilized satisfactorily by the automatic optical inspection machine 91. Consequently, the inclination of the chip part 1001 can be detected satisfactorily. In particular, if the rear surface 2B of the chip part 1001 has specularity, the information on the reflected light from the chip part 1001 can be omitted as an index for judging the polarity direction and the lowering of the precision of judgment of the polarity direction of the chip part 1001 due to such mirror-finishing of the rear surface 2B can be prevented.

Also, even when the chip part 1001 is mounted on the mounting substrate 9 in an attitude such that the rear surface 2B is directed downward (that is, an attitude such that the element forming surface 2A and the rear surface 2B are reversed), that mounting has been performed with the front and rear sides being reversed can be made known at once because the chip part 1001 has the asymmetrical shape (the shape that is neither line symmetrical nor point symmetrical) with the one corner portion being chamfered. A front/rear judgment process by an automatic mounting machine, etc., may be performed in mounting the chip part 1001 onto the mounting substrate 9. Even in this case, the front/rear judgment can be made based on the presence or non-presence of the chamfered portion 1006.

As described above, with the arrangement of the chip part 1001, the polarity direction can be judged with good precision while suppressing the decrease of productivity, and therefore the circuit assembly 100 having a highly reliable electronic circuit without error in the polarity direction of the chip part 1001 can be provided. An electronic device that includes such a circuit assembly 100 can also be provided.

Second Reference Example

Figure 58:
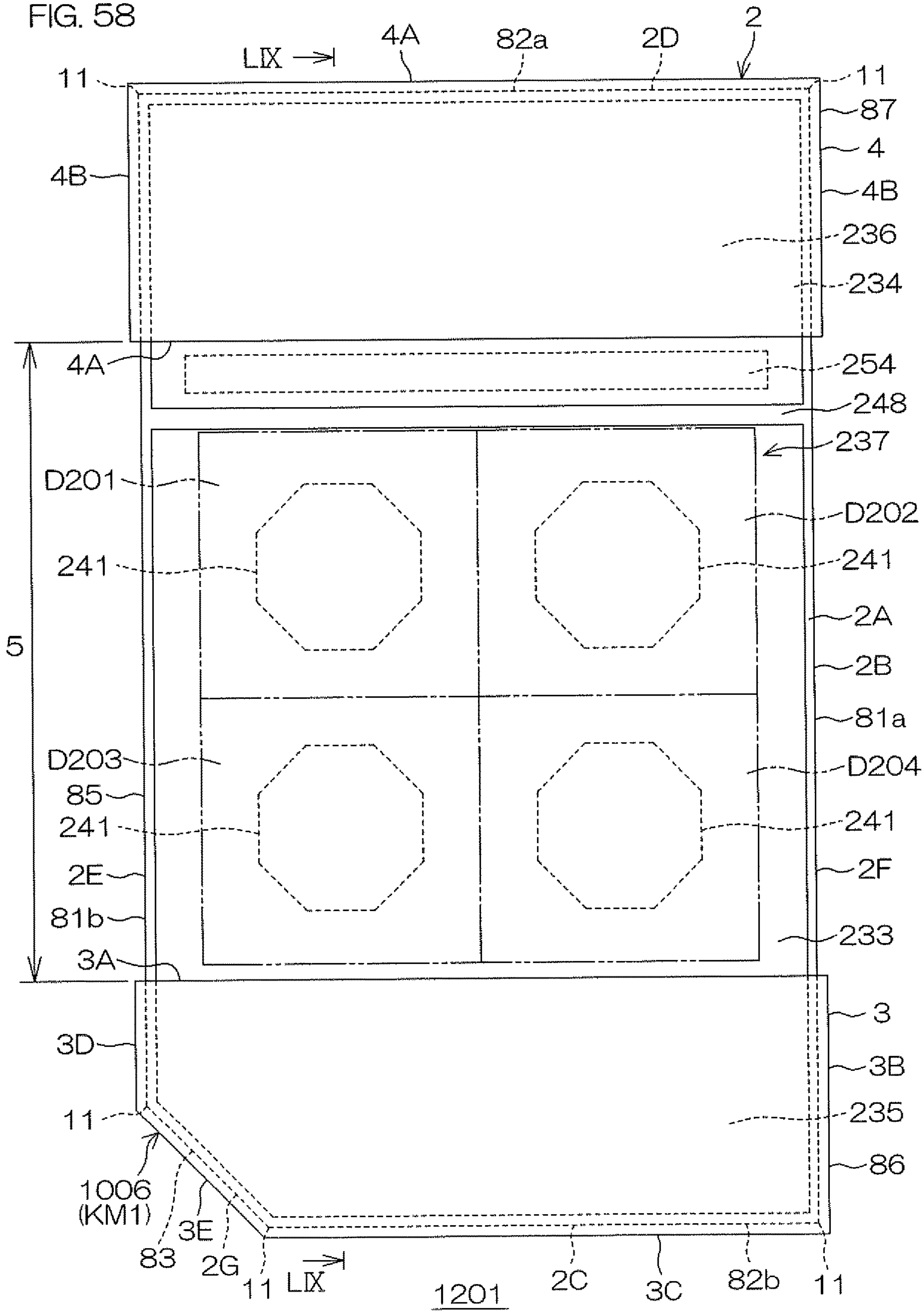
FIG. 58 is a plan view for describing the arrangement of a chip part according to a second reference example.
Figure 59:
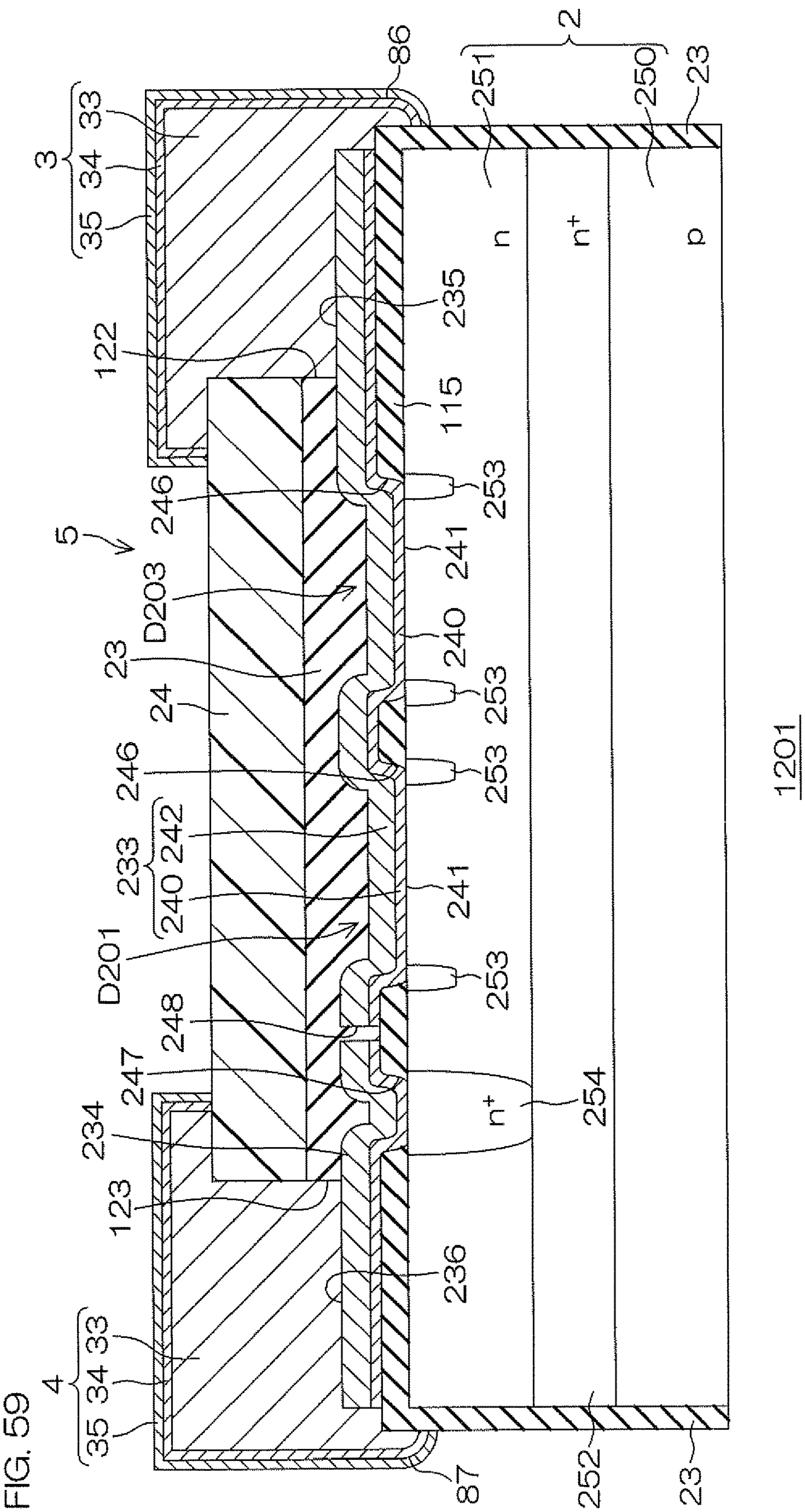
FIG. 59 is a sectional view taken along section line LIX-LIX shown in FIG. 58.

FIG. 58 is a plan view for describing the arrangement of a chip part 1201 according to a second reference example. FIG. 59 is a sectional view taken along section line LIX-LIX shown in FIG. 58. With FIG. 58 to FIG. 59, a description shall be provided with portions corresponding to the respective portions shown in FIG. 1 to FIG. 57 being provided with the same reference symbols.

The chip part 1201 includes the cathode electrode film 233 and the anode electrode film 234 formed on the substrate 2 and the plurality of diode cells D201 to D204 connected in parallel between the cathode electrode film 233 and the anode electrode film 234. The cathode pad 235 and the anode pad 236 are disposed at respective end portions of the substrate 2 in the long direction. The diode cell region 237 of rectangular shape is set between the cathode pad 235 and the anode pad 236. The plurality of diode cells D201 to D204 are aligned two-dimensionally inside the diode cell region 237. In the present reference example, the plurality of diode cells D201 to D204 are aligned at equal intervals in a matrix along the long direction and the short direction of the substrate 2.

Each of the diode cells D201 to D204 is constituted of a rectangular region and has the Schottky junction region 241 of polygonal shape (a regular octagonal shape in the present reference example) in a plan view in the interior of the rectangular region. The Schottky metal 240 is disposed so as to contact the respective Schottky junction regions 241. That is, the Schottky metal 240 is in a Schottky junction with the substrate 2 in the Schottky junction regions 241.

In the present reference example, the substrate 2 has the p-type silicon substrate 250 and the n-type epitaxial layer 251 grown epitaxially thereon. The $n^+$-type embedded layer 252, which is formed by introducing an n-type impurity (for example, arsenic) and is formed on the front surface of the p-type silicon substrate 250, may be formed in the substrate 2 as shown in FIG. 59. The Schottky junction region 241 is set at the front surface of the n-type epitaxial layer 251 and the Schottky junction is formed by the Schottky metal 240 being joined to the front surface of the n-type epitaxial layer 251. The guard ring 253 is formed at a periphery of the Schottky junction region 241 to suppress leakage at the contact edge.

The Schottky metal 240 may be made, for example, of Ti or TiN, and the cathode electrode film 233 is arranged by laminating the metal film 242 of AlSi alloy, etc., on the Schottky metal 240. Although the Schottky metal 240 may be separated according to each of the diode cells D201 to D204, in the present reference example, the Schottky metal 240 is formed so as to be in contact in common with the respective Schottky junction regions 241 of the plurality of diode cells D201 to D204.

The $n^+$-type well 254, reaching from the front surface of the n-type epitaxial layer 251 to the $n^+$-type embedded layer 252, is formed in a region of the n-type epitaxial layer 251 that avoids the Schottky junction regions 241. The anode electrode film 234 is formed so as to form an ohmic contact with the front surface of the $n^+$-type well 254. The anode electrode film 234 may be constituted of an electrode film of the same arrangement as the cathode electrode film 233.

The insulating film 115 is formed on the front surface of the n-type epitaxial layer 251. The contact holes 246, corresponding to the Schottky junction regions 241, and the contact hole 247, exposing the $n^+$-type well 254, are formed in the insulating film 115. The cathode electrode film 233 is formed so as to cover the insulating film 115, reaches the interiors of the contact holes 246, and is in Schottky junction with the n-type epitaxial layer 251 in the contact holes 246. On the other hand, the anode electrode film 234 is formed on the insulating film 115, extends into the contact hole 247, and is in ohmic contact with the $n^+$-type well 254 inside the contact hole 247. The cathode electrode film 233 and the anode electrode film 234 are separated by the slit 248.

The passivation film 23 is formed in the same arrangement as in the first reference example so as to cover the element forming surface 2A (upper sides of the cathode electrode film 233 and the anode electrode film 234) and the side surfaces 2C to 2G. Further, the resin film 24 is formed so as to cover the passivation film 23. The notched portion 122, which exposes a partial region of the front surface of the cathode electrode film 233 that is to be the cathode pad 235, is formed to penetrate through the passivation film 23 and the resin film 24. Further, the notched portion 123 is formed to penetrate through the passivation film 23 and the resin film 24 so as to expose a partial region of the front surface of the anode electrode film 234 that is to be the anode pad 236. The first and second connection electrodes 3 and 4 are formed in the same arrangements as in the first reference example on the cathode pad 235 and the anode pad 236 exposed from the notched portions 122 and 123.

With this arrangement, the cathode electrode film 233 is connected in common to the Schottky junction regions 241 that the diode cells D201 to D204 have respectively. Also, the anode electrode film 234 is connected to the n-type epitaxial layer 251 via the $n^+$-type well 254 and the $n^+$-type embedded layer 252 and is thus connected in common and parallel to the Schottky junction regions 241 formed in the plurality of diode cells D201 to D204. A plurality of Schottky barrier diodes, having the Schottky junction regions 241 of the plurality of diode cells D201 to D204, are thus connected in parallel between the cathode electrode film 233 and the anode electrode film 234.

The same effects as the effects described for the first reference example can thus be exhibited by the present reference example as well. Also, the plurality of diode cells D201 to D204 respectively have the mutually separated Schottky junction regions 241, and therefore the total extension of the peripheral length of the Schottky junction regions 241 (peripheral length of the Schottky junction regions 241 at the front surface of the n-type epitaxial layer 251) is made large. Concentration of electric field can thereby be suppressed and the ESD resistance can thus be improved. That is, even when the chip part 1201 is to be formed compactly, the total peripheral length of the Schottky junction regions 241 can be made large, thereby enabling both downsizing of the chip part 1201 and securing of the ESD resistance to be achieved at the same time.

Third Reference Example

Figure 60:
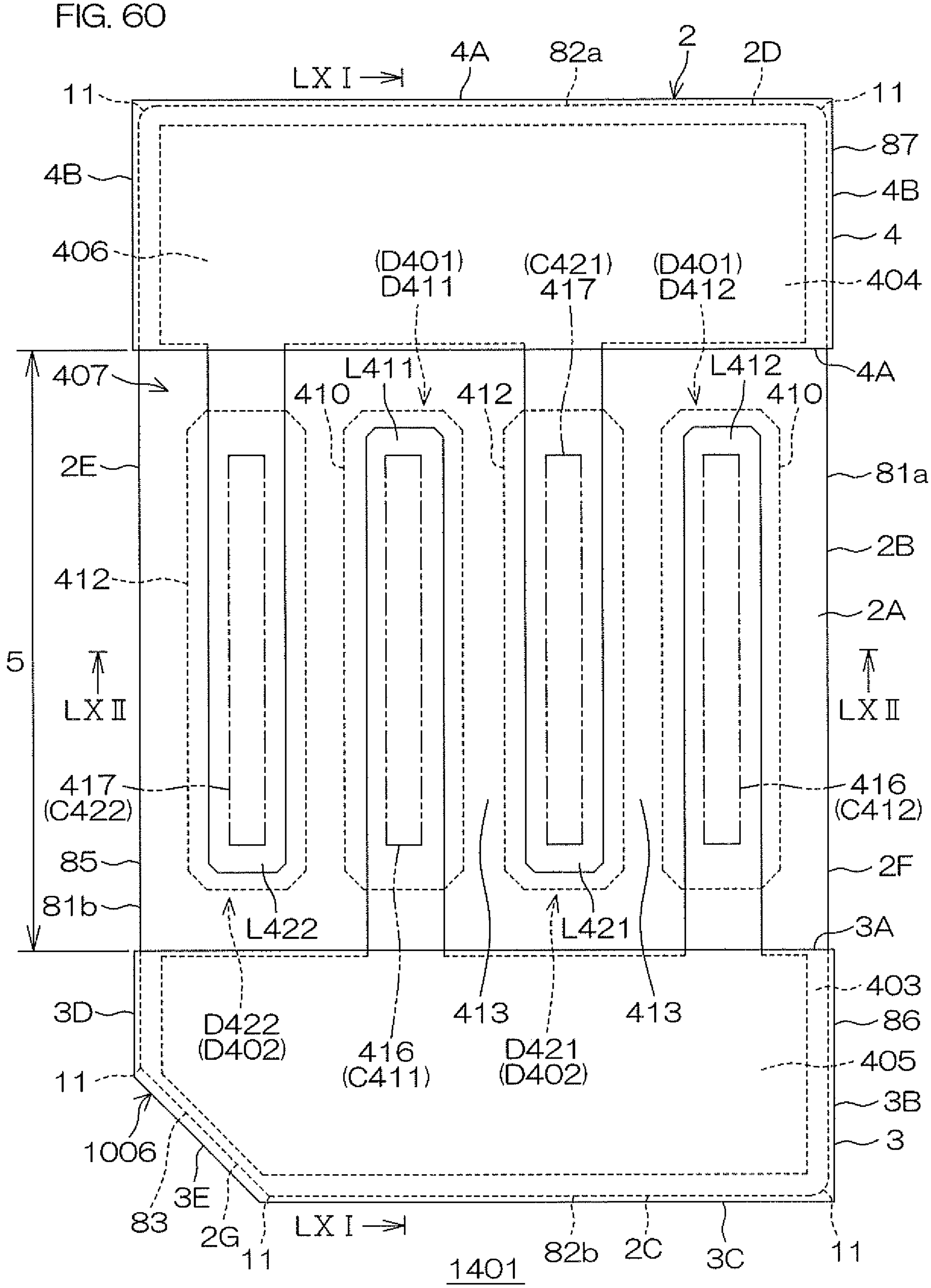
FIG. 60 is a plan view of a chip part according to a third reference example.
Figure 61:
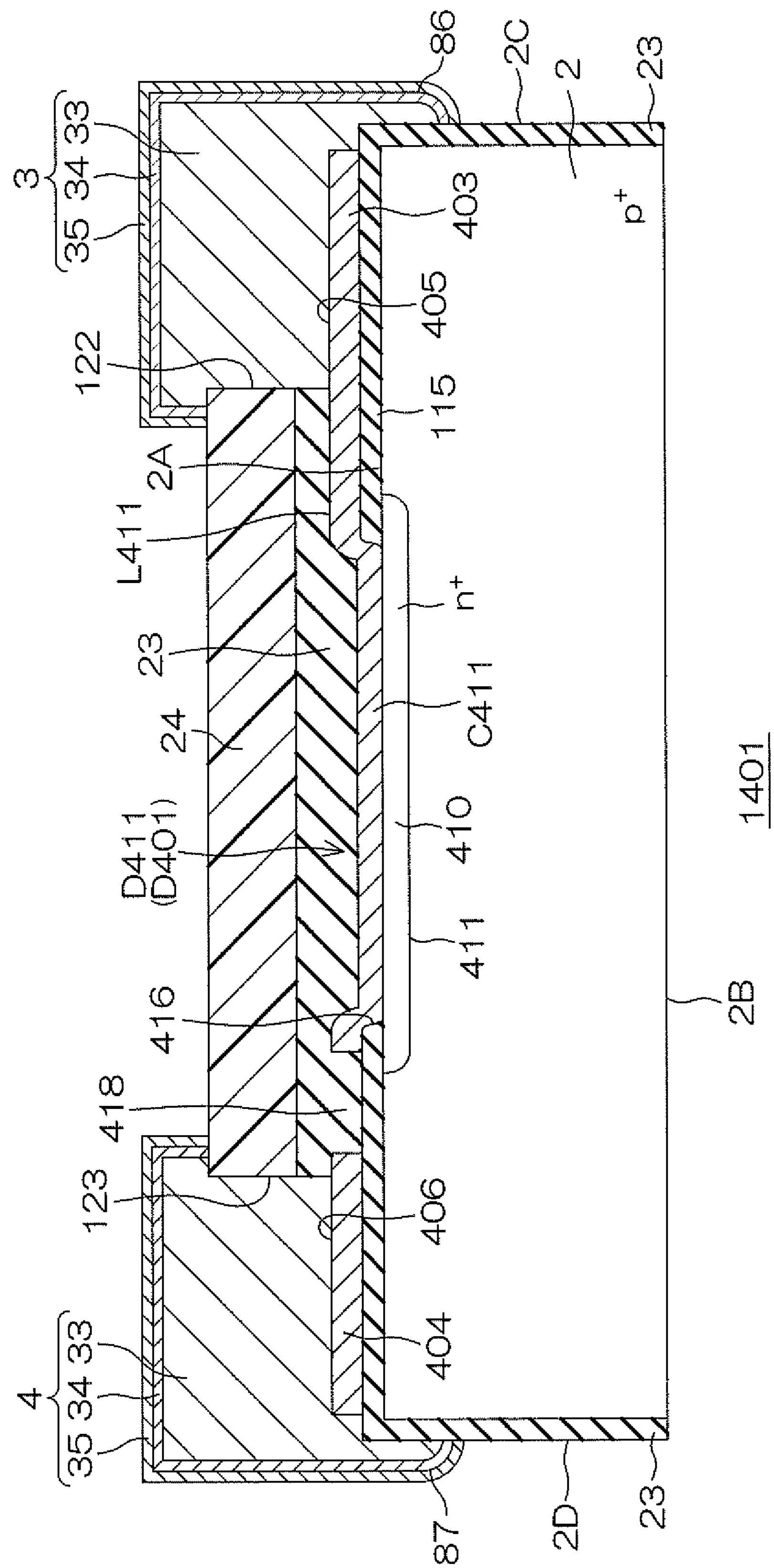
FIG. 61 is a sectional view taken along section line LXI-LXI shown in FIG. 60.
Figure 62:
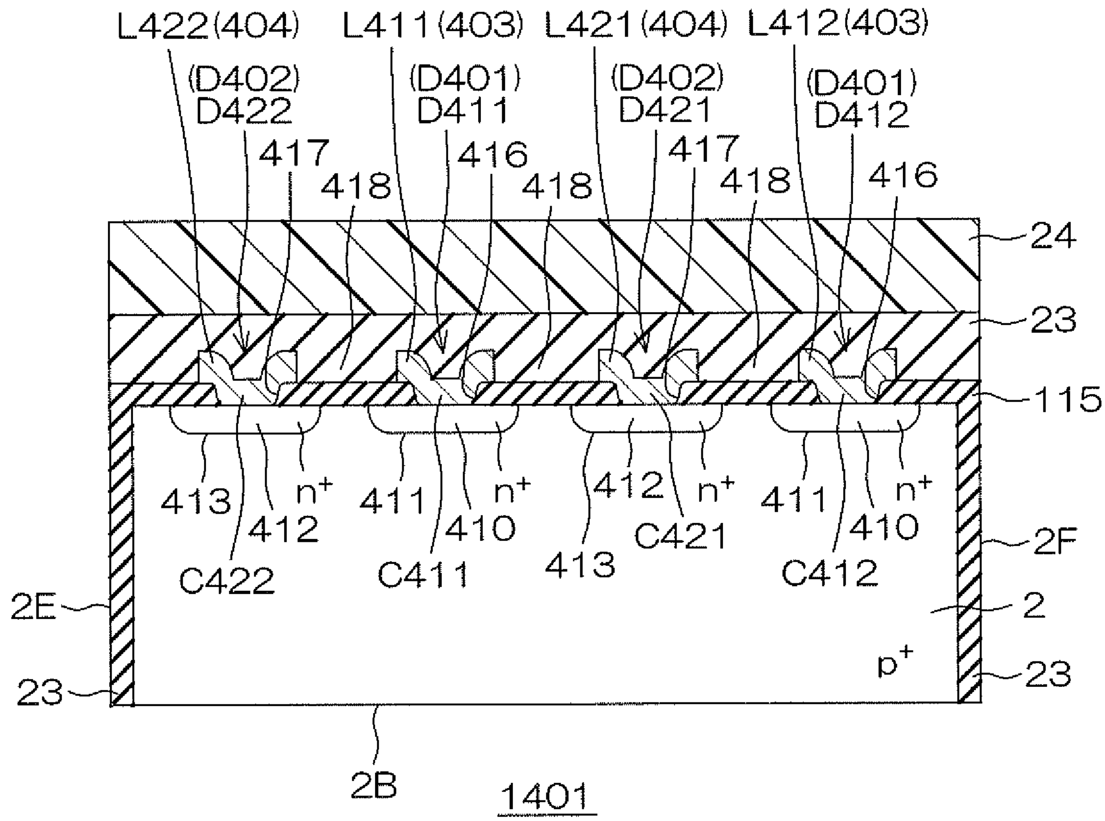
FIG. 62 is a sectional view taken along section line LXII-LXII shown in FIG. 60.

FIG. 60 is a plan view of a chip part 1401 according to a third reference example. FIG. 61 is a sectional view taken along section line LXI-LXI shown in FIG. 60. FIG. 62 is a sectional view taken along section line LXII-LXII shown in FIG. 60.

A point of difference of the chip part 1401 according to the third reference example with respect to the chip part 1001 according to the first reference example described above is that in place of the diode cells D101 to D104, first and second Zener diodes D401 and D402 are formed as the circuit elements formed in the element region 5. Arrangements of other portions are equivalent to the arrangements in the chip part 1001 according to the first reference example. With FIG. 60 to FIG. 62, a description shall be provided with portions corresponding to the respective portions shown in FIG. 1 to FIG. 59 being provided with the same reference symbols.

The chip part 1401 includes the substrate 2 (for example, a $p^+$-type silicon substrate), the first Zener diode D401 formed on the substrate 2, the second Zener diode D402 formed on the substrate 2 and connected anti-serially to the first Zener diode D401, the first connection electrode 3 connected to the first Zener diode D401, and the second connection electrode 4 connected to the second Zener diode D402. The first Zener diode D401 is arranged from a plurality of Zener diodes D411 and D412. The second Zener diode D402 is arranged from a plurality of Zener diodes D421 and D422.

The first connection electrode 3 connected to the first electrode film 403 and the second connection electrode 4 connected to the second electrode film 404 are disposed at respective end portions of the element forming surface 2A according to the third reference example. The diode forming region 407 is provided in the element forming surface 2A between the first and second connection electrodes 3 and 4. The diode forming region 407 is formed to a rectangle in the present reference example.

Figure 63:
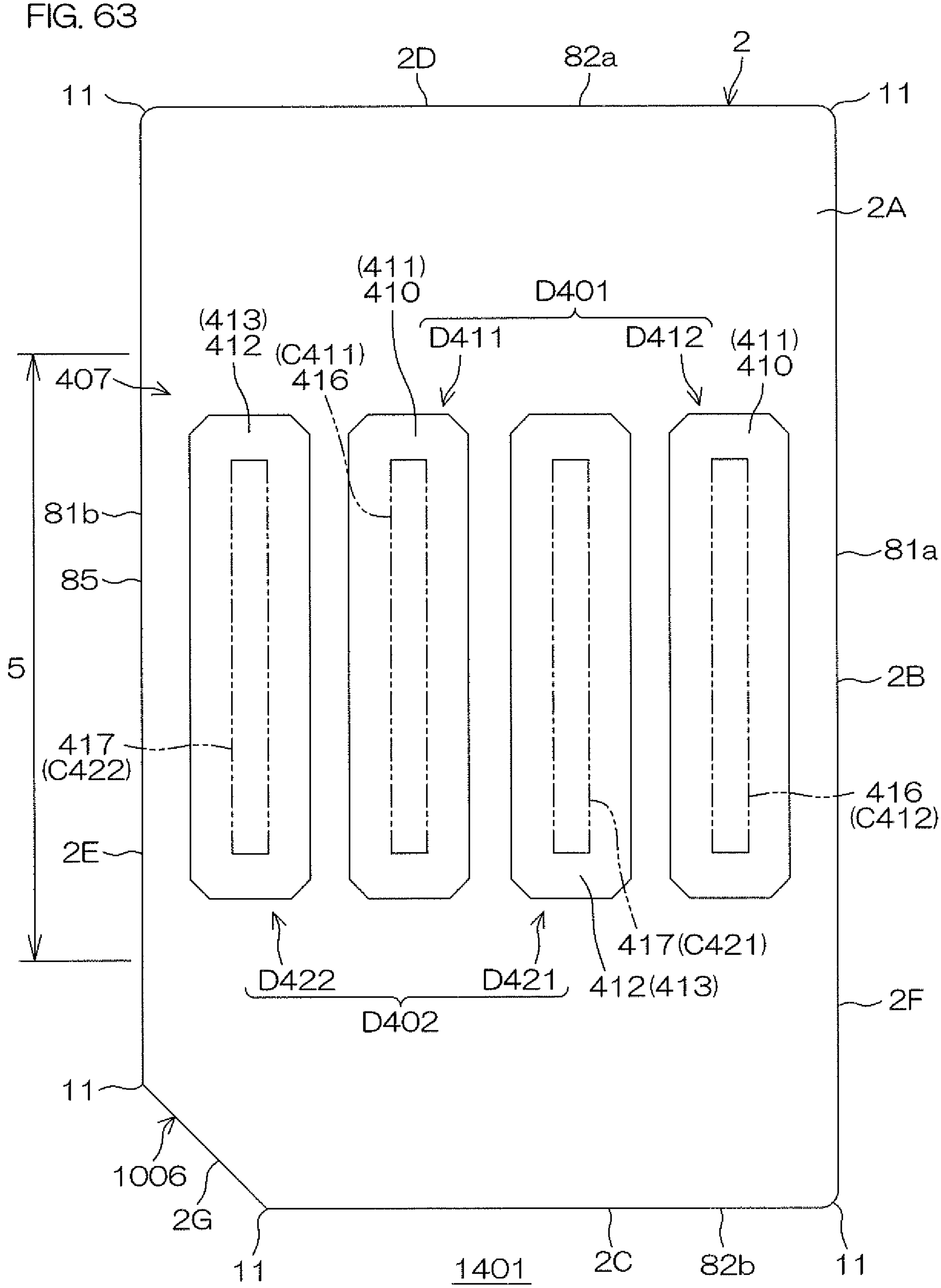
FIG. 63 is a plan view of the chip part shown in FIG. 60 with connection electrodes and the arrangement formed thereon being removed to show the structure of a front surface of a semiconductor substrate.

FIG. 63 is a plan view of the chip part 1401 shown in FIG. 60 with the first and second connection electrodes 3 and 4 and the arrangement formed thereon being removed to show the structure of the front surface (element forming surface 2A) of the substrate 2.

Referring to FIG. 60 and FIG. 63, the plurality of first $n^+$-type diffusion regions (hereinafter referred to as "first diffusion regions 410"), respectively forming the p-n junction regions 411 with the substrate 2, are formed in a surface layer region of the substrate 2 ($p^+$-type semiconductor substrate). Also, the plurality of second $n^+$-type diffusion regions (hereinafter referred to as "second diffusion regions 412"), respectively forming the p-n junction regions 413 with the substrate 2, are formed in the surface layer region of the substrate 2.

In the present reference example, two each of the first diffusion regions 410 and the second diffusion regions 412 are formed. With the four diffusion regions 410 and 412, the first diffusion regions 410 and the second diffusion regions 412 are aligned alternately and at equal intervals along the short direction of the substrate 2. Also, the four diffusion regions 410 and 412 are formed to extend longitudinally in a direction intersecting (in the present reference example, a direction orthogonal to) the short direction of the substrate 2. In the present reference example, the first diffusion regions 410 and the second diffusion regions 412 are formed to be equal in size and equal in shape. Specifically, in a plan view, the first diffusion regions 410 and the second diffusion regions 412 are formed to substantially rectangular shapes, each of which is long in the long direction of the substrate 2 and is cut at the four corners.

The two Zener diodes D411 and D412 are constituted by the respective first diffusion regions 410 and portions of the substrate 2 in the vicinities of the first diffusion regions 410, and the first Zener diode D401 is constituted by the two Zener diodes D411 and D412. The first diffusion regions 410 are separated according to each of the Zener diodes D411 and D412. The Zener diodes D411 and D412 are thereby made to respectively have the p-n junction regions 411 that are separated according to each Zener diode.

Similarly, the two Zener diodes D421 and D422 are constituted by the respective second diffusion regions 412 and portions of the substrate 2 in the vicinities of the second diffusion regions 412, and the second Zener diode D402 is constituted by the two Zener diodes D421 and D422. The second diffusion regions 412 are separated according to each of the Zener diodes D421 and D422. The Zener diodes D421 and D422 are thereby made to respectively have the p-n junction regions 413 that are separated according to each Zener diode.

As shown in FIG. 61 and FIG. 62, the insulating film 115 (omitted from illustration in FIG. 60) is formed on the element forming surface 2A of the substrate 2. First contact holes 416 respectively exposing front surfaces of the first diffusion regions 410 and second contact holes 417 exposing the front surfaces of the second diffusion regions 412 are formed in the insulating film 115. The first electrode film 403 and the second electrode film 404 are formed on the front surface of the insulating film 115.

The first electrode film 403 includes the lead-out electrode L411 connected to the first diffusion region 410 corresponding to the Zener diode D411, the lead-out electrode L412 connected to the first diffusion region 410 corresponding to the Zener diode D412, and the first pad 405 formed integral to the lead-out electrodes L411 and L412 (first lead-out electrodes). The first pad 405 is formed to a rectangle at one end portion of the element forming surface 2A. The first connection electrode 3 is connected to the first pad 405. The first connection electrode 3 is thereby connected in common to the lead-out electrodes L411 and L412.

The second electrode film 404 includes the lead-out electrode L421 connected to the second diffusion region 412 corresponding to the Zener diode D421, the lead-out electrode L422 connected to the second diffusion region 412 corresponding to the Zener diode D422, and the second pad 406 formed integral to the lead-out electrodes L421 and L422 (second lead-out electrodes). The second pad 406 is formed to a rectangle at one end portion of the element forming surface 2A. The second connection electrode 4 is connected to the second pad 406. The second connection electrode 4 is thereby connected in common to the lead-out electrodes L421 and L422. The second pad 406 and the second connection electrode 4 constitute an external connection portion of the second connection electrode 4.

The lead-out electrode L411 enters into the first contact hole 416 of the Zener diode D411 from the front surface of the insulating film 115 and forms an ohmic contact with the first diffusion region 410 of the Zener diode D411 inside the first contact hole 416. In the lead-out electrode L411, the portion bonded to the Zener diode D411 inside the first contact hole 416 constitutes the bonding portion C411. Similarly, the lead-out electrode L412 enters into the first contact hole 416 of the Zener diode D412 from the front surface of the insulating film 115 and forms an ohmic contact with the first diffusion region 410 of the Zener diode D412 inside the first contact hole 416. In the lead-out electrode L412, the portion bonded to the Zener diode D412 inside the first contact hole 416 constitutes the bonding portion C412.

The lead-out electrode L421 enters into the second contact hole 417 of the Zener diode D421 from the front surface of the insulating film 115 and forms an ohmic contact with the second diffusion region 412 of the Zener diode D421 inside the second contact hole 417. In the lead-out electrode L421, the portion bonded to the Zener diode D421 inside the second contact hole 417 constitutes the bonding portion C421. Similarly, the lead-out electrode L422 enters into the second contact hole 417 of the Zener diode D422 from the front surface of the insulating film 115 and forms an ohmic contact with the second diffusion region 412 of the Zener diode D422 inside the second contact hole 417. In the lead-out electrode L422, the portion bonded to the Zener diode D422 inside the second contact hole 417 constitutes the bonding portion C422. In the present reference example, the first electrode film 403 and the second electrode film 404 are made of the same material. In the present reference example, Al films are used as the electrode films 403 and 404.

The first electrode film 403 and the second electrode film 404 are separated by the slit 418. The lead-out electrode L411 is formed rectilinearly along a straight line passing above the first diffusion region 410 corresponding to the Zener diode D411 and leading to the first pad 405. Similarly, the lead-out electrode L412 is formed rectilinearly along a straight line passing above the first diffusion region 410 corresponding to the Zener diode D412 and leading to the first pad 405. Each of the lead-out electrodes L411 and L412 has a uniform width at all locations between the corresponding first diffusion region 410 and the first pad 405, and the respective widths are wider than the widths of the bonding portions C411 and C412. The widths of the bonding portions C411 and C412 are defined by the lengths in the direction orthogonal to the lead-out directions of the lead-out electrodes L411 and L412. Tip end portions of the lead-out electrodes L411 and L412 are shaped to match the planar shapes of the corresponding first diffusion regions 410. Base end portions of the lead-out electrodes L411 and L412 are connected to the first pad 405.

The lead-out electrode L421 is formed rectilinearly along a straight line passing above the second diffusion region 412 corresponding to the Zener diode D421 and leading to the second pad 406. Similarly, the lead-out electrode L422 is formed rectilinearly along a straight line passing above the second diffusion region 412 corresponding to the Zener diode D422 and leading to the second pad 406. Each of the lead-out electrodes L421 and L422 has a uniform width at all locations between the corresponding second diffusion region 412 and the second pad 406, and the respective widths are wider than the widths of the bonding portions C421 and C422. The widths of the bonding portions C421 and C422 are defined by the lengths in the direction orthogonal to the lead-out directions of the lead-out electrodes L421 and L422. Tip end portions of the lead-out electrodes L421 and L422 are shaped to match the planar shapes of the corresponding second diffusion regions 412. Base end portions of the lead-out electrodes L421 and L422 are connected to the second pad 406.

That is, the first and second connection electrodes 3 and 4 are formed in comb-teeth-like shapes in which the plurality of first lead-out electrodes L411 and L412 and the plurality of second lead-out electrodes L421 and L422 are mutually engaged. Also, the first connection electrode 3 plus the first diffusion regions 410 and the second connection electrode 4 plus the second diffusion regions 412 are arranged to be mutually symmetrical in a plan view. More specifically, the first connection electrode 3 plus the first diffusion regions 410 and the second connection electrode 4 plus the second diffusion regions 412 are arranged to be point symmetrical with respect to a center of gravity of the element forming surface 2A in a plan view.

The first connection electrode 3 plus the first diffusion regions 410 and the second connection electrode 4 plus the second diffusion regions 412 may also be regarded as being arranged to be practically line symmetrical. Specifically, the second lead-out electrode L422 at one of the long sides of the substrate 2 and the first lead-out electrode L411 adjacent thereto may be regarded as being at substantially the same position, and the first lead-out electrode L412 at the other long side of the substrate 2 and the second lead-out electrode L421 adjacent thereto may be regarded as being at substantially the same position. In this case, the first connection electrode 3 plus the first diffusion regions 410 and the second connection electrode 4 plus the second diffusion regions 412 may be regarded as being arranged to be line symmetrical with respect to a straight line parallel to the short direction of the element forming surface 2A and passing through the long direction center in a plan view. The slit 418 is formed so as to border the lead-out electrodes L411, L412, L421, and L422.

The passivation film 23 is formed in the same arrangement as in the first reference example so as to cover the element forming surface 2A (upper sides of the first electrode film 403 and the second electrode film 404) and the side surfaces 2C to 2G. Further, the resin film 24 is formed so as to cover the passivation film 23. The notched portion 122, which exposes a partial region of the front surface of the first electrode film 403 that is to be the first pad 405, is formed to penetrate through the passivation film 23 and the resin film 24. Further, the notched portion 123 is formed to penetrate through the passivation film 23 and the resin film 24 so as to expose a partial region of the front surface of the second electrode film 404 that is to be the second pad 406. The first and second connection electrodes 3 and 4 are formed in the same arrangements as in the first reference example on the first pad 405 and the second pad 406 exposed from the notched portions 122 and 123.

On the front surface of the first electrode film 403 (first pad 405), the passivation film 23 and the resin film 24 constitute a protective film of the chip part 1401 to suppress or prevent the entry of moisture to the first lead-out electrodes L411 and L412, the second lead-out electrodes L421 and L422, and the p-n junction regions 411 and 413 and also absorb impacts, etc., from the exterior, thereby contributing to improvement of the durability of the chip part 1401.

The first diffusion regions 410 of the plurality of Zener diodes D411 and D412 that constitute the first Zener diode D401 are connected in common to the first connection electrode 3 and are connected to the substrate 2, which is the p-type region in common to the Zener diodes D411 and D412. The plurality of Zener diodes D411 and D412 that constitute the first Zener diode D401 are thereby connected in parallel. Meanwhile, the second diffusion regions 412 of the plurality of Zener diodes D421 and D422 that constitute the second Zener diode D402 are connected to the second connection electrode 4 and are connected to the substrate 2, which is the p-type region in common to the Zener diodes D421 and D422. The plurality of Zener diodes D421 and D422 that constitute the second Zener diode D402 are thereby connected in parallel. The parallel circuit of the Zener diodes D421 and D422 and the parallel circuit of the Zener diodes D411 and D412 are connected anti-serially, and the bidirectional Zener diode is constituted by the anti-serial circuit.

Figure 64:
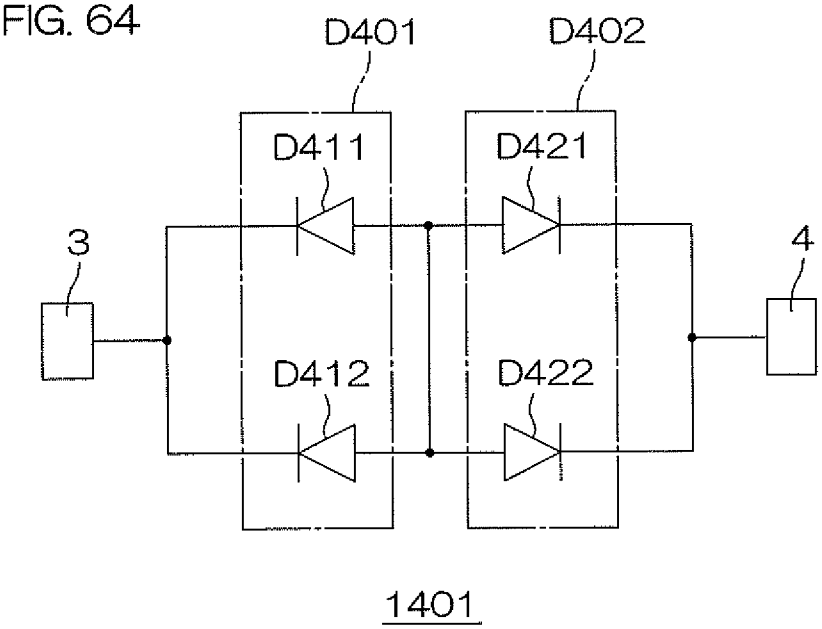
FIG. 64 is an electric circuit diagram of the electrical structure of the interior of the chip part shown in FIG. 60.

FIG. 64 is an electric circuit diagram of the electrical structure of the interior of the chip part 1401 shown in FIG. 60. The cathodes of the plurality of Zener diodes D411 and D412 constituting the first Zener diode D401 are connected in common to the first connection electrode 3 and the anodes thereof are connected in common to the anodes of the plurality of Zener diodes D421 and D422 constituting the second Zener diode D402. The cathodes of the plurality of Zener diodes D421 and D422 are connected in common to the second connection electrode 4. These thus function as a single bidirectional Zener diode as a whole.

With the present reference example, the first connection electrode 3 plus the first diffusion regions 410 and the second connection electrode 4 plus the second diffusion regions 412 are arranged to be mutually symmetrical, and characteristics for respective current directions can thus be made practically equal.

Figure 65A:
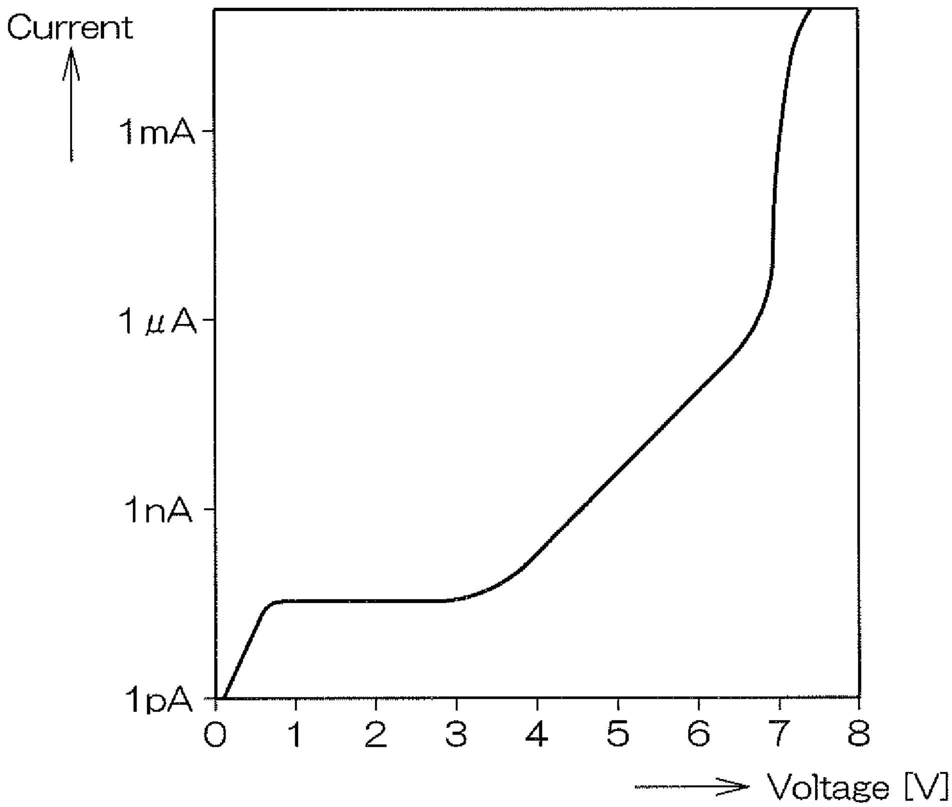
FIG. 65A is a graph of experimental results of measuring, for respective current directions, current vs. voltage characteristics of the chip part shown in FIG. 60.
Figure 65B:
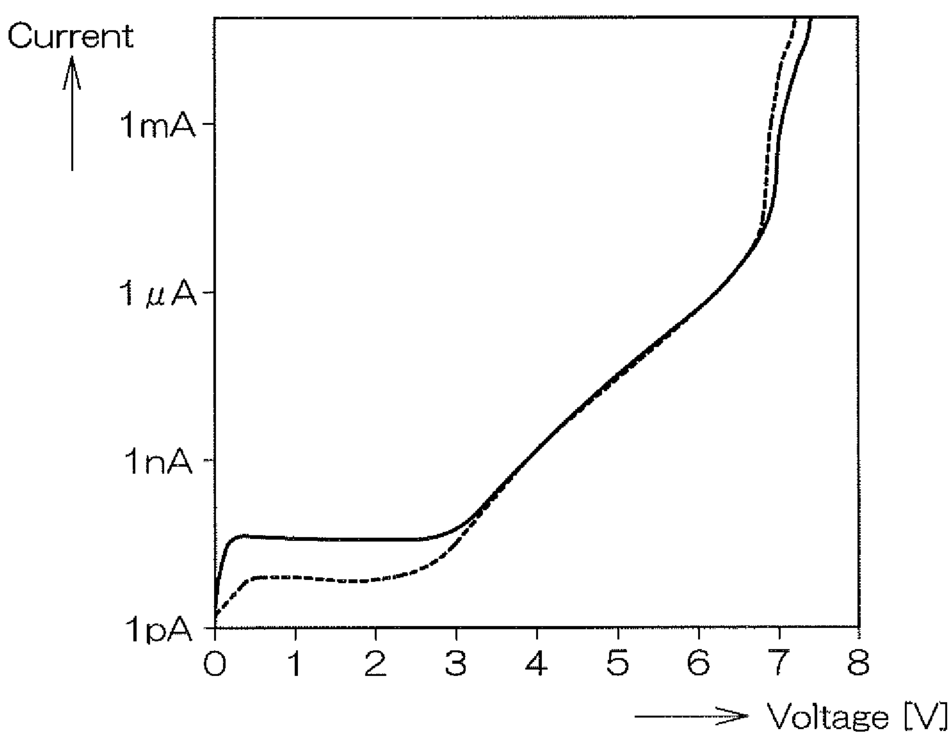
FIG. 65B is a graph of experimental results of measuring, for respective current directions, current vs. voltage characteristics of a bidirectional Zener diode chip, with which a first connection electrode plus first diffusion region and a second connection electrode plus second diffusion region are arranged to be mutually asymmetrical.

FIG. 65B is a graph of experimental results of measuring, for respective current directions, current vs. voltage characteristics of a bidirectional Zener diode chip, with which a first connection electrode plus first diffusion region and a second connection electrode plus second diffusion region are arranged to be mutually asymmetrical.

In FIG. 65B, a solid line indicates the current vs. voltage characteristics in a case of applying voltage to the bidirectional Zener diode with one electrode being a positive electrode and the other electrode being a negative electrode and a broken line indicates the current vs. voltage characteristics in a case of applying voltage to the bidirectional Zener diode with the one electrode being the negative electrode and the other electrode being the positive electrode. From the experimental results, it can be understood with the bidirectional Zener diode, with which the first connection electrode plus first diffusion region and the second connection electrode plus second diffusion region are arranged to be asymmetrical, the current vs. voltage characteristics are not equal for the respective current directions.

FIG. 65A is a graph of experimental results of measuring, for respective current directions, current vs. voltage characteristics of the chip part 1401 shown in FIG. 60.

With the bidirectional Zener diode according to the present reference example, both the current vs. voltage characteristics in the case of applying voltage with the first connection electrode 3 being the positive electrode and the second connection electrode 4 being the negative electrode and the current vs. voltage characteristics in the case of applying voltage with the second connection electrode 4 being the positive electrode and the first connection electrode 3 being the negative electrode were characteristics indicated by a solid line in FIG. 65A. That is, with the bidirectional Zener diode according to the present reference example, the current vs. voltage characteristics were practically equal for the respective current directions.

With the arrangement of the present reference example, the chip part 1401 has the first Zener diode D401 and the second Zener diode D402. The first Zener diode D401 has the plurality of Zener diodes D411 and D412 (first diffusion regions 410) and each of the Zener diodes D411 and D412 has the p-n junction region 411. The p-n junction regions 411 are separated according to each of the Zener diodes D411 and D412. Therefore "the peripheral length of the p-n junction regions 411 of the first Zener diode D401," that is, the total (total extension) of the peripheral lengths of the first diffusion regions 410 in the substrate 2 is long. The electric field can thereby be dispersed and prevented from concentrating at vicinities of the p-n junction regions 411, and the ESD resistance of the first Zener diode D401 can thus be improved. That is, even when the chip part 1401 is to be formed compactly, the total peripheral length of the p-n junction regions 411 can be made large, thereby enabling both downsizing of the chip part 1401 and securing of the ESD resistance to be achieved at the same time.

Similarly, the second Zener diode D402 has the plurality of Zener diodes D421 and D422 (second diffusion regions 412) and each of the Zener diodes D421 and D422 has the p-n junction region 413. The p-n junction regions 413 are separated according to each of the Zener diodes D421 and D422. Therefore "the peripheral length of the p-n junction regions 413 of the second Zener diode D402," that is, the total (total extension) of the peripheral lengths of the p-n junction regions 413 in the substrate 2 is long. The electric field can thereby be dispersed and prevented from concentrating at vicinities of the p-n junction regions 413, and the ESD resistance of the second Zener diode D402 can thus be improved. That is, even when the chip part 1401 is to be formed compactly, the total peripheral length of the p-n junction regions 413 can be made large, thereby enabling both downsizing of the chip part 1401 and securing of the ESD resistance to be achieved at the same time.

With the present reference example, the respective peripheral lengths of the p-n junction regions 411 of the first Zener diode D401 and the p-n junction regions 413 of the second Zener diode D402 are defined to be not less than 400 μm and not more than 1500 μm. More preferably, the respective peripheral lengths are defined to be not less than 500 μm and not more than 1000 μm.

As shall be described later using FIG. 66, a bidirectional Zener diode chip of high ESD resistance can be realized because the respective peripheral lengths are defined to be not less than 400 μm. Also, as shall be described later using FIG. 67, a bidirectional Zener diode chip with which the capacitance between the first connection electrode 3 and the second connection electrode 4 (inter-terminal capacitance) is small can be realized because the respective peripheral lengths are defined to be not more than 1500 μm. More specifically, a bidirectional Zener diode chip with an inter-terminal capacitance of not more than 30 [pF] can be realized. More preferably, the respective peripheral lengths are defined to be not less than 500 μm and not more than 1000 μm.

Figure 66:
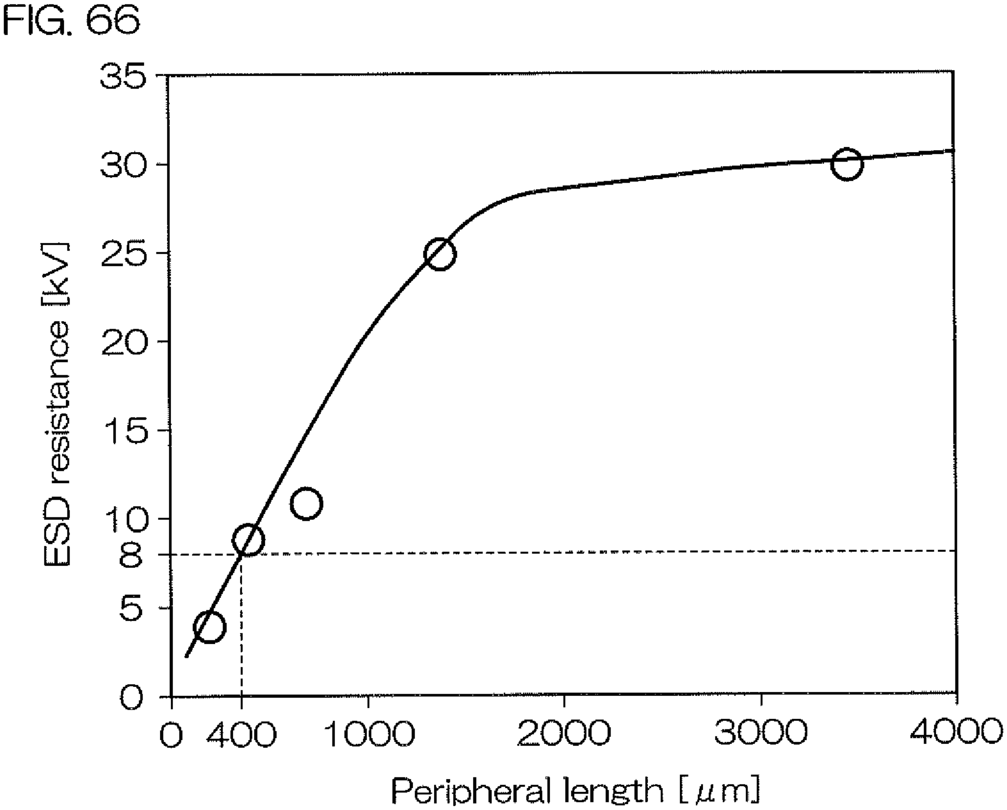
FIG. 66 is a graph of experimental results of measuring the ESD resistances of a plurality of samples that are differed in respective peripheral lengths of p-n junction regions of a first Zener diode and p-n junction regions of a second Zener diode by variously setting the number of lead-out electrodes (diffusion regions) and/or the sizes of the diffusion regions formed on a semiconductor substrate of the same area.

FIG. 66 is a graph of experimental results of measuring the ESD resistances of a plurality of samples that are differed in the respective peripheral lengths of the p-n junction regions of the first Zener diode and the p-n junction regions of the second Zener diode by variously setting the number of lead-out electrodes (diffusion regions) and/or the sizes of the diffusion regions formed on the substrate of the same area. In each sample, the first connection electrode plus the first diffusion regions and the second connection electrode plus the second diffusion regions are formed to be mutually symmetrical in the same manner as in the first reference example. Therefore in each sample, the peripheral length of the junction regions 411 of the first Zener diode D401 and the peripheral length of the p-n junction regions 413 of the second Zener diode D402 are substantially equal.

The abscissa axis of FIG. 66 indicates a length that is one of either the peripheral length of the p-n junction regions 411 of the first Zener diode D401 or the peripheral length of the p-n junction regions 413 of the second Zener diode D402. From these experimental results, it can be understood that the longer the respective peripheral lengths of the p-n junction regions 411 and p-n junction regions 413, the greater the ESD resistance. In cases where the respective peripheral lengths of the p-n junction regions 411 and p-n junction regions 413 are defined to be not less than 400 μm, ESD resistances of not less than 8 kilovolts, which is the target value, could be realized.

Figure 67:
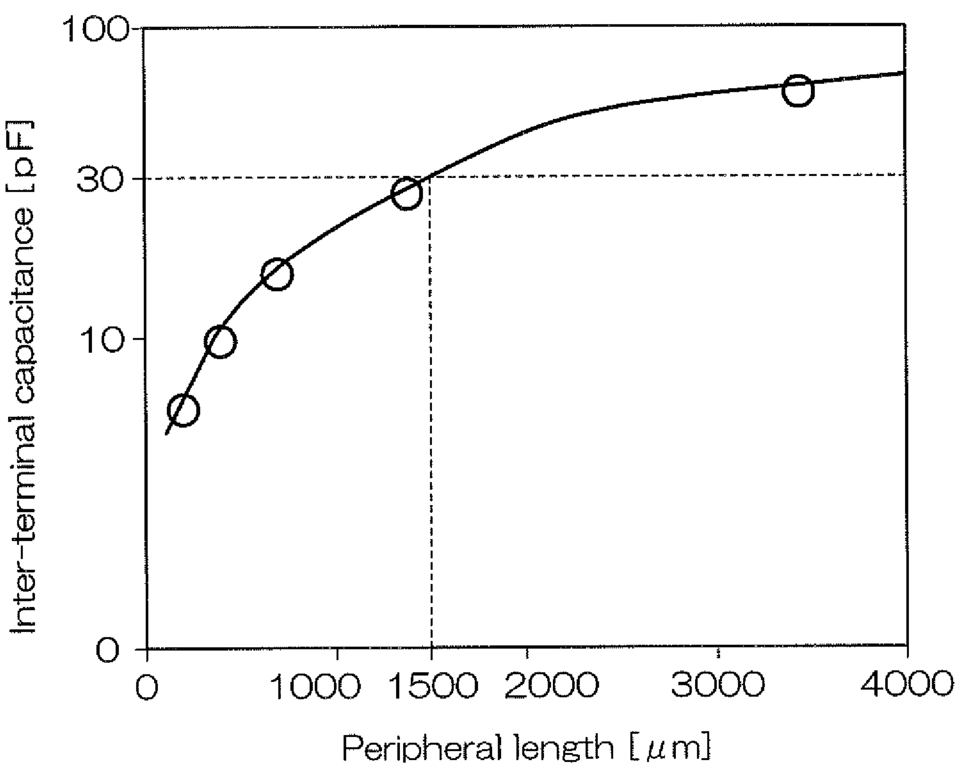
FIG. 67 is a graph of experimental results of measuring the inter-terminal capacitances of the plurality of samples that are differed in the respective peripheral lengths of the p-n junction regions of the first Zener diode and the p-n junction regions of the second Zener diode by variously setting the number of lead-out electrodes (diffusion regions) and/or the sizes of the diffusion regions formed on the semiconductor substrate of the same area.

FIG. 67 is a graph of experimental results of measuring the inter-terminal capacitances of the plurality of samples that are differed in the respective peripheral lengths of the p-n junction regions of the first Zener diode and the p-n junction regions of the second Zener diode by variously setting the number of lead-out electrodes (diffusion regions) and/or the sizes of the diffusion regions formed on the substrate of the same area. In each sample, the first connection electrode plus the first diffusion regions and the second connection electrode plus the second diffusion regions are formed to be mutually symmetrical in the same manner as in the reference example.

The abscissa axis of FIG. 67 indicates a length that is one of either the peripheral length of the p-n junction regions 411 of the first Zener diode D401 or the peripheral length of the junction regions 413 of the second Zener diode D402. From these experimental results, it can be understood that the longer the respective peripheral lengths of the p-n junction regions 411 and p-n junction regions 413, the greater the inter-terminal capacitance. In cases where the respective peripheral lengths of the p-n junction regions 411 and p-n junction regions 413 are defined to be not more than 1500

μm, inter-terminal capacitances of not more than 30 [pF], which is the target value, could be realized.

Further, with the present reference example, the widths of the lead-out electrodes L411, L412, L421, and L422 are wider than the widths of the bonding portions C411, C412, C421, and C422 at all locations between the bonding portions C411, C412, C421, and C422 and the first pad 405. A large allowable current amount can thus be set and electromigration can be reduced to improve reliability with respect to a large current. That is, a bidirectional Zener diode chip that is compact, high in ESD resistance, and secured in reliability with respect to large currents can be provided.

Further, the first and second connection electrodes 3 and 4 are both formed on the element forming surface 2A, which is one of the surfaces of the substrate 2. Therefore, as described with the first reference example, a circuit assembly having the chip part 1401 surface-mounted on the mounting substrate 9 can be arranged by making the element forming surface 2A face the mounting substrate 9 and bonding the first and second connection electrodes 3 and 4 onto the mounting substrate 9 by the solders 13 (see FIG. 54). That is, the chip part 1401 of the flip-chip connection type can be provided, and by performing face-down bonding with the element forming surface 2A being made to face the mounting surface of the mounting substrate 9, the chip part 1401 can be connected to the mounting substrate 9 by wireless bonding. The space occupied by the chip part 1401 on the mounting substrate 9 can thereby be made small. In particular, reduction of height of the chip part 1401 on the mounting substrate 9 can be realized. Effective use can thereby be made of the space inside a casing of a compact electronic device, etc., to contribute to high-density packaging and downsizing.

Also with the present reference example, the insulating film 115 is formed on the substrate 2 and the bonding portions C411 and C412 of the lead-out electrodes L411 and L412 are connected to the first diffusion regions 410 of the Zener diodes D411 and D412 via the first contact holes 416 formed in the insulating film 115. The first pad 405 is disposed on the insulating film 115 in the region outside the first contact holes 416. That is, the first pad 405 is provided at a position separated from positions directly above the p-n junction regions 411.

Similarly, the bonding portions C421 and C422 of the lead-out electrodes L421 and L422 are connected to the second diffusion regions 412 of the Zener diodes D421 and D422 via the second contact holes 417 formed in the insulating film 115. The second pad 406 is disposed on the insulating film 115 in the region outside the second contact holes 417. The second pad 406 is also disposed at a position separated from positions directly above the p-n junction regions 413. Application of a large impact to the p-n junction regions 411 and 413 can thus be avoided during mounting of the chip part 1401 on the mounting substrate 9. Destruction of the p-n junction regions 411 and 413 can thereby be avoided and a bidirectional Zener diode chip that is excellent in durability against external forces can thereby be realized.

Such a chip part 1401 may be obtained by executing a process of forming the first and second Zener diodes D401 and D402 in place of the process of forming the diode cells D101 to D104 in the first reference example. Points of difference with respect to the manufacturing process for the first reference example shall now be described in detail with reference to FIG. 68.

Figure 68:
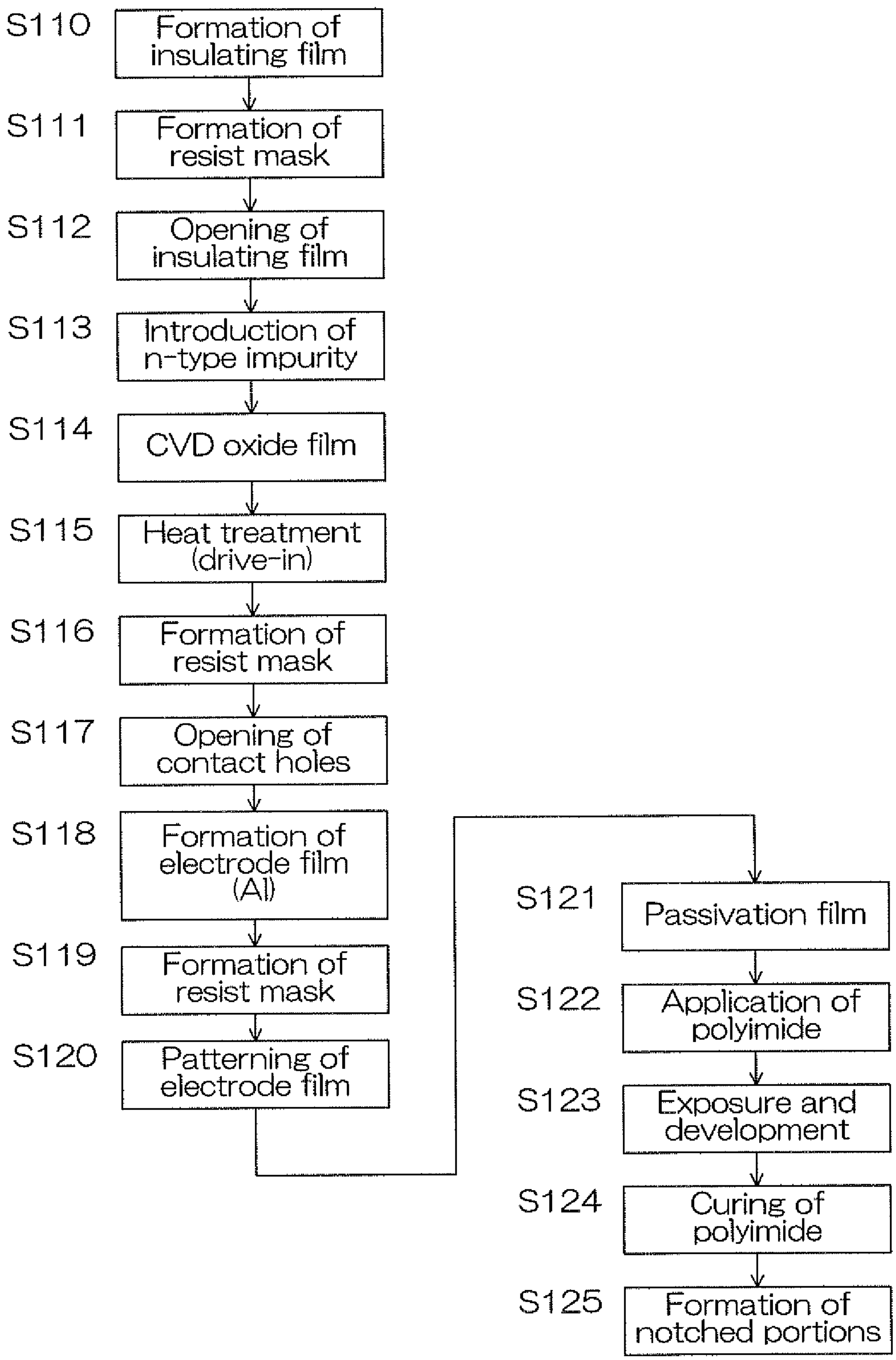
FIG. 68 is a flow chart for describing an example of a manufacturing process of the chip part shown in FIG. 60.

FIG. 68 is a flow chart for describing an example of a manufacturing process of the chip part 1401 shown in FIG. 60.

First, a $p^+$-type substrate (corresponding to the substrate 30 in first reference example) is prepared as the base substrate of the substrate 2. A front surface of the substrate is an element forming surface and corresponds to the element forming surface 2A of the substrate 2. A plurality of bidirectional Zener diode chip regions, corresponding to a plurality of the chip parts 1401, are aligned and set in a matrix on the element forming surface. Next, the insulating film 115 is formed on the element forming surface of the substrate (step S110) and a resist mask is formed thereon (step S111). Openings corresponding to the first diffusion regions 410 and the second diffusion regions 412 are then formed in the insulating film 115 by etching using the resist mask (step S112).

Further, after peeling off the resist mask, an n-type impurity is introduced to surface layer portions of the substrate that are exposed from the openings formed in the insulating film 115 (step S113). The introduction of the n-type impurity may be performed by a process of depositing phosphorus as the n-type impurity on the front surface (so-called phosphorus deposition) or by implantation of n-type impurity ions (for example, phosphorus ions). Phosphorus deposition is a process of depositing phosphorus on the front surface of the substrate exposed inside the openings in the insulating film 115 by conveying the substrate into a diffusion furnace and performing heat treatment while making $POCl_3$ gas flow inside a diffusion passage. After thickening the insulating film 115 as necessary (step S114), heat treatment (drive-in) for activation of the impurity ions introduced into the substrate is performed (step S115). The first diffusion regions 410 and the second diffusion regions 412 are thereby formed on the surface layer portion of the substrate.

Next, another resist mask having openings matching the contact holes 416 and 417 is formed on the insulating film 115 (step S116). The contact holes 416 and 417 are formed in the insulating film 115 by etching via the resist mask (step S117), and the resist mask is peeled off thereafter.

An electrode film that constitutes the first electrode film 403 and the second electrode film 404 is then formed on the insulating film 115, for example, by sputtering (step S118). In the present reference example, an electrode film, made of Al, is formed. Another resist mask having an opening pattern corresponding to the slit 418 is then formed on the electrode film (step S119) and the slit 418 is formed in the electrode film by etching (for example, reactive ion etching) via the resist mask (step S120). The electrode film is thereby separated into the first electrode film 403 and the second electrode film 404.

Next, after peeling off the resist film, the passivation film 23, which is a nitride film, etc., is formed, for example, by the CVD method (step S121), and further, polyimide, etc., is applied to form the resin film 24 (step S122). For example, a polyimide imparted with photosensitivity is applied, and after exposing in a pattern corresponding to the notched portions 122 and 123, the polyimide film is developed (step S123). The resin film 24 having the notched portions 122 and 123 that selectively expose the front surfaces of the first electrode film 403 and the second electrode film 404 is thereby formed. Thereafter, heat treatment for curing the resin film is performed as necessary (step S124). The notched portions 122 and 123 are then formed by performing dry etching (for example, reactive ion etching) using the resin film 24 as a mask (step S125).

Thereafter, the first and second connection electrodes 3 and 4 are formed as the external connection electrodes so as to be connected to the first electrode film 403 and the second electrode film 404 and then the substrate is separated into individual chips in accordance with the method described above with the first reference example (see FIG. 49E to FIG. 49H). The chip parts 1401 with the structure described above can thereby be obtained.

With the present reference example, the substrate 2 is constituted of the p-type semiconductor substrate and therefore stable characteristics can be realized even if an epitaxial layer is not formed on the substrate 2. That is, an n-type semiconductor substrate is large in in-plane variation of resistivity, and therefore when an n-type semiconductor substrate is used, an epitaxial layer with low in-plane variation of resistivity must be formed on the front surface and an impurity diffusion layer must be formed on the epitaxial layer to form the p-n junction. This is because an n-type impurity is low in segregation coefficient and therefore when an ingot (for example, a silicon ingot) that is to be the base of a substrate is formed, a large difference in resistivity arises between a central portion and a peripheral edge portion of the substrate. On the other hand, a p-type impurity is comparatively high in segregation coefficient and therefore a $p^+$-type substrate is low in in-plane variation of resistivity. Therefore by using a $p^+$-type substrate, a bidirectional Zener diode with stable characteristics can be cut out from any location of the substrate without having to form an epitaxial layer. Therefore by using the $p^+$-type semiconductor substrate as the substrate 2, the manufacturing process can be simplified and the manufacturing cost can be reduced.

FIG. 69A to FIG. 69F are plan views respectively of modification examples of the chip part 1401 shown in FIG. 60. FIG. 69A to FIG. 69F are plan views corresponding to FIG. 60. In FIG. 69A to FIG. 69F, portions corresponding to respective portions shown in FIG. 60 are provided with the same reference symbols as in FIG. 60.

Figure 69A:
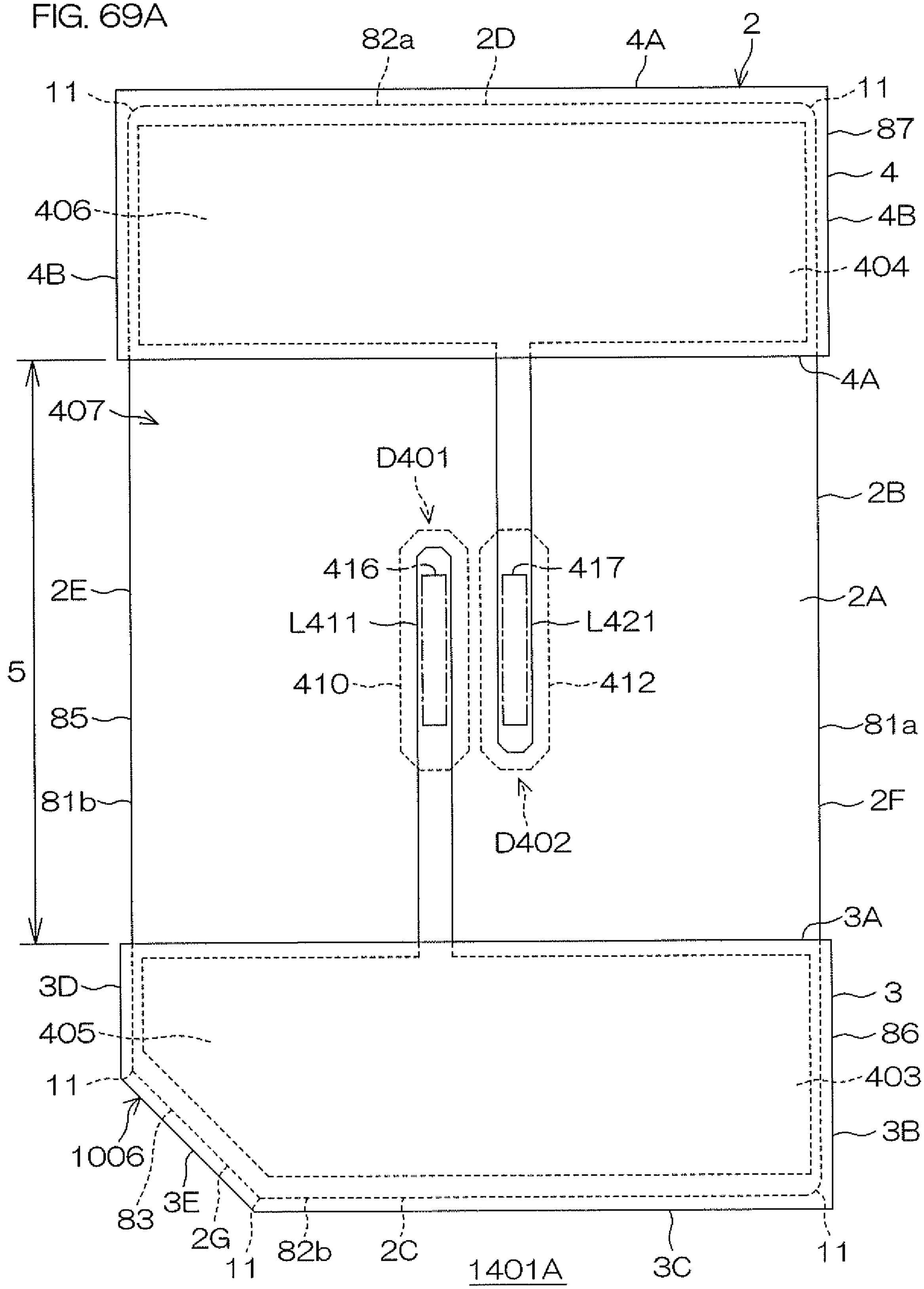
FIG. 69A to FIG. 69F are plan views respectively of first to sixth modification examples of the chip part shown in FIG. 60.

With the chip part 1401A shown in FIG. 69A, one each of the first diffusion region 410 and the second diffusion region 412 are formed. The first Zener diode D401 is constituted of a single Zener diode corresponding to the first diffusion region 410. The second Zener diode D402 is constituted of a single Zener diode corresponding to the second diffusion region 412. The first diffusion region 410 and the second diffusion region 412 have substantially rectangular shapes that are long in the long direction of the substrate 2 and are disposed across an interval in the short direction of the substrate 2. The lengths of the first diffusion region 410 and the second diffusion region 412 in the long direction are defined to be comparatively short (shorter than ½ the interval between the first pad 405 and the second pad 406). The interval between the first diffusion region 410 and the second diffusion region 412 is set to be shorter than the widths of the diffusion regions 410 and 412.

The single lead-out electrode L411 corresponding to the first diffusion region 410 is formed in the first connection electrode 3. Similarly, the single lead-out electrode L421 corresponding to the second diffusion region 412 is formed in the second connection electrode 4. The first and second connection electrodes 3 and 4 are formed in comb-teeth-like shapes in which the lead-out electrode L411 and the lead-out electrode L421 are mutually engaged.

The first connection electrode 3 plus the first diffusion region 410 and the second connection electrode 4 plus the second diffusion region 412 are arranged to be point symmetrical with respect to the center of gravity of the element forming surface 2A in a plan view. The first connection electrode 3 plus the first diffusion region 410 and the second connection electrode 4 plus the second diffusion region 412 may also be regarded as being arranged to be practically line symmetrical. That is, if the first lead-out electrode L411 and the second lead-out electrode L421 are regarded to be at substantially the same position, the first connection electrode 3 plus the first diffusion region 410 and the second connection electrode 4 plus the second diffusion region 412 may be regarded as being arranged to be line symmetrical with respect to the straight line parallel to the short direction of the element forming surface 2A and passing through the long direction center in a plan view.

Figure 69B:
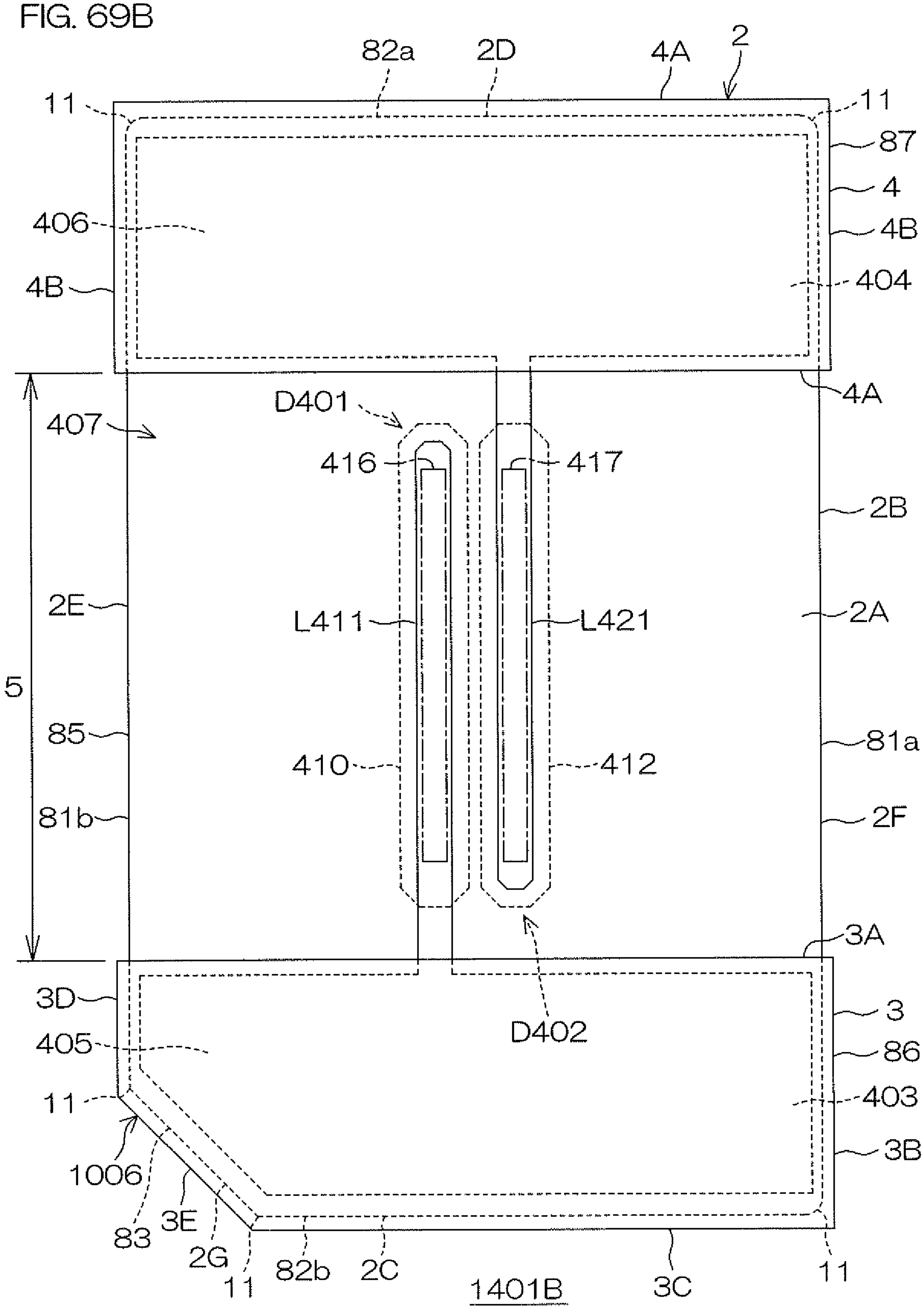

As with the chip part 1401A shown in FIG. 69A, with the chip part 1401B shown in FIG. 69B, each of the first Zener diode D401 and the second Zener diode D402 is constituted of a single Zener diode. With the chip part 1401B shown in FIG. 69B, the lengths of the first diffusion region 410 and the second diffusion region 412 in the long direction and the lengths of the lead-out electrodes L411 and L421 are defined to be comparatively long (longer than ½ the interval between the first pad 405 and the second pad 406) in comparison to the chip part 1401A shown in FIG. 69A.

Figure 69C:
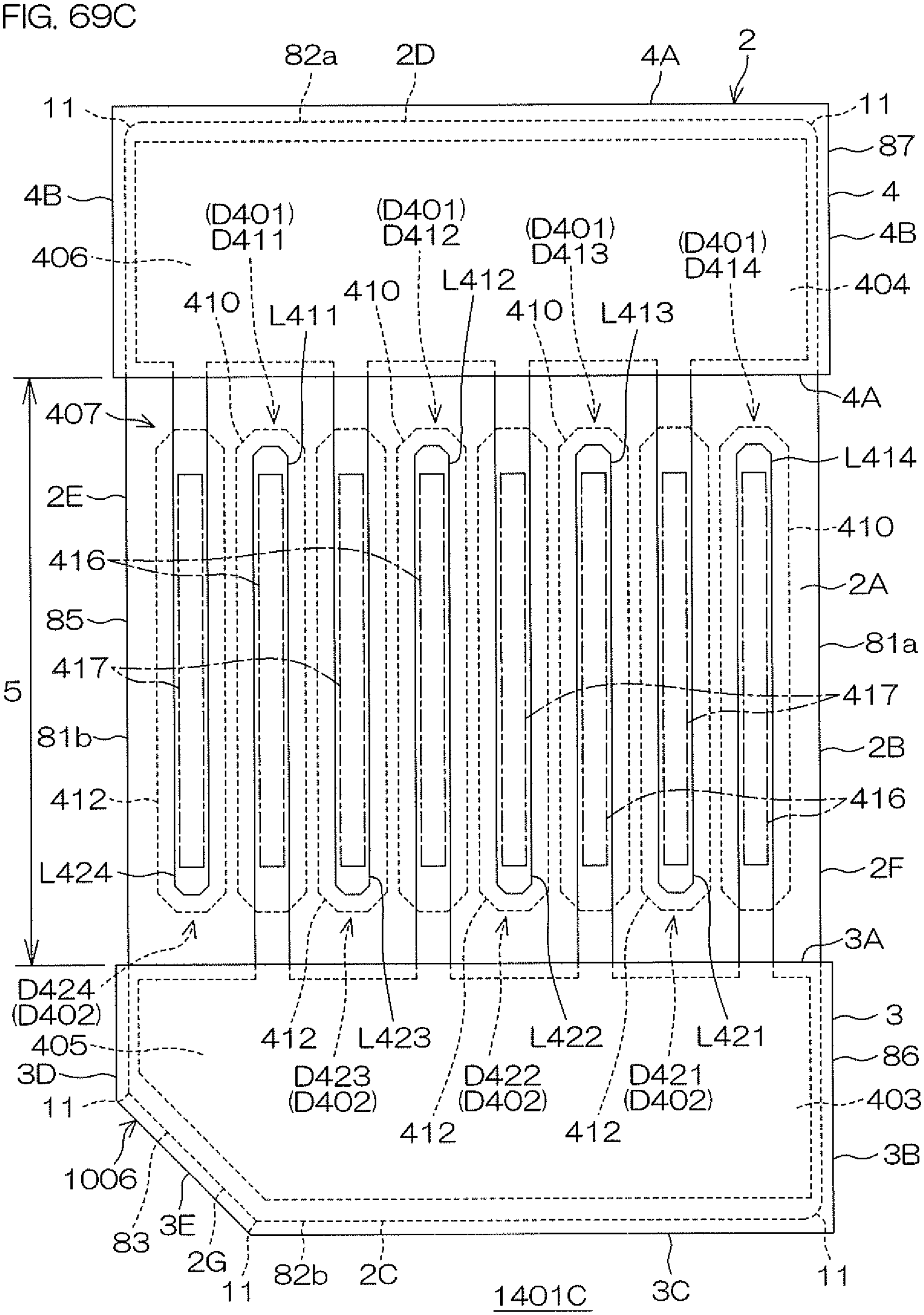

With the chip part 1401C shown in FIG. 69C, four each of the first diffusion regions 410 and the second diffusion regions 412 are formed. The eight first diffusion regions 410 and second diffusion regions 412 have rectangular shapes that are long in the long direction of the substrate 2, and the first diffusion regions 410 and the second diffusion regions 412 are disposed alternately at equal intervals along the short direction of the substrate 2. The first Zener diode D401 is constituted of four Zener diodes D411 to D414 respectively corresponding to the respective first diffusion regions 410. The second Zener diode D402 is constituted of four Zener diodes D421 to D424 respectively corresponding to the respective second diffusion regions 412.

Four lead-out electrodes L411 to L414 respectively corresponding to the respective first diffusion regions 410 are formed in the first connection electrode 3. Similarly, four lead-out electrodes L421 to L424 respectively corresponding to the respective second diffusion regions 412 are formed in the second connection electrode 4. The first and the second connection electrodes 3 and 4 are formed in comb-teeth-like shapes in which the lead-out electrodes L411 to L414 and the lead-out electrodes L421 to L424 are mutually engaged.

The first connection electrode 3 plus the first diffusion regions 410 and the second connection electrode 4 plus the second diffusion regions 412 are arranged to be point symmetrical with respect to the center of gravity of the element forming surface 2A in a plan view. The first connection electrode 3 plus the first diffusion regions 410 and the second connection electrode 4 plus the second diffusion regions 412 may also be regarded as being arranged to be practically line symmetrical. That is, if it is regarded that the mutually adjacent electrodes among the first lead-out electrodes L411 to L414 and the second lead-out electrodes L421 to L424 (L424 plus L411, L423 plus L412, L422 plus L413, and L421 plus L414) are at substantially the same positions, the first connection electrode 3 plus the first diffusion regions 410 and the second connection electrode 4 plus the second diffusion regions 412 may be regarded as being arranged to be line symmetrical with respect to the straight line parallel to the short direction center of the element forming surface 2A and passing through the long direction center in a plan view.

Figure 69D:
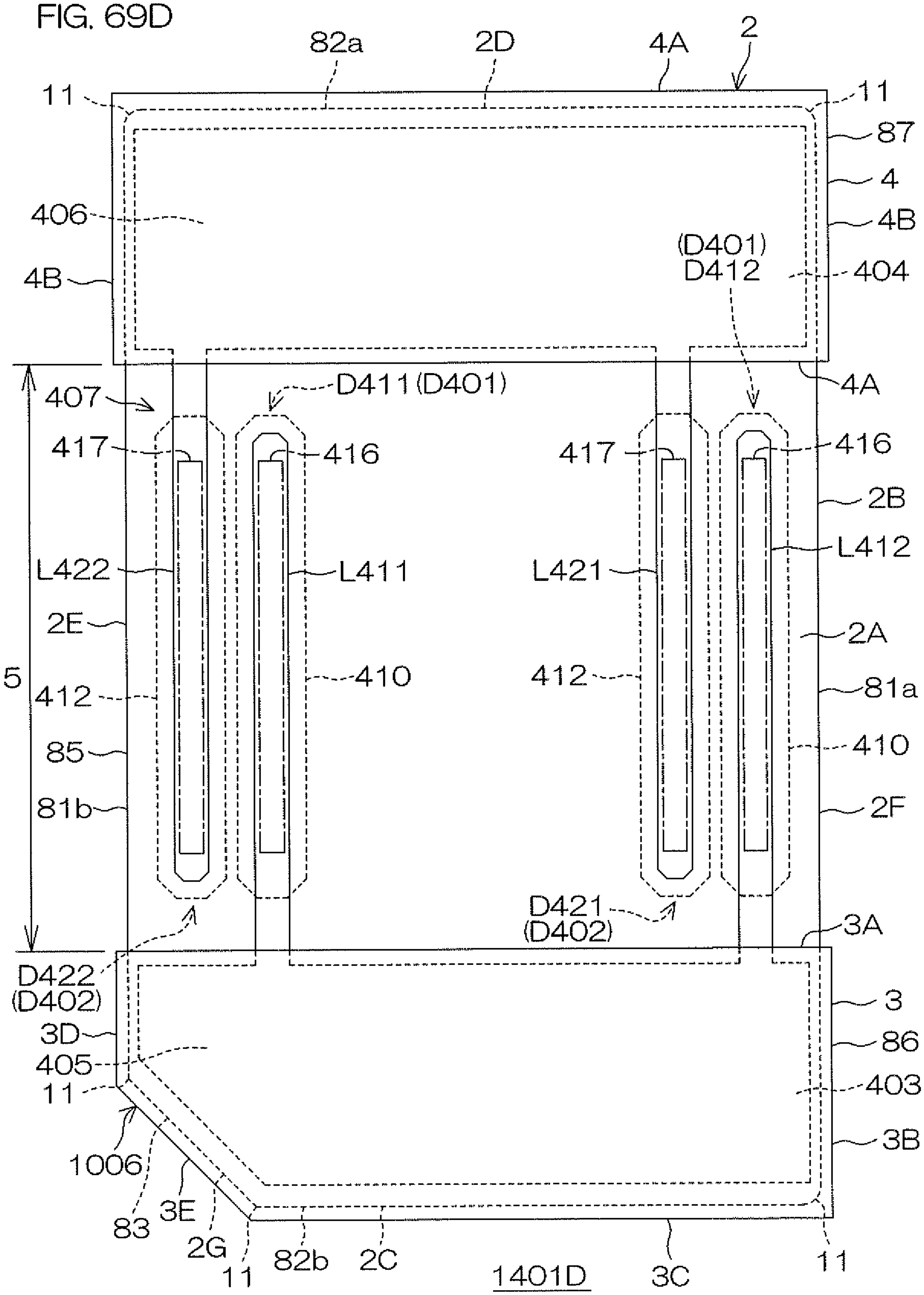

As with the third reference example shown in FIG. 60, with the chip part 1401D shown in FIG. 69D, two each of the first diffusion regions 410 and the second diffusion regions 412 are formed. The four first diffusion regions 410 and second diffusion regions 412 have rectangular shapes that are long in the long direction of the substrate 2, and the first diffusion regions 410 and the second diffusion regions 412 are disposed alternately along the short direction of the substrate 2. The first Zener diode D401 is constituted of two Zener diodes D411 and D412 respectively corresponding to the respective first diffusion regions 410. The second Zener diode D402 is constituted of two Zener diodes D421 and D422 respectively corresponding to the respective second diffusion regions 412. On the element forming surface 2A, the four diodes are aligned in the short side direction of the element forming surface 2A in the order of D422, D411, D421, and D412.

The second diffusion region 412 corresponding to the Zener diode D422 and the first diffusion region 410 corresponding to the Zener diode D411 are disposed adjacent to each other at a portion of the element forming surface 2A that is close to one of the long sides of the element forming surface 2A. The second diffusion region 412 corresponding to the Zener diode D421 and the first diffusion region 410 corresponding to the Zener diode D412 are disposed adjacent to each other at a portion of the element forming surface 2A that is close to the other long side of the surface. The first diffusion region 410 corresponding to the Zener diode D411 and the second diffusion region 412 corresponding to the Zener diode D421 are thus disposed across a large interval (an interval greater than the widths of the diffusion regions 410 and 412).

Two lead-out electrodes L411 and L412 respectively corresponding to the respective first diffusion regions 410 are formed in the first connection electrode 3. Similarly, two lead-out electrodes L421 and L422 respectively corresponding to the respective second diffusion regions 412 are formed in the second connection electrode 4. The first and second connection electrodes 3 and 4 are formed in comb-teeth-like shapes in which the lead-out electrodes L411 and L412 and the lead-out electrodes L421 and L422 are mutually engaged.

The first connection electrode 3 plus the first diffusion regions 410 and the second connection electrode 4 plus the second diffusion regions 412 are arranged to be point symmetrical with respect to the center of gravity of the element forming surface 2A in a plan view. The first connection electrode 3 plus the first diffusion regions 410 and the second connection electrode 4 plus the second diffusion regions 412 may also be regarded as being arranged to be practically line symmetrical. That is, the second lead-out electrode L422 at one of the long sides of the substrate 2 and the first lead-out electrode L411 adjacent thereto may be regarded as being at substantially the same position, and the first lead-out electrode L412 at the other long side of the substrate 2 and the second lead-out electrode L421 adjacent thereto may be regarded as being at substantially the same position. In this case, the first connection electrode 3 plus the first diffusion regions 410 and the second connection electrode 4 plus the second diffusion regions 412 may be regarded as being arranged to be line symmetrical with respect to the straight line parallel to the short direction of the element forming surface 2A and passing through the long direction center in a plan view.

Figure 69E:
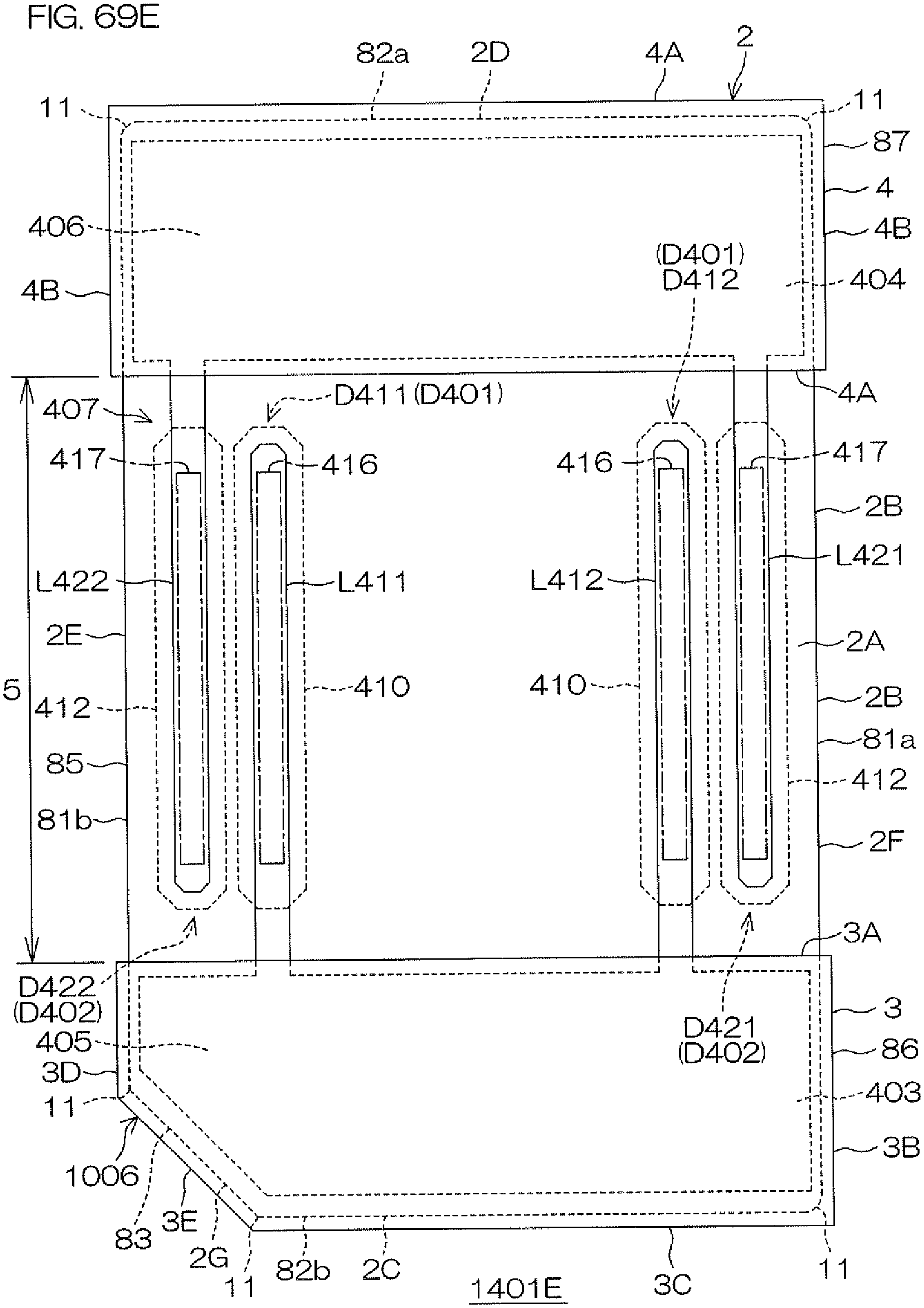

With the chip part 1401E of FIG. 69E, two each of the first diffusion regions 410 and the second diffusion regions 412 are formed. The respective first diffusion regions 410 and the respective second diffusion regions 412 have substantially rectangular shapes that are long in the long direction of the first diffusion region 410. One of the second diffusion regions 412 is formed at a portion of the element forming surface 2A close to one of the long sides of the surface and the other second diffusion region 412 is formed at a portion of the element forming surface 2A close to the other long side of the surface. The two first diffusion regions 410 are formed respectively adjacent to the respective second diffusion regions 412 in a region between the two second diffusion regions 412. That is, the two first diffusion regions 410 are disposed across a large interval (an interval greater than the widths of the diffusion regions 410 and 412) and one each of the second diffusion regions 412 are disposed at the outer sides thereof.

The first Zener diode D401 is constituted of two Zener diodes D411 and D412 respectively corresponding to the respective first diffusion regions 410. The second Zener diode D402 is constituted of two Zener diodes D421 and D422 respectively corresponding to the respective second diffusion regions 412. Two lead-out electrodes L411 and L412 respectively corresponding to the respective first diffusion regions 410 are formed in the first connection electrode 3. Similarly, two lead-out electrodes L421 and L422 respectively corresponding to the respective second diffusion regions 412 are formed in the second connection electrode 4.

The first connection electrode 3 plus the first diffusion regions 410 and the second connection electrode 4 plus the second diffusion regions 412 may be regarded as being arranged to be practically line symmetrical. That is, the second lead-out electrode L422 at one of the long sides of the substrate 2 and the first lead-out electrode L411 adjacent thereto may be regarded as being at substantially the same position, and the second lead-out electrode L421 at the other long side of the substrate 2 and the first lead-out electrode L412 adjacent thereto may be regarded as being at substantially the same position. In this case, the first connection electrode 3 plus the first diffusion regions 410 and the second connection electrode 4 plus the second diffusion regions 412 may be regarded as being arranged to be line symmetrical with respect to the straight line passing through the long direction center of the element forming surface 2A in a plan view.

With the chip part 1401E shown in FIG. 69E, the second lead-out electrode L422 at one of the long sides of the substrate 2 and the first lead-out electrode L411 adjacent thereto are arranged to be mutually point symmetrical around a predetermined point in between. Also, the second lead-out electrode L421 at the other long side of the substrate 2 and the first lead-out electrode L412 adjacent thereto are arranged to be mutually point symmetrical around a predetermined point in between. Even in such a case where the first connection electrode 3 plus the first diffusion regions 410 and the second connection electrode 4 plus the second diffusion regions 412 are arranged from a combination of partially symmetrical structures, it may be regarded that the first connection electrode 3 plus the first diffusion regions 410 and the second connection electrode 4 plus the second diffusion regions 412 are arranged to be practically symmetrical.

Figure 69F:
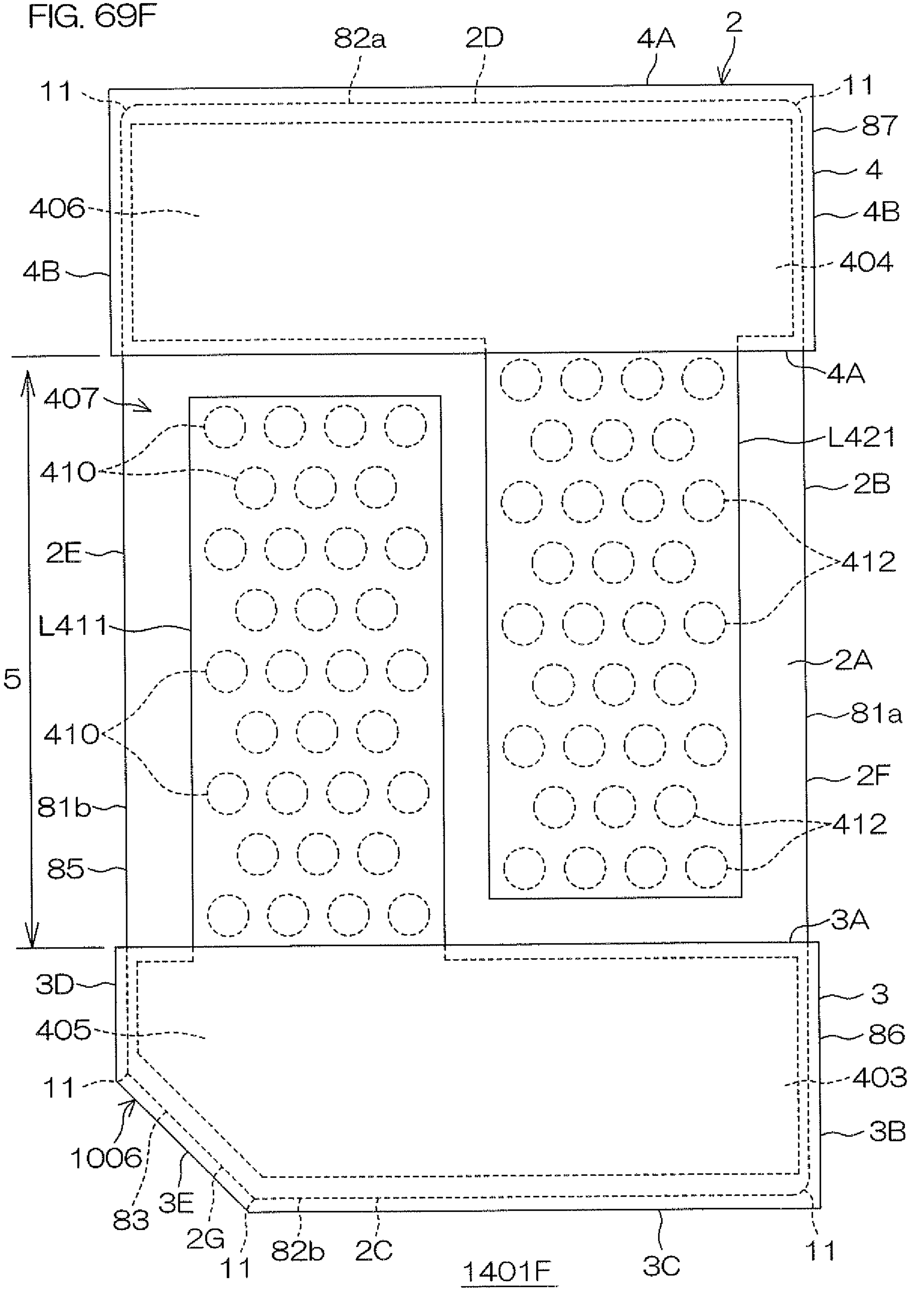

With the chip part 1401F shown in FIG. 69F, a plurality of the first diffusion regions 410 are disposed discretely and a plurality of the second diffusion regions 412 are disposed discretely in a surface layer region of the substrate 2. The first diffusion regions 410 and the second diffusion regions 412 are formed to circles of the same size in a plan view. The plurality of first diffusion regions 410 are disposed in a region between the width center and one of the long sides of the element forming surface 2A, and the plurality of second diffusion regions 412 are disposed in a region between the width center and the other long side of the element forming surface 2A. The first connection electrode 3 has the single lead-out electrode L411 connected in common to the plurality of first diffusion regions 410. Similarly, the second connection electrode 4 has the single lead-out electrode L421 connected in common to the plurality of second diffusion regions 412. The first connection electrode 3 plus the first diffusion regions 410 and the second connection electrode 4 plus the second diffusion regions 412 are arranged to be point symmetrical with respect to the center of gravity of the element forming surface 2A in a plan view in this modification example as well.

The shape in a plan view of each of the first diffusion regions 410 and the second diffusion regions 412 may be any shape, such as a triangle, rectangle, or other polygon, etc. Also, a plurality of the first diffusion regions 410, extending in a long direction of the element forming surface 2A, may be formed across intervals in the short direction of the element forming surface 2A in a region between the width center and one of the long sides of the element forming surface 2A and the lead-out electrode L411 may be connected in common to the plurality of first diffusion regions 410. In this case, a plurality of the second diffusion regions 412, extending in a long direction of the element forming surface 2A, are formed across intervals in the short direction of the element forming surface 2A in a region between the width center and the other long side of the element forming surface 2A and the lead-out electrode L421 is connected in common to the plurality of second diffusion regions 412.

Fourth Reference Example

Figure 70A:
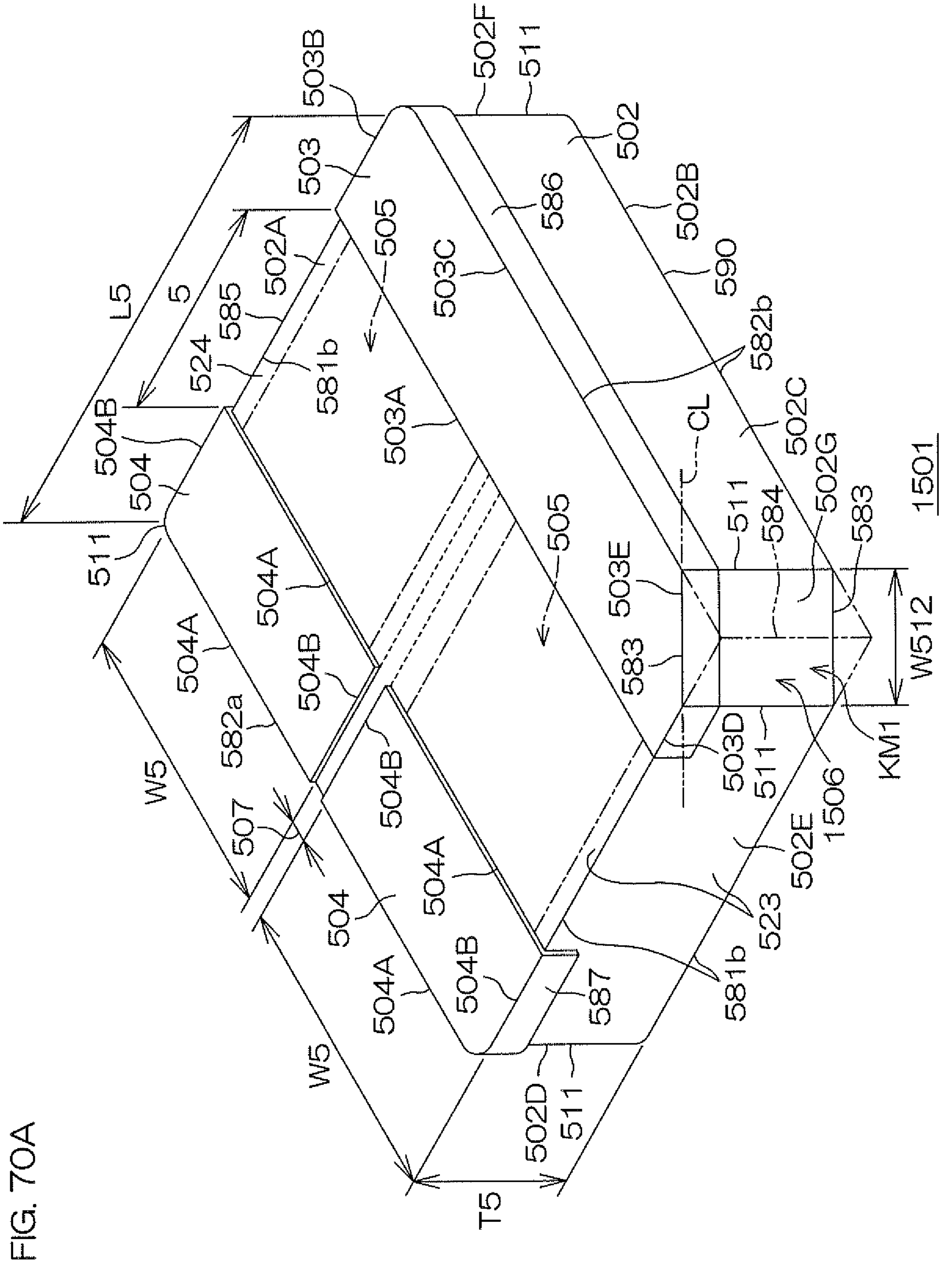
FIG. 70A is a schematic perspective view of a chip part according to a fourth reference example.

FIG. 70A is a schematic perspective view for describing the arrangement of a chip part 1501 according to a fourth reference example.

A point of difference of the chip part 1501 according to the fourth reference example with respect to the chip part 1001 according to the first reference example described above is that two circuit elements are formed on the single substrate 502 (that is, the element region 5 includes the two element regions 505 on the single substrate 502). Arrangements of other portions are equivalent to the arrangements in the chip part 1001 according to the first reference example. With the fourth reference example, a description shall be provided with portions corresponding to the respective portions shown in FIG. 1 to FIG. 69F being provided with the same reference symbols. In the following description, the chip part 1501 shall be referred to as the "composite chip part 1501."

The composite chip part 1501 is a bare chip having a diode according to any of the first to third reference examples mounted selectively on the common substrate 502. A diode according to any of the first to third reference examples may be mounted on either one or on each of both of the two element regions 505 of the substrate 502 or a diode according to any of the first to third reference examples may be mounted on either one of the element regions 505 while selectively mounting a circuit element, including a resistor element, a capacitor element, a fuse element, etc., on the other element region 505. The respective element regions 505 are disposed adjacent to each other so as to be right/left symmetrical with respect to the boundary region 507 thereof.

The composite chip part 1501 has a substantially rectangular parallelepiped shape. More specifically, the composite chip part 1501 has a chamfered portion 1506 as a notched portion at one corner portion as shall be described below and is thereby made to have a substantially rectangular parallelepiped shape with an asymmetrical shape. The chamfered portion 1506 expresses the polarity direction of the composite chip part 1501.

The planar shape of the composite chip part 1501 is a rectangle having sides (lateral sides 582(*a*) and 582(*b*)) extending along a direction in which the two circuit elements are aligned (hereinafter, the "lateral direction of the substrate 502") and sides (longitudinal sides 581(*a*) and 581(*b*)) orthogonal to the lateral sides 582(*a*) and 582(*b*). In regard to the planar dimensions of the composite chip part 1510, for example, a 0606 size is arranged by a combination of two circuit elements each of 0603 size with the length L5 along the longitudinal side 581(*a*) being not more than approximately 0.6 mm and the width W5 being not more than approximately 0.3 mm.

As a matter of course, the planar dimensions of the composite chip part 1501 are not restricted to the above and, for example, a 0404 size may be arranged by a combination of elements each of 0402 size with the length L5 along the longitudinal side 581(*a*) being not more than approximately 0.4 mm and the width W5 being not more than approximately 0.2 mm, or a 0303 size may be arranged by a combination of elements each of 03015 size with the length L5 along the longitudinal side 581(*a*) being not more than approximately 0.3 mm and the width W5 being not more than approximately 0.15 mm. Also, the composite chip part 1501 has a thickness T5, for example, of approximately 0.1 mm, and the width of the boundary region 507 between the two mutually adjacent circuit elements is preferably approximately 0.03 mm.

The composite chip part 1501 is obtained by defining chip regions, for forming numerous composite chip parts 1501, in a lattice on a substrate (corresponding to the substrate 30 in the first reference example), then forming grooves (corresponding to the groove 1044) in the substrate, and thereafter performing rear surface polishing (dividing of the substrate at the groove) to perform separation into the individual composite chip parts 1501.

The two circuit elements mainly include the substrate 502 that constitutes the main body of the composite chip part 1501, the first connection electrode 503 and the second connection electrodes 504 that are the external connection electrodes, and the element regions 505 that are connected to the exterior by the first connection electrode 503 and the second connection electrodes 504. In the present reference example, the first connection electrode 503 is formed so as to extend via the two elements and is an electrode in common to the two circuit elements. The material of the substrate 502 is the same as the material of the substrate 2 in the first to third reference examples described above.

With the substrate 502, the one surface constituting the upper surface in FIG. 70A is the element forming surface 502A. The element forming surface 502A is the surface of the substrate 502 on which the elements are formed and has a substantially oblong shape. The surface at the opposite side of the element forming surface 502A in the thickness direction of the substrate 502 is the rear surface 502B. The element forming surface 502A and the rear surface 502B are substantially the same in dimension and same in shape and are parallel to each other.

Each of the element forming surface 502A and the rear surface 502B has the pair of longitudinal sides 581(*a*) and 581(*b*) that differ mutually in length (length of the longitudinal side 581(*a*)>length of the longitudinal side 581(*b*)), the pair of lateral sides 582(*a*) and 582(*b*) that differ mutually in length (length of the lateral side 582(*a*)>length of the lateral side 582(*b*)), and an oblique side 583 joining the longitudinal side 581(*b*) and the lateral side 582(*b*).

In the following description, the substantially rectangular edge defined by the pair of longitudinal sides 581(*a*) and 581(*b*), the pair of lateral sides 582(*a*) and 582(*b*), and the oblique side 583 at the element forming surface 502A shall be referred to as the peripheral edge portion 585 and the substantially rectangular edge defined by the pair of longitudinal sides 581(*a*) and 581(*b*), the pair of lateral sides 582(*a*) and 582(*b*), and the oblique side 583 at the rear surface 502B shall be referred to as the peripheral edge portion 590. At the element forming surface 502A, the pair of longitudinal sides 581(*a*) and 581(*b*) are mutually parallel and the pair of lateral sides 582(*a*) and 582(*b*) are mutually parallel. When viewed from the direction of the normal orthogonal to the element forming surface 502A (rear surface 502B), the peripheral edge portion 585 and the peripheral edge portion 590 are overlapped.

As surfaces besides the element forming surface 502A and the rear surface 502B, the substrate 502 has the plurality of side surfaces (the side surface 502C, the side surface 502D, the side surface 502E, the side surface 502F, and the side surface 502G). The plurality of side surfaces 502C to 502G extend so as to intersect (specifically, so as to be orthogonal to) each of the element forming surface 502A and the rear surface 502B and join the element forming surface 502A and the rear surface 502B.

The side surface 502C is constructed between the lateral sides 582(*b*) at the element forming surface 502A and the rear surface 502B at one side (the front right side in FIG. 70A) in a longitudinal direction (hereinafter, the "longitudinal direction of the substrate 502") that is orthogonal to the lateral direction of the substrate 502, and the side surface 502D is constructed between the lateral sides 582(*a*) at the element forming surface 502A and the rear surface 502B at the other side (the inner left side in FIG. 70A) in the longitudinal direction of the substrate 502. The side surface 502C and the side surface 502D are the respective end surfaces of the substrate 502 in the longitudinal direction. The side surface 502E is constructed between the longitudinal sides 581(*b*) at the element forming surface 502A and the rear surface 502B at one side (the front left side in FIG. 70A) in the lateral direction of the substrate 502, and the side surface 502F is constructed between the longitudinal sides 581(*a*) at the element forming surface 502A and the rear surface 502B at the other side (the inner right side in FIG. 70A) in the lateral direction of the substrate 502. The side surface 502E and the side surface 502F are the respective end surfaces of the substrate 502 in the lateral direction. The side surface 502C and side surface 502F, the side surface 502F and side surface 502D, and the side surface 502D and side surface 502E intersect (specifically, are orthogonal) respectively. The chamfered portion 1506 is formed by chamfering of a corner portion 584 (see the alternate long and two short dashes lines in FIG. 70) of the substrate 502 defined by intersection of the side surface 502C and the side surface 502E along extensions thereof. With the present reference example, an arrangement is illustrated in which the corner portion 584 is chamfered along the chamfer line CL.

In a plan view of viewing from the direction of the normal orthogonal to the element forming surface 502A (rear surface 502B), the chamfered portion 1506 is formed to have a chamfer width W512 (notch width) greater than 10 μm. In the present reference example, the chamfer width W512 is the length of the oblique side 583. The chamfer width W512 is preferably defined to be not less than 30 μm (more specifically, 40 μm to 70 μm).

The chamfer line CL is a straight line passing through the side surface 502C (longitudinal side 581(*b*)) and the side surface 502E (lateral side 582(*b*)). Preferably, lengths (minimum lengths) between the corner portion 584 and the intersections of the chamfer line CL and the side surfaces 502C and 502E (respective sides 581(*b*) and 582(*b*)) are 30 μm to 50 μm respectively.

The side surface 502G is formed by the chamfered portion 1506. The side surface 502G is an oblique surface that is inclined with respect to the side surface 502C and the side surface 502E. The side surface 502G is constructed between the oblique sides 583 at the element forming surface 502A and the rear surface 502B and between the side surface 502C and the side surface 502E.

Although the present reference example illustrates an example adopting a straight line, by which a portion of the substrate 502 that includes the corner portion 584 is chamfered in the shape of a triangular prism (a triangle in a plan view), as the chamfer line CL, the chamfer line CL may, for example, be a broken line, by which a portion including the corner portion 584 is chamfered in the shape of a quadratic prism (a rectangle in a plan view), or may be a curve, by which a portion including the corner portion 584 is chamfered in an arcuate shape in a plan view (in the shape of a convex surface or a concave surface).

With the substrate 502, the respective entireties of the element forming surface 502A and the side surfaces 502C to 502G are covered by the passivation film 523. Therefore to be exact, the respective entireties of the element forming surface 502A and the side surfaces 502C to 502G in FIG. 70A are positioned at the inner sides (rear sides) of the passivation film 523 and are not exposed to the exterior. The composite chip part 1501 further has the resin film 524.

The first and second connection electrodes 503 and 504 are disposed at the one end portion and the other end portion of the element forming surface 502A and are formed across an interval from each other. The one end portion of the element forming surface 502A is an end portion at the side surface 502C side of the substrate 502, and the other end portion of the element forming surface 502A is an end portion at the side surface 502D side of the substrate 502.

The first connection electrode 503 includes the peripheral edge portion 586 having a portion extending along the chamfer line CL that defines the chamfered portion 1506 of the substrate 502. The peripheral edge portion 586 of the first connection electrode 503 is formed integrally on the element forming surface 502A of the substrate 502 so as to extend from the element forming surface 502A to the side surfaces 502C, 502E, 502F, and 502G and thereby cover the peripheral edge portion 585. In the present reference example, the peripheral edge portion 586 is formed so as to cover the respective corner portions 511 at which the side surfaces 502C, 502E, 502F, and 502G of the substrate 502 intersect mutually. The first connection electrode 503 is thus formed to include a pair of long sides 503A and 503C that differ mutually in length (length of the long side 503A>length of the long side 503C), a pair of short sides 503B and 503D that differ mutually in length (length of the short side 503B>length of the short side 503D), and an oblique side 503E joining the long side 503C and the short side 503C. The peripheral edge portion 586 along the oblique side 503E is formed along the chamfer line CL that defines the chamfered portion 1506. The long side 503A and short side 503B, the short side 503B and long side 503C, and the long side 503A and short side 503D are respectively orthogonal in a plan view.

The second connection electrode 504 includes the peripheral edge portion 587. The peripheral edge portion 587 of the second connection electrode 504 is formed integrally on the element forming surface 502A of the substrate 502 so as to extend from the element forming surface 502A to the side surfaces 502D, 502E, and 502F and thereby cover the peripheral edge portion 585. In the present reference example, the peripheral edge portion 587 is formed so as to cover respective corner portions 511 at which the side surfaces 502D, 502E, and 502F of the substrate 502 intersect mutually. The second connection electrode 504 has the pair of long sides 504A and the pair of short sides 504B that define four sides in a plan view. The long sides 504A and the short sides 504B of the second connection electrode 504 are orthogonal in a plan view.

The substrate 502 thus has different shapes at the one end portion at which the first connection electrode 503 is formed and at the other end portion at which the second connection electrode 504 is formed. That is, the first connection electrode 503 is formed at the one end portion side of the substrate 502 at which the chamfered portion 1506 is formed and the second connection electrode 504 is formed at the other end portion side of the substrate 502 at which the mutually adjacent side surfaces among the side surfaces 502D, 502E, and 502F are kept mutually perpendicular.

Therefore, in the plan view of viewing the element forming surface 502A from the normal direction, the respective end portions of the substrate 502 at which the first and second connection electrodes 503 and 504 are formed have shapes that are not line symmetrical with respect to a straight line orthogonal to the longitudinal sides 581(*a*) and 581(*b*) of the substrate 502 (and passing through a center of gravity of the substrate 502). The respective end portions of the substrate 502 at which the first and second connection electrodes 503 and 504 are formed also have shapes that are not point symmetrical with respect to the center of gravity of the substrate 502.

With the substrate 502, each corner portion 511 may have a chamfered rounded shape in a plan view. In this case, the structure is made capable of suppressing chipping during a manufacturing process or mounting of the chip part 1501.

In each element region 505 of such a composite chip part 1501, a diode is formed such that a cathode side is connected to the first connection electrode 503 and an anode side is connected to the second connection electrode 504. Therefore, the chamfered portion 1506 in the fourth reference example functions as a cathode mark KM1 that indicates the polarity direction of the composite chip part 1501.

Figure 70B:
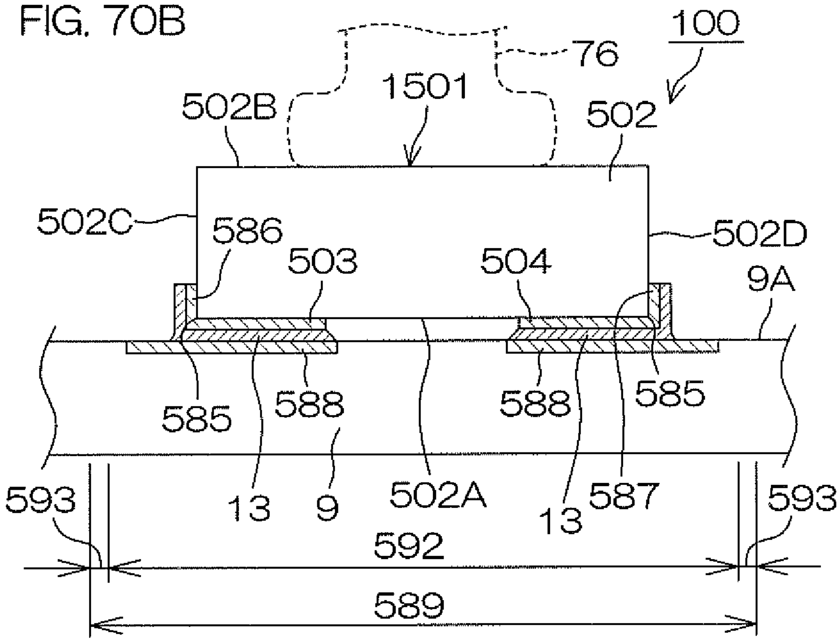
FIG. 70B is a schematic sectional view of a circuit assembly with which the chip part shown in FIG. 70A is mounted on a mounting substrate.
Figure 70C:
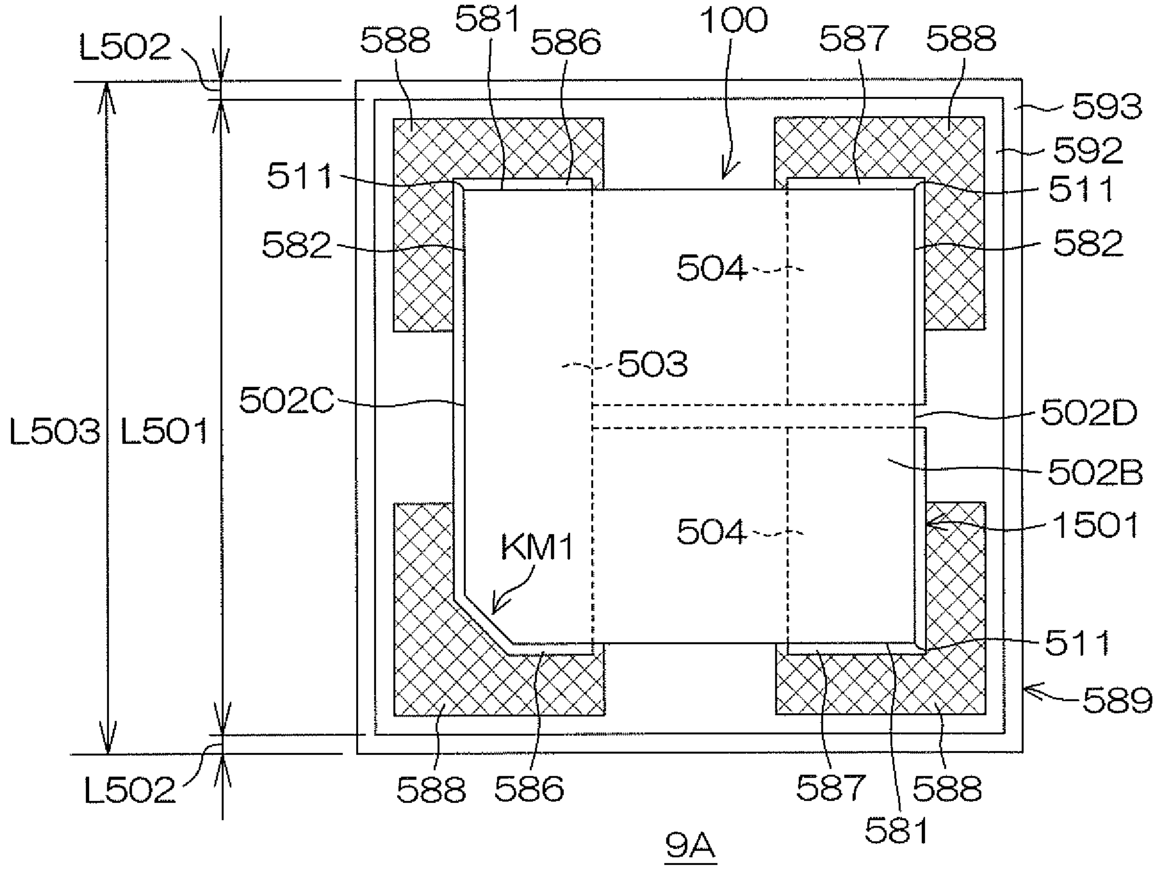
FIG. 70C is a schematic plan view of the circuit assembly of FIG. 70B as viewed from a rear surface side of the chip part.
Figure 70D:
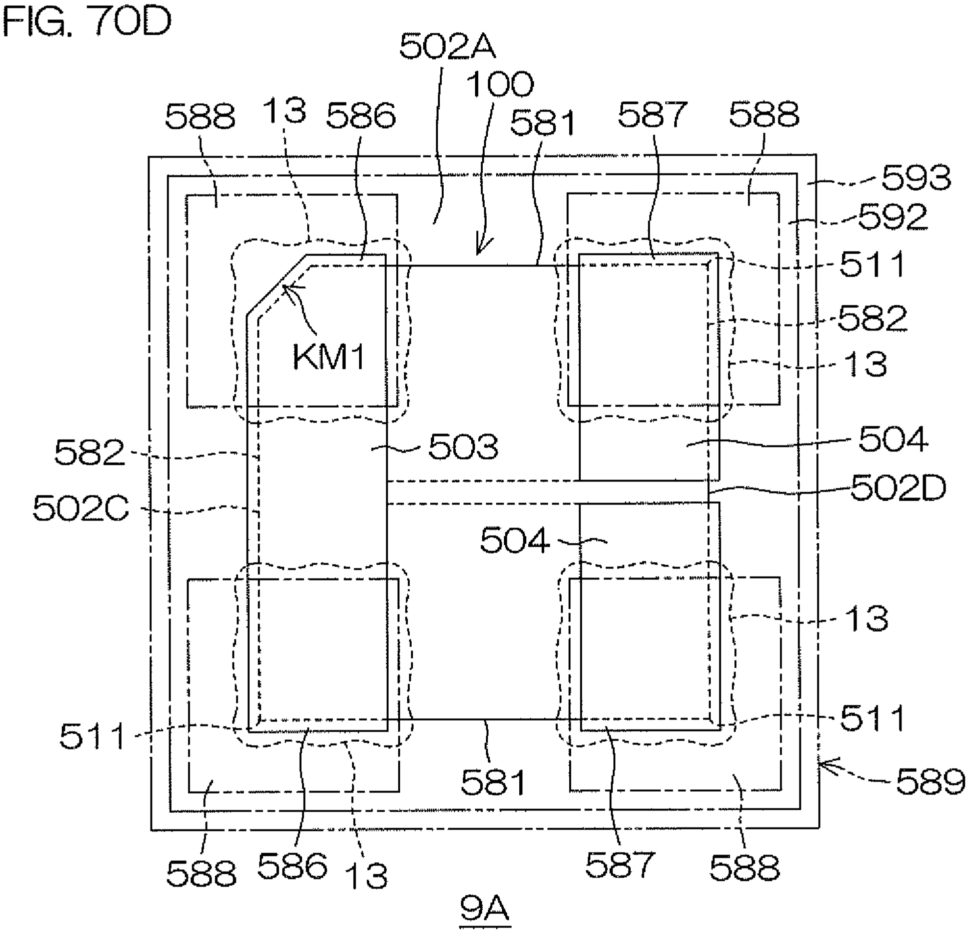
FIG. 70D is a schematic plan view of the circuit assembly of FIG. 70B as viewed from an element forming surface side of the chip part.
Figure 70E:
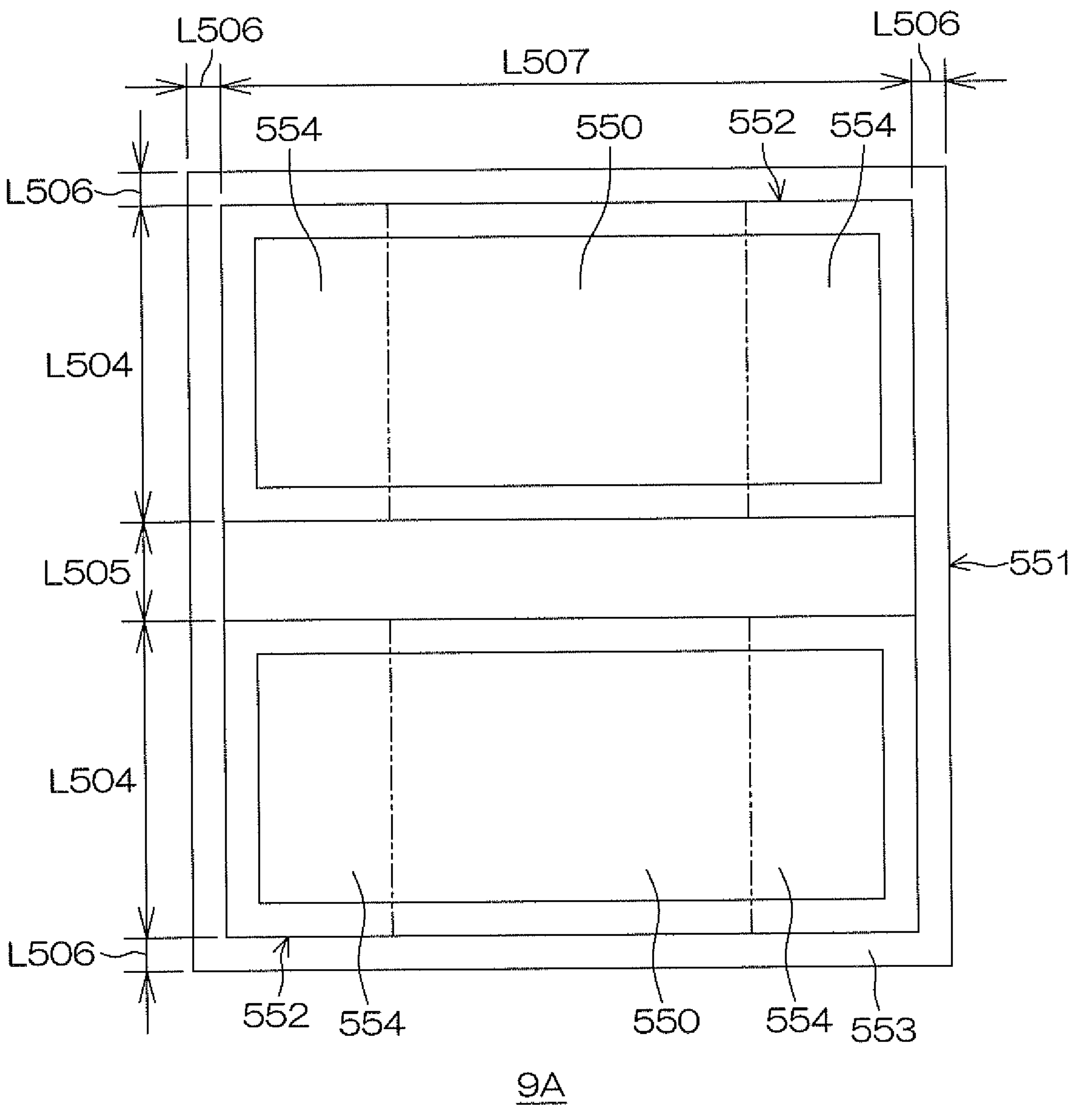
FIG. 70E is a diagram of a state where two of the chip parts are mounted on a mounting substrate.

FIG. 70B is a schematic sectional view of the circuit assembly 100 with which the composite chip part 1501 shown in FIG. 70A is mounted on the mounting substrate 9. FIG. 70C is a schematic plan view of the circuit assembly 100 shown in FIG. 70B as viewed from the rear surface 502B side of the composite chip part 1501. FIG. 70D is a schematic plan view of the circuit assembly 100 shown in FIG. 70B as viewed from the element forming surface 502A side of the composite chip part 1501. FIG. 70E is a diagram of a state where two chip parts are mounted on a mounting substrate. Only principal portions are shown in FIG. 70B to FIG. 70E. In FIG. 70C, cross hatching is applied to regions in which respective lands 588 are formed.

The composite chip part 1501 is mounted on the mounting substrate 9 as shown in FIG. 70B to FIG. 70D. The composite chip part 1501 and the mounting substrate 9 in this state constitute the circuit assembly 100.

As shown in FIG. 70B, the upper surface of the mounting substrate 9 is the mounting surface 9A. The mounting region 589 for the composite chip part 1501 is defined on the mounting surface 9A. In the present reference example, the mounting region 589 is defined to be a square in a plan view and includes the land region 592 in which the lands 588 are disposed and the solder resist region 593 surrounding the land region 592 as shown in FIG. 70C and FIG. 70D.

For example, if the composite chip part 1501 is a pair chip that includes one each of the two circuit elements of 03015 size, the land region 592 has a rectangular (square) shape having a planar size of 410 μm×410 μm. That is, the length L501 of one side of the land region 592 is such that L501=410 μm. On the other hand, the solder resist region 593 is defined to have a rectangular annular shape with a width L502 of 25 μm so as to border the land region 592.

A total of four lands 588 are disposed in the land region 592, one each at each of the four corners of the land region 592. In the present reference example, each land 588 is provided at a position spaced by a fixed interval from each of the sides that define the land region 592. For example, the interval from each side of the land region 592 to each land 588 is 25 μm. Also, an interval of 80 μm is provided between mutually adjacent lands 588. Each land 588 is formed, for example, of Cu and is connected to the internal circuit (not shown) of the mounting substrate 9. On the front surface of each land 588, the solder 13 is provided so as to project from the front surface as shown in FIG. 70B.

In mounting the composite chip part 1501 onto the mounting substrate 9, the suction nozzle 76 of the automatic mounting machine (not shown) is made to suction the rear surface 502B of the composite chip part 1501 as shown in FIG. 70B and then the suction nozzle 76 is moved to convey the composite chip part 1501. In this process, the suction nozzle 76 suctions the rear surface 502B at a substantially central portion in the longitudinal direction of the substrate 502. As mentioned above, the first connection electrode 503 and the second connection electrodes 504 are provided only on one surface (the element forming surface 502A) and the element forming surface 502A side end portions of the side surfaces 502C to 502F of the composite chip part 1501 and therefore the rear surface 502B of the composite chip part 1501 is a flat surface without electrodes (unevenness). The flat rear surface 502B can thus be suctioned onto the suction nozzle 76 when the composite chip part 1501 is to be suctioned by the suction nozzle 76 and moved. In other words, with the flat rear surface 502B, a margin of the portion that can be suctioned by the suction nozzle 76 can be increased. The composite chip part 1501 can thereby be suctioned reliably by the suction nozzle 76 and the composite chip part 1501 can be conveyed reliably without dropping off from the suction nozzle 76 midway.

Also, the composite chip part 1501 is a pair chip that includes a pair of, that is, two circuit elements, and therefore, for example, in comparison to a case of performing two times of mounting to mount two chip parts, each having just one diode according to the first to third reference examples installed thereon, a chip part having the same functions can be mounted in a single mounting process. Further in comparison to a single-component chip part, the rear surface area per chip part can be enlarged by an amount corresponding to two or more chips to stabilize the suction operation by the suction nozzle 76.

The suction nozzle 76, suctioning the composite chip part 1501, is then moved to the mounting substrate 9. At this point, the element forming surface 502A of the composite chip part 1501 and the mounting surface 9A of the mounting substrate 9 face each other. In this state, the suction nozzle 76 is moved and pressed against the mounting substrate 9 to make the first connection electrode 503 and the second connection electrodes 504 of the composite chip part 1501 contact the solders 13 of the respective lands 588.

When the solders 13 are then heated in a reflow process, the solders 13 melt. Thereafter, when the solders 13 become cooled and solidified, the first connection electrode 503 and the second connection electrodes 504 become bonded to the lands 588 via the solders 13. That is, each of the lands 588 is solder-bonded to the corresponding electrode among the first connection electrode 503 and the second connection electrodes 504. Mounting (flip-chip connection) of the composite chip part 1501 onto the mounting substrate 9 is thereby completed and the circuit assembly 100 is completed.

In the circuit assembly 100 in the completed state, the element forming surface 502A of the composite chip part 1501 and the mounting surface 9A of the mounting substrate 9 extend parallel while facing each other across a gap. The dimension of the gap corresponds to the total of the thickness of the portions of the first and second connection electrodes 503 and 504 projecting from the element forming surface 502A and the thickness of the solders 13.

With the circuit assembly 100, the peripheral edge portions 586 and 587 of the first and second connection electrodes 503 and 504 are formed to extend from the element forming surface 502A to the side surface 502C to 502G (only the side surfaces 502C and 502D are shown in FIG. 70B) of the substrate 502. Therefore, the adhesion area for soldering the composite chip part 1501 onto the mounting substrate 9 can be enlarged. Consequently, the amount of solder 13 adsorbed to the first and second connection electrodes 503 and 504 can be increased to improve the adhesion strength.

Also, in the mounted state, the chip part can be held from at least the two directions of the element forming surface 502A and the side surface 502C to 502G. The mounting form of the chip part 1501 can thus be stabilized. Moreover, the chip part 1501 after mounting onto the mounting substrate 9 can be supported at four points by the four lands 588 so that the mounting form can be stabilized further.

Also, the composite chip part 1501 is a pair chip that includes a pair of, that is, two circuit elements of 03015 size. Therefore, the area of the mounting region 589 for the composite chip part 1501 can be reduced significantly in comparison to a conventional case.

For example, with the present reference example, in reference to FIG. 70C, the area of the mounting region 589 suffices to be: L503×L503=(L502+L501+L502)×(L502+L501+L502)=(25+410+25)×(25+410+25)=211600 $\mu m^2$.

On the other hand, as shown in FIG. 70E, in the case where two single-component chip parts 550 of 0402 size, which is the smallest size that can be prepared conventionally, are to be mounted on the mounting surface 9A of the mounting substrate 9, the mounting region 551 of 319000 $\mu m^2$ is necessary. From a comparison of the areas of the mounting region 589 of the present reference example and the conventional mounting region 551, it can be understood that the mounting area can be reduced by approximately 34% with the arrangement of the present reference example.

The area of the mounting region 551 in FIG. 70E was calculated as: (L506+L504+L505+L504+L506)×(L506+L507+L506)=(25+250+30+250+25)×(25+500+25)=319000 $\mu m^2$ based on the mounting area 552 for each single-component chip part 550 with the lands 554 disposed therein having the lateral width L504=250 μm, the interval L505 between mutually adjacent mounting areas 552 being such that L505=30 μm, a solder resist region, constituting an outer periphery of the mounting region 551, having the width L506=25 μm, and the mounting area 552 having the length L507=500 μm.

Fifth Reference Example

Figure 71:
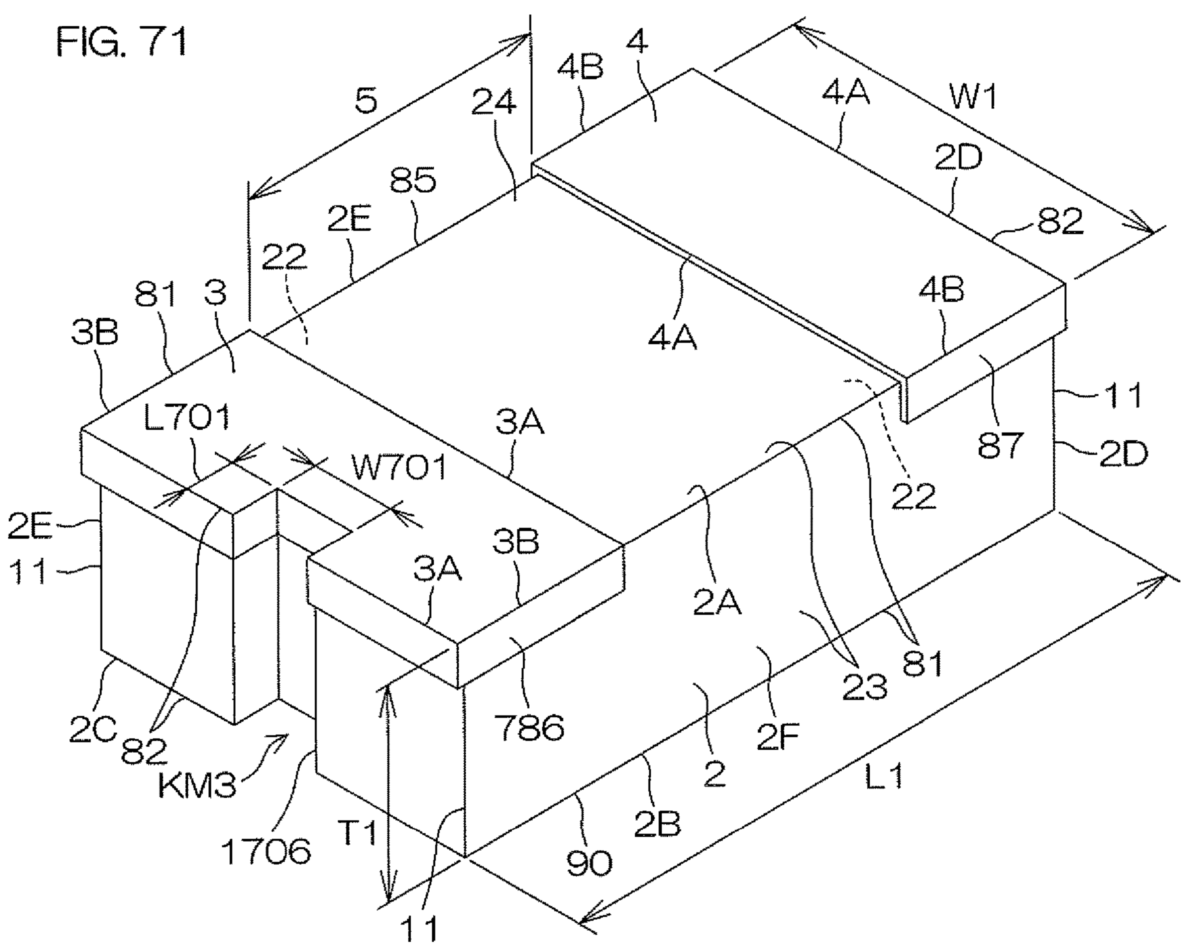
FIG. 71 is a schematic perspective view of a chip part according to a fifth reference example.

FIG. 71 is a schematic perspective view of a chip part 1701 according to a fifth reference example.

Points of difference of the chip part 1701 according to the fifth reference example with respect to the chip part 1001 according to the first reference example described above are that a recess 1706 is formed as a notched part in place of the chamfered portion 1006 and that, accordingly, the side surface 2C and the side surface 2E intersect orthogonally, the substrate 2 has the arrangement having the pair each of long sides 81 and short sides 82, and the first connection electrode 3 has the arrangement having the pair of long sides 3A and the pair of short sides 3B. Arrangements of other portions are equivalent to the arrangements of the chip part 1001 according to the first reference example. With FIG. 71, a description shall be provided with portions corresponding to the respective portions shown in FIG. 1 to FIG. 70E being provided with the same reference symbols.

The recess 1706 is formed selectively in the peripheral edge portions 85 and 90 of the chip part 1701 and the chip part 1701 is thereby made to have a substantially rectangular parallelepiped shape having an asymmetrical shape (a shape that is not point symmetrical). The recess 1706 is formed such that the peripheral edge portions 85 and 90 of the substrate 2 are dug in from the element forming surface 2A toward the rear surface 2B (in the thickness direction of the substrate 2).

The recess 1706 is formed at a middle portion of a region along the long direction of the side surface 2C of the substrate 2 (a central portion in the long direction of the side surface 2C in the present reference example) and is formed as a long groove extending in the thickness direction of the substrate 2. That is, the recess 1706 is formed to be recessed from the side surface 2C of the substrate 2 toward an inner side of the substrate 2 (that is, in the direction of the side surface 2D of the substrate 2). The recess 1706 is formed to a rectangular shape in a plan view of viewing the element forming surface 2A in the normal direction.

The recess 1706 is formed at a notch width W701 greater than 10 μm (notch width W701>10 μm). The notch width W701 is defined as the width of the recess 1706 in the direction along the side surface 2C. Also, a width L701 of the recess 1706 in a direction along the side surfaces 2E and 2F is greater than 5 μm (width L701>5 μm). More preferably, the notch width W701 is not less than 30 μm (more specifically, 30 μm to 50 μm) and the width L701 is not less than 10 μm (10 μm to 20 μm).

Although with the present reference example, an example where the recess 1706 is formed as a long groove that penetrates through the substrate 2 in the thickness direction is illustrated, the recess 1706 may instead have a bottom portion at a middle portion thereof so as not to penetrate through the thickness direction of the substrate 2. Also in place of the rectangular recess 1706, a recess of any shape, such as a trapezoidal shape in a plan view, an arcuate shape in a plan view (a convex surface shape or a concave surface shape), a triangular shape in a plan view, etc., may be formed.

The first connection electrode 3 is formed to integrally cover the three side surfaces 2C, 2E, and 2F and a peripheral edge portion 786 is formed thereby. The peripheral edge portion 786 of the first connection electrode 3 (more specifically, a surface of the peripheral edge portion 786 and a surface of contact of the substrate 2 and the peripheral edge portion 786) is further formed along the surface of the recess 1706 formed in the side surface 2C, and thereby at a long side 3A of the first connection electrode 3 (the long side 3A at the side surface 2C side) a portion that is recessed in a plan view is formed along a line defined by the recess 1706.

The substrate 2 thus has different shapes at the one end portion at which the first connection electrode 3 is formed and at the other end portion at which the second connection electrode 4 is formed. That is, the first connection electrode 3 is formed at the one end portion side of the substrate 2 at which the recess 1706 is formed and the second connection electrode 4 is formed at the other end portion side of the substrate 2 at which the mutually adjacent side surfaces among the side surfaces 2D, 2E, and 2F are kept mutually perpendicular. Therefore, in the plan view of viewing the element forming surface 2A from the normal direction, the respective end portions of the substrate 2 at which the first and second connection electrodes 3 and 4 are formed have shapes that are not line symmetrical with respect to a straight line orthogonal to the side surfaces 2E and 2F of the substrate 2 (and passing through a center of gravity of the substrate 2). The respective end portions of the substrate 2 at which the first and second connection electrodes 3 and 4 are formed also have shapes that are not point symmetrical with respect to the center of gravity of the substrate 2.

If the first connection electrode 3 is connected to the cathode side of a diode as in the first reference example described above, the recess 1706 formed in the substrate 2 functions as a cathode mark KM3.

Such a recess 1706 may be formed by the same processes as those of the manufacturing process described above for the first reference example. That is, whereas in FIG. 49E described above, the resist pattern 41 having the chamfered portion 1042C is formed on the substrate 30, an opening that selectively exposes a region in which the recess 1706 is to be formed is formed in place of the chamfered portion 1042C in the resist pattern 41. The chip part 1701 is thereafter formed via the same processes as those of FIG. 49F to FIG. 49H described above.

The same effects as the effects described for the first to fifth reference examples can thus be exhibited by forming the recess 1706 in the substrate 2.

Although with the present reference example, an example where the single recess 1706 is formed in the central portion in the long direction of the side surface 2C of the substrate 2 was described, the single recess 1706 may be formed in the side surface 2C of the substrate 2 at a portion besides the central portion in the long direction of the side surface 2C. In this case, in the plan view of viewing the element forming surface 2A from the normal direction, the respective end portions of the substrate 2 at which the first and second connection electrodes 3 and 4 are formed have shapes that are further not line symmetrical with respect to a straight line orthogonal to the side surfaces 2C and 2D of the substrate 2 (and passing through a center of gravity of the substrate 2).

Also, although with the present reference example, an example where the recess 1706 is formed in the side surface 2C of the substrate 2 was described, an arrangement may be adopted where the recess 1706 is formed in at least one or both of the side surface 2E and side surface 2F of the substrate 2.

Also, although with the present reference example, an example where the single recess 1706 is formed in the side surface 2C of the substrate 2 was described, an arrangement may be adopted where a plurality of recesses 1706 are formed in the side surface 2C (or any of side surfaces 2C, 2E, and 2F) of the substrate 2. With such an arrangement, a polarity direction, type name, date of manufacture, and other information of the chip part 1701 can be indicated by way of combinations, etc., of the positions and number of the plurality of recesses 1706.

Also, although with the present reference example, an example where the recess 1706 is formed as the cathode mark KM3 at the side surface 2C side of the substrate 2 was described, the recess 1706 may be formed as an anode mark at the side surface 2D side of the substrate 2.

Also, although with the present reference example, the chip part 1701 is indicated as a single-component chip part, the arrangement of the chip part 1701 may obviously be applied to an arrangement such as that of the composite chip part according to the fourth reference example.

<Smartphone>

Figure 72:
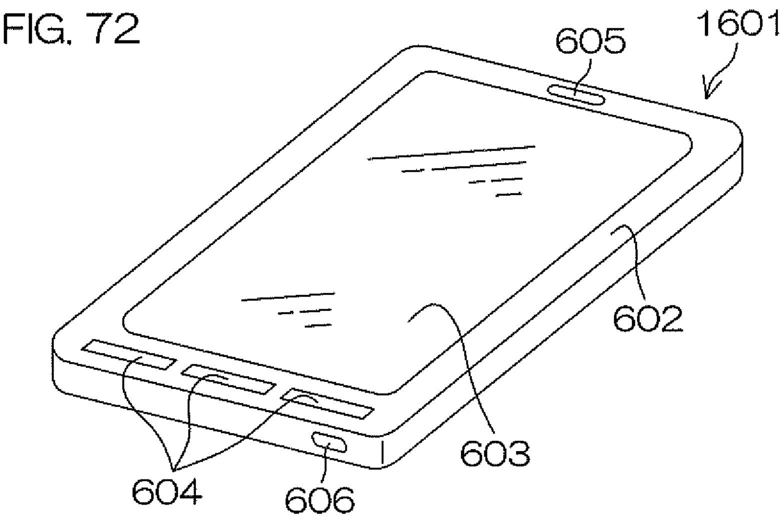
FIG. 72 is a perspective view of an outer appearance of a smartphone that is an example of an electronic device in which the chip parts according to the first to fifth reference examples are used.

FIG. 72 is a perspective view of an outer appearance of a smartphone 1601 that is an example of an electronic device in which the chip parts according to the first to fifth reference examples are used. The smartphone 1601 is arranged by housing electronic parts in the interior of the casing 602 with a flat rectangular parallelepiped shape. The casing 602 has a pair of major surfaces with an oblong shape at its front side and rear side, and the pair of major surfaces are joined by four side surfaces. A display surface of the display panel 603, constituted of a liquid crystal panel or an organic EL panel, etc., is exposed at one of the major surfaces of the casing 602. The display surface of the display panel 603 constitutes a touch panel and provides an input interface for a user.

The display panel 603 is formed to an oblong shape that occupies most of one of the major surfaces of the casing 602. The operation buttons 604 are disposed along one short side of the display panel 603. In the present reference example, a plurality (three) of the operation buttons 604 are aligned along the short side of the display panel 603. The user can call and execute necessary functions by performing operations of the smartphone 1601 by operating the operation buttons 604 and the touch panel.

The speaker 605 is disposed in a vicinity of the other short side of the display panel 603. The speaker 605 provides an earpiece for a telephone function and is also used as an acoustic conversion unit for reproducing music data, etc. On the other hand, close to the operation buttons 604, the microphone 606 is disposed at one of the side surfaces of the casing 602. The microphone 606 provides a mouthpiece for the telephone function and may also be used as a microphone for sound recording.

Figure 73:
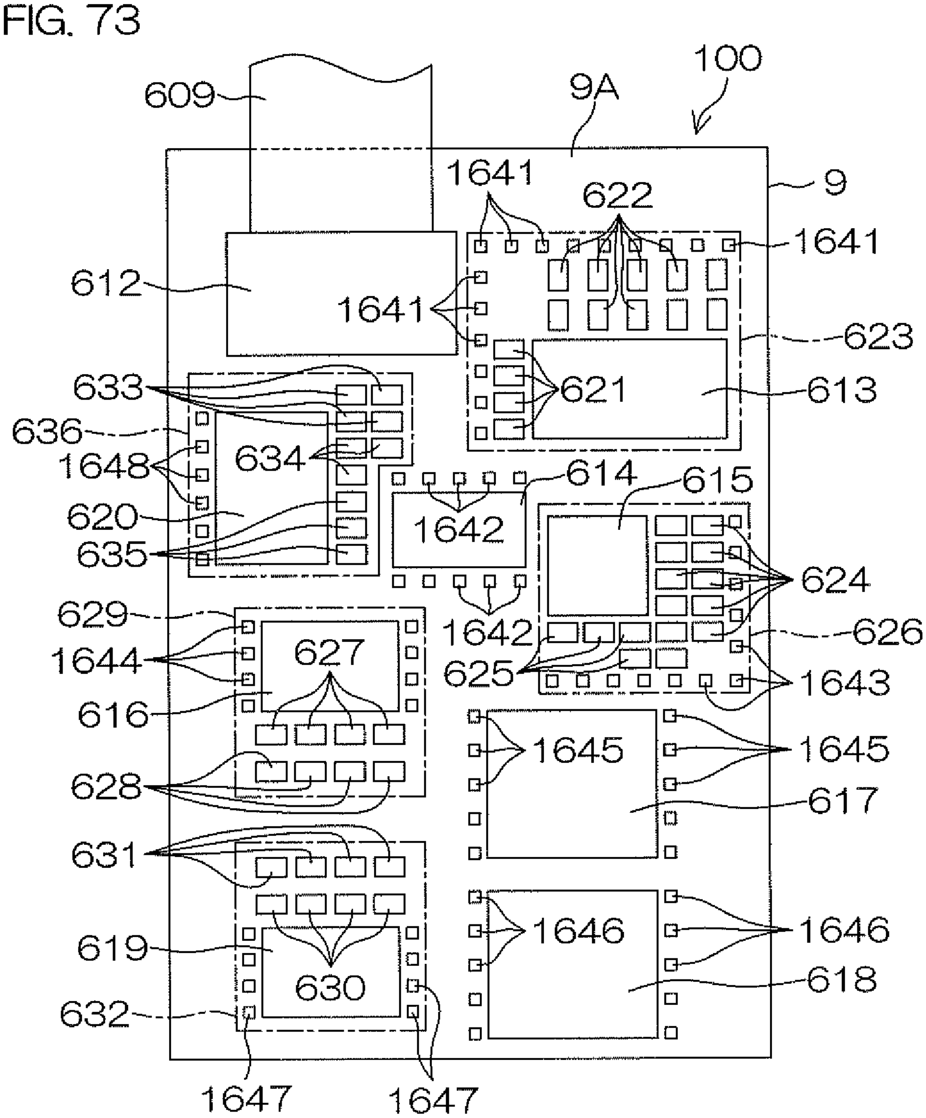
FIG. 73 is an illustrative plan view of the arrangement of a circuit assembly housed in the interior of a casing of the smartphone.

FIG. 73 is an illustrative plan view of the arrangement of the circuit assembly 100 housed in the interior of the casing 602. The circuit assembly 100 includes the mounting substrate 9 and circuit parts mounted on the mounting surface 9A of the mounting substrate 9. The plurality of circuit parts include the plurality of integrated circuit elements (ICs) 612 to 620 and a plurality of chip parts. The plurality of ICs include the transmission processing IC 612, the one-segment TV receiving IC 613, the GPS receiving IC 614, the FM tuner IC 615, the power supply IC 616, the flash memory 617, the microcomputer 618, the power supply IC 619, and the baseband IC 620.

The plurality of chip parts include the chip inductors 621, 625, and 635, the chip resistors 622, 624, and 633, the chip capacitors 627, 630, and 634, chip diodes 1628 and 1631, and bidirectional Zener diode chips 1641 to 1648. The chip diodes 1628 and 1631 and the bidirectional Zener diode chips 1641 to 1648 correspond to the chip parts according to the first to fifth reference examples described above and are mounted on the mounting surface 9A of the mounting substrate 9, for example, by flip-chip bonding.

The bidirectional Zener diode chips 1641 to 1648 are provided for absorbing positive and negative surges, etc., in signal input lines to the one-segment TV receiving IC 613, the GPS receiving IC 614, the FM tuner IC 615, the power supply IC 616, the flash memory 617, the microcomputer 618, the power supply IC 619, and the baseband IC 620.

The transmission processing IC 612 has incorporated therein an electronic circuit arranged to generate display control signals for the display panel 603 and receive input signals from the touch panel on the front surface of the display panel 603. For connection with the display panel 603, the transmission processing IC 612 is connected to the flexible wiring 609.

The one-segment TV receiving IC 613 incorporates an electronic circuit that constitutes a receiver for receiving one-segment broadcast (terrestrial digital television broadcast targeted for reception by portable equipment) radio waves. A plurality of the chip inductors 621, a plurality of the chip resistors 622, and a plurality of the bidirectional Zener diode chips 1641 are disposed in a vicinity of the one-segment TV receiving IC 613. The one-segment TV receiving IC 613, the chip inductors 621, the chip resistors 622, and the bidirectional Zener diode chips 1641 constitute the one-segment broadcast receiving circuit 623. The chip inductors 621 and the chip resistors 622 respectively have accurately adjusted inductances and resistances and provide circuit constants of high precision to the one-segment broadcast receiving circuit 623.

The GPS receiving IC 614 incorporates an electronic circuit that receives radio waves from GPS satellites and outputs positional information of the smartphone 1601. A plurality of the bidirectional Zener diode chips 1642 are disposed in a vicinity of the GPS receiving IC 614.

The FM tuner IC 615 constitutes, together with a plurality of the chip resistors 624, a plurality of the chip inductors 625, and a plurality of the bidirectional Zener diode chips 1643 mounted on the mounting substrate 9 in a vicinity thereof, the FM broadcast receiving circuit 626. The chip resistors 624 and the chip inductors 625 respectively have accurately adjusted resistance values and inductances and provide circuit constants of high precision to the FM broadcast receiving circuit 626.

A plurality of the chip capacitors 627, a plurality of the chip diodes 1628, and a plurality of the bidirectional Zener diode chips 1644 are mounted on the mounting surface 9A of the mounting substrate 9 in a vicinity of the power supply IC 616. Together with the chip capacitors 627, the chip diodes 1628, and the bidirectional Zener diode chips 1644, the power supply IC 616 constitutes the power supply circuit 629.

The flash memory 617 is a storage device for recording operating system programs, data generated in the interior of the smartphone 1601, data and programs acquired from the exterior by communication functions, etc. A plurality of the bidirectional Zener diode chips 1645 are disposed in a vicinity of the flash memory 617.

The microcomputer 618 is a computing processing circuit that incorporates a CPU, a ROM, and a RAM and realizes a plurality of functions of the smartphone 1601 by executing various computational processes. More specifically, computational processes for image processing and various application programs are realized by actions of the microcomputer 618. A plurality of the bidirectional Zener diode chips 1646 are disposed in a vicinity of the microcomputer 618.

A plurality of the chip capacitors 630, a plurality of the chip diodes 1631, and a plurality of the bidirectional Zener diode chips 1647 are mounted on the mounting surface 9A of the mounting substrate 9 in a vicinity of the power supply IC 619. Together with the chip capacitors 630, the chip diodes 1631, and the bidirectional Zener diode chips 1647, the power supply IC 619 constitutes the power supply circuit 632.

A plurality of the chip resistors 633, a plurality of the chip capacitors 634, a plurality of the chip inductors 635, and a plurality of the bidirectional Zener diode chips 1648 are mounted on the mounting surface 9A of the mounting substrate 9 in a vicinity of the baseband IC 620. Together with the chip resistors 633, the chip capacitors 634, the chip inductors 635, and the plurality of bidirectional Zener diode chips 1648, the baseband IC 620 constitutes the baseband communication circuit 636. The baseband communication circuit 636 provides communication functions for telephone communication and data communication.

With the above arrangement, electric power that is appropriately adjusted by the power supply circuits 629 and 632 is supplied to the transmission processing IC 612, the GPS receiving IC 614, the one-segment broadcast receiving circuit 623, the FM broadcast receiving circuit 626, the baseband communication circuit 636, the flash memory 617, and the microcomputer 618. The microcomputer 618 performs computational processes in response to input signals input via the transmission processing IC 612 and makes the display control signals be output from the transmission processing IC 612 to the display panel 603 to make the display panel 603 perform various displays.

When receiving of a one-segment broadcast is commanded by operation of the touch panel or the operation buttons 604, the one-segment broadcast is received by actions of the one-segment broadcast receiving circuit 623. Computational processes for outputting the received images to the display panel 603 and making the received audio signals be acoustically converted by the speaker 605 are executed by the microcomputer 618.

Also, when positional information of the smartphone 1601 is required, the microcomputer 618 acquires the positional information output by the GPS receiving IC 614 and executes computational processes using the positional information.

Further, when an FM broadcast receiving command is input by operation of the touch panel or the operation buttons 604, the microcomputer 618 starts up the FM broadcast receiving circuit 626 and executes computational processes for outputting the received audio signals from the speaker 605.

The flash memory 617 is used for storing data acquired by communication and storing data prepared by computations by the microcomputer 618 and inputs from the touch panel. The microcomputer 618 writes data into the flash memory 617 or reads data from the flash memory 617 as necessary.

The telephone communication or data communication functions are realized by the baseband communication circuit 636. The microcomputer 618 controls the baseband communication circuit 636 to perform processes for sending and receiving audio signals or data.

Modification Examples

Figure 74:
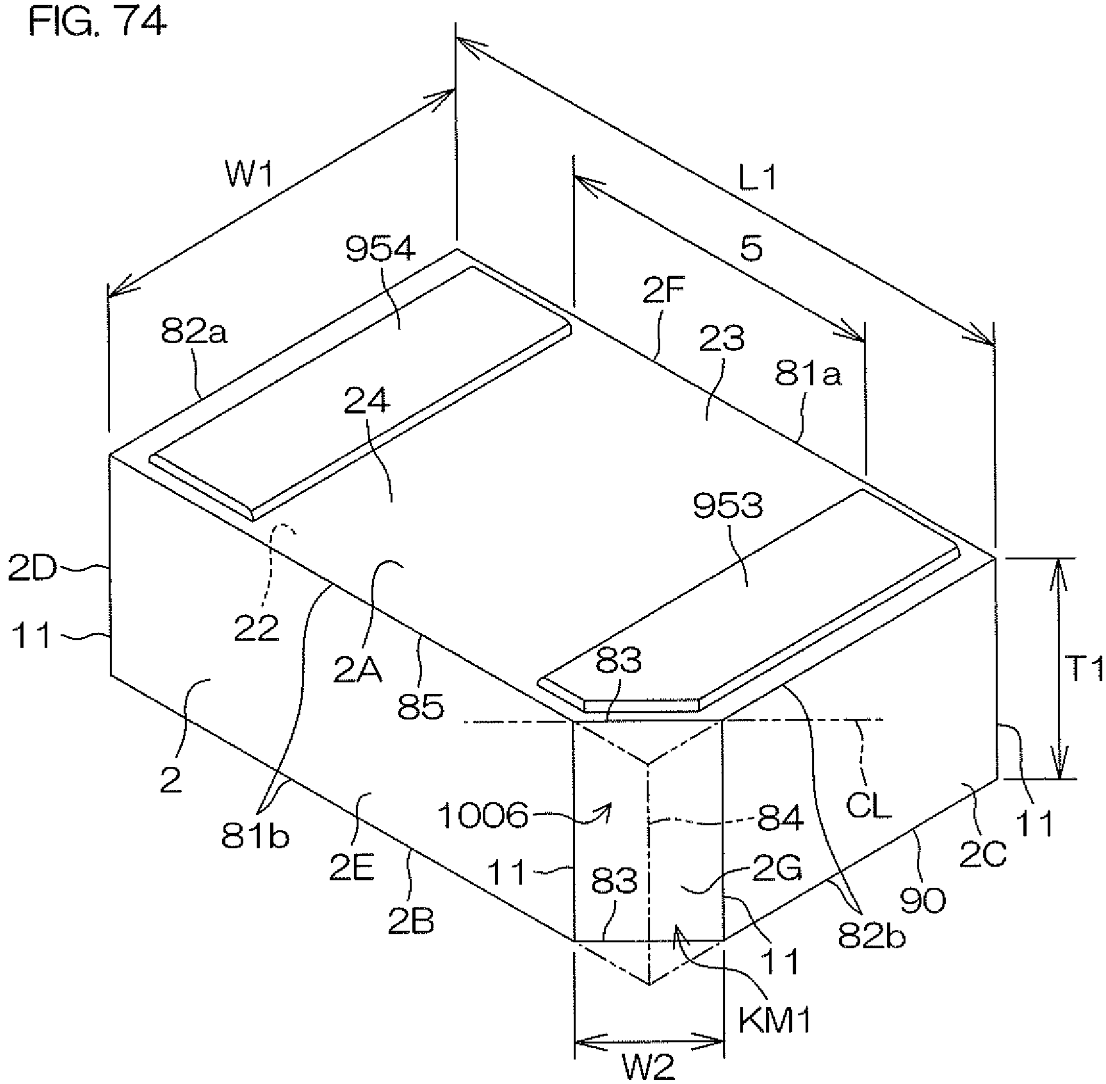
FIG. 74 is a schematic perspective view of a modification example of the chip part shown in FIG. 42.

Although with each of the first to fifth reference examples described above, an example where the first and second connection electrodes 3 and 4 are formed on the side surfaces 2C to 2F and the element forming surface 2A so as to cover the edge portion of the substrate 2 was described, the arrangement shown in FIG. 74 may be adopted instead.

Figure 75:
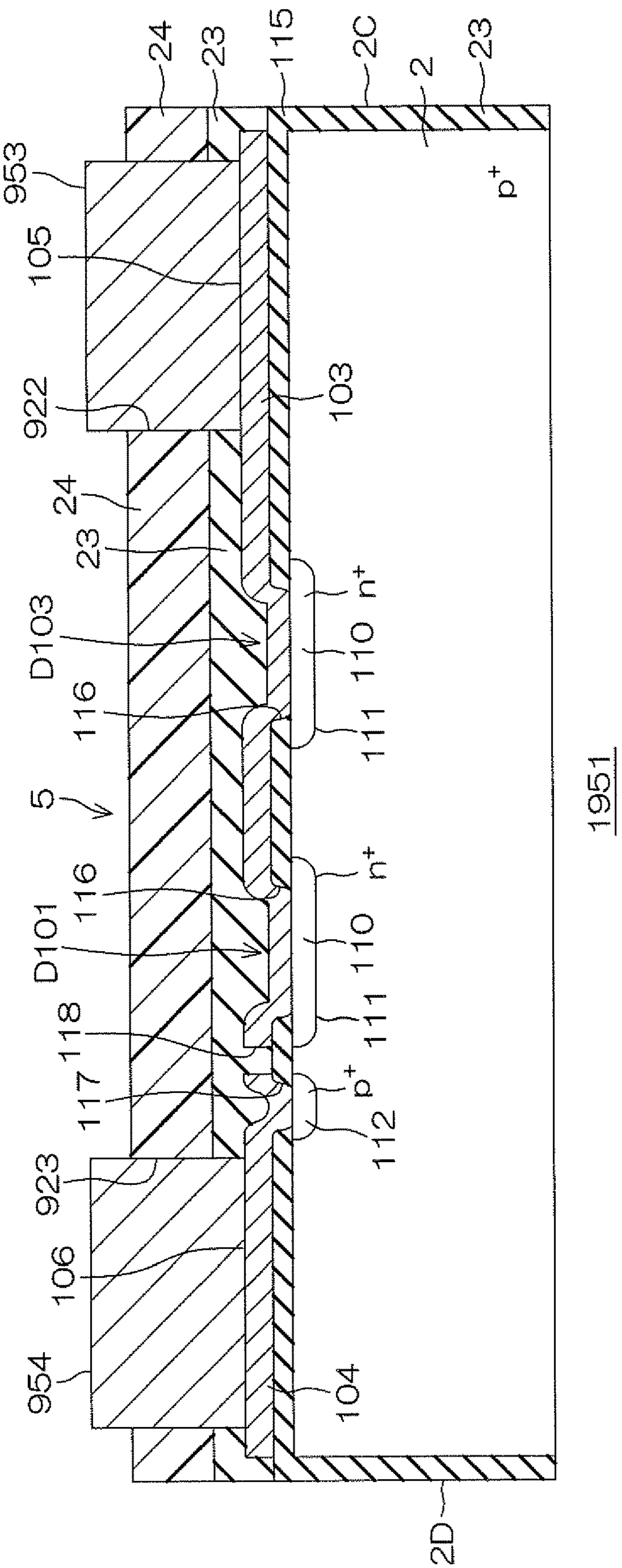
FIG. 75 is a sectional view of the chip part shown in FIG. 74.

FIG. 74 is a schematic perspective view of a modification example (a chip part 1951) of the chip part 1001 shown in FIG. 42. FIG. 75 is a sectional view of the chip part 1951 shown in FIG. 74.

A point of difference of the chip part 1951 according to the modification example with respect to the chip part 1001 according to the first reference example described above is that the first and second connection electrodes 953 and 954 are formed in place of the first and second connection electrodes 3 and 4. Arrangements of other portions are the same as the arrangements of the chip part 1001 according to the first reference example and therefore the same reference symbols shall be provided and description shall be omitted. Although in FIG. 74 and FIG. 75, the chip part 1951 is illustrated as a modification example of the chip part 1001 according to the first reference example, the arrangement with the first and second connection electrodes 953 and 954 may obviously be adopted in any of the second to fifth reference examples described above.

As shown in FIG. 74, the first and second connection electrodes 953 and 954 are disposed at an interval from each other at respective end portions of the element forming surface 2A of the substrate 2 (the end portion of the substrate 2 at the side surface 2C side and the end portion of the substrate 2 at the side surface 2D side). The first and second connection electrodes 953 and 954 are formed only on the element forming surface 2A of the substrate 2 and are not formed so as to cover the side surfaces 2C, 2D, 2E, and 2F of the substrate 2. That is, unlike the first and second connection electrodes 3 and 4 in the first reference example described above, the first and second connection electrodes 953 and 954 do not have the peripheral edge portions 86 and 87.

As shown in FIG. 75, on the substrate 2 (across the entire element forming surface 2A), the passivation film 23 and the resin film 24 are formed to cover the cathode electrode film 103 and the anode electrode film 104. The pad opening 922 that exposes the cathode pad 105 and the pad opening 923 that exposes the anode pad 106 are formed in the passivation film 23 and the resin film 24. The first and second connection electrodes 953 and 954 are formed so as to refill the respective pad openings 922 and 923.

As shown in FIG. 74, the first connection electrode 953 has a portion extending along the chamfer line CL (oblique side 83) that defines the chamfered portion 1006 of the substrate 2. That is, the first connection electrode 953 is formed at the one end portion side of the substrate 2 at which the chamfered portion 1006 is formed and the second connection electrode 954 is formed at the other end portion side of the substrate 2 at which the mutually adjacent side surfaces among the side surfaces 2D, 2E, and 2F are kept mutually perpendicular. Therefore, in the plan view of viewing the element forming surface 2A from the normal direction, the respective end portions of the substrate 2 at which the first and second connection electrodes 953 and 954 are formed have shapes that are not line symmetrical with respect to a straight line orthogonal to the long sides 81(*a*) and 81(*b*) of the substrate 2 (and passing through a center of gravity of the substrate 2). The respective end portions of the substrate 2 at which the first and second connection electrodes 953 and 954 are formed also have shapes that are not point symmetrical with respect to the center of gravity of the substrate 2.

The first and second connection electrodes 953 and 954 may have front surfaces at positions lower (positions closer to the substrate 2) than the front surface of the resin film 24 or, as shown in FIG. 75, may project from the front surface of the resin film 24 and have front surfaces at positions higher (positions further from the substrate 2) than the resin film 24. In the case where the first and second connection electrodes 953 and 954 project from the front surface of the resin film 24, the first and second connection electrodes 953 and 954 may have overlapping portions extending from opening ends of the pad openings 922 and 923 to the front surface of the resin film 24. Also, although an example where the first and second connection electrodes 953 and 954, each constituted of a single layer of a metal material (for example, an Ni layer), are formed is illustrated in FIG. 75, these may instead have the laminated structure of the Ni layer 33/Pd layer 34/Au layer 35 as in the first reference example.

Such a chip part 1951 may be formed by changing the processes of FIG. 49A to FIG. 49H of the first reference example described above. Portions of processes for manufacturing the chip part 1951 that differ from the processes of FIG. 49A to 49H shall now be described with reference to FIG. 76A to FIG. 76D. FIG. 76A to FIG. 76D are sectional views of a method for manufacturing the chip part 1951 shown in FIG. 74.

Figure 76A:
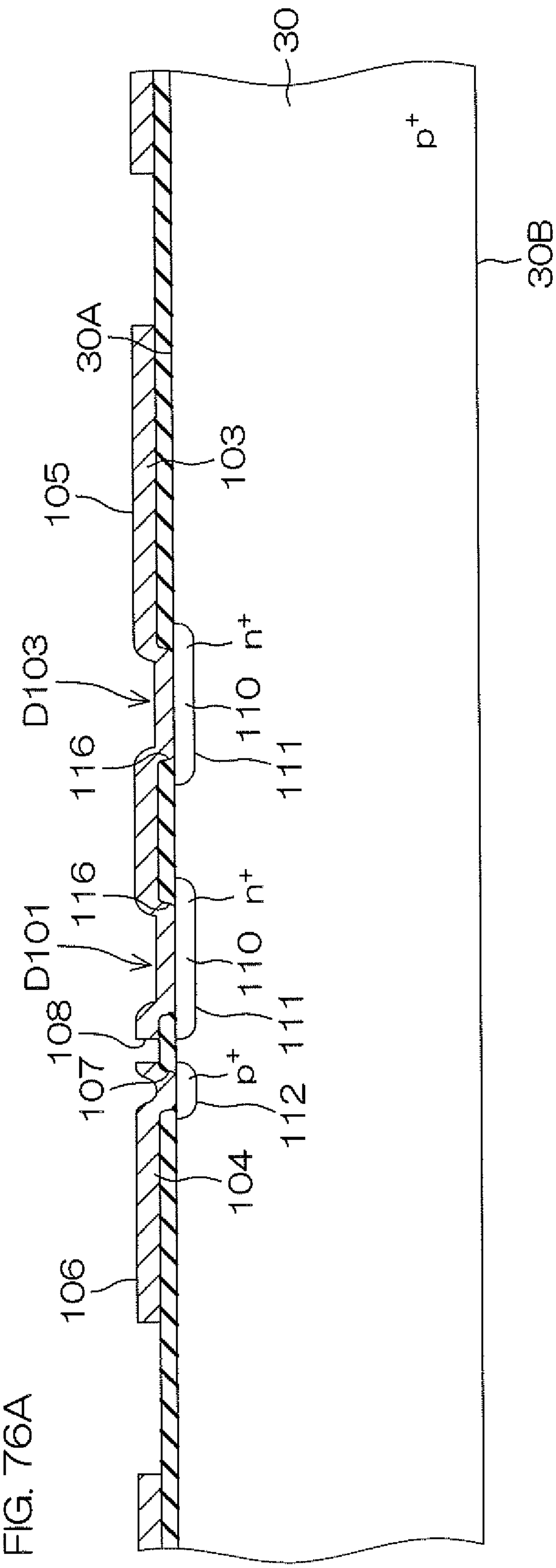
FIG. 76A to FIG. 76D are sectional views of a method for manufacturing the chip part shown in FIG. 74.
Figure 76B:
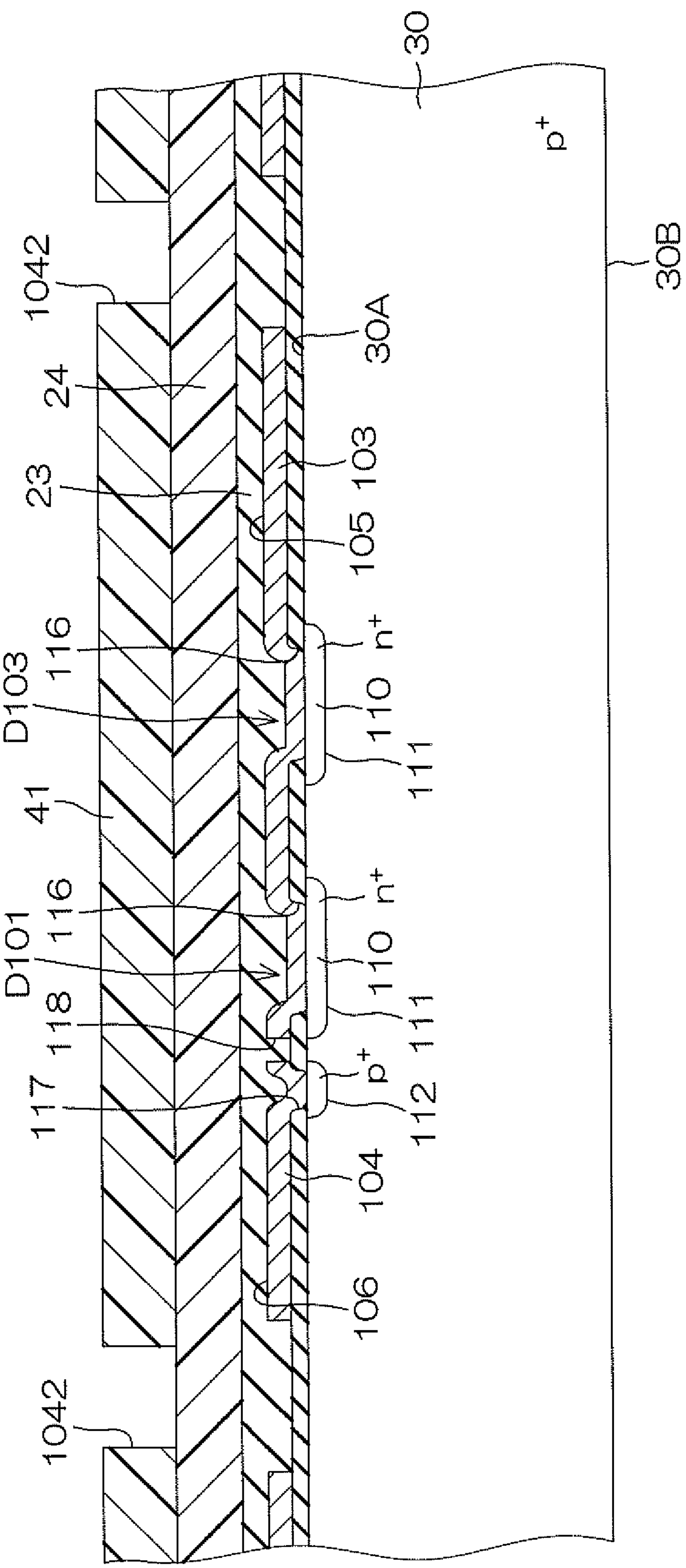

First, as shown in FIG. 76A, the substrate 30 that has undergone the processes of FIG. 49A and FIG. 49B of the first reference example is prepared. Next, as shown in FIG. 76B, the passivation film 23 and the resin film 24 are formed on the entire front surface 30A of the substrate 30 so as to cover the cathode electrode film 103 and the anode electrode film 104. Next, via the same process as that of FIG. 49D, the resist pattern 41, having the opening 1042 (including the rectilinear portions 1042A and 1042B and the chamfered portions 1042C) formed selectively, is formed so as to cover the substrate 30 (see FIG. 50).

Figure 76C:
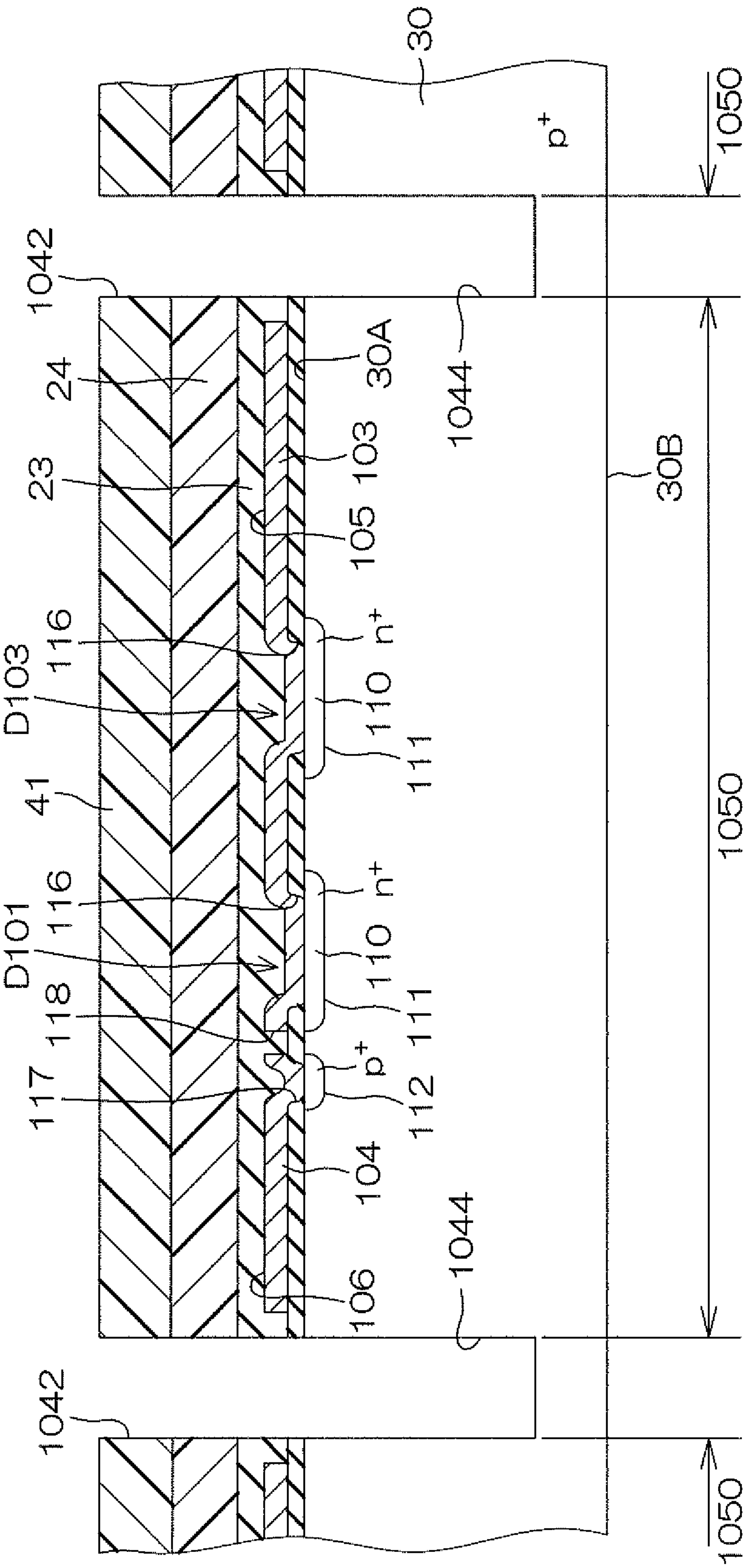

Next, as shown in FIG. 76C, the substrate 30 is removed selectively by plasma etching using the resist pattern 41 as a mask. The groove 1044 of predetermined depth reaching the middle of the thickness of the substrate 30 from the front surface 30A of the substrate 30 is thereby formed at positions matching the opening 1042 of the resist pattern 41 in a plan view, and the semi-finished products 1050 that are aligned and disposed in an array are formed. After the groove 1044 has been formed, the resist pattern 41 is removed.

Figure 76D:
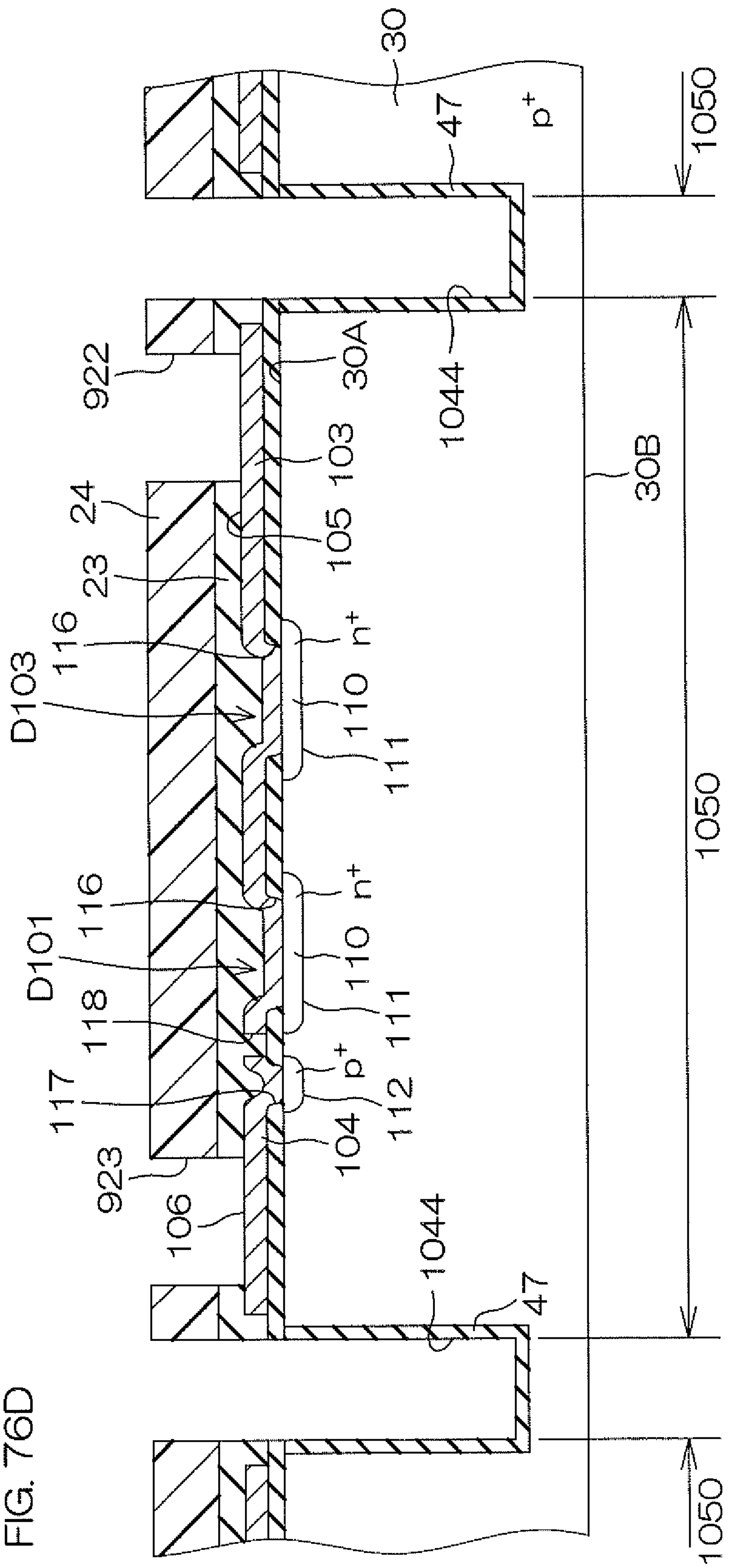

Next, as shown in FIG. 76D, the insulating film 47, constituted of SiN, is formed across the entire front surface 30A (including the wall surfaces of the groove 1044) of the substrate 30 via the same process as that of FIG. 49F. Next, the pad openings 922 and 923 that expose the cathode electrode film 103 and the anode electrode film 104 are formed, for example by etching, so as to penetrate through the passivation film 23 and the resin film 24.

Thereafter, via the same process as the process of FIG. 49G, the first and second connection electrodes 953 and 954 are formed (by plating growth, see FIG. 51) so as to refill the pad openings 922 and 923. The chip parts 1951 (see FIG. 74) that are separated into individual chips are then obtained via the same process as the process of FIG. 49H.

Even with such an arrangement, the same effects as the effects described above with the first to fifth reference examples can be exhibited.

Sixth Reference Example

Figure 77:
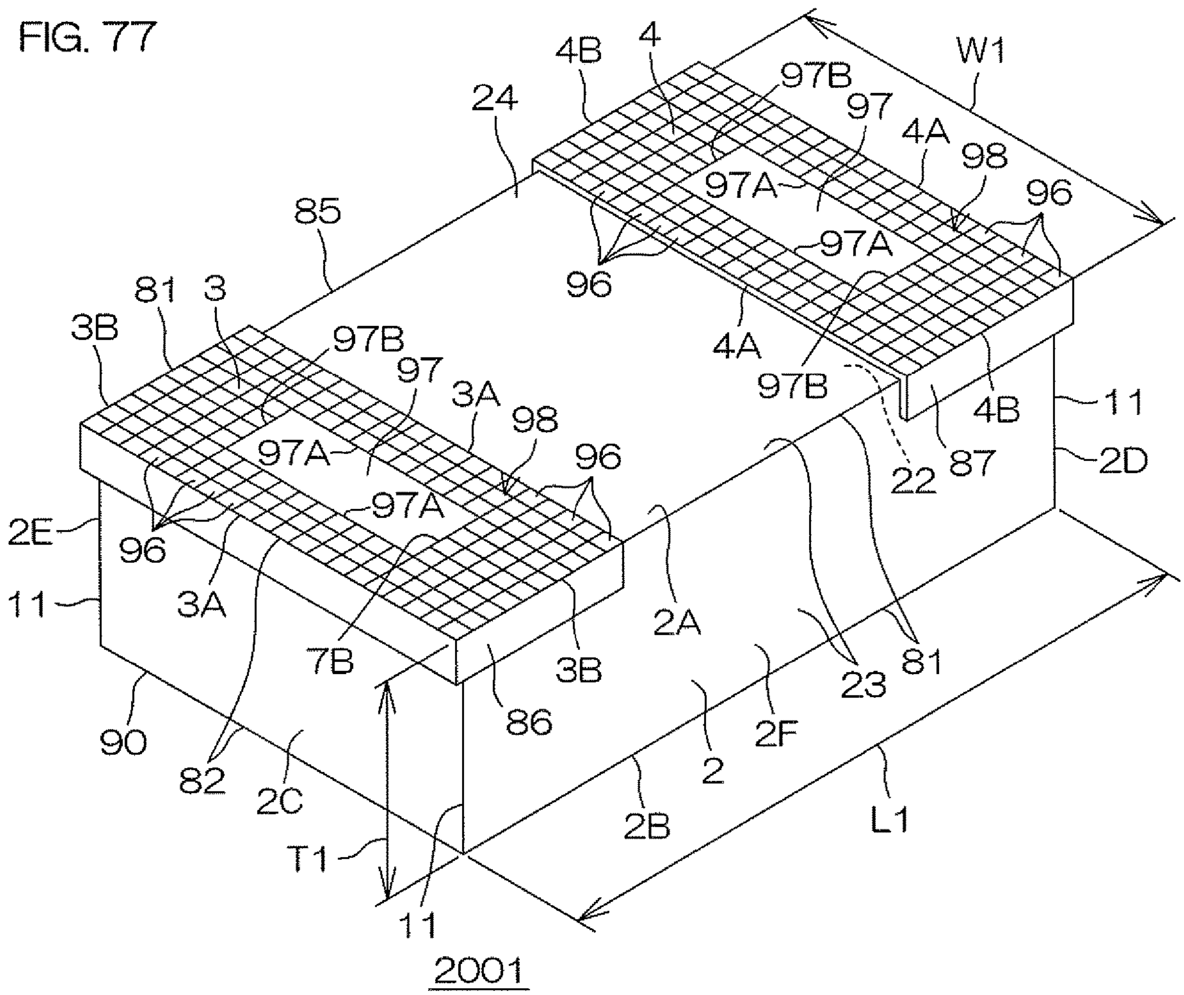
FIG. 77 is a schematic perspective view of a chip part according to a sixth reference example.

FIG. 77 is a schematic perspective view of a chip part 2001 according to a sixth reference example. With the sixth reference example, portions corresponding to the respective portions shown in FIG. 1 to FIG. 76D are provided with the same reference symbols.

The chip part 2001 is a minute chip part and has a substantially rectangular parallelepiped shape as shown in FIG. 77. The planar shape of the chip part 2001 may, for example, be a rectangle (0603 chip) with the length L along the long side 81 being not more than 0.6 mm and the length W1 along the short side 82 being not more than 0.3 mm or may be a rectangle (0402 chip) with the length L1 along the long side 81 being not more than 0.4 mm and the length W1 along the short side 82 being not more than 0.2 mm. More preferably, the dimension of the chip part 2001 is a rectangle (03015 chip) with the length L1 along the long side 81 being 0.3 mm and the length W1 along the short side 82 being 0.15 mm. The chip part 2001 has a thickness T1, for example, of 0.1 mm.

The chip part 2001 mainly includes a semiconductor substrate 2 that constitutes the main body of the chip part 2001, the first and second connection electrodes 3 and 4 that are to be first and second external connection portions, and a circuit element (a bidirectional Zener diode to be described below) electrically connected by the first and second connection electrodes 3 and 4.

The semiconductor substrate 2 has a substantially rectangular parallelepiped chip shape. With the semiconductor substrate 2, one surface constituting the upper surface in FIG. 77 is the element forming surface 2A. The element forming surface 2A is the surface of the semiconductor substrate 2 on which the circuit element is formed and has a substantially oblong shape. The surface at the opposite side of the element forming surface 2A in the thickness direction of the semiconductor substrate 2 is the rear surface 2B. The element forming surface 2A and the rear surface 2B are substantially the same in dimension and same in shape and are parallel to each other. The rectangular edge defined by the pair of long sides 81 and the pair of short sides 82 at the element forming surface 2A shall be referred to as the peripheral edge portion 85 and the rectangular edge defined by the pair of long sides 81 and the pair of short sides 82 at the rear surface 2B shall be referred to as the peripheral edge portion 90. When viewed from the direction of a normal orthogonal to the element forming surface 2A (rear surface 2B), the peripheral edge portion 85 and the peripheral edge portion 90 are overlapped.

As surfaces besides the element forming surface 2A and the rear surface 2B, the semiconductor substrate 2 has the plurality of side surfaces (the side surface 2C, the side surface 2D, the side surface 2E, and the side surface 2F). The plurality of side surfaces 2C to 2F extend so as to intersect (specifically, so as to be orthogonal to) each of the element forming surface 2A and the rear surface 2B and join the element forming surface 2A and the rear surface 2B.

The side surface 2C is constructed between the short sides 82 at one side in a long direction (the front left side in FIG. 77) of the element forming surface 2A and the rear surface 2B, and the side surface 2D is constructed between the short sides 82 at the other side in the long direction (the inner right side in FIG. 77) of the element forming surface 2A and the rear surface 2B. The side surface 2C and the side surface 2D are the respective end surfaces of the semiconductor substrate 2 in the long direction. The side surface 2E is constructed between the long sides 81 at one side in a short direction (the inner left side in FIG. 77) of the element forming surface 2A and the rear surface 2B, and the side surface 2F is constructed between the long sides 81 at the other side in the short direction (the front right side in FIG. 77) of the element forming surface 2A and the rear surface 2B. The side surface 2E and the side surface 2F are the respective end surfaces of the semiconductor substrate 2 in the short direction. Each of the side surface 2C and the side surface 2D intersects (specifically, is orthogonal to) each of the side surface 2E and the side surface 2F. Mutually adjacent surfaces among the element forming surface 2A to side surface 2F thus form a right angle.

With the semiconductor substrate 2, the respective entireties of the element forming surface 2A and the side surfaces 2C to 2F are covered by the passivation film 23. Therefore to be exact, the respective entireties of the element forming surface 2A and the side surfaces 2C to 2F in FIG. 77 are positioned at the inner sides (rear sides) of the passivation film 23 and are not exposed to the exterior. The chip part 2001 further has the resin film 24. The resin film 24 covers the entirety (the peripheral edge portion 85 and a region at the inner side thereof) of the passivation film 23 on the element forming surface 2A. The passivation film 23 and the resin film 24 shall be described in detail later.

The first and second connection electrodes 3 and 4 are disposed at the one end portion and the other end portion of the element forming surface 2A and are formed across an interval from each other.

The first connection electrode 3 has the pair of long sides 3A and the pair of short sides 3B that define four sides in a plan view and the peripheral edge portion 86. The long sides 3A and the short sides 3B of the first connection electrode 3 are orthogonal in a plan view. The peripheral edge portion 86 of the first connection electrode 3 is formed integrally on the element forming surface 2A of the semiconductor substrate 2 so as to extend from the element forming surface 2A to the side surfaces 2C, 2E, and 2F and thereby cover the peripheral edge portion 85. In the present reference example, the peripheral edge portion 86 is formed so as to cover the respective corner portions 11 at which the side surfaces 2C, 2E, and 2F of the semiconductor substrate 2 intersect mutually.

On the other hand, the second connection electrode 4 has the pair of long sides 4A and the pair of short sides 4B that define four sides in a plan view and the peripheral edge portion 87. The long sides 4A and the short sides 4B of the second connection electrode 4 are orthogonal in a plan view. The peripheral edge portion 87 of the second connection electrode 4 is formed integrally on the element forming surface 2A of the semiconductor substrate 2 so as to extend from the element forming surface 2A to the side surfaces 2D, 2E, and 2F and thereby cover the peripheral edge portion 85. In the present reference example, the peripheral edge portion 87 is formed so as to cover the respective corner portions 11 at which the side surfaces 2D, 2E, and 2F of the semiconductor substrate 2 intersect mutually.

With the semiconductor substrate 2, each corner portion 11 may have a chamfered rounded shape in a plan view. In this case, the structure is made capable of suppressing chipping during a manufacturing process or mounting of the chip part 2001.

As shown in FIG. 77, in the plan view of viewing from the direction of the normal orthogonal to the element forming surface 2A (rear surface 2B), a flat portion 97 and a projection formation portion 98 are formed on the front surface of each of the first and second connection electrodes 3 and 4. The flat portion 97 is a portion at which the front surface of each of the first and second connection electrodes 3 and 4 is formed flatly and the projection formation portion 98 is a portion in which a plurality of projections 96 are formed.

The flat portion 97 is formed at an inner portion of each of the first and second connection electrodes 3 and 4 and is formed to a substantially oblong shape in a plan view so as to extend along the long direction of the long side 3A or 4A of the first or second connection electrode 3 and 4. The flat portion 97 has a pair of long sides 97A and a pair of short sides 97 that define four sides in a plan view and has a surface area greater than the surface area of each projection 96. Although the surface area of the flat portion 97 is changed as suited according to the size of the chip part 2001, preferably, the length of the long side 97A of the flat portion 97 is at least not less than 60 μm and the length of the short side 97B is at least not less than 40 μm.

Each projection formation portion 98 is formed so as to surround the flat portion 97. At the projection formation portion 98, the plurality of projections 96 are formed in a pattern of being aligned in an array at fixed intervals in a row direction and a column direction that are mutually orthogonal. Each projection 96 is, for example, formed to be rectangular in a plan view, and the size (area in a plan view) thereof is, for example, preferably 5 μm×5 μm to 20 μm×20 μm. As a matter of course, each projection 96 is not restricted to being rectangular in a plan view and the shape thereof may be changed as suited as long as the area is within the above range.

The circuit element is formed in a region of the element forming surface 2A of the semiconductor substrate 2 between the first connection electrode 3 and the second connection electrode 4 and is covered from above by the passivation film 23 and the resin film 24.

Figure 78:
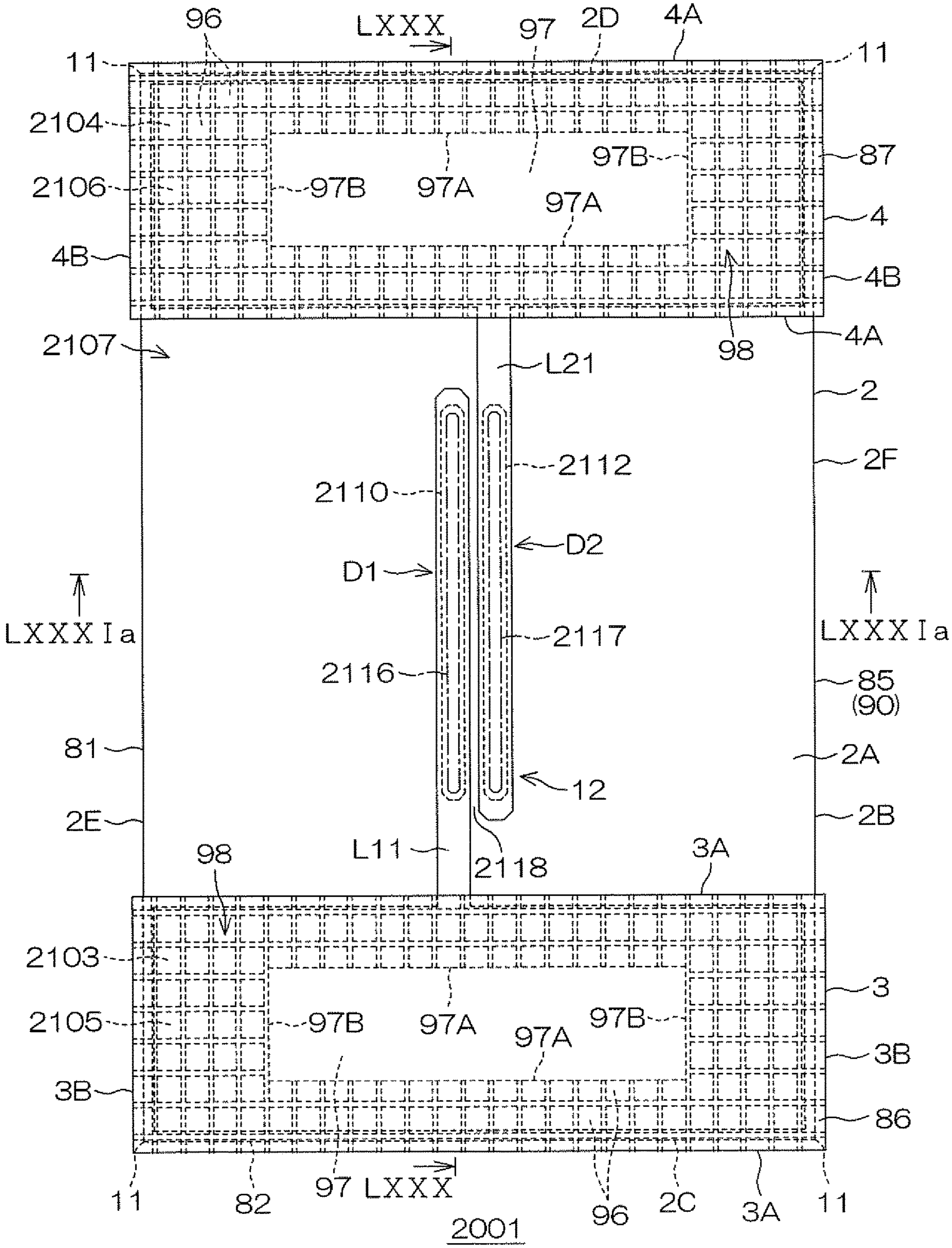
FIG. 78 is a perspective plan view of the chip part shown in FIG. 77.
Figure 79:
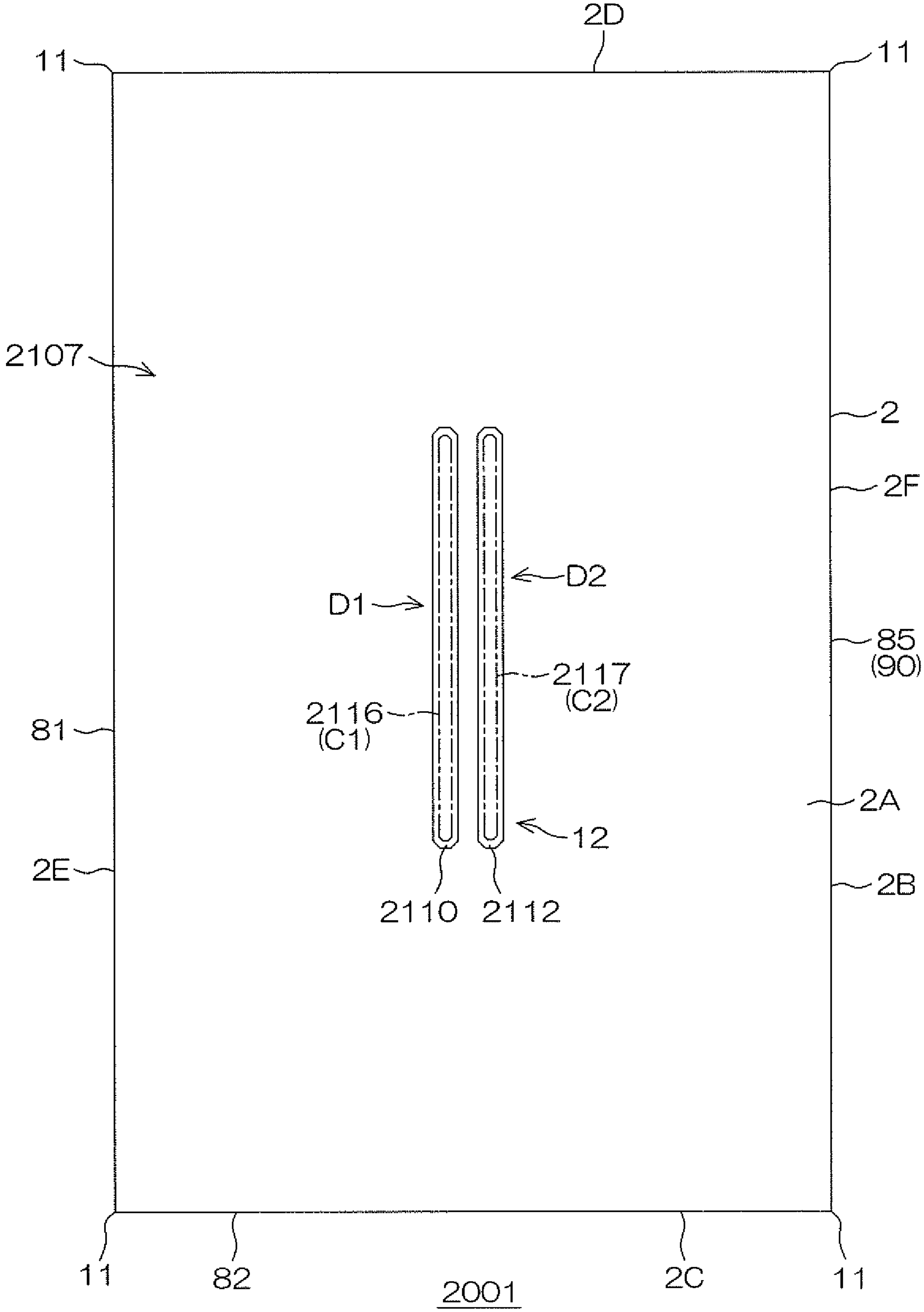
FIG. 79 is a plan view of the structure of a front surface of a semiconductor substrate, with connection electrodes and the arrangement formed thereon of FIG. 78 being removed.
Figure 80:
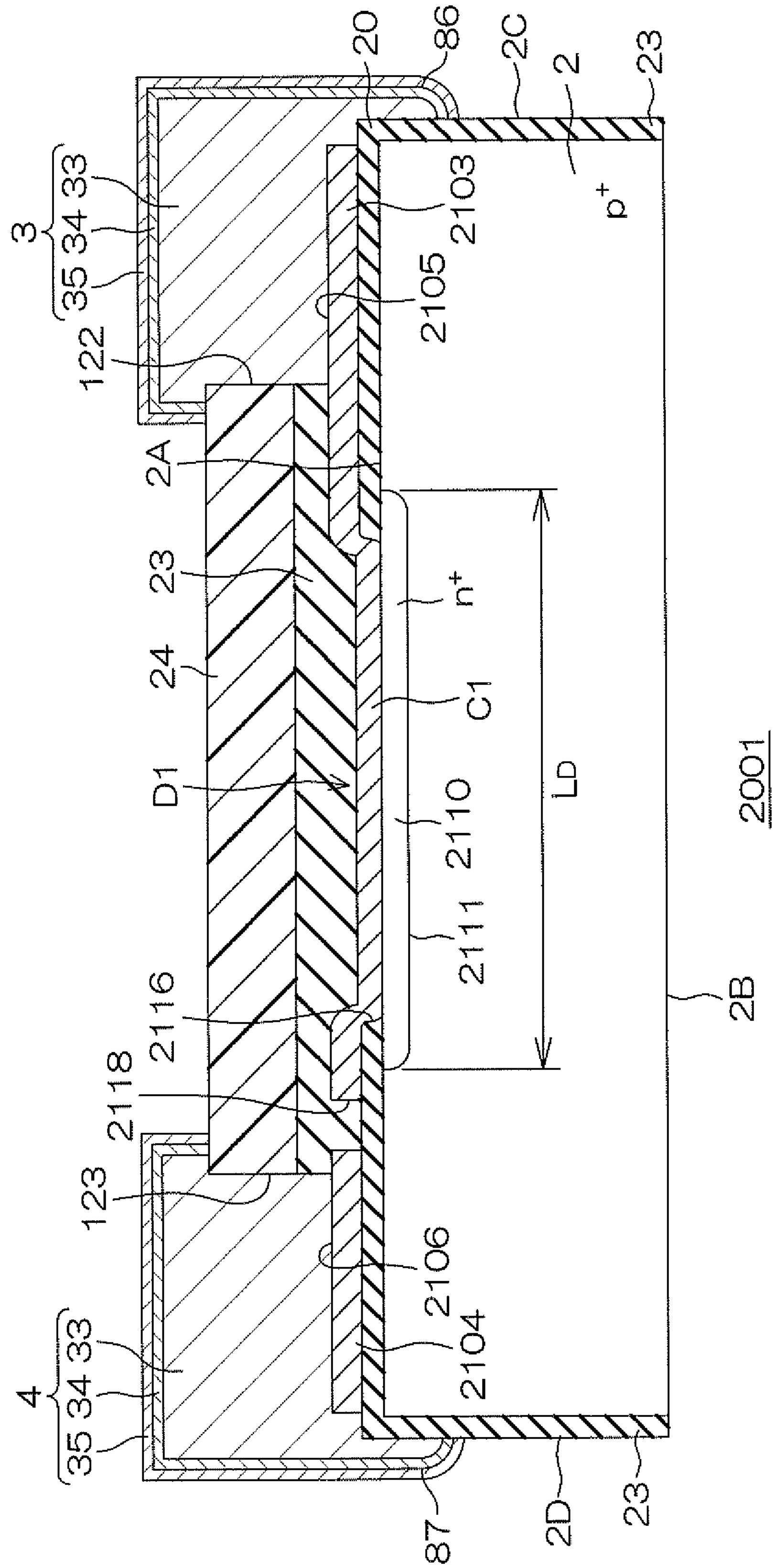
FIG. 80 is a sectional view taken along section line LXXX-LXXX shown in FIG. 78.
Figure 81A:
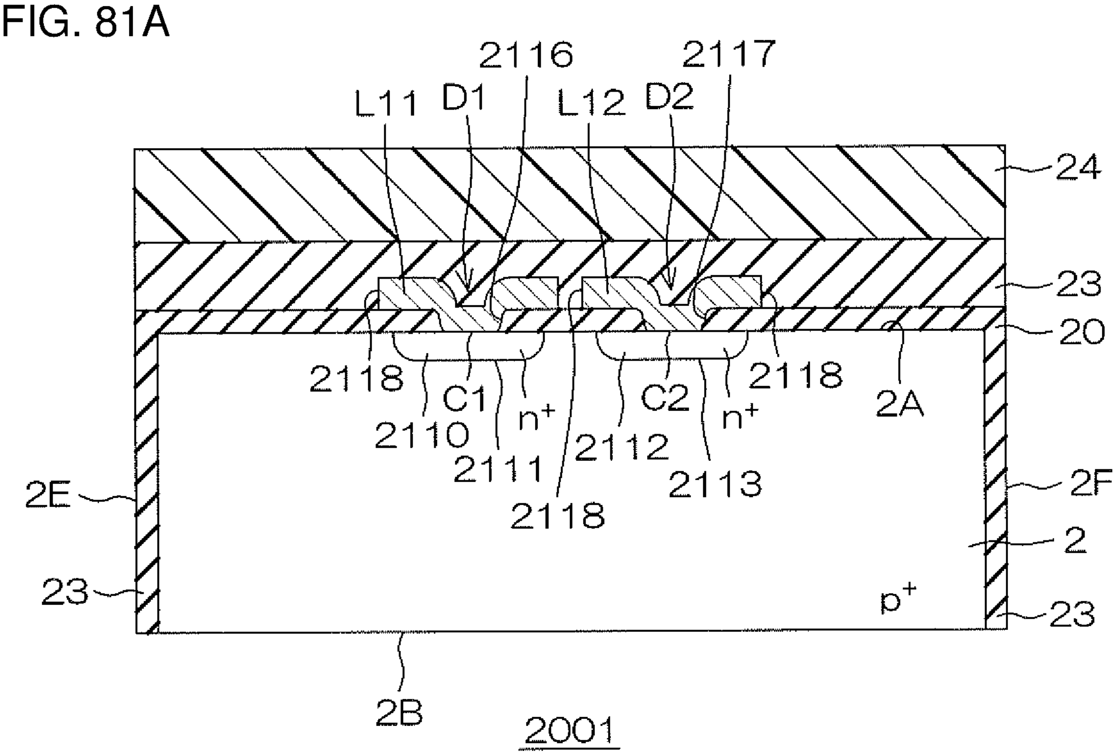
FIG. 81A is a sectional view taken along section line LXXXIa-LXXXIa shown in FIG. 78
Figure 81B:
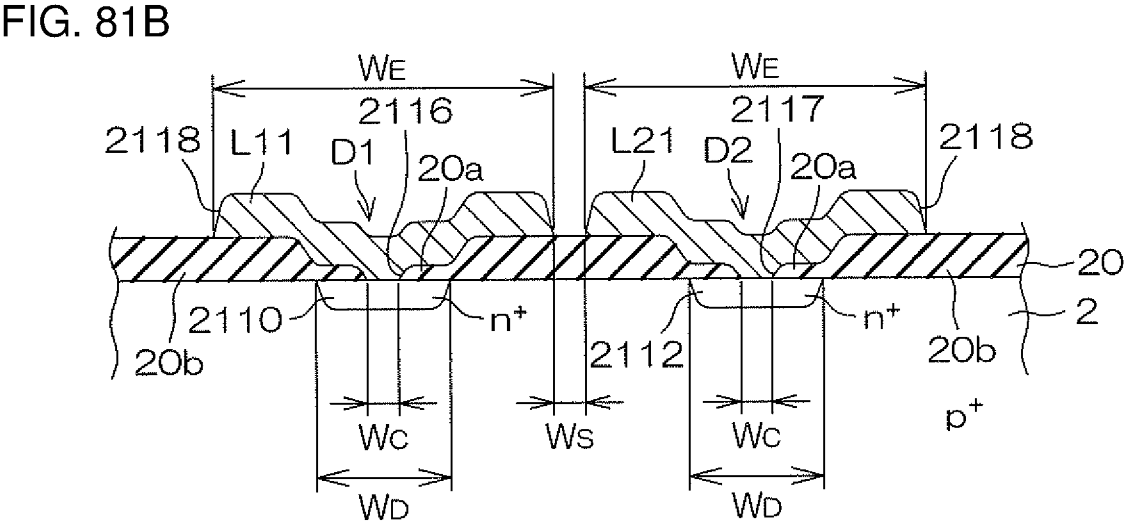
FIG. 81B is an enlarged sectional view of a first Zener diode and a second Zener diode shown in FIG. 81A.

FIG. 78 is a schematic plan view of the chip part 2001 shown in FIG. 77. FIG. 79 is a plan view of the structure of the front surface (element forming surface 2A) of the semiconductor substrate 2, with the first and second connection electrodes 3 and 4 and the arrangement formed thereon of FIG. 78 being removed. FIG. 80 is a sectional view taken along section line LXXX-LXXX shown in FIG. 78. FIG. 81(*a*) is a sectional view taken along section line LXXXIa-LXXXIa shown in FIG. 78 and FIG. 81(*b*) is an enlarged sectional view of a first Zener diode D1 shown in FIG. 81(*a*).

The chip part 2001 is a bidirectional Zener diode chip that includes one parallel structure 12 in which the first Zener diode D1 and a second Zener diode D2 are formed so as to be parallel to each other. With the chip part 2001, a satisfactory ESD (electrostatic discharge) resistance and/or a satisfactory inter-terminal capacitance $C_t$ (total capacitance between the first connection electrode 3 and the second connection electrode 4) are intended to be achieved by the forming of one or a plurality (two or more) parallel structures 12.

In the following description, a number of parallels of "1," a number of parallels of "2," a number of parallels of "3," . . . shall be used to count the number of parallel structures 12 formed on the semiconductor substrate 2. Also in the following description, the structure of the chip part 2001 for the case of the number of parallels of "1" shall be described as a minimum unit.

As shown in FIG. 80 and FIG. 81, the semiconductor substrate 2 is a $p^+$-type semiconductor substrate (a silicon substrate). As shown in FIG. 78, in the semiconductor substrate 2, a rectangular diode forming region 2107 is provided in the element forming surface 2A between the first and second connection electrodes 3 and 4. The one parallel structure 12 is formed in the diode forming region 2107.

The parallel structure 12 includes the first Zener diode D1 connected to the first connection electrode 3 and the second Zener diode D2 connected to the second connection electrode 4 and connected anti-serially to the first Zener diode D1. The first Zener diode D1 is constituted of a first $n^+$-type diffusion region (hereinafter referred to as the "first diffusion region 2110") and a portion of the semiconductor substrate 2 in the vicinity of the first diffusion region 2110. Similarly, the second Zener diode D2 is constituted of a second $n^+$-type diffusion region (hereinafter referred to as the "second diffusion region 2112") and a portion of the semiconductor substrate 2 in the vicinity of the second diffusion region 2112.

As shown in FIG. 78 and FIG. 79, the first diffusion region 2110 is formed in a surface layer region of the semiconductor substrate 2 and forms a pn-junction region with the semiconductor substrate 2. Also, the second diffusion region 2112 is formed in a surface layer region of the semiconductor substrate 2 and forms a pn-junction region with the semiconductor substrate 2.

The first and second diffusion regions 2110 and 2112 are aligned at an interval from each other along the short direction of the semiconductor substrate 2 and are formed to long shapes extending in directions that intersect (in the present reference example, directions that are orthogonal to) the short direction of the semiconductor substrate 2. In the present reference example, the first and second diffusion regions 2110 and 2112 are formed to be the same in area and the same in shape. Specifically, in a plan view, each of the first diffusion region 2110 and the second diffusion region 2112 is formed to a substantially rectangular shape that is long in the long direction of the semiconductor substrate 2 and has the four corners cut. A length $L_D$ (see FIG. 80) of each of first and the second diffusion regions 2110 and 2112 in the direction intersecting the short direction is 20 μm to 200 μm.

As shown in FIG. 80 and FIG. 81(*a*), an insulating film 20 (omitted from illustration in FIG. 78) is formed on the element forming surface 2A of the semiconductor substrate 2. As shown in FIG. 81(*b*), the insulating film 20 includes thin film portions 20*a* and a thick film portion 20*b*. The thick film portion 20*b* of the insulating film 20 is formed to contact the front surface of the semiconductor substrate 2 outside a region in which the first and second diffusion regions 2110 and 2112 are formed. The thin film portions 20*a* of the insulating film 20 are formed to contact the first and second diffusion regions 2110 and 2112. In the thin film portions 20*a* are formed a first contact hole 2116 exposing a front surface of the first diffusion region 2110 (more specifically, a front surface central portion of the first diffusion region 2110) and a second contact hole 2117 exposing a front surface of the second diffusion region 2112 (more specifically, a front surface central portion of the second diffusion region 2112). Each of the first and second diffusion regions 2110 and 2112 is thereby made to have a peripheral edge portion covered by the thin film portion 20*a* of the insulating film 20 and a central portion exposed from the thin film portion 20*a*.

A first electrode film 2103 as an example of a first electrode and a second electrode film 2104 as an example of a second electrode are formed on the front surface of the insulating film 20. In the present reference example, the first electrode film 2103 and the second electrode film 2104 are made of the same material and, for example, Al films are used.

The first electrode film 2103 includes a lead-out electrode L11 connected to the first diffusion region 2110 and a first pad 2105 formed integral to the lead-out electrode L11. The first pad 2105 is formed to a rectangle at one end portion of the element forming surface 2A. The first connection electrode 3 is connected to the first pad 2105. The first connection electrode 3 is thereby electrically connected to the lead-out electrode L11 via the first pad 2105 (first electrode film 2103).

The lead-out electrode L11 is formed rectilinearly along a straight line passing above the first diffusion region 2110 and leading to the first pad 2105 so as to cover the first diffusion region 2110. The lead-out electrode L11 has a uniform width $W_E$ at all locations between the first diffusion region 2110 and the first pad 2105 (see FIG. 81(*b*)). The width WE of the lead-out electrode L11 is defined to be wider than a width $W_D$ of the first diffusion region 2110.

A tip end portion of the lead-out electrode L11 is shaped to match the planar shape of the first diffusion region 2110. A base end portion of the lead-out electrode L11 is connected to the first pad 2105. The lead-out electrode L11 enters into the first contact hole 2116 from the front surface of the insulating film 20 and forms an ohmic contact with the first diffusion region 2110 inside the first contact hole 2116. In the lead-out electrode L11, the portion bonded to the Zener diode D1 inside the first contact hole 2116 constitutes a bonding portion C1.

The second electrode film 2104 includes a lead-out electrode L21 connected to the second diffusion region 2112 and a second pad 2106 formed integral to the lead-out electrode L21. The second pad 2106 is formed to a rectangle at one end portion of the element forming surface 2A. The second connection electrode 4 is connected to the second pad 2106. The second connection electrode 4 is thereby electrically connected to the lead-out electrode L21 via the second pad 2106 (second electrode film 2104).

The lead-out electrode L21 is formed rectilinearly along a straight line passing above the second diffusion region 2112 and leading to the second pad 2106 so as to cover the second diffusion region 2112. The lead-out electrode L21 has the uniform width $W_E$ at all locations between the second diffusion region 2112 and the second pad 2106 (see FIG. 81(*b*)). The width $W_E$ of the lead-out electrode L21 is defined to be wider than a width $W_D$ of the second diffusion region 2112.

A tip end portion of the lead-out electrode L21 is shaped to match the planar shape of the second diffusion region 2112. A base end portion of the lead-out electrode L21 is connected to the second pad 2106. The lead-out electrode L21 enters into the second contact hole 2117 from the front surface of the insulating film 20 and forms an ohmic contact with the second diffusion region 2112 inside the second contact hole 2117. In the lead-out electrode L21, the portion bonded to the Zener diode D2 inside the second contact hole 2117 constitutes a bonding portion C2.

A slit 2118, which electrically separates the first electrode film 2103 and the second electrode film 2104 and borders respective peripheral edge portions of the lead-out electrodes L11 and L21, is formed on the thick film portion 20*b* of the insulating film 20.

As shown in FIG. 81(*b*), the width $W_D$ of each of the first and second diffusion regions 2110 and 2112 is 5 μm to 20 μm. Also, a width $W_C$ of each of the first and second contact holes 2116 and 2117 is 10 μm to 15 μm. Also, the width $W_E$ of each of the lead-out electrodes L11 and L21 is 12 μm to 20 μm. Also, a width $W_S$ across the slit 2118 between the first and second diffusion regions 2110 and 2112 is 3 μm to 10 μm. In the present reference example, the respective widths $W_C$, $W_D$, $W_E$, and $W_S$ of the first diffusion region 2110 and the respective widths $W_C$, $W_D$, $W_E$, and $W_S$ of the second diffusion region 2112 are set to be mutually equal respectively. The respective widths $W_C$, $W_D$, $W_E$, and $W_S$ shown in FIG. 81(*b*) are all defined as widths in directions orthogonal to the direction in which the lead-out electrodes L11 and L21 are lead out.

The first and second electrode films 2103 and 2104 are formed so that the first and second lead-out electrodes L11 and L21 are parallel to each other. Also, the first connection electrode 3 plus the first diffusion region 2110 and the second connection electrode 4 plus the second diffusion region 2112 are arranged to be mutually symmetrical in a plan view. More specifically, the first connection electrode 3 plus the first diffusion region 2110 and the second connection electrode 4 plus the second diffusion region 2112 are arranged to be point symmetrical with respect to a center of gravity of the element forming surface 2A in a plan view. The chip part 2001 is thus made to have the one parallel structure 12 that includes the first Zener diode D1 and the second Zener diode D2 that are formed to be mutually parallel.

The first electrode film 2103 and the second electrode film 2104 are covered by the passivation film 23 (omitted from illustration in FIG. 78), constituted, for example, of a nitride film, and the resin film 24, made of polyimide (photosensitive polyimide), etc., is further formed on the passivation film 23. The notched portions 122 and 123 exposing peripheral edge portions facing side face portions of the first and second connection electrodes 3 and 4 are formed in the passivation film 23 and the resin film 24.

The arrangement of the flat portion 97 and the arrangement of the projection formation portion 98 (projections 96) formed in each of the first and second connection electrodes 3 and 4 of the chip part 2001 shall now be described in detail with reference to FIG. 82 to FIG. 84.

Figure 82A:
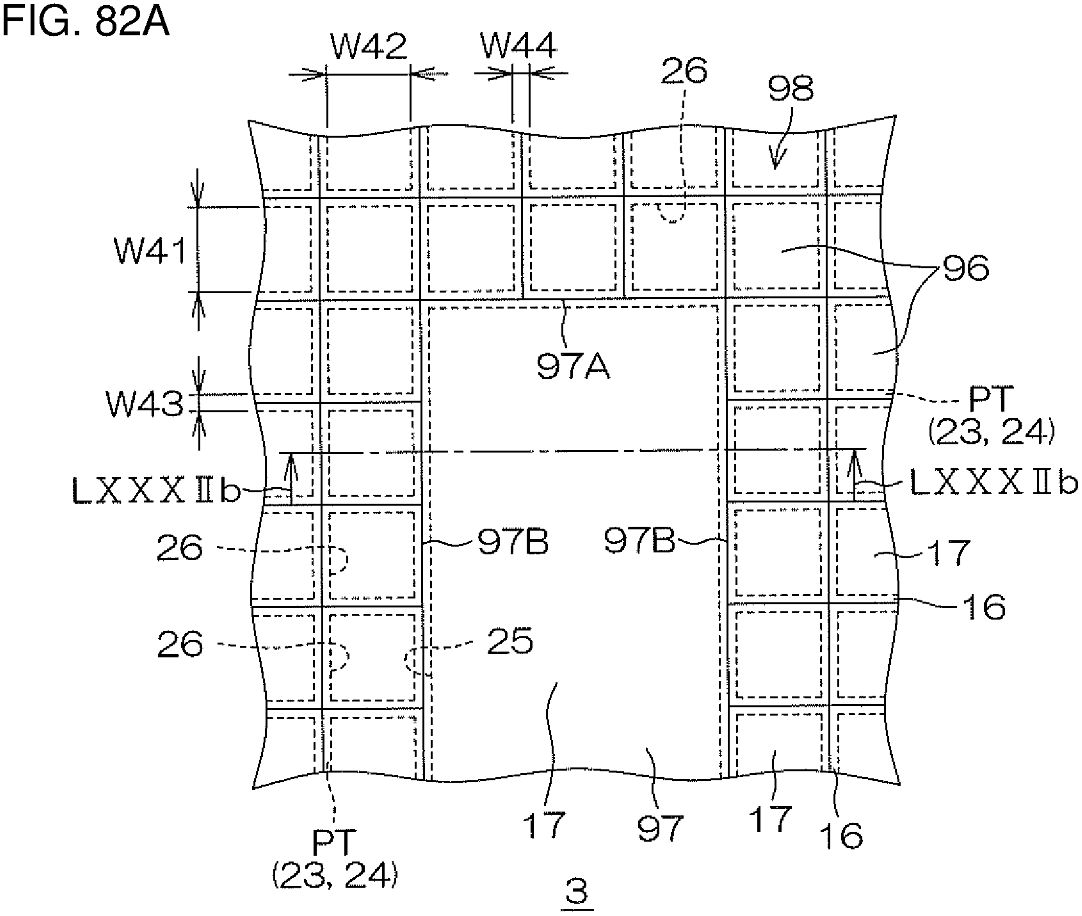
FIG. 82A is a partially enlarged view of a connection electrode shown in FIG. 78
Figure 82B:
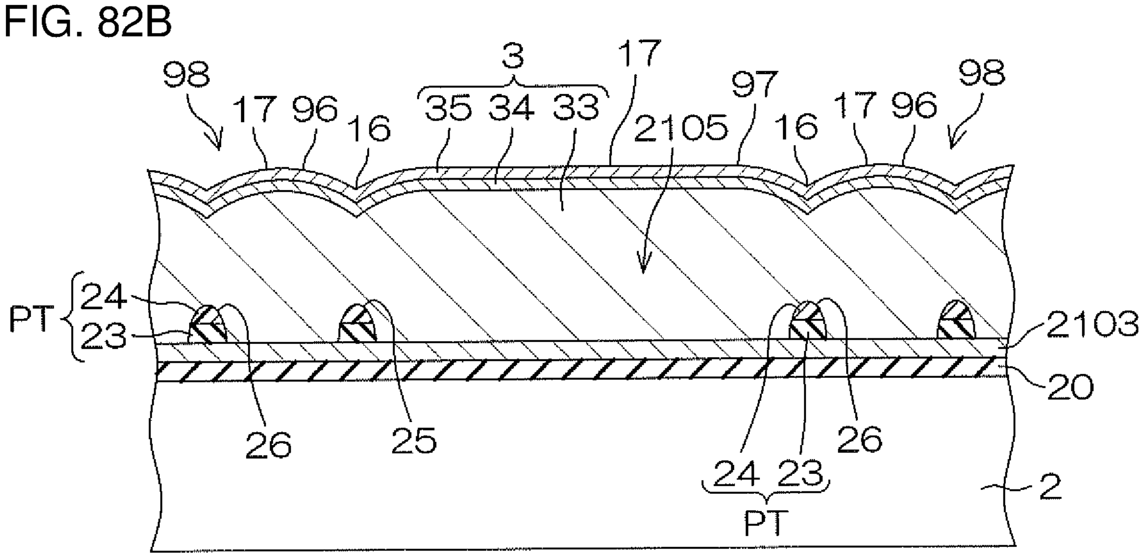
FIG. 82B is a sectional view taken along section line LXXXIIa-LXXXIIa shown in FIG. 82A.

FIG. 82(*a*) is a partially enlarged plan view of the flat portion 97 of the first connection electrode 3 shown in FIG. 78 and FIG. 82(*b*) is a sectional view taken along section line LXXXIIa-LXXXIIa of FIG. 82(*a*). FIG. 83(*a*) is a partially enlarged plan view of the projection formation portion 98 of the first connection electrode 3 shown in FIG. 78 and FIG. 83(*b*) is a sectional view taken along section line LXXXIIIb-LXXXIIIb of FIG. 83(*a*). In FIG. 82 and FIG. 83, the region in which the second connection electrode 4 is formed is omitted from illustration because it is equivalent in arrangement to the region in which the first connection electrode 3 is formed.

Figure 83A:
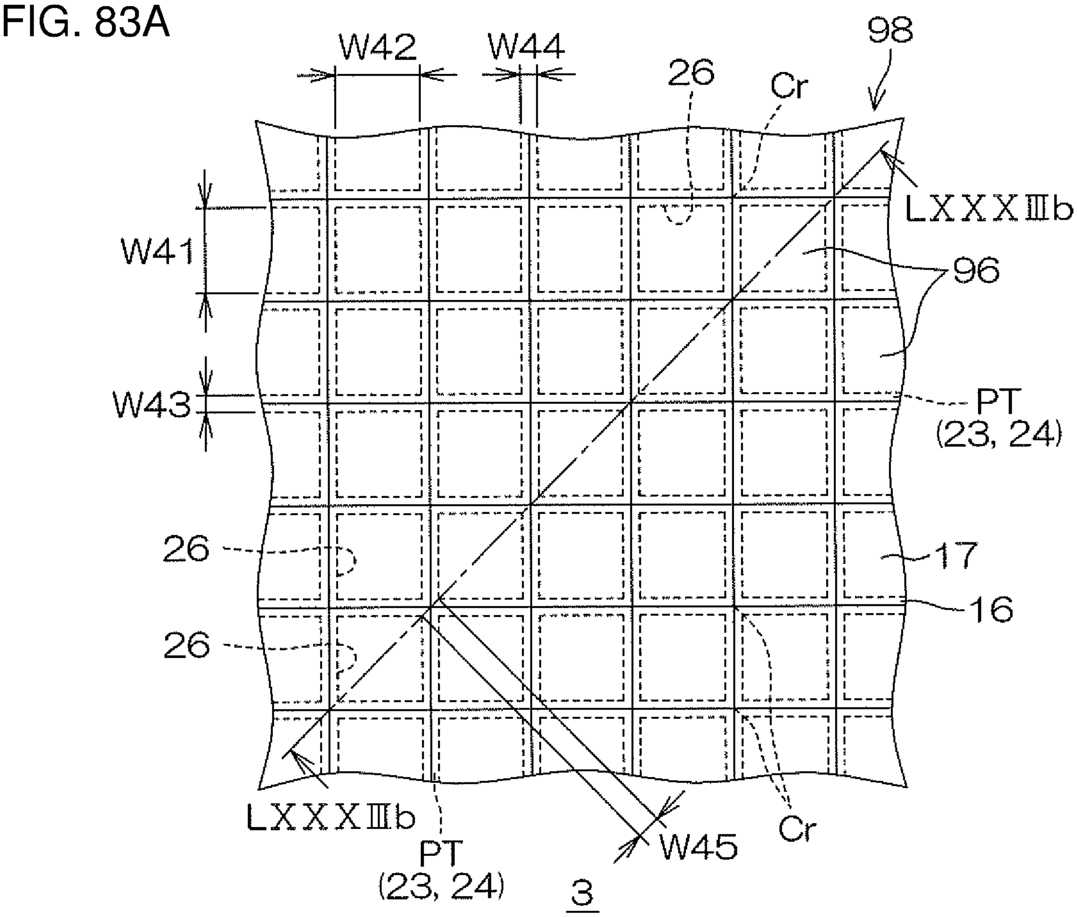
FIG. 83A is a partially enlarged plan view of the connection electrode shown in FIG. 78
Figure 83B:
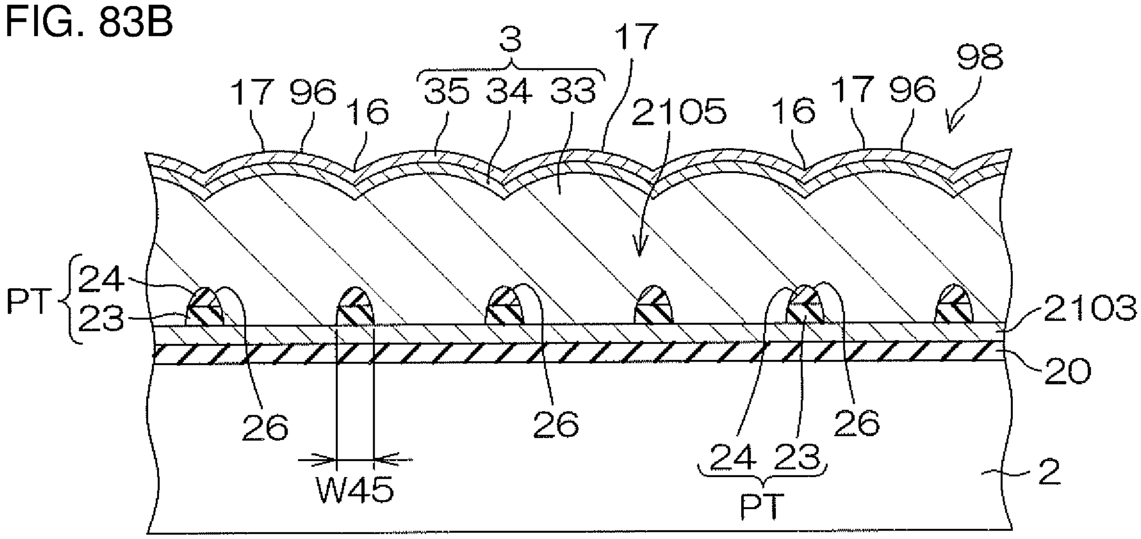
FIG. 83B is a sectional view taken along section line LXXXIIIb-LXXXIIIb shown in FIG. 83A.

As shown in FIG. 82(*b*) and FIG. 83(*b*), in the region in which the first connection electrode 3 is formed, the insulating film 20 and the first electrode film 2103 are formed in that order on the semiconductor substrate 2 as mentioned above. A pattern PT selectively exposing the front surface of the first electrode film 2103 is further formed on the front surface of the first electrode film 2103. The pattern PT is an insulating pattern and includes the passivation film 23 and the resin film 24 formed on the passivation film 23.

In the respective sectional views of FIG. 82(*b*) and FIG. 83(*b*), the pattern PT is formed a substantially arcuate shape that smoothly connects an apex portion formed on the front surface of the resin film 24 and a bottom portion constituted of respective end portions of the passivation film 23. In the pattern PT are formed a first opening 25 that exposes the front surface of the first electrode film 2103 across a relatively wide area and a plurality of second openings 26 that expose the front surface of the first electrode film 2103 across an area narrower than the first opening 25.

The first opening 25 is formed in a region directly below the region of the first connection electrode 3 in which the flat portion 97 is formed. More specifically, as shown in FIG. 82, the first opening 25 is formed along a region directly below the long sides 97A and the short sides 97B of the flat portion 97 so as to be similar in shape to the flat portion 97. A length of a side of the first opening 25 corresponding to the long side 97A of the flat portion 97 is at least not less than 60 μm and a length of a side corresponding to the short side 97B of the flat portion 97 is at least not less than 40 μm.

On the other hand, as shown in FIGS. 83(*a*) and 83(*b*), in a region directly below the portion in which the plurality of projections 96 are formed, the plurality of second openings 26 are formed so as to expose the front surface of the first electrode film 2103 in a lattice at fixed intervals in the row direction and the column direction that are orthogonal to each other. The plurality of second openings 26 are formed to be similar in shape to the plurality of projections 96. A width W41 in the column direction of each second opening 26 is, for example, 5 μm to 20 μm, and a width W42 in the row direction of each second opening 26 is, for example, 5 μm to 20 μm. A width W43 between second openings 26 that are mutually adjacent in the column direction is, for example, 5 μm to 10 μm, and a width W44 between second openings 26 that are mutually adjacent in the row direction is, for example, 5 μm to 10 μm.

By the pattern PT in which the first and second openings 25 and 26 are formed, the first pad 2015 is formed as an uneven electrode pad. The first connection electrode 3 is formed on the uneven first pad 2105 so as to refill the first and second openings 25 and 26 and be electrically connected to the first electrode film 2103. The first connection electrode 3 has the laminated structure constituted of the Ni layer 33, the Pd layer 34, and the Au layer 35.

As shown in FIG. 82(*b*) and FIG. 83(*b*), the first connection electrode 3 includes a thin film portions 16 that are formed so as to be recessed in the thickness direction and a thick film portions 17 that are formed thickly so as to be positioned higher than the thin film portions 16. The thin film portions 16 are formed in regions directly above the pattern PT and the thick film portions 17 are formed in regions above the first electrode film 2103 exposed from the pattern PT.

As shown in FIGS. 82(*a*) and 82(*b*), the flat portion 97 formed on the front surface of the first connection electrode 3 is formed by thin film portions 16 and a thick film portion 17 of the first connection electrode 3. That is, at the front surface of the first connection electrode 3 that is formed so as to refill the first opening 25, the front surface of the thick film portion 17 is formed to be parallel to the front surface of the first electrode film 2103 (the front surface of the semiconductor substrate 2) to thereby form the flat portion 97. The thin film portions 16 are formed to surround the periphery of the flat portion 97 (thick film portion 17) and the flat portion 97 and the projection formation portion 98 are demarcated thereby.

Also as shown in FIGS. 83(*a*) and 83(*b*), the plurality of projections 96 formed on the front surface of the first connection electrode 3 are also formed by thin film portions 16 and thick film portions 17 of the first electrode film 3. That is, at the front surface of the first connection electrode 3 that is formed so as to refill the second openings 26, surfaces of substantially arcuate shape in cross section having the thin film portions 16 as bottom portions and the thick film portions 17 as apex portions are formed to form the plurality of projections 96. In the projection formation portion 98, the thin film portions 16 are formed in a net-like form so as to demarcate the thick film portions 17 in an array and constitute thin film portions (bottom portions) in common to respective projections 96 that are mutually adjacent in the row direction and the column direction.

Figure 84:
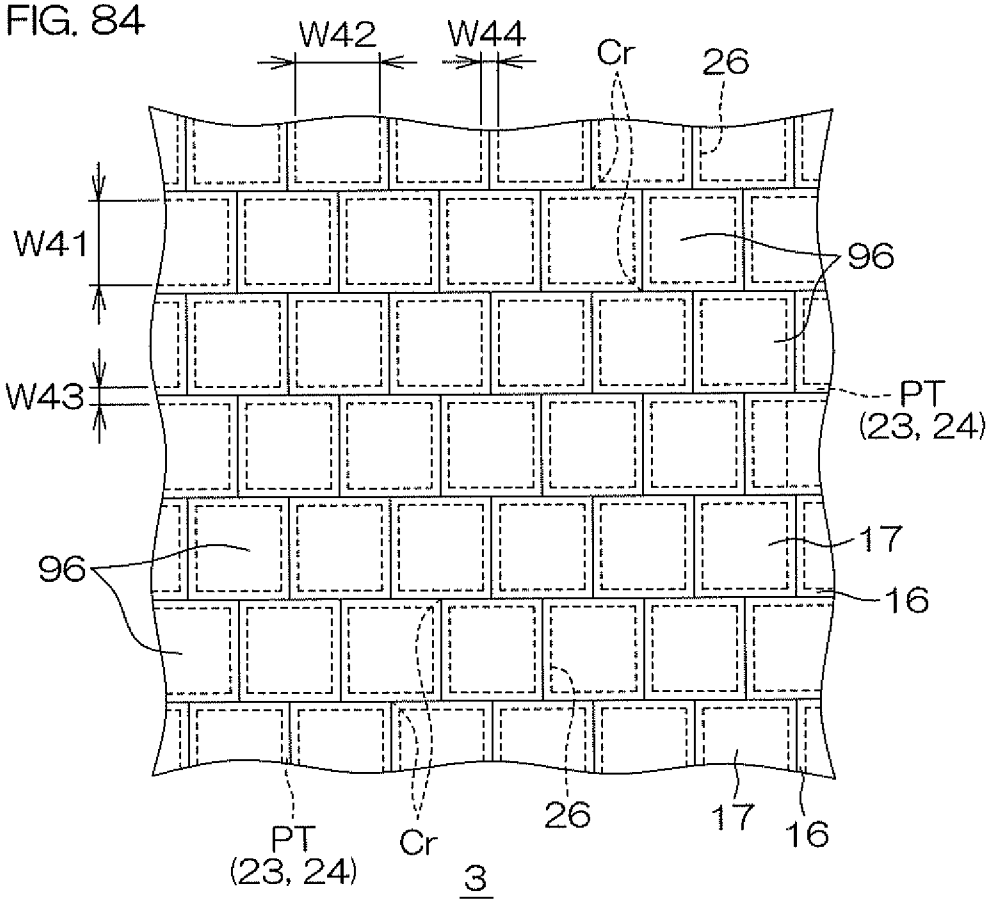
FIG. 84 is a partially enlarged plan view of a modification example of the connection electrode shown in FIG. 83.

In place of the arrangement of FIG. 83, the plurality of projections 96 formed in the first and second connection electrodes 3 and 4 may have an arrangement such as shown in FIG. 84. FIG. 84 is a partially enlarged plan view of the projection formation portion 98 according to a modification example of the first connection electrode 3 shown in FIG. 83. The region in which the second connection electrode 4 is formed is omitted from illustration in FIG. 84 because it is equivalent in arrangement to the region in which the third connection electrode 3 is formed.

A point of difference of the arrangement shown in FIG. 84 with respect to the arrangement shown in FIG. 83 is that, in the projection formation portion 98, the plurality of projections 96 are formed to include a staggered alignment pattern of being dislocated in position in the row direction at every other column in the row direction and the column direction that are mutually orthogonal.

As shown in FIGS. 83(*a*) and 83(*b*), when the plurality of projections 96 are aligned in an array in the projection formation portion 98, a cross-shaped intersection portion Cr is formed between the second openings 26 that are mutually adjacent in a diagonal direction. A width W45 of the intersection portion Cr in the diagonal direction is defined to be wider than the widths W43 and W44 between the second openings 26 that are mutually adjacent in the row direction and the column direction.

The first connection electrode 3 is formed by being grown by plating on the first electrode film 2103 so as to refill the first and second openings 25 and 26. The thin film portion 16 on the intersection portion Cr is formed by the electrode material (that is, the Ni layer 33), which is grown by plating, moving in lateral directions from mutually adjacent second openings 26. Therefore, there is a time lag between the thin film portions 16 formed on the comparatively wide intersection portions Cr and the thin film portions 16 formed on the comparatively narrow portions besides the intersection portions Cr, and depending on the plating growth conditions (for example, the rate, time, etc., of plating growth), whereas the mutually adjacent electrode material may overlap at the comparatively narrow portions besides the intersection portions Cr, the mutually adjacent electrode material may not overlap sufficiently at the intersection portions Cr. Therefore, the thin film portions 16 formed on the intersection portions Cr may be formed even closer to the front surface of the pattern PT (resin film 24) than the other portions or the front surface of the pattern PT may be exposed from the first connection electrode 3.

As shown in FIG. 84, by selectively forming the pattern PT with the second openings 26 so that the plurality of projections 96 are in a staggered alignment, the intersection portions Cr can be made to have a T shape instead of a cross shape. That is, the number of second openings 26 adjacent to each intersection portion Cr can be decreased from four to three and the distances among the three second openings 26 that are mutually adjacent at the intersection portion Cr can be made equal to the widths W41 and W42 in the row direction and the column direction. The time lag between the thin film portions 16 formed on the intersection portions Cr and the thin film portions 16 formed on the portions besides the intersection portions Cr can thereby be eliminated. The thin film portions 16 formed on the intersection portions Cr can consequently be prevented from being formed even closer to the front surface of the pattern PT than the other portions Besides constituting the predetermined pattern PT on the first and second pads 2105 and 2106, the passivation film 23 and the resin film 24 constitute a protective film of the chip part 2001 to suppress or prevent the entry of moisture to the first and second lead-out electrodes L11 and L12 and the first and second diffusion regions 2110 and 2112 and also absorb impacts, etc., from the exterior, thereby contributing to improvement of the durability of the chip part 2001.

Figure 85:
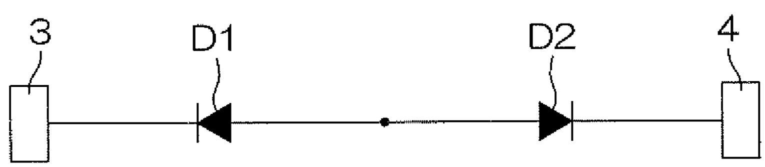
FIG. 85 is an electric circuit diagram of the electrical structure of the interior of the chip part shown in FIG. 77.

FIG. 85 is an electric circuit diagram of the electrical structure of the interior of the chip part 2001 shown in FIG. 77.

As mentioned above, the first and second Zener diodes D1 and D2 are connected anti-serially to each other. That is, as shown in FIG. 85, the cathode of the first Zener diode D1 is connected to the first connection electrode 3 and the anode of the first Zener diode D1 is connected to the anode of the second Zener diode D2. The cathode of the second Zener diode D2 is connected to the second connection electrode 4. A bidirectional Zener diode is thus arranged by such an anti-serial circuit.

With this structure, the first connection electrode 3 plus the first diffusion region 2110 and the second connection electrode 4 plus the second diffusion region 2112 are arranged to be mutually symmetrical, and characteristics for respective current directions can thus be made practically equal. Current characteristics of the chip part 2001 shall now be described with reference to FIG. 86A and FIG. 86B.

Figure 86A:
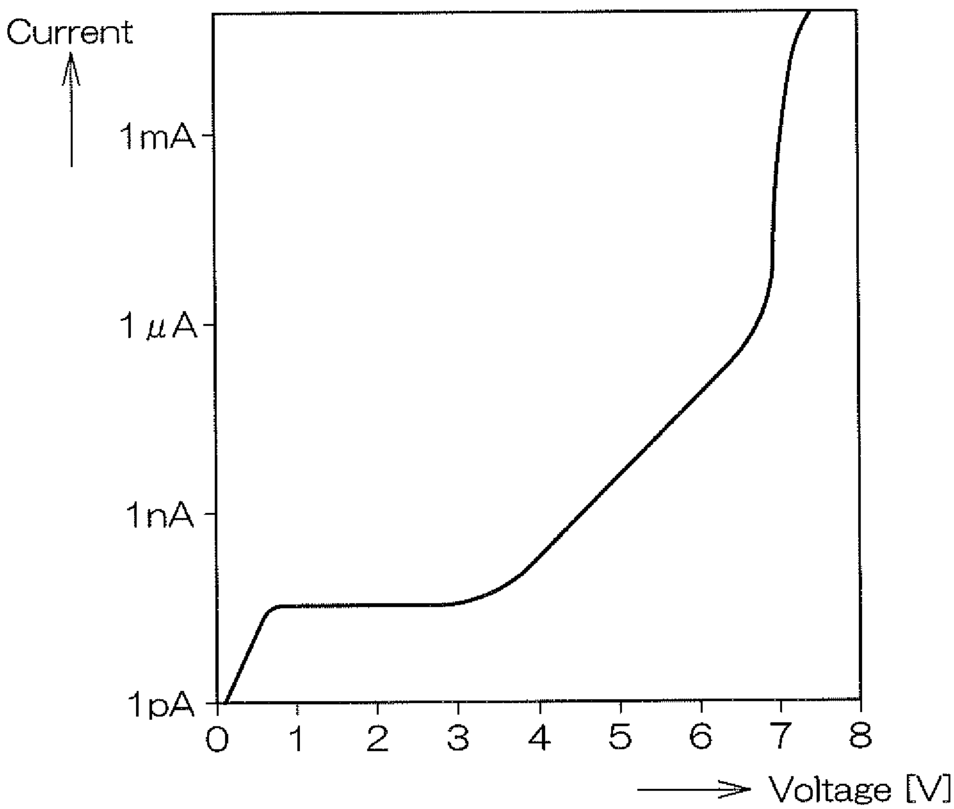
FIG. 86A is a graph of experimental results of measuring, for respective current directions, current vs. voltage characteristics of the chip part shown in FIG. 77.
Figure 86B:
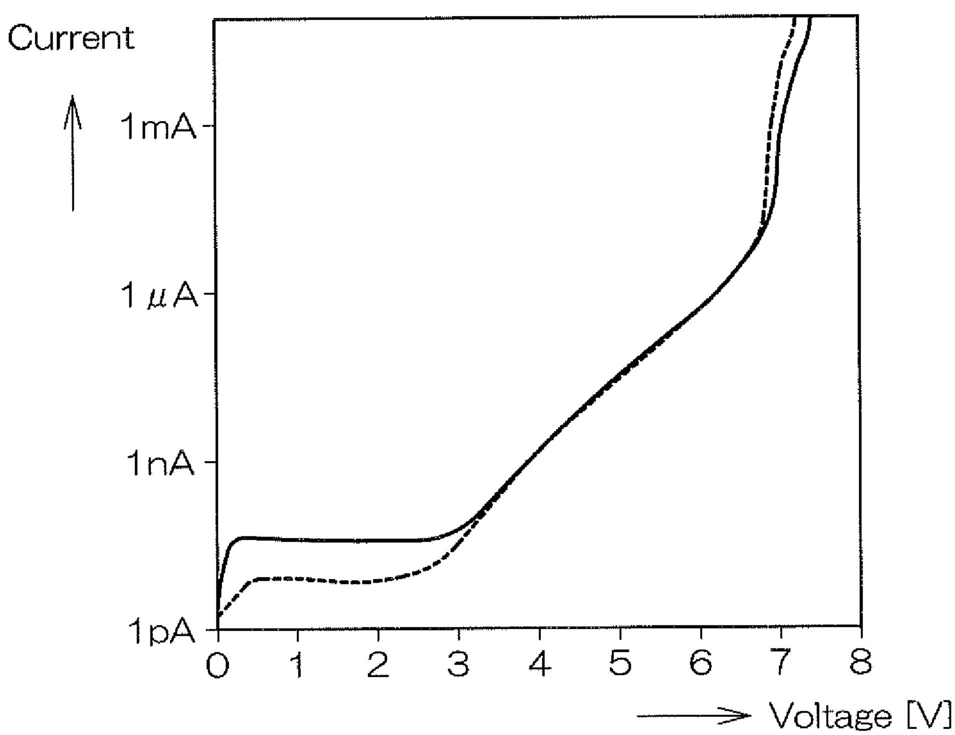
FIG. 86B is a graph of experimental results of measuring, for respective current directions, current vs. voltage characteristics of a bidirectional Zener diode chip, with which a first connection electrode plus first diffusion region and a second connection electrode plus second diffusion region are arranged to be mutually asymmetrical.
Figure 87:
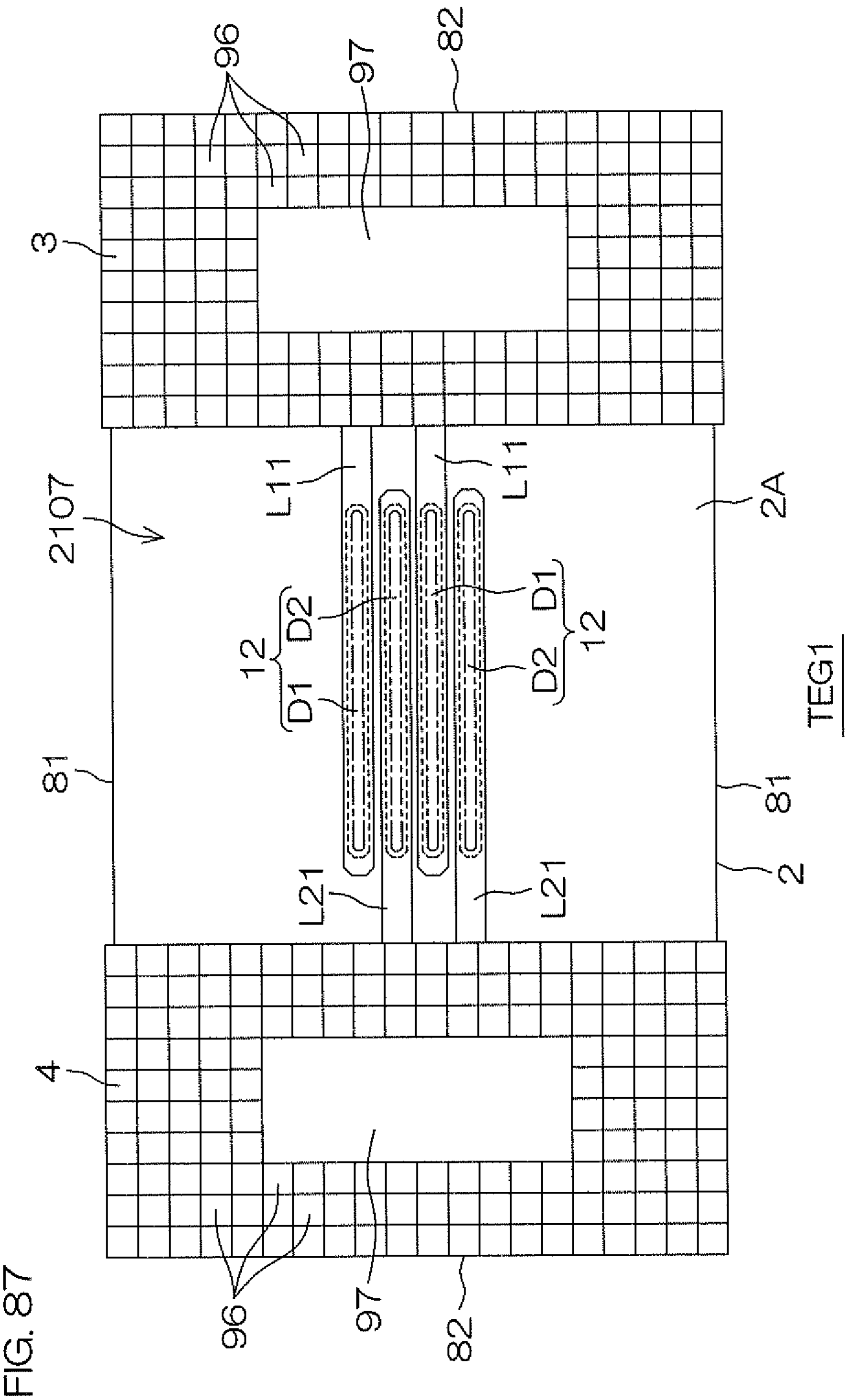
FIG. 87 to FIG. 93 are plan views respectively of first to seventh evaluation elements for examining the ESD resistance and the inter-terminal capacitance.
Figure 88:
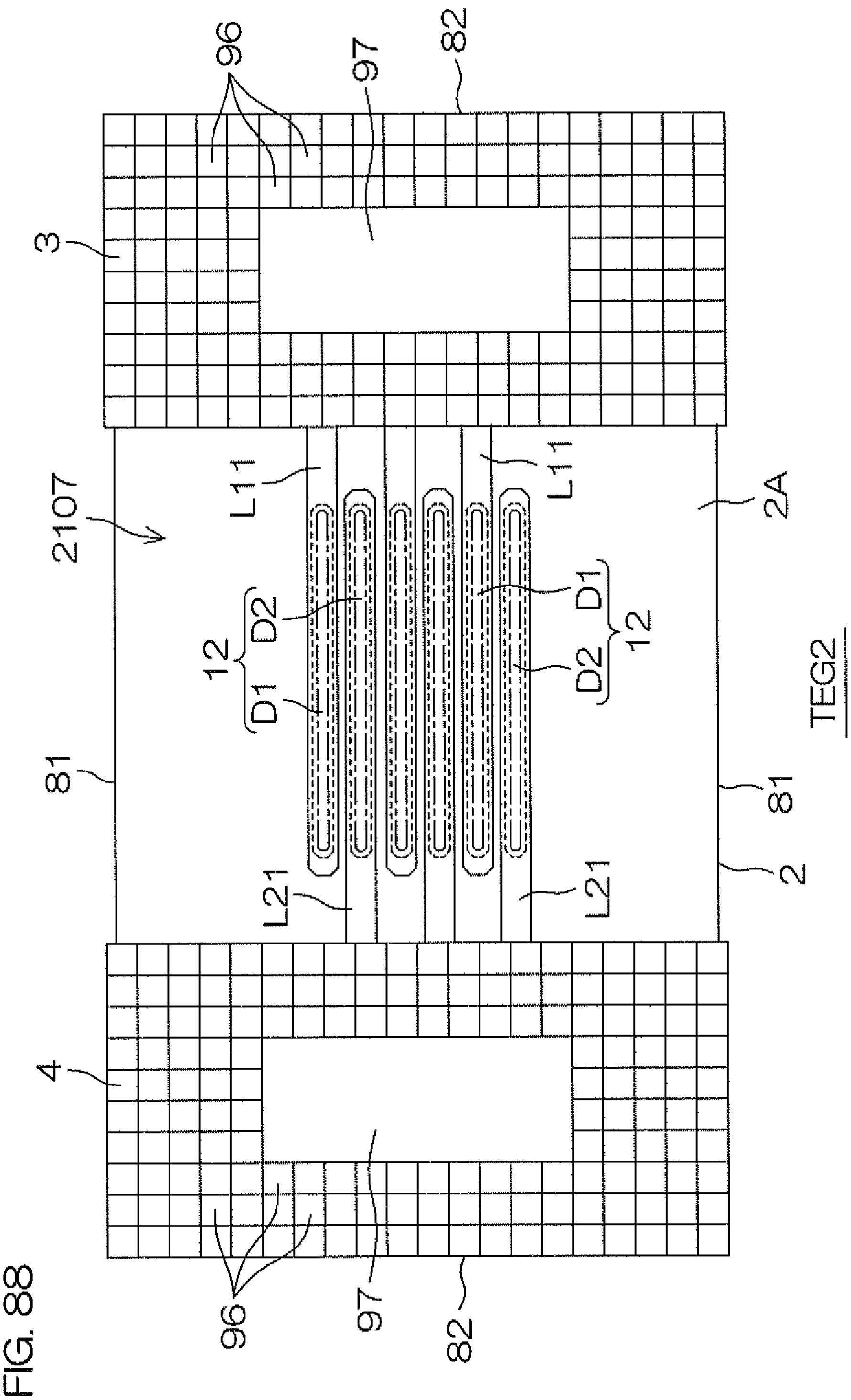
Figure 89:
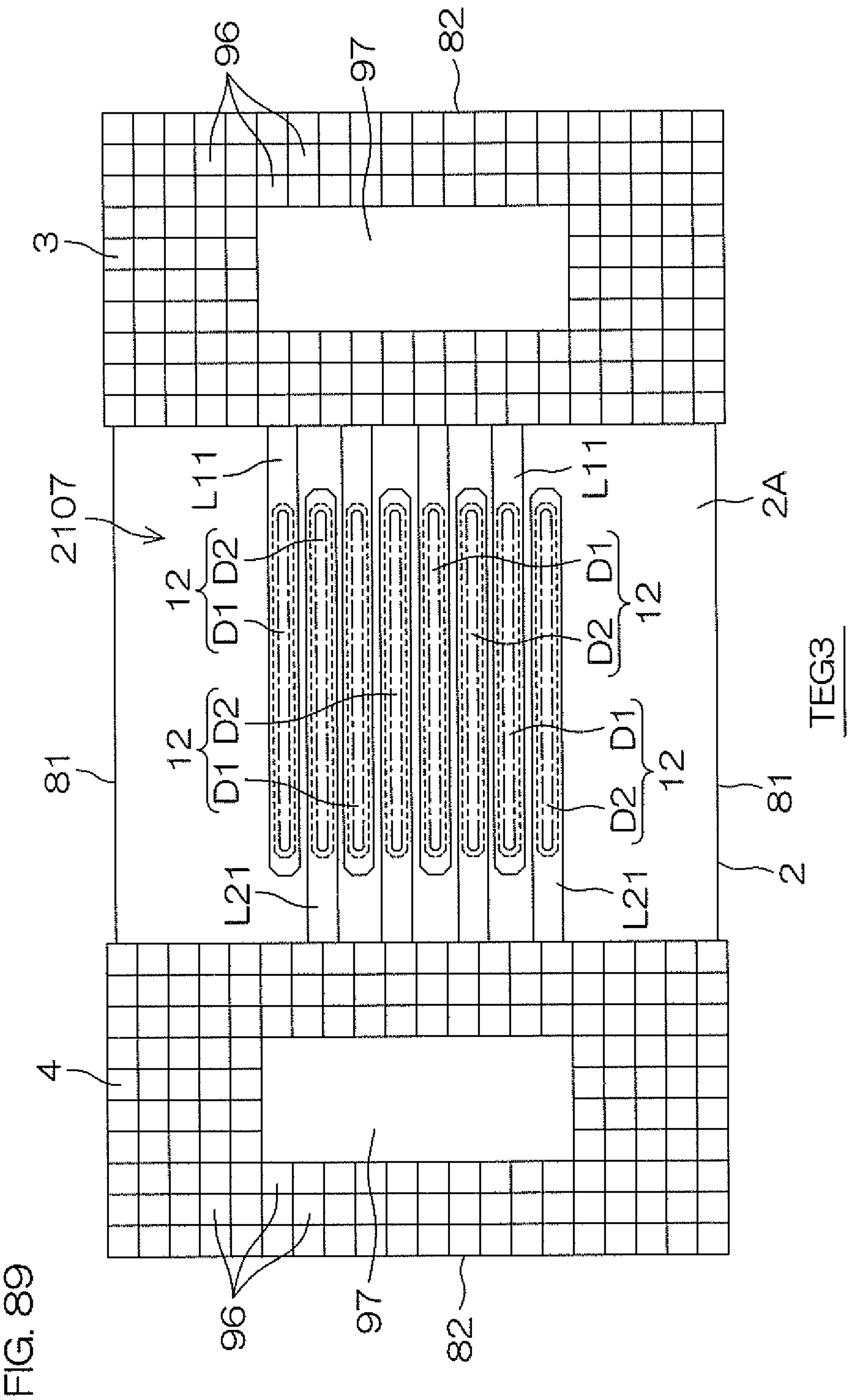
Figure 90:
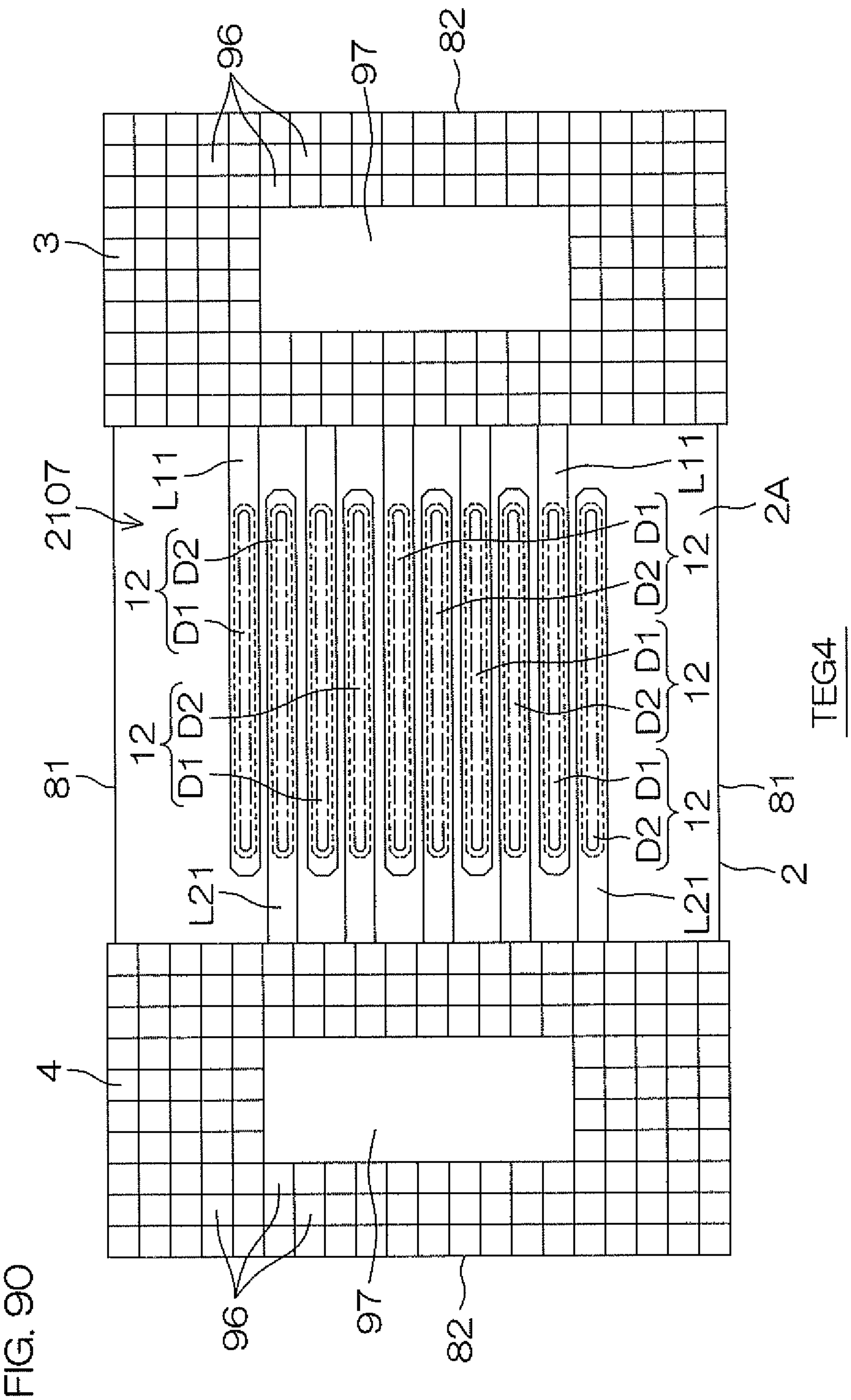

FIG. 86A is a graph of experimental results of measuring, for respective current directions, current vs. voltage characteristics of the chip part 2001 shown in FIG. 77. FIG. 86B is a graph of experimental results of measuring, for respective current directions, current vs. voltage characteristics of a bidirectional Zener diode chip, with which the first connection electrode 3 plus the first diffusion region 2110 and the second connection electrode 4 plus the second diffusion region 2112 are arranged to be mutually asymmetrical.

In FIG. 86B, a solid line indicates the current vs. voltage characteristics in a case of applying voltage to the bidirectional Zener diode with one electrode being a positive electrode and the other electrode being a negative electrode and a broken line indicates the current vs. voltage characteristics in a case of applying voltage to the bidirectional Zener diode with the one electrode being the negative electrode and the other electrode being the positive electrode. From the experimental results, it can be understood with the bidirectional Zener diode, with which the first connection electrode plus first diffusion region and the second electrode plus second diffusion region are arranged to be asymmetrical, the current vs. voltage characteristics are not equal for the respective current directions.

On the other hand, as shown in FIG. 86A, with the chip part 2001, both the current vs. voltage characteristics in the case of applying voltage with the first connection electrode 3 being the positive electrode and the second connection electrode 4 being the negative electrode and the current vs. voltage characteristics in the case of applying voltage with the second connection electrode 4 being the positive electrode and the first connection electrode 3 being the negative electrode were characteristics indicated by a solid line in FIG. 86A. That is, with the bidirectional Zener diode according to the present reference example, the current vs. voltage characteristics were practically equal for the respective current directions.

Next, as shown in FIG. 87 to FIG. 93, first to seventh evaluation elements (hereinafter referred to as "TEG (test element group) 1 to TEG 7") were prepared, and the ESD resistances and the inter-terminal capacitances $C_t$ of the TEG 1 to TEG 7 were examined in addition to those of the chip part 2001. The TEG 1 to TEG 7 are differed in the respective peripheral lengths and the respective areas of the first diffusion regions 2110 and the second diffusion regions 2112 by setting the number and/or the sizes of the first and second diffusion regions 2110 and 2112 formed on the semiconductor substrate 2 to various values.

The peripheral length of the first diffusion region 2110 refers to the total extension of boundary lines between the semiconductor substrate 2 and the first diffusion region 2110 at the element forming surface 2A of the semiconductor substrate 2 and is defined as the total length of the length of the pair of sides in the lead-out direction of the first diffusion region 2110 and the length of the pair of sides orthogonal to the lead-out direction. Similarly, the peripheral length of the second diffusion region 2112 refers to the total extension of boundary lines between the semiconductor substrate 2 and the second diffusion region 2112 at the element forming surface 2A of the semiconductor substrate 2 and is defined as the total length of the length of the pair of sides in the lead-out direction of the second diffusion region 2112 and the length of the pair of sides orthogonal to the lead-out direction.

Also, the area of the first diffusion region 2110 refers to the total area of the region surrounded by the boundary lines between the semiconductor substrate 2 and the first diffusion region 2110 in the plan view of viewing the element forming surface 2A of the semiconductor substrate 2 from the normal direction. Similarly, the area of the second diffusion region 2112 refers to the total area of the region surrounded by the boundary lines between the semiconductor substrate 2 and the second diffusion region 2112 in the plan view of viewing the element forming surface 2A of the semiconductor substrate 2 from the normal direction.

FIG. 87 to FIG. 93 are plan views of the TEG 1 to TEG 7 for examining the ESD resistances and the inter-terminal capacitances $C_t$. FIG. 94 is a table of the respective peripheral lengths and the respective areas of the first or second diffusion regions 2110 or 2112 of the respective TEG 1 to TEG 7. In FIG. 87 to FIG. 93, only principal portions are provided with the reference symbols and other portions are shown with the reference symbols omitted.

As shown in FIG. 87 to FIG. 90, the TEG 1 to TEG 4 are chip parts with which the number of parallels is "2," "3," "4," and "5," respectively. As shown in the table of FIG. 94, the respective peripheral lengths and the respective areas of the first and second diffusion regions 2110 and 2112 of the TEG 1 to TEG 4 increase in proportion as 2 times, 3 times, 4 times, and 5 times those of the chip part 2001.

With each of the TEG 1 to TEG 4, the respective parallel structures 12 are disposed so that the first Zener diodes D1 and the second Zener diodes D2 are aligned alternately across mutually equal intervals. Also, the first and second lead-out electrodes L11 and L21 are aligned at the width $W_S$ across each slit 2118 (see FIG. 81(*b*)). That is, in each of the TEG 1 to TEG 4, the respective parallel structures 12 are formed so that the first and second electrode films 2103 and 2104 have comb-teeth-like shapes with which the plurality of first lead-out electrodes L11 and the plurality of second lead-out electrodes L12 engage mutually.

Also with the respective TEG 1 to TEG 4, the first connection electrode 3 plus the first diffusion regions 2110 and the second connection electrode 4 plus the second diffusion regions 2112 are mutually symmetrical in a plan view in all cases. More specifically, the first connection electrode 3 plus the first diffusion regions 2110 and the second connection electrode 4 plus the second diffusion regions 2112 are arranged to be point symmetrical with respect to the center of gravity of the element forming surface 2A. The first connection electrode 3 plus the first diffusion regions 2110 and the second connection electrode 4 plus the second diffusion regions 2112 are also arranged to be line symmetrical with respect to a straight line passing through the center of gravity of the element forming surface 2A and extending in the short direction of the semiconductor substrate 2 (the direction along the short side 82 of the semiconductor substrate 2).

Figure 91:
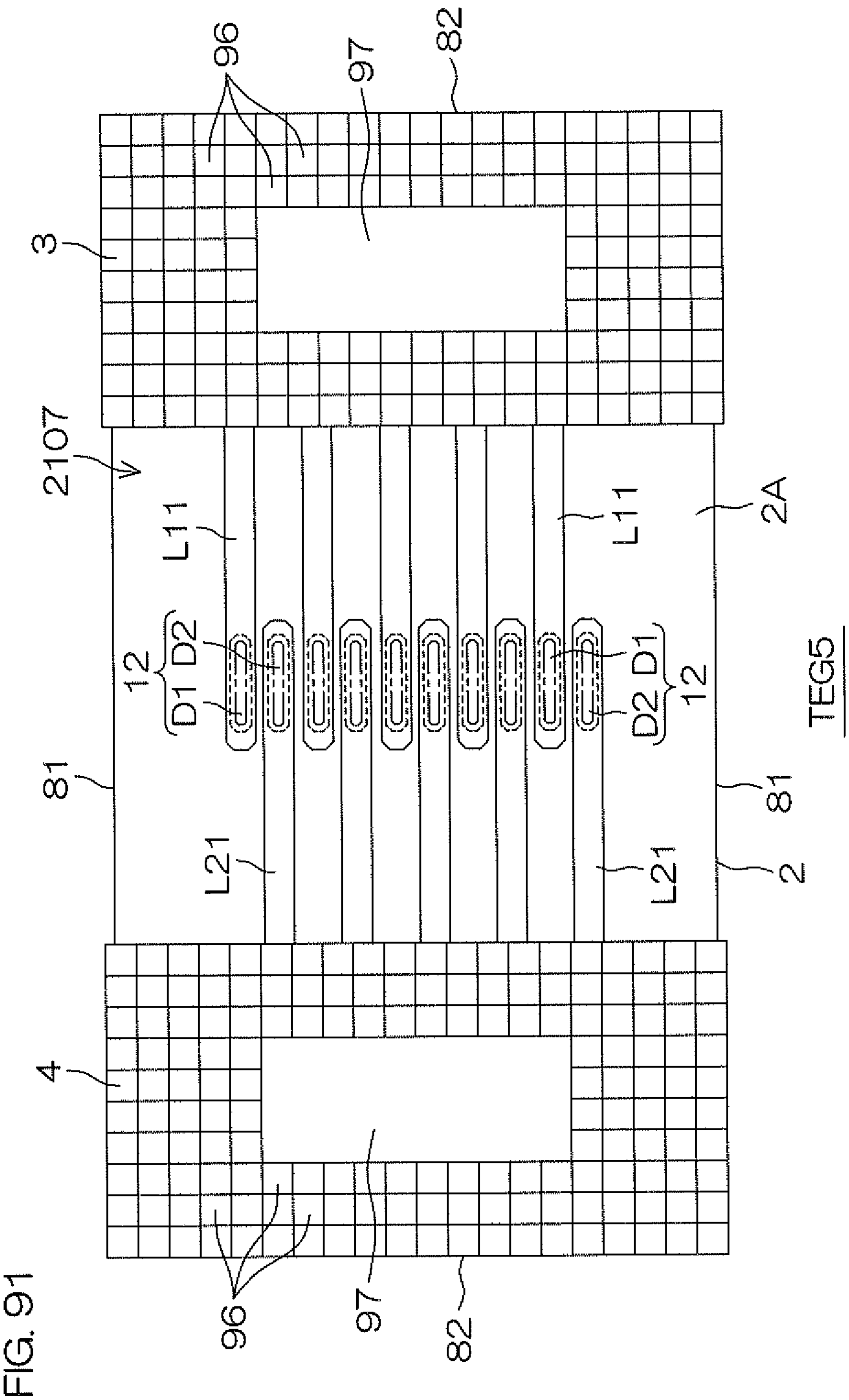
Figure 92:
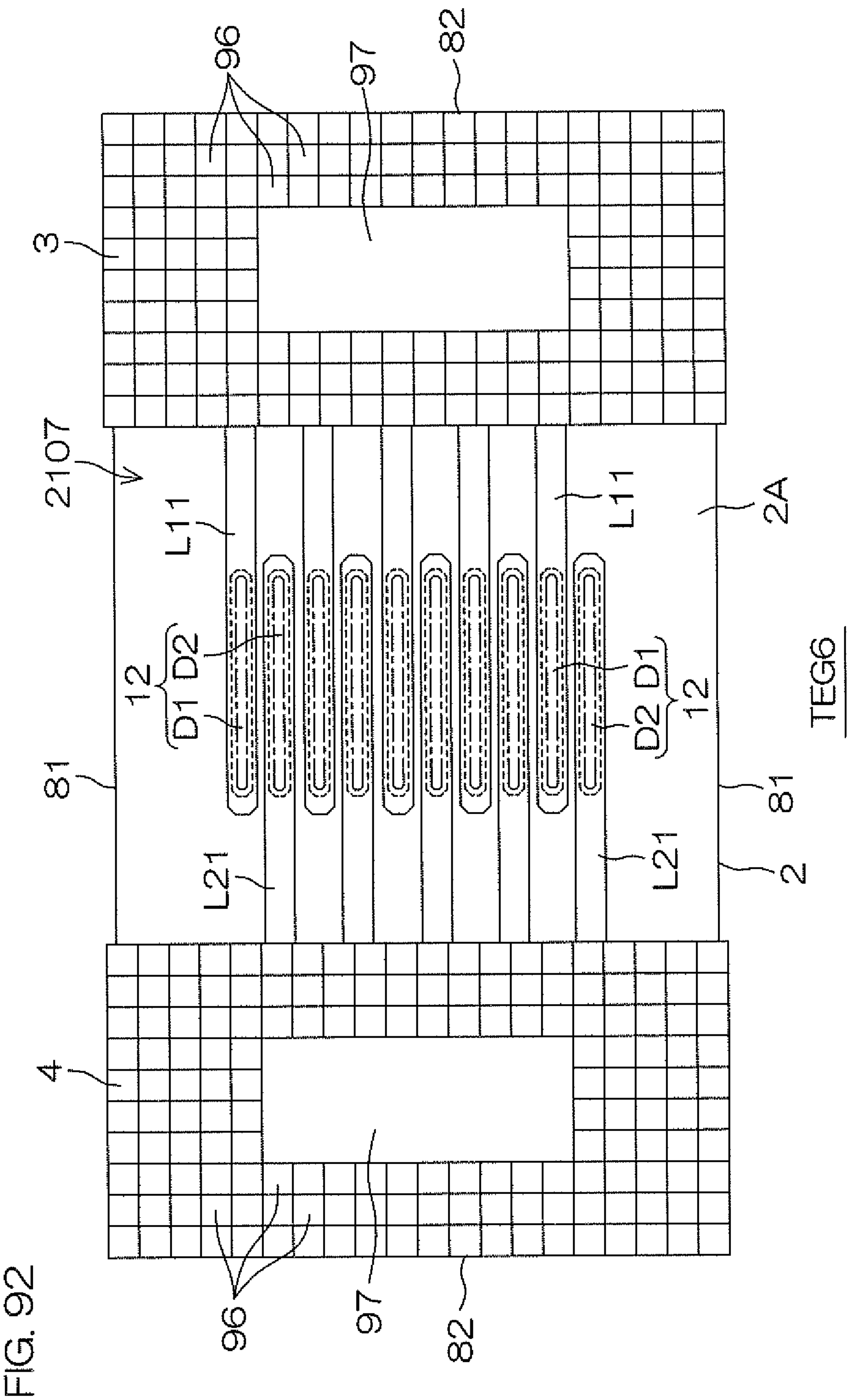
Figure 93:
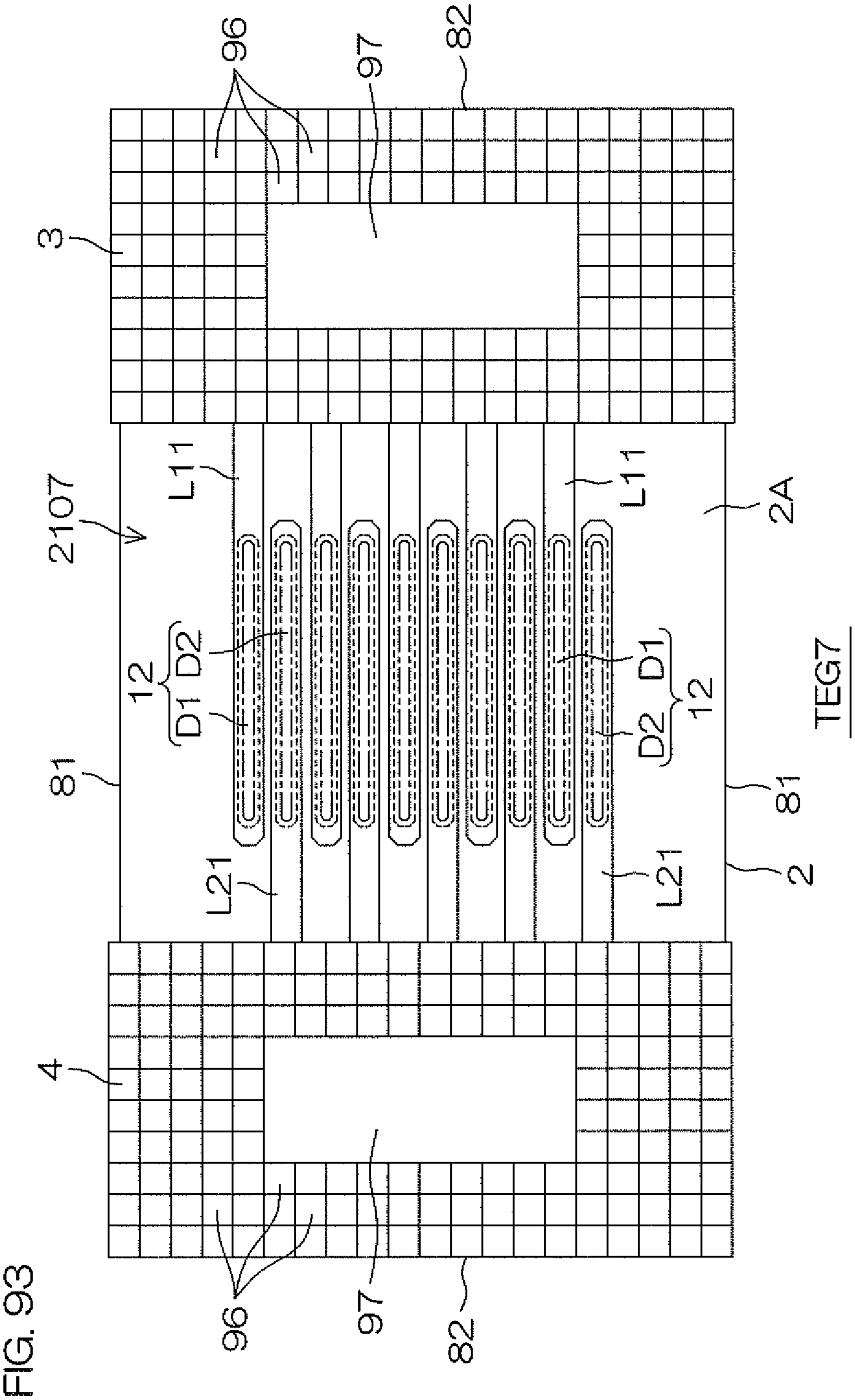
Figures 94, 95:
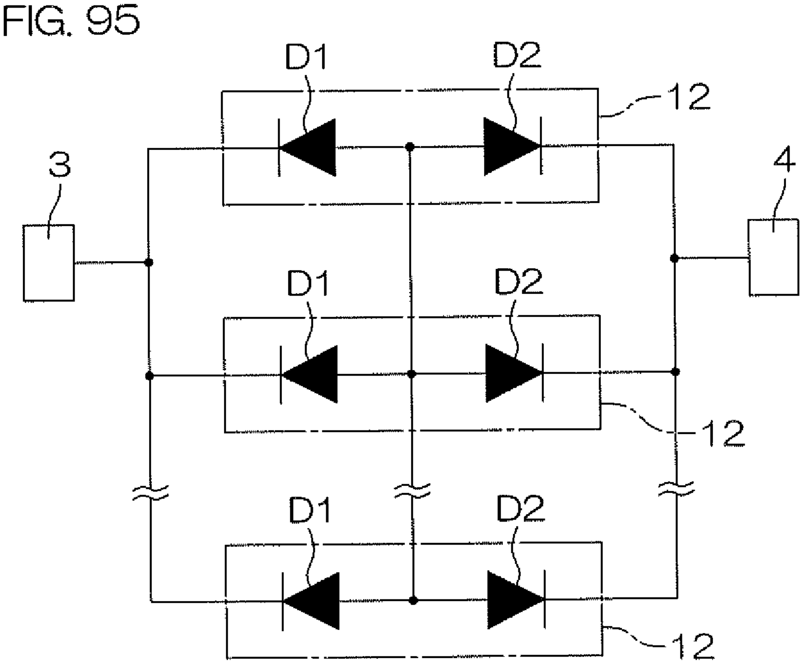
FIG. 94 is a table of peripheral lengths and areas of diffusion regions of the respective evaluation elements.
FIG. 95 is an electric circuit diagram of the electrical structure of the interior of each of the evaluation elements.

As shown in FIG. 91 to FIG. 93, the TEG 5 to TEG 7 are all chip parts with the number of parallels being "5." As shown in the table of FIG. 94, the TEG 5 to TEG 7 are respectively formed with the respective peripheral lengths and the respective areas of the first and second diffusion regions 2110 and 2112 of the TEG 4 being changed. The respective peripheral lengths and the respective areas of the first and second diffusion regions 2110 and 2112 are the smallest in the TEG 5, and the respective peripheral lengths and the respective areas are defined to increase in the order of: TEG 5, TEG 6, TEG 7, and TEG 4. Also, the respective peripheral lengths in the TEG 5 to TEG 7 are successively defined to be respectively equal to the respective peripheral lengths in the TEG 1 to TEG 3. On the other hand, the respective areas in the TEG 5 are defined to be smaller than the respective areas in the TEG 1. Also, the respective areas in the TEG 6 are defined to be smaller than the respective areas in the TEG 2. Also, the respective areas in the TEG 7 are defined to be smaller than the respective areas in the TEG 3.

The electrical structure of each of the TEG 1 to TEG 7 that includes the plurality of parallel structures 12 is described by an electrical circuit diagram in FIG. 95. FIG. 95 is an electric circuit diagram of the electrical structure of the interior of each of the TEG 1 to TEG 7.

With the respective arrangements of the TEG 1 to TEG 7, the plurality of the parallel structures 12 including the plurality of first Zener diodes D1 and the plurality of second Zener diodes D2 are formed in the diode forming region 2107. As shown in FIG. 95, the cathodes of the plurality of first Zener diodes D1 are connected in common to the first connection electrode 3 and the anodes thereof are connected in common to the anodes of the plurality of second Zener diodes D2. The cathodes of the plurality of second Zener diodes D2 are connected in common to the second connection electrode 4. The pluralities of first and second Zener diodes D1 and D2 are thereby made to function as a single bidirectional Zener diode as a whole.

Figure 96:
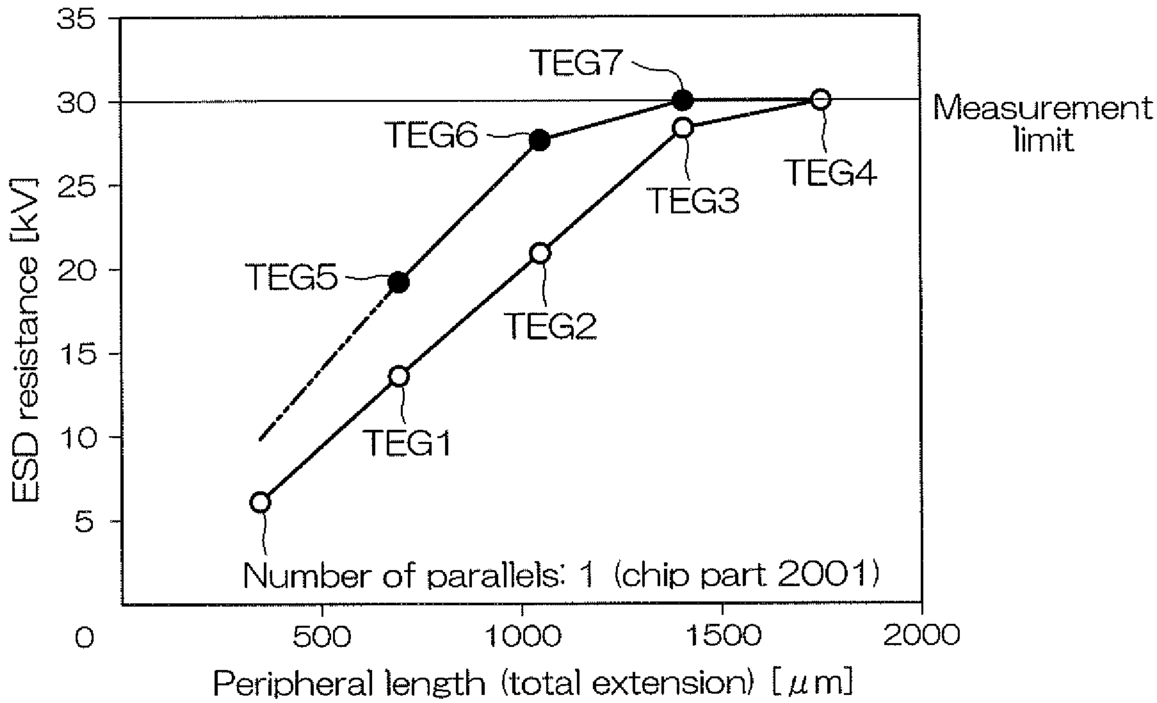
FIG. 96 is a graph of experimental results of measuring the ESD resistances of the chip part shown in FIG. 77 and the respective evaluation elements.
Figure 97:
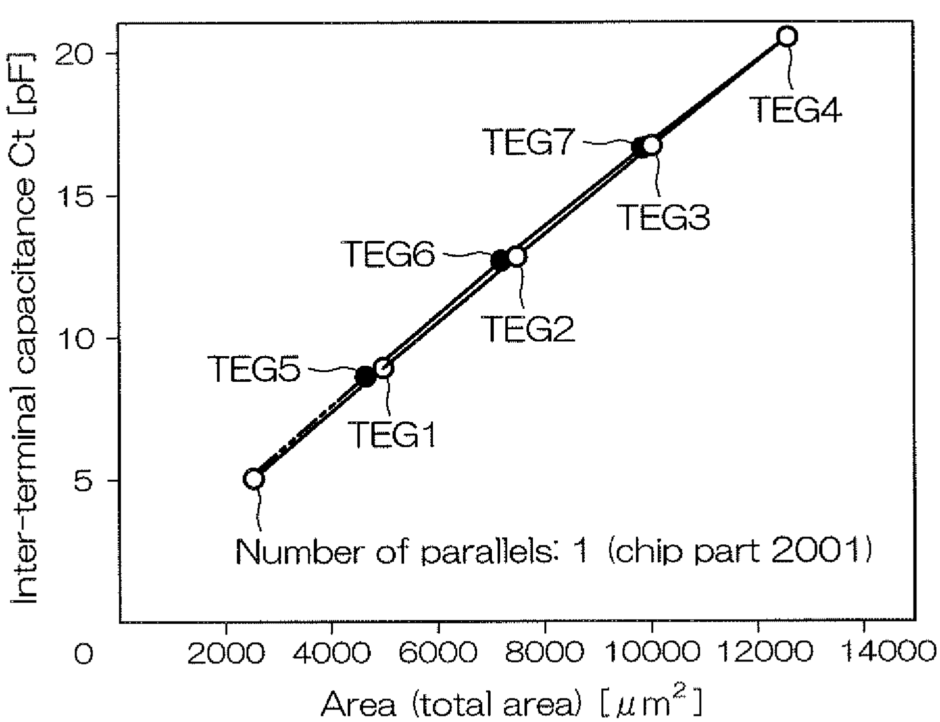
FIG. 97 is a graph of experimental results of measuring the inter-terminal capacitances of the chip part shown in FIG. 77 and the respective evaluation elements.

The graph of FIG. 96 and the graph of FIG. 97 show the results of examining the electrical characteristics of the chip part 2001 and the TEG 1 to TEG 7.

FIG. 96 is a graph of experimental results of measuring the ESD resistances of the chip part 2001 shown in FIG. 77 and the TEG 1 to TEG 7.

The abscissa axis of FIG. 96 indicates a length that is one of either the peripheral length (total extension) of the first diffusion regions 2110 of the first Zener diodes D1 or the peripheral length (total extension) of the second diffusion regions 2112 of the second Zener diodes D2.

From these experimental results, it can be understood that the longer the respective peripheral lengths of the first and second diffusion regions 2110 and 2112, the greater the ESD resistance. Also oppositely, it can be understood that the shorter the respective peripheral lengths of the first and second diffusion regions 2110 and 2112, the smaller the ESD resistance. In FIG. 96, the ESD resistances of the TEG 4 and the TEG 7 level off at the position of 30 kV due to a measurement limit. It can thus be understood from the graph of FIG. 96 that at magnitudes of not more than 30 kV, the ESD resistance is in a proportional relationship with the respective peripheral lengths of the first and second diffusion regions 2110 and 2112. Further, all of the TEG 5 to TEG 7 have higher ESD resistances than the TEG 1 to TEG 3. From this, it can be understood that a higher ESD resistance can be attained with a larger number of parallels.

Improvement of the ESD resistances of the first and second Zener diodes D1 and D2 can thus be achieved because the electric field at vicinities of the first and second diffusion regions 2110 and 2112 can be dispersed and prevented from concentrating by making long the respective peripheral lengths of the first and second diffusion regions 2110 and 2112. The results of the TEG 5 to TEG 7 show that such an effect is expressed more prominently when the number of parallels is large.

From the experimental results of FIG. 96, it can be understood that even when the chip part 2001 is to be formed compactly, both downsizing of the chip part 2001 and securing of a satisfactory ESD resistance can be achieved at the same time by increasing the respective peripheral lengths of the first and second diffusion regions 2110 and 2112.

FIG. 97 is a graph of experimental results of measuring the inter-terminal capacitances $C_t$ of the chip part 2001 shown in FIG. 77 and the TEG 1 to TEG 7.

The abscissa axis of FIG. 97 indicates an area (total area) that is one of either the area (total area) of the first diffusion regions 2110 of the first Zener diodes D1 or the area (total area) of the second diffusion regions 2112 of the second Zener diodes D2.

From these experimental results, it can be understood that as the respective areas of the first and second diffusion regions 2110 and 2112 increase, the inter-terminal capacitance $C_t$ increases and oppositely as the respective areas of the first and second diffusion regions 2110 and 2112 decrease, the inter-terminal capacitance $C_t$ decreases.

Based on the graph of FIG. 97, the straight line for the TEG 1 to TEG 4 can be expressed by the relational expression: $y=0.0015x+1.53$ where y is the ESD resistance and x is the area. Also, the straight line for the TEG 5 to TEG 7 can similarly be expressed by the relational expression: $y=0.0015x+1.08$. The straight line for the TEG 1 to TEG 4 and the straight line for the TEG 5 to TEG 7 thus have mutually equal slopes and lie at substantially overlapping positions.

From this, it can be understood that the inter-terminal capacitance $C_t$ is in a proportional relationship with the respective areas of the first and second diffusion regions 2110 and 2112. It can thus be understood that by setting the respective areas of the first and second diffusion regions 2110 and 2112, for example, to not more than 2500 $\mu m^2$, an inter-terminal capacitance $C_t$ of not more than 6 pF can be attained.

From the experimental results of FIG. 97, it can be understood that when the chip part 2001 is to be formed compactly, both downsizing of the chip part 2001 and a satisfactory inter-terminal capacitance $C_t$ can be realized at the same time by decreasing the respective areas of the first and second diffusion regions 2110 and 2112.

Figure 98:
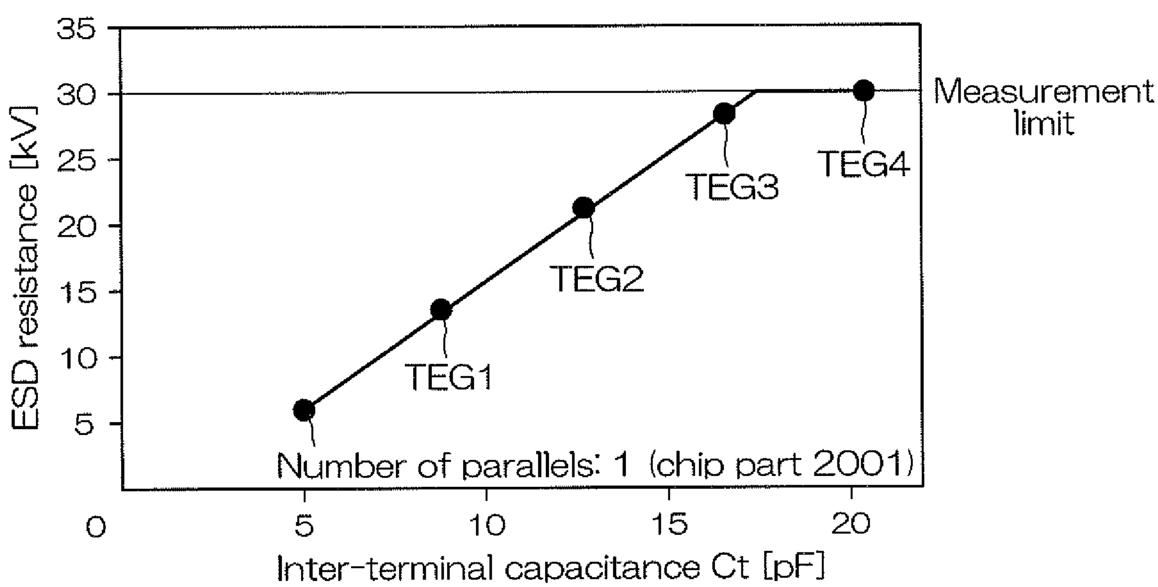
FIG. 98 is a graph of the ESD resistance vs. inter-terminal capacitance of the chip part shown in FIG. 77 and the respective evaluation elements.

The results of FIG. 96 and FIG. 97 are brought together in the graph of FIG. 98. FIG. 98 is a graph of the ESD resistance vs. inter-terminal capacitance $C_t$ of the chip part 2001 shown in FIG. 77 and the TEG 1 to TEG 4. In FIG. 98, the plots for the TEG 5 to TEG 7 are omitted for the sake of description.

Generally, from the standpoint of tolerance, reliability, etc., of a chip part, it is required to make the ESD resistance large, and from the standpoint of conducting electrical signals satisfactorily without giving rise to loss, it is desired to make the inter-terminal capacitance $C_t$ small. However, it can be understood from FIG. 98 that the ESD resistance and the inter-terminal capacitance $C_t$ are in a trade-off relationship. That is, if a low inter-terminal capacitance $C_t$ is pursued by taking note of the respective areas of the first and second diffusion regions 2110 and 2112, the ESD resistance also decreases and the ESD resistance must be sacrificed inevitably.

It can thus be understood that a low inter-terminal capacitance $C_t$ and a high ESD resistance cannot be realized by simply increasing or decreasing the number of parallels to change the respective peripheral lengths and/or the respective areas of the first and second diffusion regions 2110 and 2112 as in the TEG 1 to TEG 4.

Here, referring again to FIG. 96 and FIG. 97, the ESD resistance is in a proportional relationship with the respective peripheral lengths of the first and second diffusion regions 2110 and 2112 and the inter-terminal capacitance $C_t$ is in a proportional relationship with the respective areas of the first and second diffusion regions 2110 and 2112.

From this, it can be understood that by making the respective peripheral lengths of the first and second diffusion regions 2110 and 2112 not less than a predetermined length while restricting the respective areas of the first and second diffusion regions 2110 and 2112 to be not more than a predetermined area, the ESD resistance and the inter-terminal capacitance $C_t$ that are in the trade-off relationship can be set independently of each other. From another viewpoint, it can be understood that by making the respective areas of the first and second diffusion regions 2110 and 2112 not more than a predetermined area while restricting the respective peripheral lengths of the first and second diffusion regions 2110 and 2112 to be not less than a predetermined length, the ESD resistance and the inter-terminal capacitance $C_t$ that are in the trade-off relationship can be set independently of each other.

Figure 99A:
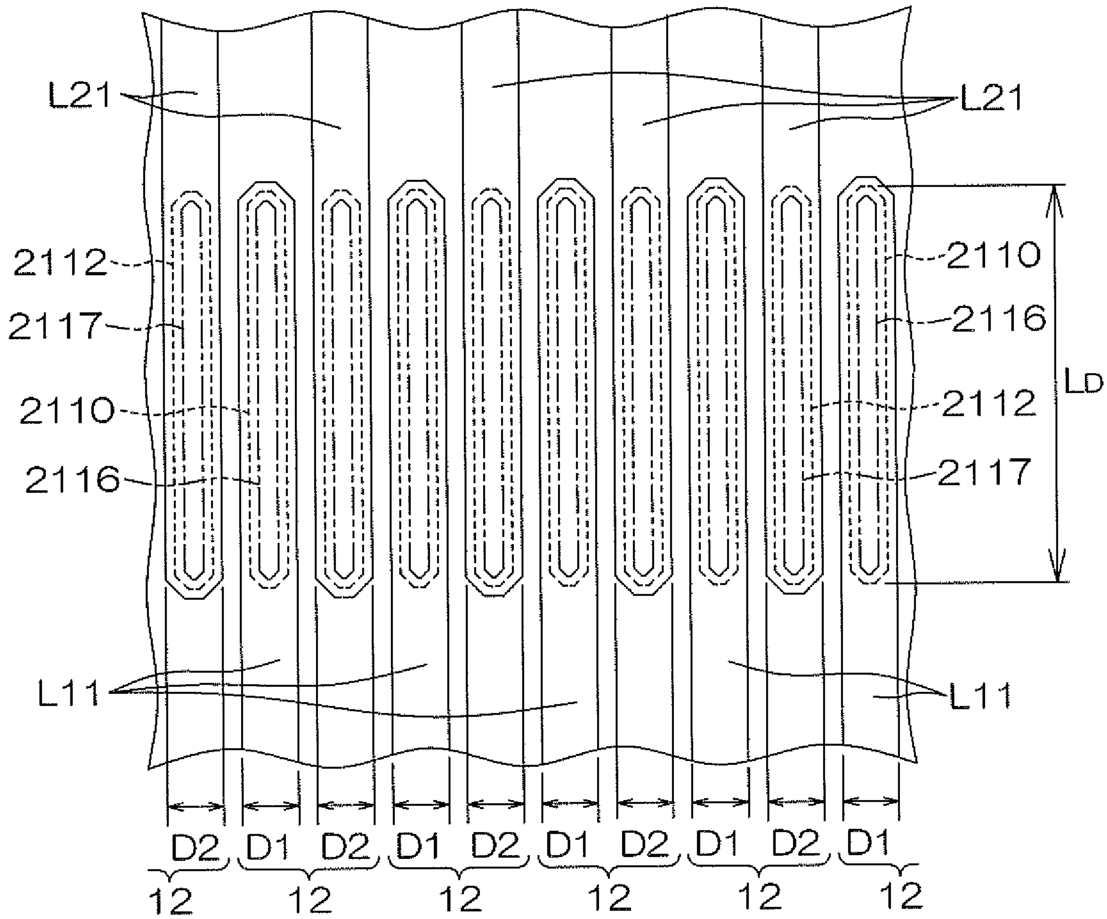
FIG. 99A is an enlarged plan view of a diode forming region of a chip part and FIG. 99B is an enlarged sectional view of a first Zener diode and a second Zener diode shown in FIG. 99A.
Figure 99B:
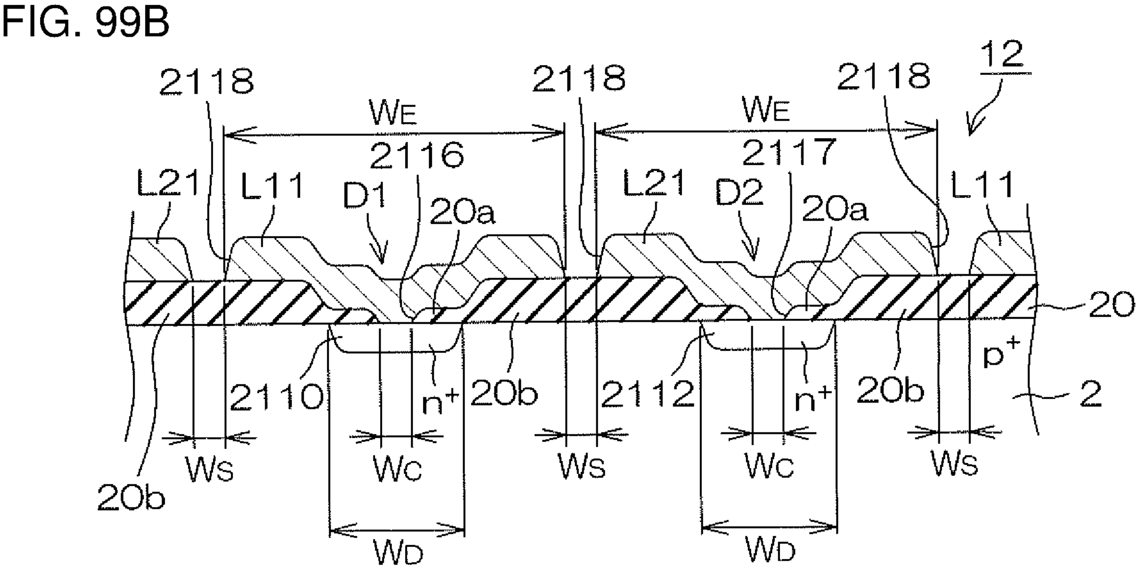

With the present reference example, the chip part 2001 indicated in FIG. 99 and FIG. 100 was prepared based on the above idea and the respective values of the ESD resistance and the inter-terminal capacitance $C_t$ were examined.

FIG. 99(*a*) is an enlarged plan view of the diode forming region 2107 of the chip part 2001 and FIG. 99(*b*) is an enlarged sectional view of the first Zener diode D1 and the second Zener diode D2 shown in FIG. 99(*a*). FIG. 100 is a table of values of respective arrangements, inter-terminal capacitances $C_t$, and ESD resistances of the chip part 2001 shown in FIG. 99.

A point of difference of the arrangement of the chip part 2001 shown in FIGS. 99(*a*) and 99(*b*) and the arrangements of the TEG 1 to TEG 4 described above is that the respective total areas of the first and second connection electrodes 3 and 4 are not more than 2000 $\mu m^2$. Arrangements of other portions are the same as in the arrangements of the TEG 1 to TEG 4. An example where the number of parallels is not less than "5" is shown in FIG. 99(*a*).

As shown in FIG. 100, with the present reference example, in addition to the above described chip part 2001 with which the number of parallels is "1," the chip parts 2001 with which the number of parallels is "5," "6," "7," "8," and "10" (hereinafter referred to as the "chip parts 2001 with the number of parallels of "5" to "10"") were prepared and the inter-terminal capacitances $C_t$ and the ESD resistances were measured.

The chip parts 2001 with the number of parallels of "5" to "10" were all formed so that the respective total areas of the first and second connection electrodes 3 and 4 are not more than 2000 $\mu m^2$ (more specifically, not less than 1800 $\mu m^2$ and not more than 1900 $\mu m^2$).

With the chip parts 2001 with the number of parallels of "5" to "10," the length $L_D$ of each of first and the second diffusion regions 2110 and 2112 in the direction intersecting the short direction and the width $W_D$ of each of first and the second diffusion regions 2110 and 2112 in the short direction are defined by being adjusted suitably so that with the increase of the number of parallels, the respective peripheral lengths of the first and second diffusion regions 2110 and 2112 increase but the respective areas do not increase.

Also, whereas the width $W_C$ of each of the contact holes 2116 and 2117 decreases with increase of the number of parallels (reduction of the first and second diffusion regions 2110 and 2112), the width from the contact hole 2116 or 2117 to an end portion of the first or second diffusion region 2110 or 2112 (width of: (width $W_D$–width $W_C$)/2) is defined to be approximately 2.5 μm in all cases. In other words, the thin film portions 20*a* of the insulating film 20 are formed to cover the peripheral edge portions of the first and second diffusion regions 2110 and 2112 across a width of approximately 2.5 μm (width of: (width $W_D$–width $W_C$)/2) regardless of the increase of the number of parallels. Also, the width $W_E$ of each of the lead-out electrodes L11 and L21 is defined to decrease in accordance with the reduction of the width $W_D$ in the short direction of each of the first and second diffusion regions 2110 and 2112. On the other hand, the width $W_S$ across the slit 2118 of the first and second diffusion regions 2110 and 2112 is defined to be 2 μm to 3 μm in all cases.

Figure 101:
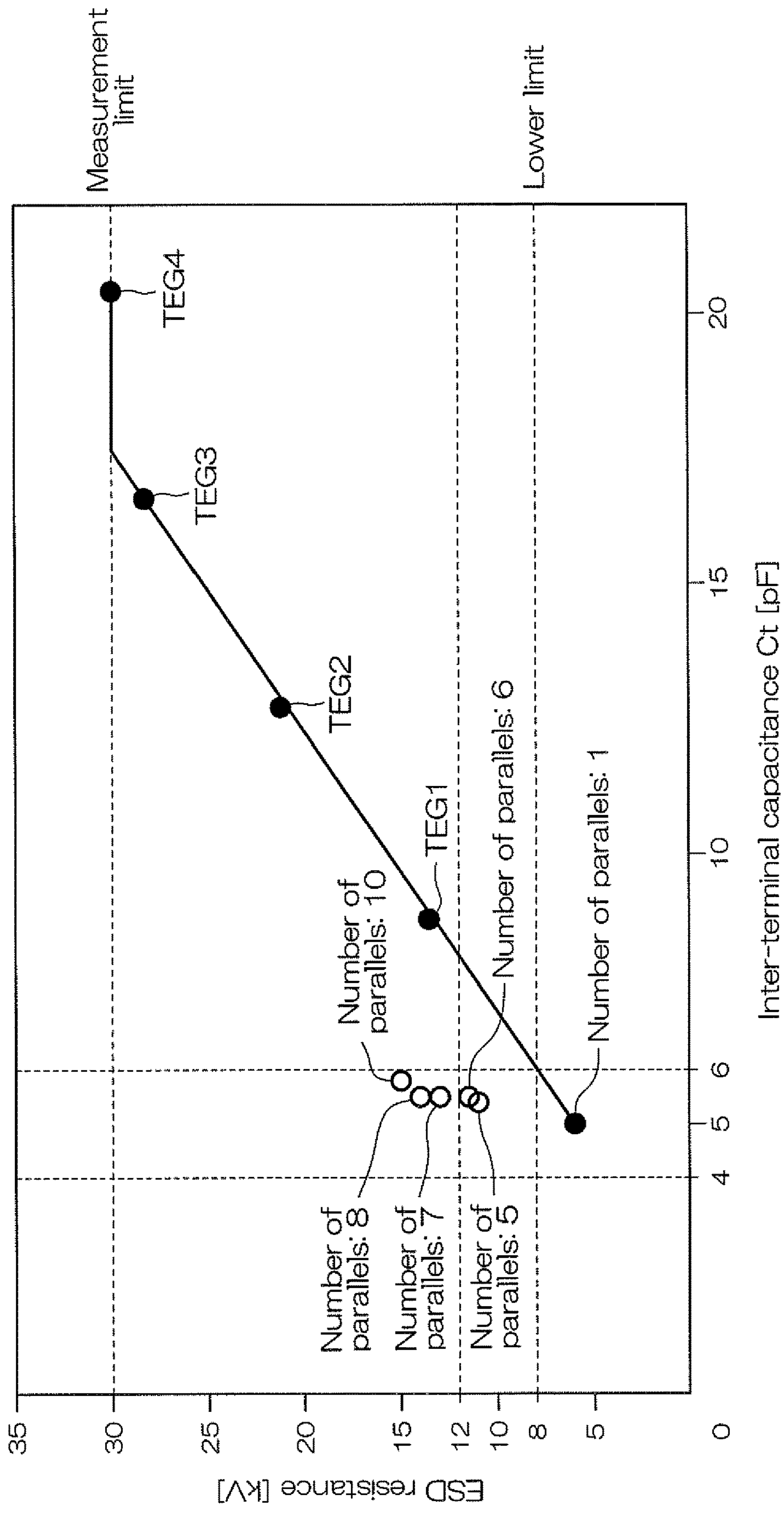
FIG. 101 is a graph in which the inter-terminal capacitances and ESD resistances of FIG. 100 are indicated in the graph of FIG. 98.

FIG. 101 is a graph in which the inter-terminal capacitances $C_t$ and ESD resistances of FIG. 100 are indicated in the graph of FIG. 98.

As shown in FIG. 101, with the TEG 1 to TEG 4, the ESD resistance increases continuously (rectilinearly) with increase of the inter-terminal capacitance $C_t$. On the other hand, with the chip parts 2001 with the number of parallels of "5" to "10," although the ESD resistance increases with the increase of the number of parallels, the inter-terminal capacitance $C_t$ is not more than 6 pF in all cases.

More specifically, comparison of the chip parts 2001 with the number of parallels of "5" to "10" with the chip part 2001 with the number of parallels of "1" shows that the with the chip parts 2001 with the number of parallels of "5" to "10," a high ESD resistance is attained while substantially maintaining the inter-terminal capacitance $C_t$ of the chip part 2001 with the number of parallels of "1." That is, by making the respective peripheral lengths of the first and second diffusion regions 2110 and 2112 large (be not less than 400 μm) in a state where the respective areas of the first and second diffusion regions 2110 and 2112 are restricted to not more than a predetermined area (not more than 2000 $\mu m^2$), a high ESD resistance is realized in the state of maintaining a low inter-terminal capacitance $C_t$.

More specifically, with the chip parts 2001 with the number of parallels of "5" and "6," ESD resistances of not less than 11 kV (more specifically, 11 kV≤ESD resistance <12 kV) are realized. It can thus be understood that by making the respective peripheral lengths of the first and second diffusion regions 2110 and 2112 be not less than 400 μm and not more than 420 μm in a state where the respective areas of the first and second diffusion regions 2110 and 2112 are restricted to not more than 2000 $\mu m^2$ (more specifically, not less than 1800 $\mu m^2$ and not more than 1900 $\mu m^2$), 11 kV≤ESD resistance <12 kV is realized while achieving 4 pF<inter-terminal capacitance $C_t$<6 pF.

Also, with the chip parts 2001 with the number of parallels of "7," "8," and "10" (hereinafter referred to as the "number of parallels of "7" to "10"), ESD resistances of not less than 12 kV (more specifically, 12 kV≤ESD resistance <16 kV) are realized. It can thus be understood that by making the respective peripheral lengths of the first and second diffusion regions 2110 and 2112 be not less than 470 μm and not more than 720 μm in a state where the respective areas of the first and second diffusion regions 2110 and 2112 are restricted to not more than 2000 $\mu m^2$ (more specifically, not less than 1800 $\mu m^2$ and not more than 1900 $\mu m^2$), an ESD resistance of not less than 12 kV (more specifically, 12 kV≤ESD resistance <16 kV) is realized while achieving 4 pF<inter-terminal capacitance $C_t$<6 pF.

Also, comparison of the chip parts 2001 with the number of parallels of "7" to "10" (especially the chip part 2001 with the number of parallels of "10" (peripheral length=720 μm, area=1800 $\mu m^2$) with the TEG 1 (peripheral length=700 μm, area=5028 $\mu m^2$) shows that with the chip parts 2001 with the number of parallels of "7" to "10," a low inter-terminal capacitance $C_t$ is attained while substantially maintaining the ESD resistance of the TEG 1. That is, by making the respective areas of the first and second diffusion regions 2110 and 2112 small in a state where the respective peripheral lengths of the first and second diffusion regions 2110 and 2112 are restricted to not less than a predetermined length, a low inter-terminal capacitance $C_t$ is realized in the state of substantially maintaining a high ESD resistance.

From these experimental results, it could be understood that by making the respective peripheral lengths of the first and second diffusion regions 2110 and 2112 be not less than a predetermined length while restricting the respective areas of the first and second diffusion regions 2110 and 2112 to be not more than a predetermined area, the ESD resistance and the inter-terminal capacitance $C_t$ that are in the trade-off relationship can be set independently of each other.

Also, in a case where the lower limit of the ESD resistance is set to 8 kV based on the international standards IEC61000-4-2, all of the chip parts 2001 with the number of parallels of "5" to "10" can comply with the international standards IEC61000-4-2.

As described above, with the chip part 2001, an inter-terminal capacitance $C_t$ of not more than 6 pF can be attained by setting the respective areas of the first and second diffusion regions 2110 and 2112 to not more than 2500 $\mu m^2$.

Also, by setting the respective peripheral lengths of the first and second diffusion regions 2110 and 2112 to not less than 400 μm and not more than 720 μm while setting the respective areas of the first and second diffusion regions 2110 and 2112 to not more than 2000 $\mu m^2$ (more specifically, not less than 1800 $\mu m^2$ and not more than 1900 $\mu m^2$), an ESD resistance of not less than 8 kV (more specifically, 11 kV≤ESD resistance <16 kV) can be realized while attaining an inter-terminal capacitance $C_t$ of not more than 6 pF (more specifically, 4 pF<inter-terminal capacitance $C_t$<6 pF).

Further, by setting the respective peripheral lengths of the first and second diffusion regions 2110 and 2112 to not less than 470 μm and not more than 720 μm while setting the respective areas of the first and second diffusion regions 2110 and 2112 to not more than 2000 $\mu m^2$ (more specifically, not less than 1800 $\mu m^2$ and not more than 1900 $\mu m^2$), an ESD resistance of not less than 12 kV (more specifically, 12 kV≤ESD resistance <16 kV) can be realized.

Thus by the chip part 2001, a chip part 2001 can be provided that includes a bidirectional Zener diode, which is capable of complying with IEC61000-4-2 while realizing a low inter-terminal capacitance $C_t$ and is excellent in reliability.

Although with the present reference example, the chip part 2001 with the maximum number of parallels being "10" was prepared, it can be presumed, based on the above experimental results, that an inter-terminal capacitance $C_t$ and an ESD resistance that are better can be attained by making the number of parallels not less than "10," that is, by making the respective peripheral lengths of the first and second diffusion regions 2110 and 2112 not less than 720 μm in a state while making the respective areas of the first and second diffusion regions 2110 and 2112 not more than 2000 $\mu m^2$ (more specifically, not less than 1800 $\mu m^2$ and not more than 1900 $\mu m^2$). That is, it can be presumed that an inter-terminal capacitance $C_t$ and an ESD resistance that are even better can be attained by making the respective peripheral lengths of the first and second diffusion regions 2110 and 2112 as long as possible while maintaining a state of making the respective areas of the first and second diffusion regions 2110 and 2112 as small as possible.

Figure 102:
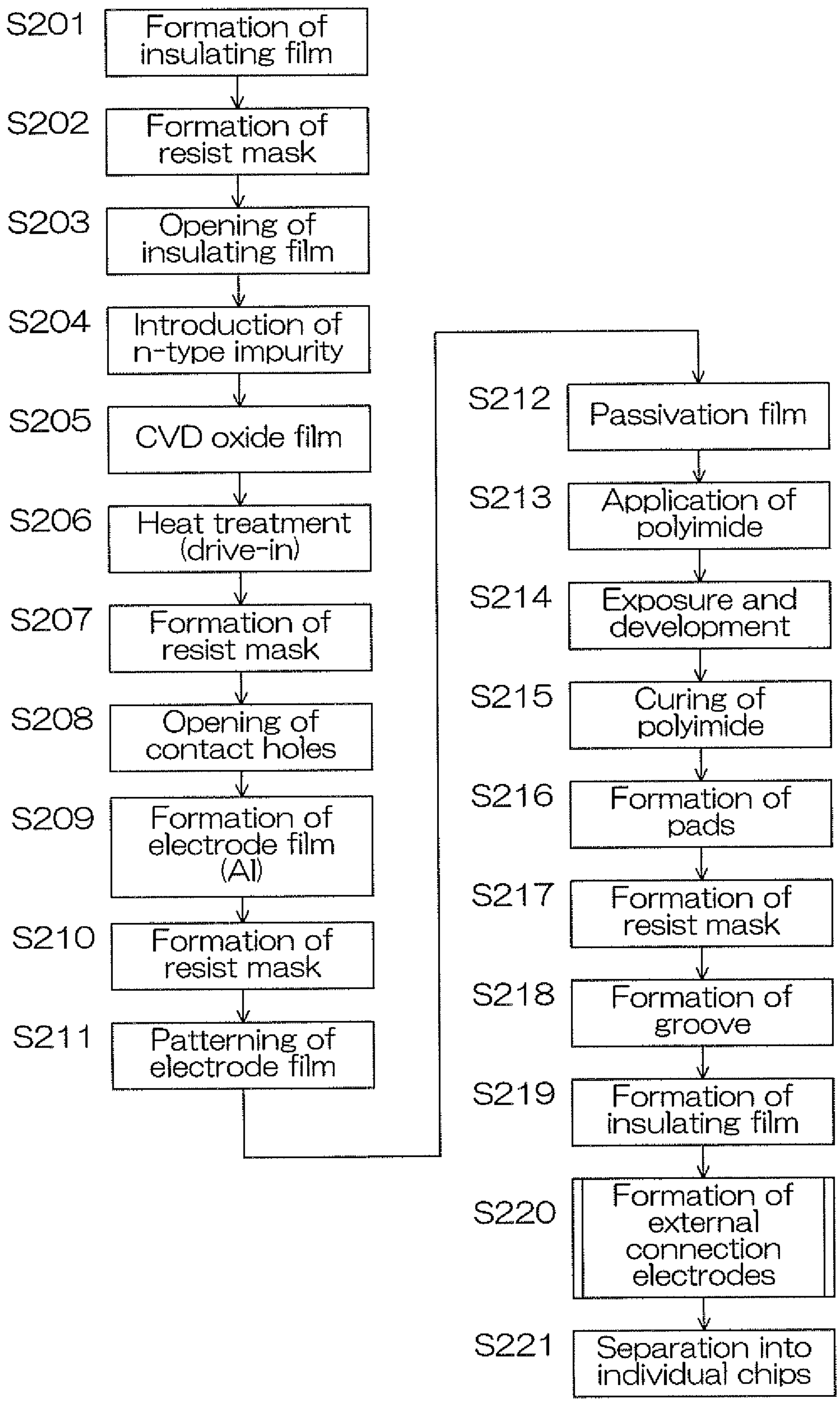
FIG. 102 is a flow chart for describing an example of a manufacturing process of the chip part shown in FIG. 77.

FIG. 102 is a flow chart for describing an example of a manufacturing process of the chip part 2001 shown in FIG. 77. FIG. 103A to FIG. 103H are sectional views of a method for manufacturing the chip part 2001 shown in FIG. 77. For the sake of description, the pattern PT formed on the first and second electrode films 2103 and 2104 is omitted in FIG. 103A to FIG. 103H.

Figure 103A:
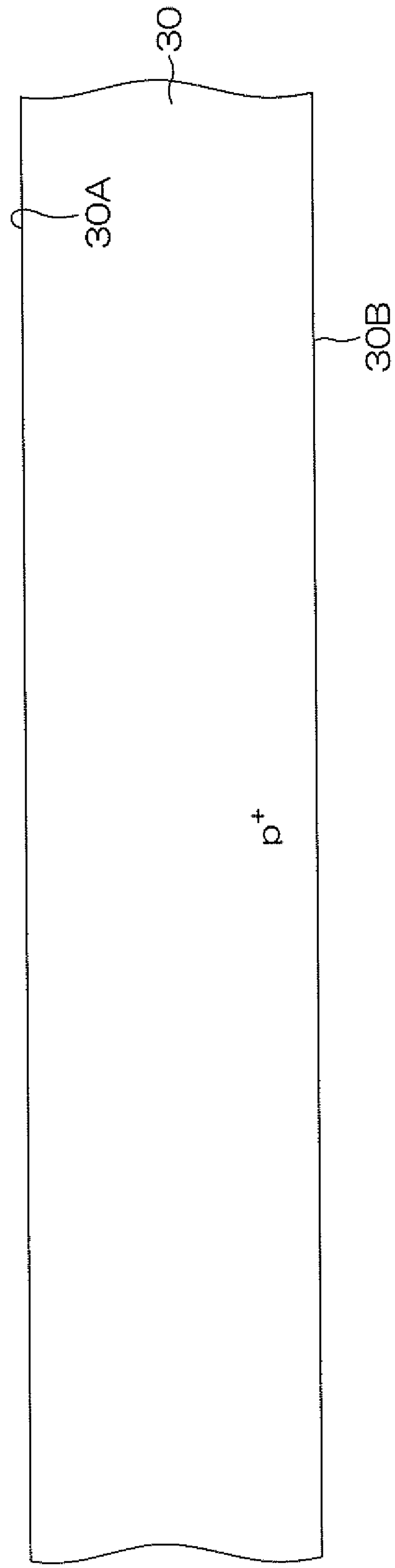
FIG. 103A to FIG. 103H are sectional views of a method for manufacturing the chip part shown in FIG. 77.

First, a $p^+$-type semiconductor substrate 30 is prepared as the base substrate of the substrate 2 as shown in FIG. 103A. The front surface 30A of the semiconductor substrate 30 is an element forming surface and the surface at the opposite side of the front surface 30A is the rear surface 30B. The front surface 30A of the semiconductor substrate 30 corresponds to the element forming surface 2A of the semiconductor substrate 2 and the rear surface 30B of the semiconductor substrate 30 corresponds to the rear surface 2B of the semiconductor substrate 2.

Chip regions 2001*a*, in which a plurality of bidirectional Zener diodes corresponding to a plurality of the chip parts 2001 are to be formed, are aligned and set in a matrix on the front surface 30A (element forming surface) of the semiconductor substrate 30. A boundary region 2180 is provided between adjacent chip regions 2001*a* (see FIG. 104). The boundary region 2180 is a band-like region having a substantially fixed width and extends in two orthogonal directions to form a lattice. After performing necessary processes on the semiconductor substrate 30, the semiconductor substrate 30 is cut apart (separated into individual chips) along the boundary region 2180 to obtain the plurality of chip parts 2001.

Figure 103B:
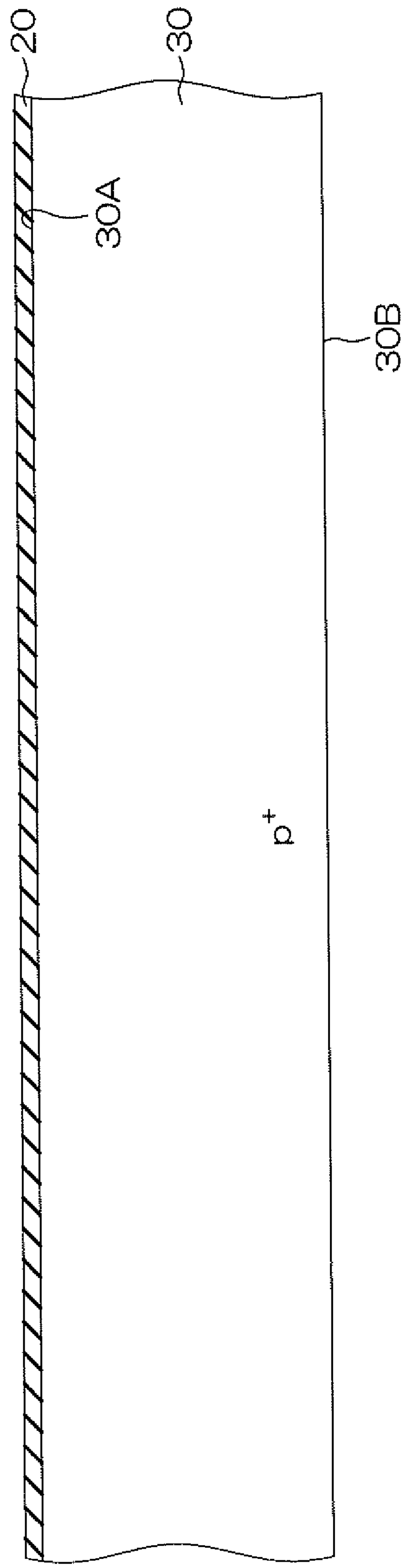

Thereafter, the insulating film 20 is formed on the front surface 30A of the semiconductor substrate 30 as shown in FIG. 103B (step S201: insulating film forming process). Thereafter, a resist mask (not shown) is formed on the insulating film 20 (step S202: resist mask forming process). Openings corresponding to the first diffusion region 2110 and the second diffusion region 2112 are then formed in the insulating film 20 by etching using the resist mask (step S203: insulating film opening forming process).

Next, after peeling off the resist mask, an n-type impurity is introduced to surface layer portions of the semiconductor substrate 30 that are exposed from the openings formed in the insulating film 20 (step S204: n-type impurity introducing process). The introduction of the n-type impurity may be performed by a process of depositing phosphorus as the n-type impurity on the front surface (so-called phosphorus deposition) or by implantation of n-type impurity ions (for example, phosphorus ions). Phosphorus deposition is a process of depositing phosphorus on the front surface 30A of the semiconductor substrate 30 exposed inside the openings in the insulating film 20 by conveying the semiconductor substrate 30 into a diffusion furnace and performing heat treatment while making $POCl_3$ gas flow inside a diffusion passage.

Next, after thickening the insulating film 20 as necessary by the CVD method (step S205: CVD oxide film forming process), heat treatment (drive-in) for activation of the impurity ions introduced into the semiconductor substrate 30 is performed (step S206: heat treatment (drive-in) process). The first diffusion region 2110 and the second diffusion region 2112 are thereby formed on the surface layer portion of the semiconductor substrate 30.

Figure 103C:
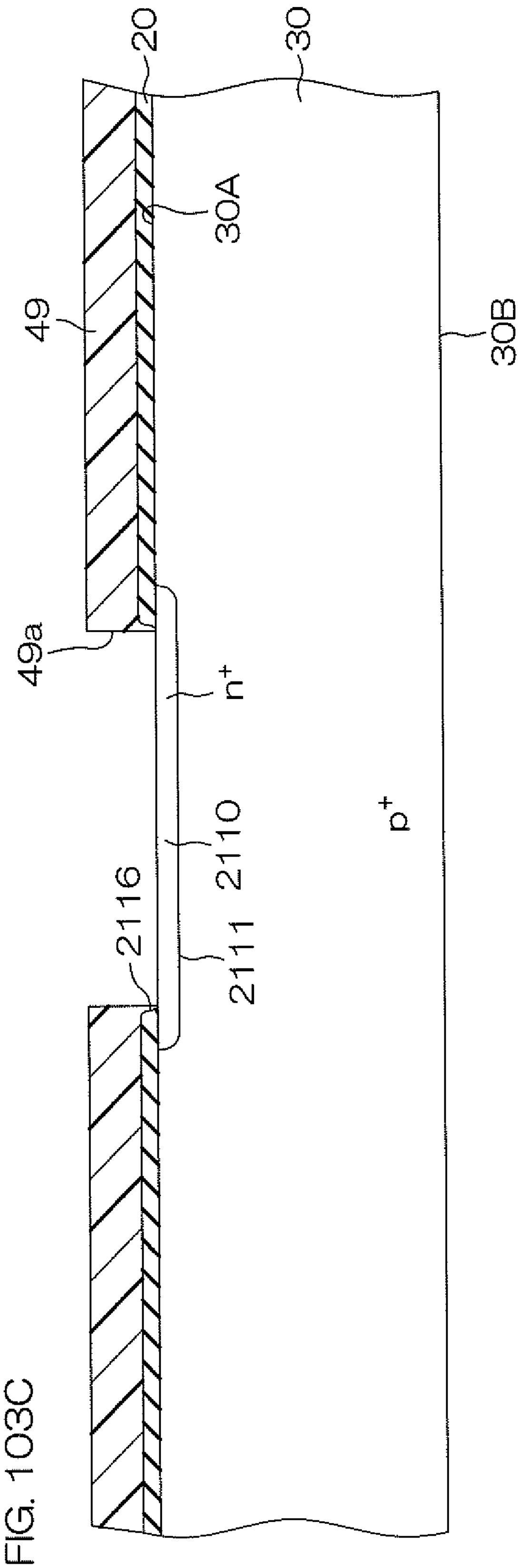

Next, as shown in FIG. 103C, a resist mask 49 having openings 49*a* matching the contact holes 2116 and 2117 is formed on the insulating film 20 (step S207: resist mask forming process). The contact holes 2116 and 2117 are formed in the insulating film 20 by etching via the resist mask 49 (step S208: contact hole opening process). The resist mask 49 is thereafter peeled off.

Figure 103D:
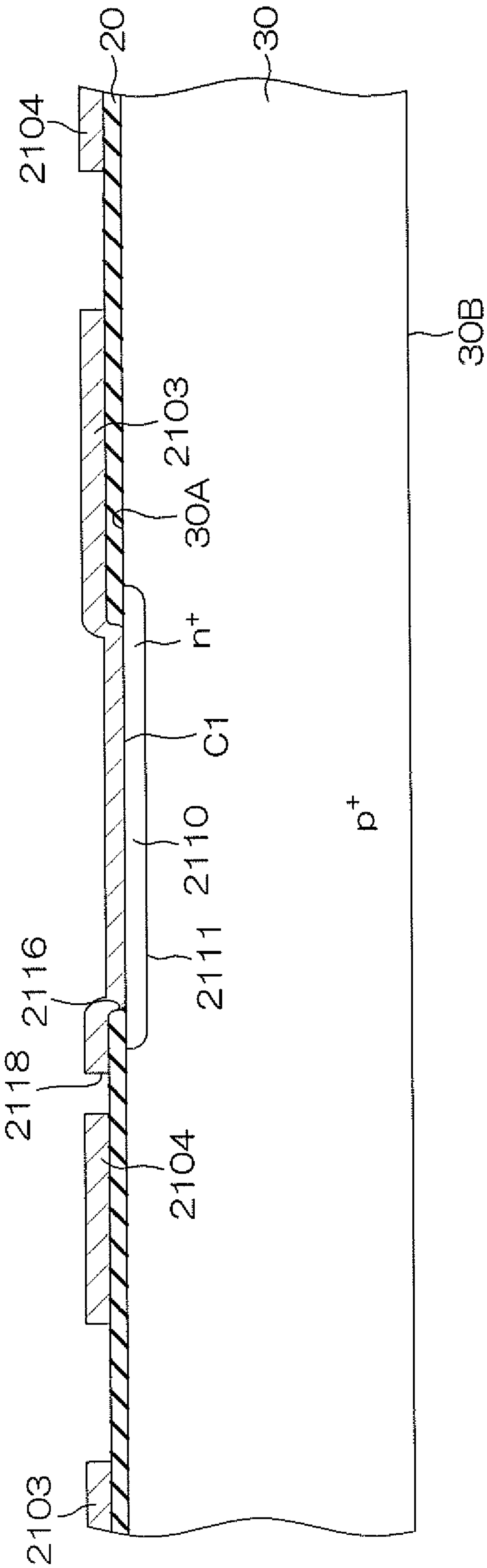

Next, as shown in FIG. 103D, an electrode film that constitutes the first electrode film 2103 and the second electrode film 2104 is formed on the insulating film 20, for example, by sputtering (step S209: electrode film forming process). In the present reference example, an electrode film, made of Al, is formed. Another resist mask having an opening pattern corresponding to the slit 2118 is then formed on the electrode film (step S210: resist mask forming process) and the slit 2118 is formed in the electrode film by etching (for example, reactive ion etching) via the resist mask (step S211: electrode film patterning process). The electrode film is thereby separated into the first electrode film 2103 and the second electrode film 2104 and the first and second Zener diodes D1 and D2 are formed.

Figure 103E:
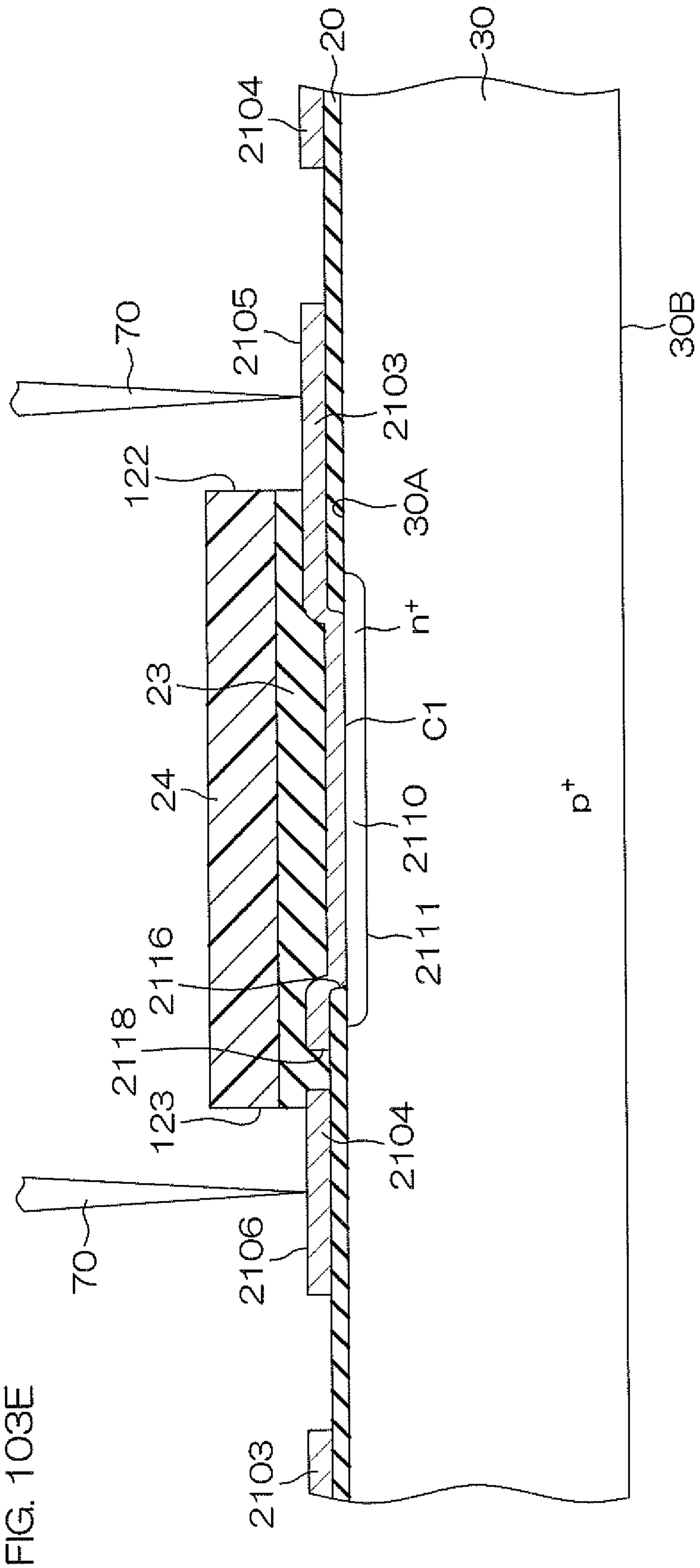

Next, as shown in FIG. 103E, after peeling off the resist mask, the passivation film 23, which is a nitride film, etc., is formed, for example, by the CVD method (step S212: passivation film forming process). Next, a photosensitive polyimide, etc., is applied to form the resin film 24 (step S213: polyimide applying process). Next, the resin film 24 is exposed with the predetermined pattern PT (see FIG. 82 to FIG. 84) that includes the first openings 25 and the second openings 26 and with a pattern corresponding to the notched portions 122 and 123. Thereafter, the resin film 24 is developed (step S214: exposure/development process).

By patterning and developing the resin film 24, portions of the resin film 24 matching the predetermined pattern PT and portions matching the notched portions 122 and 123 are selectively removed. More specifically, the resin film 24 is removed in a pattern by which the flat portion 97 and the projection formation portion 98 (see FIG. 82) are formed on the front surface of each of the first and second connection electrodes 3 and 4. In each region in which the flat portion 97 is formed, the first opening 25, which exposes the front surface of the first electrode film 2103 or the second electrode film 2104 across an area wider than the second openings 26, is formed in the first electrode film 2103 or the second electrode film 2104. In this process, the resin film 24 on the first electrode film 2103 and the second electrode film 2104 melts due to the exposure and is formed to have an arcuate shape in a sectional view.

If the projections 96 of array form are to be formed in the projection formation portion 98 of each of the first and second connection electrodes 3 and 4 (see FIG. 83), the plurality of second openings 26 are formed on each of the first electrode film 2103 and the second electrode film 2104 in a pattern of being aligned in an array at fixed intervals in the row direction and the column direction that are mutually orthogonal.

On the other hand, if the projections 96 of staggered form are to be formed in the projection formation portion 98 of each of the first and second connection electrodes 3 and 4 (see FIG. 84), the plurality of second openings 26 are formed on each of the first electrode film 2103 and the second electrode film 2104 in a staggered alignment pattern of being dislocated in position in the row direction at every other column in the row direction and the column direction that are mutually orthogonal.

Thereafter, heat treatment for curing the resin film 24 is performed as necessary (step S215: polyimide curing process). The predetermined pattern PT (see FIG. 82 to FIG. 84) and the notched portions 122 and 123 are then formed by removing the passivation film 23 by dry etching (for example, reactive ion etching) using the resin film 24 as a mask. The first electrode film 2103 and the second electrode film 2104 exposed from the notched portions 122 and 123 are thereby formed as the uneven first pad 2105 and the uneven second pad 2106 (step S216: pad forming process).

Next, an electrical test is performed on the first and second Zener diodes D1 and D2. The electrical test is performed by putting probes 70 in contact with the first pad 2105 and the second pad 2106. At this point, the comparatively wide first openings 25 are formed at the first pad 2105 and the second pad 2106. Therefore, by setting the positions of contact of the probes 70 and the first pad 2105 and the second pad 2106 within the first openings 25, the probes 70 (more specifically, portions other than tip end portions of the probes 70) can be effectively suppressed from entering into a comparatively narrow second opening 26 or contacting a side surface of the second opening 26, etc. The electrical test can thus be performed satisfactorily.

Figure 103F:
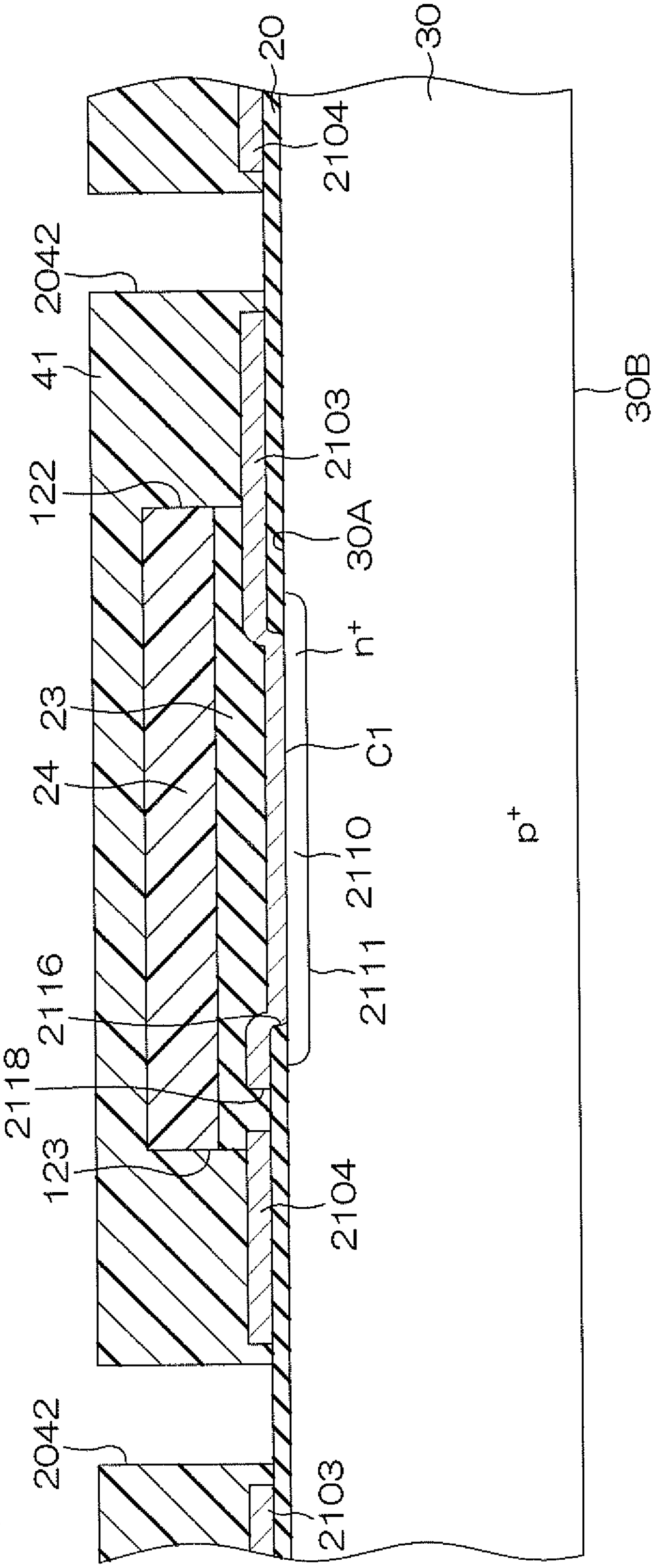

Next, as shown in FIG. 103F, the resist pattern 41 for forming a groove 2044 to be described below is formed (step S217: resist mask forming process).

Figure 104:
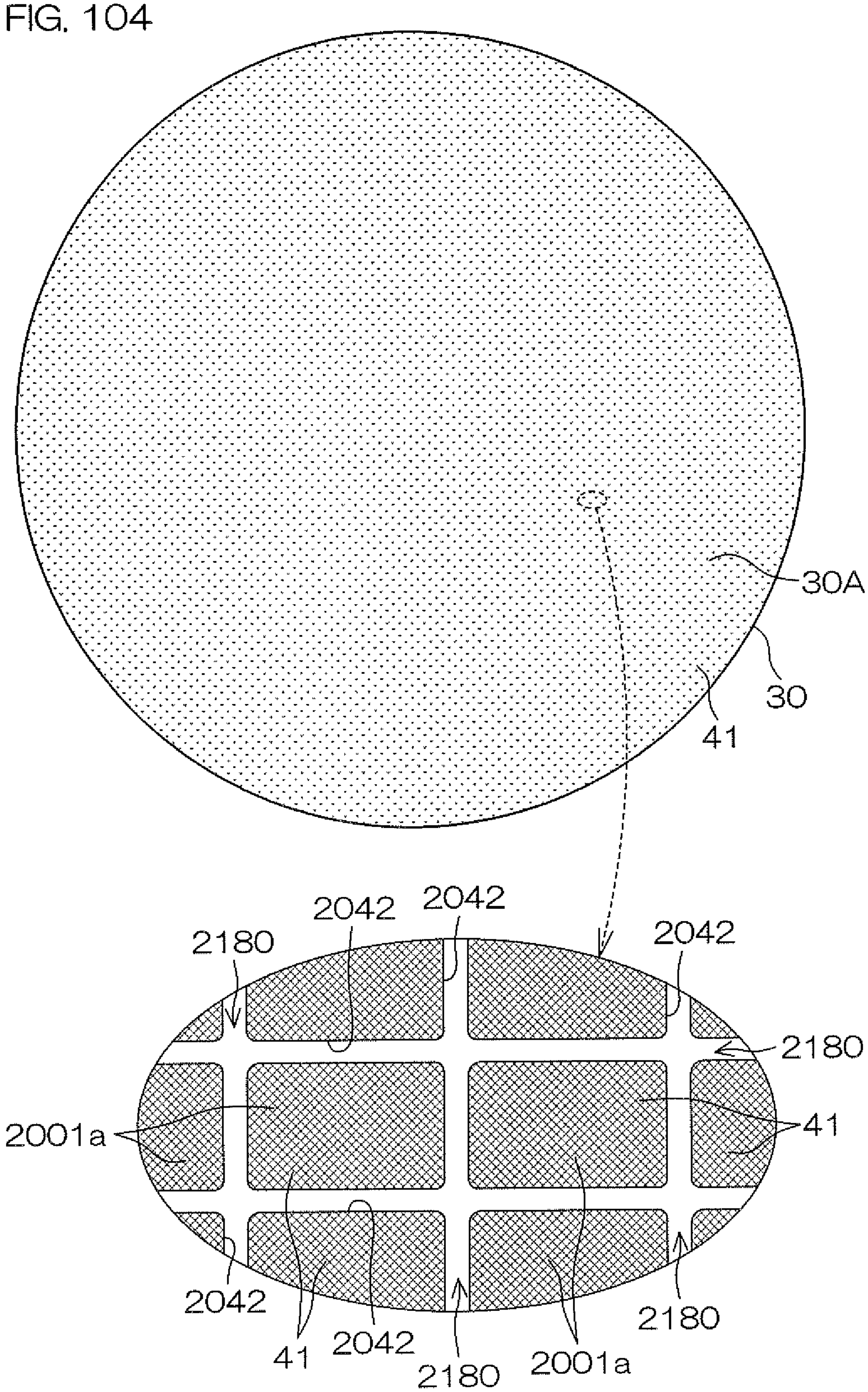
FIG. 104 is a schematic plan view of a portion of a resist pattern used to form a groove in the process of FIG. 103F.

FIG. 104 is a schematic plan view of a portion of the resist pattern 41 used to form the groove 2044 in the process of FIG. 103F. The resist pattern 41 has a lattice-shaped opening 2042 that matches the boundary region 2180. Plasma etching is performed via the resist pattern 41.

The semiconductor substrate 30 is thereby etched to a predetermined depth from its front surface 30A as shown in 103G. The groove 2044 for cutting is thereby formed along the boundary region 2180 (step S218: groove forming process).

The overall shape of the groove 2044 in the semiconductor substrate 30 is a lattice that matches the opening 2042 of the resist pattern 41 in a plan view (see FIG. 104). At the front surface 30A of the semiconductor substrate 30, rectangular frame body portions of the groove 2044 surround the peripheries of the chip regions 2001*a*. One semi-finished product 2050 is positioned in each chip region 2001*a* surrounded by the groove 2044, and these semi-finished products 50 are aligned and disposed in an array. By thus forming the groove 2044, the semiconductor substrate 30 is made capable of being separated according to each of the plurality of chip regions 2001*a*. After the groove 2044 has been formed, the resist pattern 41 is peeled off.

Next, the insulating film 47, constituted of SiN, is formed across the entire front surface 30A of the semiconductor substrate 30 by the CVD method (step S219: insulating film step). In this process, the insulating film 47 is also formed on the entireties of the inner peripheral surfaces (the demarcating surfaces of the side walls and the upper surfaces of the bottom walls described above) of the groove 2044. Next, the insulating film 47 is etched selectively. Specifically, portions of the insulating film 47 that are parallel to the front surface 30A are etched selectively. The first electrode film 2103 is thereby exposed as the first pad 2105, the second electrode film 2104 is exposed as the second pad 2106, and, in the groove 2044, the insulating film 47 on the bottom walls is removed.

Figure 105:
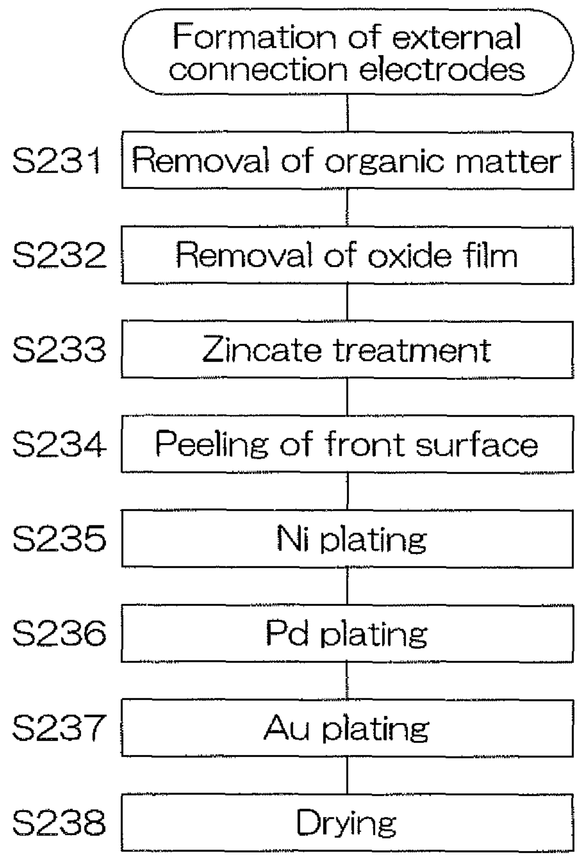
FIG. 105 is a flow chart for describing a process for manufacturing connection electrodes.

Next, by the process shown in FIG. 105, the first and second connection electrodes 3 and 4 are formed as the external connection electrodes (step S220: external electrode forming process).

FIG. 105 is a diagram for describing a process for manufacturing the first and second connection electrodes 3 and 4.

To manufacture the first and second connection electrodes 3 and 4, first as shown in FIG. 105, front surfaces of the first pad 2105 and the second pad 2106 are cleaned to remove (degrease) organic matter (including smut such as carbon stains and greasy dirt) on the front surfaces (step S231: organic matter removing process). Next, an oxide film on the front surfaces is removed (step S232: oxide film removing process). Next, a zincate treatment is performed on the front surfaces to convert the Al (of the first electrode film 2103 and the second electrode film 2104) at the front surfaces to Zn (step S233: zincate process). Next, the Zn on the front surfaces is peeled off by nitric acid, etc., so that fresh Al is exposed at the first pad 2105 and the second pad 2106 (step S234: front surface peeling process).

Next, the first pad 2105 and the second pad 2106 are immersed in a plating solution to apply Ni plating on front surfaces of the fresh Al in the first pad 2105 and the second pad 2106. The Ni in the plating solution is thereby chemically reduced and deposited to form the Ni layers 33 on the respective front surfaces of the first pad 2105 and the second pad 2106 (step S235: Ni plating process).

Next, the Ni layers 33 are immersed in another plating solution to apply Pd plating on front surfaces of the Ni layers 33. The Pd in the plating solution is thereby chemically reduced and deposited to form the Pd layers 34 on the front surfaces of the Ni layers 33 (step S236: Pd plating process).

Next, the Pd layers 34 are immersed in yet another plating solution to apply Au plating on front surfaces of the Pd layers 34. The Au in the plating solution is thereby chemically reduced and deposited to form the Au layers 35 on the front surfaces of the Pd layer 34 (step S237: Au plating process). The first and second connection electrodes 3 and 4 are thereby formed, and when the first and second connection electrodes 3 and 4 that have been formed are dried (step S238: drying process), the process for manufacturing the first and second connection electrodes 3 and 4 is completed. A step of cleaning the semi-finished product 2050 with water is performed as necessary between consecutive steps. Also, the zincate treatment may be performed a plurality of times.

As described above, the first and second connection electrodes 3 and 4 are formed by electroless plating and the Ni, Pd, and Al, which are the electrode materials, can thus be grown satisfactorily by plating even on the insulating film 47. Also in comparison to a case where the first and second connection electrodes 3 and 4 are formed by electrolytic plating, the number of steps of the process for forming the first and second connection electrodes 3 and 4 (for example, a lithography process, a resist mask peeling process, etc., that are necessary in electrolytic plating) can be reduced to improve the productivity of the chip part 2001. Further, in the case of electroless plating, the resist mask that is deemed to be necessary in electrolytic plating is unnecessary and deviation of the positions of formation of the first and second connection electrodes 3 and 4 due to positional deviation of the resist mask thus does not occur, thereby enabling the formation position precision of the first and second connection electrodes 3 and 4 to be improved to improve the yield.

Also with this method, the first electrode film 2103 and the second electrode film 2104 are exposed from the notched portions 122 and 123 and there is nothing that hinders the plating growth from the first electrode film 2103 and the second electrode film 2104 to the groove 2044. That is, the chip regions 2001*a* are covered by the resin film 24 and plating growth does not occur at the regions in which the first and second Zener diodes D1 and D2 are formed. Plating growth can thus be achieved rectilinearly from the first electrode film 2103 and the second electrode film 2104 to the groove 2044. Consequently, the time taken to form the electrodes can be reduced.

Next, as shown in FIG. 104H, the semiconductor substrate 30 is ground from the rear surface 303B side until the bottom portion of the groove 2044 is reached (step S221: individual chip separation process). The plurality of chip regions 2001*a* are thereby separated into individual chips and the chip parts 2001 of the above described structure can be obtained. The plurality of chip parts 2001 formed on the semiconductor substrate 30 can thus be divided all at once into individual chips (separated into individual chips) (the individual chips of the plurality of chip parts 2001 can be obtained at once) by forming the groove 2044 and then grinding the semiconductor substrate 30 from the rear surface 30B side. The productivity of the chip parts 2001 can thus be improved by reduction of the time for manufacturing the plurality of chip parts 2001.

The rear surface 2B of the semiconductor substrate 2 of the finished chip part 2001 may be mirror-finished by polishing or etching to refine the rear surface 2B.

Also, an electrical test may be performed on the finished chip part 2001. The flat portions 97 are formed on the respective front surfaces of the first and second connection electrodes 3 and 4. Therefore, by setting the respective contact positions of probes (corresponding to the probes 70 in FIG. 103E) used in the electrical test and the first and second connection electrodes 3 and 4 in the flat portions 97, the probes (more specifically, portions other than tip end portions of the probes) can be effectively suppressed from contacting the projections 96. The electrical test can thus be performed satisfactorily.

As described above, with the present reference example, the semiconductor substrate 2 is constituted of the p-type semiconductor substrate and therefore stable characteristics can be realized even if an epitaxial layer is not formed on the semiconductor substrate 2. That is, an n-type semiconductor substrate is large in in-plane variation of resistivity, and therefore when an n-type semiconductor substrate is used, an epitaxial layer with low in-plane variation of resistivity must be formed on the front surface and an impurity diffusion layer must be formed on the epitaxial layer to form the p-n junction. This is because an n-type impurity is low in segregation coefficient and therefore when an ingot (for example, a silicon ingot) that is the base of a substrate is formed, a large difference in resistivity arises between a central portion and a peripheral edge portion of the semiconductor substrate.

On the other hand, a p-type impurity is comparatively high in segregation coefficient and therefore a p-type semiconductor substrate is low in in-plane variation of resistivity.

Therefore by using a p-type semiconductor substrate, a bidirectional Zener diode with stable characteristics can be cut out from any location of the semiconductor substrate without having to form an epitaxial layer. Therefore by using the semiconductor substrate 2 as the $p^+$-type semiconductor substrate, the manufacturing process can be simplified and the manufacturing cost can be reduced.

Figure 103G:
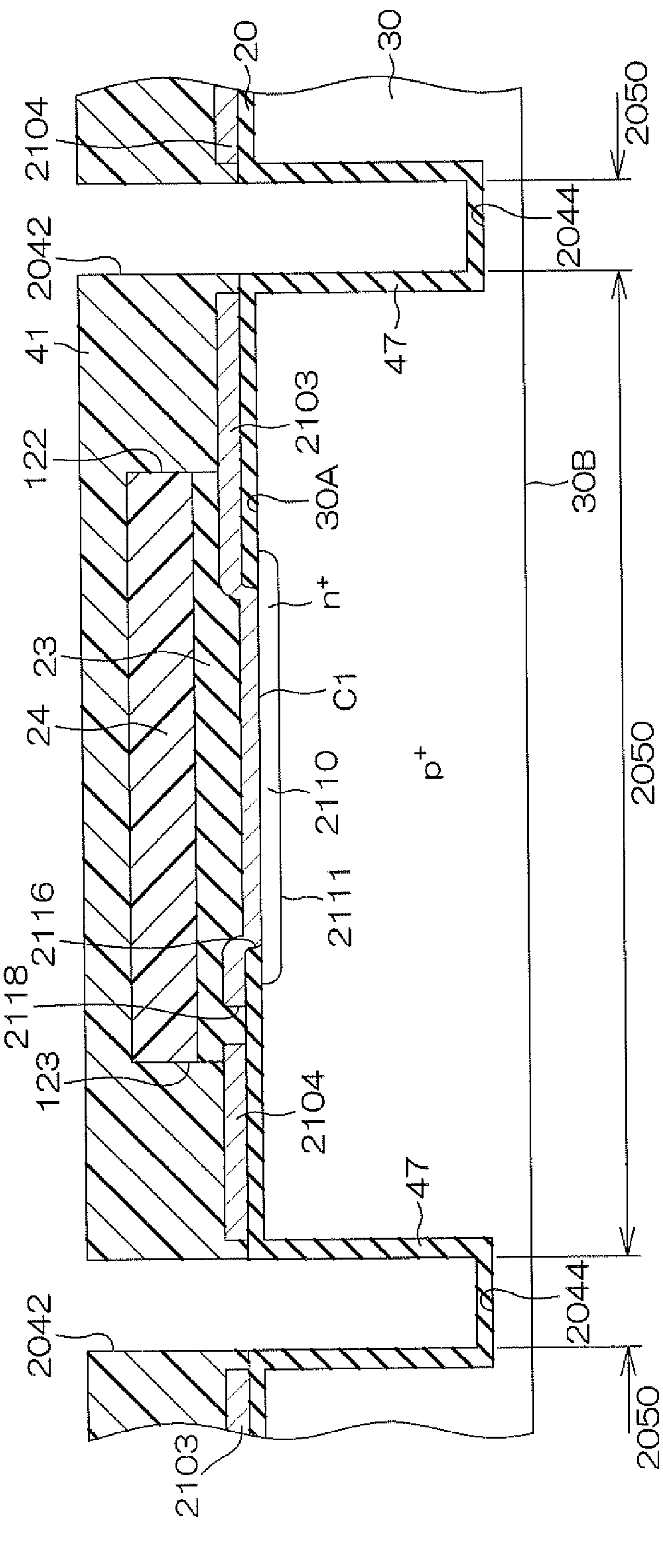
Figure 103H:
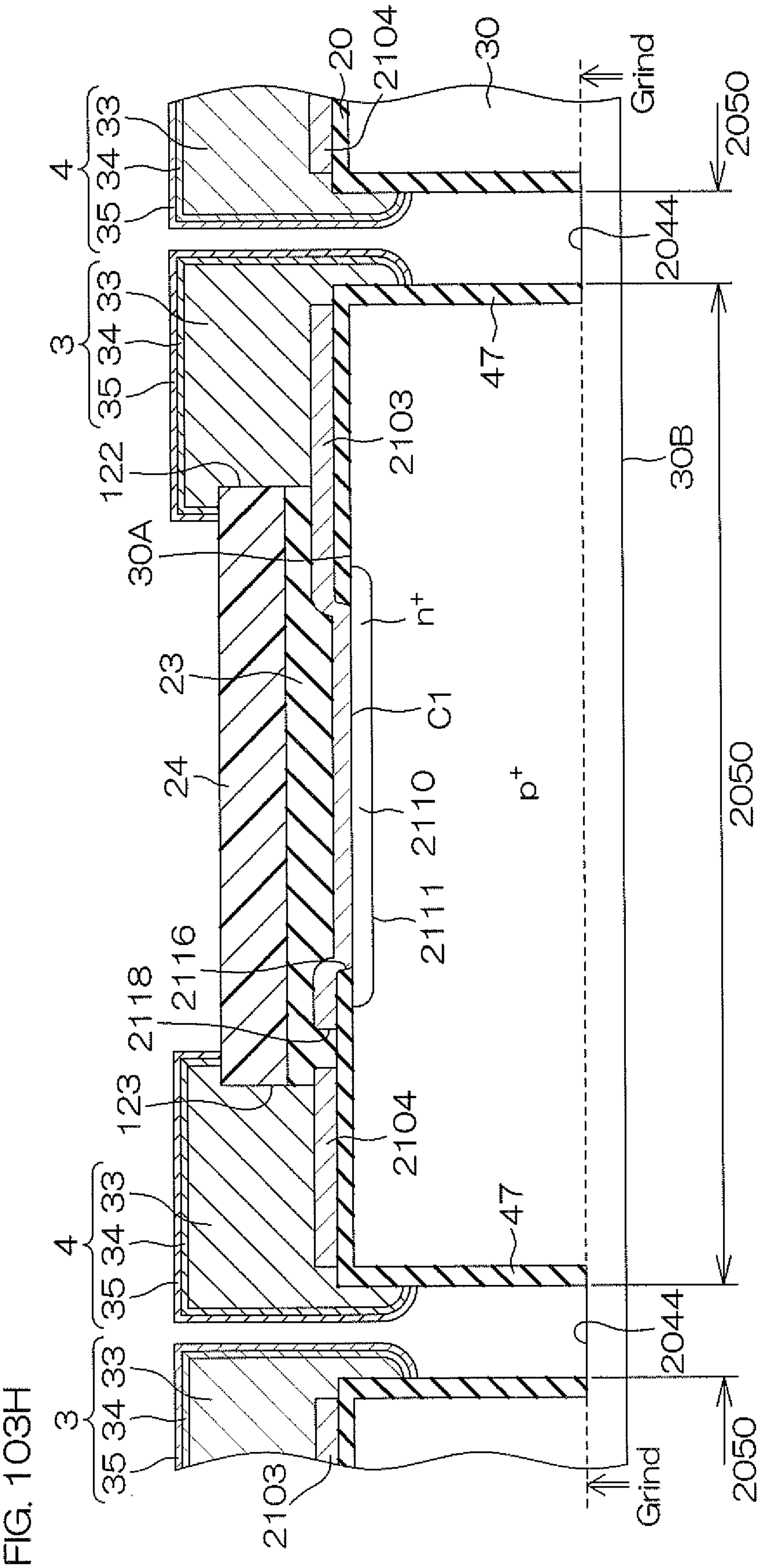

FIG. 106A to FIG. 106D are illustrative sectional views of a process for recovering the chip parts 2001 after the process of FIG. 103H.

Figure 106A:
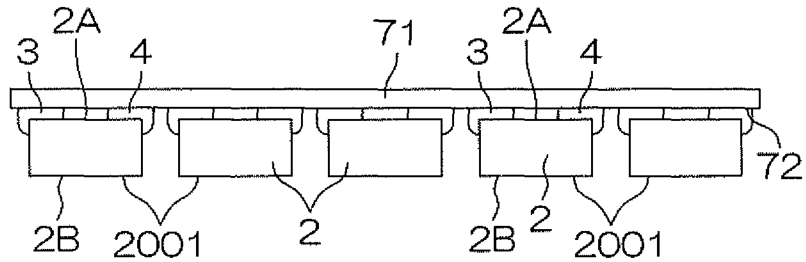
FIG. 106A to FIG. 106D are schematic sectional views of a chip part recovery process performed after the process of FIG. 103H.
Figure 106B:
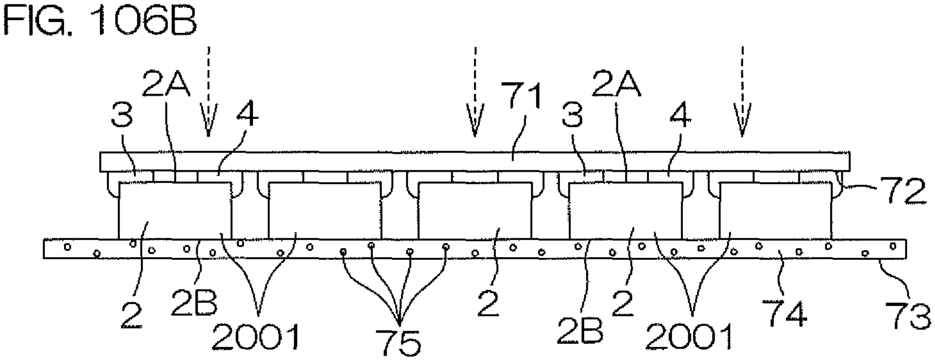

FIG. 106A shows a state where the plurality of chip parts 2001, which have been separated into individual chips, continue to be adhered to the supporting tape 71. In this state, a thermally foaming sheet 73 is adhered onto the rear surfaces 2B of the semiconductor substrates 2 of the respective chip parts 2001 as shown in FIG. 106B. The thermally foaming sheet 73 includes a sheet main body 74 of sheet shape and numerous foaming particles 75 that are kneaded into the sheet main body 74.

Figure 106C:
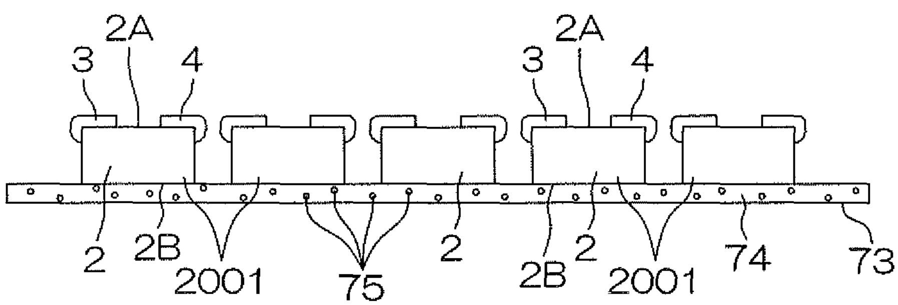

The adhesive force of the sheet main body 74 is stronger than the adhesive force at the adhesive surface 72 of the supporting tape 71. Thus after the thermally foaming sheet 73 has been adhered onto the rear surfaces 2B of the semiconductor substrates 2 of the respective chip parts 2001, the supporting tape 71 is peeled off from the respective chip parts 2001 to transfer the chip parts 1 onto the thermally foaming sheet 73 as shown in FIG. 106C. If ultraviolet rays are irradiated onto the supporting tape 71 in this process (see the dotted arrows in FIG. 106B), the adhesive property of the adhesive surface 72 weakens and the supporting tape 71 can be peeled off easily from the respective chip parts 2001.

Figure 106D:
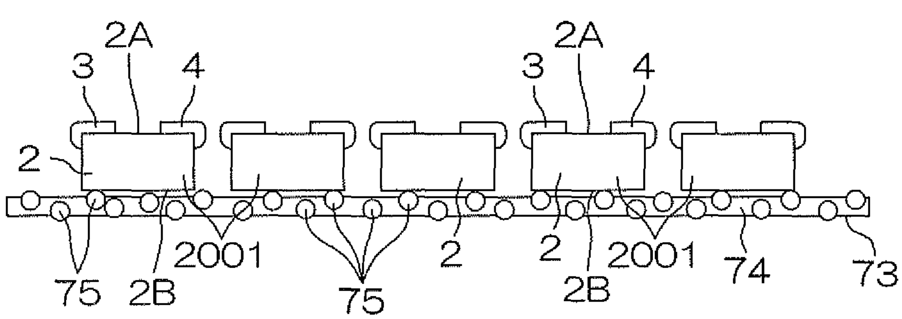

Next, the thermally foaming sheet 73 is heated. Thereby in the thermally foaming sheet 73, the respective thermally foaming particles 75 in the sheet main body 74 are made to foam and swell out from the front surface of the sheet main body 74 as shown in FIG. 106D. Consequently, the area of contact of the thermally foaming sheet 73 and the rear surfaces 2B of the semiconductor substrates 2 of the respective chip parts 2001 decreases and all of the chip parts 2001 peel off (fall off) naturally from the thermally foaming sheet 73. The chip parts 2001 that are thus recovered are housed in housing spaces formed in an embossed carrier tape (not shown). In this case, the processing time can be reduced in comparison to a case where the chip parts 2001 are peeled off one-by-one from the supporting tape 71 or the thermally foaming sheet 73. As a matter of course, in the state where the plurality of chip parts 2001 are adhered to the supporting tape 71 (see FIG. 106A), a predetermined number of the chip parts 2001 may be peeled off at a time directly from the supporting tape 71 without using the thermally foaming sheet 73. The embossed carrier tape in which the chip parts 2001 are housed is then placed in an automatic mounting machine 80. Each chip part 2001 is recovered individually by being suctioned by a suction nozzle 76 included in the automatic mounting machine 80. A front/rear judgment process by means of a part recognizing camera 64 is then executed on the chip parts 2001 that have thus been recovered (see FIG. 108 and FIG. 109).

Figure 107A:
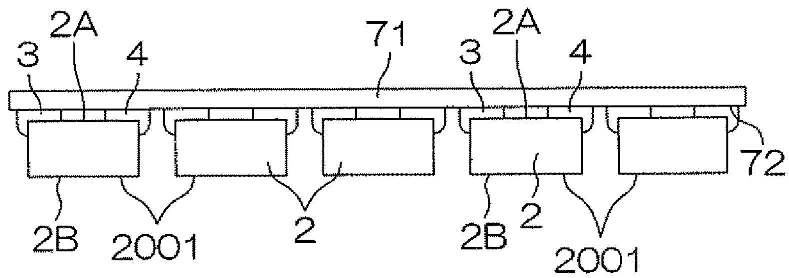
FIG. 107A to FIG. 107C are schematic sectional views of a chip part recovery process (modification example) performed after the process of FIG. 103H.
Figure 107B:
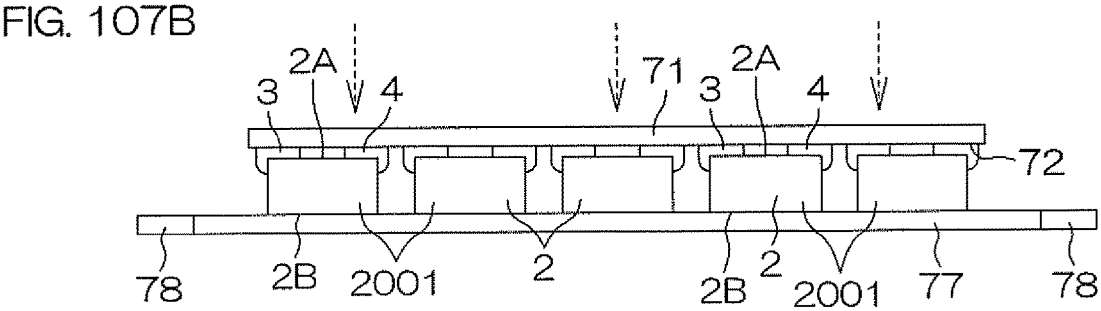
Figure 107C:
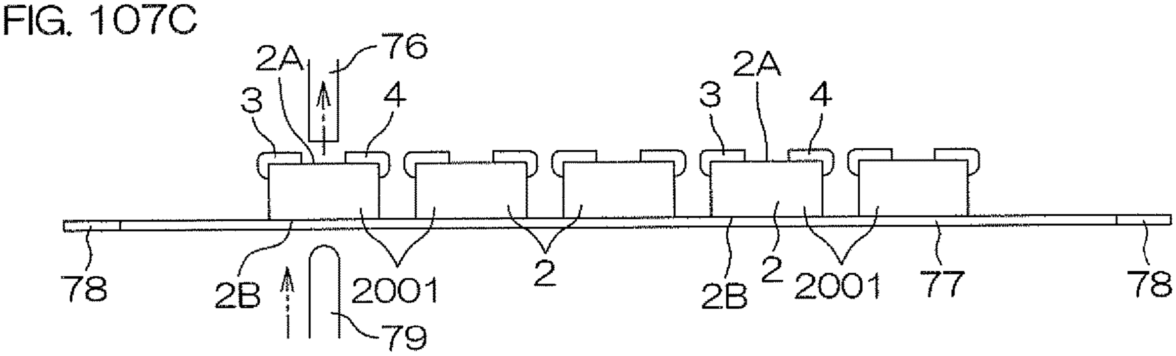

The respective chip parts 2001 may also be recovered by another method shown in FIG. 107A to FIG. 107C.

FIG. 107A to FIG. 107C are illustrative sectional views of a process (modification example) for recovering the chip parts 2001 after the process of FIG. 103H.

As in FIG. 106A, FIG. 107A shows a state where the plurality of chip parts 2001, which have been separated into individual chips, continue to be adhered to the supporting tape 71. In this state, the transfer tape 77 is adhered onto the rear surfaces 2B of the semiconductor substrates 2 of the respective chip parts 2001 as shown in FIG. 107B. The transfer tape 77 has a stronger adhesive force than the adhesive surface 72 of the supporting tape 71. Therefore after the transfer tape 77 has been adhered onto the respective chip parts 2001, the supporting tape 71 is peeled off from the respective chip parts 2001 as shown in FIG. 107C. In this process, ultraviolet rays (see the dotted arrows in FIG. 107B) may be irradiated onto the supporting tape 71 to weaken the adhesive property of the adhesive surface 72 as described above.

Frames 78 installed in the automatic mounting machine 80 are adhered to both ends of the transfer tape 77. The frames 78 at both sides are enabled to move in directions of approaching each other or separating from each other. When after the supporting tape 71 has been peeled off from the respective chip parts 2001, the frames 78 at both sides are moved in directions of separating from each other, the transfer tape 77 elongates and becomes thin. The adhesive force of the transfer tape 77 is thereby weakened, making it easier for the respective chip parts 2001 to become peeled off from the transfer tape 77. When in this state, the suction nozzle 76 of the automatic mounting machine 80 is directed toward the element forming surface 2A side of a chip part 2001, the chip part 2001 becomes peeled off from the transfer tape 77 and suctioned onto the suction nozzle 76 by the suction force generated by the automatic mounting machine 80 (suction nozzle 76). When in this process, the projection 79 shown in FIG. 107C pushes the chip part 2001 up toward the suction nozzle 76 from the opposite side of the suction nozzle 76 and via the transfer tape 77, the chip part 2001 can be peeled off smoothly from the transfer tape 77. The front/rear judgment process by means of the part recognizing camera 64 is then executed on the chip parts 2001 that have thus been recovered.

Figure 108:
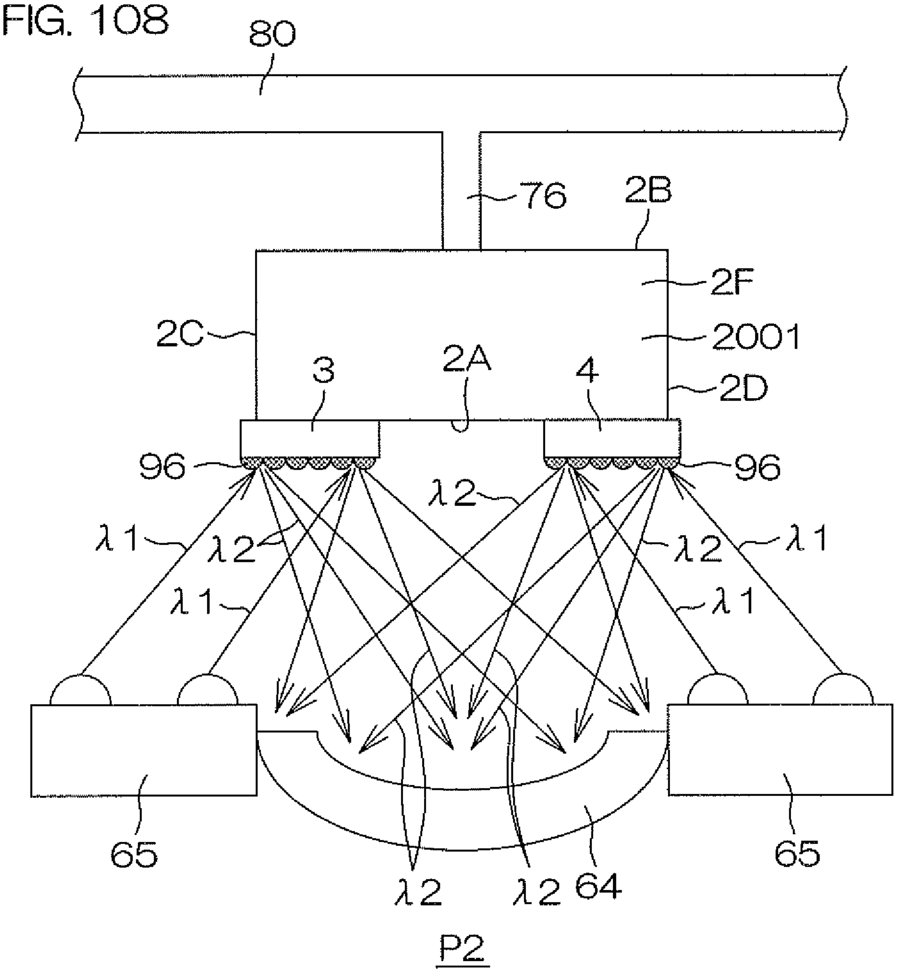
FIG. 108 is a diagram for describing a front/rear judgment process of the chip part shown in FIG. 77.
Figure 109:
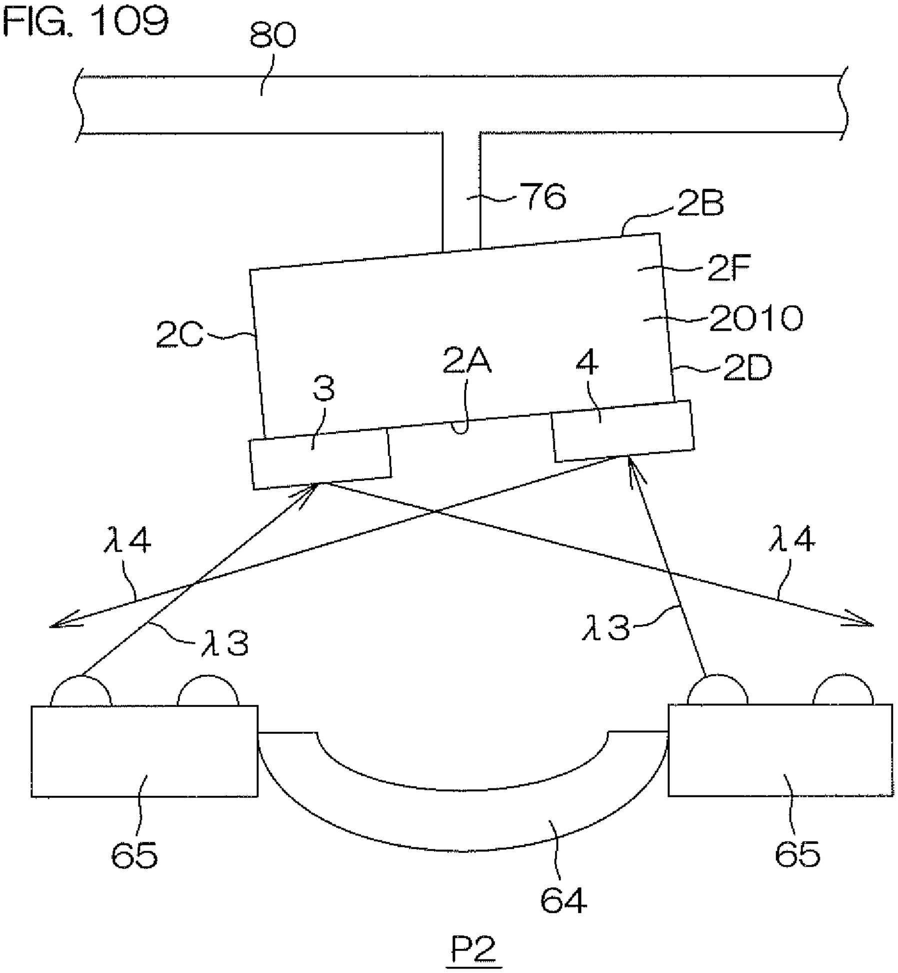
FIG. 109 is a diagram for describing a front/rear judgment process of a chip part according to a reference example.

FIG. 108 is a diagram for describing the front/rear judgment process of the chip part 2001 shown in FIG. 77. FIG. 109 is a diagram for describing the front/rear judgment process of a chip part 2010 according to a reference example.

Each of FIG. 108 and FIG. 109 shows a state where the chip part 2001 or the chip part 2010 according to the reference example is suctioned by the suction nozzle 76. Here, the "chip part 2010 according to the reference example" refers to a chip part with which the projections 96 are not formed on the respective front surfaces of the first and second connection electrodes 3 and 4.

As shown in FIG. 108, the automatic mounting machine 80 conveys the chip part 2001, in the state of being suctioned by the suction nozzle 76, to a part detection position P2 at which the front or rear of the chip part 2001 is judged by the part recognizing camera 64. In this process, a substantially central portion in the long direction of the rear surface 2B is suctioned onto the suction nozzle 76. As mentioned above, the first and second connection electrodes 3 and 4 are formed only on one surface (the element forming surface 2A) and the element forming surface 2A side end portions of the side surfaces 2C to 2F of the chip part 2001 and therefore, with the chip part 2001, the rear surface 2B is a flat surface without electrodes (unevenness). The flat rear surface 2B can thus be suctioned onto the suction nozzle 76 when the chip part 2001 is to be suctioned by the suction nozzle 76 and moved. In other words, with the flat rear surface 2B, a margin of the portion that can be suctioned by the suction nozzle 76 can be increased. The chip part 2001 can thereby be suctioned reliably by the suction nozzle 76 and the chip part 2001 can be conveyed reliably to the position P2 (above the mounting substrate 9) for part detection by the part recognizing camera 64 without dropping off from the suction nozzle 76 midway.

As shown in FIG. 108, when the chip part 2001 arrives at the part detection position P2, light from a light source 65 (for example, a light irradiator that includes a plurality of LEDs), installed at a periphery of the part recognizing camera 64, is irradiated in oblique directions onto the surface (element forming surface 2A) of the chip part 2001 on which the first and second connection electrodes 3 and 4 are formed. The part recognizing camera 64 detects the reflected light reflected from the first and second connection electrodes 3 and 4 and from portions of the chip part 2001 at which the first and second connection electrodes 3 and 4 are not formed to distinguish between light and dark of the regions in which the first and second connection electrodes 3 and 4 are formed and the regions in which the electrodes are not formed to judge the front or rear of the chip part 2001.

The chip part 2001 is not necessarily suctioned by the suction nozzle 76 in a horizontal attitude and may, at times, be suctioned by the suction nozzle 76 in an inclined attitude.

Here, as shown in FIG. 109, in the case of the chip part 2010 according to the reference example, when light from the light source 65 is irradiated onto the element forming surface 2A in an inclined attitude state (see incident light λ3 in FIG. 109), the first and second connection electrodes 3 and 4 reflect light out of the region in which the part recognizing camera 64 is disposed (total reflection: see reflected light λ4 in FIG. 109) and the reflected light may not be detected by the part recognizing camera 64. In such a case, a portion or all of the first and second connection electrodes 3 and 4 of the chip part 2010 may appear darkly in the image information captured by the part recognizing camera 64. The automatic mounting machine 80 thus misrecognizes the region in which the first and second connection electrodes 3 and 4 are formed to be a region in which the first and second connection electrodes 3 and 4 are not formed and stops the conveying of the chip part 2010 to the mounting substrate 9. Therefore, with the chip part 2010 according to the reference example, such occurrence of misrecognition is a hindrance to a smooth mounting process.

On the other hand, with the chip part 2001, the plurality of projections 96 are formed on the respective front surfaces of the first and second connection electrodes 3 and 4 formed on the frontmost surface of the chip part 2001 as shown in FIG. 108. Therefore, even if the chip part 2001 is suctioned in an inclined attitude, the light irradiated from the light source 65 onto the first and second connection electrodes 3 and 4 (see incident light λ1 in FIG. 108) is diffusely reflected by the projections 96 of the first and second connection electrodes 3 and 4 (see reflected light λ2 in FIG. 108). A plurality of such projections 96 are formed on the first and second connection electrodes 3 and 4 and therefore even if the chip part 2001 is suctioned in an inclined attitude as shown in FIG. 109 by the suction nozzle 76, the incident light λ3 from the light source 65 can be reflected in various directions. Therefore, regardless of how the part recognizing camera 64 is disposed with respect to the part detection position P2, the first and second connection electrodes 3 and 4 (the chip part 2001) can be detected satisfactorily by the part recognizing camera 64. Misrecognition due to specifications of the chip part 2001 can thereby be alleviated to enable the automatic mounting machine 80 to perform the mounting of the chip part 2001 onto the mounting substrate 9 smoothly.

Moreover, it suffices to perform the processing of forming the projections 96 on the first and second connection electrodes 3 and 4 of the chip part 2001 and therefore application to chip parts of different specifications (for example, size and shape) is possible. There is thus no need to change the conditions (specifications) of the light source 65 disposed in the periphery of the part recognizing camera 64 according to specifications of the chip part. The chip part 2001 that has undergone the front/rear judgment process is thereafter mounted onto the mounting substrate 9 as shown in FIG. 110.

Figure 110:
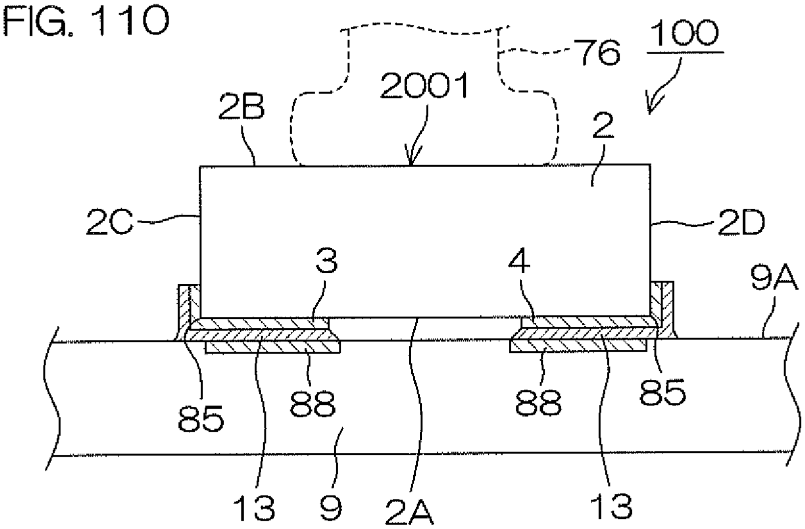
FIG. 110 is a schematic sectional view, taken along a long direction of the chip part shown in FIG. 77, of a circuit assembly in a state where the chip part is mounted on a mounting substrate.
Figure 111:
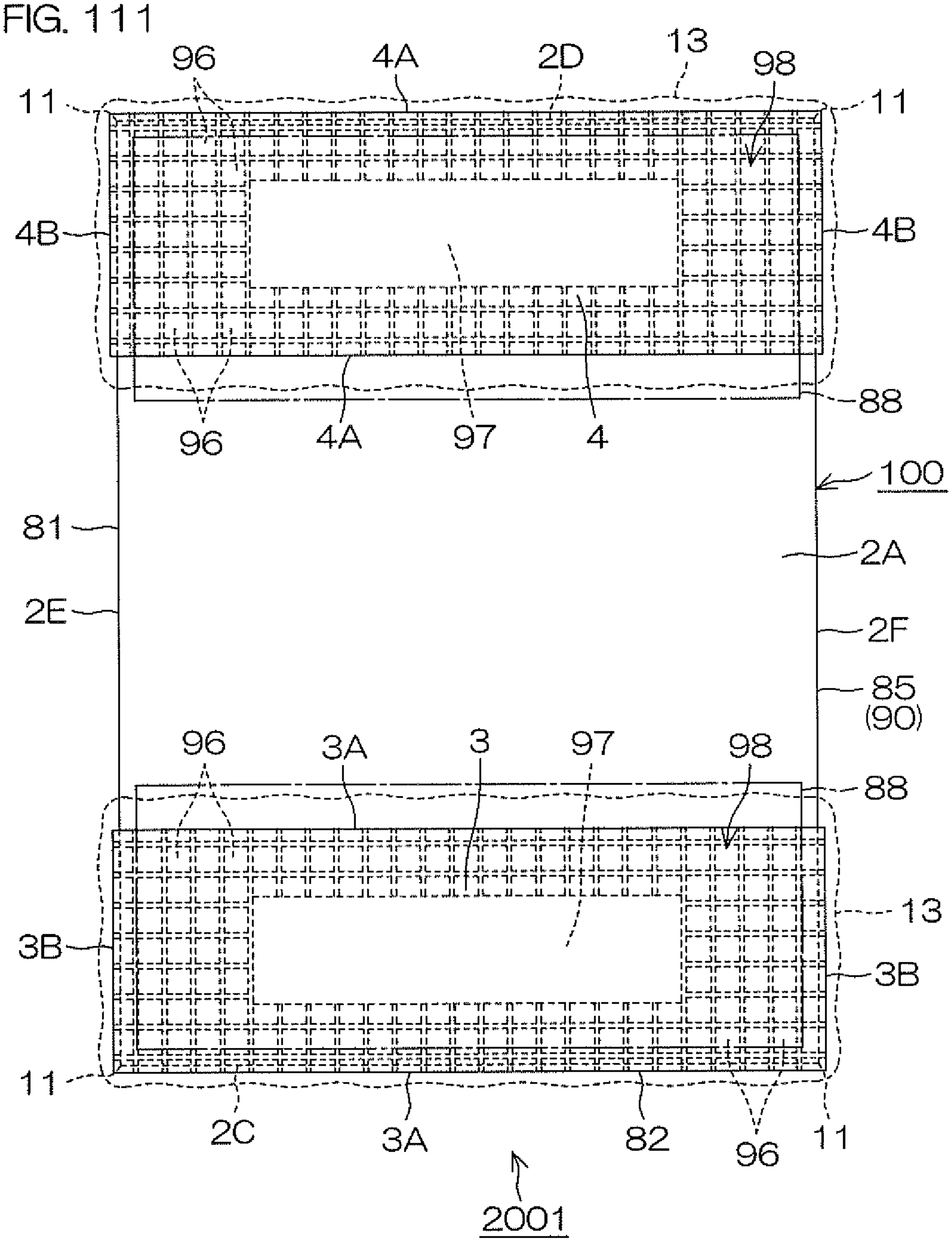
FIG. 111 is a schematic plan view of the chip part in the state of being mounted on the mounting substrate as viewed from an element forming surface side.

FIG. 110 is a schematic sectional view, taken along a long direction of the chip part 2001, of the circuit assembly 100 in a state where the chip part 2001 is mounted on the mounting substrate 9. FIG. 111 is a schematic plan view of the chip part 2001 in the state of being mounted on the mounting substrate 9 as viewed from the element forming surface 2A side.

The chip part 2001 is mounted on the mounting substrate 9 as shown in FIG. 110. The chip part 2001 and the mounting substrate 9 in this state constitute the circuit assembly 100. The upper surface of the mounting substrate 9 in FIG. 110 is the mounting surface 9A. The pair (two) of lands 88, connected to an internal circuit (not shown) of the mounting substrate 9, are formed on the mounting surface 9A. Each land 88 is formed, for example, of Cu. On the front surface of each land 88, the solder 13 is provided so as to project from the front surface.

After the front/rear judgment process, the automatic mounting machine 80 moves the suction nozzle 76, in the state of suctioning the chip part 2001, to the mounting substrate 9. At this point, the element forming surface 2A of the chip part 2001 and the mounting surface 9A of the mounting substrate 9 face each other. In this state, the suction nozzle 76 is moved and pressed against the mounting substrate 9 to make the first connection electrode 3 of the chip part 2001 contact the solder 13 on one land 88 and the second connection electrode 4 contact the solder 13 on the other land 88. When the solders 13 are then heated, the solders 13 melt. Thereafter, when the solders 13 become cooled and solidified, the first connection electrode 3 and the one land 88 become bonded via the solder 13 and the second connection electrode 4 and the other land 88 become bonded via the solder 13. That is, each of the two lands 88 is solder-bonded to the corresponding electrode among the first and second connection electrodes 3 and 4. Mounting (flip-chip connection) of the chip part 2001 onto the mounting substrate 9 is thereby completed and the circuit assembly 100 is completed. At this point, the Au layer 35 (gold plating) is formed on the frontmost surfaces of the first and second connection electrodes 3 and 4. Excellent solder wettability and high reliability can thus be achieved in the process of mounting the chip part 2001 onto the mounting substrate 9.

In the circuit assembly 100 in the completed state, the element forming surface 2A of the chip part 2001 and the mounting surface 9A of the mounting substrate 9 extend parallel while facing each other across a gap (see also FIG. 111). The dimension of the gap corresponds to the total of the thickness of the portion of the first connection electrode 3 or the second connection electrode 4 projecting from the element forming surface 2A and the thickness of the solders 13.

As shown in FIG. 110, in a sectional view, the first and second connection electrodes 3 and 4 are, for example, formed to L-like shapes with the front surface portions on the element forming surface 2A and the side surface portions on the side surfaces 2C and 2D being made integral. Therefore, when the circuit assembly 100 (to be accurate, the portion of bonding of the chip part 2001 and the mounting substrate 9) is viewed from the direction of the normal to the mounting surface 9A (and the element forming surface 2A) (the direction orthogonal to these surfaces) as shown in FIG. 111, the solder 13 bonding the first connection electrode 3 and the one land 88 is adsorbed not only to the front surface portion but also to the side surface portions of the first connection electrode 3. Similarly, the solder 13 bonding the second connection electrode 4 and the other land 88 is adsorbed not only to the front surface portion but also to the side surface portions of the second connection electrode 4.

Thus, with the chip part 2001, the first connection electrode 3 is formed to integrally cover the three side surfaces 2C, 2E, and 2F of the semiconductor substrate 2, and the second connection electrode 4 is formed to integrally cover the three side surfaces 2D, 2E, and 2F of the semiconductor substrate 2. That is, the electrodes are formed on the side surfaces 2C to 2F in addition to the element forming surface 2A of the semiconductor substrate 2 and therefore the adhesion area for soldering the chip part 2001 onto the mounting substrate 9 can be enlarged. Consequently, the amount of solder 13 adsorbed to the first connection electrode 3 and the second connection electrode 4 can be increased to improve the adhesion strength.

Also as shown in FIG. 111, the solder 13 is adsorbed so as to extend from the element forming surface 2A to the side surfaces 2C to 2F of the semiconductor substrate 2. Therefore in the mounted state, the first connection electrode 3 is held by the solder 13 at the three side surfaces 2C, 2E, and 2F and the second connection electrode 4 is held by the solder 13 at the three side surfaces 2D, 2E, and 2F so that all of the side surfaces 2C to 2F of the rectangular chip part 2001 can be fixed by the solder 13. The mounting form of the chip part 2001 can thus be stabilized.

Seventh Reference Example

Figure 112:
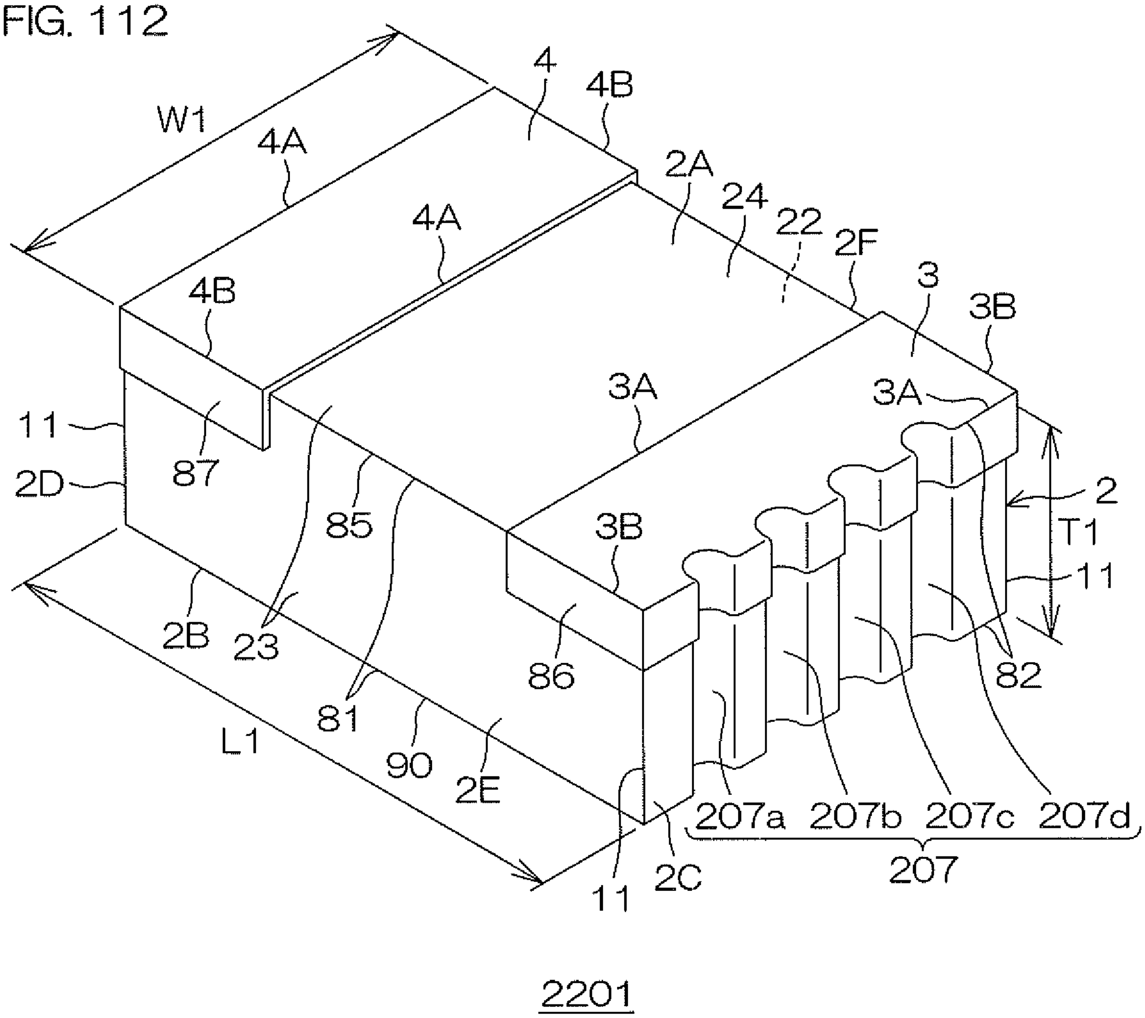
FIG. 112 is a schematic perspective view of a chip part according to a seventh reference example.

FIG. 112 is a schematic perspective view of a chip part 2201 according to a seventh reference example.

Points of difference of the chip part 2201 according to the seventh reference example with respect to the chip part 2001 according to the sixth reference example described above are that a plurality of recessed marks 207 are formed at the first connection electrode 3 side (more specifically, the side surface 2C side of the semiconductor substrate 2) and that the projections 96 and the flat portion 97 are not formed on the respective front surfaces of the first and second connection electrodes 3 and 4. Arrangements of other portions are the same as the arrangements of the chip part 2001 described above and therefore the same reference symbols shall be provided and description shall be omitted.

A plurality of the recessed marks 207 are formed at the peripheral edge portions 85 and 90 of the semiconductor substrate 2 or, more specifically, at the side surface 2C of the semiconductor substrate 2 so as to extend in an up/down direction (thickness direction of the semiconductor substrate 2). In the present reference example, four recessed marks 207 (207*a*, 207*b*, 207*c*, and 207*d*) are formed. In the present reference example, each long groove that constitutes a recessed mark 207 and extends in the up/down direction (thickness direction of the semiconductor substrate 2) has an arcuate shape in a plan view (concave surface shape in a plan view). The recessed marks 207 may be of any recessed shape, such as a trapezoidal shape in a plan view, a triangular shape in a plan view, etc. The recessed marks 207 indicate information, such as the polarity direction (directions of the positive electrode and the negative electrode), type name, date of manufacture, etc., of the chip part by way of the positions and number of the recessed marks 207.

The first connection electrode 3 is formed to integrally cover the three side surfaces 2C, 2E, and 2F and the peripheral edge portion 86 is formed thereby. The peripheral edge portion 86 of the first connection electrode 3 (more specifically, a surface of the peripheral edge portion 86 and a surface of contact of the semiconductor substrate 2 and the peripheral edge portion 86) is further formed along the surfaces of the recessed marks 207 formed in the side surface 2C, and thereby at the long side 3A of the first connection electrode 3 (the long side 3A at the side surface 2C side), a plurality of portions that are recessed in a plan view are formed along a line defined by the plurality of recessed marks 207.

The semiconductor substrate 2 thus has different shapes at the one end portion at which the first connection electrode 3 is formed and at the other end portion at which the second connection electrode 4 is formed. That is, the first connection electrode 3 is formed at the one end portion side of the semiconductor substrate 2 at which the plurality of recessed marks 207 are formed and the second connection electrode 4 is formed at the other end portion side of the semiconductor substrate 2 at which the mutually adjacent side surfaces among the side surfaces 2D, 2E, and 2F are kept mutually perpendicular. Therefore, in the plan view of viewing the element forming surface 2A from the normal direction, the respective end portions of the semiconductor substrate 2 at which the first and second connection electrodes 3 and 4 are formed have shapes that are not line symmetrical with respect to a straight line orthogonal to the side surfaces 2E and 2F of the semiconductor substrate 2 (and passing through a center of gravity of the semiconductor substrate 2). The respective end portions of the semiconductor substrate 2 at which the first and second connection electrodes 3 and 4 are formed also have shapes that are not point symmetrical with respect to the center of gravity of the semiconductor substrate 2.

FIG. 113 shows plan views of the chip part 2201 as viewed from the rear surface 2B side and shows diagrams for explaining the arrangements of recessed marks 207.

Figure 113A:
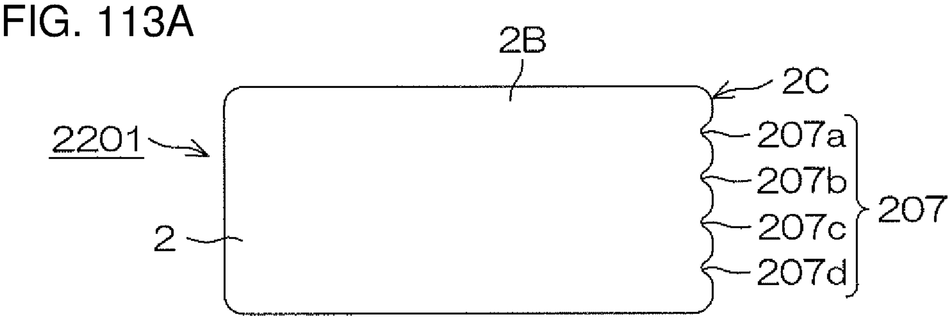
FIGS. 113A, 113B and 113C show plan views of the chip part shown in FIG. 112 as viewed from a rear surface side and shows diagrams for explaining the arrangements of recessed marks.

As shown in FIG. 113A, the recessed marks 207 may be of an arrangement having four recessed marks 207*a*, 207*b*, 207*c*, and 207*d* formed at equal intervals at the side surface 2C of the semiconductor substrate 2.

Figure 113B:
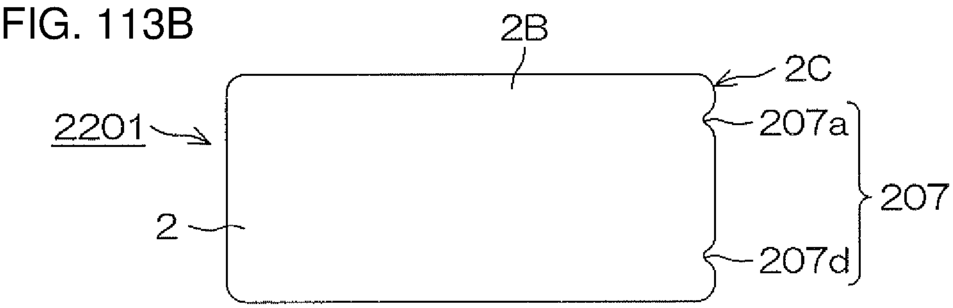

Also, as shown in FIG. 113B, the recessed marks 207 may be the two recessed marks 207*a* and 207*d* positioned at the respective outer sides.

Figure 113C:
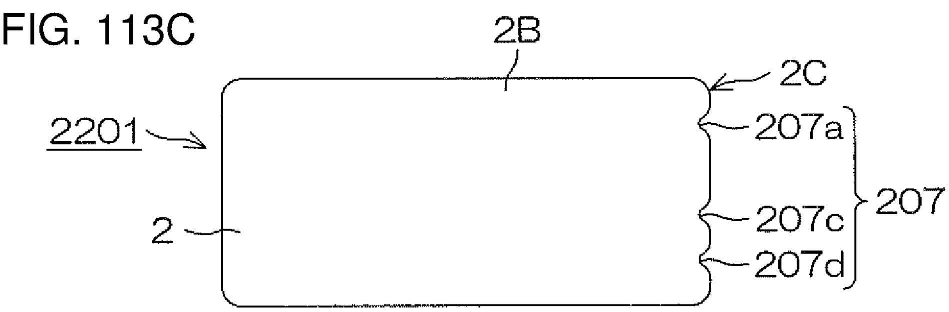

Or, as shown in FIG. 113C, the recessed marks 207 may be the three recessed marks 207*a*, 207*b*, and 207*d*.

Arrangements are thus made so that, for example, four recessed marks 207 can be formed at equal intervals along the side surface 2C, and by arranging to form certain recessed marks 207 or not to form certain recessed marks 207, binary information can be indicated by the presence/non-presence of a single recessed mark 207.

With the present reference example, a maximum of four of the recessed marks 207, each of which indicates binary information, can be formed and therefore in regard to information amount, the chip part 2201 can be made to have an information amount of $2 \times 2 \times 2 \times 2 = 2^4$.

The compact chip part 2201 is thus provided with an outer appearance feature (the recessed marks 207) that expresses information along the side surface 2C, and information required of the chip part 2201 can be expressed by a method that takes the place of marking. An automatic mounting machine, etc., can easily recognize the type, polarity direction (directions of the positive electrode and the negative electrode), date of manufacture, and other information of the chip part 2201. The chip part 2201 can thus be made suitable for automatic mounting.

FIG. 114 shows plan views of the chip part 2201 as viewed from the rear surface side and shows diagrams showing modification examples of the recessed mark 207. FIG. 115 shows diagrams of examples with which the types of information that can be indicated by recessed marks 207 are made abundant by varying the types and positions of recessed marks 207.

Figure 114A:
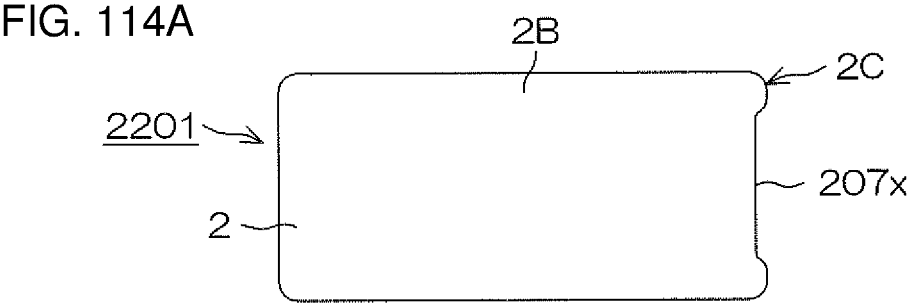
FIGS. 114A, 114B and 114C show plan views of the chip part shown in FIG. 112 as viewed from the rear surface side and shows diagrams showing modification examples of a recessed mark.
Figure 114B:
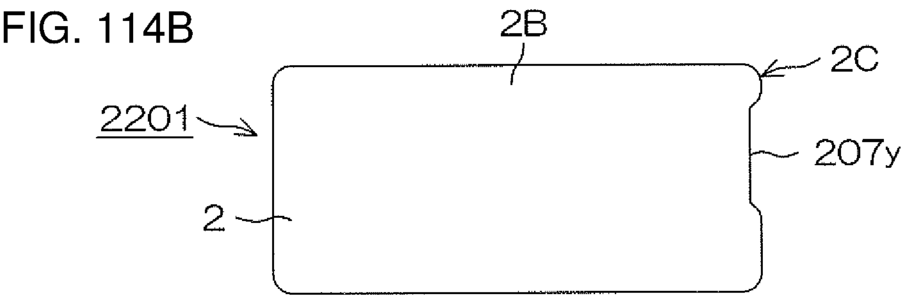
Figure 114C:
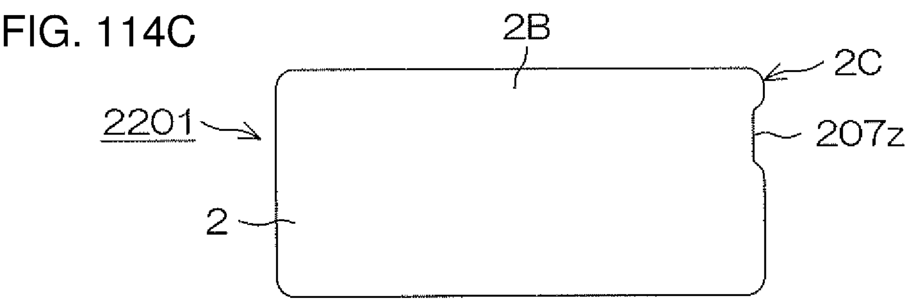

The chip part 2201 shown in FIG. 114A is an arrangement example where a long recessed mark 207*x* extending in the length direction of the side surface 2C of the semiconductor substrate 2 is formed at the side surface 2C. As shown in FIG. 114B or FIG. 114C, the long recessed mark 207*x* may be changed to a recessed mark 207*y* or 207*z* that is differed in length. That is, the reference example shown in FIG. 114 is an embodiment in which the recessed mark 207 formed at the side surface 2C of the semiconductor substrate 2 is arranged to differ in width and information is indicated by the three types of recessed marks 207*x*, 207*y*, and 207*z* that are a wide width mark, a medium width mark, and a narrow width mark.

Figure 115A:
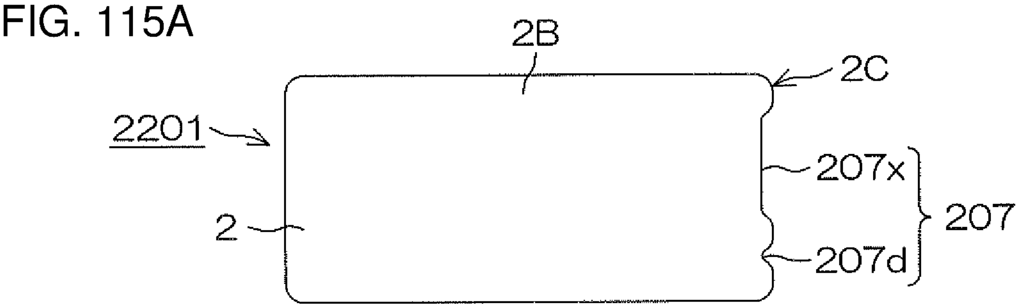
FIGS. 115A and 115B show diagrams of examples with which the types of information that can be indicated by recessed marks are made abundant by varying the types and positions of recessed marks.
Figure 115B:
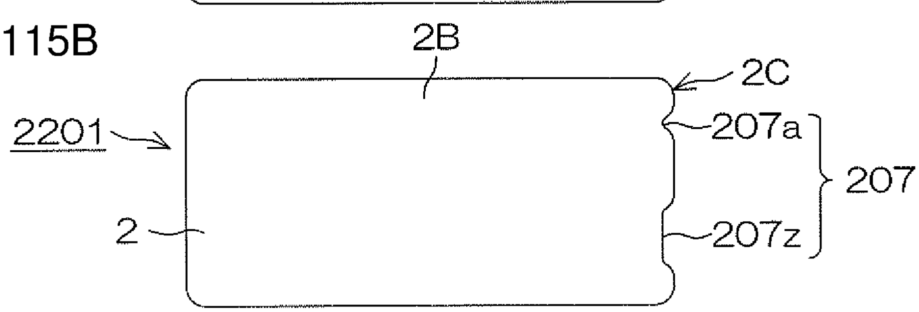

Further, in regard to the recessed marks 207 formed at the side surface 2C of the semiconductor substrate 2, the plurality of recessed marks 207*a*, 207*b*, 207*c*, and 207*d* of fixed width described with reference to FIG. 113 and the recessed marks 207*x*, 207*y*, and 207*z* of variable width described with reference to FIG. 114 may be combined to vary the types and positions of the recessed marks 207 as in a combination of the recessed mark 207*y* of wide width and the recessed mark 207*d* of fixed width shown in FIG. 115A or a combination of the recessed mark 207*z* of narrow width and the recessed mark 207*a* of fixed width shown in FIG. 115B to make abundant the types of information that can be indicated by the recessed marks 207.

Figure 116:
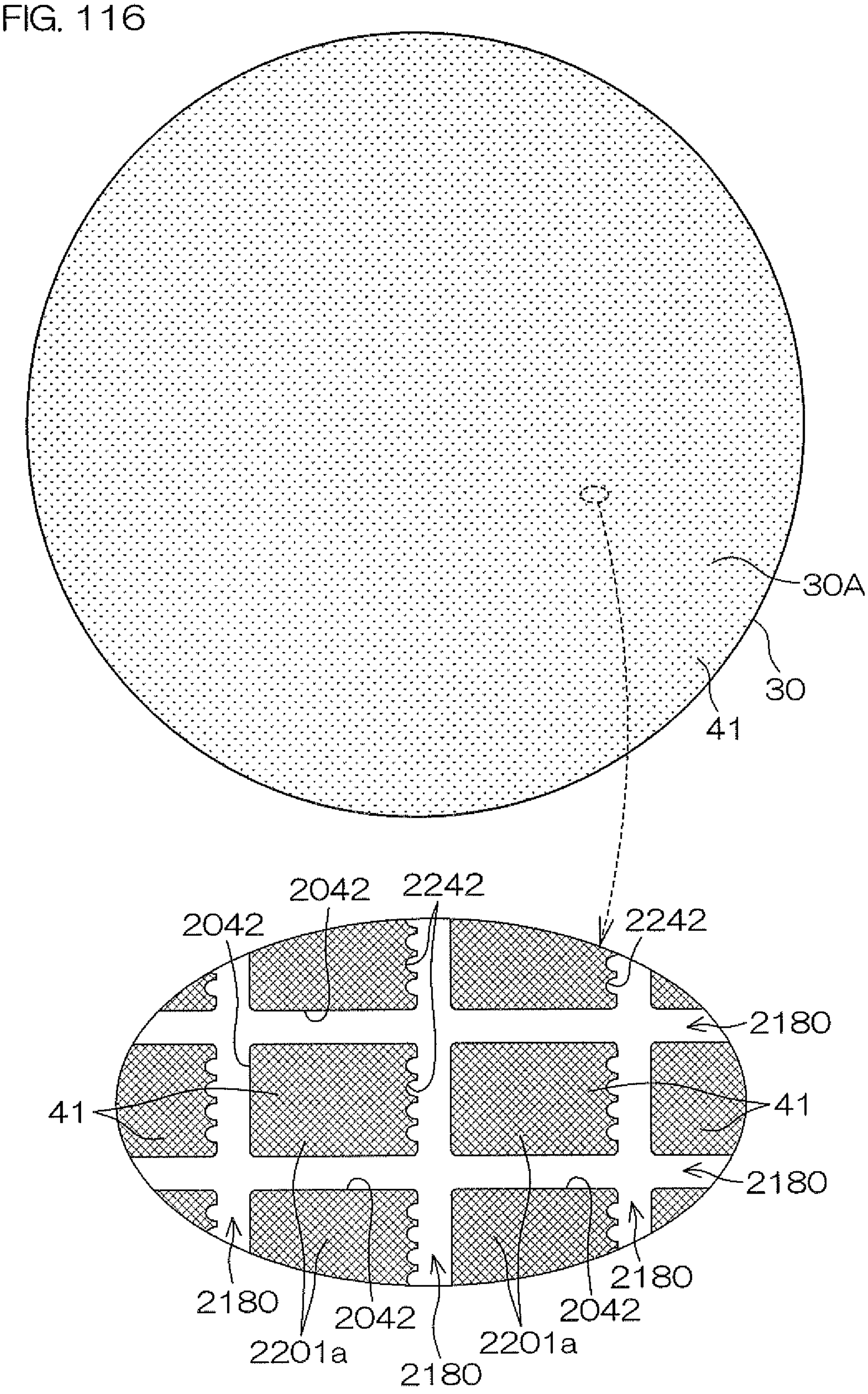
FIG. 116 is a schematic plan view of a portion of a resist pattern used to form grooves for the recessed marks in the chip part shown in FIG. 112.

The chip part 2201 thus having the plurality of recessed marks 207 may be formed by changing the layout of the resist pattern 41 (see FIG. 104) in the process of FIG. 103F according to the sixth reference example to the layout shown in FIG. 116.

FIG. 116 is a schematic plan view of a portion of the resist pattern 41 used to form grooves for the recessed marks 207 in the chip part 2201 shown in FIG. 112.

In the opening 2042 for forming the groove 2044 (see FIG. 103G) in the resist pattern 41, a plurality of projections 2242 are formed to form the grooves for the recessed marks 207. The plurality of projections 2242 are formed to selectively expose one end portion of each chip region 2201*a* (a portion corresponding to the side surface 2C of each chip part 2201). The chip regions 2201*a* correspond to the chip regions 2001*a* in the sixth reference example described above and are regions that become the chip parts 2201 by being separated into individual chips in a subsequent process.

By etching via the resist pattern 41, the groove 2044 is formed in the semiconductor substrate 30, which is the base substrate, as shown in FIG. 103G. When the groove 2044 is formed, the recessed marks 207 are formed at the same time along the one end portion of each chip region 2201*a* (the portion corresponding to the side surface 2C of each chip part 2001).

That is, the layout of the resist pattern 41 for etching the boundary region 2180 of the semiconductor substrate 30 is designed so that the recessed marks 207 are formed at the same time by the etching. Thereafter, the chip parts 2201 are completed via the same processes as the processes described with FIG. 103G and FIG. 103H.

Thus, with the manufacturing method of the present reference example, the recessed marks 207 are formed at the peripheral edge portions at the same time as the cutting of the semiconductor substrate 30, having the plurality of chip regions 2201*a*, along the boundary region 2180 (groove 2044). There is thus no need to provide a dedicated step for recording the information related to the chip part 2201 and the productivity of the chip part 2201 can thus be improved. Also, the information of the chip part 2201 is indicated by the recessed marks 207 formed at the side surface 2C and therefore a large space for forming a marking is not required at the front surface or the rear surface of the chip part 2201. Application to a micro type chip part is thus also possible.

Although arrangements of forming the recessed marks 207 (207*a*, 207*b*, 207*c*, 207*d*, 207*x*, 207*y*, 207*z*) at the side surface 2C of the semiconductor substrate 2 of the chip part 2201 was described, the position of formation of the recessed marks 207 is not restricted to the side surface 2C and the marks may be formed at any of the other side surfaces 2D, 2E, or 2F of the semiconductor substrate 2.

Also, although with the chip part 2201, a reference example, with which the plurality of recessed marks 207 extending in the up/down direction are formed at the side surface 2C of the semiconductor substrate 2, was described, the recessed marks 207 may be replaced by projecting marks 270. A reference example provided with projecting marks 270 shall now be described specifically with reference to the drawings.

Eighth Reference Example

Figure 117:
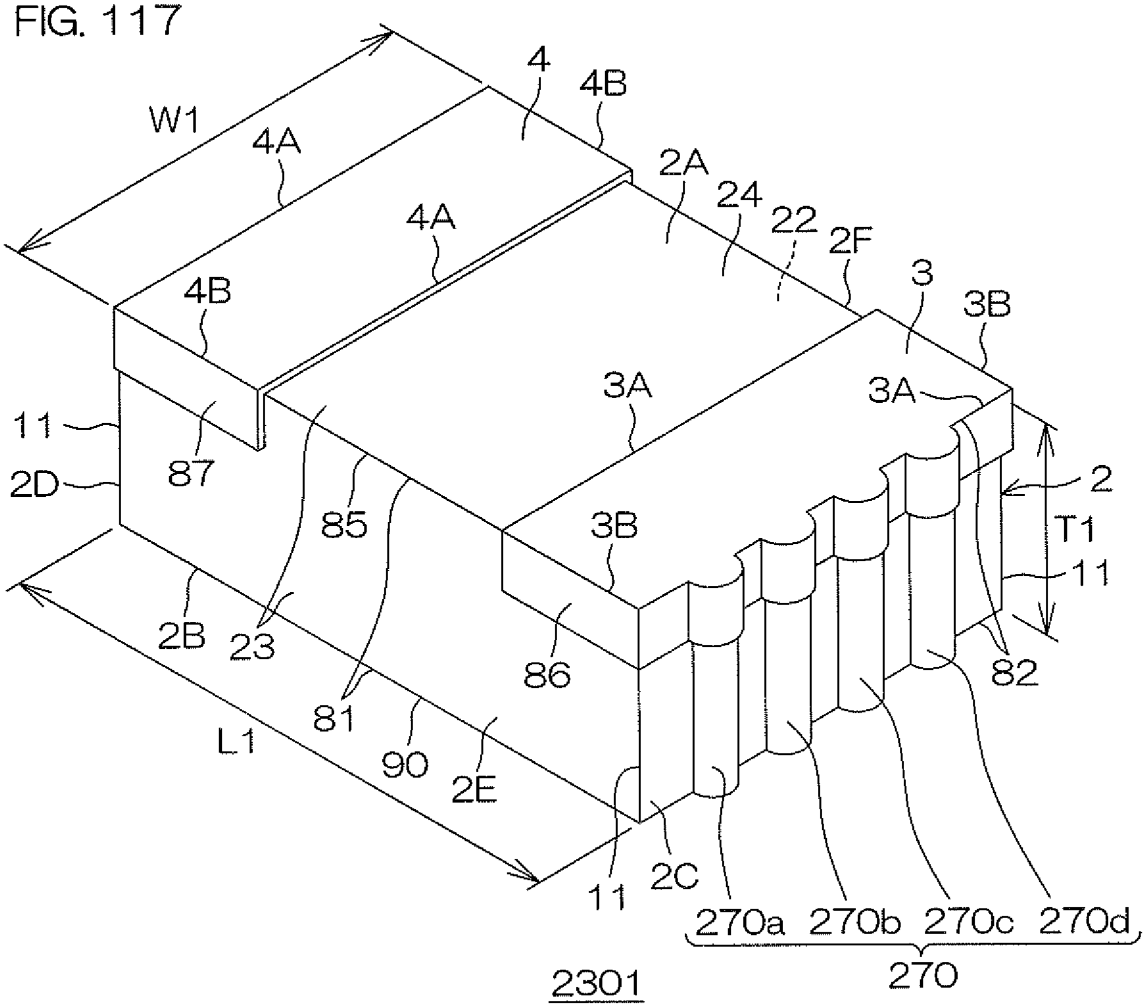

FIG. 117 is a schematic perspective view of a chip part 2301 according to an eighth reference example.

A point of difference of the chip part 2301 according to the eighth reference example with respect to the chip part 2201 according to the seventh reference example described above is that projecting marks 270 are formed in place of the recessed marks 207. Arrangements of other portions are the same as the arrangements of the chip part 2201 and therefore the same reference symbols shall be provided and description shall be omitted.

A plurality, four in the present reference example, of projecting marks 270 (270*a*, 270*b*, 270*c*, and 270*d*), extending in the up/down direction, are formed on the side surface 2C of the semiconductor substrate 2 of the chip part 2301. In the present reference example, each ridge or projecting shape that constitutes a projecting mark 270 and extends in the up/down direction (thickness direction of the semiconductor substrate 2) has an arcuate shape in a plan view (convex surface shape in a plan view). The projecting marks 270 may be of any projecting shape, such as a trapezoidal shape in a plan view, a triangular shape in a plan view, etc. Also, the projecting marks 270 may be a rectangular shape with a rounded corner or a triangular shape with a rounded apex angle. That is, the projecting marks 270 may be ridges or projecting shape of any form. The projecting marks 270 indicate information, such as the polarity direction (directions of the positive electrode and the negative electrode), type name, date of manufacture, etc., of the chip part by way of the positions and number of the projecting marks 270.

The first connection electrode 3 is formed to integrally cover the three side surfaces 2C, 2E, and 2F and the peripheral edge portion 86 is formed thereby. The peripheral edge portion 86 of the first connection electrode 3 (more specifically, the surface of the peripheral edge portion 86 and the surface of contact of the semiconductor substrate 2 and the peripheral edge portion 86) is further formed along the surfaces of the projecting marks 270 formed on the side surface 2C, and thereby at the long side 3A of the first connection electrode 3 (the long side 3A at the side surface 2C side), a plurality of portions of projecting form in a plan view are formed along a line defined by the plurality of projecting marks 270.

The semiconductor substrate 2 thus has different shapes at the one end portion at which the first connection electrode 3 is formed and at the other end portion at which the second connection electrode 4 is formed. That is, the first connection electrode 3 is formed at the one end portion side of the semiconductor substrate 2 at which the plurality of projecting marks 270 are formed and the second connection electrode 4 is formed at the other end portion side of the semiconductor substrate 2 at which the mutually adjacent side surfaces among the side surfaces 2D, 2E, and 2F are kept mutually perpendicular. Therefore, in the plan view of viewing the element forming surface 2A from the normal direction, the respective end portions of the semiconductor substrate 2 at which the first and second connection electrodes 3 and 4 are formed have shapes that are not line symmetrical with respect to a straight line orthogonal to the side surfaces 2E and 2F of the semiconductor substrate 2 (and passing through a center of gravity of the semiconductor substrate 2). The respective end portions of the semiconductor substrate 2 at which the first and second connection electrodes 3 and 4 are formed also have shapes that are not point symmetrical with respect to the center of gravity of the semiconductor substrate 2.

FIG. 118 shows plan views of the chip part 2301 as viewed from the rear surface 2B side and shows diagrams for explaining the arrangements of the projecting marks 270.

Figure 118A:
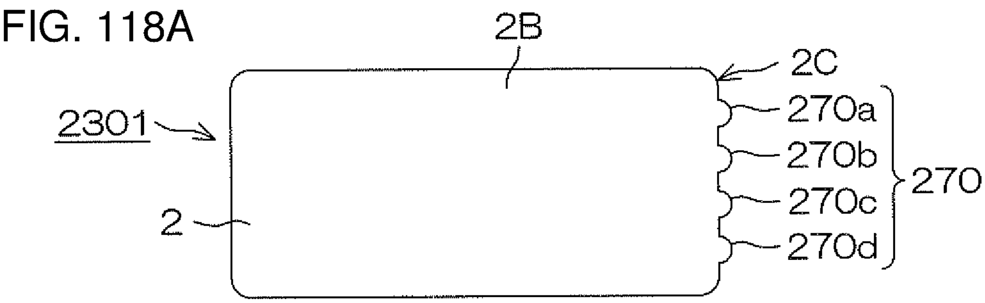

As shown in FIG. 118A, the projecting marks 270 may be of an arrangement having four projecting marks 270*a*, 270*b*, 270*c*, and 270*d* formed at equal intervals at the side surface 2C of the semiconductor substrate 2.

Figure 118B:
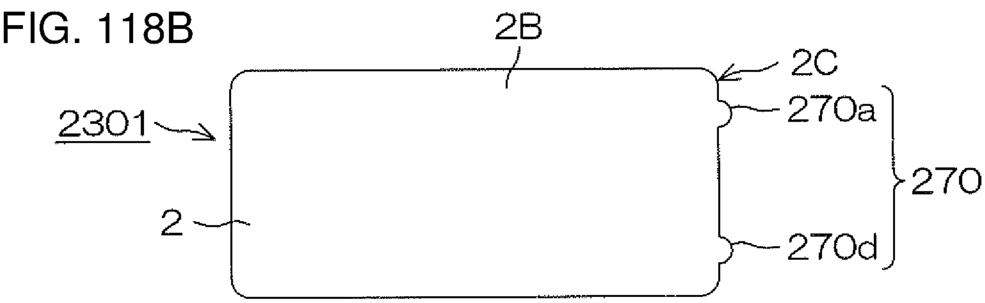

Also, as shown in FIG. 118B, the projecting marks 270 may be the two projecting marks 270*a* and 270*d* positioned at the respective outer sides.

Figure 118C:
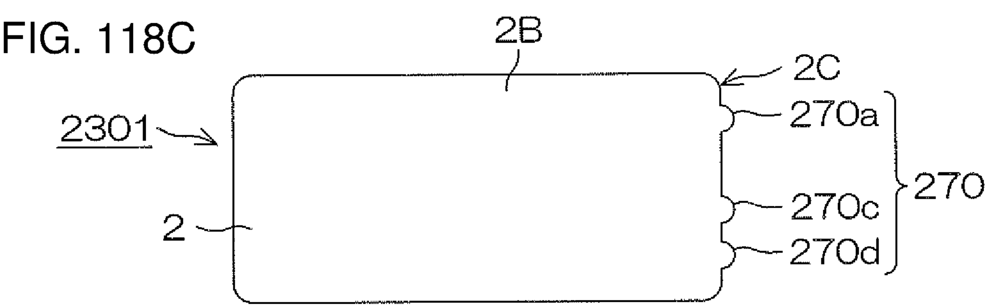

Or, as shown in FIG. 118C, the projecting marks 270 may be the three projecting marks 270*a*, 270*b*, and 270*d*.

Arrangements are thus made so that, for example, four projecting marks 270 can be formed at equal intervals along the side surface 2C, and by arranging to form certain projecting marks 270 or not to form certain projecting marks 270, binary information can be indicated by the presence/non-presence of a single projecting mark 270.

With the present reference example, a maximum of four of the projecting marks 270, each of which indicates binary information, can be formed and therefore in regard to information amount, the chip part 2301 can be made to have an information amount of $2\times2\times2\times2=2^4$.

The compact chip part 2301 is thus provided with an outer appearance feature (the projecting marks 270) that expresses information along the side surface 2C, and information required of the chip part 2301 can be expressed by a method that takes the place of marking. An automatic mounting machine, etc., can easily recognize the type, polarity direction (directions of the positive electrode and the negative electrode), date of manufacture, and other information of the chip part 2301. The chip part 2301 can thus be made suitable for automatic mounting.

FIG. 119 shows plan views of the chip part 2301 as viewed from the rear surface side and shows diagrams showing modification examples of the projecting mark 270.

Figure 119A:
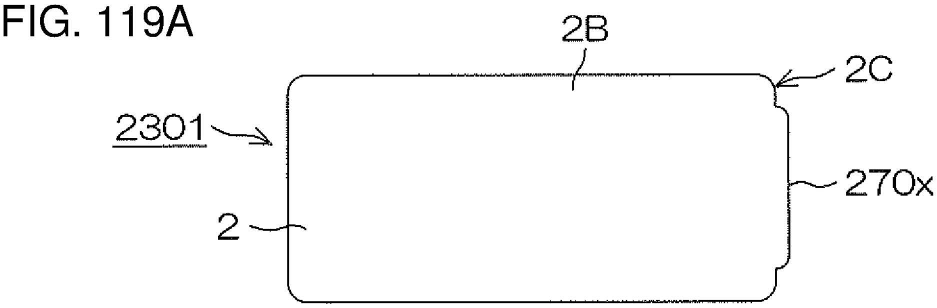
Figure 119B:
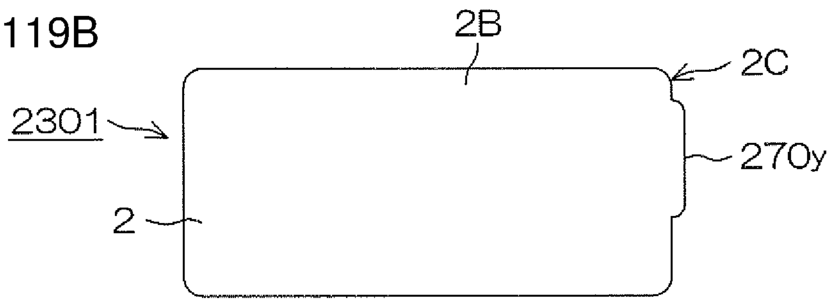
Figure 119C:
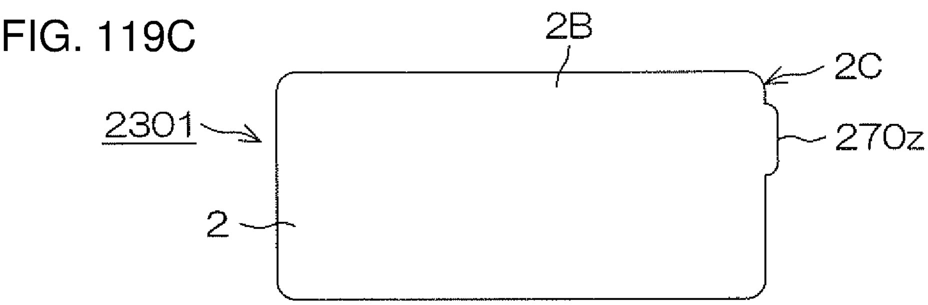

The chip part 2301 of FIG. 119A is an arrangement example where a long projecting mark 270*x* extending in the length direction of the side surface 2C of the semiconductor substrate 2 is formed at the side surface 2C. As shown in FIG. 119B or FIG. 119C, the long projecting mark 270*x* may be changed to a projecting mark 270*y* or 270*z* that is differed in length. That is, the reference example shown in FIG. 119 is an embodiment in which the projecting mark 270 formed at the side surface 2C of the semiconductor substrate 2 is arranged to differ in width and information is indicated by the three types of projecting marks 270*x*, 270*y*, and 270*z* that are a wide width mark, a medium width mark, and a narrow width mark.

Figure 120A:
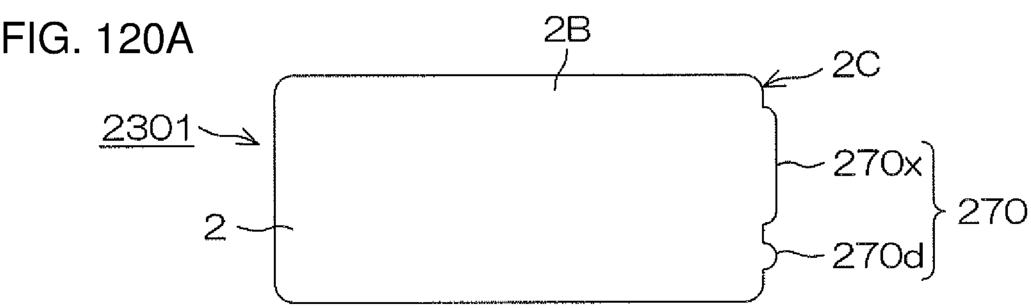
Figure 120B:
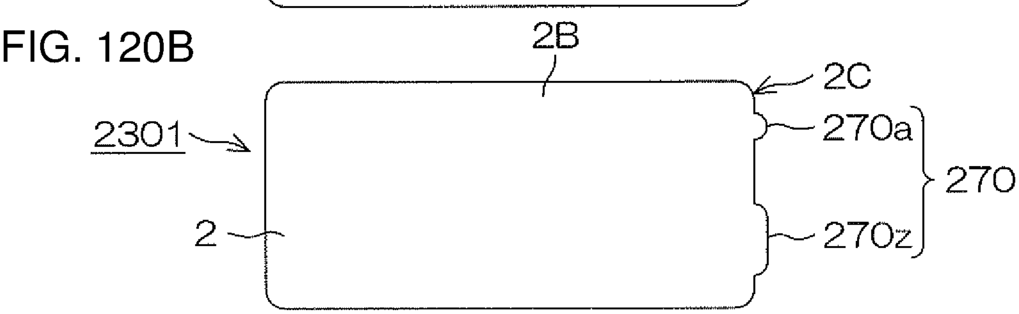

Further, in regard to the projecting marks 270 formed at the side surface 2C of the semiconductor substrate 2, the plurality of projecting marks 270*a*, 270*b*, 270*c*, and 270*d* of fixed width described with reference to FIG. 118 and the projecting marks 270*x*, 270*y*, and 270*z* of variable width described with reference to FIG. 119 may be combined to vary the types and positions of the projecting marks 270 as in a combination of the projecting mark 270*y* of wide width and the projecting mark 270*d* of fixed width shown in FIG. 120A or a combination of the projecting mark 270*z* of narrow width and the projecting mark 270*a* of fixed width shown in FIG. 120B to make abundant the types of information that can be indicated by the projecting marks 270.

Figure 121:
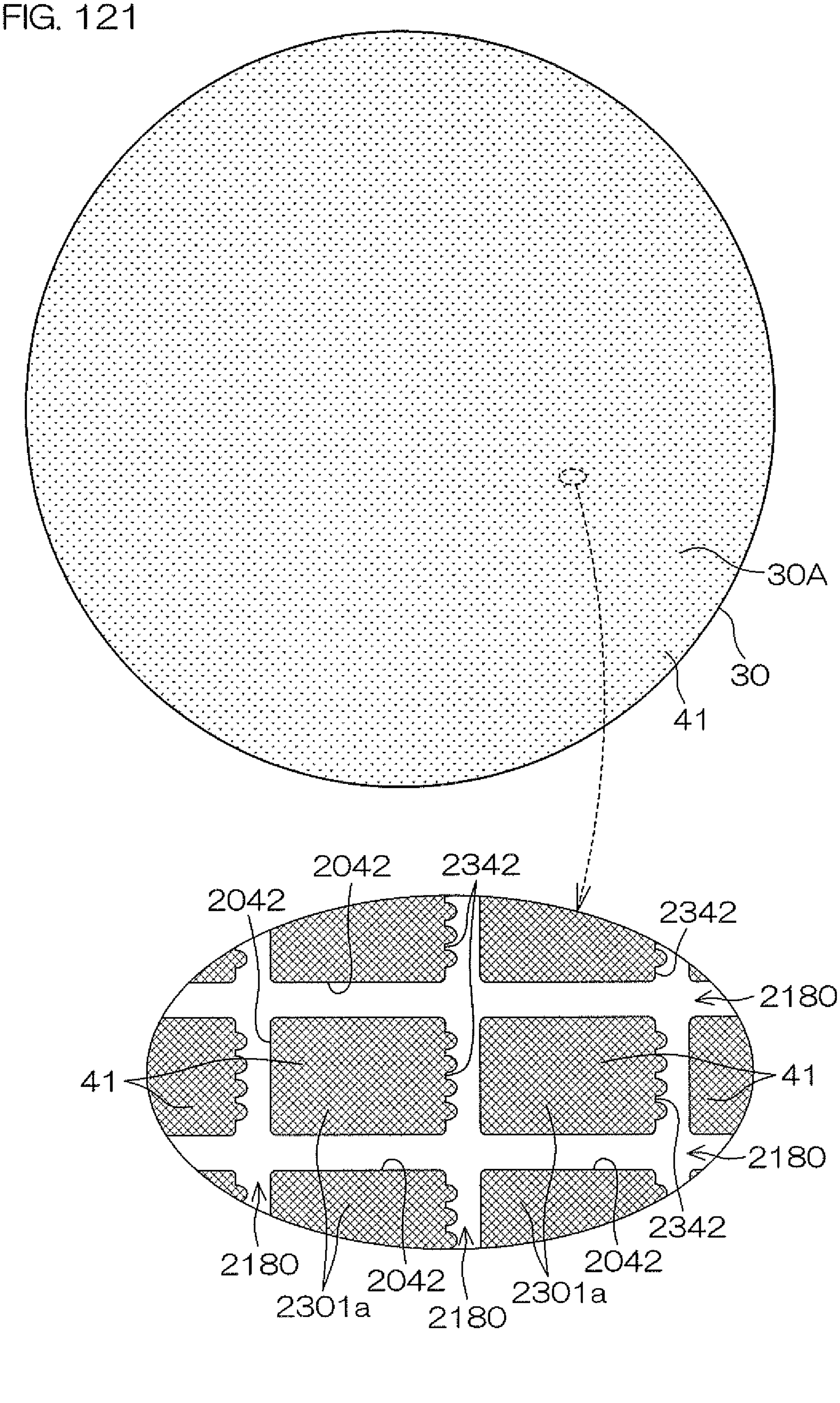

The chip part 2301 thus having the plurality of projecting marks 270 may be formed by changing the layout of the resist pattern 41 (see FIG. 104) in the process of FIG. 103F according to the sixth reference example to the layout shown in FIG. 121.

FIG. 121 is a schematic plan view of a portion of the resist pattern 41 used to form grooves for the projecting marks 270 in the chip part 2301 shown in FIG. 117.

In the opening 2042 for forming the groove 2044 (see FIG. 103G) in the resist pattern 41, a plurality of recesses 2342 are formed to form the grooves for the projecting marks 270. The plurality of recesses 2342 are formed to selectively expose one end portion of each chip region 2301*a* (a portion corresponding to the side surface 2C of each chip part 2301). The chip regions 2301*a* correspond to the chip regions 2001*a* in the sixth reference example described above and are regions that become the chip parts 2301 by being separated into individual chips in a subsequent process.

By etching via the resist pattern 41, the groove 2044 is formed in the semiconductor substrate 30, which is the base substrate, as shown in FIG. 103G. When the groove 2044 is formed, the projecting marks 270 are formed at the same time along the side surface of each chip region 2301*a* (the side surface corresponding to the side surface 2C of each chip part 2001).

That is, the layout of the resist pattern 41 for etching the boundary region 2180 of the semiconductor substrate 30 is designed so that the projecting marks 270 are formed at the same time by the etching. Thereafter, the chip parts 2301 are completed via the same processes as the processes described with FIG. 103G and FIG. 103H.

Thus, with the manufacturing method of the present reference example, the projecting marks 270 are formed at the peripheral edge portions at the same time as the cutting of the semiconductor substrate 30, having the plurality of chip regions 2301*a*, along the boundary region 2180 (groove 2044). There is thus no need to provide a dedicated step for recording the information related to the chip part 2301 and the productivity of the chip part 2301 can thus be improved. Also, the information of the chip part 2301 is indicated by the projecting marks 270 formed at the side surface 2C and therefore a large space for forming a marking is not required at the front surface or the rear surface of the chip part 2301. Application to a micro type chip part is thus also possible.

Although arrangements of forming the projecting marks 270 (270*a*, 270*b*, 270*c*, 270*d*, 270*x*, 270*y*, 270*z*) at the side surface 2C of the semiconductor substrate 2 of the chip part 2301 was described, the position of formation of the projecting marks 270 is not restricted to the side surface 2C and the marks may be formed at any of the other side surfaces 2D, 2E, or 2F of the semiconductor substrate 2.

Also with the present reference example, the recessed marks 207 according to the seventh reference example described above may be formed in combination. That is, the shape may be such that, when viewed as a whole, information is expressed by recesses and projections.

<Smartphone>

Figure 122:
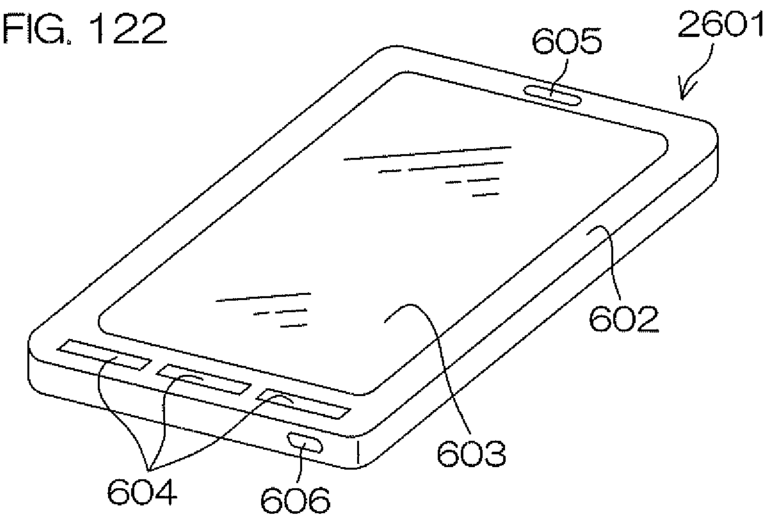

FIG. 122 is a perspective view of an outer appearance of a smartphone 2601 that is an example of an electronic device in which the chip parts 2001, 2201, and 2301 according to the sixth to eighth reference examples described above are used. The smartphone 2601 is arranged by housing electronic parts in the interior of the casing 602 with a flat rectangular parallelepiped shape. The casing 602 has a pair of major surfaces with an oblong shape at its front side and rear side, and the pair of major surfaces are joined by four side surfaces. A display surface of the display panel 603, constituted of a liquid crystal panel or an organic EL panel, etc., is exposed at one of the major surfaces of the casing 602. The display surface of the display panel 603 constitutes a touch panel and provides an input interface for a user.

The display panel 603 is formed to an oblong shape that occupies most of one of the major surfaces of the casing 602. The operation buttons 604 are disposed along one short side of the display panel 603. In the present reference example, a plurality (three) of the operation buttons 604 are aligned along the short side of the display panel 603. The user can call and execute necessary functions by performing operations of the smartphone 2601 by operating the operation buttons 604 and the touch panel.

The speaker 605 is disposed in a vicinity of the other short side of the display panel 603. The speaker 605 provides an earpiece for a telephone function and is also used as an acoustic conversion unit for reproducing music data, etc. On the other hand, close to the operation buttons 604, the microphone 606 is disposed at one of the side surfaces of the casing 602. The microphone 606 provides a mouthpiece for the telephone function and may also be used as a microphone for sound recording.

Figure 123:
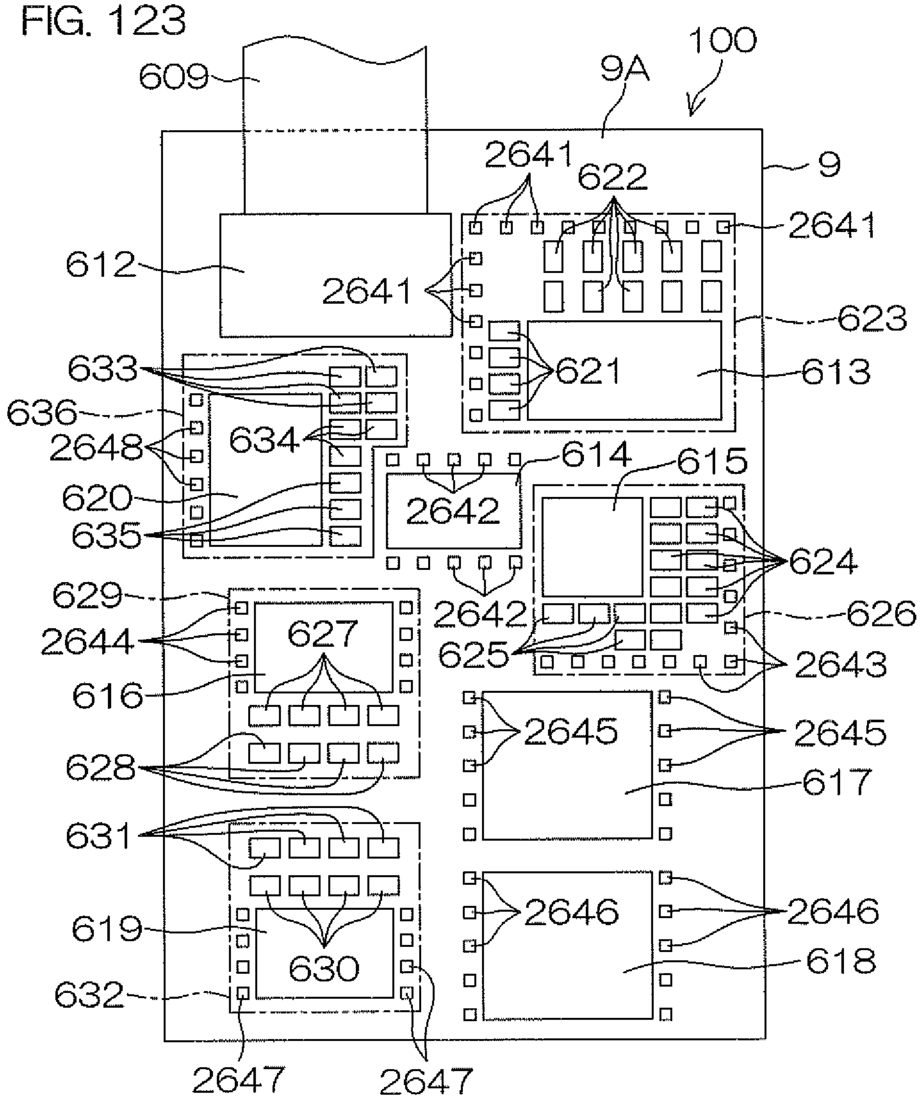

FIG. 123 is an illustrative plan view of the arrangement of the circuit assembly 100 housed in the interior of the casing 602. The circuit assembly 100 includes the mounting substrate 9 and circuit parts mounted on the mounting surface 9A of the mounting substrate 9. The plurality of circuit parts include the plurality of integrated circuit elements (ICs) 612 to 620 and a plurality of chip parts. The plurality of ICs include the transmission processing IC 612, the one-segment TV receiving IC 613, the GPS receiving IC 614, the FM tuner IC 615, the power supply IC 616, the flash memory 617, the microcomputer 618, the power supply IC 619, and the baseband IC 620.

The plurality of chip parts include the chip inductors 621, 625, and 635, the chip resistors 622, 624, and 633, the chip capacitors 627, 630, and 634, the chip diodes 628 and 631, and bidirectional Zener diode chips 2641 to 2648. The bidirectional Zener diode chips 2641 to 2648 correspond to the chip parts 2001, 2201, and 2301 according to the sixth to eighth reference examples described above and are mounted on the mounting surface 9A of the mounting substrate 9, for example, by flip-chip bonding.

The bidirectional Zener diode chips 2641 to 2648 are provided for absorbing positive and negative surges, etc., in signal input lines to the one-segment TV receiving IC 613, the GPS receiving IC 614, the FM tuner IC 615, the power supply IC 616, the flash memory 617, the microcomputer 618, the power supply IC 619, and the baseband IC 620.

The transmission processing IC 612 has incorporated therein an electronic circuit arranged to generate display control signals for the display panel 603 and receive input signals from the touch panel on the front surface of the display panel 603. For connection with the display panel 603, the transmission processing IC 612 is connected to the flexible wiring 609.

The one-segment TV receiving IC 613 incorporates an electronic circuit that constitutes a receiver for receiving one-segment broadcast (terrestrial digital television broadcast targeted for reception by portable equipment) radio waves. A plurality of the chip inductors 621, a plurality of the chip resistors 622, and a plurality of the bidirectional Zener diode chips 2641 are disposed in a vicinity of the one-segment TV receiving IC 613. The one-segment TV receiving IC 613, the chip inductors 621, the chip resistors 622, and the bidirectional Zener diode chips 2641 constitute the one-segment broadcast receiving circuit 623. The chip inductors 621 and the chip resistors 622 respectively have accurately adjusted inductances and resistances and provide circuit constants of high precision to the one-segment broadcast receiving circuit 623.

The GPS receiving IC 614 incorporates an electronic circuit that receives radio waves from GPS satellites and outputs positional information of the smartphone 2601. A plurality of the bidirectional Zener diode chips 2642 are disposed in a vicinity of the GPS receiving IC 614.

The FM tuner IC 615 constitutes, together with a plurality of the chip resistors 624, a plurality of the chip inductors 625, and a plurality of the bidirectional Zener diode chips 2643 mounted on the mounting substrate 9 in a vicinity thereof, the FM broadcast receiving circuit 626. The chip resistors 624 and the chip inductors 625 respectively have accurately adjusted resistance values and inductances and provide circuit constants of high precision to the FM broadcast receiving circuit 626.

A plurality of the chip capacitors 627, a plurality of the chip diodes 628, and a plurality of the bidirectional Zener diode chips 2644 are mounted on the mounting surface 9A of the mounting substrate 9 in a vicinity of the power supply IC 616. Together with the chip capacitors 627, the chip diodes 628, and the bidirectional Zener diode chips 2644, the power supply IC 616 constitutes the power supply circuit 629.

The flash memory 617 is a storage device for recording operating system programs, data generated in the interior of the smartphone 2601, data and programs acquired from the exterior by communication functions, etc. A plurality of the bidirectional Zener diode chips 2645 are disposed in a vicinity of the flash memory 617.

The microcomputer 618 is a computing processing circuit that incorporates a CPU, a ROM, and a RAM and realizes a plurality of functions of the smartphone 2601 by executing various computational processes. More specifically, computational processes for image processing and various application programs are realized by actions of the microcomputer 618. A plurality of the bidirectional Zener diode chips 2646 are disposed in a vicinity of the microcomputer 618.

A plurality of the chip capacitors 630, a plurality of the chip diodes 631, and a plurality of the bidirectional Zener diode chips 2647 are mounted on the mounting surface 9A of the mounting substrate 9 in a vicinity of the power supply IC 619. Together with the chip capacitors 630, the chip diodes 631, and the plurality of bidirectional Zener diode chips 2647, the power supply IC 619 constitutes the power supply circuit 632.

A plurality of the chip resistors 633, a plurality of the chip capacitors 634, a plurality of the chip inductors 635, and a plurality of the bidirectional Zener diode chips 2648 are mounted on the mounting surface 9A of the mounting substrate 9 in a vicinity of the baseband IC 620. Together with the chip resistors 633, the chip capacitors 634, the chip inductors 635, and the plurality of bidirectional Zener diode chips 2648, the baseband IC 620 constitutes the baseband communication circuit 636. The baseband communication circuit 636 provides communication functions for telephone communication and data communication.

With the above arrangement, electric power that is appropriately adjusted by the power supply circuits 629 and 632 is supplied to the transmission processing IC 612, the GPS receiving IC 614, the one-segment broadcast receiving circuit 623, the FM broadcast receiving circuit 626, the baseband communication circuit 636, the flash memory 617, and the microcomputer 618. The microcomputer 618 performs computational processes in response to input signals input via the transmission processing IC 612 and makes the display control signals be output from the transmission processing IC 612 to the display panel 603 to make the display panel 603 perform various displays.

When receiving of a one-segment broadcast is commanded by operation of the touch panel or the operation buttons 604, the one-segment broadcast is received by actions of the one-segment broadcast receiving circuit 623. Computational processes for outputting the received images to the display panel 603 and making the received audio signals be acoustically converted by the speaker 605 are executed by the microcomputer 618.

Also, when positional information of the smartphone 2601 is required, the microcomputer 618 acquires the positional information output by the GPS receiving IC 614 and executes computational processes using the positional information.

Further, when an FM broadcast receiving command is input by operation of the touch panel or the operation buttons 604, the microcomputer 618 starts up the FM broadcast receiving circuit 626 and executes computational processes for outputting the received audio signals from the speaker 605.

The flash memory 617 is used for storing data acquired by communication and storing data prepared by computations by the microcomputer 618 and inputs from the touch panel. The microcomputer 618 writes data into the flash memory 617 or reads data from the flash memory 617 as necessary.

The telephone communication or data communication functions are realized by the baseband communication circuit 636. The microcomputer 618 controls the baseband communication circuit 636 to perform processes for sending and receiving audio signals or data.

Modification Examples

Although with each of the sixth to eighth reference examples described above, an example where the first diffusion region 2110 and the second diffusion region 2112 are formed mutually symmetrically (see FIG. 78 and FIG. 79) was described, an example where the first diffusion region 2110 and the second diffusion region 2112 are formed asymmetrical may also be adopted. However, with this arrangement, the first diffusion region 2110 and the second diffusion region 2112 are asymmetrical, and therefore the current vs. voltage characteristics obtained with the first connection electrode 3 being the positive electrode and the second connection electrode 4 being the negative electrode will not be equal to the current vs. voltage characteristics obtained with the first connection electrode 3 being the negative electrode and the second connection electrode 4 being the positive electrode as was described with FIG. 86B. Therefore, in a case where the number of parallels is to be increased, the arrangement of a chip part 2401 shown in FIG. 124 may be adopted.

Figure 124:
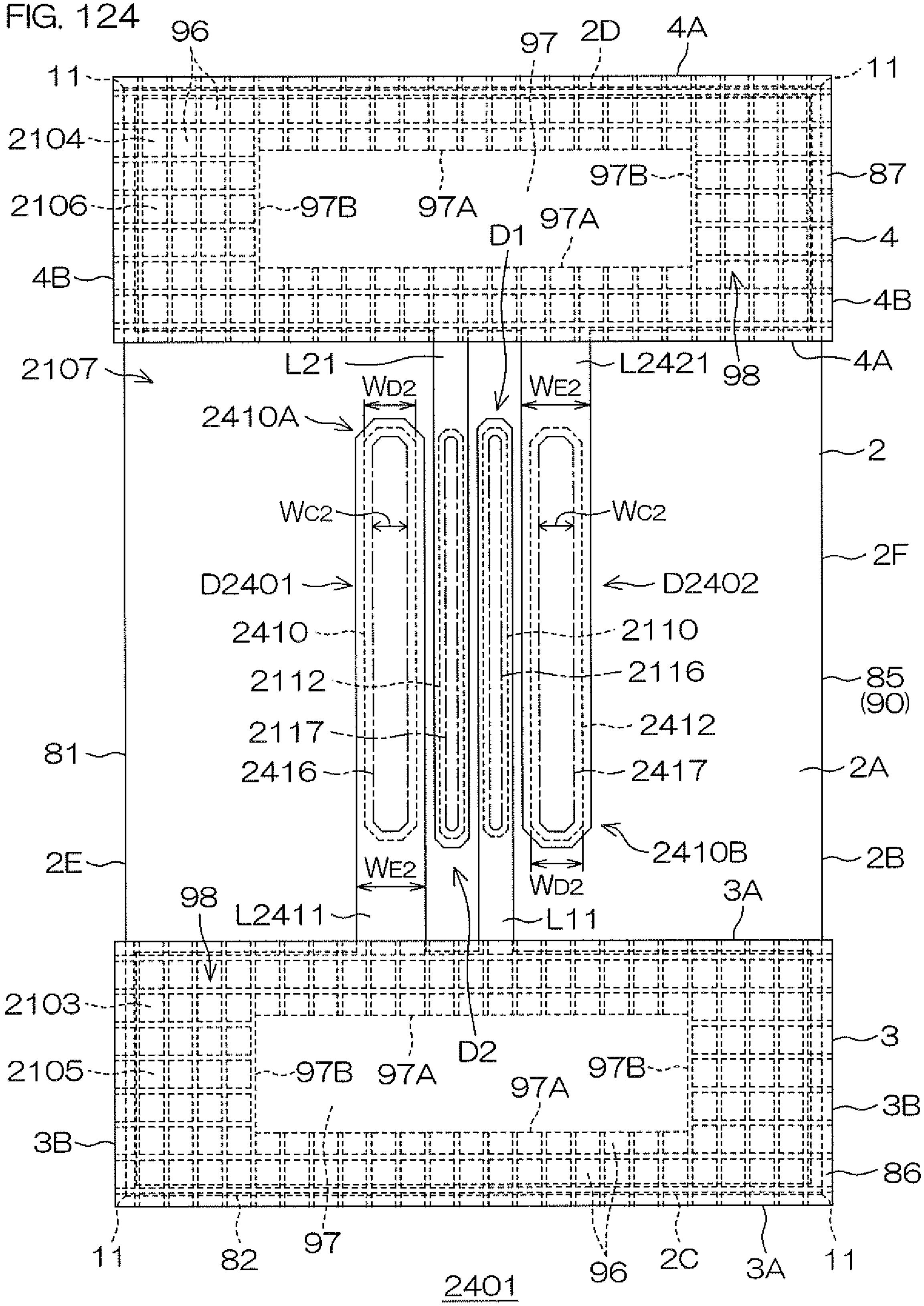

FIG. 124 is a schematic plan view of the chip part 2401 according to a first modification example of the chip part 2001 shown in FIG. 77.

A point of difference of the chip part 2401 according to the first modification example with respect to the chip part 2001 according to the sixth reference example described above is that a parallel structure 2410A and a parallel structure 2410B are formed in place of the parallel structure 12. In FIG. 124, portions corresponding to the respective portions shown in FIG. 78 described above are provided with the same reference symbols and description thereof shall be omitted.

The parallel structure 2410A includes the second Zener diode D2 and a first Zener diode D2401 that is formed to be wider than the second Zener diode D2. The first Zener diode D2401 of the parallel structure 2410A is constituted of a first diffusion region 2410 and a portion of the semiconductor substrate 2 in the vicinity of the first diffusion region 2410. The first diffusion region 2410 is covered by a lead-out electrode L2411 extending from the first pad 2105. A width $W_{D2}$ of the first diffusion region 2410 is defined to be wider than the width $W_D$ of the second diffusion region 2112 (width $W_{D2}$>width $W_D$). Also, a width $W_{C2}$ of a first contact hole 2416 is defined to be wider than the width $W_C$ of the second contact hole 2117 (width $W_{C2}$>width $W_C$). The width $W_{E2}$ of the lead-out electrode L2411 is defined to be wider than the width $W_E$ of the lead-out electrode L21 (width $W_{E2}$>width $W_E$).

On the other hand, the parallel structure 2410B includes the first Zener diode D1 and a second Zener diode D2402 that is formed to be wider than the first Zener diode D1. The second Zener diode D2402 of the parallel structure 2410B is constituted of a second diffusion region 2412 and a portion of the semiconductor substrate 2 in the vicinity of the second diffusion region 2412. The second diffusion region 2412 is covered by a lead-out electrode L2421 extending from the second pad 2106. The respective widths of the second diffusion region 2412, a second contact hole 2417, and the lead-out electrode L2421 are equal to the respective widths $W_{D2}$, $W_{C2}$, and $W_{E2}$ of the first diffusion region 2410, the first contact hole 2416 and the lead-out electrode L2411.

Although the respective parallel structures 2410A and 2410B thus have the first diffusion regions 2110 and 2410 and the second diffusion regions 2112 and 2412 that respectively differ from each other in peripheral length and area, the total area and total extension of the first diffusion regions 2110 and 2410 are both defined to be equal to the total area and total extension of the second diffusion regions 2112 and 2412.

Also the first connection electrode 3 plus the first diffusion regions 2110 and 2410 and the second connection electrode 4 plus the second diffusion regions 2112 and 2412 are arranged to be mutually symmetrical in a plan view. More specifically, the first connection electrode 3 plus the first diffusion regions 2110 and 2410 and the second connection electrode 4 plus the second diffusion regions 2112 and 2412 are arranged to be point symmetrical with respect to the center of gravity of the element forming surface 2A in a plan view. The first connection electrode 3 plus the first diffusion regions 2110 and 2410 and the second connection electrode 4 plus the second diffusion regions 2112 and 2412 are also formed to be line symmetrical with respect to a straight line passing through the center of gravity of the element forming surface 2A and extending in the short direction of the chip part 2401 (the direction along the short side 82 of the chip part 2401).

By this arrangement, the current vs. voltage characteristics obtained with the first connection electrode 3 being the positive electrode and the second connection electrode 4 being the negative electrode can be made equal to the current vs. voltage characteristics obtained with the first connection electrode 3 being the negative electrode and the second connection electrode 4 being the positive electrode. Also, if the respective areas and the respective peripheral lengths of the first diffusion regions 2110 and 2410 and the second diffusion regions 2112 and 2412 in the respective parallel structures 2410A and 2410B are of the numerical values mentioned above for the sixth reference example (for example, each total area ≤200 $\mu m^2$ and each total extension ≥470 μm), a low inter-terminal capacitance $C_t$ (not more than 6 pF) and a high ESD resistance (not less than 12 kV) can be realized. As a matter of course, a plurality of pairs of parallel structures 2410A and 2410B may be provided.

Figure 125:
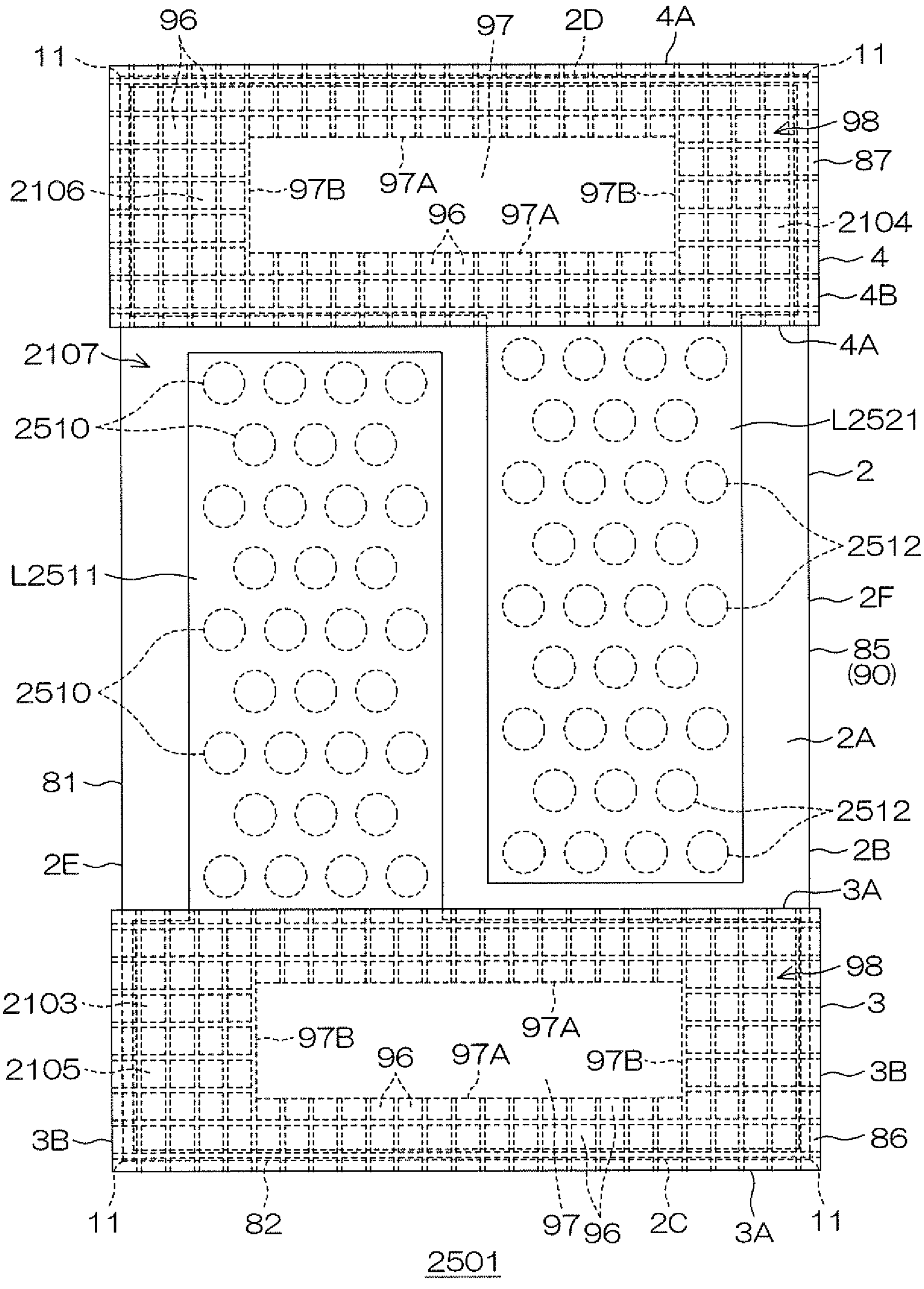

Also, although with each of the sixth to eighth reference examples described above, an example where the first and second diffusion regions 2110 and 2112 are aligned across an interval from each other along the short direction of the semiconductor substrate 2 and formed to extend and be long in the direction intersecting the short direction of the semiconductor substrate 2 was described, the first and second diffusion regions 2110 and 2112 may also be formed in the arrangement shown in FIG. 125. FIG. 125 is a schematic plan view of a chip part 2501 according to a second modification example of the chip part 2001 shown in FIG. 77.

With the chip part 2501 shown in FIG. 125, a plurality of the first diffusion regions 2510 are disposed discretely and a plurality of the second diffusion regions 2512 are disposed discretely in a surface layer region of the semiconductor substrate 2. The first diffusion regions 2510 and the second diffusion regions 2512 are formed to circles of the same size in a plan view. The plurality of first diffusion regions 2510 are disposed in a region between the width center and one of the long sides of the element forming surface 2A, and the plurality of second diffusion regions 2512 are disposed in a region between the width center and the other long side of the element forming surface 2A. The first connection electrode 3 has a single lead-out electrode L2511 connected in common to the plurality of first diffusion regions 2510. Similarly, the second connection electrode 4 has a single lead-out electrode L2521 connected in common to the plurality of second diffusion regions 2512. The first connection electrode 3 plus the first diffusion regions 2510 and the second connection electrode 4 plus the second diffusion regions 2512 are arranged to be point symmetrical with respect to the center of gravity of the element forming surface 2A in a plan view in this modification example as well.

The shape in a plan view of each of the first diffusion regions 2510 and the second diffusion regions 2512 may be any shape, such as a triangle, rectangle, or other polygon, etc. Also, a plurality of the first diffusion regions 2510, extending in the long direction of the element forming surface 2A, may be formed across intervals in the short direction of the element forming surface 2A in a region between the width center and one of the long sides of the element forming surface 2A and the lead-out electrode L2511 may be connected in common to the plurality of first diffusion regions 2510. In this case, a plurality of the second diffusion regions 2512, extending in a long direction of the element forming surface 2A, are formed across intervals in the short direction of the element forming surface 2A in a region between the width center and the other long side of the element forming surface 2A and the lead-out electrode L2521 is connected in common to the plurality of second diffusion regions 2512.

The respective peripheral lengths and the respective areas of the first and second diffusion regions 2510 and 2512 may thus be changed as in the arrangement described above. As a matter of course, such an arrangement may be arranged as a parallel structure and a plurality thereof may be formed to change respective peripheral lengths and the respective areas of the first and second diffusion regions 2510 and 2512.

Figure 126:
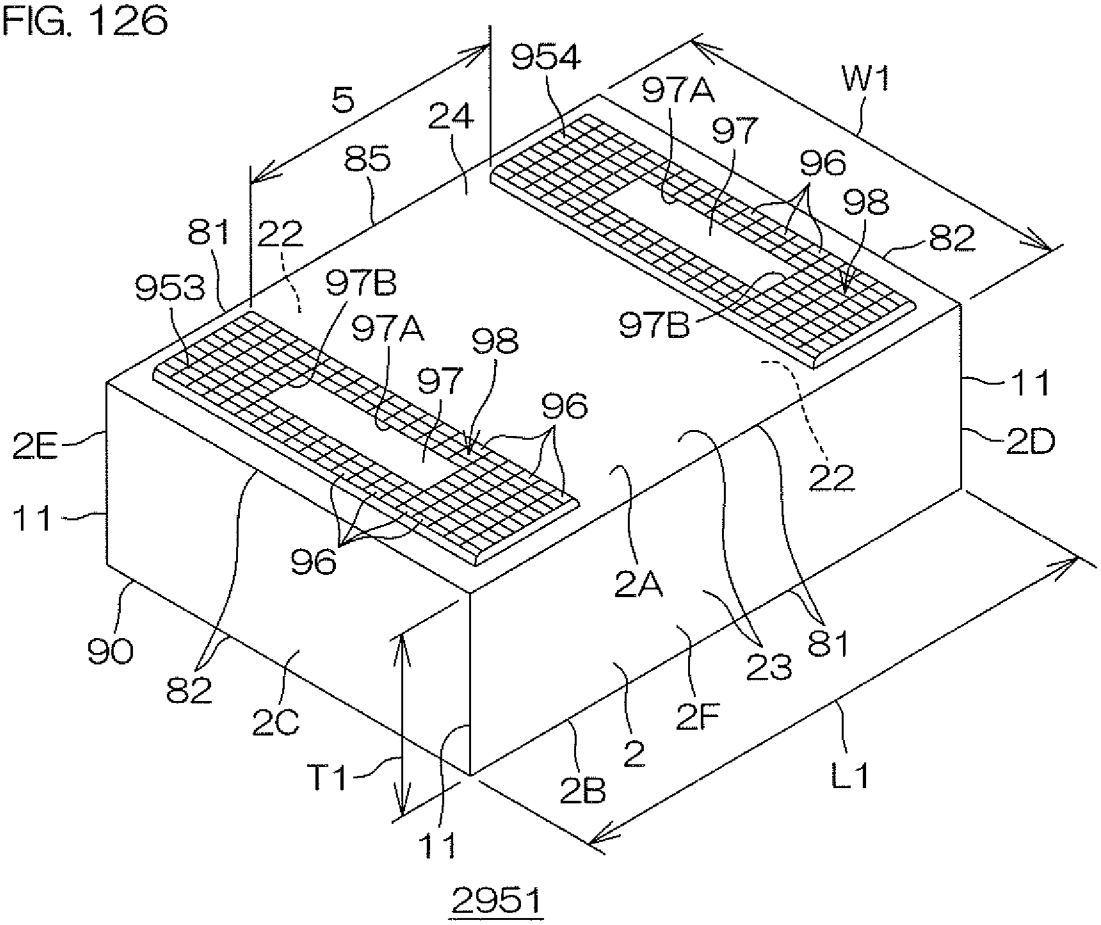
Figure 127:
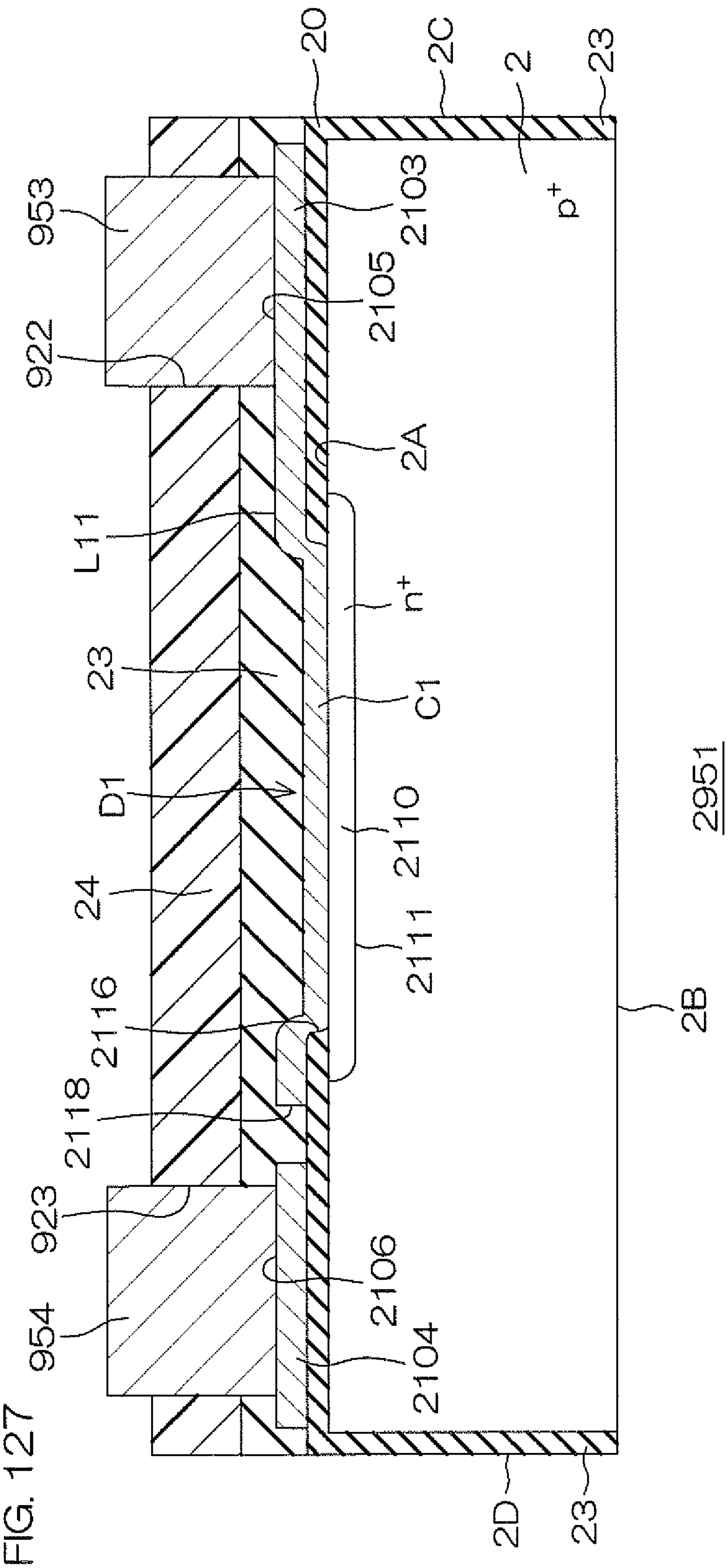

Also, although with each of the sixth to eighth reference examples described above, an example where the first and second connection electrodes 3 and 4 have the peripheral edge portions 86 and 88 was described, the arrangement shown in FIG. 126 and FIG. 127 may also be adopted.

FIG. 126 is a schematic perspective view of a third modification example (chip part 2951) of the chip part 2001 shown in FIG. 77. FIG. 127 is a sectional view of the chip part 2951 shown in FIG. 126.

A point of difference of the chip part 2951 according to the third modification example, with respect to the chip part 2001 according to the sixth reference example described above is that the first and second connection electrodes 953 and 954 are formed in place of the first and second connection electrodes 3 and 4. Arrangements of other portions are the same as those of the chip part 2001 according to the sixth reference example and therefore the same reference symbols shall be provided and description shall be omitted. For the sake of description, the pattern PT (see FIG. 82 and FIG. 83) is omitted in FIG. 127.

As shown in FIG. 126, the first and second connection electrodes 953 and 954 are disposed at an interval from each other at respective end portions of the element forming surface 2A of the substrate 2 (the end portion of the substrate 2 at the side surface 2C side and the end portion of the substrate 2 at the side surface 2D side). The first and second connection electrodes 953 and 954 are formed only on the element forming surface 2A of the substrate 2 and are not formed so as to cover the side surfaces 2C, 2D, 2E, and 2F of the substrate 2. That is, unlike the first and second connection electrodes 3 and 4 in the sixth reference example described above, the first and second connection electrodes 953 and 954 do not have the peripheral edge portions 86 and 87. On the other hand, in the plan view of viewing from the normal direction orthogonal to the element forming surface 2A (rear surface 2B), the flat portion 97 and the projection formation portion 98 are formed, in the same arrangement as in each of the first and second connection electrodes 3 and 4 in the sixth reference example, on the front surface of each of the first and second connection electrodes 953 and 954.

As shown in FIG. 127, on the substrate 2 (across the entire element forming surface 2A), the passivation film 23 and the resin film 24 are formed to cover the first electrode film 2103 and the second electrode film 2104. The pad opening 922 that exposes the first pad 2105 and the pad opening 923 that exposes the second pad 2106 are formed in the passivation film 23 and the resin film 24. The first and second connection electrodes 953 and 954 are formed so as to refill the respective pad openings 922 and 923.

The first and second connection electrodes 953 and 954 may have front surfaces at positions lower (positions closer to the substrate 2) than the front surface of the resin film 24 or, as shown in FIG. 127, may project from the front surface of the resin film 24 and have front surfaces at positions higher (positions further from the substrate 2) than the resin film 24. In the case where the first and second connection electrodes 953 and 954 project from the front surface of the resin film 24, the first and second connection electrodes 953 and 954 may have overlapping portions extending from the opening ends of the pad openings 922 and 923 to the front surface of the resin film 24. Also, although an example where the first and second connection electrodes 953 and 954, each constituted of a single layer of a metal material (for example, an Ni layer), are formed is illustrated in FIG. 127, these may instead have the laminated structure of the Ni layer 33/Pd layer 34/Au layer 35 as in the first reference example.

Such a chip part 2951 may be formed by changing the processes of FIG. 103A to FIG. 103H of the sixth reference example described above. Portions of processes for manufacturing the chip part 2951 that differ from the processes of FIG. 103A to 103H shall now be described with reference to FIG. 128A to FIG. 128D. FIG. 128A to FIG. 128D are sectional views of a method for manufacturing the chip part 2951 shown in FIG. 126.

Figure 128A:
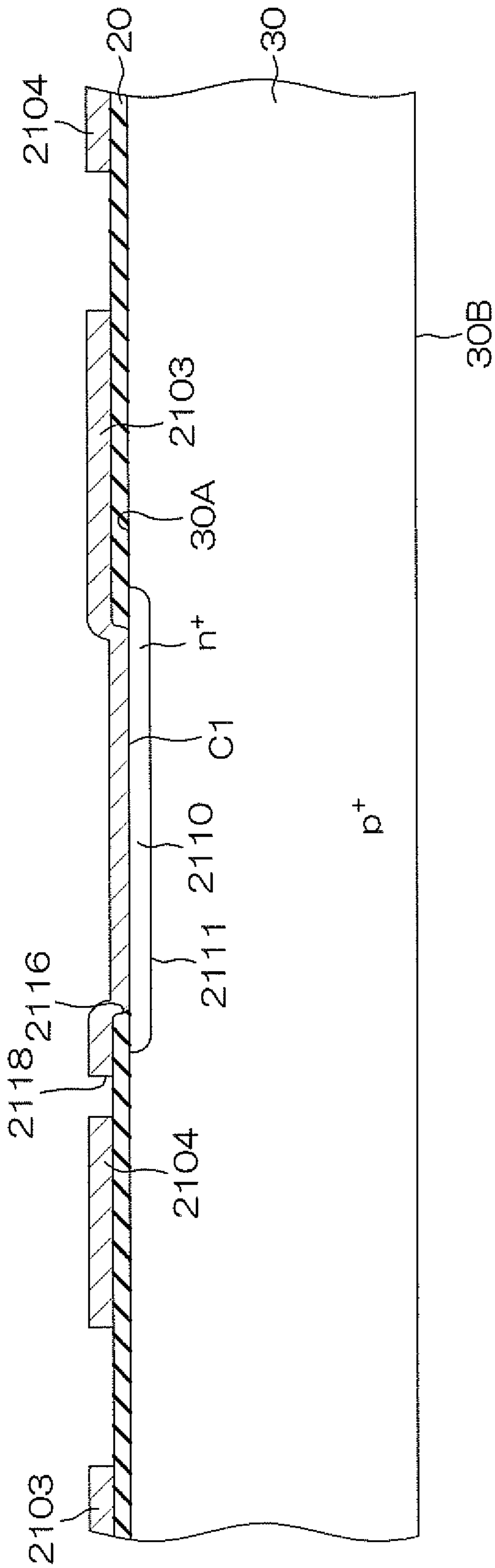
Figure 128B:
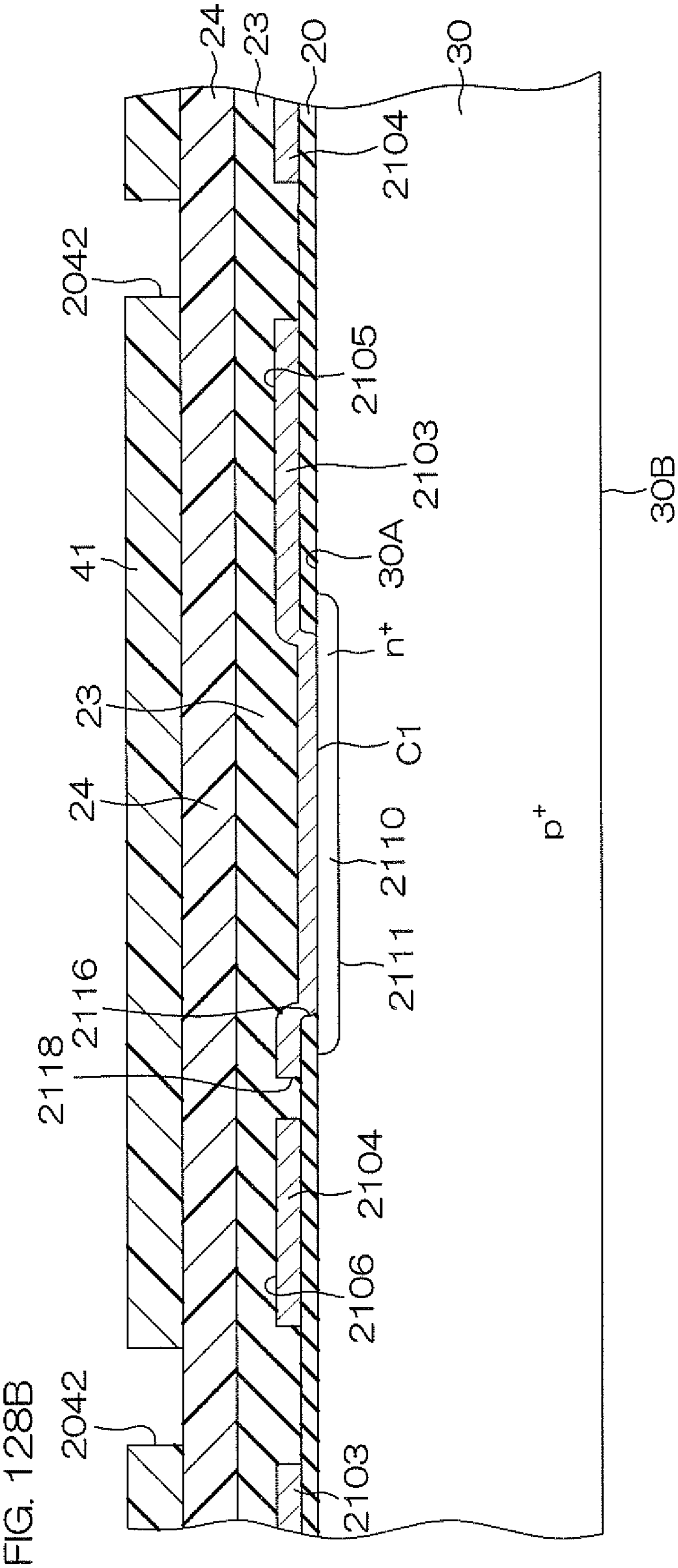

First, as shown in FIG. 128A, the substrate 30 that has undergone the processes of FIG. 103A to FIG. 103D of the sixth reference example is prepared. Thereafter, as shown in FIG. 128B, the passivation film 23 and the resin film 24 are formed in that order on the entire front surface 30A of the substrate 30 so as to cover the first electrode film 2103 and the second electrode film 2104. Next, the resist pattern 41, having the opening 2042 formed selectively in the region in which the groove 2044 is to be formed, is formed so as to cover the substrate 30 (see FIG. 85).

Figure 128C:
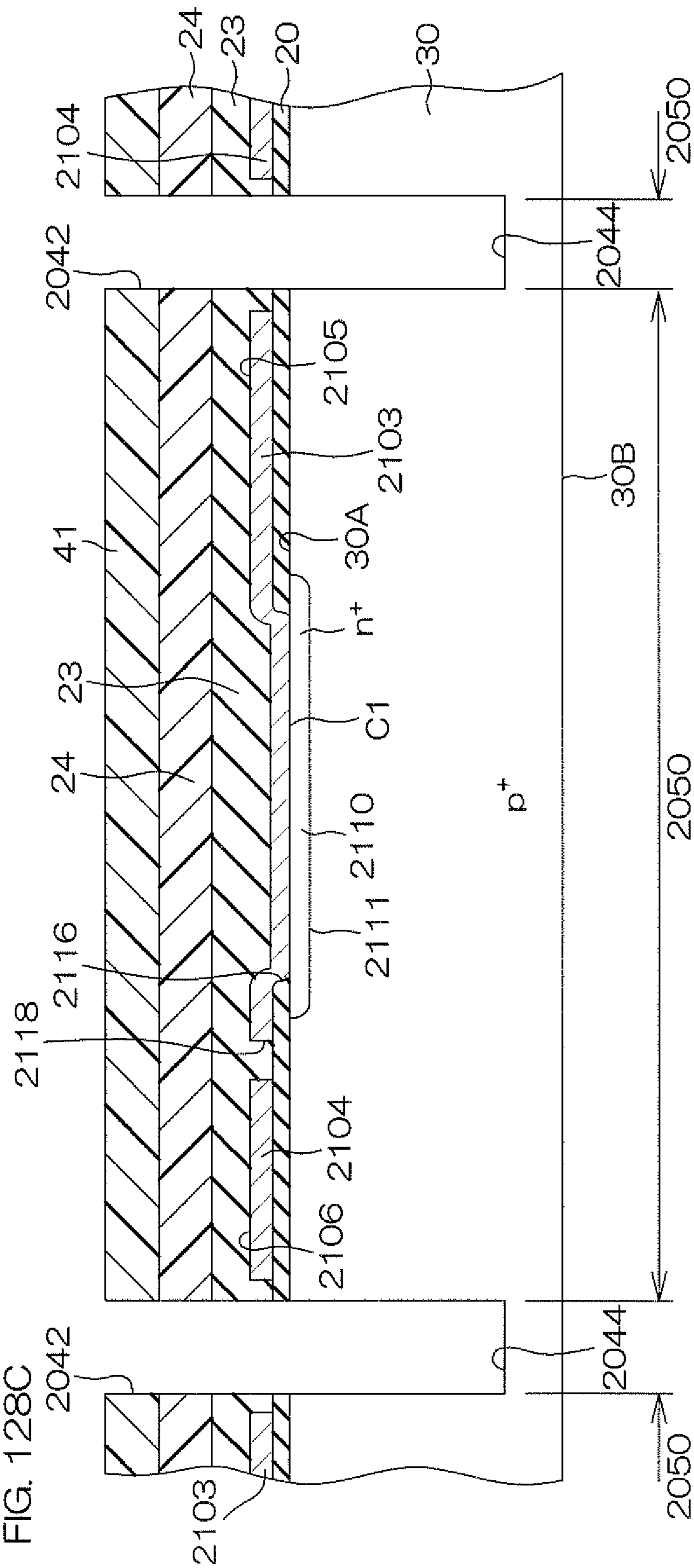

Next, as shown in FIG. 128C, the substrate 30 is removed selectively by plasma etching using the resist pattern 41 as a mask. The groove 2044 of predetermined depth reaching the middle of the thickness of the substrate 30 from the front surface 30A of the substrate 30 is thereby formed at positions matching the opening 2042 of the resist pattern 41 in a plan view, and the semi-finished products 2050 that are aligned and disposed in an array are formed. After the groove 2044 has been formed, the resist pattern 41 is removed.

Figure 128D:
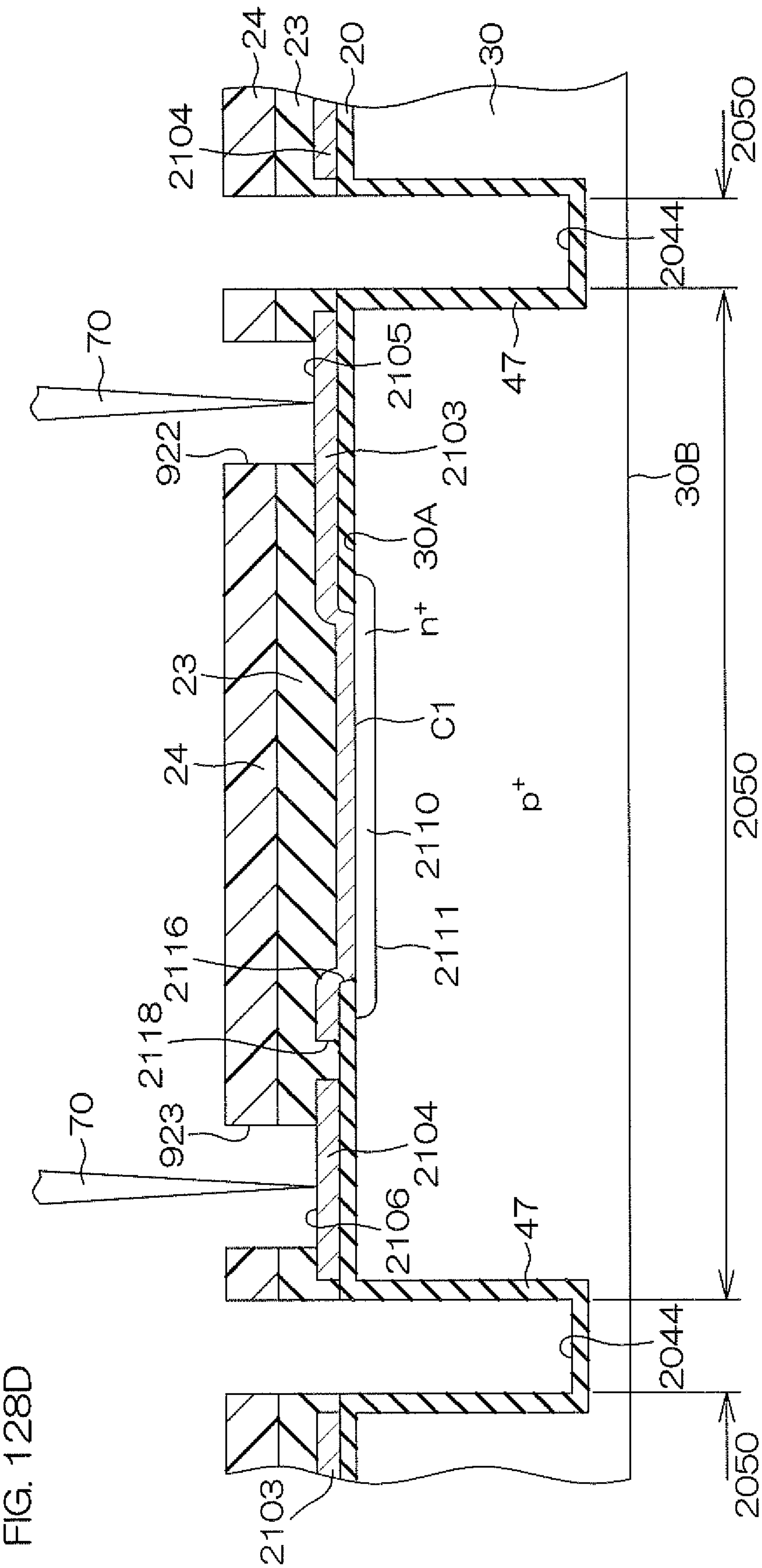

Next, as shown in FIG. 128D, the insulating film 47, constituted of SiN, is formed across the entire front surface 30A of the substrate 30 by the same process as that of FIG. 103G.

Next, by the same process as that of FIG. 103E, the resin film 24 is exposed with the predetermined pattern PT (see FIG. 82 to FIG. 84) that includes the first openings 25 and the second openings 26 and with a pattern corresponding to the pad openings 922 and 923. Thereafter, the resin film 24 is developed. By patterning and developing the resin film 24, portions of the resin film 24 matching the predetermined pattern PT and portions matching the pad openings 922 and 923 are selectively removed. Next, an electrical test using the probes 70 is performed on the first and second Zener diodes D1 and D2.

At this point, the comparatively wide first openings 25 are formed at the first pad 2105 and the second pad 2106. Therefore, by setting the positions of contact of the probes 70 and the first pad 2105 and the second pad 2106 within the first openings 25, the probes 70 (more specifically, portions other than tip end portions of the probes 70) can be effectively suppressed from entering into a comparatively narrow second opening 26 or contacting a side surface of the second opening 26, etc. The electrical test can thus be performed satisfactorily.

Thereafter, the first and second connection electrodes 953 and 954 are formed (by plating growth, see FIG. 86) so as to refill the pad openings 922 and 923. The chip parts 2951 (see FIG. 126) that are separated into individual chips are then obtained via the same process as the process of FIG. 103H.

Even with such an arrangement, the same effects as the effects described above with the sixth to eighth reference examples can be exhibited. Although in FIG. 126 and FIG. 127, the arrangement of the first and second connection electrodes 953 and 954 is illustrated as a modification example of the chip part 2001 according to the sixth reference example, the arrangement may obviously be adopted in each of the sixth to eighth reference examples and the first and second modification examples of the chip part 2001 shown in FIG. 77.

Although preferred embodiments of the present invention and forms according to the reference examples have been described above, the preferred embodiments of the present invention and the forms according to the reference examples may be implemented in yet other forms.

For example, although with the first preferred embodiment described above, an example where the penetrating hole 6 is formed at the second connection electrode 4 side was described, the penetrating hole may be formed in the first connection electrode 3 side. Even with such an arrangement, the same effects as the effects described above with the respective preferred embodiments can be exhibited. However, when the penetrating hole is formed at the cathode electrode side, there is a possibility for a current path to be formed due to degradation, etc., of the passivation film formed on the wall surfaces of the penetrating hole and a leakage current may thus flow from the cathode electrode side to the anode electrode side. Therefore, it is preferable for the penetrating hole to be formed at the anode electrode side.

Also, although with the first to fifth preferred embodiments described above, examples where each of respective types of diodes is formed in a single chip part was described, an example where various circuit elements, such as a diode, a resistor, a capacitor, a fuse, etc., are selectively formed in a single chip part (for example, a 0603 chip, a 0402 chip, or a 03015 chip) may also be adopted. Therefore, for example, the element region 5 defined in a single chip part may be divided into two and a diode and various circuit elements may be formed in the respective divided element regions.

Also, although with each of the first and second preferred embodiments described above, an example where four diode cells are formed on the substrate 2 was described, two or three diode cells may be formed or not less than four diode cells may be formed on the substrate 2.

Also, although with each of the first and second preferred embodiments, an example where the p-n junction regions or the Schottky junction regions are respectively formed to a regular octagon in a plan view was described, the p-n junction regions or the Schottky junction regions may be formed to any polygonal shape with the number of sides being not less than three, and the planar shape of the regions may be circular or elliptical. If the shape of the p-n junction regions or the Schottky junction regions is to be made a polygonal shape, the shape does not have to be a regular polygonal shape and the regions may be formed to a polygon with two or more types of side length. Yet further, there is no need to form the p-n junction regions or the Schottky junction regions to the same size and a plurality of diode cells respectively having junction regions of different sizes may be mixed on the substrate 2. Yet further, the shape of the p-n junction regions or the Schottky junction regions formed on the semiconductor substrate 2 does not have to be of one type, and p-n junction regions or Schottky junction regions with two or more types of shape may be mixed on the substrate 2.

Also, although with the third preferred embodiment described above, an example where the first diffusion regions 410 and the second diffusion regions 412 are formed to extend and be long in the direction orthogonal to the alignment direction thereof was described, these may be formed to extend and be long in a direction oblique with respect to the alignment direction thereof.

Also with the third preferred embodiment, an arrangement may be adopted where the first pad 405 and the second pad 406 are respectively used as external connection portions without providing the first and second connection electrodes 3 and 4 and bonding wires are connected to the first pad 405 and the second pad 406. In this case, destruction of the p-n junction regions 411 and 413 due to impact during wire bonding can be avoided.

Also with each of the first to fifth preferred embodiments, the polarities of the respective types of impurity regions (the region doped with the p-type impurity and the region doped with the n-type impurity) may be reversed. Therefore, if a p-type substrate is used as the substrate 2, this may be changed to an n-type substrate. The other impurity regions are changed to the n-type or p-type in accordance with the polarity of the substrate.

Also, although with each of the first to fourth reference examples described above, an example where the chamfered portion 1006 or 1506 is formed at the corner portion at the first connection electrode 3 or 503 side was described, the chamfered portion may be formed at the corner portion of the second connection electrode 4 or 504 side. Even with such an example, the same effects as the effects described above with the first reference example can be exhibited.

Also, although with each of the first to fourth reference examples described above, an example was described where the chamfered portion 1006 or 1506 is formed by chamfering the corner portion 84 or 584 of the substrate 2 or 502 defined by the intersection of the extensions of the side surface 2C or 502C (short side 82*b* or lateral side 582*b*) and the side surface 2E or 502E (long side 81*b* or longitudinal side 581*b*) in the plan view of viewing from the normal direction orthogonal to the element forming surface 2A or 502A (rear surface 2B or 502B), the chamfered portion 1006 or 1506 may be formed by chamfering a corner portion of the substrate 2 or 502 defined by intersection of extensions of the side surface 2C or 502C and the side surface 2F or 502F. Also, an arrangement may be adopted where, by forming such a chamfered portion, two corner portions of the chip part are chamfered.

Also, an arrangement may be adopted where three corner portions of the chip part are chamfered. In this case, whereas chamfered portions are formed at three corner portions, the perpendicular state is kept at one corner portion. Therefore, in the plan view of viewing the element forming surface 2A from the normal direction, the respective end portions of the substrate 2 at which the first and second connection electrodes 3 and 4 are formed have shapes that are not line symmetrical with respect to the straight line orthogonal to the long sides 81*a* and 81*b* of the substrate 2 (and passing through a center of gravity of the substrate 2). The respective end portions of the substrate 2 at which the first and second connection electrodes 3 and 4 are formed also have shapes that are not point symmetrical with respect to the center of gravity of the substrate 2. The same effects as the effects described above with the first to fourth reference examples can thereby be exhibited.

Also, although with the first to fifth reference examples, examples where each of various types of diodes is formed in a single chip part was described, an example where various circuit elements, such as a diode, a resistor, a capacitor, a fuse, etc., are selectively formed in a single chip part (for example, a 0603 chip, a 0402 chip, or a 03015 chip) may also be adopted. Therefore, for example, the element region 5 defined in a single chip part may be divided into two and a diode and various circuit elements may be formed in the respective divided element regions.

Also, although with each of the first and second reference examples described above, an example where four diode cells are formed on the substrate 2 was described, two or three diode cells may be formed or not less than four diode cells may be formed on the substrate 2.

Also, although with each of the first and second reference examples, an example where the p-n junction regions or the Schottky junction regions are respectively formed to a regular octagon in a plan view was described, the p-n junction regions or the Schottky junction regions may be formed to any polygonal shape with the number of sides being not less than three, and the planar shape of the regions may be circular or elliptical. If the shape of the p-n junction regions or the Schottky junction regions is to be made a polygonal shape, the shape does not have to be a regular polygonal shape and the regions may be formed to a polygon with two or more types of side length. Yet further, there is no need to form the p-n junction regions or the Schottky junction regions to the same size and a plurality of diode cells respectively having junction regions of different sizes may be mixed on the substrate 2. Yet further, the shape of the p-n junction regions or the Schottky junction regions formed on the substrate 2 does not have to be of one type, and p-n junction regions or Schottky junction regions with two or more types of shape may be mixed on the substrate 2.

Also, although with the third reference example described above, an example where the first diffusion regions 410 and the second diffusion regions 412 are formed to extend and be long in the direction orthogonal to the alignment direction thereof was described, these may be formed to extend and be long in a direction oblique with respect to the alignment direction thereof.

Also with the third reference example, an arrangement may be adopted where the first pad 405 and the second pad 406 are respectively used as external portions without providing the first and second connection electrodes 3 and 4 and bonding wires are connected to the first pad 405 and the second pad 406. In this case, destruction of the p-n junction regions 411 and 413 due to impact during wire bonding can be avoided.

Also with each of the first to fifth reference examples, the polarities of the respective impurity regions (the region doped with the p-type impurity and the region doped with the n-type impurity) may be reversed. Therefore, if a p-type substrate is used as the substrate 2, this may be changed to an n-type substrate. The other impurity regions are changed to the n-type or p-type in accordance with the polarity of the substrate.

Also, although with the sixth reference example described above, an example was described where the plurality of projections 96 are formed to rectangular shapes in a plan view, the plurality of projections 96 may be formed to circular shapes in a plan view. Also, the plurality of projections 96 may be aligned in a honeycomb form in a plan view. When the plurality of projections 96 are aligned in a honeycomb form in a plan view, the widths between mutually adjacent projections 96 are all equal. The projections 96 can thus be laid out on the front surfaces of the first and second connection electrodes 3 and 4 without waste, and the same effects as those in the case where the projections 96 are in a staggered alignment as described with FIG. 84 can be exhibited. In this case, the pattern PT having the first and second openings 25 and 26 such that the respective front surfaces of the first and second electrode films 2103 and 2104 are exposed in honeycomb form is formed on the first and second electrode films 2103 and 2104.

Also, although with the sixth reference example, an example was described where the plurality of projections 96 are respectively formed across an interval from each other, a portion of the plurality of projections 96 may be formed so as to be continuous to each other to arrange an oblong shape in a plan view, a projecting shape in a plan view, or a recessed shape in a plan view, etc.

Also, although with the sixth reference example, an example was described where the flat portion 97 and the plurality of projections 96 formed in the periphery of the flat portion 97 are formed across an interval from each other, the flat portion 97 and the plurality of projections 96 formed in the periphery of the flat portion 97 may be formed so as to be continuous to each other.

Also, although with the sixth reference example, an example was described where the plurality of projections 96 are formed on the first and second connection electrodes 3 and 4, a line-shaped (annular) projection portion, with which the plurality of projections 96 are integrated continuously, may be formed. Such a line-shaped projection 96 may be formed, for example, by changing the method for patterning the resin film 24 in the process of forming the pattern PT (notched portions 122 and 123) described with FIG. 103E. That is, although as was described with the sixth reference example, a pattern that is annular in a plan view is formed in the region directly below the flat portion 97 to form the first opening 25, a plurality of annular patterns may be formed so as to further surround the periphery of the aforementioned annular pattern. A plurality of line-shaped (annular) projections are thereby formed on the respective front surfaces of the first and second connection electrodes 3 and 4 so as to surround the periphery of the flat portion 97.

Also, although with the sixth reference example, an example was described where the flat portion 97 is formed on the front surface of each of the first and second connection electrodes 3 and 4, an arrangement where the projections 96 are formed across the entireties of the front surfaces of the first and second connection electrodes 3 and 4 may be adopted. In this case, the light from the light source 65 can be reflected by the entire surfaces of the first and second connection electrodes 3 and 4 to enable the detection by the part recognizing camera 64 to be performed more satisfactorily. On the other hand, the flat portions 97 are not formed on the first and second connection electrodes 3 and 4 and therefore in the electrical test by the probes 70 (see FIG. 103E), portions of the probes 70 other than the tip end portions may contact the projections 96. It is therefore preferable for the projection 96 to be formed in plurality on each of the first and second connection electrodes 3 and 4 to a degree such that regions for contact by the probes 70 can be secured.

Also, although with the sixth reference example, an example was described where the flat portion 97 is formed at an inner portion of each of the first and second connection electrodes 3 and 4, an example may be adopted where a flat portion is formed in a region of a corner portion at which a long side 3A or 4A and a short side 3B or 4B of each of the first and second connection electrodes 3 and 4 intersect.

Also, although with the sixth reference example, an example was described where the flat portion 97 with the oblong shape in a plan view is formed on the front surface of each of the first and second connection electrodes 3 and 4, a flat portion with a polygonal shape in a plan view or a circular shape in a plan view, etc., may be formed in place of the flat portion 97 with the oblong shape in a plan view. In this case, the pattern PT, which includes the first opening 25 with a polygonal shape in a plan view or circular shape in a plan view at the position corresponding to the region in which the flat portion is to be formed, is formed on the first and second electrode films 2103 and 2104.

Also, although with the sixth reference example, an example was described where the pattern PT that includes the resin film is formed on the first and second electrode films 2103 and 214, the pattern PT may be formed of a material other than a resin film, for example, an insulating material, such as $SiO_2$, SiN, etc.

Also, although with each of the seventh and eighth reference examples, plasma etching is applied along the boundary region 2180 in performing cutting and separation into the chip parts 2201 or 2301, the etching conditions of the plasma etching may be changed. By changing the etching conditions of the plasma etching, the shape of the cut end surface of each chip part 2201 or 2301 can be shaped to an end surface that is vertical from the front surface to the rear surface or an end surface that is an inclined surface other than a vertical surface, such as an end surface with an inclination in a direction of spreading from the front surface toward the rear surface (inclination of an increasing direction), an end surface with an inclination in a direction of narrowing from the front surface toward the rear surface (inclination of a gouging direction), etc., and accordingly, the recessed marks 207 and the projecting marks 270 may also be arranged as marks that extend vertically or extend in an inclination direction. The recessed marks 207 or the projecting marks 270 can thus be imparted with an inclination by control of the etching conditions to provide marks that are richer in information amount.

Also, although with each of the seventh and eighth reference examples, an example was described where the plurality of projections 96 and the flat portion 97 are not formed on the front surface of each of the first and second connection electrodes 3 and 4, the plurality of projections 96 and the flat portion 97 may obviously be formed on the front surface of each of the first and second connection electrodes 3 and 4 in each of the seventh and eighth reference examples as well.

Further, with each of the sixth to eighth reference examples, the polarities of the respective types of impurity regions (the region doped with the p-type impurity and the region doped with the n-type impurity) may be reversed. Therefore, if a p-type substrate is used as the substrate 2, this may be changed to an n-type substrate. The other impurity regions are changed to the n-type or p-type in accordance with the polarity of the semiconductor substrate 2.

Besides the above, various design changes may be applied within the scope of the matters described in the claims. The features that can be extracted from the present specification and the drawings are indicated below.

For example, with reference to FIG. 42 to FIG. 76D, if the objects are to provide a chip part and a method for manufacturing the chip part with which a polarity direction can be judged with good precision while suppressing the decrease of productivity and to provide a circuit assembly and an electronic device that include a chip part with which a polarity direction can be judged with good precision while suppressing the decrease of productivity, a chip part with the features indicated in A1 to A8 can be extracted.

A1: A chip part including a substrate, a pair of electrodes formed on a front surface of the substrate and including one electrode and another electrode that face each other along the front surface of the substrate, an element formed on the front surface side of the substrate and electrically connected to the pair of electrodes, and a notched portion formed at a notch width greater than 10 μm at a portion of a peripheral edge portion of the substrate along the one electrode.

Ordinarily, with mounting substrates having a chip part mounted thereon, only those that are judged to be "non-defective" upon undergoing a substrate appearance inspection process are shipped. As judgment items in the substrate appearance inspection process, an inspection of the state of soldering on the mounting substrate, a polarity inspection in a case where there is polarity to the electrodes of the chip part, etc., are performed by an automatic optical inspection machine (AOI).

Among these judgment items, the polarity inspection is performed, for example, according to whether or not a marking formed on the chip part is detected to be of a color (for example, white, blue, etc.) of not less than a value set in advance in a polarity inspection window at a predetermined position of the inspection machine, and if the marking is detected as such, the "non-defective" judgment is made.

However, a chip part is not necessarily mounted in a horizontal attitude onto a mounting substrate and there are cases where a chip part is mounted in an inclined attitude onto a mounting substrate. In this case, depending on the inclination angle, a portion of the light irradiated from the inspection machine onto the chip part may be reflected outside the polarity window or the wavelength of the reflected light may change with respect to the incident light so that the detected color is recognized (misrecognized) to be a color of not more than the set value. This leads to a problem that a "defective" judgment is made despite the polarity direction of the electrodes being correct.

To prevent such misrecognition, a detection system (part recognizing camera, etc.) and an illumination system (light source, etc.) of the automatic optical inspection machine must be optimized according to each inspection object to improve the inspection precision and thus extra effort is required for the appearance inspection and productivity is decreased. Moreover, such effort becomes excessive as chip parts of even smaller size become desired.

With the present arrangement, when the chip part is mounted on a mounting substrate, the respective positions of the one electrode and the other electrode can be confirmed based on the position of the notched portion. In a case where there is polarity to the pair of electrodes, the polarity direction can thereby be judged easily. Moreover, the polarity judgment is made not based on brightness or tint detected by an inspection machine but based on the shape of the notched portion that is unchanged even when an inclination of the chip part with respect to the mounting substrate changes. Therefore, even if a mounting substrate, on which the chip part is mounted in an inclined attitude, and a mounting substrate, on which the chip part is mounted in a horizontal attitude, are mixed together in an appearance inspection process, the polarity direction can be judged with stable quality based on the notched portion and without having to optimize a detection system, etc., of the inspection machine according to each mounting substrate.

Also, the notched portion is formed to have the notch width that is greater than 10 μm and therefore a portion at which the notched portion is formed and a portion at which it is not formed can be detected satisfactorily without having to use an inspection machine of high precision (high resolution) in judging the polarity direction.

Also, there is no need to form a marking on the front surface or the rear surface of the chip part as index for judging the polarity direction and therefore there is no need to use a marking apparatus for forming a marking on the chip part by irradiation of ultraviolet rays or a laser, etc. The process for manufacturing the chip part can thus be simplified and equipment investment can be reduced. The productivity can thereby be improved as well.

A2: The chip part according to A1, where the substrate is formed to a substantially rectangular shape in a plan view and the notched portion includes a chamfered portion formed at a corner portion of the substrate.

A3: The chip part according to A1, where the substrate is formed to a substantially rectangular shape in a plan view and the notched portion includes a recess formed selectively at a peripheral edge portion along one side of the substrate.

A4: The chip part according to any one of A1 to A3, where the one electrode has a portion along a line defining the notched portion.

A5: The chip part according to any one of A1 to A4, where the one or the other electrode is formed integrally on the front surface and a side surface of the substrate so as to cover the peripheral edge portion of the substrate.

With this arrangement, each electrode is formed on the side surface in addition to the front surface of the substrate and the adhesion area for soldering the chip part onto the mounting substrate can be enlarged. Consequently, the amount of solder adsorbed to the electrode can be increased to improve the adhesion strength. Also, the solder is adsorbed so as to extend around from the front surface to the side surface of the substrate and the chip part can thus be held from the two directions of the front surface and the side surface of the substrate in the mounted state. The mounting form of the chip part can thus be stabilized.

A6: The chip part according to any one of A1 to A5, where the element is formed between the pair of electrodes.

A7: The chip part according to any one of A1 to A6, where the element includes a plurality of elements having mutually different functions and disposed on the substrate at intervals from each other and the pair of electrodes are formed on the substrate so as to be electrically connected to each of the plurality of elements.

With this arrangement, the chip part constitutes a composite chip part in which a plurality of circuit elements are disposed on a substrate in common. With the composite chip part, the bonding area (mounting area) with respect to the mounting substrate can be reduced. Also, by the composite chip part being arranged as an N-tuple chip (where N is a positive integer), a chip part providing the same functions obtained by performing N times of mounting of a chip part carrying only one element can be mounted in a single process. Further, in comparison to a single-component chip part, the area per chip part can be enlarged to stabilize a suction operation by a suction nozzle of an automatic mounting machine.

A8: The chip part according to any one of A1 to A7, where the element includes a diode and the pair of electrodes include a cathode electrode and an anode electrode electrically connected respectively to a cathode and an anode of the diode.

With this arrangement, the notched portion formed in the substrate functions as a cathode mark that indicates the cathode electrode or an anode mark that indicates the anode electrode. Therefore, even if in the mounting of the chip part onto the mounting substrate, the mounting is performed such that the cathode electrode and the anode electrode are reversed, the polarity direction of the chip part can be judged based on the position of the notched portion. The reliability of mounting of the chip part including the diode onto the mounting substrate can thus be improved further.

A9: The chip part according to any one of A1 to A8, where a rear surface of the substrate at the side opposite to the front surface is mirror-finished.

With this arrangement, the rear surface of the chip part is mirror-finished and therefore light made incident onto the rear surface from an inspection machine can be reflected with good efficiency. Therefore in a case where various mounting substrates that differ in the condition of inclination of the chip part with respect to the mounting substrate are to be inspected, information (brightness or tint of reflected light) for distinguishing a certain inclination from another inclination can be utilized satisfactorily by the inspection machine. Consequently, the inclination of the chip part can be detected satisfactorily. In particular, with the present arrangement, information on reflected light from the chip part can be omitted as an index for judging the polarity direction and the lowering of the precision of judgment of the polarity direction of the chip part due to such mirror-finishing of the rear surface can be prevented.

A10: The chip part according to any one of A1 to A9, where each of the pair of electrodes may include an Ni layer, an Au layer, and a Pd layer interposed between the Ni layer and the Au layer.

With this arrangement, the Au layer is formed at a frontmost surface of each electrode functioning as an external connection electrode of the chip part. Excellent solder wettability and high reliability can thus be achieved in mounting the chip part onto the mounting substrate. Also, with the electrode of this arrangement, even if a penetrating hole (pinhole) forms in the Au layer of the electrode due to thinning of the Au layer, the Pd layer interposed between the Ni layer and the Au layer closes the penetrating hole and the Ni layer can thus be prevented from being exposed to the exterior through the penetrating hole and becoming oxidized.

A11: A circuit assembly including the chip part according to any one of A1 to A10 and a mounting substrate having lands, solder-bonded to the pair of electrodes, on a mounting surface facing the pair of electrodes on the substrate.

With this arrangement, a circuit assembly having a highly reliable electronic circuit without error in the polarity direction of the chip part can be provided.

A12: An electronic device including the circuit assembly according to A11 and a casing that houses the circuit assembly.

With this arrangement, the chip part is included and therefore an electronic device having a highly reliable electronic circuit without error in the polarity direction of the chip part can be provided.

A13: A method for manufacturing a chip part including a step of forming a plurality of elements at intervals from each other on a substrate, a step of selectively removing the substrate to form a groove defining a chip region including at least one of the elements and at the same time using a portion of the groove to form a notched portion, with a notch width greater than 10 μm, at a portion of a peripheral edge portion of the chip region, a step of forming a pair of electrodes, including one electrode along the notched portion and another electrode facing the one electrode along a front surface of the substrate, in the chip region so as to be electrically connected to the element, and a step of grinding the substrate from a rear surface at the opposite side of the front surface until the groove is reached to divide and separate the plurality of chip regions along the groove into a plurality of individual chip parts.

By this method, chip parts exhibiting the same effects as the chip part according to A1 can be manufactured. Also by this method, a portion of the groove that defines the respective chip regions is used to form the notched portion and there is thus no need to separately prepare an apparatus for forming the notched portion. The process for manufacturing the chip part can thus be simplified and equipment investment can be reduced. The productivity of the chip part can also be improved thereby.

A14: The method for manufacturing a chip part according to A13, where the step of forming the groove includes a step of forming a chip region of substantially rectangular shape in a plan view, a corner portion of which is chamfered as the notched portion.

A15: The method for manufacturing a chip part according to A13, where the step of forming the groove includes a step of forming a chip region of substantially rectangular shape in a plan view, a side surface of which is selectively recessed as the notched portion.

A16: The method for manufacturing a chip part according to any one of A13 to A15, where the step of forming the elements includes a step of forming a diode on the substrate and the step of forming the pair of electrodes includes a step of forming a cathode electrode and an anode electrode electrically connected respectively to a cathode and an anode of the diode.

A17: The method for manufacturing a chip part according to any one of A13 to A16, further including a step of forming an insulating film on a side surface of the groove prior to the step of forming the pair of electrodes and the step of forming the pair of electrodes includes a step of forming, by electroless plating, the one electrode and the other electrode so as to integrally cover a front surface of the chip region and the side surface of the groove.

A18: The method for manufacturing a chip part according to any one of A13 to A17, where the groove is formed by etching.

Also, with reference to FIG. 77 to FIG. 128D, if the objects are to provide a bidirectional Zener diode chip capable of realizing a satisfactory inter-terminal capacitance and to provide a circuit assembly that includes the bidirectional Zener diode chip and an electronic device housing the circuit assembly in a casing, a bidirectional Zener diode chip with the features indicated in B1 to B20 can be extracted.

B1: A bidirectional Zener diode chip including a semiconductor substrate of a first conductivity type, a first diffusion region of a second conductivity type formed on the semiconductor substrate and exposed at a front surface of the semiconductor substrate, a second diffusion region of the second conductivity type formed on the semiconductor substrate across an interval from the first diffusion region and exposed at the front surface of the semiconductor substrate, a first electrode formed on the front surface of the semiconductor substrate and connected to the first diffusion region, and a second electrode formed on the front surface of the semiconductor substrate and connected to the second diffusion region, and where, in a plan view of viewing the semiconductor substrate from a normal direction, respective areas of the first diffusion region and the second diffusion region are not more than 2500 $\mu m^2$ respectively.

With this arrangement, a p-n junction is formed between the semiconductor substrate and the first diffusion region and a first Zener diode is constituted thereby. The first electrode is connected to the first diffusion region of the first Zener diode. On the other hand, a p-n junction is formed between the semiconductor substrate and the second diffusion region and a second Zener diode is constituted thereby. The second electrode is connected to the second diffusion region of the second Zener diode. The first Zener diode and the second Zener diode are connected anti-serially via the semiconductor substrate and therefore a bidirectional Zener diode is arranged between the first electrode and the second electrode.

Characteristics of a bidirectional Zener diode include a Zener voltage ($V_Z$) as a breakdown voltage, a leakage current ($I_R$), an inter-terminal capacitance ($C_t$), ESD (electrostatic discharge) resistance, etc. A lower inter-terminal capacitance and a lower leakage current are more preferable, and a higher ESD resistance is more preferable. Especially, in the field of mobile devices, it is desired to make the inter-terminal capacitance of the bidirectional Zener diode low from the standpoint of reducing transmission loss of an electrical signal.

The inter-terminal capacitance of the bidirectional Zener diode (total capacitance between the first electrode and the second electrode) is in a proportional relationship with the respective areas of the first diffusion region and the second diffusion region. That is, the inter-terminal capacitance can be made small by defining the respective areas of the first diffusion region and the second diffusion region to be small. When the respective areas of the first diffusion region and the second diffusion region are defined to be not more than 2500 $\mu m^2$ respectively as in the present arrangement, a bidirectional Zener diode chip having an inter-terminal capacitance of not more than 6 pF can be realized.

The area of the first diffusion region is the total area of the region surrounded by boundary lines between the semiconductor substrate and the first diffusion region in the plan view of viewing the front surface of the semiconductor substrate from the normal direction. Similarly, the area of the second diffusion region is the total area of the region surrounded by boundary lines between the semiconductor substrate and the first diffusion region in the plan view of viewing the front surface of the semiconductor substrate from the normal direction.

B2: The bidirectional Zener diode chip according to B1, where the respective areas of the first diffusion region and the second diffusion region are not more than 2000 $\mu m^2$ respectively and the respective peripheral lengths of the first diffusion region and the second diffusion region are not less than 470 μm respectively.

With a bidirectional Zener diode chip, a high ESD resistance is required from the standpoint of securing high reliability. However, the ESD (electrostatic discharge) resistance and the inter-terminal capacitance of a bidirectional Zener diode chip are in a trade-off relationship. That is, if a low inter-terminal capacitance is pursued by taking note of the respective areas of the first diffusion region and second diffusion region, the ESD resistance also decreases and the ESD resistance must be sacrificed inevitably.

Here, the ESD resistance is in a proportional relationship with the respective peripheral lengths of the first diffusion region and the second diffusion region. That is, the ESD resistance can be made large by defining the respective peripheral lengths of the first diffusion region and the second diffusion region to be large. Therefore, by making the respective peripheral lengths of the first diffusion region and the second diffusion region not less than a predetermined length while restricting the respective areas of the first diffusion region and the second diffusion region to be not more than 2000 $\mu m^2$, the ESD resistance and the inter-terminal capacitance that are in the trade-off relationship can be set independently of each other. In other words, by making the respective peripheral areas of the first diffusion region and the second diffusion region not more than 2000 $\mu m^2$ while restricting the respective peripheral lengths of the first diffusion region and the second diffusion region to be not less than a predetermined length, the ESD resistance and the inter-terminal capacitance that are in the trade-off relationship can be set independently of each other.

By defining the respective peripheral lengths of the first diffusion region and the second diffusion region to be not less than 470 μm as in the present arrangement, an ESD resistance of not less than 12 kV can be realized. That is, in a case where the lower limit of the ESD resistance is set to not less than 8 kV based on the international standards IEC61000-4-2, a bidirectional Zener diode chip that can comply with the international standards IEC61000-4-2 while realizing an inter-terminal capacitance of not more than 6 pF can be provided by the present arrangement.

The peripheral length of the first diffusion region is the total extension of the boundary lines between the semiconductor substrate and the first diffusion region at the front surface of the semiconductor substrate. Also, the peripheral length of the second diffusion region is the total extension of the boundary lines between the semiconductor substrate and the second diffusion region at the front surface of the semiconductor substrate.

B3: The bidirectional Zener diode chip according to B1 or B2, where the ESD resistance is not less than 12 kV.

B4: The bidirectional Zener diode chip according to any one of B1 to B3, where the first diffusion region and the second diffusion region have mutually equal areas.

With this arrangement, the electrostatic capacitance at the p-n junction portion of the semiconductor substrate and the first diffusion region and the electrostatic capacitance at the p-n junction portion of the semiconductor substrate and the second diffusion region can be made practically equal.

B5: The bidirectional Zener diode chip according to any one of B1 to B4, where the first diffusion region and the second diffusion region have mutually equal peripheral lengths.

With this arrangement, the ESD resistance of the first Zener diode and the ESD resistance of the second Zener diode can be made practically equal.

B6: The bidirectional Zener diode chip according to any one of B1 to B5, where the first diffusion region and the second diffusion region are formed to be mutually symmetrical.

With this arrangement, the electrical characteristics of the first Zener diode and the electrical characteristics of the second Zener diode can be made substantially equal. The characteristics for respective current directions can thereby be made practically equal. Symmetry includes point symmetry and line symmetry. Also, symmetry includes a form that is not strictly symmetrical but can be regarded to be practically symmetrical as long as the electrical characteristics are symmetrical.

B7: The bidirectional Zener diode chip according to any one of B1 to B6, where first current vs. voltage characteristics obtained with the first electrode being a positive electrode and the second electrode being a negative electrode are practically equal to second current vs. voltage characteristics obtained with the first electrode being the negative electrode and the second electrode being the positive electrode.

With this arrangement, a bidirectional Zener diode chip, with which the current vs. voltage characteristics for the respective current directions are practically equal, can be provided.

B8: The bidirectional Zener diode chip according to any one of B1 to B7, where a plurality of the first diffusion regions and a plurality of the second diffusion regions are aligned alternately along a predetermined alignment direction parallel to the front surface of the semiconductor substrate.

With this arrangement, p-n junctions that are separated according to each of the plurality of first diffusion regions are formed, thereby enabling the peripheral length of the first diffusion regions to be made long. Concentration of electric filed is thereby relaxed and the ESD resistance of the first Zener diode can be improved. Similarly, p-n junctions that are separated according to each of the plurality of second diffusion regions are formed, thereby enabling the peripheral length of the second diffusion regions to be made long. Concentration of electric filed is thereby relaxed and the ESD resistance of the second Zener diode can be improved.

Also with this arrangement, the plurality of first diffusion regions and the plurality of second diffusion regions are aligned alternately so that the peripheral lengths of the first diffusion regions and the second diffusion regions can be made long within a region of limited area and the ESD resistance can be improved readily.

B9: The bidirectional Zener diode chip according to B8, where the plurality of first diffusion regions and the plurality of second diffusion regions are formed to extend and be long in a direction intersecting the alignment direction.

With this arrangement, the respective peripheral lengths of the first diffusion regions and the second diffusion regions can be made even longer within the region of limited area.

B10: The bidirectional Zener diode chip according to B8 or B9, where the first electrode includes a plurality of first lead-out electrode portions bonded respectively to the plurality of first diffusion regions, the second electrode includes a plurality of second lead-out electrode portions bonded respectively to the plurality of second diffusion regions, and the plurality of first lead-out electrode portions and the plurality of second lead-out electrode portions are formed to mutually engaging comb-teeth-like shapes.

With this arrangement, the plurality of first lead-out electrode portions and the plurality of second lead-out electrode portions are formed to mutually engaging comb-teeth-like shapes and therefore the respective peripheral lengths of the first diffusion regions and the second diffusion regions can be defined to be long efficiently.

B11: The bidirectional Zener diode chip according to any one of B1 to B10, further including a first external connection portion electrically connected to the first electrode and a second external connection portion electrically connected to the second electrode.

B12: The bidirectional Zener diode chip according to B11, where the first external connection portion and the second external connection portion have front surfaces that are exposed at a frontmost surface of the semiconductor substrate and the front surface of each of the first external connection portion and the second external connection portion includes a projection formation portion in which are formed a plurality of upwardly projecting projections of a predetermined pattern.

An automatic mounting machine is used when the bidirectional Zener diode chip is soldered onto a mounting substrate. The bidirectional Zener diode chip that is placed in the automatic mounting machine is suctioned by a suction nozzle included in the automatic mounting machine and is conveyed to a position above the mounting substrate. Prior to being mounted, the bidirectional Zener diode chip suctioned by the suction nozzle is irradiated with light from a light source included in the automatic mounting machine and front/rear judgment of the bidirectional Zener diode chip by a part recognizing camera is executed.

With the present arrangement, the plurality of projections are formed on the respective front surfaces of the first external connection portion and the second external connection portion and therefore even if the bidirectional Zener diode chip is suctioned in an inclined attitude by the suction nozzle, the incident light from the light source can be reflected in various directions. Therefore, regardless of how the part recognizing camera is disposed with respect to a part detection position (the position at which the front/rear judgment by the part recognizing camera is performed), the first external connection portion and the second external connection portion can be detected satisfactorily by the part recognizing camera. Misrecognition due to specifications of the bidirectional Zener diode chip can thereby be alleviated to enable the automatic mounting machine to perform the mounting of the bidirectional Zener diode chip smoothly.

B13: The bidirectional Zener diode chip according to B12, where the projection formation portion includes a pattern in which the plurality of projections are aligned in a matrix at fixed intervals in a row direction and a column direction that are mutually orthogonal.

B14: The bidirectional Zener diode chip according to B12, where the projection formation portion includes a pattern in which the plurality of projections are aligned in a staggered alignment of being dislocated in position in the row direction at every other column in the row direction and the column direction that are mutually orthogonal.

B15: The bidirectional Zener diode chip according to any one of B1 to B14, where the semiconductor substrate is a p-type semiconductor substrate and the first diffusion region and the second diffusion region are n-type diffusion regions.

With this arrangement, the semiconductor substrate is a p-type semiconductor substrate and therefore stable characteristics can be realized even if an epitaxial layer is not formed on the semiconductor substrate. That is, an n-type semiconductor substrate is large in in-plane variation of resistivity, and therefore when an n-type semiconductor substrate is used, an epitaxial layer with low in-plane variation of resistivity must be formed on the front surface and an impurity diffusion layer must be formed on the epitaxial layer to form the p-n junction. On the other hand, a p-type semiconductor substrate is low in in-plane variation of resistivity and therefore a bidirectional Zener diode with stable characteristics can be cut out from any location of the p-type semiconductor substrate without having to form an epitaxial layer. Therefore by using the p-type semiconductor substrate, the manufacturing process can be simplified and the manufacturing cost can be reduced.

B16: The bidirectional Zener diode chip according to any one of B1 to B15, where an unevenness arranged to indicate information concerning the bidirectional Zener diode chip is formed at a peripheral edge portion of the semiconductor substrate.

With this arrangement, a polarity direction (positive electrode direction or negative electrode direction), type name, date of manufacture, and other information on the bidirectional Zener diode chip can be obtained based on the unevenness formed on the peripheral edge portion of the semiconductor substrate. Also, the automatic mounting machine used to mount the bidirectional Zener diode chip can recognize the unevenness easily and therefore a bidirectional Zener diode chip suited for automatic mounting can be provided.

B17: The bidirectional Zener diode chip according to any one of B1 to B16, where the front surface of the semiconductor substrate has a rectangular shape with a rounded corner portion.

With this arrangement, the front surface of the semiconductor substrate has the rectangular shape with the rounded corner portion. Fragmenting (chipping) of a corner portion of the bidirectional Zener diode chip can thereby be suppressed or prevented to enable a bidirectional Zener diode chip with few appearance defects to be provided.

B18: A circuit assembly including a mounting substrate and the bidirectional Zener diode chip according to any one of B1 to B17 that is mounted on the mounting substrate.

By this arrangement, a circuit assembly having an electronic circuit that includes the bidirectional Zener diode chip with any of the above described features can be provided.

B19: The circuit assembly according to B18, where the bidirectional Zener diode chip is connected by wireless bonding to the mounting substrate.

By this arrangement, the bidirectional Zener diode chip can be mounted onto the mounting substrate without using wires. The space occupied by the bidirectional Zener diode chip on the mounting substrate can thus be made small.

B20: An electronic device including the circuit assembly according to B18 or B19 and a casing that houses the circuit assembly.

By this arrangement, an electronic device that includes the circuit assembly including the bidirectional Zener diode chip with any of the above described features can be provided.

What is claimed is:

1. A bidirectional Zener diode chip, comprising:

a semiconductor substrate of a first conductivity type;

an insulating film which covers a front surface of the semiconductor substrate;

a first diffusion region of a second conductivity type formed in the semiconductor substrate and exposed at the front surface of the semiconductor substrate;

a second diffusion region of the second conductivity type formed in the semiconductor substrate across an interval from the first diffusion region and exposed at the front surface of the semiconductor substrate;

contact holes in the insulating film for selectively exposing the first diffusion region and the second diffusion region through the insulating film;

a first electrode formed on the front surface of the semiconductor substrate and connected to the first diffusion region; and a second electrode formed on the front surface of the semiconductor substrate and connected to the second diffusion region, wherein the first electrode includes a plurality of first extraction electrodes which are defined to cover the first diffusion region, wherein the second electrode includes a plurality of second extraction electrodes which are defined to cover the second diffusion region along the second extraction electrodes extending parallel to the first extraction electrodes in a lengthwise direction as viewed from a plan view, wherein the plurality of first extraction electrodes and the plurality of second extraction electrodes are defined in a comb-toothed shape engaging with each other, wherein a shape of the contact holes is an elongated shape in the lengthwise direction, and a head shape of each contact hole is tapered in the plan view, wherein in the plan view of the semiconductor substrate from a normal direction, an area of the first diffusion region that is covered by one of the plurality of first extraction electrodes and an area of the second diffusion region that is covered by one of the plurality of second extraction electrodes are not more than 2500 $\mu m^2$respectively, and wherein a length of both of the first extraction electrode and the second extraction electrode are same in the lengthwise direction, and numbers of both of the plurality of first extraction electrodes and the plurality of second extraction electrodes are same.

2. The bidirectional Zener diode chip according to claim 1, wherein the first diffusion region that is covered by the one of the plurality of first extraction electrodes and the second diffusion region that is covered by the one of the plurality of second extraction electrodes have mutually equal areas.

3. The bidirectional Zener diode chip according to claim 2, wherein the first diffusion region that is covered by the one of the plurality of first extraction electrodes and the second diffusion region that is covered by the one of the plurality of second extraction electrodes have mutually equal peripheral lengths.

4. The bidirectional Zener diode chip according to claim 3, wherein a plurality of the first diffusion regions that are covered by ones of the plurality of first extraction electrodes and a plurality of the second diffusion regions that are covered by ones of the plurality of second extraction electrodes are aligned alternately along a predetermined alignment direction parallel to the front surface of the semiconductor substrate.

5. The bidirectional Zener diode chip according to claim 4, wherein the plurality of first diffusion regions that are covered by the ones of the plurality of first extraction electrodes and the plurality of second diffusion regions that are covered by the ones of the plurality of second extraction electrodes are formed to extend lengthwise in the lengthwise direction, intersecting the alignment direction.

6. The bidirectional Zener diode chip according to claim 5, wherein the area of the first diffusion region that is covered by the one of the plurality of first extraction electrodes and the area of the second diffusion region that is covered by the one of the plurality of second extraction electrodes are not more than 2000 $\mu m^2$ respectively, and the peripheral length of the first diffusion region that is covered by the one of the plurality of first extraction electrodes and the peripheral length of the second diffusion region that is covered by the one of the plurality of second extraction electrodes are not less than 470 μm respectively.

7. The bidirectional Zener diode chip according to claim 5, wherein the ESD resistance is not less than 12 kV.

8. The bidirectional Zener diode chip according to claim 5, wherein the first diffusion region that is covered by the one of the plurality of first extraction electrodes and the second diffusion region that is covered by the one of the plurality of second extraction electrodes are formed to be mutually symmetrical.

9. The bidirectional Zener diode chip according to claim 5, wherein first current vs. voltage characteristics obtained with the first electrode being a positive electrode and the second electrode being a negative electrode are practically equal to second current vs. voltage characteristics obtained with the first electrode being the negative electrode and the second electrode being the positive electrode.

10. The bidirectional Zener diode chip according to claim 5, wherein the semiconductor substrate is a p-type semiconductor substrate and the first diffusion region and the second diffusion region are n-type diffusion regions.

11. The bidirectional Zener diode chip according to claim 5, further comprising:

a first external connection portion electrically connected to the first electrode; and a second external connection portion electrically connected to the second electrode.

12. The bidirectional Zener diode chip according to claim 11, wherein the first external connection portion and the second external connection portion have front surfaces that are exposed at a frontmost surface of the semiconductor substrate and the front surface of each of the first external connection portion and the second external connection portion includes a projection formation portion in which are formed a plurality of upwardly projecting projections of a predetermined pattern.

13. The bidirectional Zener diode chip according to claim 12, wherein the projection formation portion includes a pattern in which the plurality of projections are aligned in a matrix at fixed intervals in a row direction and a column direction that are mutually orthogonal.

14. The bidirectional Zener diode chip according to claim 12, wherein the projection formation portion includes a pattern in which the plurality of projections are aligned in a staggered alignment of being dislocated in position in a row direction at every other column in the row direction and a column direction that are mutually orthogonal.

15. The bidirectional Zener diode chip according to claim 1, wherein an unevenness is arranged to indicate information concerning bidirectionality.

16. The bidirectional Zener diode chip according to claim 1, wherein the front surface of the semiconductor substrate has a rectangular shape with a rounded corner portion.

* * * * *